US012435267B2

(12) United States Patent
Kuwabara et al.

(10) Patent No.: US 12,435,267 B2
(45) Date of Patent: Oct. 7, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Hirokazu Kuwabara, Yokohama (JP); Ryuhei Furue, Yokohama (JP); Yuji Suzaki, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 723 days.

(21) Appl. No.: 17/397,406

(22) Filed: Aug. 9, 2021

(65) Prior Publication Data

US 2022/0123214 A1 Apr. 21, 2022

(30) Foreign Application Priority Data

Oct. 16, 2020 (KR) ........................ 10-2020-0134646

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 85/322* (2023.02);
(Continued)

(58) Field of Classification Search
CPC ............. H10K 85/322; H10K 2101/10; H10K 2101/20; C07F 5/027; C09K 2211/1022; C09K 2211/107
See application file for complete search history.

(56) References Cited

U.S. PATENT DOCUMENTS

2020/0044159 A1 2/2020 Yamatani
2020/0185626 A1 6/2020 Yuuki
(Continued)

FOREIGN PATENT DOCUMENTS

KR 10-2019-0025065 3/2019
KR 10-2019-0042791 4/2019
(Continued)

OTHER PUBLICATIONS

Machine Translation of WO2020040298 (Year: 2020).*
Machine Translation of WO2019198698A1 (Year: 2019).*

*Primary Examiner* — Jenna N Chandhok
(74) *Attorney, Agent, or Firm* — KILE PARK REED & HOUTTEMAN PLLC

(57) ABSTRACT

An organic electroluminescence device of an embodiment includes a first electrode, a hole transport region disposed on the first electrode, an emission layer disposed on the hole transport region, an electron transport region disposed on the emission layer, and a second electrode disposed on the electron transport region, wherein the emission layer includes a polycyclic compound represented by Formula 1, thereby exhibiting high emission efficiency.
(Continued)

[Formula 1]

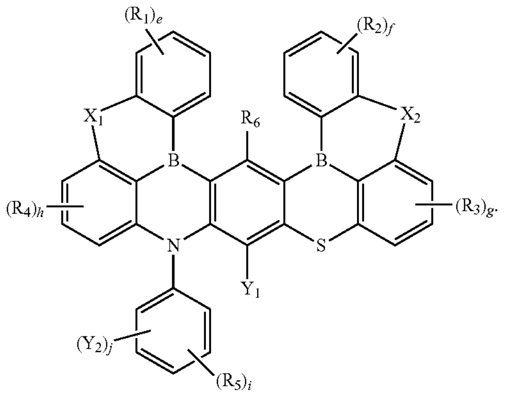

22 Claims, 6 Drawing Sheets

(51) Int. Cl.

| | |
|---|---|
| ***H10K 50/11*** | (2023.01) |
| ***H10K 85/30*** | (2023.01) |
| ***H10K 85/60*** | (2023.01) |
| ***H10K 101/10*** | (2023.01) |
| ***H10K 101/20*** | (2023.01) |

(52) U.S. Cl.

CPC .... *H10K 85/658* (2023.02); *C09K 2211/1018* (2013.01); *H10K 50/11* (2023.02); *H10K 2101/10* (2023.02); *H10K 2101/20* (2023.02)

(56) References Cited

U.S. PATENT DOCUMENTS

| | | | | |
|---|---|---|---|---|
| 2020/0190115 | A1 | 6/2020 | Hatakeyama et al. | |
| 2022/0037591 | A1 * | 2/2022 | Hatakeyama ........ | C08G 61/122 |

FOREIGN PATENT DOCUMENTS

| | | | | |
|---|---|---|---|---|
| KR | 10-2020-0006965 | | 1/2020 | |
| KR | 10-2020-0014451 | | 2/2020 | |
| KR | 10-2020-0026182 | | 3/2020 | |
| KR | 10-2020-0058313 | | 5/2020 | |
| KR | 10-2020-0071192 | | 6/2020 | |
| WO | 2018/074167 | | 4/2018 | |
| WO | 2018/212169 | | 11/2018 | |
| WO | 2019/198698 | | 10/2019 | |
| WO | WO-2020040298 | A1 * | 2/2020 | ............. C09K 11/06 |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0134646 under 35 U.S.C. § 119, filed on Oct. 16, 2020 in the Korean Intellectual Property Office, the entire contents of which are incorporated herein by reference.

BACKGROUND

1. Technical Field

The disclosure relates to an organic electroluminescence device and a polycyclic compound for the organic electroluminescence device.

2. Description of the Related Art

Active development continues for an organic electroluminescence display as an image display. In contrast to a liquid crystal display, the organic electroluminescence display is a so-called self-luminescent display in which holes and electrons respectively injected from a first electrode and a second electrode recombine in an emission layer, and a light-emitting material including an organic compound in the emission layer emits light to achieve display.

In the application of an organic electroluminescence device to a display apparatus, there is a need to decrease driving voltage and to increase emission efficiency and service life of the organic electroluminescence device, and continuous development is required on materials for an organic electroluminescence device which stably achieves such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organic electroluminescence device with high efficiency and a polycyclic compound included in an emission layer of the organic electroluminescence device.

In an embodiment, there is provided a polycyclic compound represented by Formula 1 below.

[Formula 1]

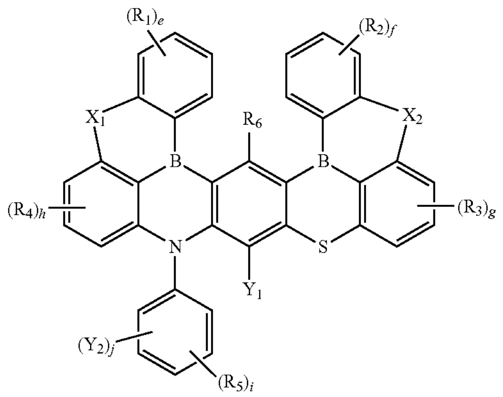

In Formula 1 above, $X_1$ and $X_2$ may each independently be $N(Ar_1)$, O, or S, $Ar_1$ may be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, $Y_1$ and $Y_2$ may each independently be a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring, where at least one of $Y_1$ and $Y_2$ may be F or $CF_3$, $R_1$ to $R_6$ may each independently be a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring. In Formula 1, e and f may each independently be an integer from 0 to 4, j and i may each independently be an integer from 0 to 5, the sum of j and i may be equal to or greater than 5, and g and h may each independently be an integer from 0 to 3.

In an embodiment, in Formula 1, $X_1$ and $X_2$ may be the same as each other.

In an embodiment, Formula 1 above may be represented by Formula 2 below.

[Formula 2]

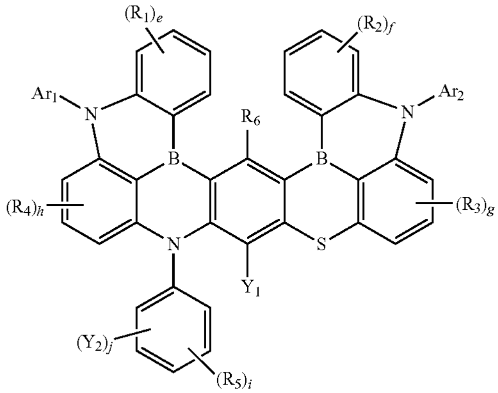

In Formula 2 above, $Ar_2$ may be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $Ar_1$, $Y_1$, $Y_2$, $R_1$ to $R_6$, and e to j may be the same as defined in connection with Formula 1.

In an embodiment, in Formula 1, the sum of g and h may be equal to or greater than 1, and at least one of $R_3$ and $R_4$ may be a substituted amine group.

In an embodiment, Formula 2 above may be represented by Formula 3 below.

[Formula 3]

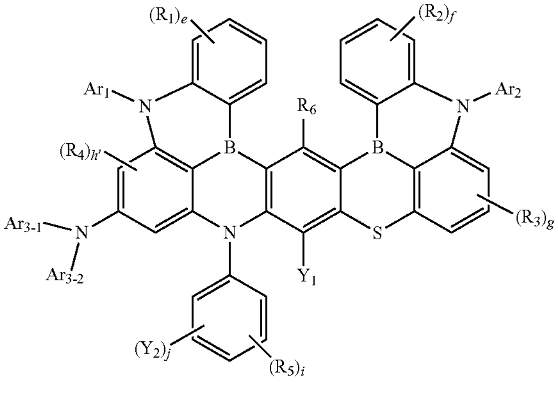

In Formula 3 above, $Ar_{3-1}$ and $Ar_{3-2}$ may each independently be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, h' may be an integer from 0 to 2, and $Ar_1$, $Ar_2$, $Y_1$, $Y_2$, $R_1$ to $R_6$, e to g, i, and j may be the same as defined in connection with Formula 2.

In an embodiment, Formula 2 above may be represented by Formula 4 below.

[Formula 4]

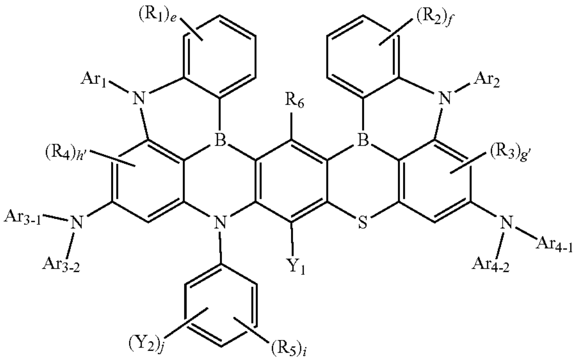

In Formula 4 above, $Ar_{3-1}$, $Ar_{3-2}$, $Ar_{4-1}$, and $Ar_{4-2}$ may each independently be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, h' and g' may each independently be an integer from 0 to 2, and $Ar_1$, $Ar_2$, $Y_1$, $Y_2$, $R_1$ to $R_6$, e, f, i, and j may be the same as defined in connection with Formula 2.

In an embodiment, in Formula 4, $Ar_{3-1}$, $Ar_{3-2}$, $Ar_{4-1}$, and $Ar_{4-2}$ may each independently be a substituted or unsubstituted ring-forming aryl group having 6 to 18 carbon atoms.

In an embodiment, Formula 1 above may be represented by Formula 6 below.

[Formula 6]

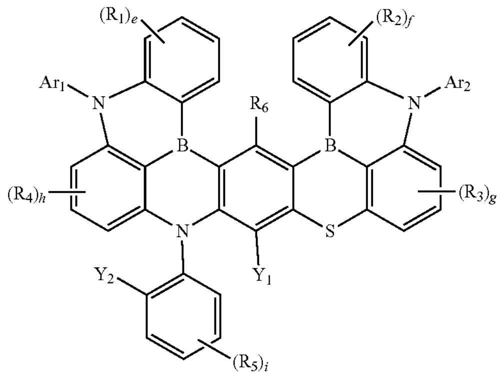

In Formula 6 above, $Ar_2$ may be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $Ar_1$, $Y_1$, $Y_2$, $R_1$ to $R_6$, and e to i may be the same as defined in connection with Formula 1.

In an embodiment, $Ar_1$ and $Ar_2$ may be each independently represented by any one among Formula 5-1 to Formula 5-3 below.

[Formula 5-1]

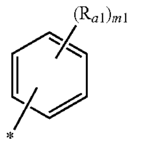

[Formula 5-2]

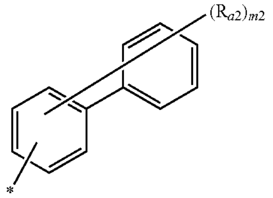

[Formula 5-3]

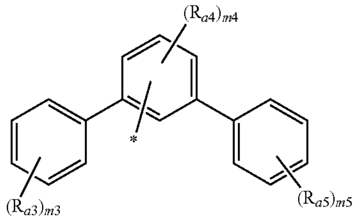

In Formula 5-1 to Formula 5-3 above, Rai to Ras may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In Formula 5-1 to Formula 5-3 above, m1, m3, and m5 may each independently be an integer from 0 to 5, m2 may be an integer from 0 to 9, m4 may be an integer from 0 to 3, and * indicates a binding site to a neighboring atom.

In an embodiment, a polycyclic compound represented by Formula 1 above may be any one among the compounds represented in Compound Group 1 below.

An embodiment provides an organic electroluminescence device including a first electrode, a hole transport region disposed on the first electrode, an emission layer disposed on the hole transport region, an electron transport region disposed on the emission layer, and a second electrode disposed on the electron transport region, wherein the emission layer includes a polycyclic compound according to an embodiment.

In an embodiment, the emission layer may emit delayed fluorescence.

In an embodiment, the emission layer may be a delayed fluorescence emission layer including a first compound and a second compound, and the first compound may include a polycyclic compound according to an embodiment.

In an embodiment, the emission layer may be a thermally activated delayed fluorescence (TADF) emission layer that emits light of a wavelength in a range of about 430 nm to about 480 nm.

BRIEF DESCRIPTION OF THE DRAWINGS

The accompanying drawings are included to provide a further understanding of the embodiments, and are incorporated in and constitute a part of this specification. The drawings illustrate embodiments of the disclosure. The above and other aspects and features of the disclosure will become more apparent by describing in detail embodiments thereof with reference to the attached drawings, in which.

DETAILED DESCRIPTION OF THE EMBODIMENTS

Figure 1:
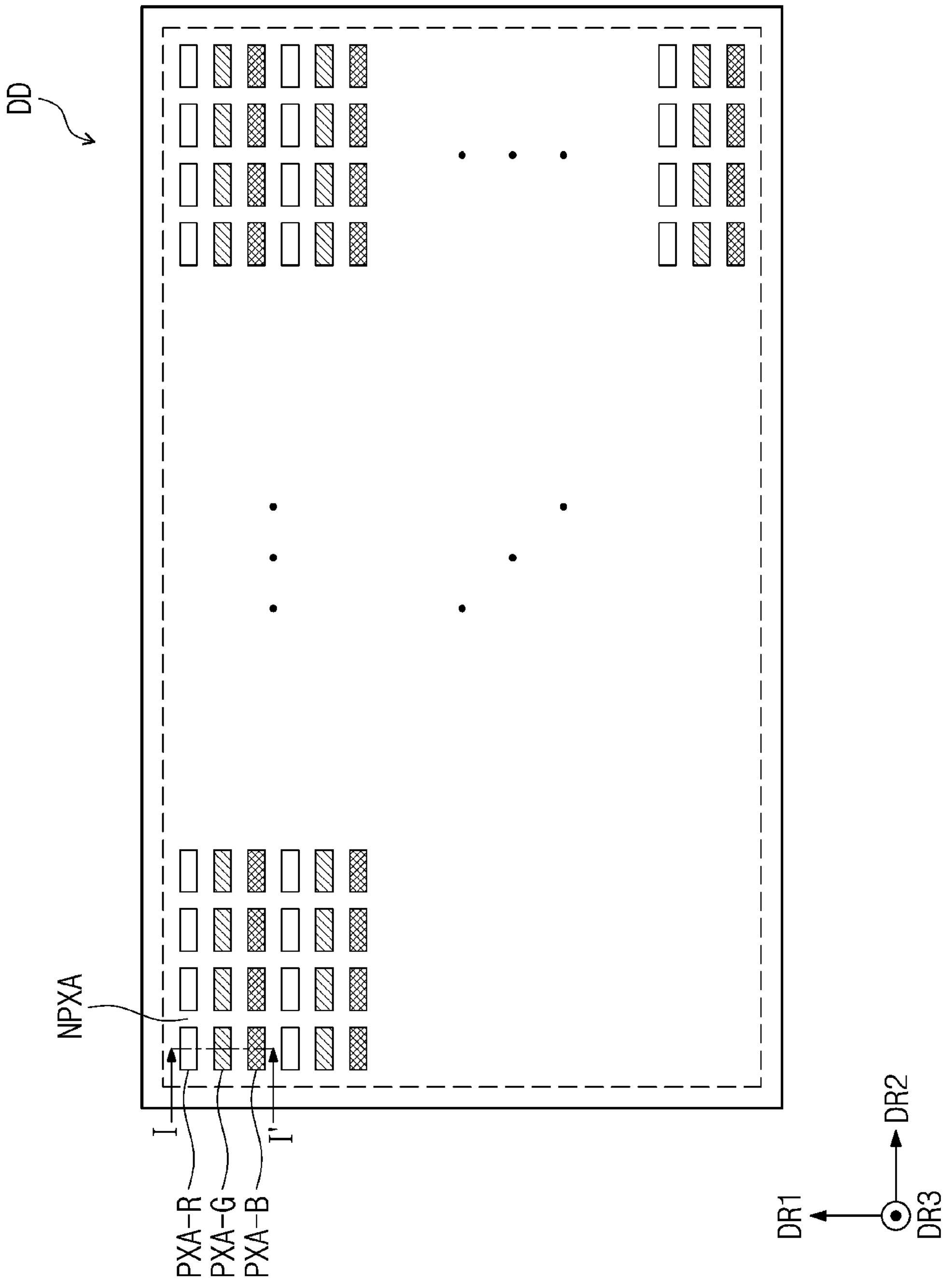
FIG. 1 is a plan view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be explained with reference to the drawings.

Figure 2:
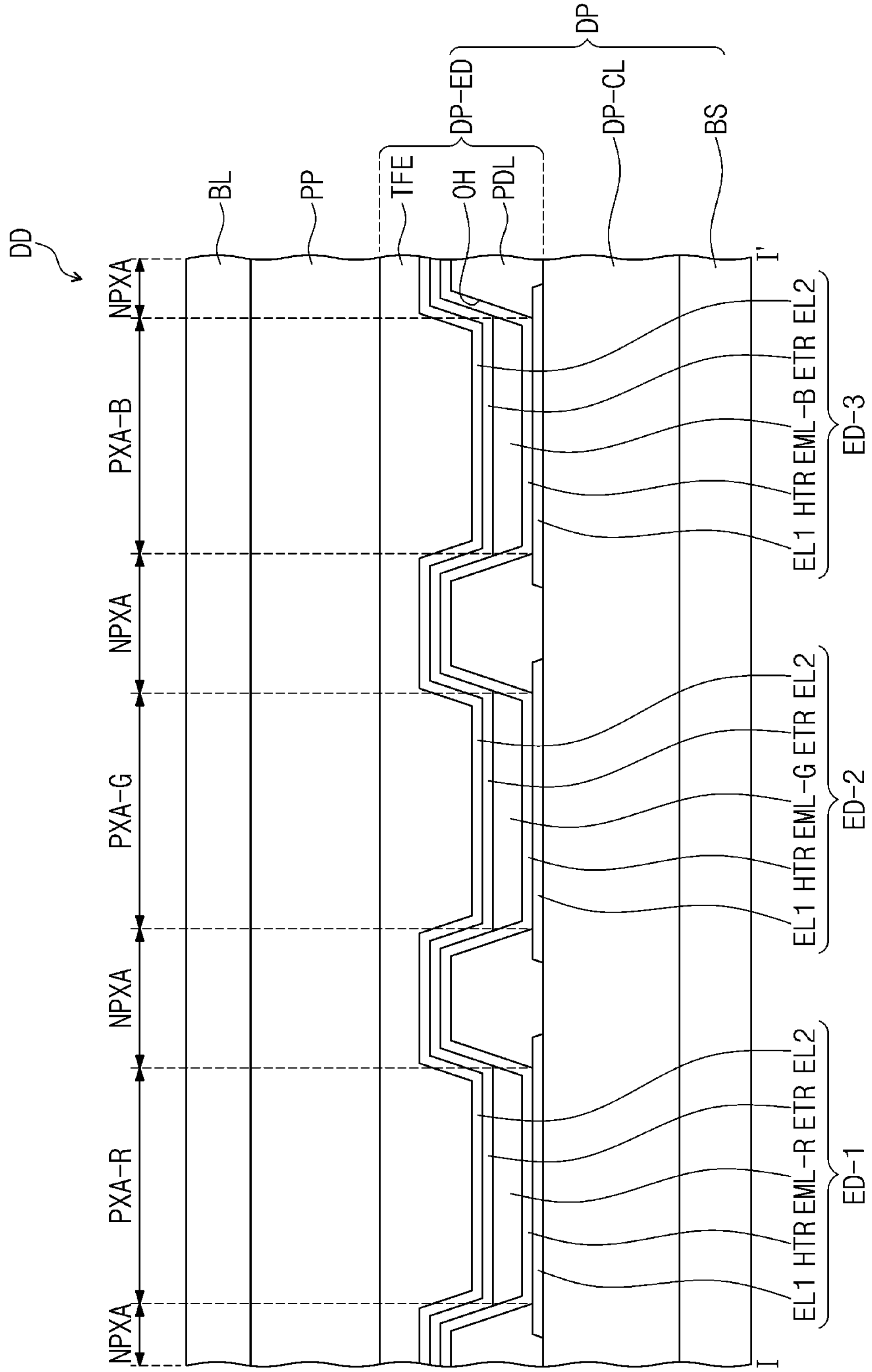
FIG. 2 is a schematic cross-sectional view illustrating a display apparatus according to an embodiment.

FIG. 1 is a plan view illustrating an embodiment of a display apparatus DD. FIG. 2 is a schematic cross-sectional view of a display apparatus DD according to an embodiment. FIG. 2 is a schematic cross-sectional view showing a portion corresponding to line I-I' in FIG. 1.

The display apparatus DD may include a display panel DP and an optical layer PP disposed on the display panel DP. The display panel DP includes organic electroluminescence devices ED-1, ED-2, and ED-3. The display apparatus DD may include organic electroluminescence devices ED-1, ED-2, and ED-3. The optical layer PP may be disposed on the display panel DP and control light reflected from an external light on the display panel DP. The optical layer PP may include, for example, a polarization layer or a color filter layer. While not shown in the drawings, the optical layer PP may be omitted in the display apparatus DD according to another embodiment.

The display panel DP may include a base layer BS, a circuit layer DP-CL provided on the base layer BS, and a display apparatus layer DP-ED. The display apparatus layer DP-ED may include a pixel-defining film PDL, organic electroluminescence devices ED-1, ED-2, and ED-3 disposed between the pixel-defining film PDL, and an encapsulating layer TFE disposed on the organic electroluminescence devices ED-1, ED-2, and ED-3.

The base layer BS may be a member that provides a base surface on which the display device layer DP-ED is disposed. The base layer BS may be a glass substrate, a metal substrate, a plastic substrate, or the like. However, embodiments are not limited thereto, and the base layer BS may be an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the organic electroluminescence devices ED-1, ED-2, and ED-3 of the display device layer DP-ED.

Each of the organic electroluminescence devices ED-1, ED-2, and ED-3 may have a structure of an organic electroluminescence device ED according to an embodiment of FIGS. 3 to 6 to be described below. Each of the organic electroluminescence devices ED-1, ED-2, and ED-3 may include a first electrode EL1, a hole transport region HTR, emission layers EML-R, EML-G, and EML-B, an electron transport region ETR, and a second electrode EL2.

In FIG. 2, the emission layers EML-R, EML-G, and EML-B of the organic electroluminescence devices ED-1, ED-2, and ED-3 are disposed in an opening OH defined in the pixel-defining film PDL, and the hole transport region HTR, the electron transport region ETR, and the second electrode EL2 are provided as common layers in all of the organic electroluminescence devices ED-1, ED-2, and ED-3. However, embodiments are not limited thereto. Unlike the illustration in FIG. 2, in an embodiment, the hole transport region HTR and the electron transport region ETR may be patterned and provided in the opening OH defined in the pixel-defining film PDL. For example, in an embodiment, the hole transport region HTR, the emission layers EML-R, EML-G, and EML-B, and the electron transport region ETR, etc. of the organic electroluminescence devices ED-1, ED-2, and ED-3 may be patterned and provided by an inkjet printing method.

An encapsulating layer TFE may cover the organic electroluminescence devices ED-1, ED-2, and ED-3. The encapsulating layer TFE may seal the display device layer DP-ED. The encapsulating layer TFE may be a thin film encapsulating layer. The encapsulating layer TFE may be a single layer or a stack of layers. The encapsulating layer TFE may include at least one insulating layer. The encapsulating layer TFE according to an embodiment may include at least one inorganic film (hereinafter, an encapsulating inorganic film). The encapsulating layer TFE according to an embodiment may include at least one organic film (hereinafter, an encapsulating organic film) and at least one encapsulating inorganic film.

The encapsulating inorganic film may protect the display device layer DP-ED from moisture and/or oxygen, and the encapsulating organic film may protect the display device layer DP-ED from foreign materials such as dust particles. The encapsulating inorganic film may include silicon nitride, silicon oxy nitride, silicon oxide, titanium oxide, aluminum oxide, or the like, but embodiments are not particularly limited thereto. The encapsulating organic film may include an acrylic-based compound, an epoxy-based compound, or the like. The encapsulating organic film may include an organic material capable of photopolymerization, but embodiments are not particularly limited thereto.

The encapsulating layer TFE may be disposed on the second electrode EL2 and may be disposed to fill the opening OH.

Referring to FIG. 1 and FIG. 2, the display apparatus DD may include a non-light emitting region NPXA and light-emitting regions PXA-R, PXA-G, and PXA-B. The light-emitting regions PXA-R, PXA-G, and PXA-B may be regions in which light generated from each of the organic electroluminescence devices ED-1, ED-2, and ED-3 is respectively emitted. The light-emitting regions PXA-R, PXA-G, and PXA-B may be spaced apart from each other on a plane.

Each of the light-emitting regions PXA-R, PXA-G, and PXA-B may be a region separated by a pixel-defining film PDL. The non-light emitting regions NPXA may be regions interposed between the neighboring light-emitting regions PXA-R, PXA-G, and PXA-B, and may be regions corresponding to the pixel-defining film PDL. In the disclosure the light-emitting regions PXA-R, PXA-G, and PXA-B may respectively correspond to pixels. The pixel-defining film PDL may separate the organic electroluminescence devices ED-1, ED-2, and ED-3. Emission layers EML-R, EML-G, and EML-B of the organic electroluminescence devices ED-1, ED-2, and ED-3 may be disposed and separated in the opening OH defined in the pixel-defining film PDL.

The light-emitting regions PXA-R, PXA-G, and PXA-B may be classified into groups according to the color of light generated from the organic electroluminescence devices ED-1, ED-2, and ED-3. In the display apparatus DD according to an embodiment shown in FIG. 1 and FIG. 2, three light-emitting regions PXA-R, PXA-G, and PXA-B respectively emitting red light, green light, and blue light are illustrated by way of example. For example, the display apparatus DD according to an embodiment may include a red light-emitting region PXA-R, a green light-emitting region PXA-G, and a blue light-emitting region PXA-B, which are distinguished from each other.

In the display apparatus DD according to an embodiment, organic electroluminescence devices ED-1, ED-2, and ED-3 may emit light having different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, the red light-emitting region PXA-R, the green light-emitting region PXA-G, and the blue light-emitting region PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light of the same wavelength region, or at least one thereof may emit light of a different wavelength region. For example, all of the first to third organic electroluminescence devices ED-1, ED-2, and ED-3 may emit blue light.

The light-emitting regions PXA-R, PXA-G, and PXA-B in the display apparatus DD according to an embodiment may be arranged in a stripe shape. Referring to FIG. 1, red light-emitting regions PXA-R, green light-emitting regions PXA-G, and blue light-emitting regions PXA-B may be arranged respectively along a second direction axis DR2. The red light-emitting region PXA-R, the green light-emitting region PXA-G, and the blue light-emitting region PXA-B may be alternatively arranged in order along a first direction axis DR1.

FIG. 1 and FIG. 2 illustrate that all the light-emitting regions PXA-R, PXA-G, and PXA-B have similar areas, but embodiments are not limited thereto. The areas of the light-emitting regions PXA-R, PXA-G, and PXA-B may be different from each other depending on the wavelength region of the emitted light. For example, the areas of the light-emitting regions PXA-R, PXA-G, and PXA-B may be areas in a plan view that are defined by the first direction axis DR1 and the second direction axis DR2.

The arrangement of the light-emitting regions PXA-R, PXA-G, and PXA-B is not limited to the configuration illustrated in FIG. 1, and the arrangement order of the red light-emitting region PXA-R, the green light-emitting region PXA-G, and the blue light-emitting region PXA-B may be provided in various combinations depending on the characteristics of display quality required for the display apparatus DD. For example, the light-emitting regions PXA-R, PXA-G, and PXA-B may be arranged in a PenTile® configuration or in a diamond configuration.

The areas of the light-emitting regions PXA-R, PXA-G, and PXA-B may be different from each other. For example, in an embodiment, the area of the green light-emitting region PXA-G may be smaller than the area of the blue light-emitting region PXA-B, but embodiments are not limited thereto.

Hereinafter, FIGS. 3 to 6 are schematic cross-sectional views each illustrating an organic electroluminescence device according to an embodiment. The organic electroluminescence device ED according to an embodiment may include a first electrode EL1, a hole transport region HTR, an emission layer EML, an electron transport region ETR, and a second electrode EL2, sequentially stacked.

The organic electroluminescence device ED according to an embodiment may include a polycyclic compound according to an embodiment to be described below in the emission layer EML disposed between the first electrode EL1 and the second electrode EL2. However, embodiments are not limited thereto, and the organic electroluminescence device ED according to an embodiment may include a compound according to an embodiment to be described below, in the hole transport region HTR or in the electron transport region ETR, which form part of the functional layers disposed between the first electrode EL1 and the second electrode EL2, or in the capping layer CPL disposed on the second electrode EL2, in addition to the emission layer EML.

Figure 3:
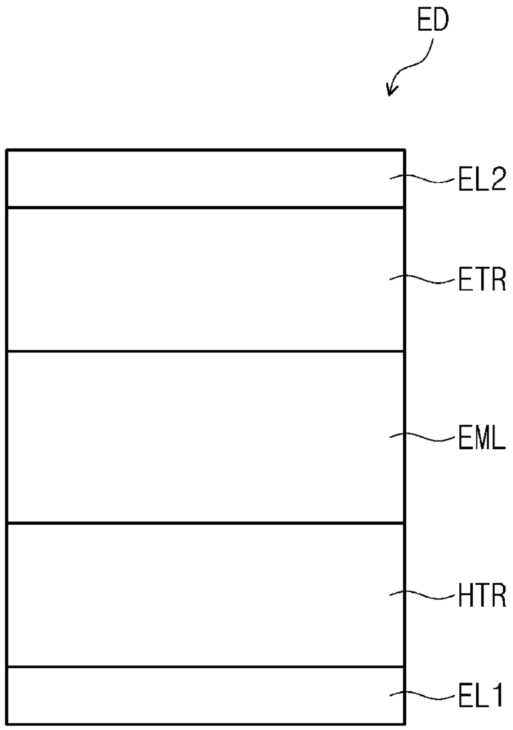
FIG. 3 is a schematic cross-sectional view illustrating an organic electroluminescence device according to an embodiment.
Figure 4:
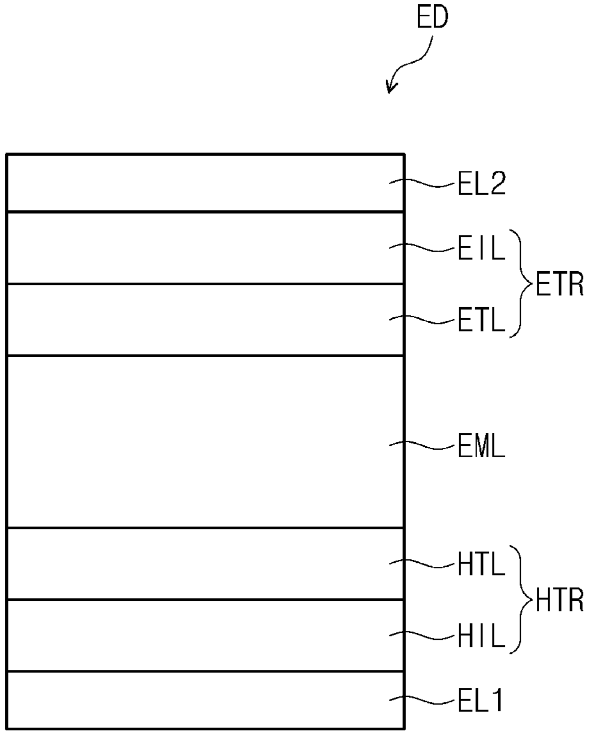
FIG. 4 is a schematic cross-sectional view illustrating an organic electroluminescence device according to an embodiment.
Figure 5:
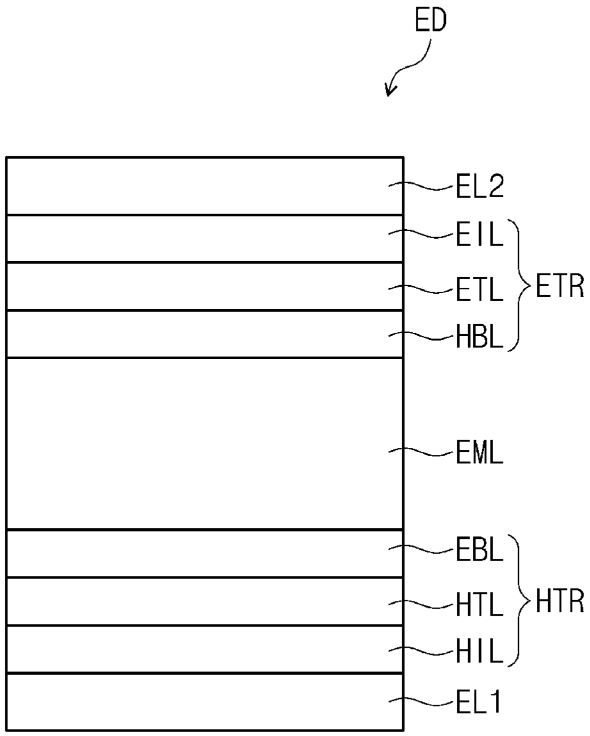
FIG. 5 is a schematic cross-sectional view illustrating an organic electroluminescence device according to an embodiment.
Figure 6:
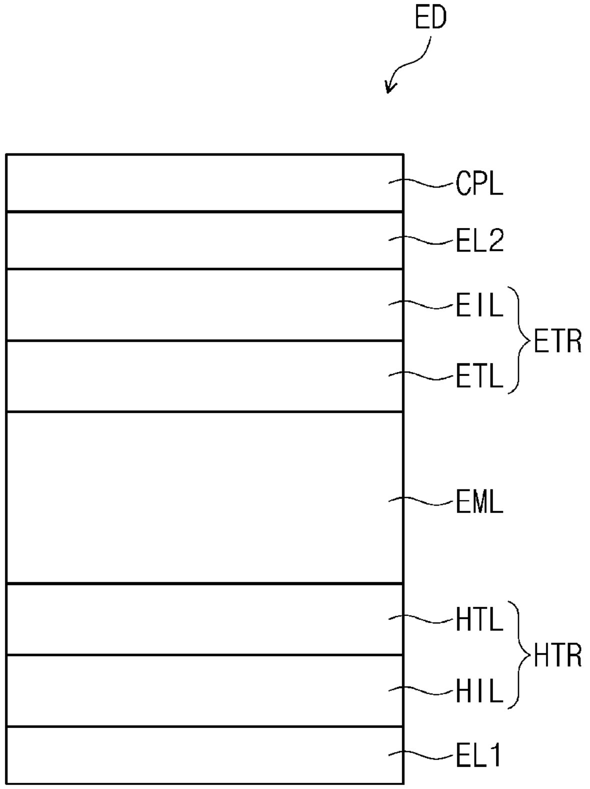
FIG. 6 is a schematic cross-sectional view illustrating an organic electroluminescence device according to an embodiment.

In comparison to FIG. 3, FIG. 4 shows a schematic cross-sectional view of an organic electroluminescence device ED according to an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of an organic electroluminescence device ED according to an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of an organic electroluminescence device ED according to an embodiment, which includes a capping layer CPL disposed on the second electrode EL2.

The first electrode EL1 has conductivity. The first electrode EL1 may be formed using a metal alloy or a conductive compound. The first electrode EL1 may be an anode or a cathode. However, embodiments are not limited thereto. In another embodiment, the first electrode EL1 may be a pixel electrode. The first electrode EL1 may be a transmissive electrode, a transflective electrode, or a reflective electrode. If the first electrode EL1 is a transmissive electrode, the first electrode EL1 may include transparent metal oxide such as indium tin oxide (ITO), indium zinc oxide (IZO), zinc oxide (ZnO), indium tin zinc oxide (ITZO), or the like. If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In another embodiment, the first electrode EL1 may have a multilayered structure including a reflective film or a transflective film formed using the above-described materials and a transparent conductive film formed using indium tin oxide (ITO), indium zinc oxide (IZO), zinc oxide (ZnO), indium tin zinc oxide (ITZO), or the like. For example, the first electrode EL1 may have a three-layer structure of ITO/Ag/ITO, but embodiments are not limited thereto. A thickness of the first electrode EL1 may be in a range of about 700 Å to about 10000 Å. For example, the thickness of the first electrode EL1 may be in a range of about 1000 Å to about 3000 Å.

The hole transport region HTR may be provided on the first electrode EL1. The hole transport region HTR may include at least one of a hole injection layer HIL, a hole transport layer HTL, a buffer layer (not shown), and an electron blocking layer EBL. A thickness of the hole transport region HTR may be, for example, in a range of about 50 Å to about 15,000 Å.

The hole transport region HTR may have a single layer structure formed using a single material, a single layer structure formed using different materials, or a multilayer structure having layers formed using different materials.

For example, the hole transport regions HTR may have a structure of a single layer of a hole injection layer HIL or a hole transport layer HTL, and may have a structure of a single layer formed using a hole injection material and a hole transport material. In an embodiment, the hole transport regions HTR may have a structure of a single layer formed using different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in order from the first electrode EL1, but embodiments are not limited thereto.

The hole transport region HTR may be formed by using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may further include a compound represented by Formula H-1 below.

[Formula H-1]

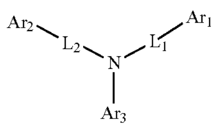

In Formula H-1 above, $L_1$ and $L_2$ may each independently be a direct linkage, a substituted or unsubstituted ring-forming arylene group having 6 to 30 carbon atoms, or a substituted or unsubstituted ring-forming heteroarylene group having 2 to 30 carbon atoms. In Formula H-1, $Ar_1$ and $Ar_2$ may each independently be a substituted or unsubstituted ring-forming aryl group having 6 to 30 carbon atoms, or a substituted or unsubstituted ring-forming heteroaryl group having 2 to 30 carbon atoms. In Formula H-1, $Ar_3$ may be a substituted or unsubstituted ring-forming aryl group having 6 to 30 carbon atoms, or a substituted or unsubstituted ring-forming heteroarylene group having 2 to 30 carbon atoms.

The compound represented by Formula H-1 above may be a monoamine compound. In another embodiment, the compound represented by Formula H-1 above may be a diamine compound in which at least one among $Ar_{-1}$ to $Ar_3$ includes an amine group as a substituent. The compound represented by Formula H-1 above may be a carbazole-based compound including a substituted or unsubstituted carbazole group in at least one of $Ar_1$ and $Ar_2$, or a fluorene-based compound including a substituted or unsubstituted fluorene group in at least one of $Ar_1$ and $Ar_2$.

The compound represented by Formula H-1 may be represented by any one among the compounds in Compound Group H below. However, the compounds listed in Compound Group H below are illustrative, and the compound represented by Formula H-1 is not limited to those represented in Compound Group H below.

[Compound Group H]

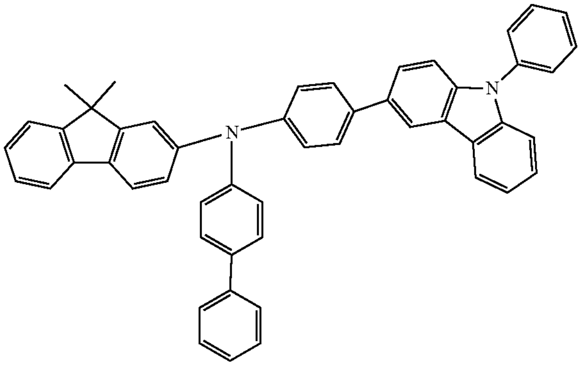

-continued
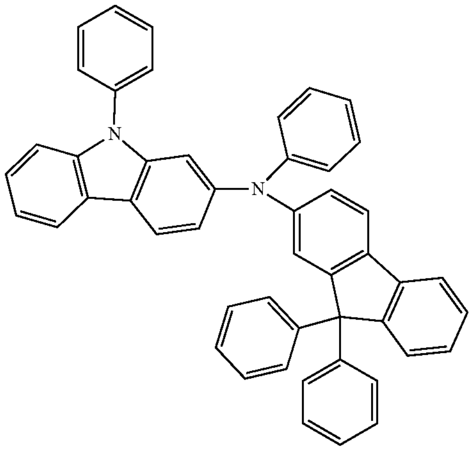
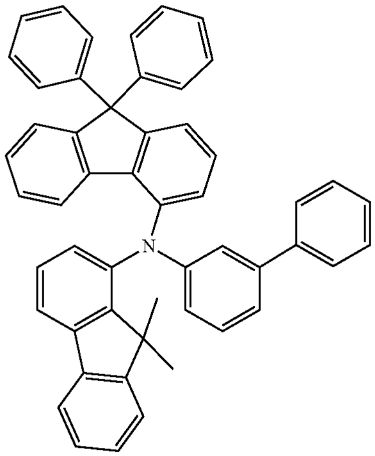
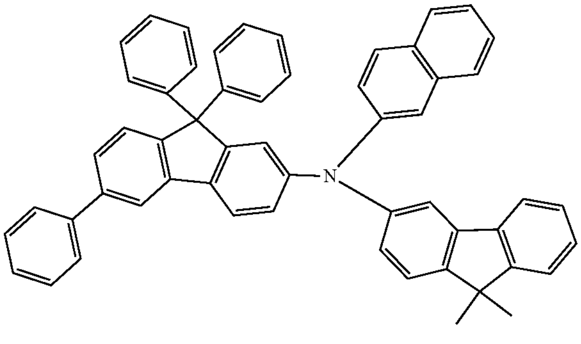
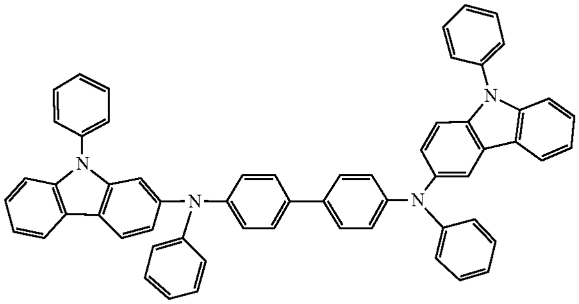
-continued
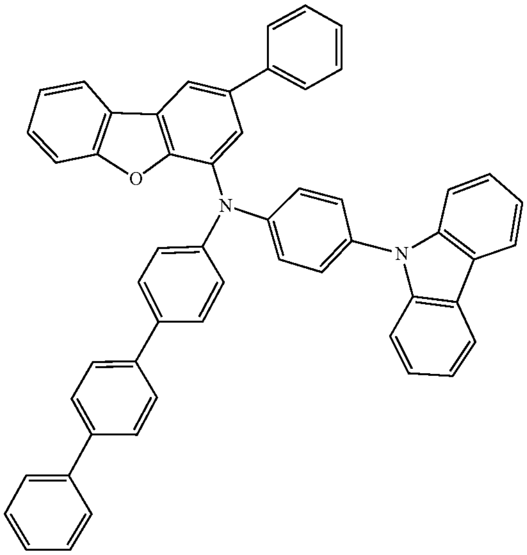
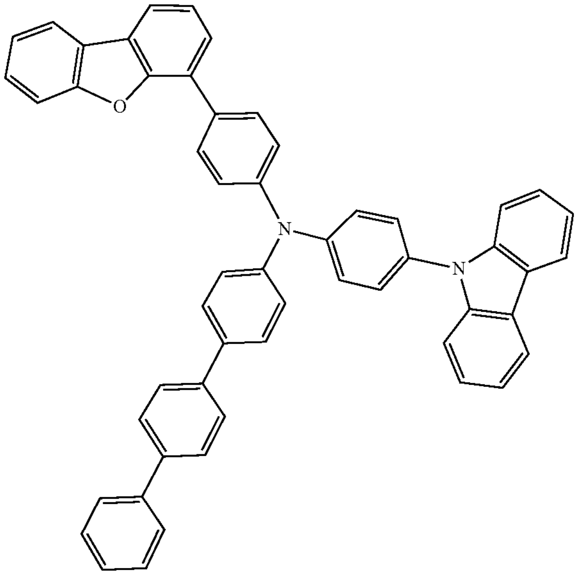

-continued
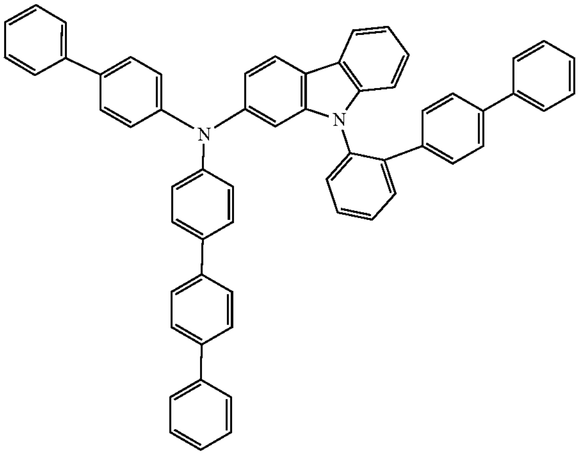
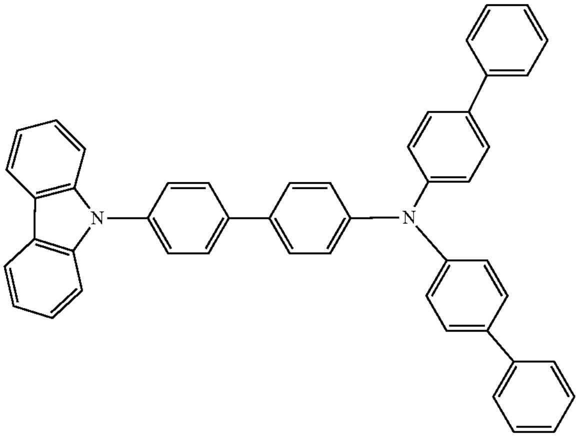
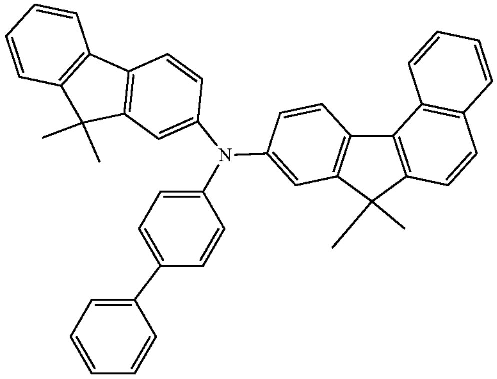
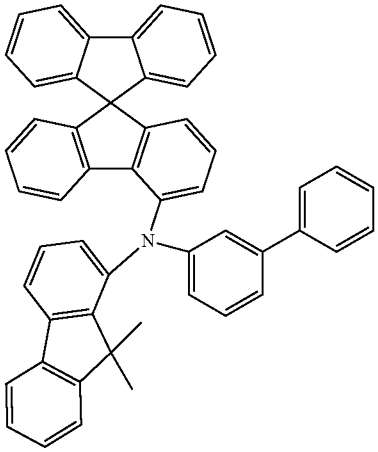
-continued
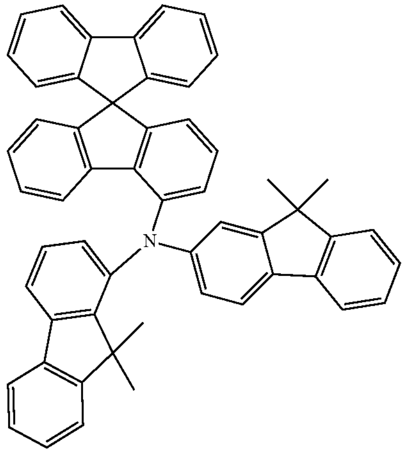
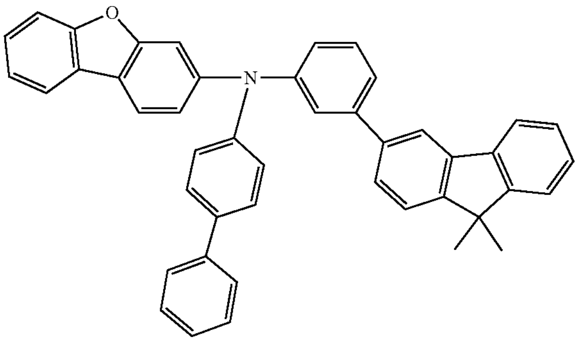
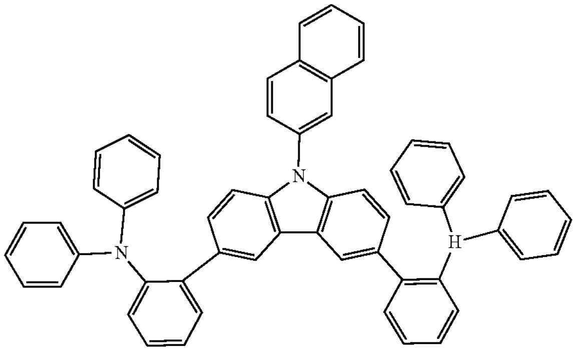
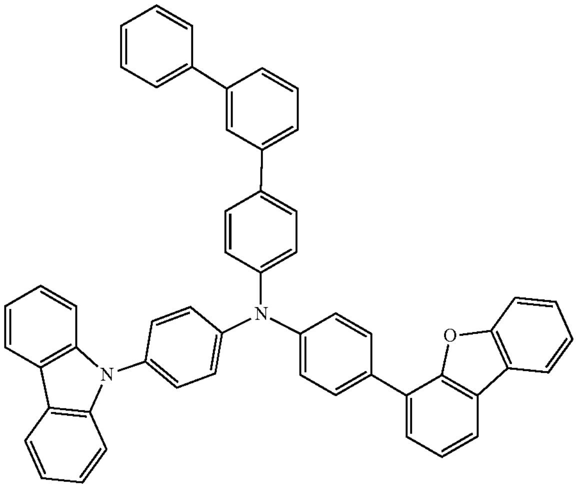

-continued

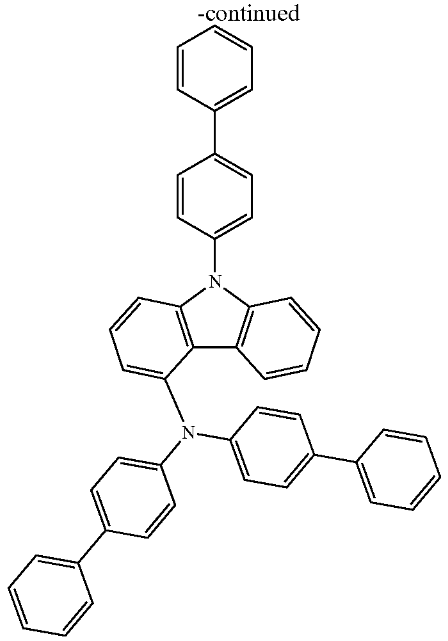

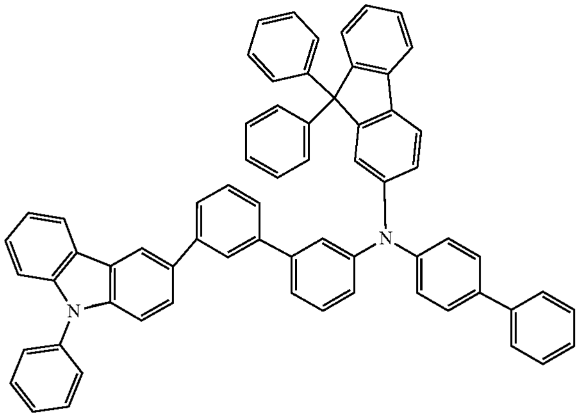

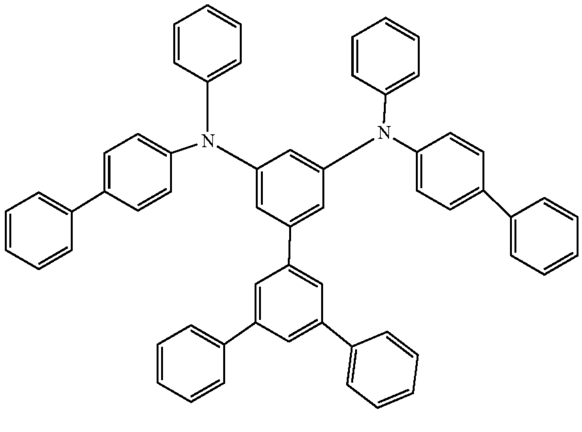

The hole transport region HTR may include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N (2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium[tetrakis(pentafluorophenyl)borate], dipyrazino[2,3-f:2',3'-h]quinoxaline-2,3,6,7,10,11-hexacarbonitrile (HATCN), or the like.

The hole transport region HTR may include a carbazole-based derivative such as N-phenyl carbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), or the like.

The hole transport region HTR may include a carbazole-based derivative such as N-phenyl carbazole, polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-Bis(N-carbazolyl)benzene (mCP), 1,3-bis(1,8-dimethyl-9H-carbazol-9-yl)benzene (mDCP), or the like.

The hole transport region HTR may include the aforementioned compounds of the hole transport region in at least one of the hole injection layer HIL, the hole transport layer HTL, and the electron blocking layer EBL.

In an embodiment, a thickness of the hole transport region HTR may be in a range of about 100 Å to about 10,000 Å. For example, the thickness of the hole transport region HTR may be in a range of about 100 Å to about 5,000 Å. A thickness of the hole injection region HIL may be, for example, in a range of about 30 Å to about 1,000 Å, and a thickness of the hole transport layer HTL may be in a range of about 30 Å to about 1,000 Å. For example, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but embodiments are not limited thereto. For example, non-limiting examples of the p-dopant may include, but are not limited to, quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide, and molybdenum oxide.

As described above, the hole transport region HTR may further include at least one of the buffer layers (not shown) and the electron blocking layer EBL in addition to the hole injection layer HIL and the hole transport layer HTL. The buffer layer (not shown) may compensate an optical resonance distance according to the wavelength of light emitted from the emission layer EML to increase light-emitting efficiency. Materials which may be included in the hole transport region HTR may be used as materials included in the buffer layer (not shown). The electron blocking layer EBL may be a layer that prevents electron injection from the electron transport region ETR to the hole transport region HTR.

The emission layer is provided on the hole transport region HTR. The emission layer EML may have a thickness of, for example, in a range of about 100 Å to about 1,000 Å. For example, the thickness of the emission layer EML may be in a range of about 100 Å to about 300 Å. The emission layer EML may have a single layer formed using a single material, a single layer formed using different materials, or a multilayer structure having layers formed using different materials.

The emission layer EML may emit at least one of red light, green light, blue light, white light, yellow light, and cyan light. The emission layer EML may include a fluorescent light-emitting material or a phosphorescent light-emitting material.

In an embodiment, the emission layer EML may be a fluorescent emission layer. For example, some of the light emitted from the emission layer EML may be due to thermally activated delayed fluorescence (TADF). For example, the emission layer EML may include a light-emitting component that emits thermally activated delayed fluorescence, and in an embodiment, the emission layer EML may be an emission layer that emits thermally activated delayed fluorescence that emits blue light. In an embodiment, the emission layer EML may emit light of a wavelength in a range of about 430 nm to about 480 nm.

The emission layer EML of the organic electroluminescence device ED according to an embodiment includes a polycyclic compound according to an embodiment.

In the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the description, the term "bonded to an adjacent group to form a ring" may indicate that one is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. Rings formed by being bonded to an adjacent group may be monocyclic or polycyclic. The rings formed by being bonded to each other may be connected to another ring to form a spiro structure.

In the description, the term "an adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups".

In the description, examples of the halogen atom may include a fluorine atom, a chlorine atom, a bromine atom, and an iodine atom.

In the description, the alkyl may be a linear, branched, or cyclic type. The number of carbon atoms of the alkyl may be 1 to 50, 1 to 30, 1 to 20, 1 to 10, or 1 to 6. Examples of the alkyl group may include, but are not limited to, methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, and so on.

In the description, the alkenyl group means a hydrocarbon group including one or more carbon double bonds in the middle of or at the terminal of an alkyl group having 2 or more carbon atoms. The alkenyl group may be linear or branched. The number of carbon atoms is not particularly limited, but may be 2 to 30, 2 to 20, or 2 to 10. Examples of the alkenyl group may include, but is not limited to, a vinyl group, a 1-butenyl group, a 1-pentenyl group, a 1,3-butadienyl aryl group, a styrenyl group, a styrylvinyl group, and so on.

In the description, the alkynyl group means a hydrocarbon group including one or more carbon triple bonds in the middle of or at the terminal of an alkyl group having 2 or more carbon atoms. The alkynyl group may be linear or branched. The number of carbon atoms is not particularly limited, but may be 2 to 30, 2 to 20, or 2 to 10. Examples of the alkynyl group may include, but is not limited to, an ethynyl group, a propynyl group, and so on.

In the description, the hydrocarbon ring group may be an optional functional group or substituent derived from an aliphatic hydrocarbon ring, or an optional functional group or substituent derived from an aromatic hydrocarbon ring. The number of ring-forming carbon atoms of the hydrocarbon ring group may be 5 to 60, 5 to 30, or 5 to 20.

In the description, the aryl group means an optional functional group or substituent derived from an aromatic hydrocarbon ring. The aryl group may be a monocyclic aryl group or a polycyclic aryl group. The number of ring-forming carbon atoms of the aryl group may be 6 to 30, 6 to 20, or 6 to 15. Examples of the aryl group may include, but are not limited to, phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, and so on.

In the description, the heterocyclic group means an optional functional group or substituent derived from a ring including one or more among B, O, N, P, Si, and S as heteroatoms. The heterocyclic group may include an aliphatic heterocyclic group and an aromatic heterocyclic group. The aromatic heterocyclic group may be a heteroaryl group. The aliphatic heterocyclic group and the aromatic heterocyclic group may be a monocycle or a polycycle.

In the description, the heterocyclic group may include one or more among B, O, N, P, Si, and S as heteroatoms. If the heterocyclic group includes two or more heteroatoms, two or more heteroatoms may be the same as or different from each other. The heterocyclic group may be a monocyclic heterocyclic group or a polycyclic heterocyclic group, and has a concept including a heteroaryl group. The number of ring-forming carbon atoms of the heterocyclic group may be 2 to 30, 2 to 20, or 2 to 10.

In the description, the aliphatic heterocyclic group may include one or more among B, O, N, P, Si, and S as heteroatoms. The number of ring-forming carbon atoms of the aliphatic heteroaryl group may be 2 to 30, 2 to 20, or 2 to 10. Examples of the aliphatic heterocyclic group may include, but are not limited to, an oxirane group, a thiirane group, a pyrrolidine group, a piperidine group, a tetrahydrofuran group, a tetrahydrothiophene group, a thiane group, a tetrahydropyran group, a 1,4-dioxane group, and so on.

In the description, the heteroaryl group may include one or more among B, O, N, P, Si, and S as heteroatoms. If the heteroaryl group includes two or more heteroatoms, two or more heteroatoms may be the same as or different from each other. The heteroaryl group may be a monocyclic heterocyclic group or a polycyclic heterocyclic group. The number of ring-forming carbon atoms of the heteroaryl group may be 2 to 30, 2 to 20, or 2 to 10. Examples of the heteroaryl group may include, but are not limited to thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isoxazole, oxazole, oxadiazole, thiadiazole, phenothiazine, dibenzosilole, dibenzofuran, and so on.

In the description, the number of carbon atoms of the amine group may be 1 to 30, but is particularly limited thereto. The amine group may include an alkyl amine group and an aryl amine group. Examples of the amine group may include, but are not limited to a methylamine group, a dimethylamine group, a phenylamine group, a diphenylamine group, a naphthylamine group, a 9-methyl-anthracenylamine group, and so on.

In the description, a silyl group may include an alkyl silyl group and an aryl silyl group. Examples of the silyl group may include, but are not limited to, a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and so on.

In the description, a thio group may include an alkyl thio group and an aryl thio group. The thio group may be a sulfur atom that is bonded to an alkyl group or to an aryl group defined above. Examples of the thio group may include, but are not limited to, a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, or the like.

In the description, the oxy group may be an oxygen atom that is bonded to an alkyl group or to an aryl group defined above. The oxy group may include an alkoxy group and an aryl oxy group. The alkoxy group may be a linear, branched, or cyclic type. The number of carbon atoms of the alkoxy group is not particularly limited, but may be, for example, 1 to 20, or 1 to 10. Examples of the oxy group may include, but are not limited to, methoxy, ethoxy, n-propoxy, isopropoxy, butoxy, pentyloxy, hexyloxy, octyloxy, nonyloxy, decyloxy, benzyloxy, and so on.

In the description "-*" and "*" each indicate a binding site to a neighboring atom.

In an embodiment, a polycyclic compound according to an embodiment may be represented by Formula 1 below.

[Formula 1]

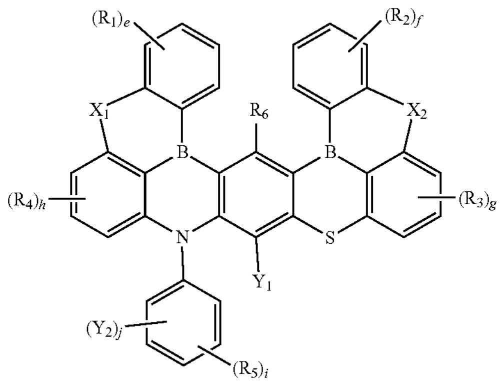

In Formula 1, $X_1$ and $X_2$ may each independently be $N(Ar_1)$, O, or S.

In Formula 1, $Ar_1$ may be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 1, $Y_1$ and $Y_2$ may each independently be a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring, where at least one of $Y_1$ and $Y_2$ may be F or $CF_3$.

In Formula 1, $R_1$ to $R_6$ may each independently be a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring.

In Formula 1, e and f may each independently be an integer from 0 to 4. If e is 2 or more, multiple $R_1$(s) may be the same as or different from each other, and if f is 2 or more, multiple $R_2$ (s) may be the same as or different from each other.

In Formula 1, g and h may each independently be an integer from 0 to 3. If g is 2 or more, multiple $R_3$(s) may be the same as or different from each other, and if h is 2 or more, multiple $R_4$(s) may be the same as or different from each other.

In Formula 1, j and i may each independently be an integer from 0 to 5, where the sum of j and i may be equal to or less than 5. If j is 2 or more, multiple $Y_2$ (s) may be the same as or different from each other, and if i is 2 or more, multiple $R_5$(s) may be the same as or different from each other.

In an embodiment, $X_1$ and $X_2$ may be the same as each other.

In an embodiment, Formula 1 may be represented by Formula 2 below.

[Formula 2]

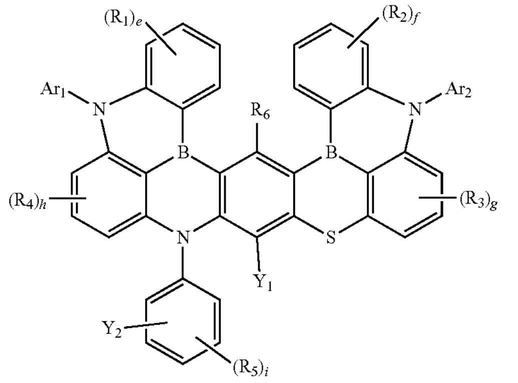

In Formula 2, $Ar_2$ may be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 2, $Ar_1$, $Y_1$, $Y_2$, $R_1$ to $R_6$, and e to j may be the same as defined in connection with Formula 1.

In an embodiment, in Formula 1 or Formula 2, the sum of g and h may be equal to or greater than 1, and at least one of $R_3$ and $R_4$ may be a substituted amine group.

In an embodiment, Formula 2 may be represented by Formula 3 below.

[Formula 3]

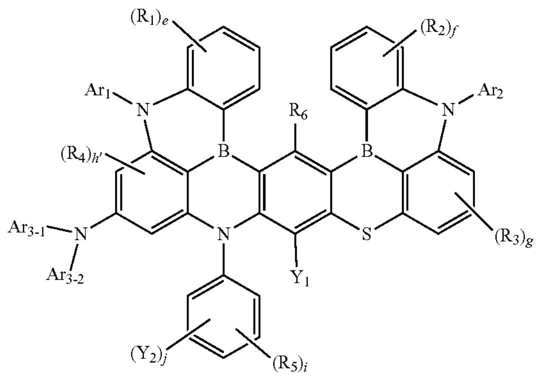

In Formula 3, $Ar_{3-1}$ and $Ar_{3-2}$ may each independently be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 3, h' may be an integer from 0 to 2. If h' is 2, multiple $R_4$(s) may be the same as or different from each other.

In Formula 3, $Ar_1$, $Ar_2$, $Y_1$, $Y_2$, $R_1$ to $R_6$, e to g, i, and j may be the same as defined in connection with Formula 2.

In an embodiment, Formula 2 may be represented by Formula 4 below.

[Formula 4]

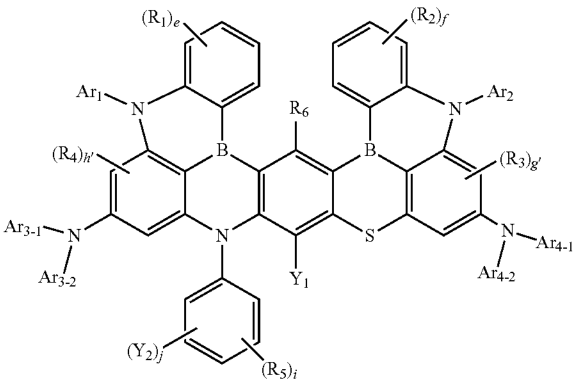

In Formula 4, $Ar_{3-1}$, $Ar_{3-2}$, $Ar_{4-1}$, and $Ar_{4-2}$ may each independently be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 4, h' and g' may each independently be an integer from 0 to 2. If h' is 2, multiple $R_4$(s) may be the same as or different from each other, and if g' is 2, multiple $R_3$(s) may be the same as or different from each other.

In Formula 4, $Ar_1$, $Ar_2$, $Y_1$, $Y_2$, $R_1$ to $R_6$, e, f, i, and j may be the same as defined in connection with Formula 2.

In an embodiment, $Ar_{3-1}$, $Ar_{3-2}$, $Ar_{4-1}$, and $Ar_{4-2}$ in Formula 4 may each independently be a substituted or unsubstituted ring-forming aryl group having 6 to 18 carbon atoms.

In an embodiment, Formula 1 may be represented by Formula 6 below.

[Formula 6]

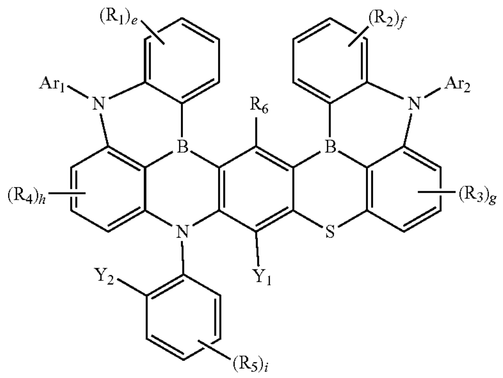

In Formula 6, $Ar_2$ may be a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 6, $Ar_1$, $Y_1$, $Y_2$, $R_1$ to $R_6$, and e to j may be the same as defined in connection with Formula 1.

In an embodiment, $Ar_1$ and $Ar_2$ of Formula 1 to Formula 6 may each independently be represented by any one among Formula 5-1 to Formula 5-3 below.

[Formula 5-1]

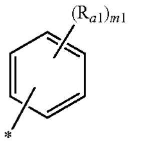

[Formula 5-2]

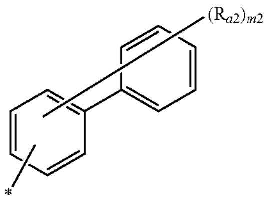

[Formula 5-3]

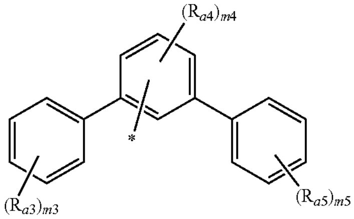

In Formula 5-1 to Formula 5-3, $R_{a1}$ to $R_{a5}$ may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 5-1, m1 may be an integer from 0 to 5. If m1 is 2 or more, multiple $R_{a1}$(s) may be the same as or different from each other.

In Formula 5-2, m2 may be an integer from 0 to 9. If m2 is 2 or more, multiple $R_{a2}$(s) may be the same as or different from each other.

In Formula 5-3, m3 may be an integer from 0 to 5. If m3 is 2 or more, multiple $R_{a3}$(s) may be the same as or different from each other.

In Formula 5-3, m4 may be an integer from 0 to 3. If m4 is 2 or more, multiple $R_{a4}$(s) may be the same as or different from each other.

In Formula 5-3, m5 may be an integer from 0 to 5. If m5 is 2 or more, multiple $R_{a5}$(s) may be the same as or different from each other.

The polycyclic compound represented by Formula 1 according to an embodiment may be any one selected from the compounds represented in Compound Group 1 below. However, embodiments are not limited thereto.

[Compound Group 1]

1

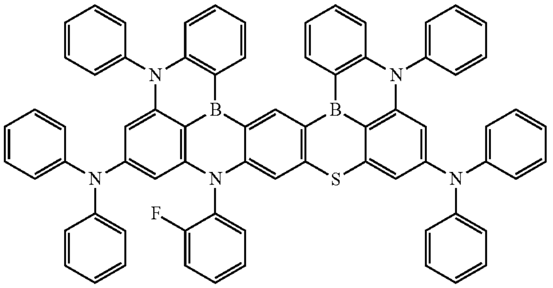

2

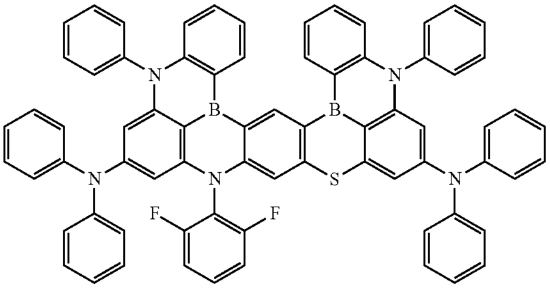

3

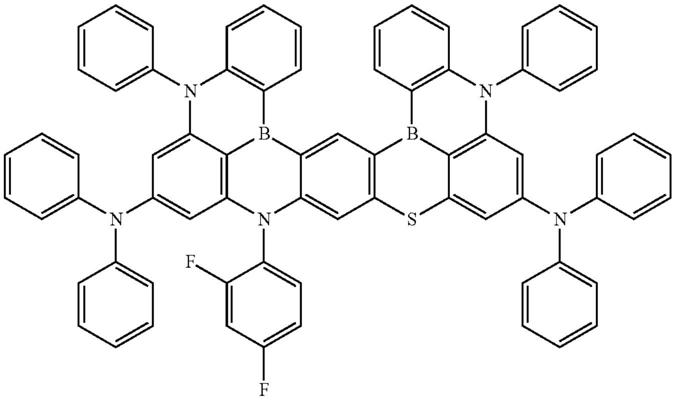

-continued
4
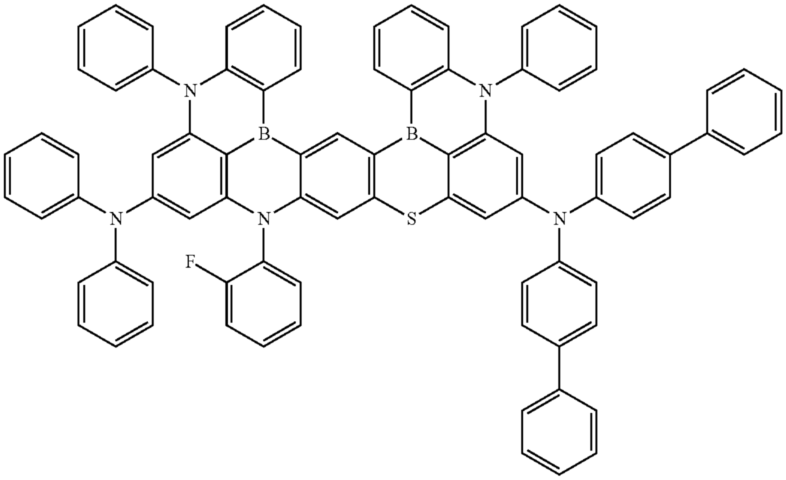
5
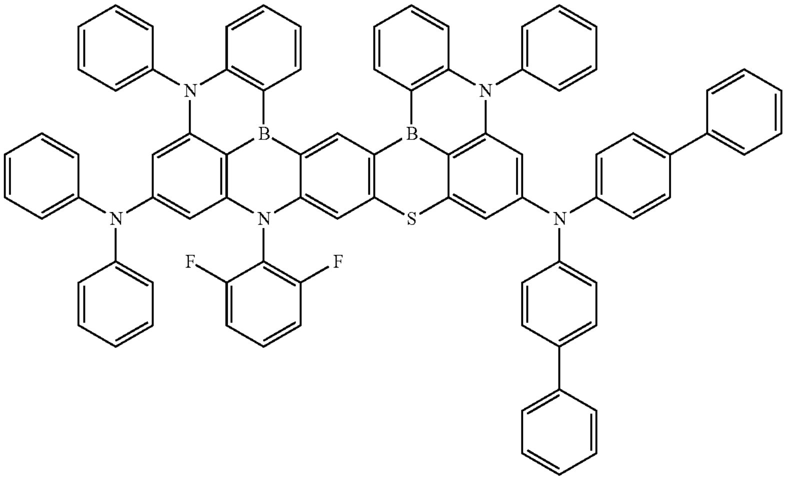
6
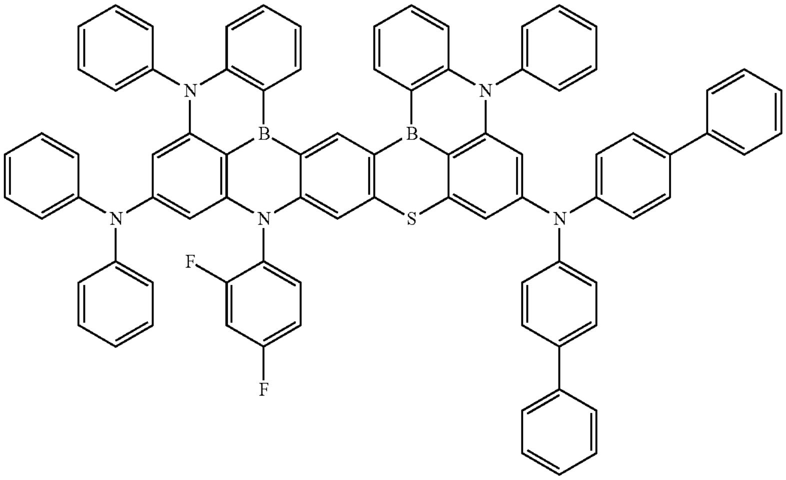

-continued
7
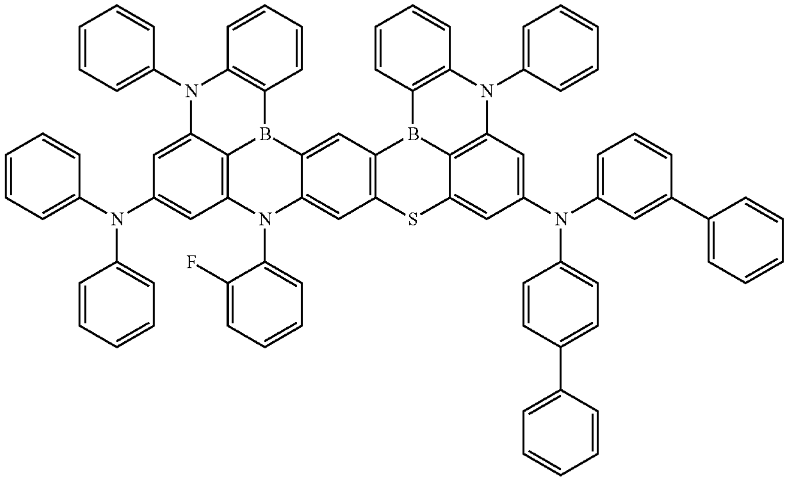
8
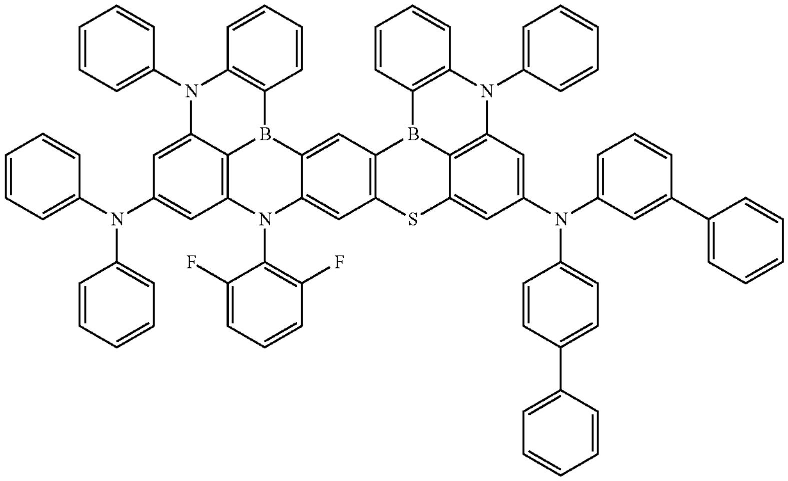
9
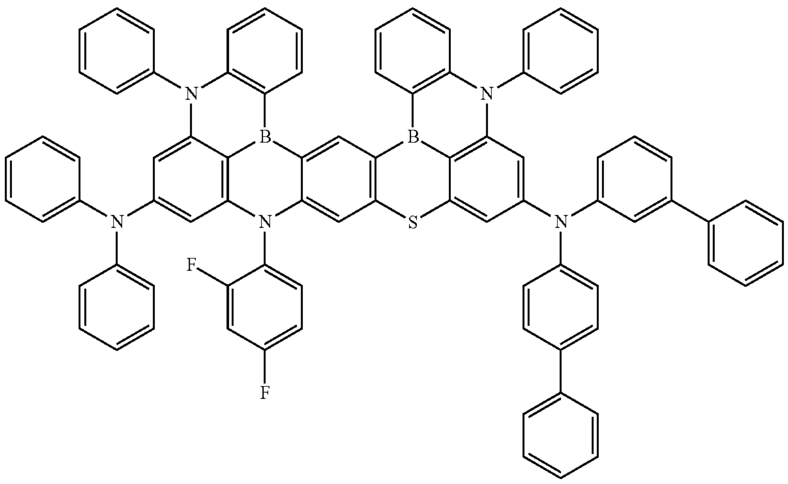

-continued
10
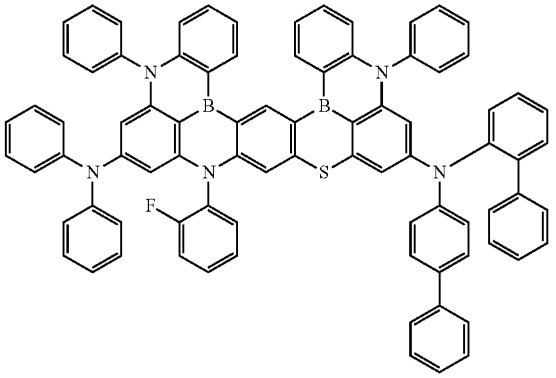
11
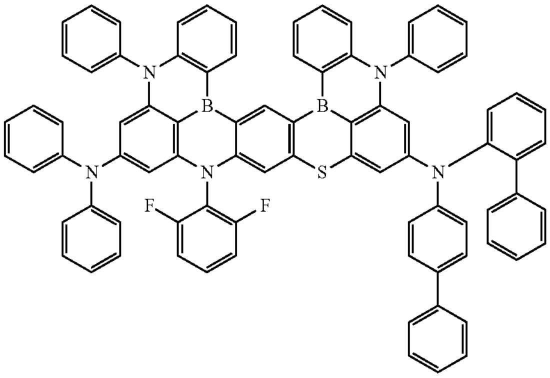
12
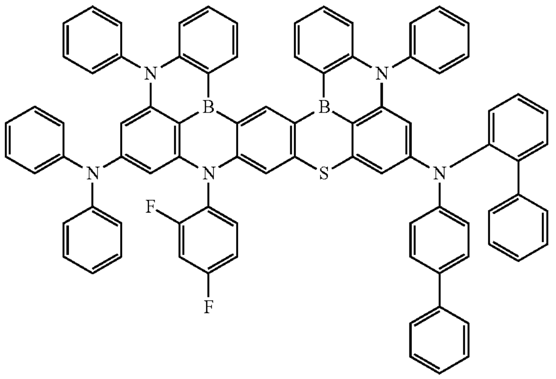
13
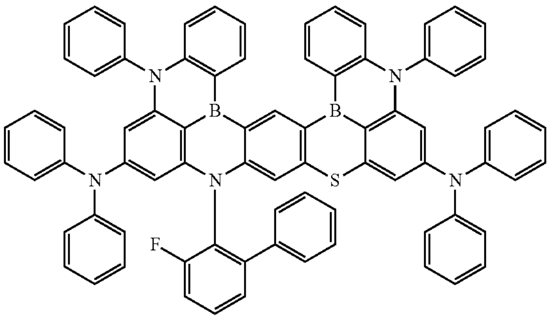
14
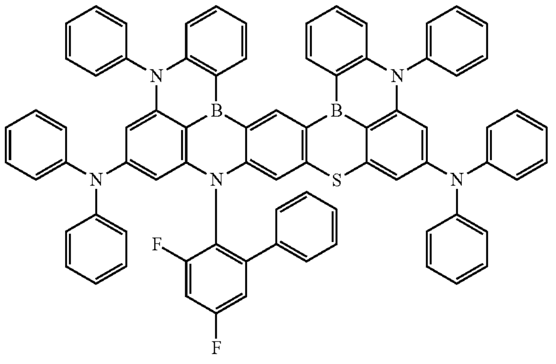
15
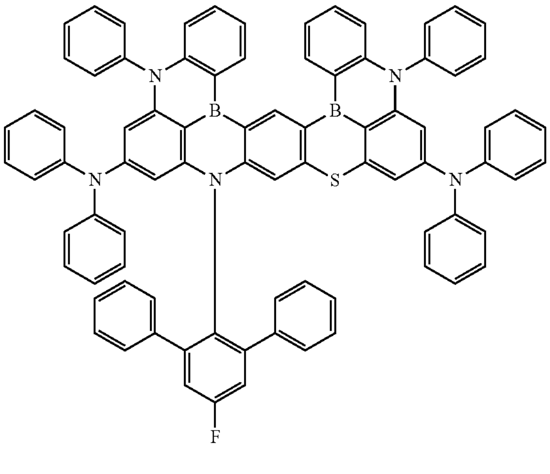

-continued
16
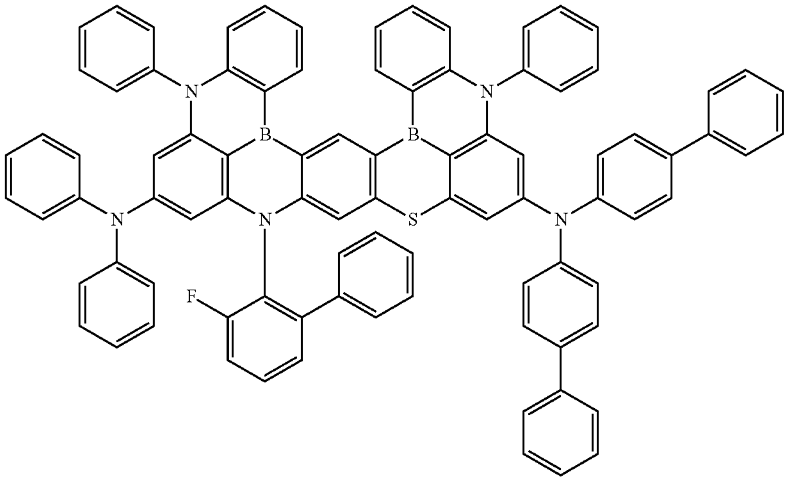
17
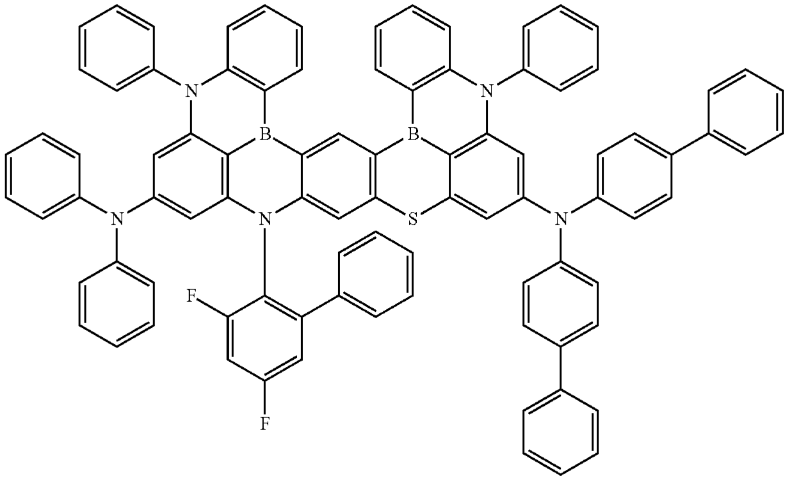
18
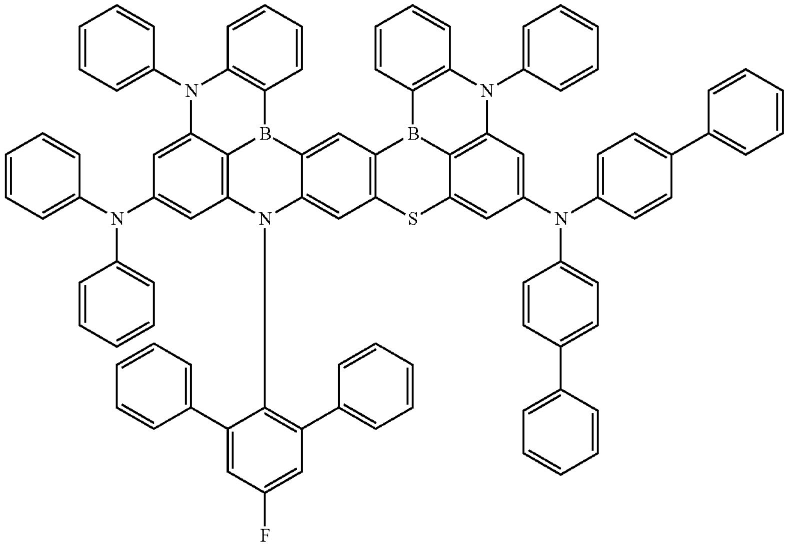

-continued
19
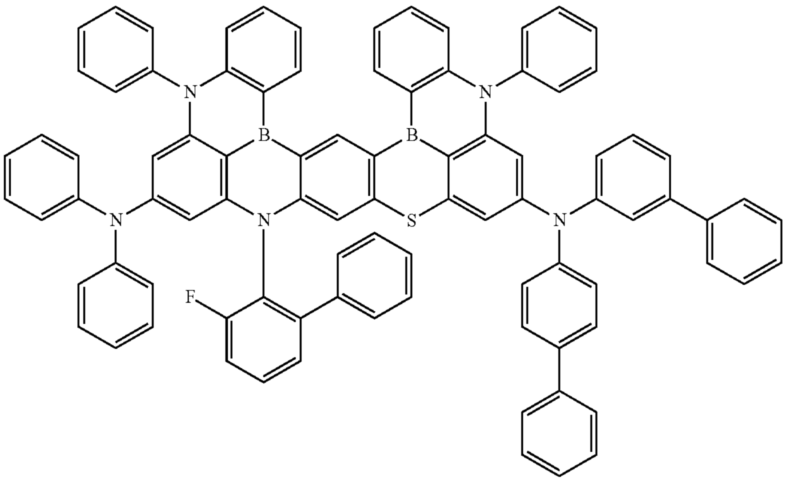
20
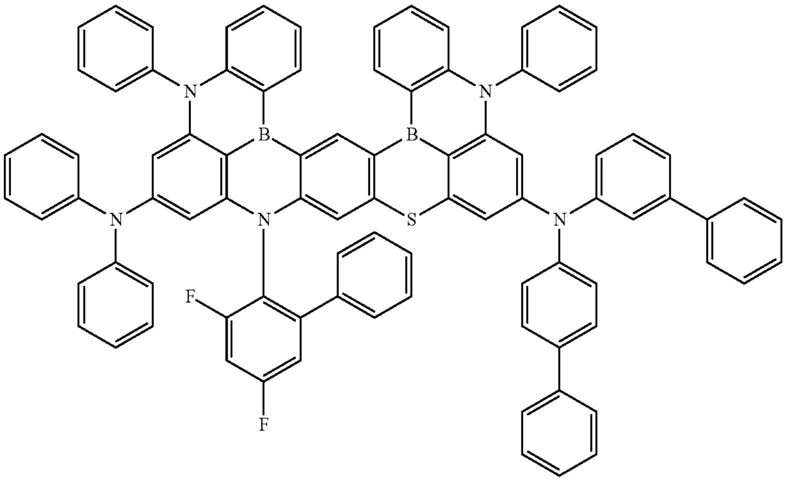
21
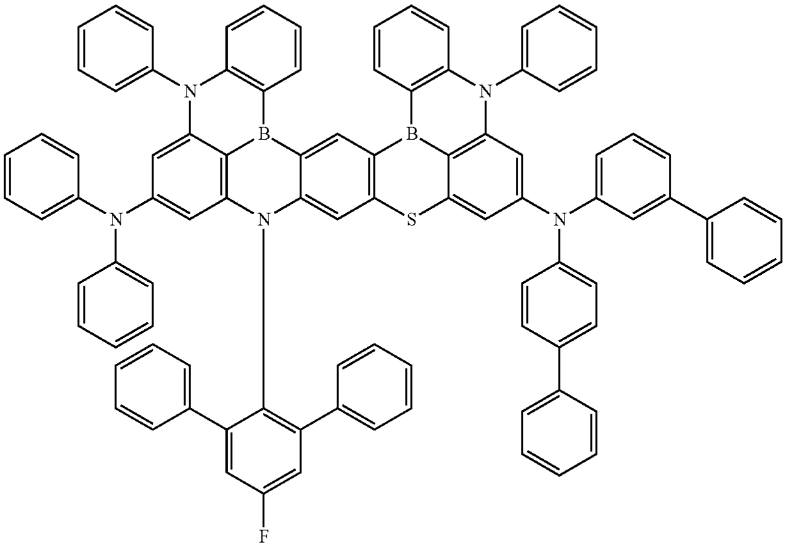

-continued
22
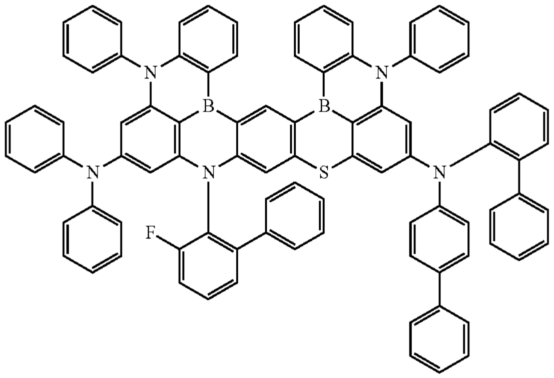
23
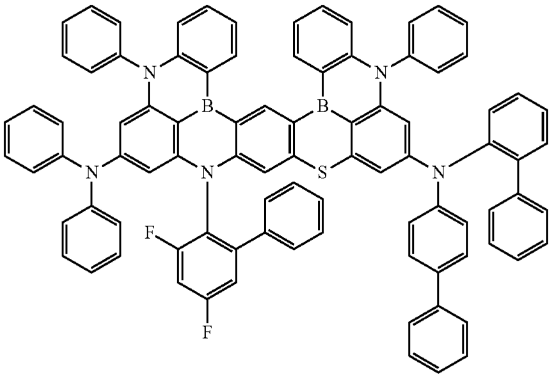
24
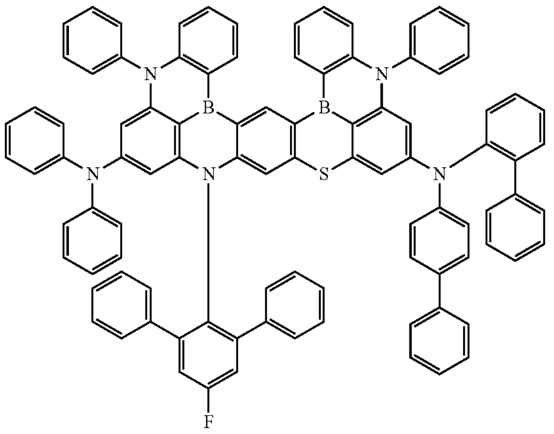
25
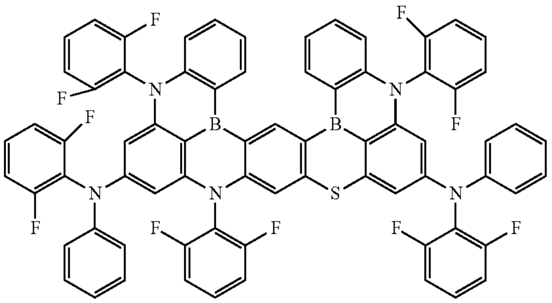
26
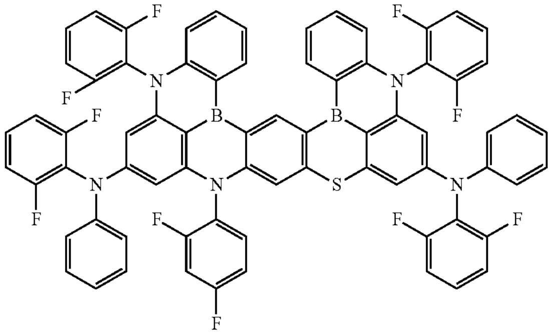
27
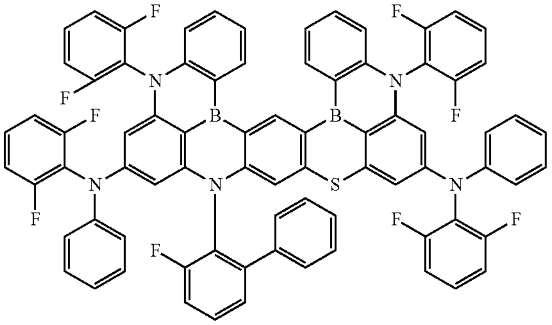

-continued
28
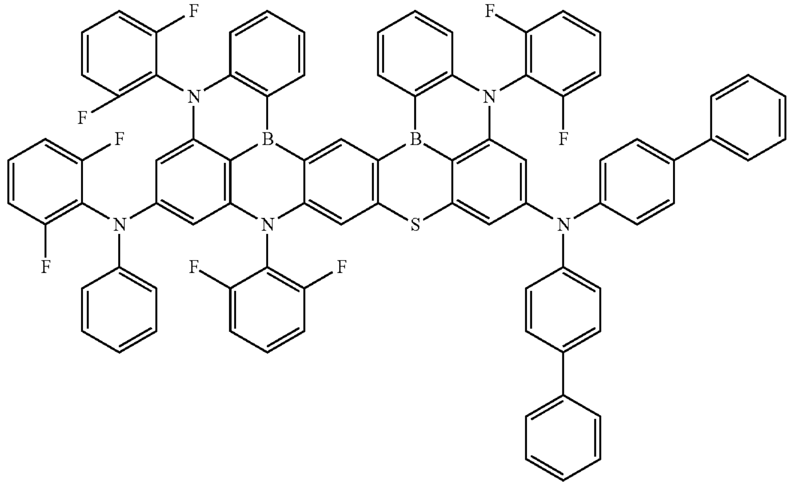
29
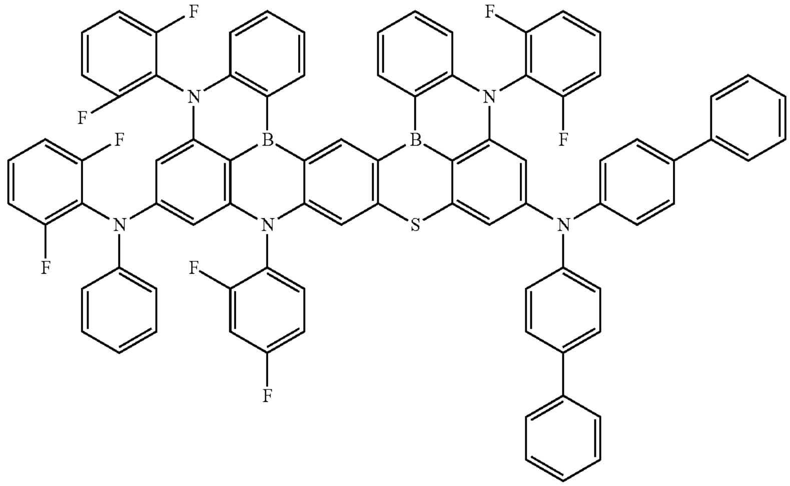
30
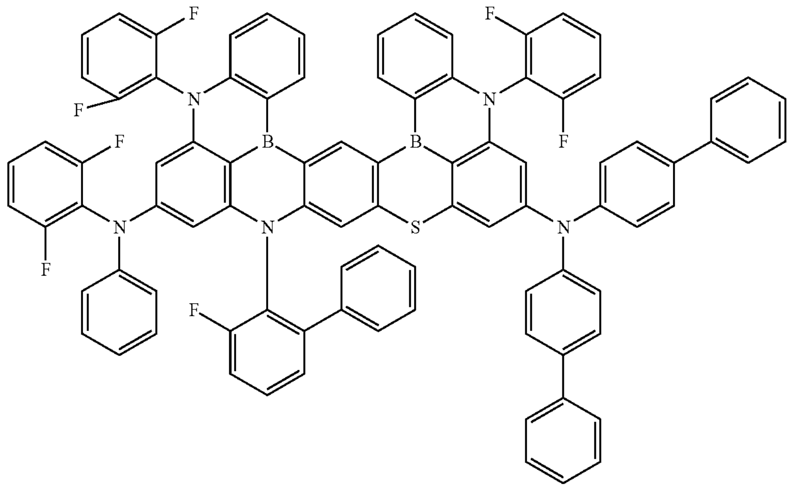

-continued
31
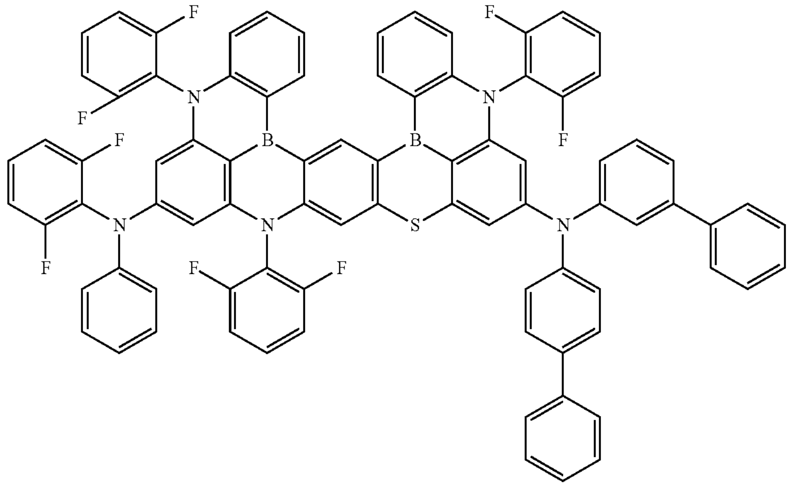
32
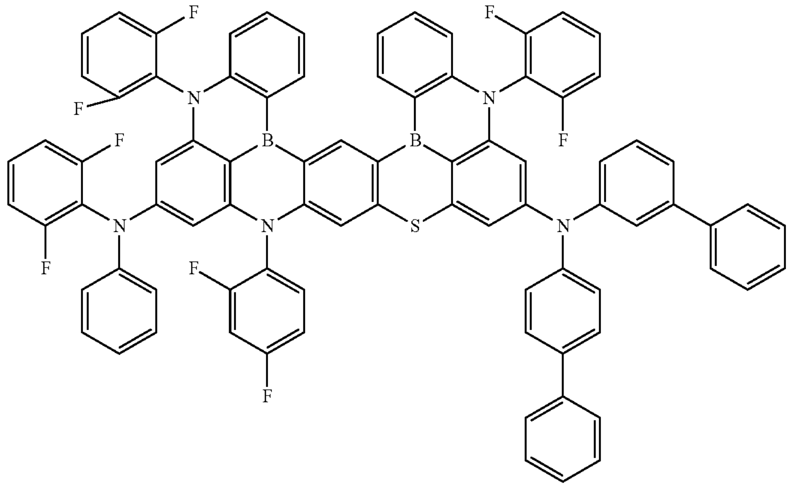
33
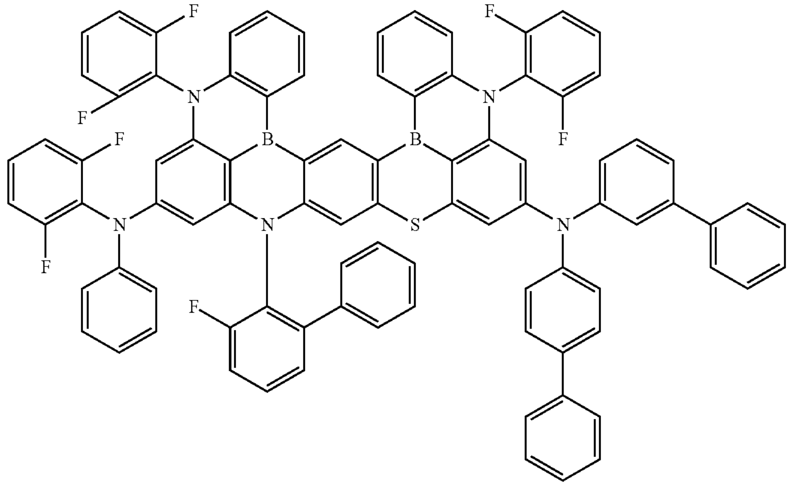

-continued
34
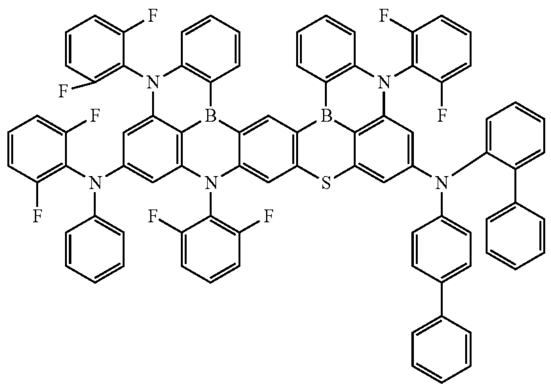
35
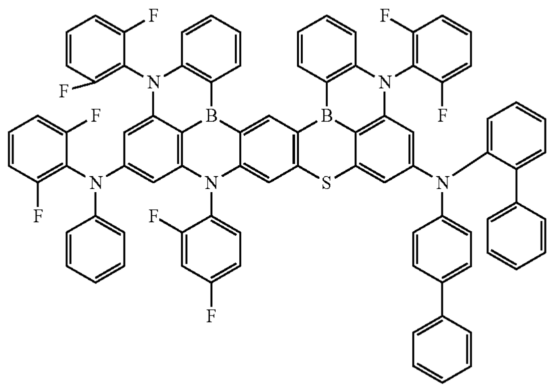
36
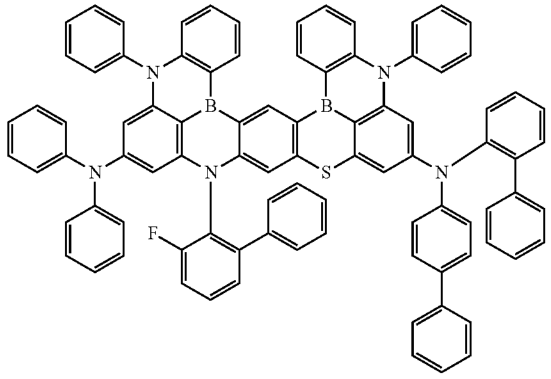
37
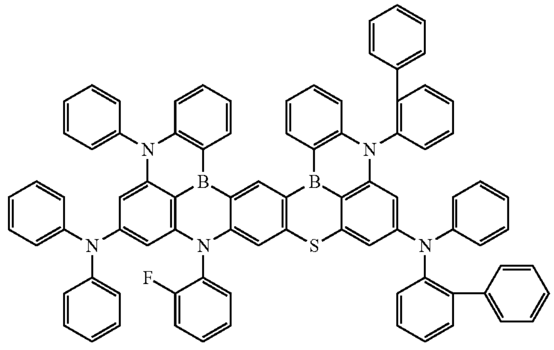
38
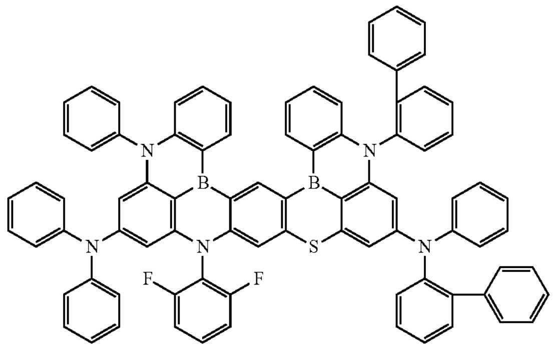
39
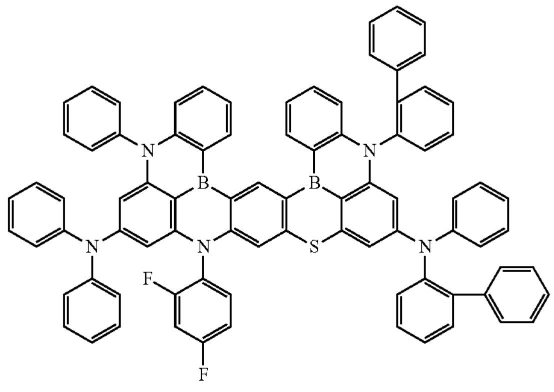

-continued
40
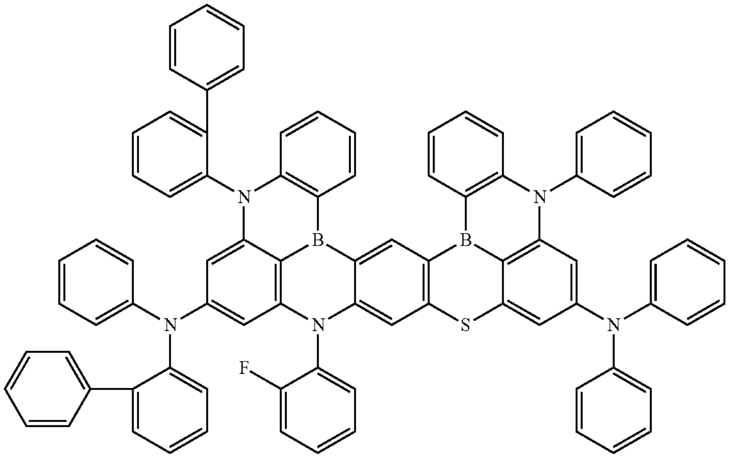
41
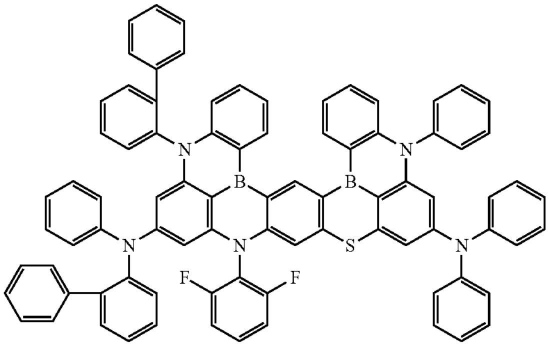
42
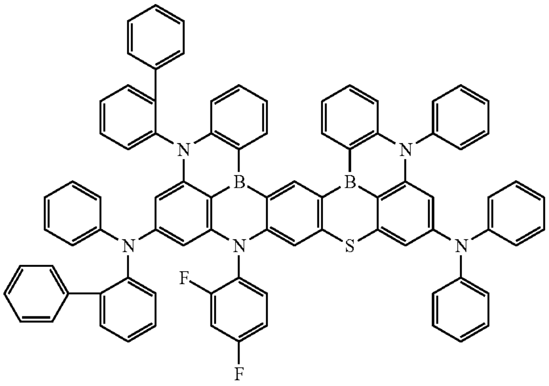
43
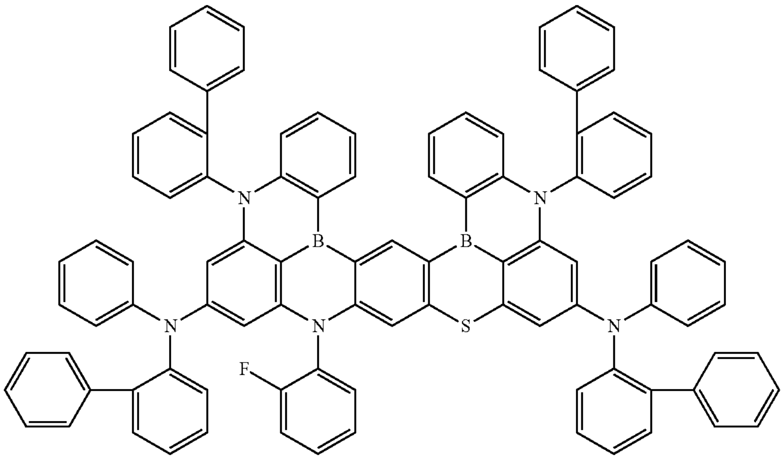

-continued
44
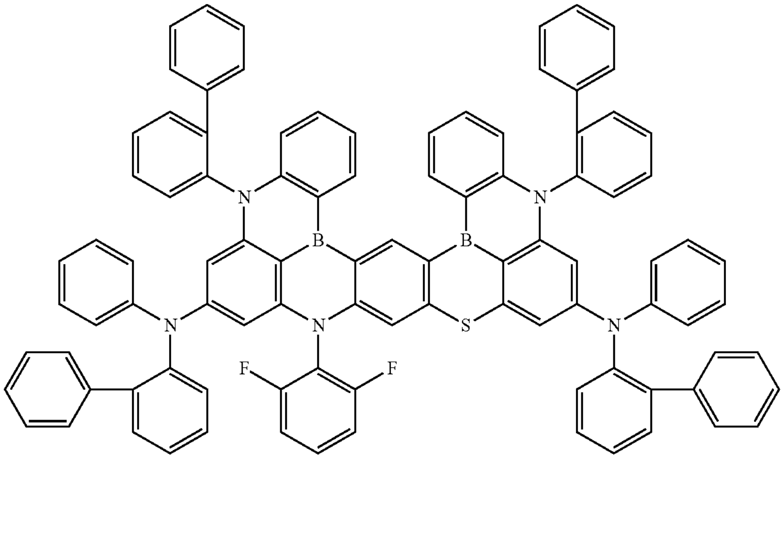
45
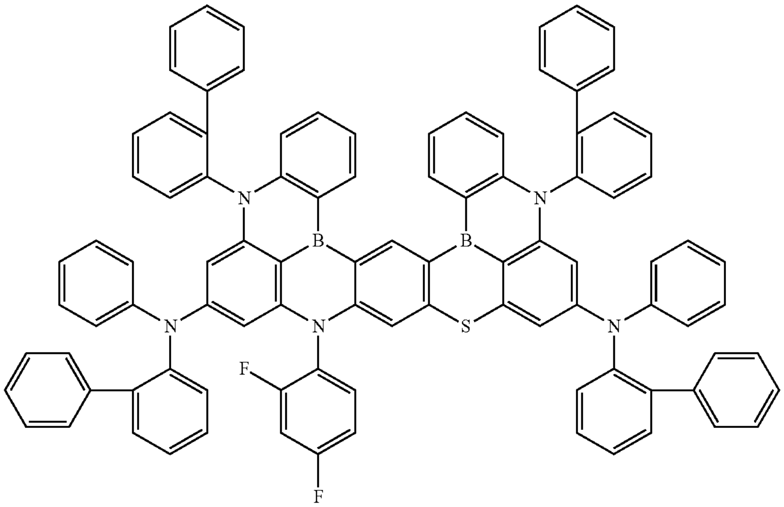
46
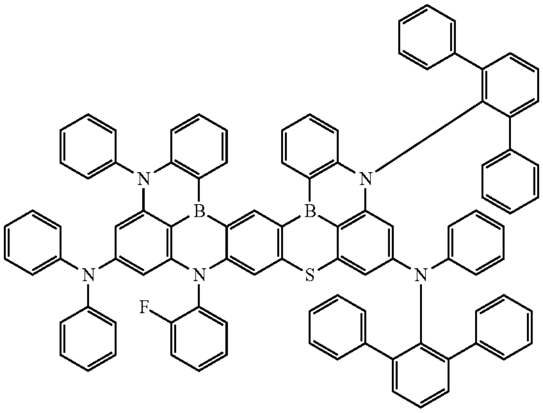
47
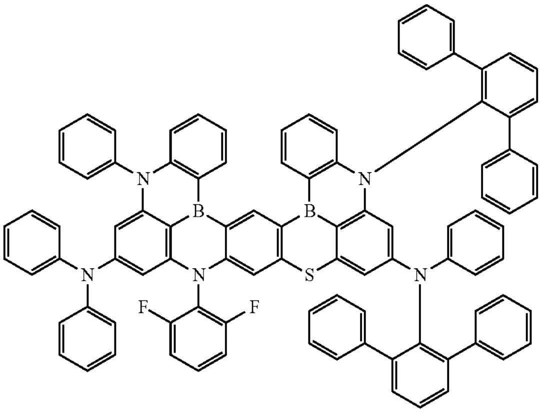

-continued
48
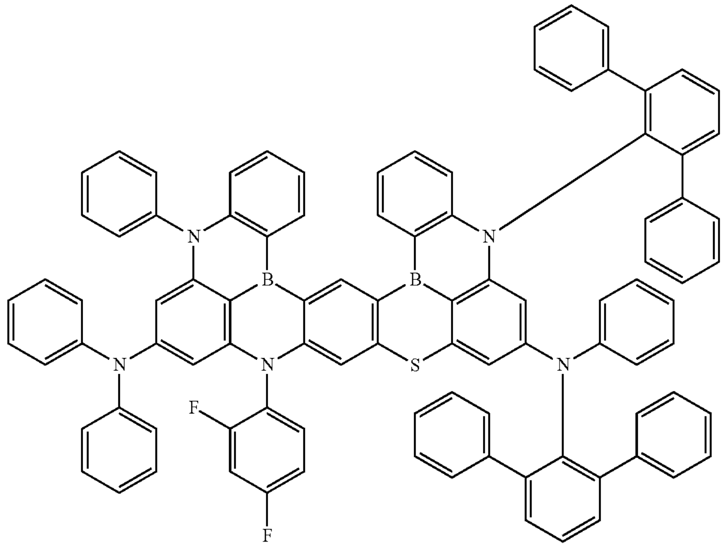
49
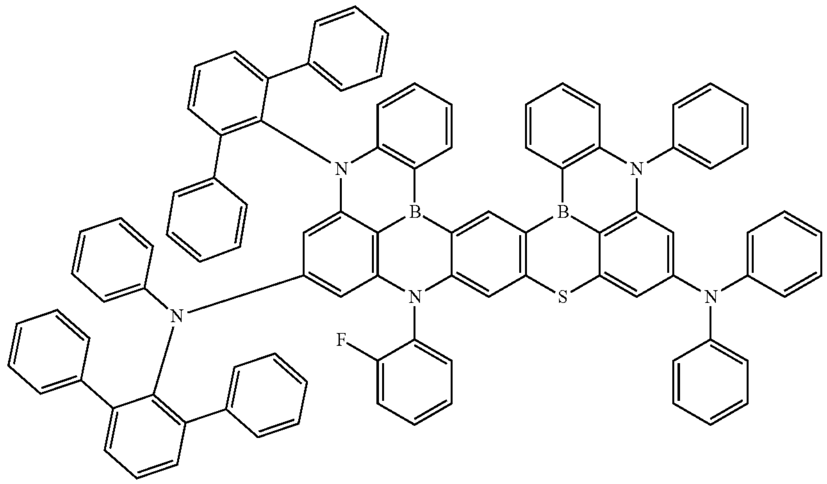
50
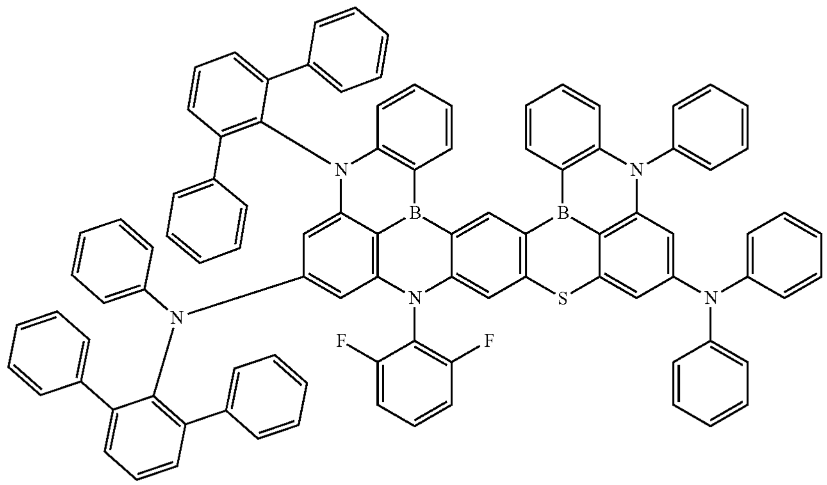

-continued
51
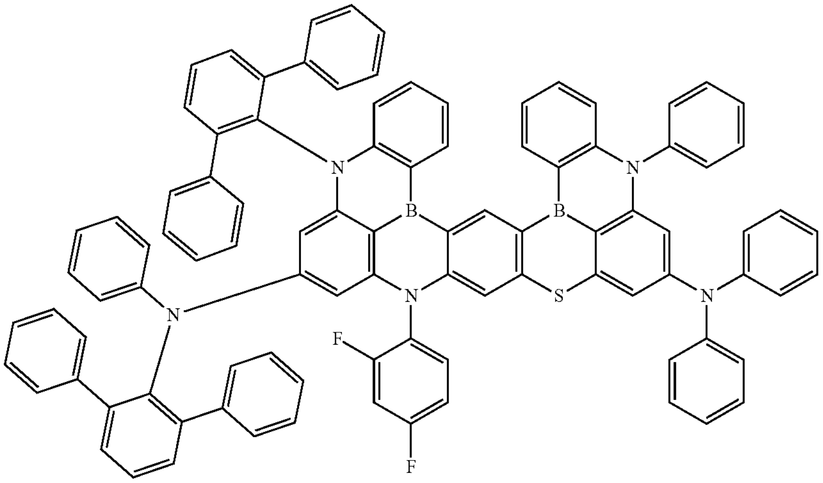
52
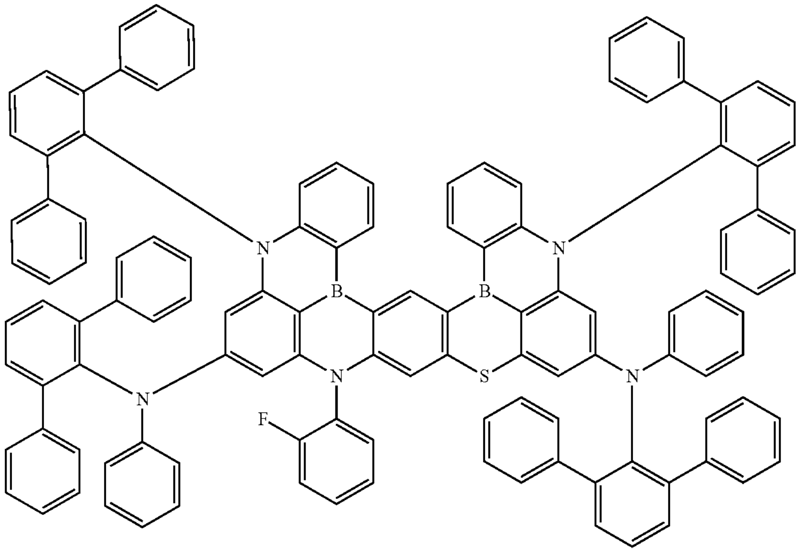
53
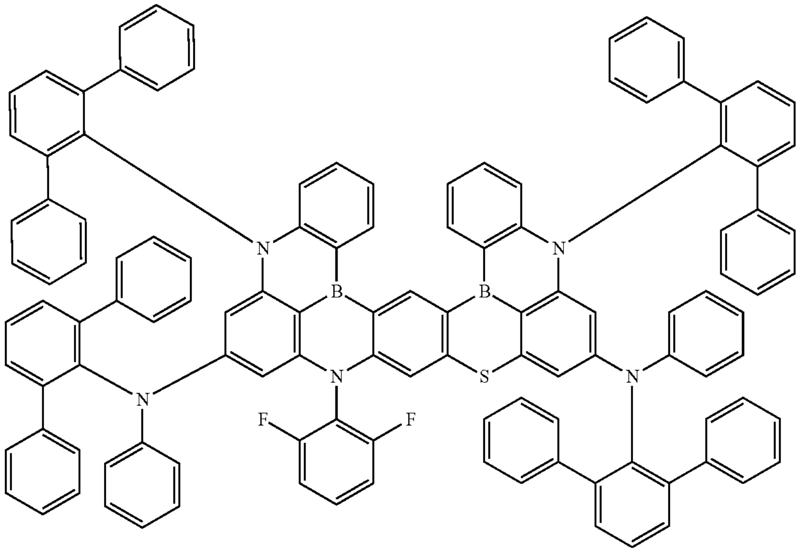

-continued
54
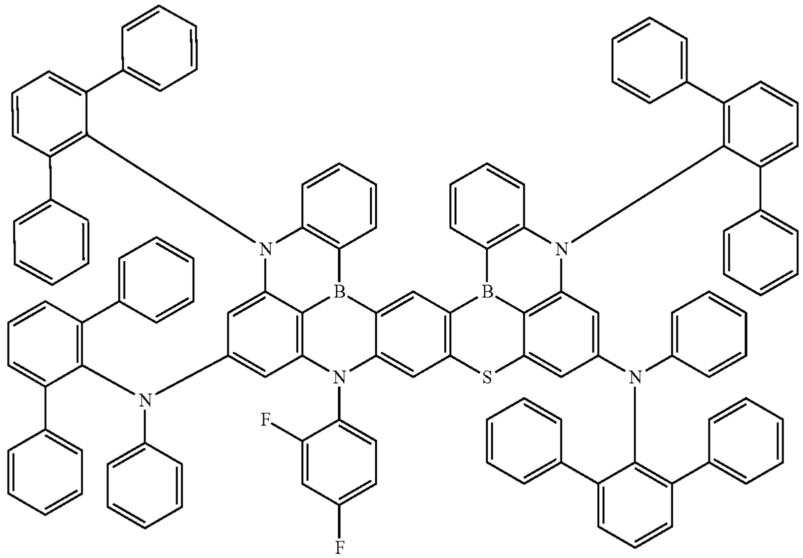
55
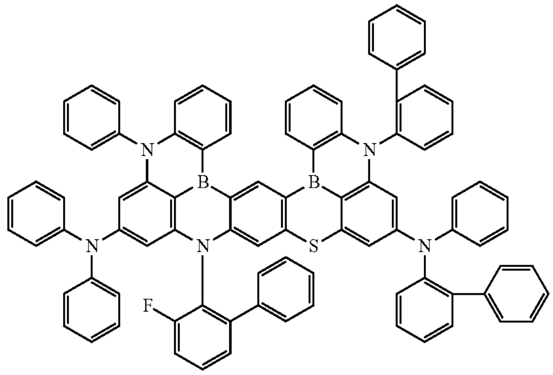
56
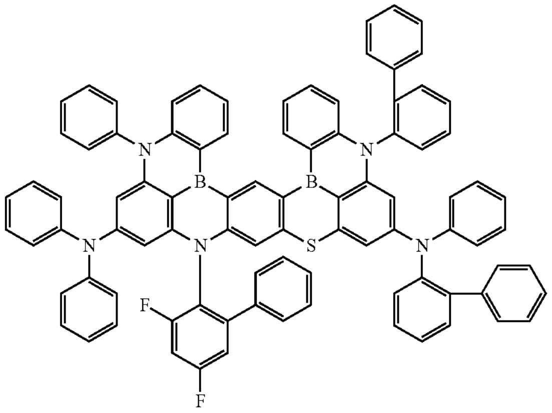
57
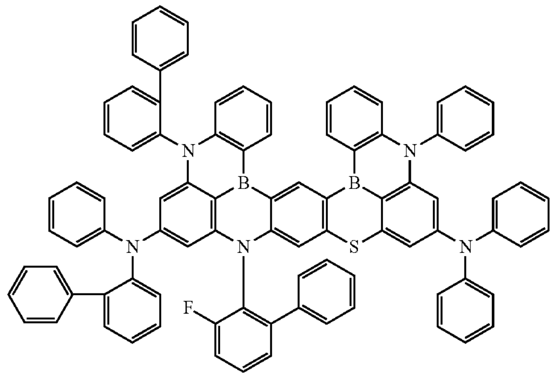
58
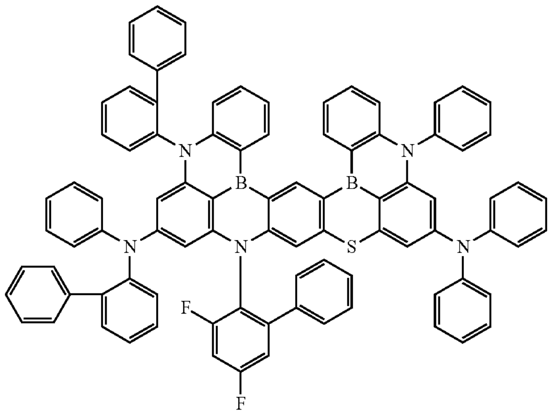

-continued
59
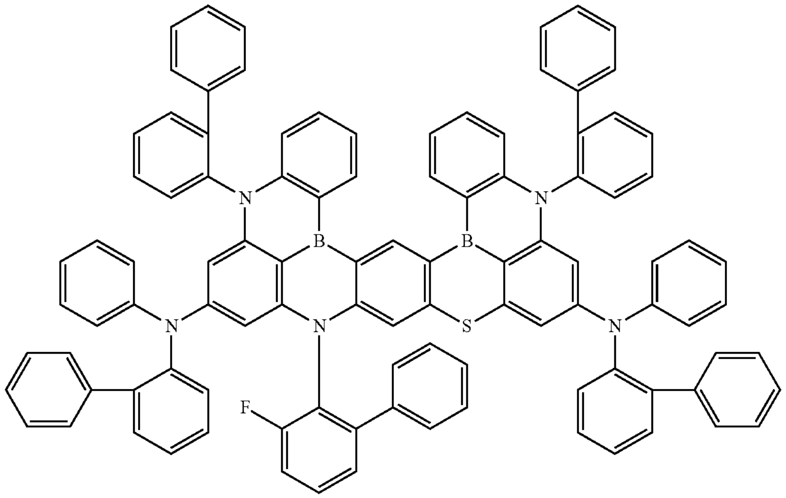
60
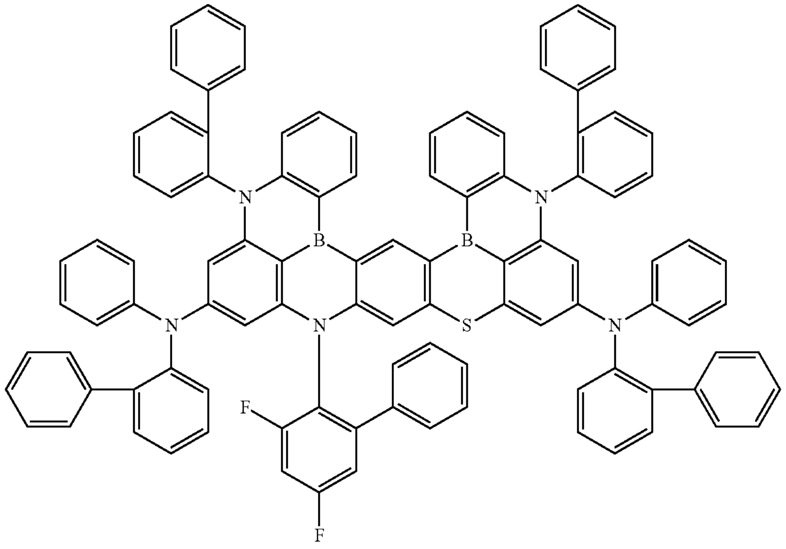
61
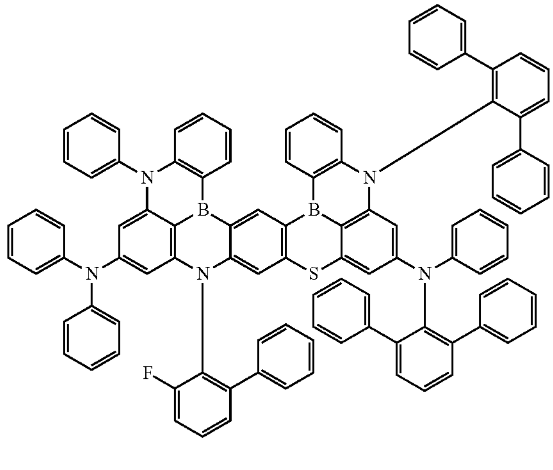
62
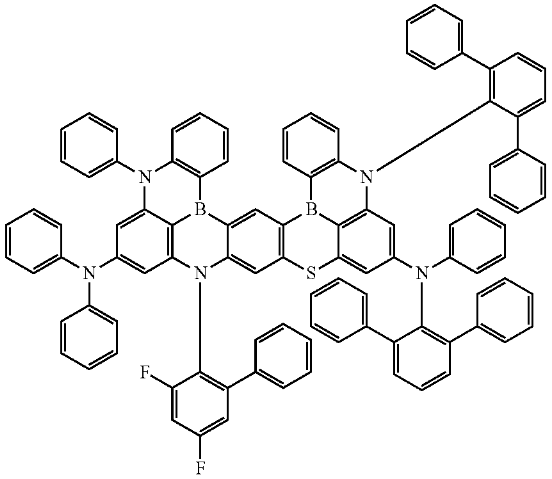

-continued
63
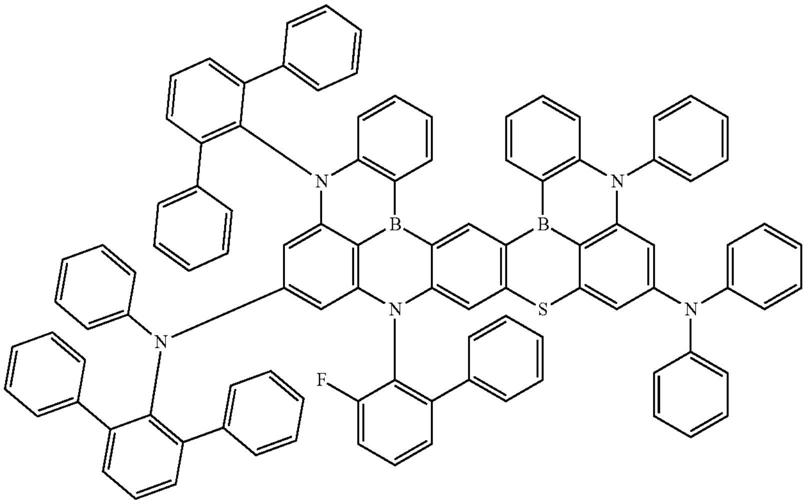
64
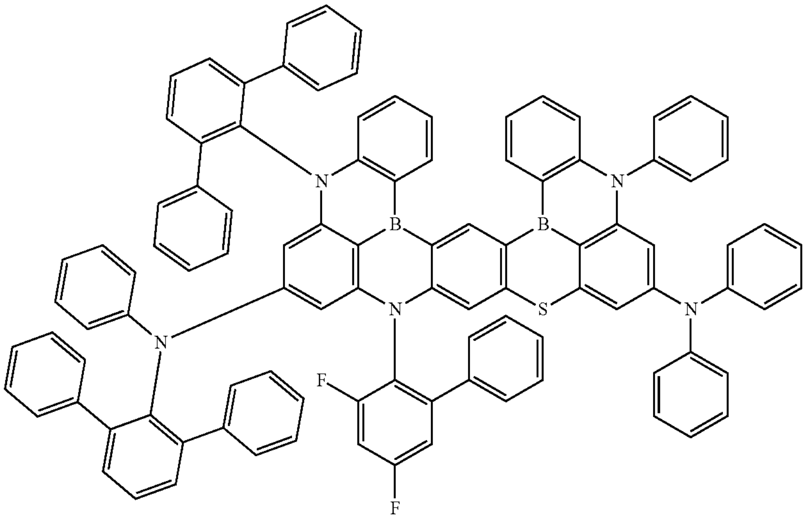
65
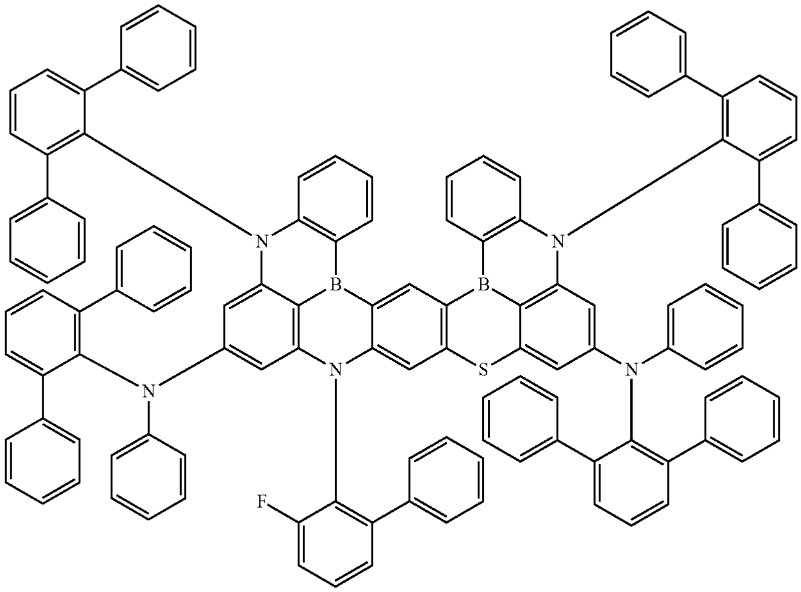

-continued
66
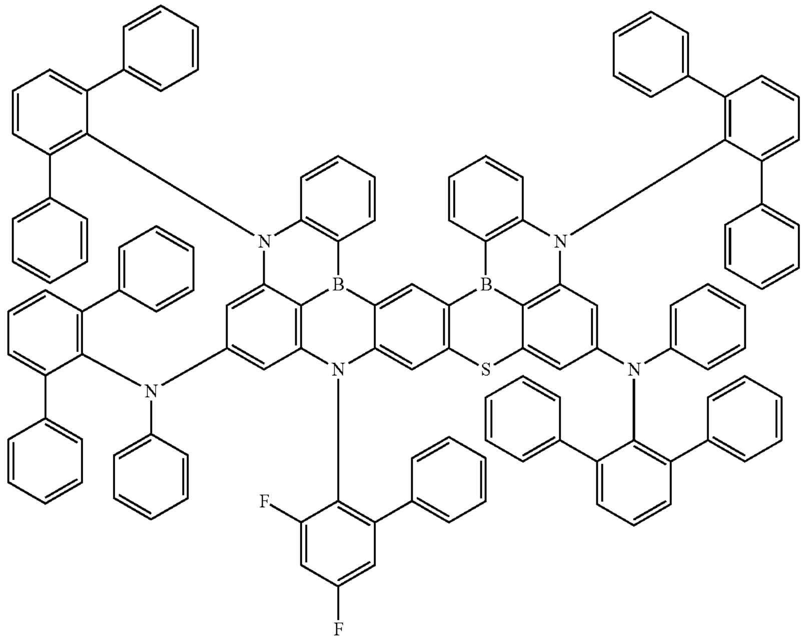
67
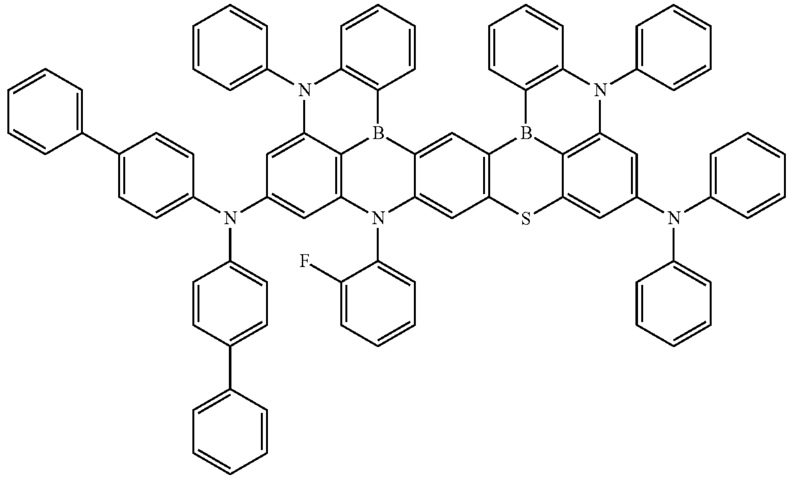
68
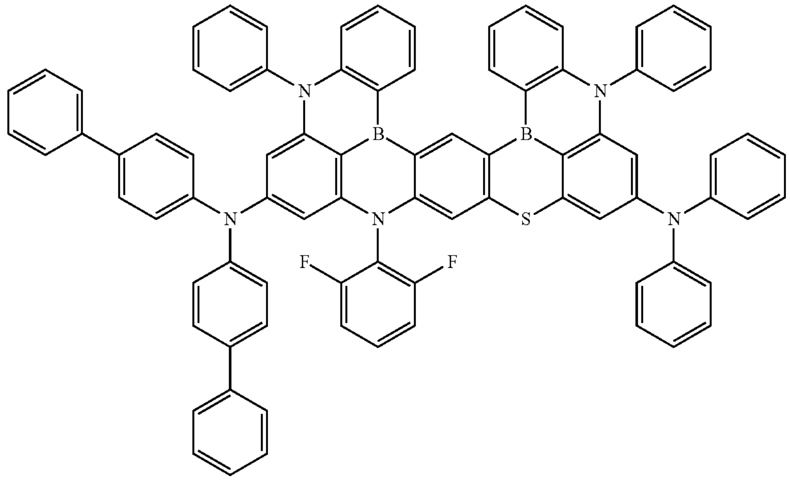

-continued
69
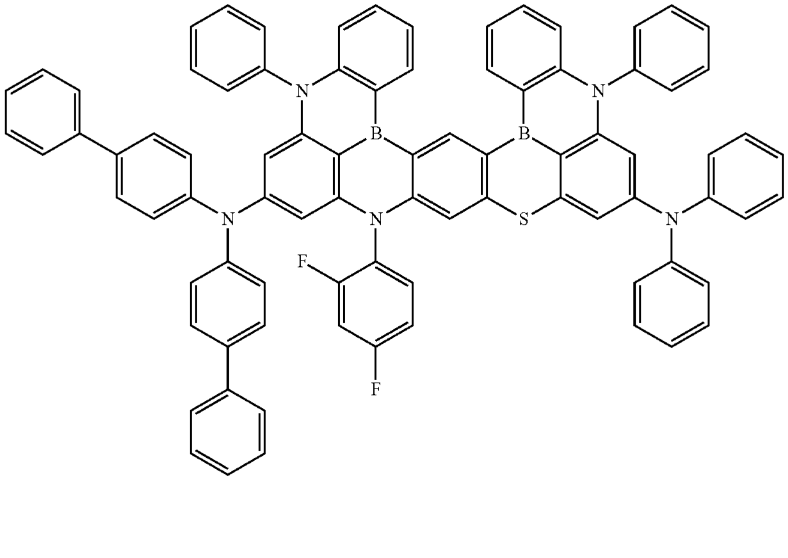
70
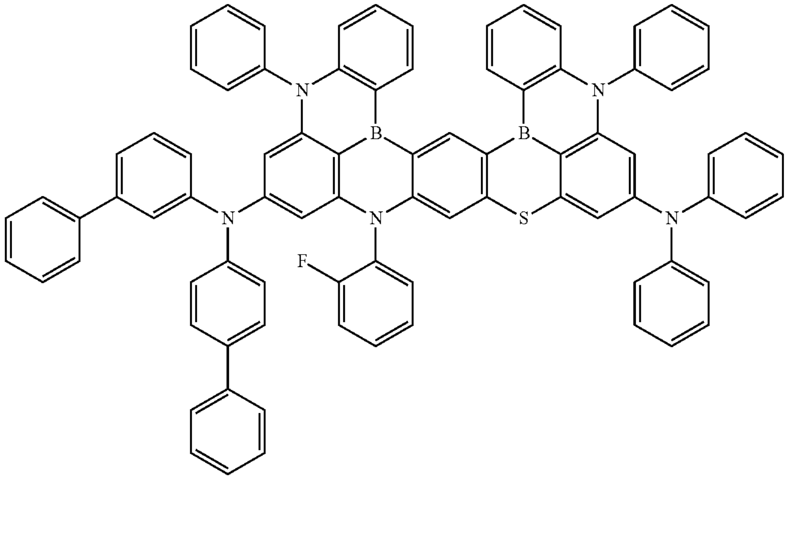
71
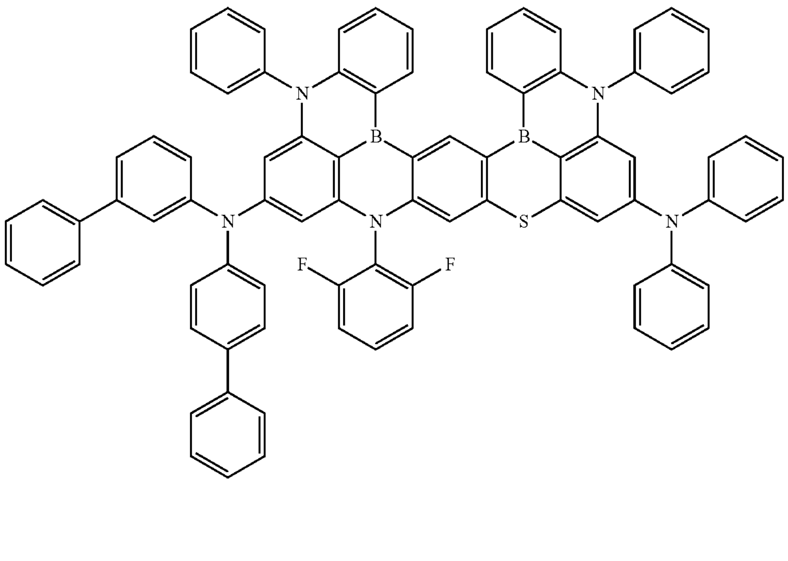

-continued
72
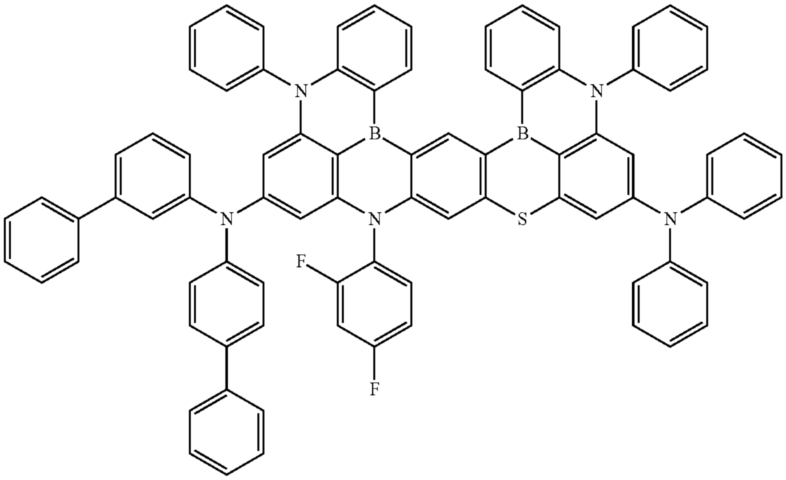
73
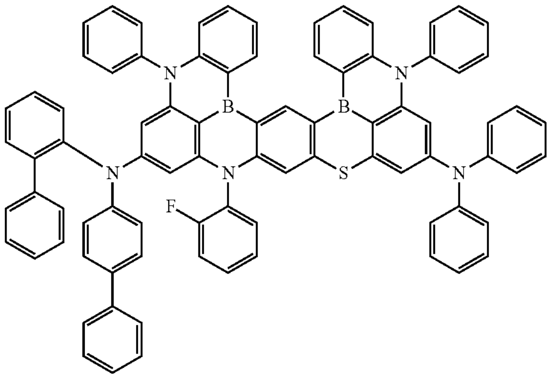
74
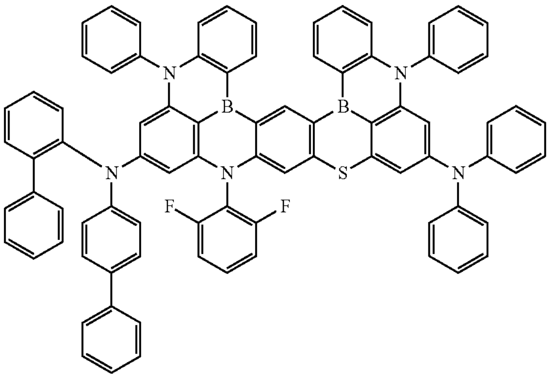
75
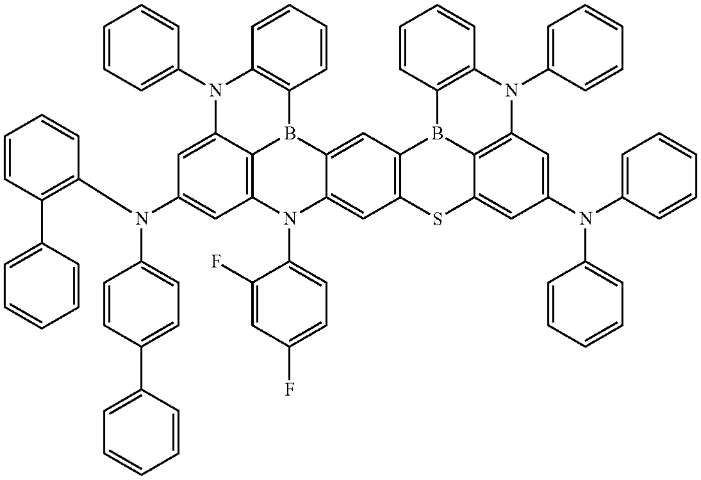

-continued
76
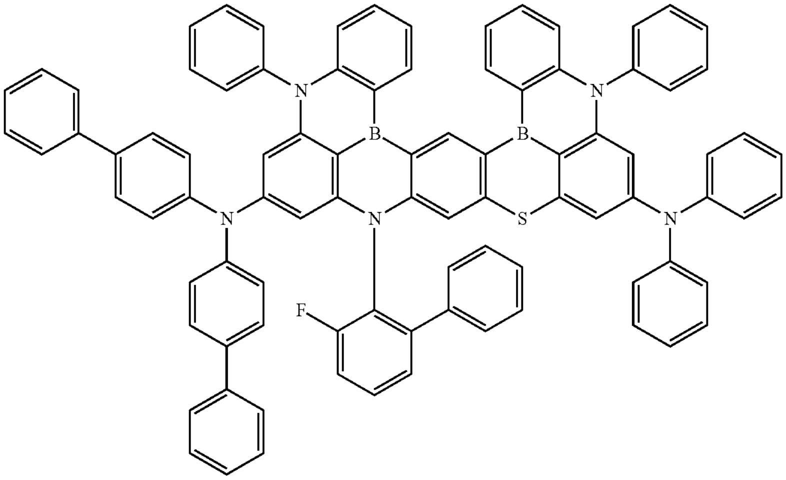
77
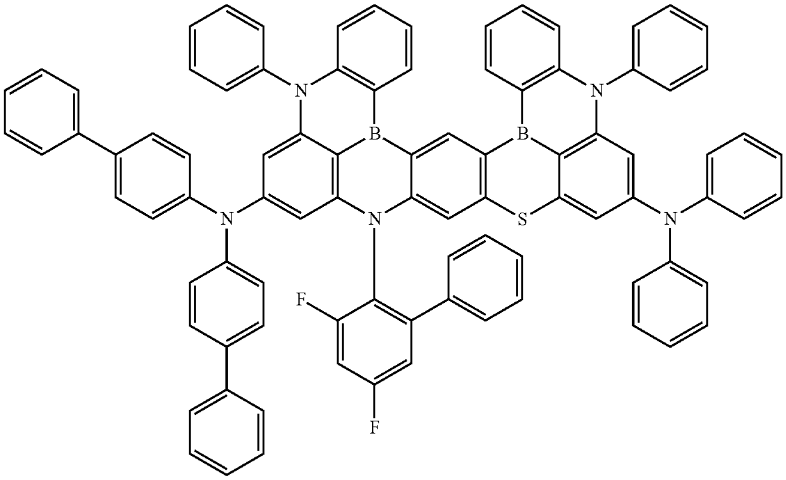
78
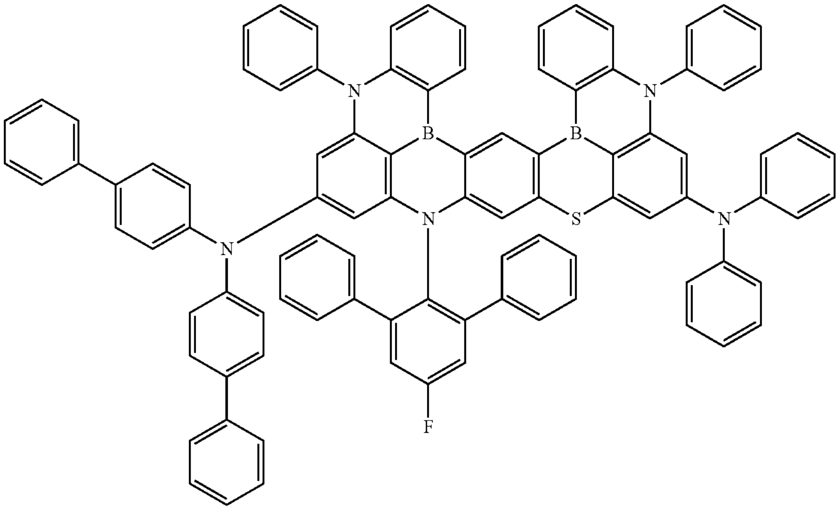

-continued
79
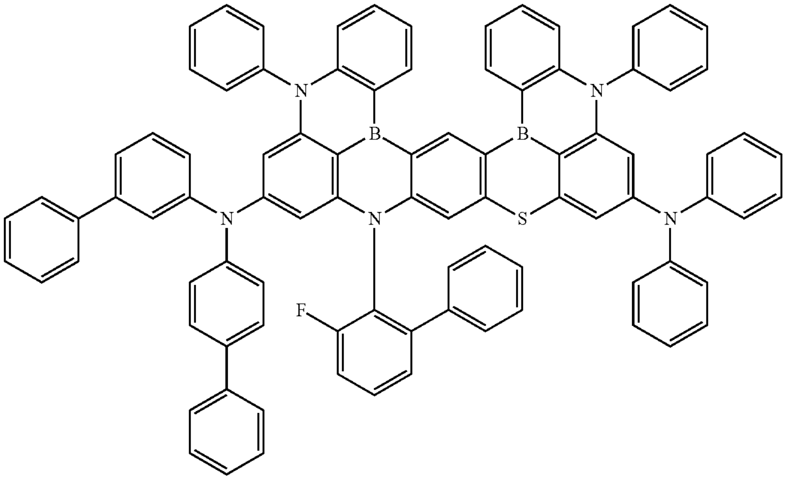
80
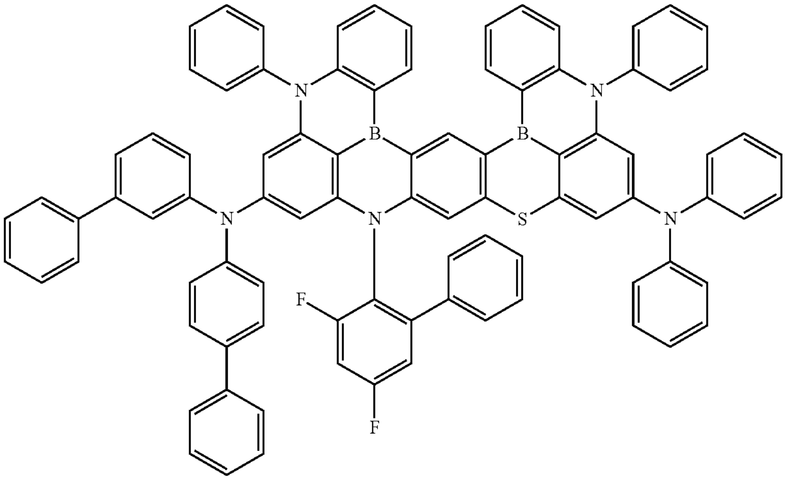
81
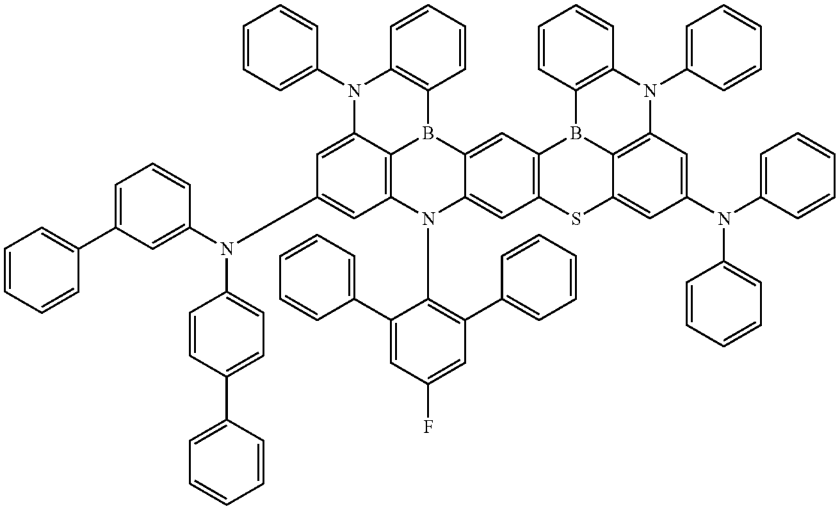

-continued
82
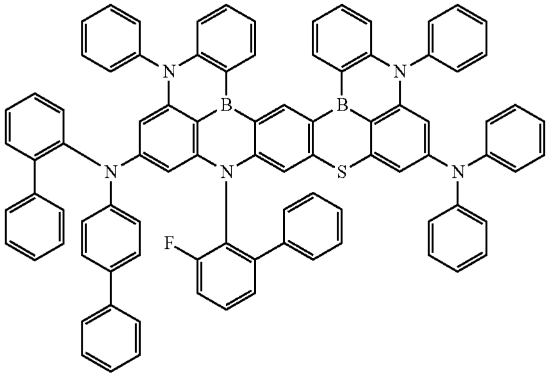
83
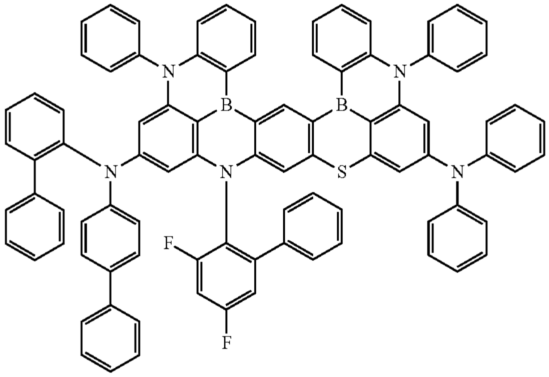
84
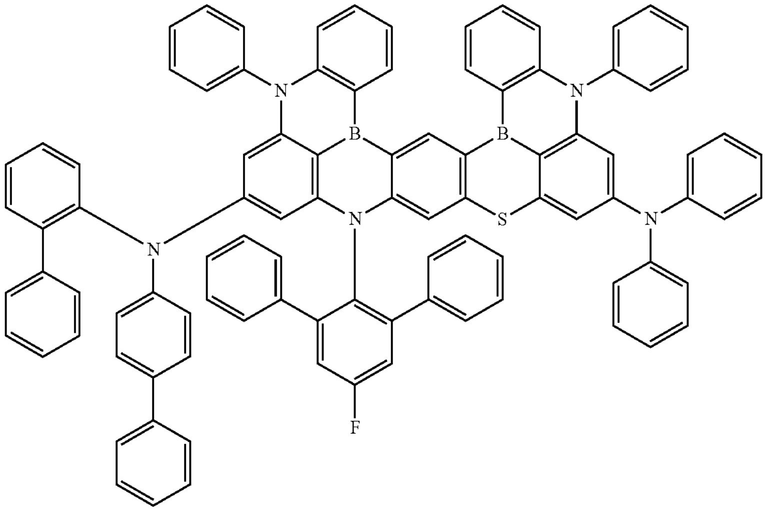
85
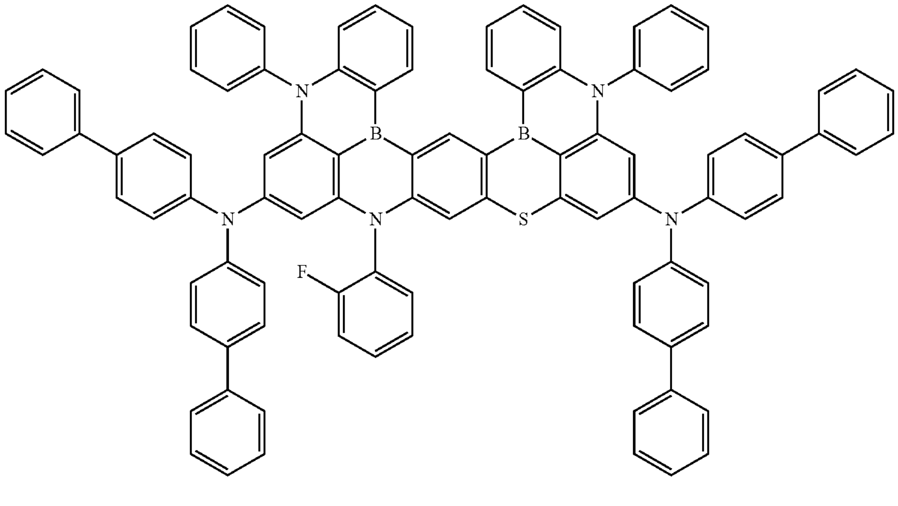

-continued
86
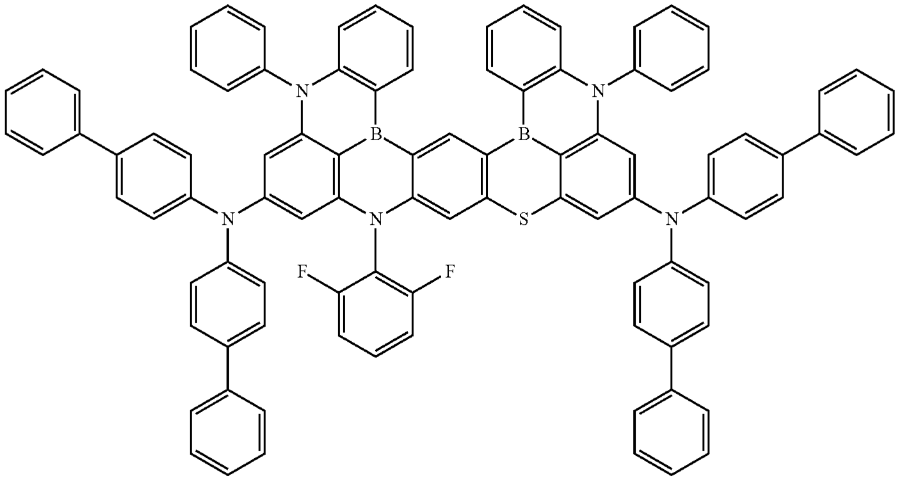
87
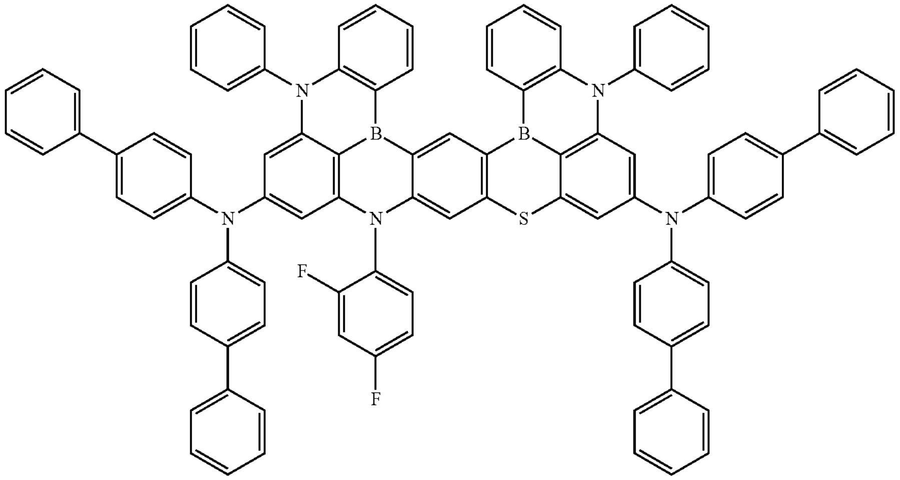
88
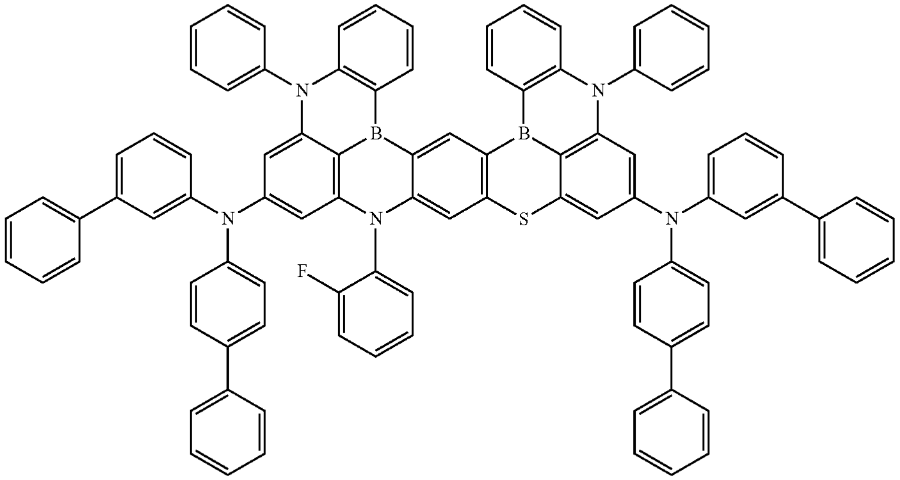

89
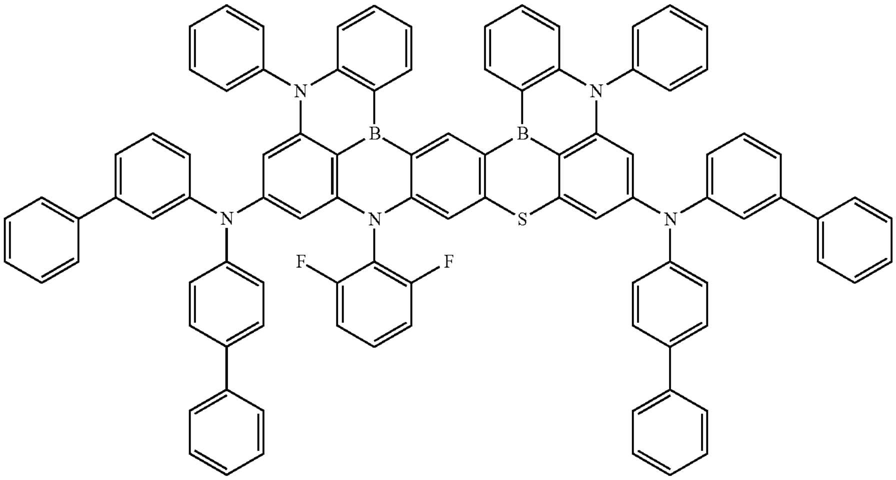
90
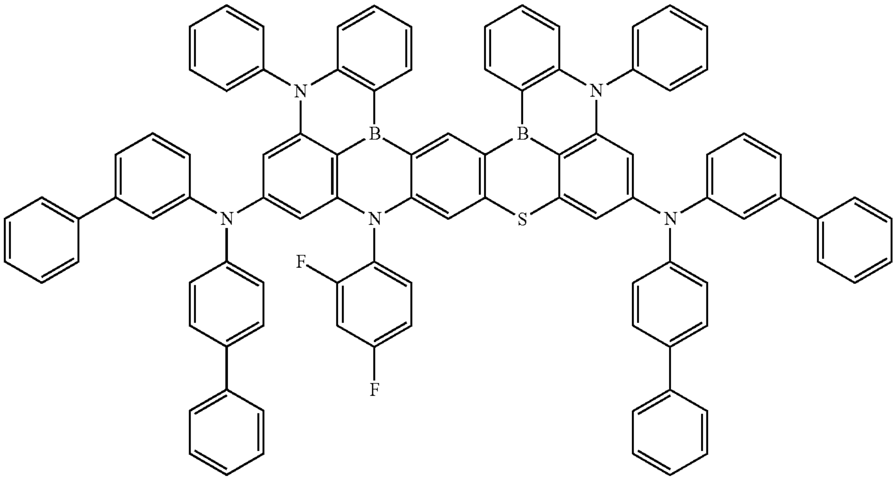
91
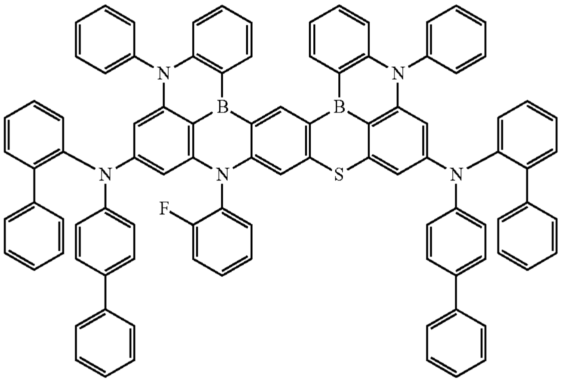
92
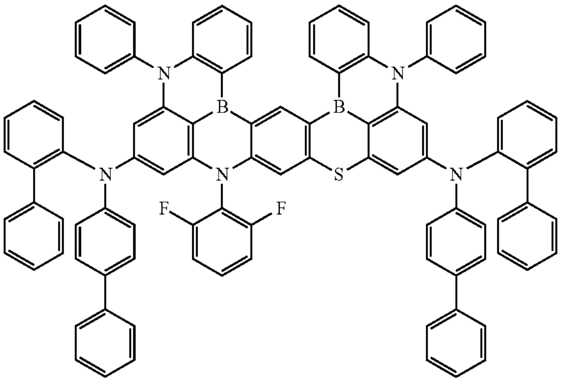

-continued
93
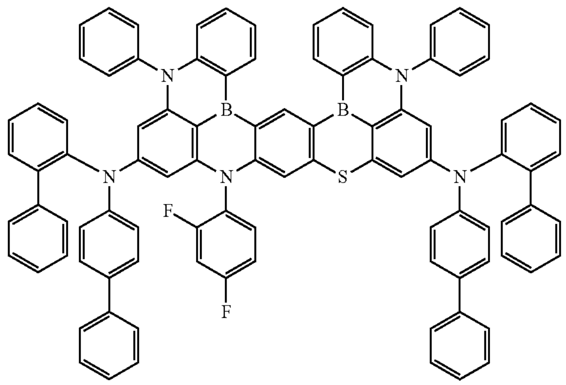
94
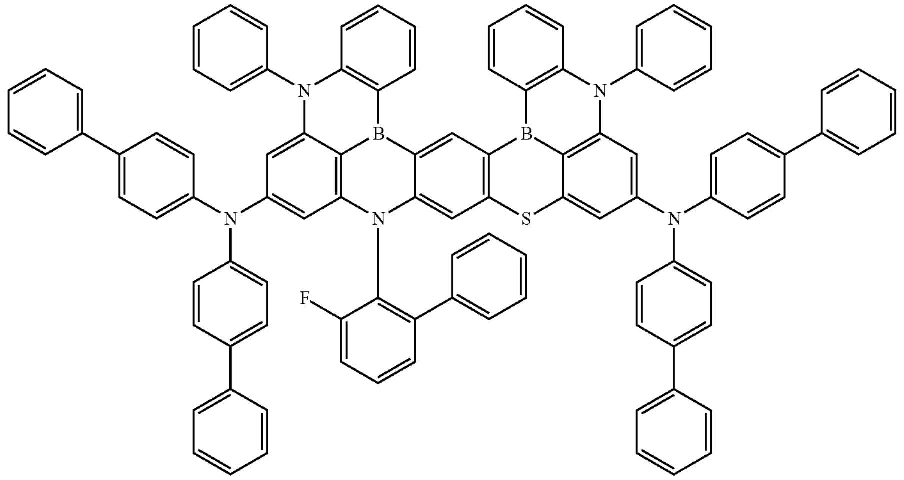
95
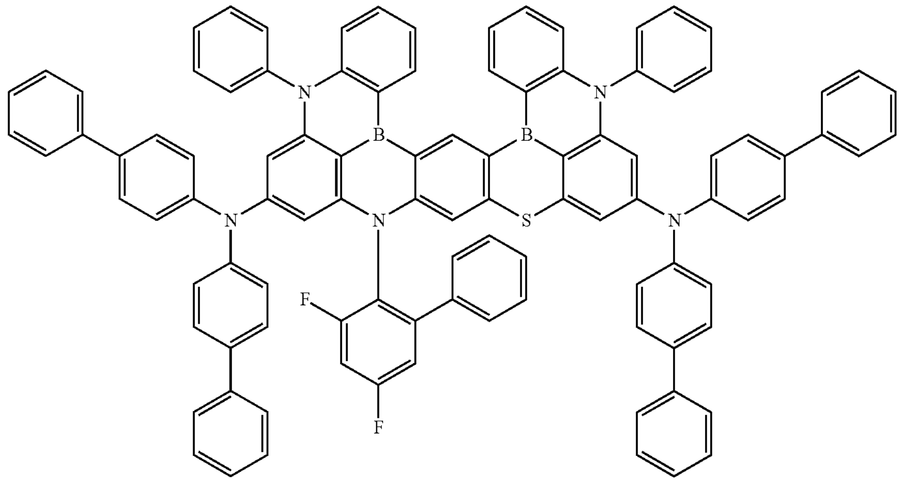

-continued
96
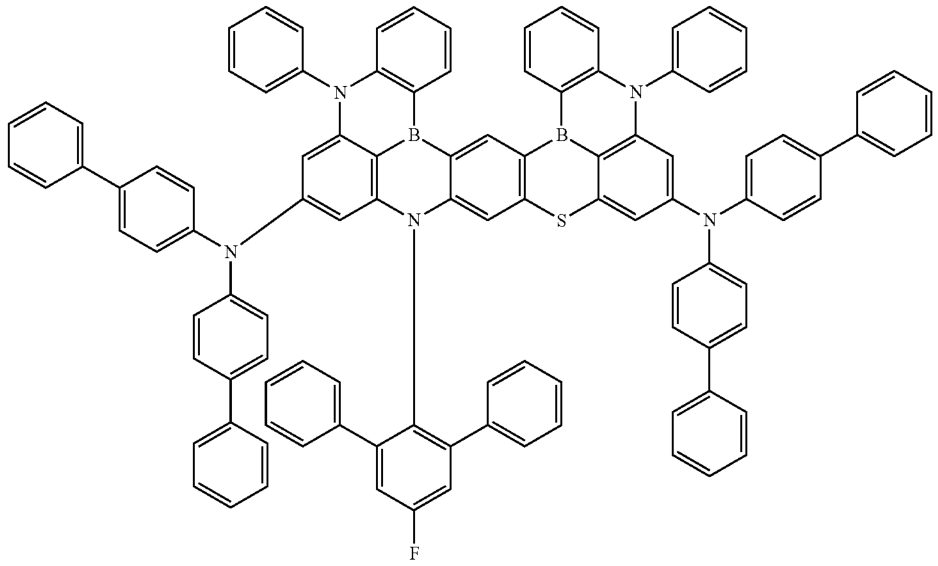
97
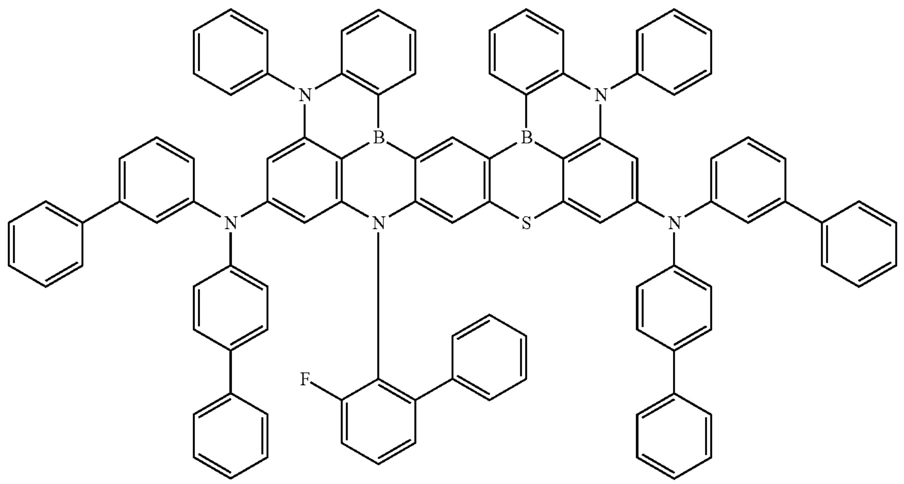
98
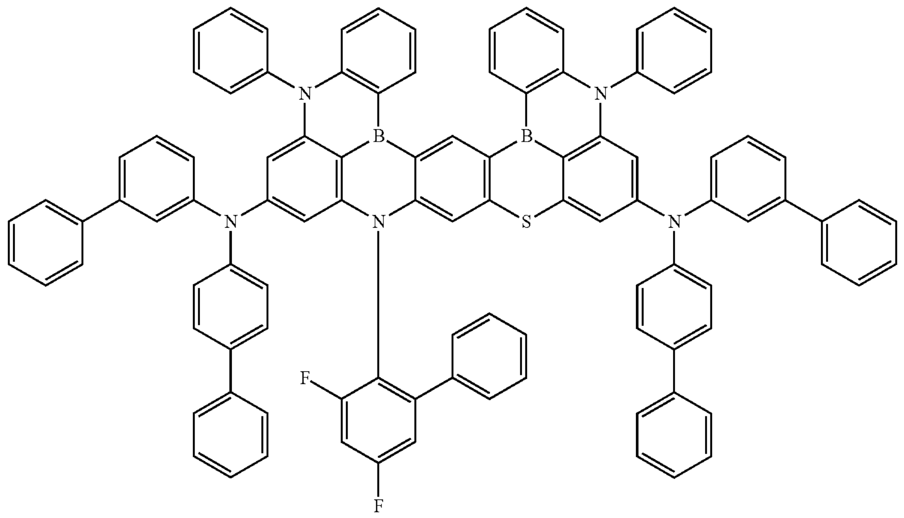

-continued
99
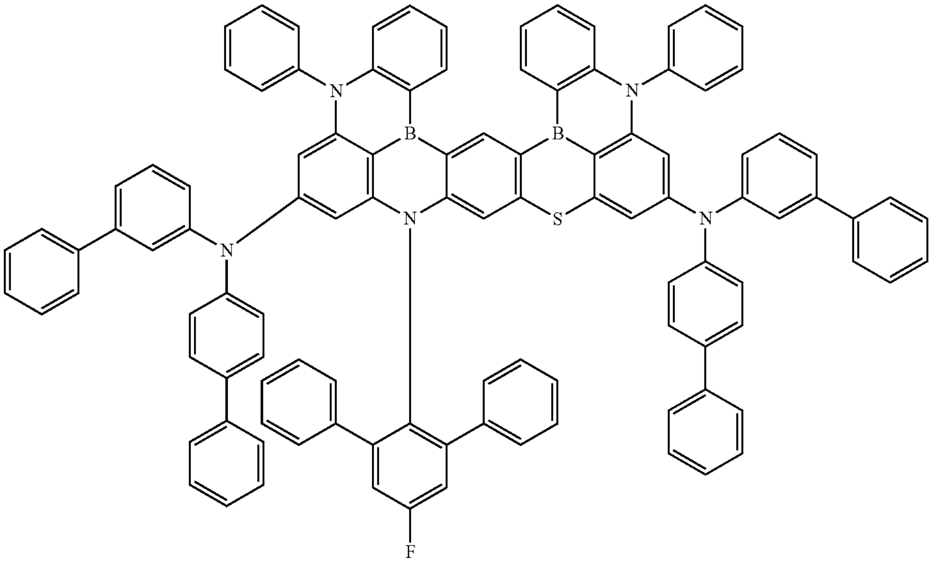
100
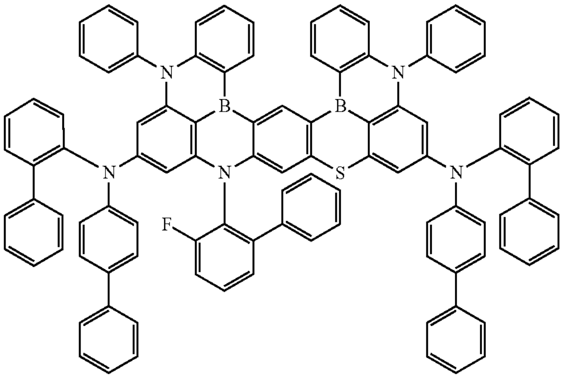
101
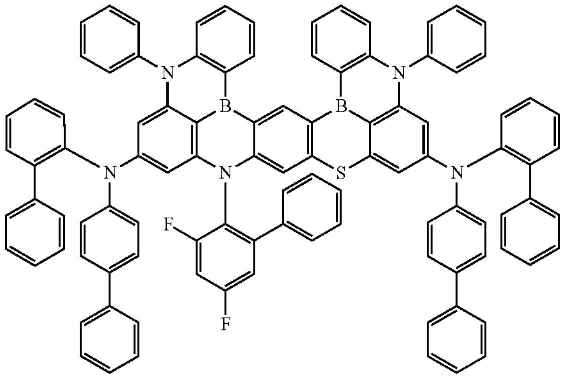
102
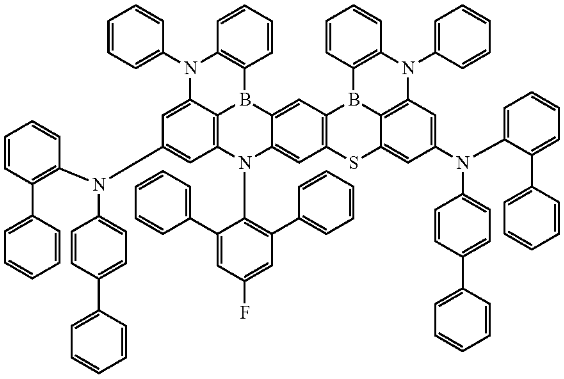
103
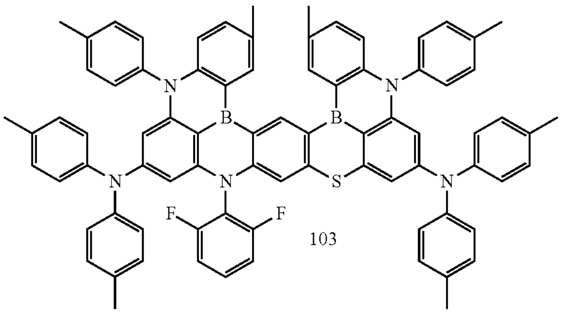
103

-continued
104
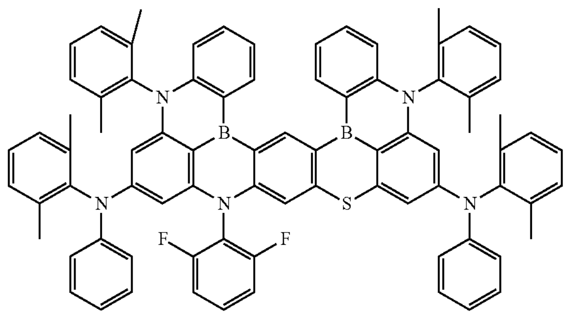
105
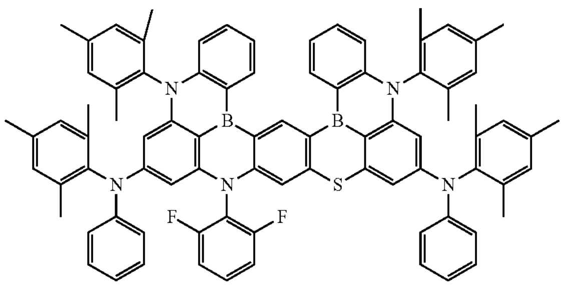
106
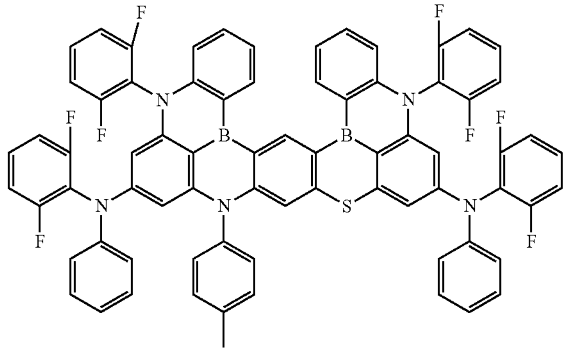
107
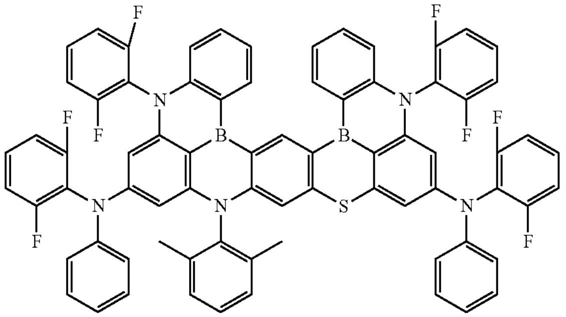
108
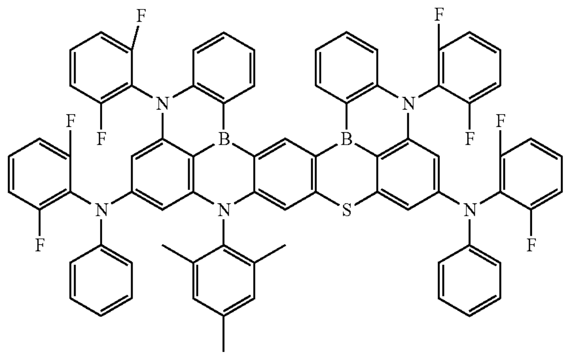
109
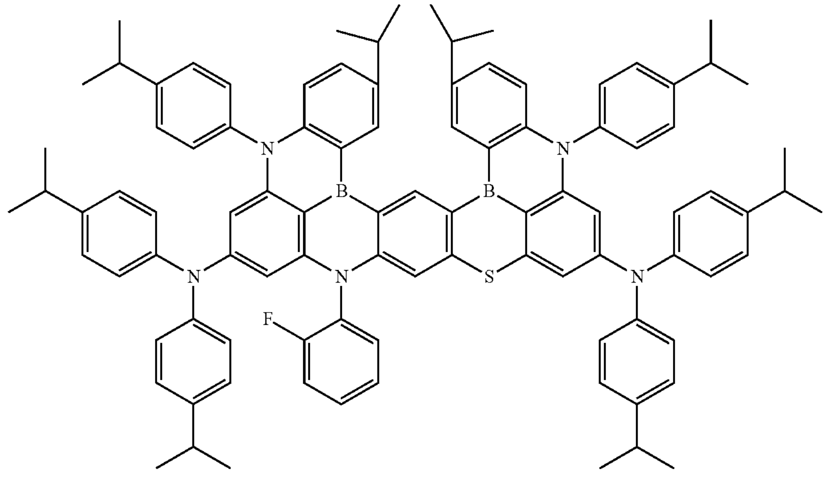

-continued
110
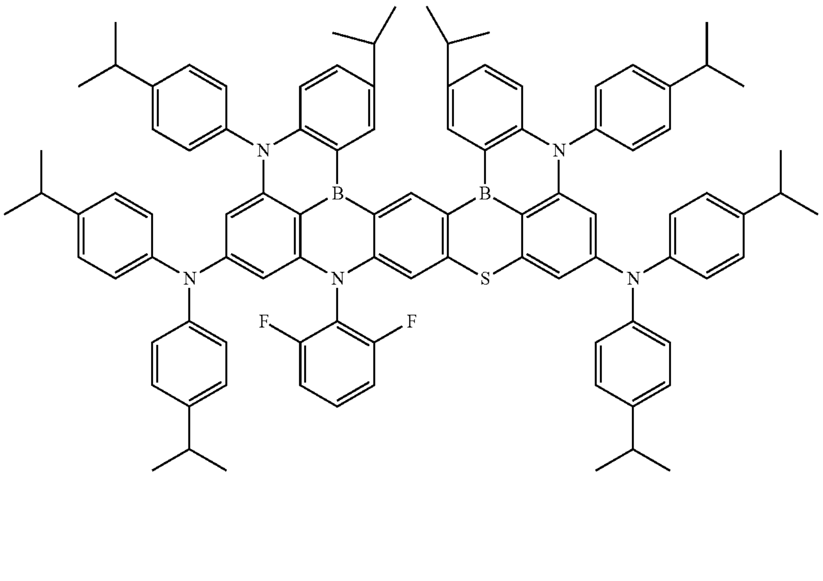
111
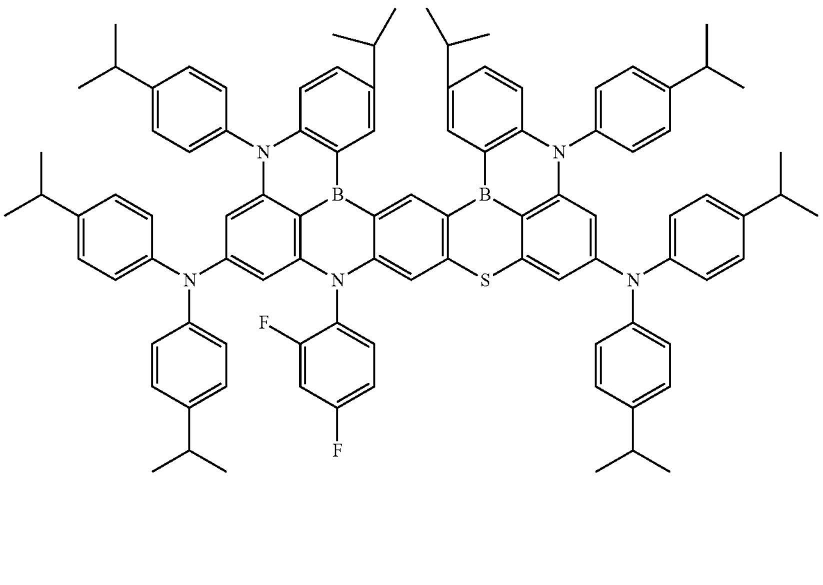
112
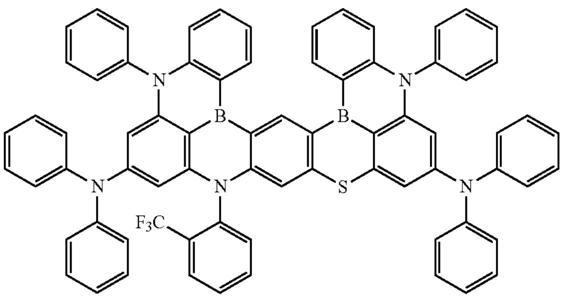
113
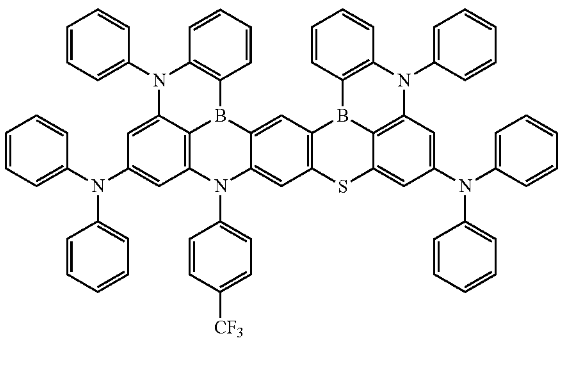

-continued
114
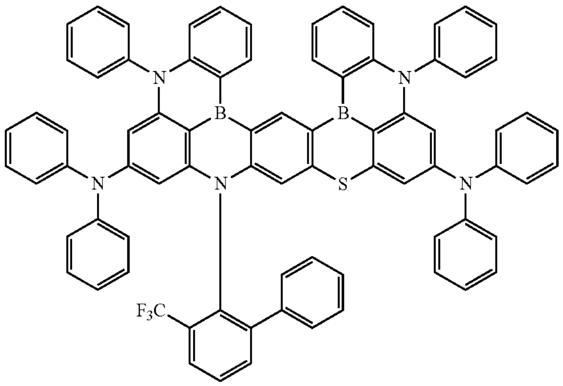
115
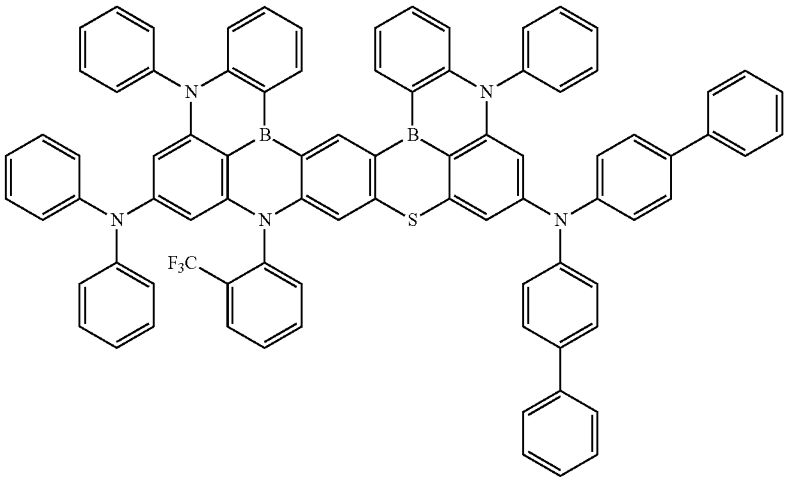
116
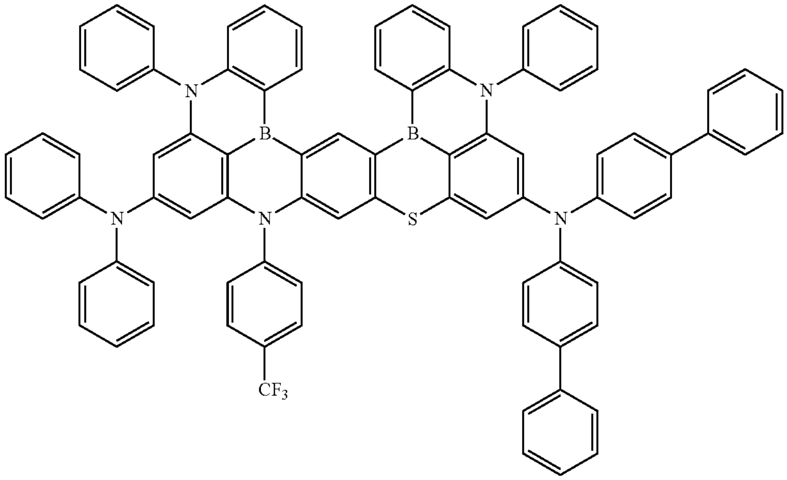

-continued
117
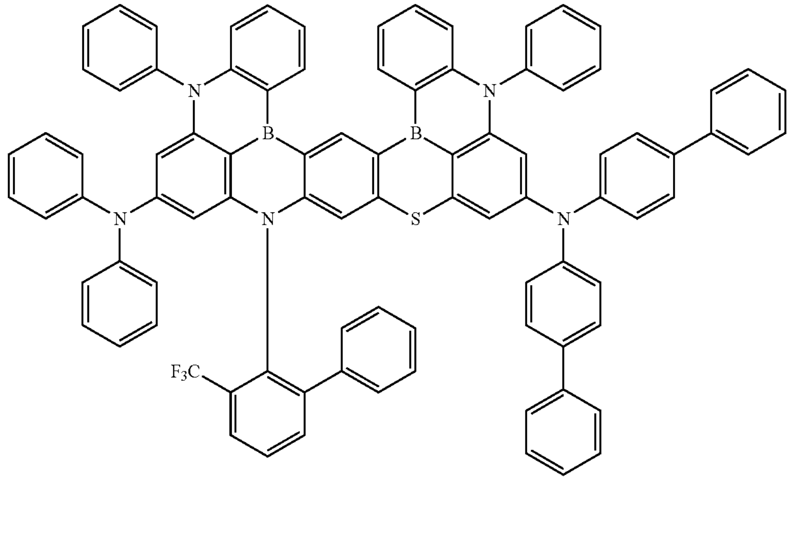
118
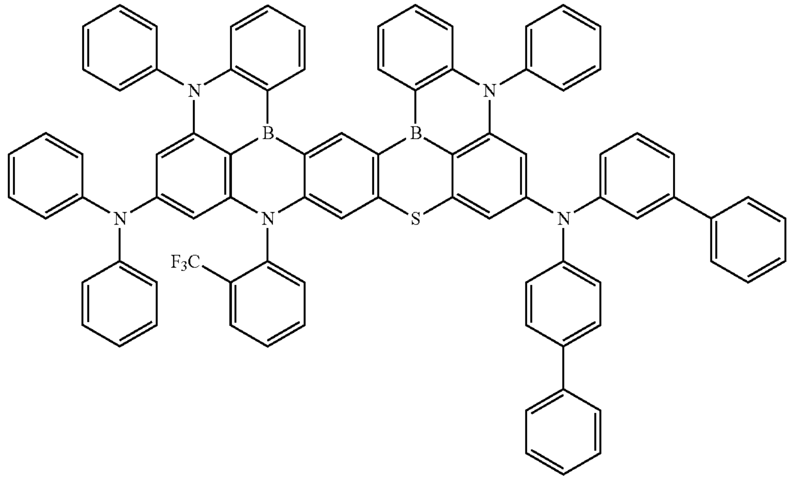
119
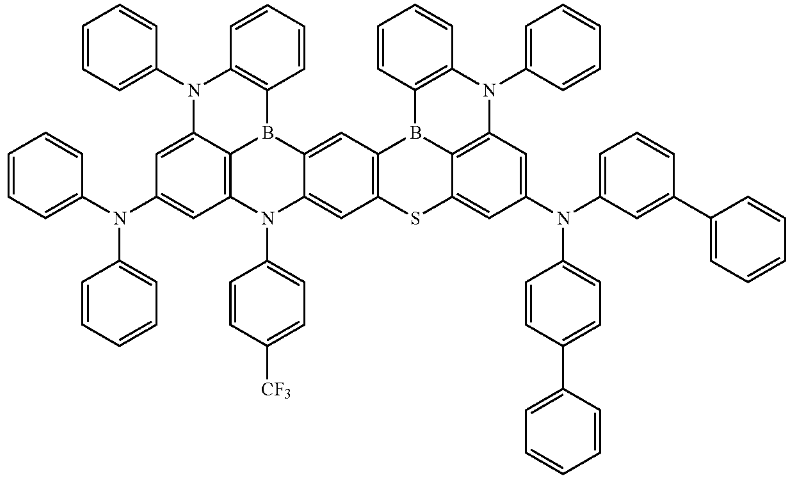

-continued
120
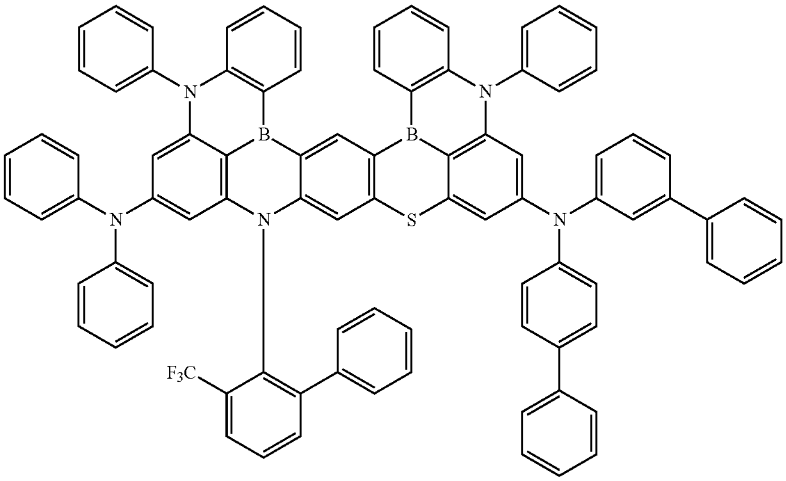
121
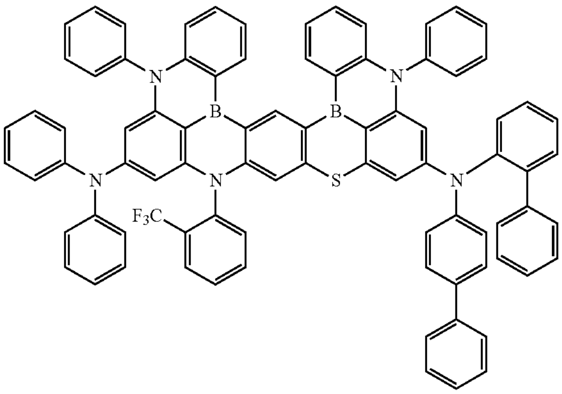
122
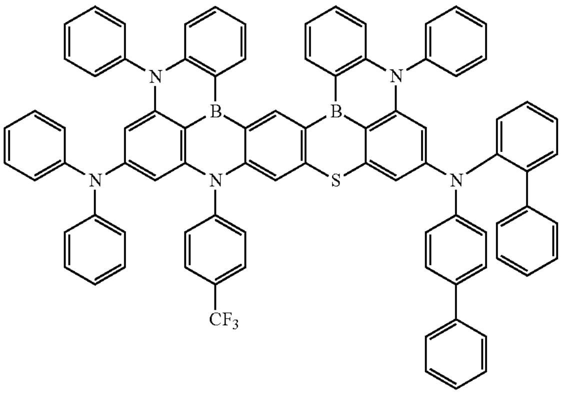
123
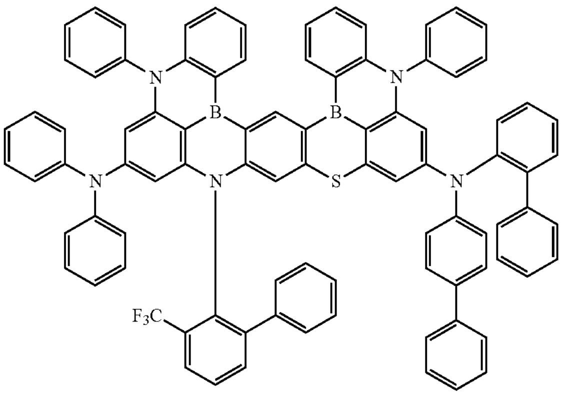
124
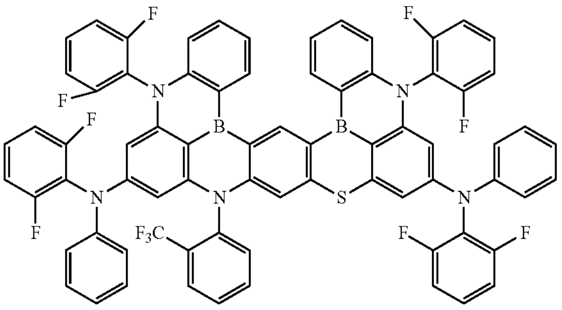

-continued
125
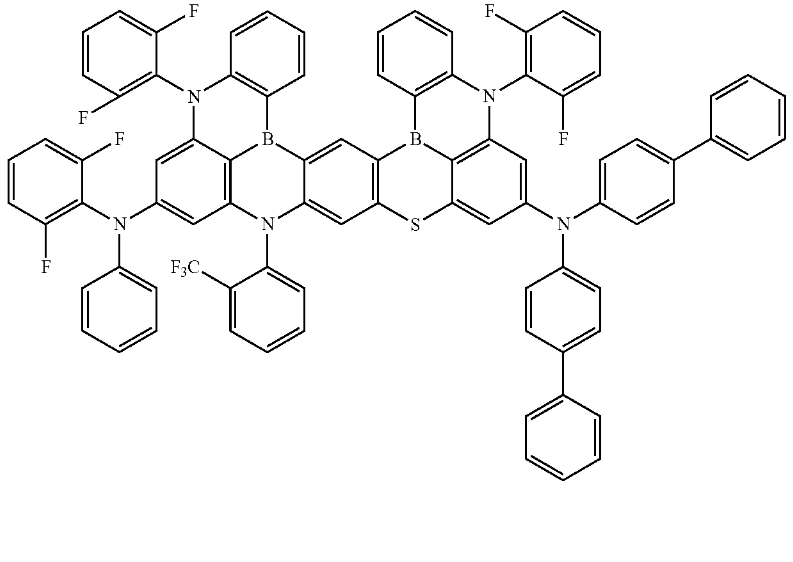
126
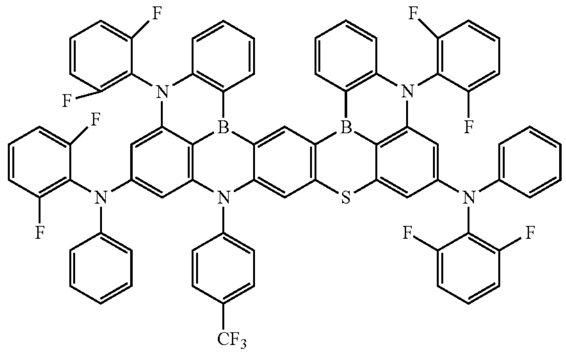
127
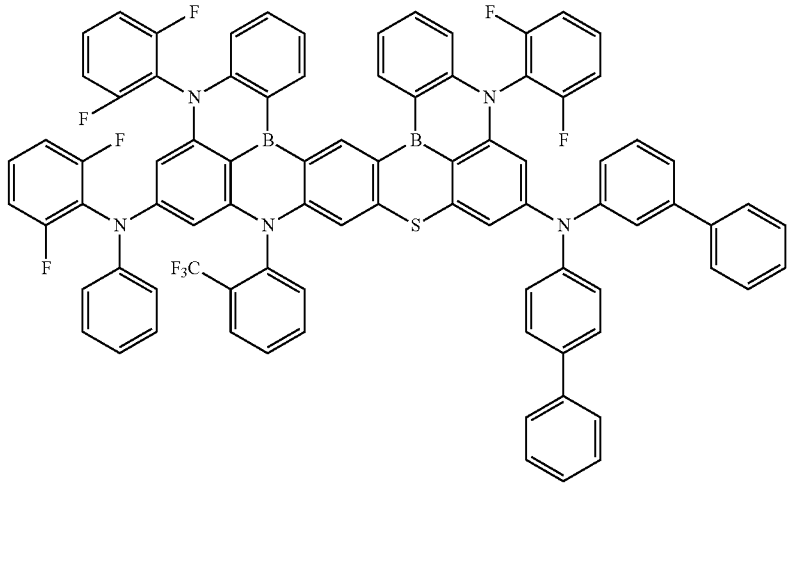

-continued
128
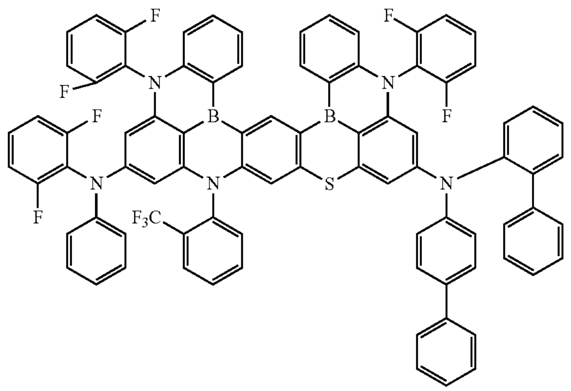
129
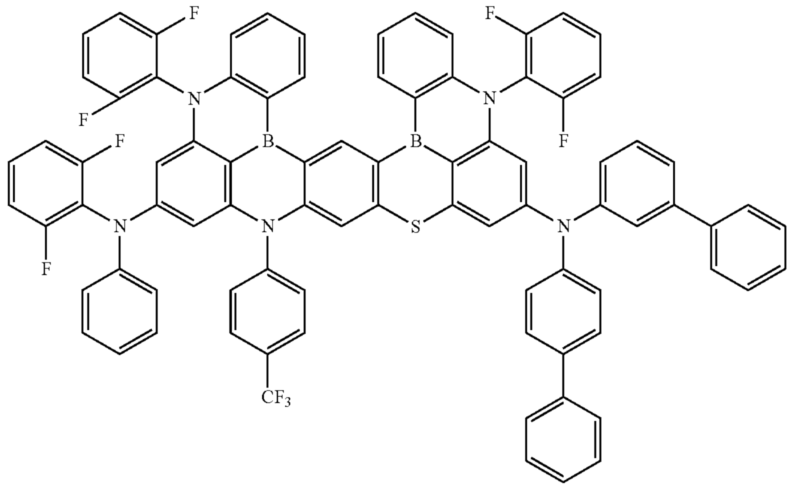
130
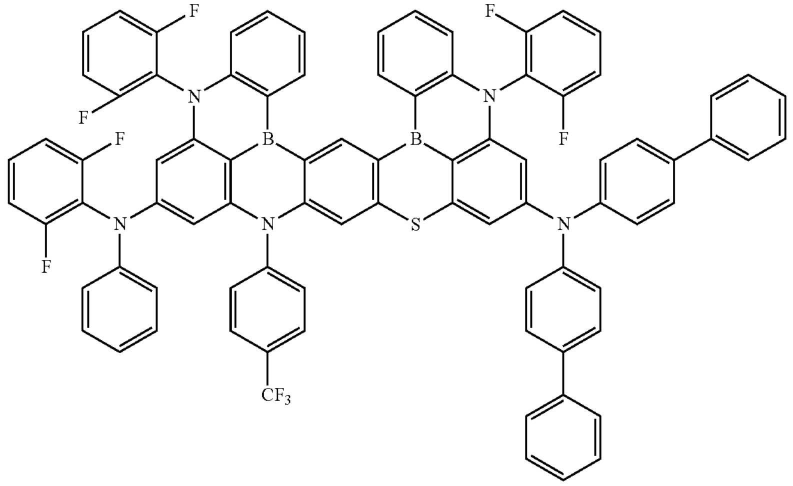

-continued
131
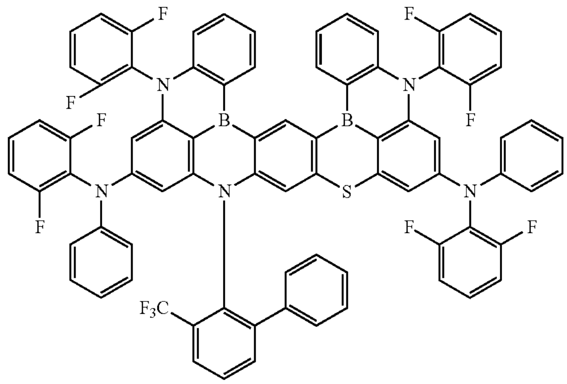
132
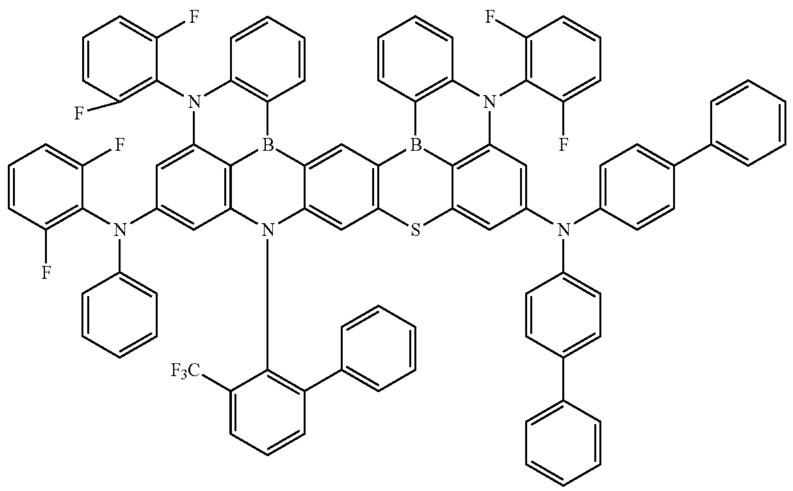
133
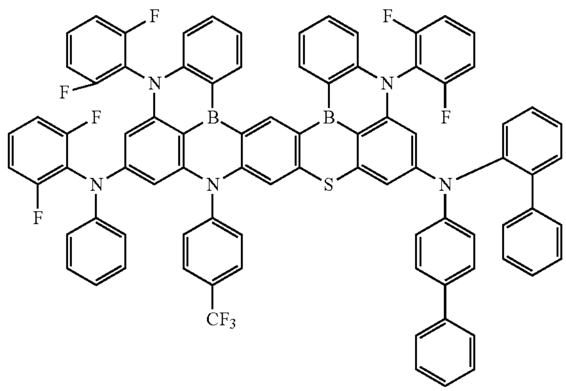

-continued
134
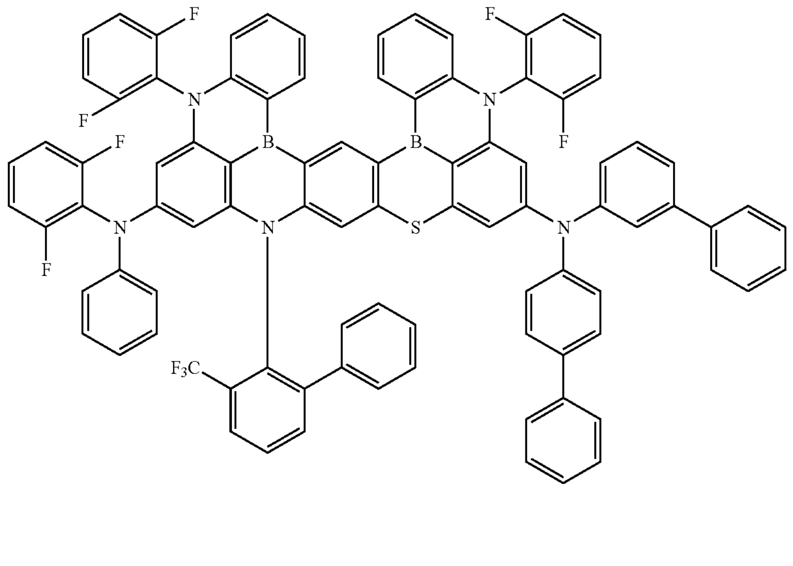
135
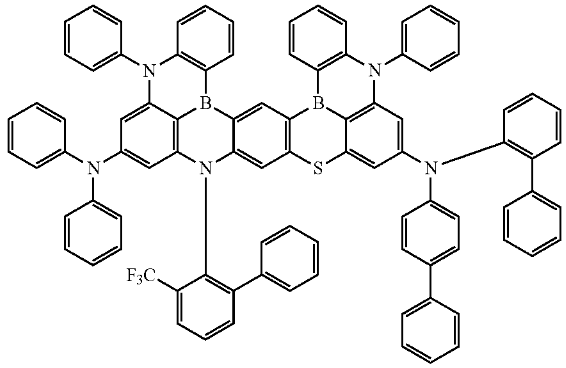
136
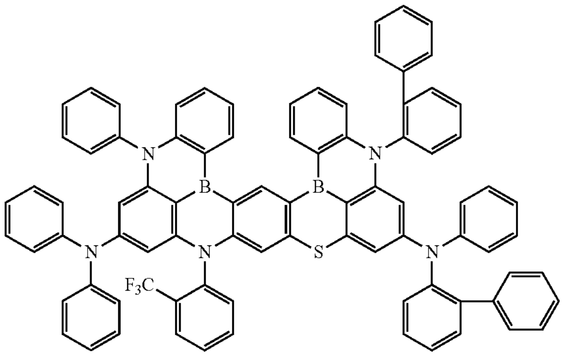
137
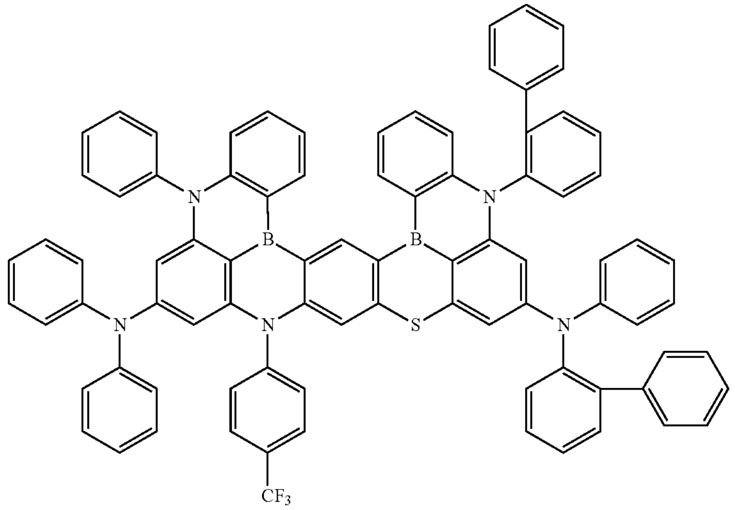

-continued
138
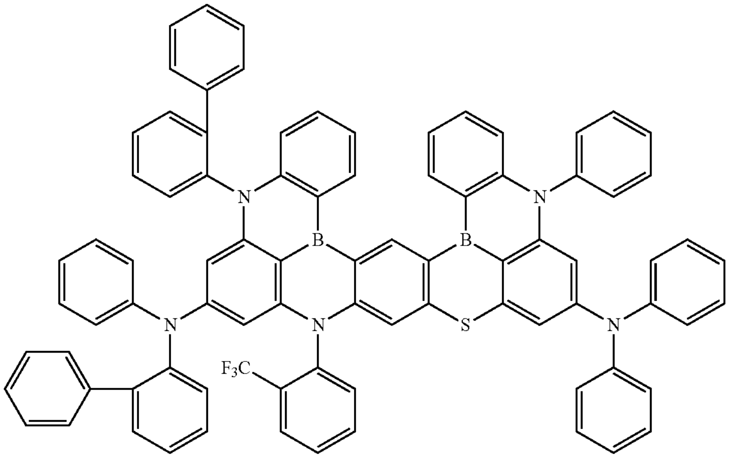
139
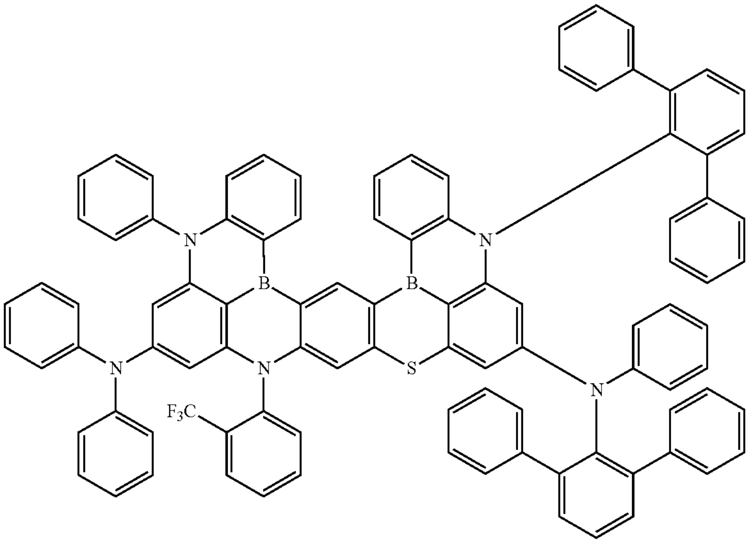
140
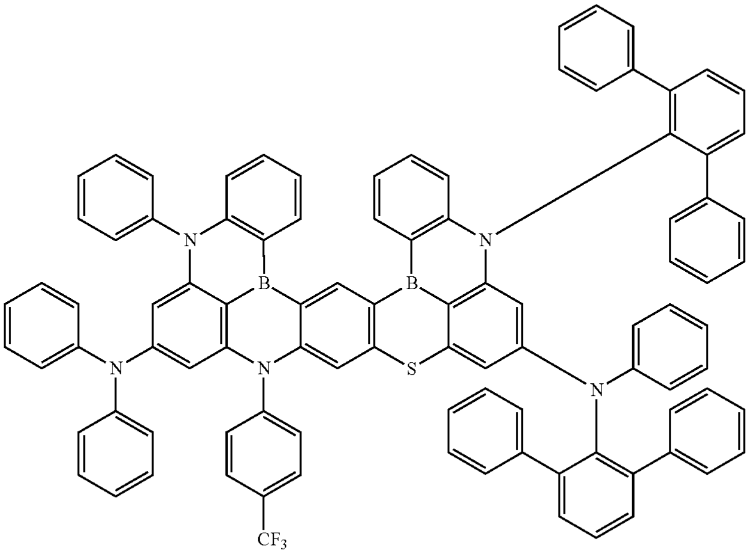

-continued
141
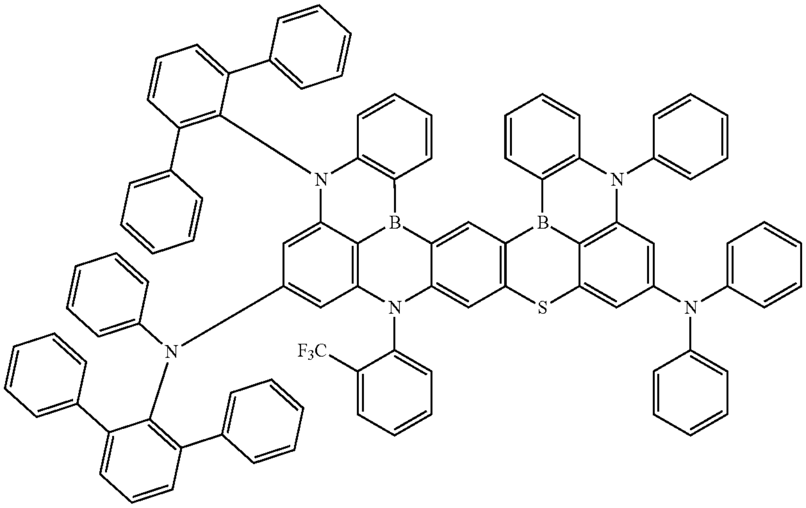
142
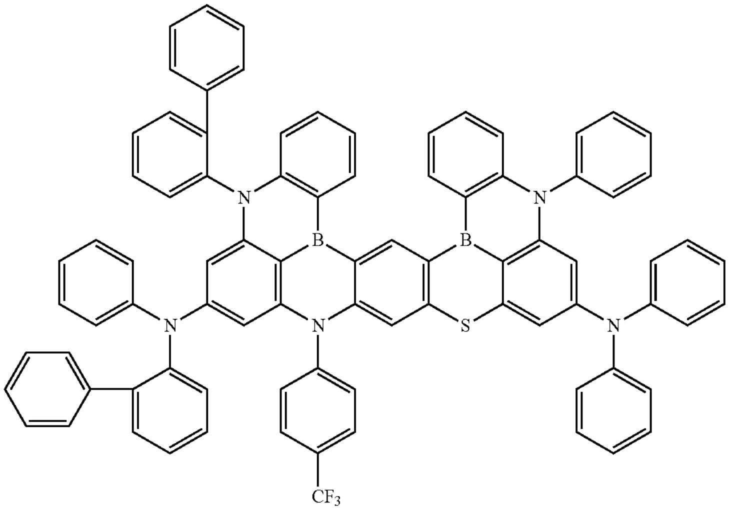
143
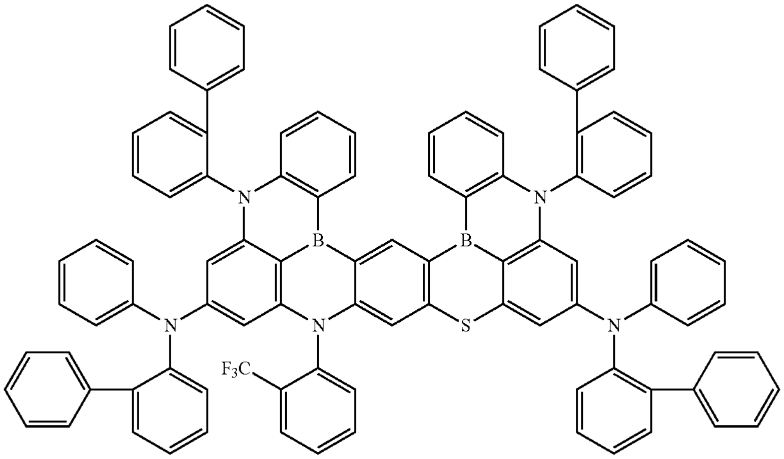

-continued
144
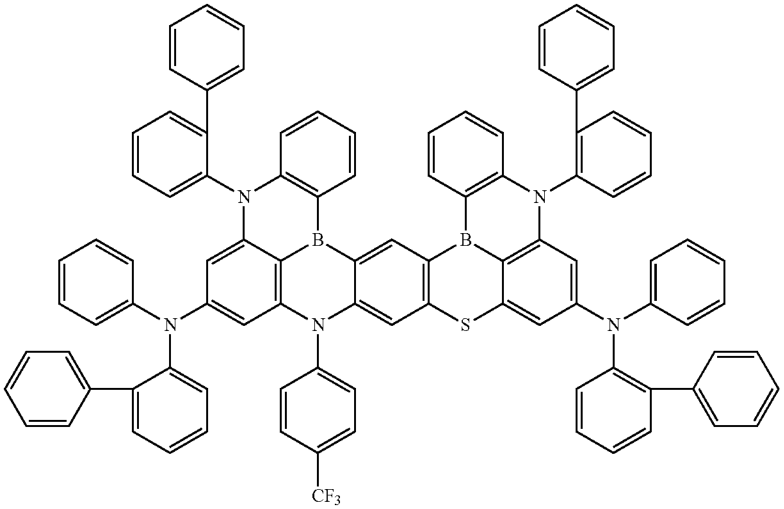
145
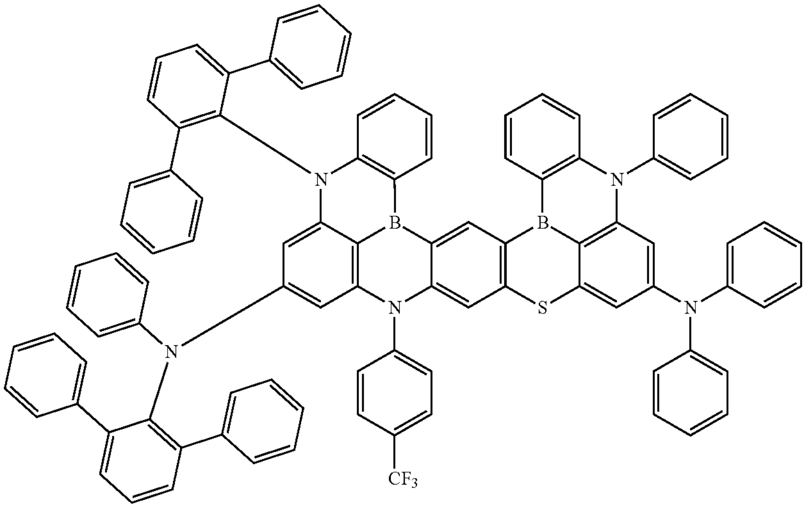
146
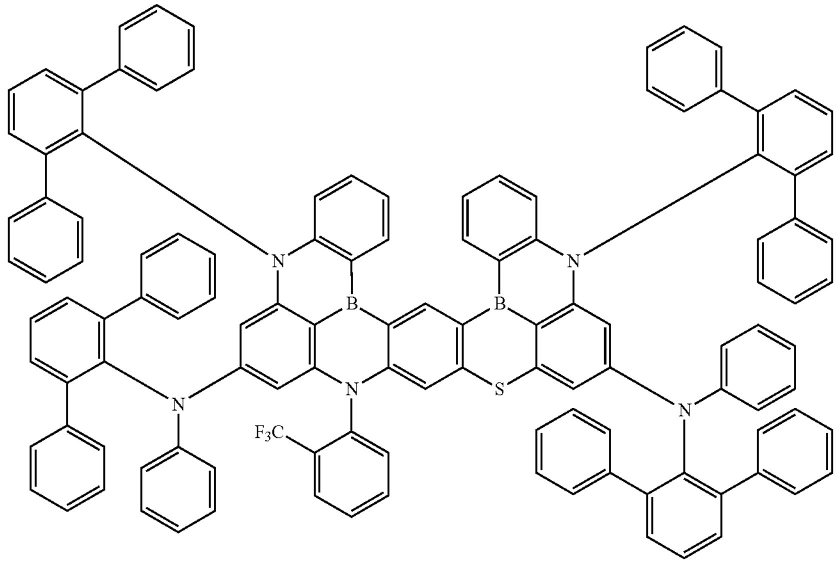

-continued
147
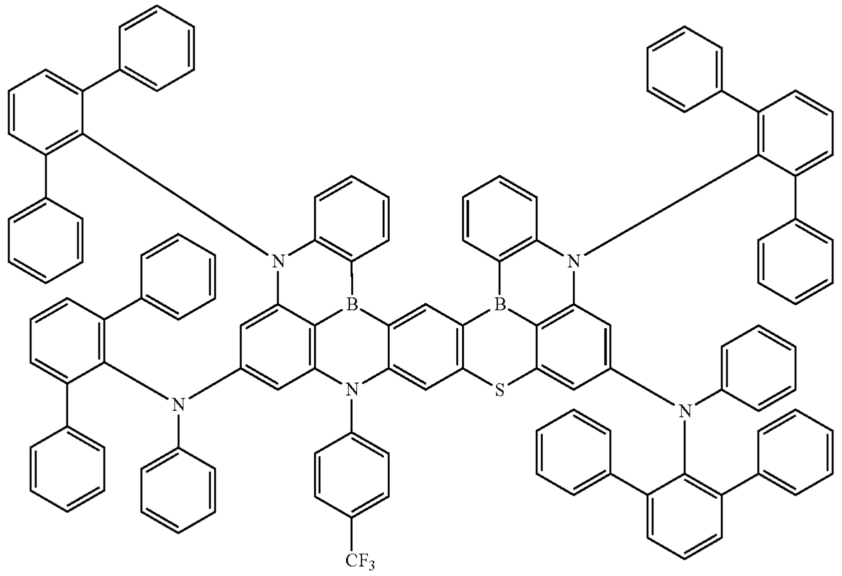
148
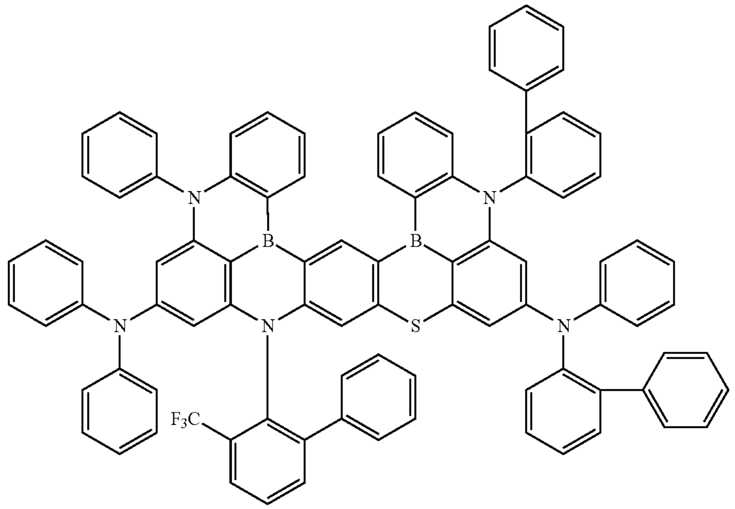
149
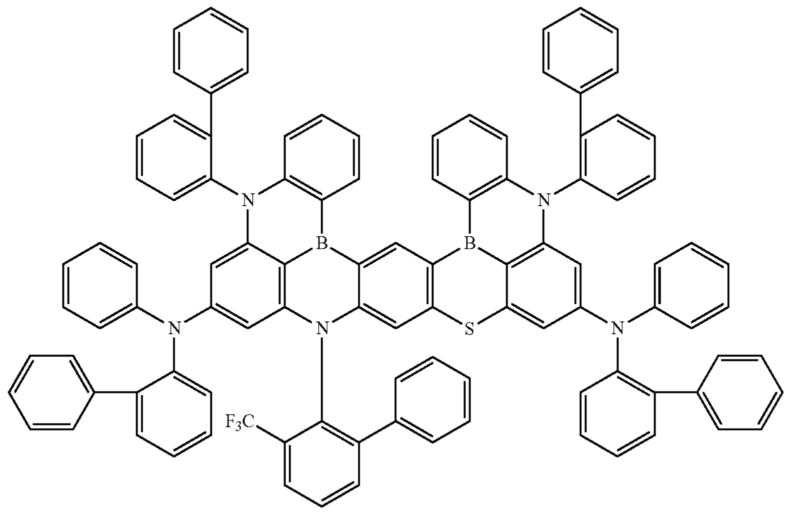

-continued
150
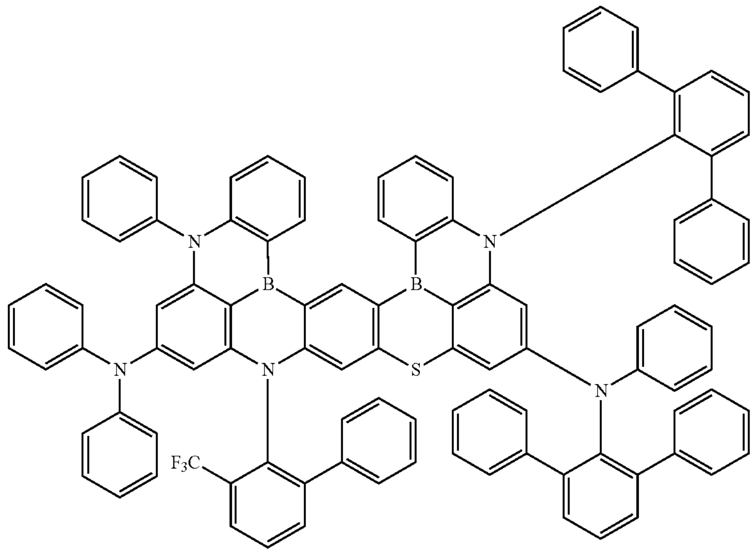
151
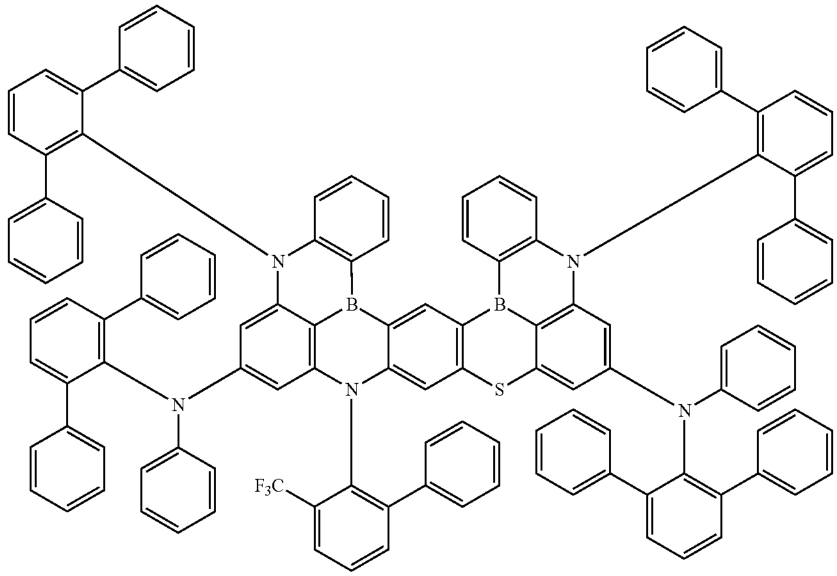
152
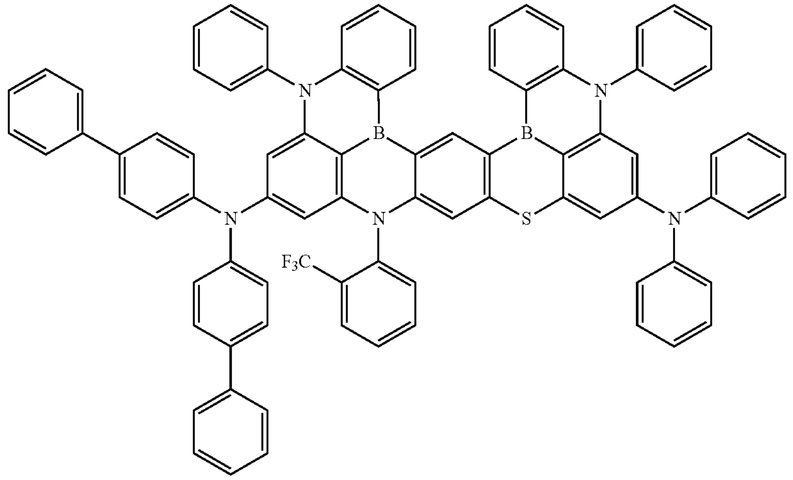

-continued
153
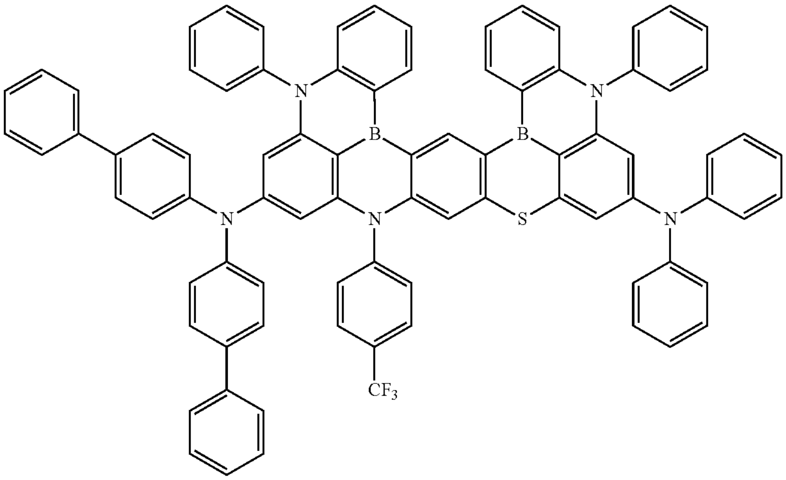
154
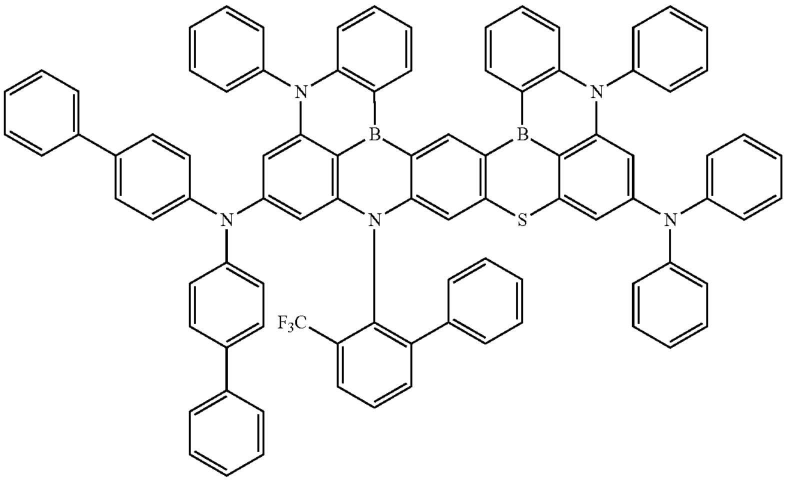
155
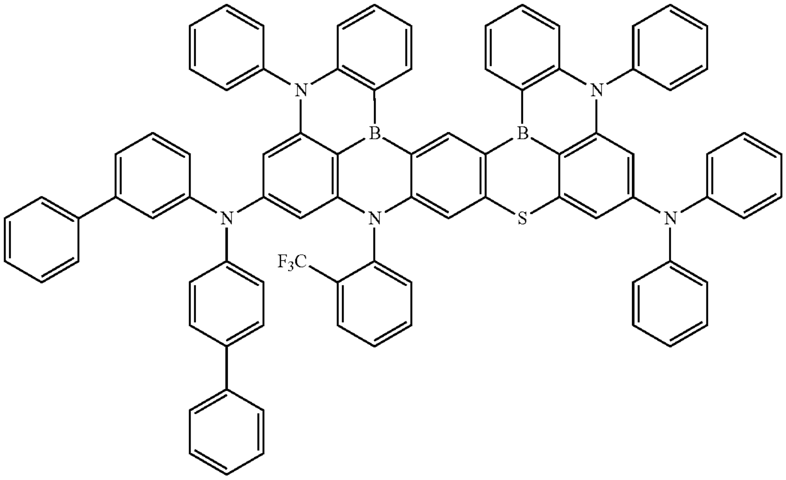

-continued
156
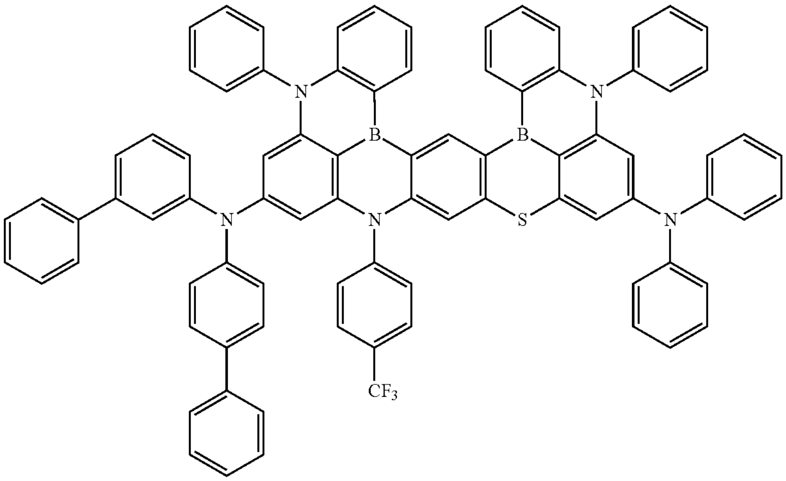
157
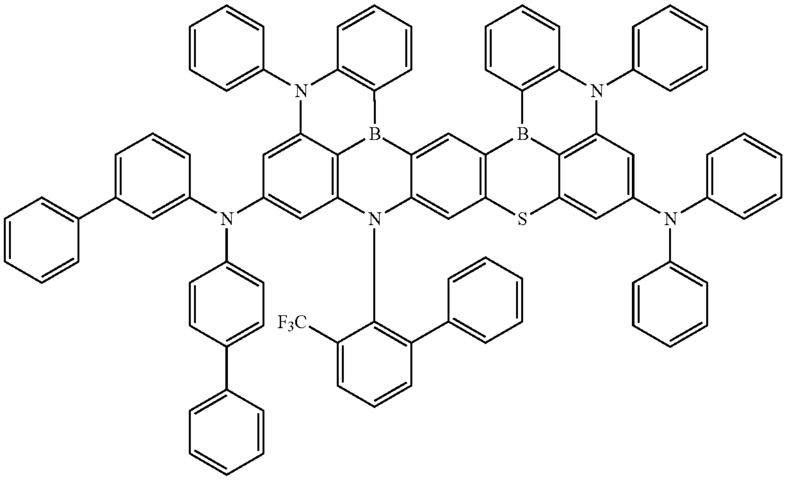
158
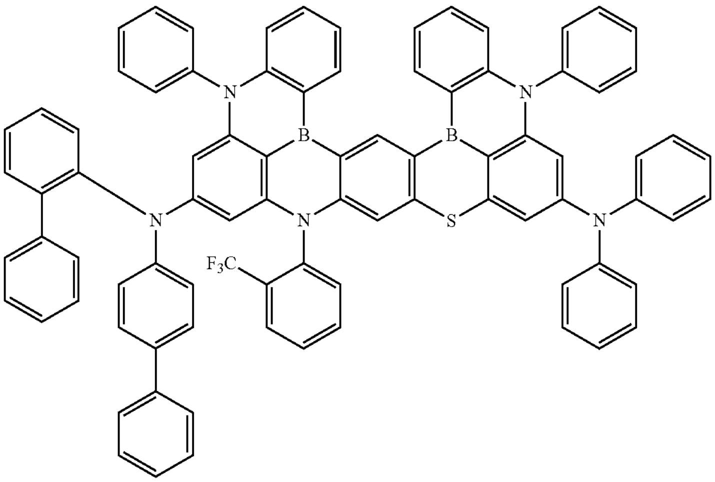

-continued
159
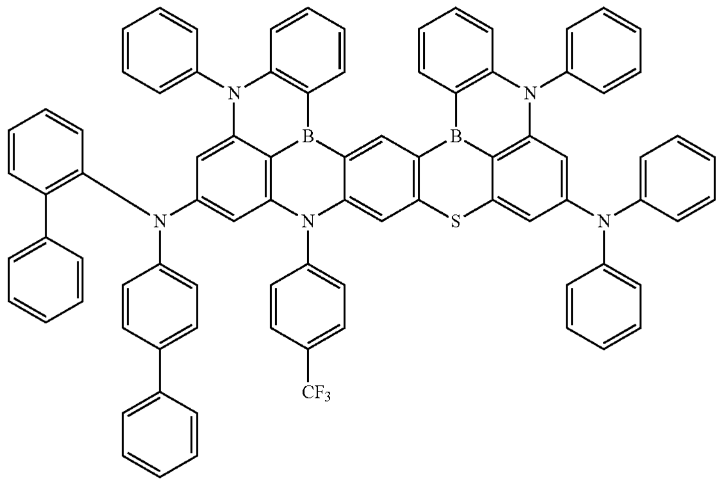
160
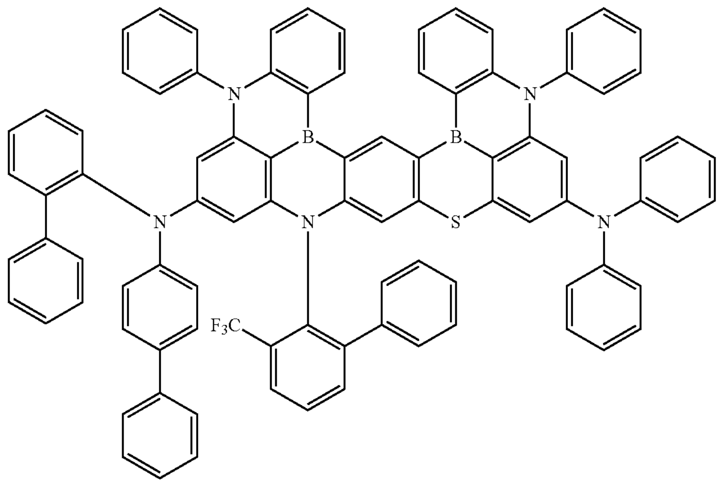
161
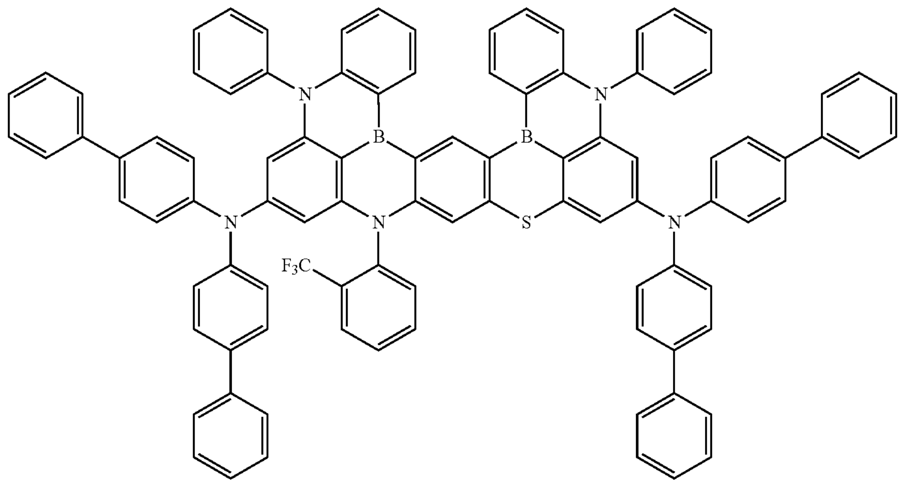

-continued
162
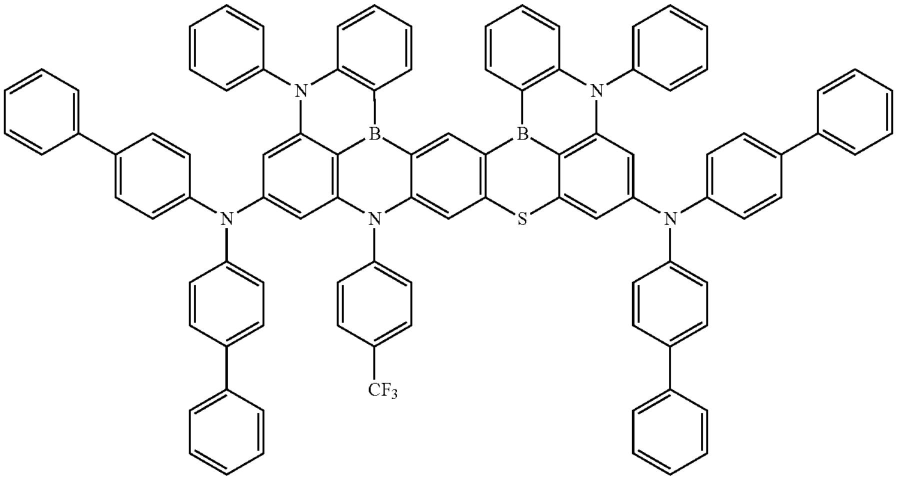
163
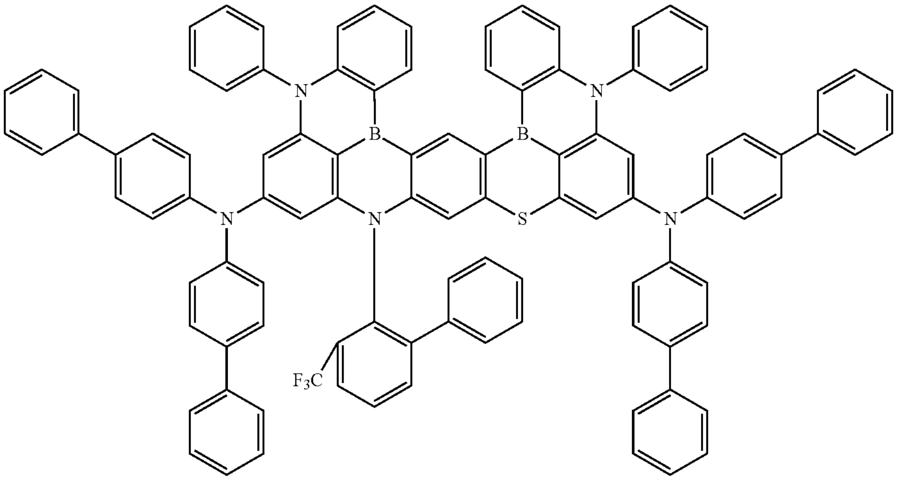
164
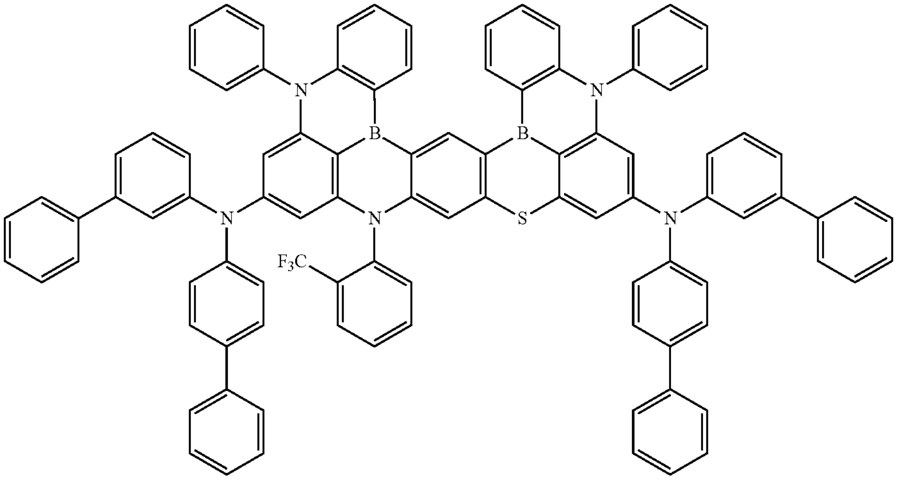

-continued
165
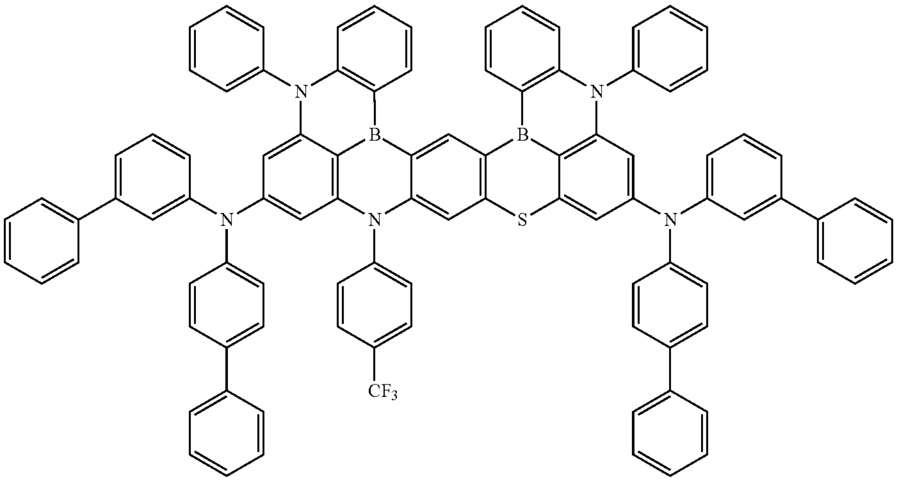
166
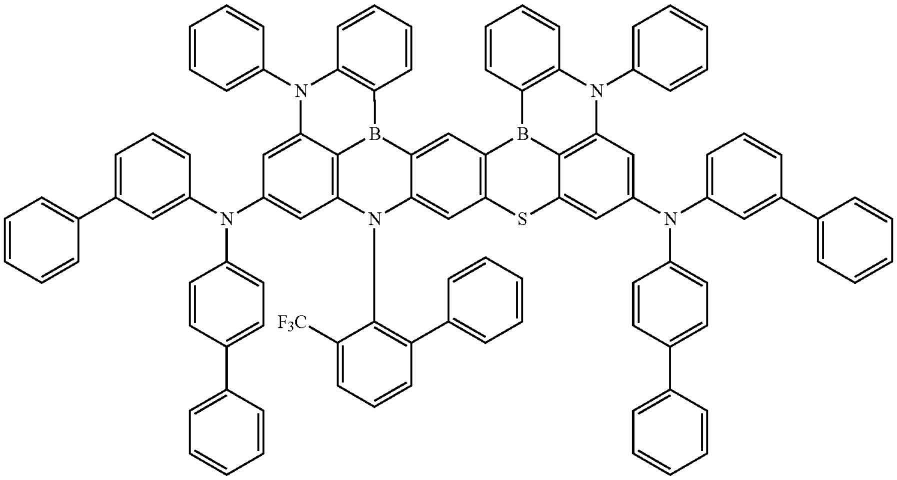
167
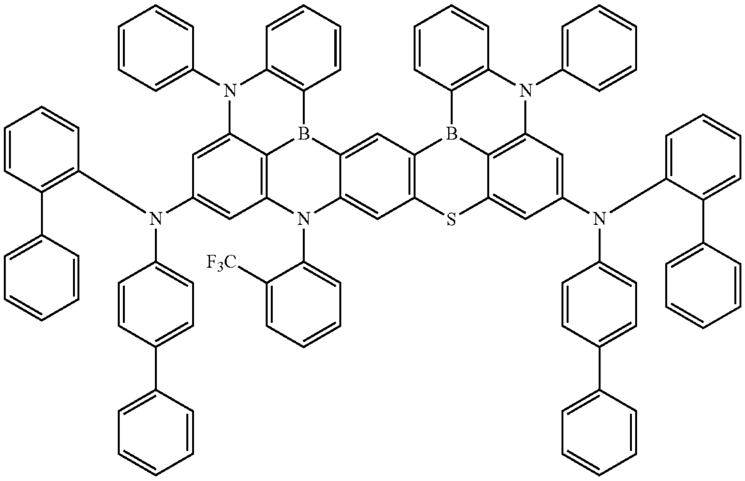

-continued
168
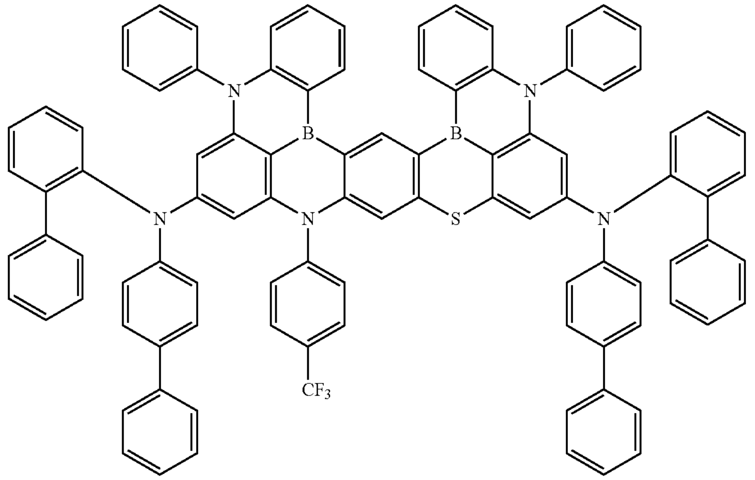
169
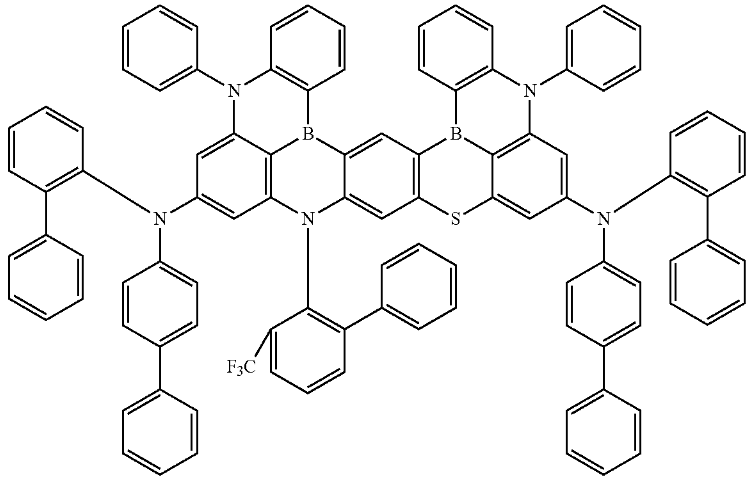
170
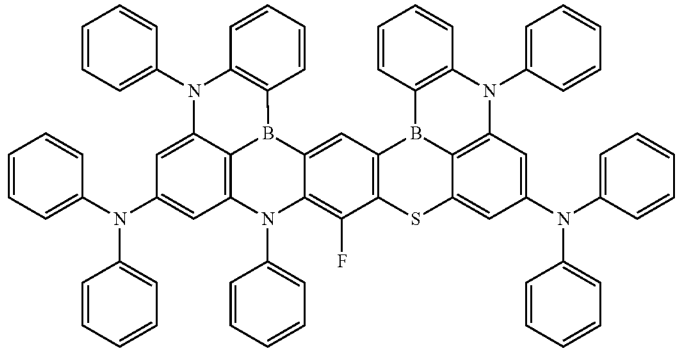

-continued
171
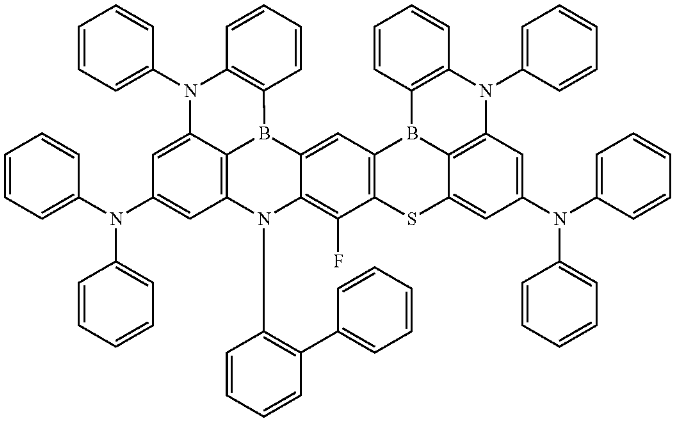
172
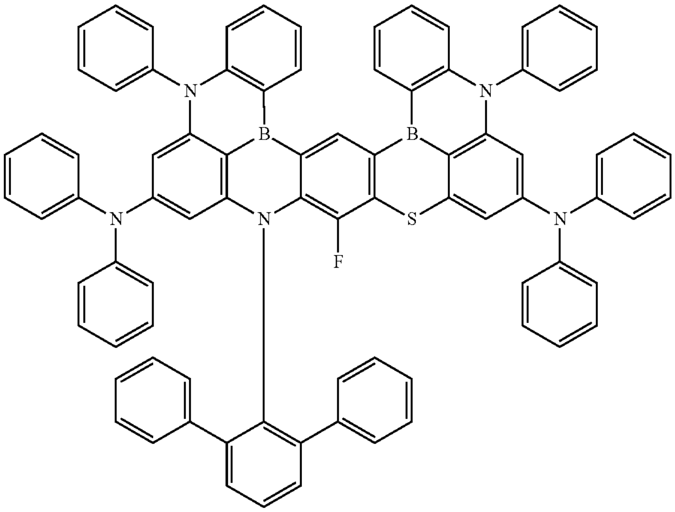
173
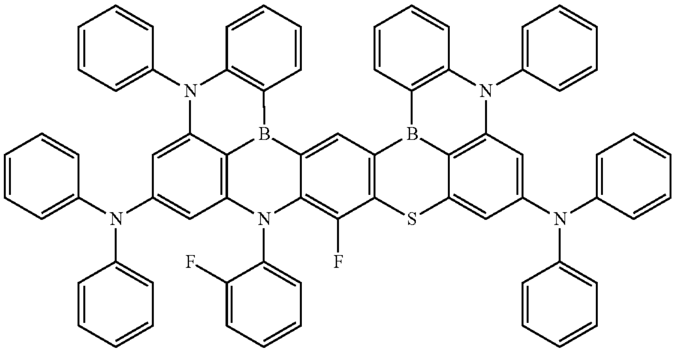

-continued
174
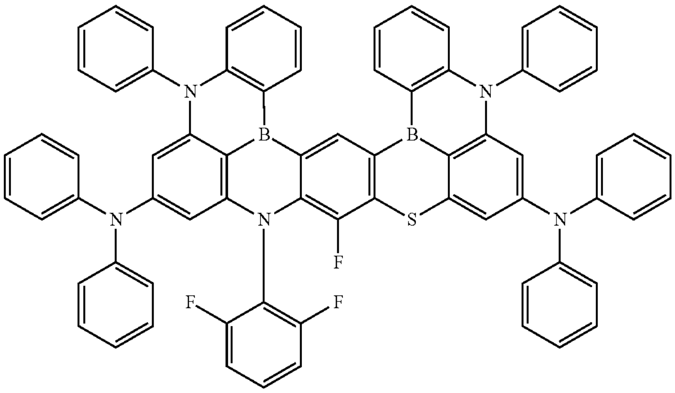
175
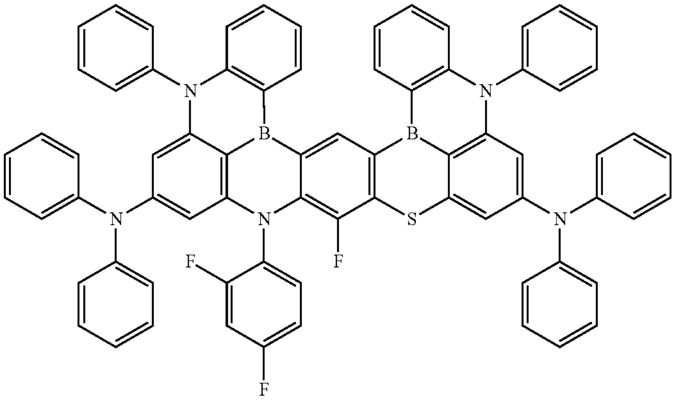
176
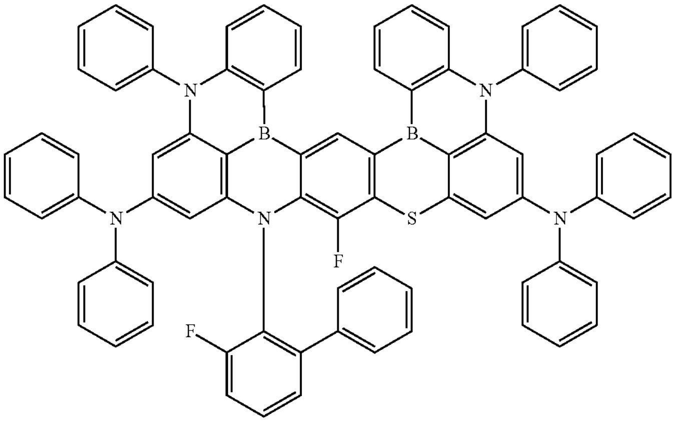

-continued
177
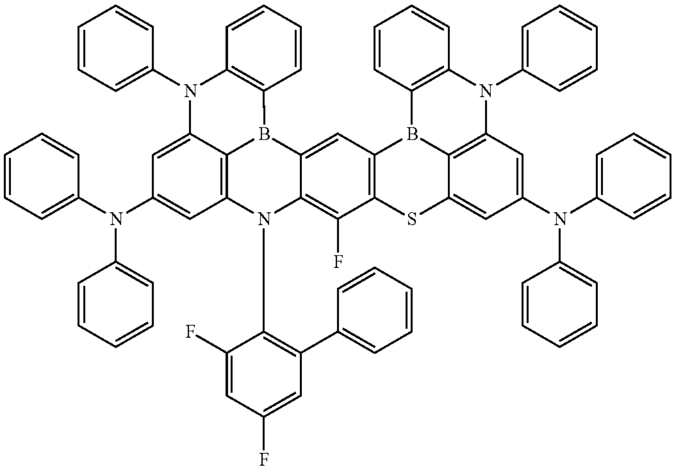
178
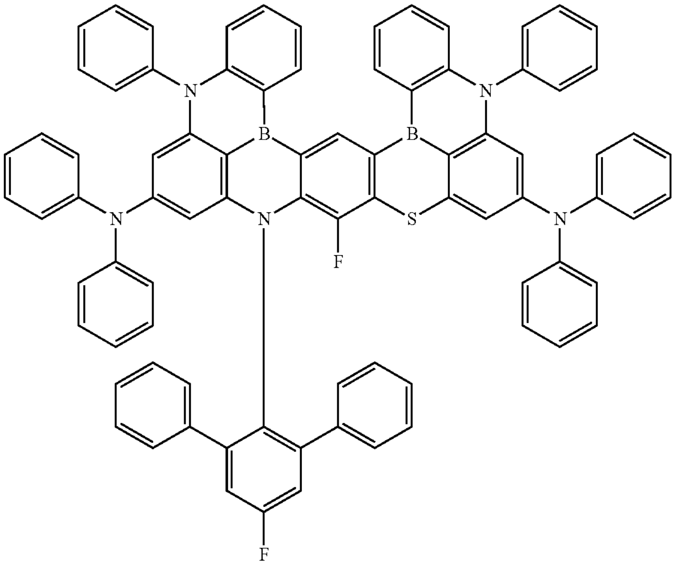
179
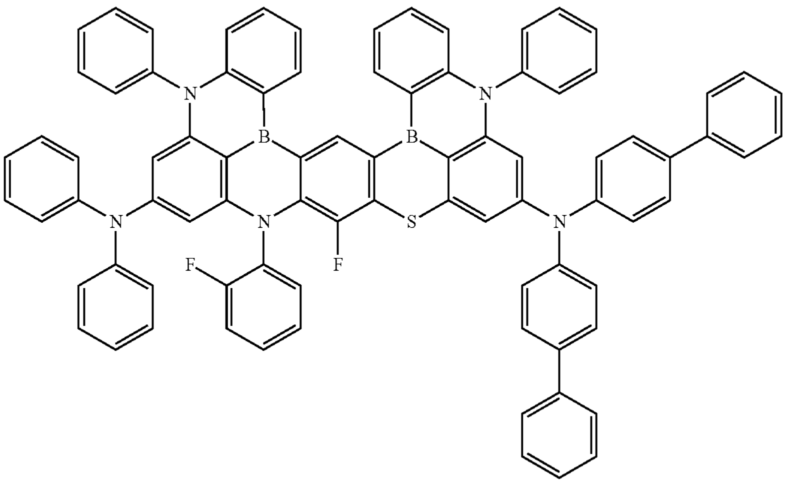

-continued
180
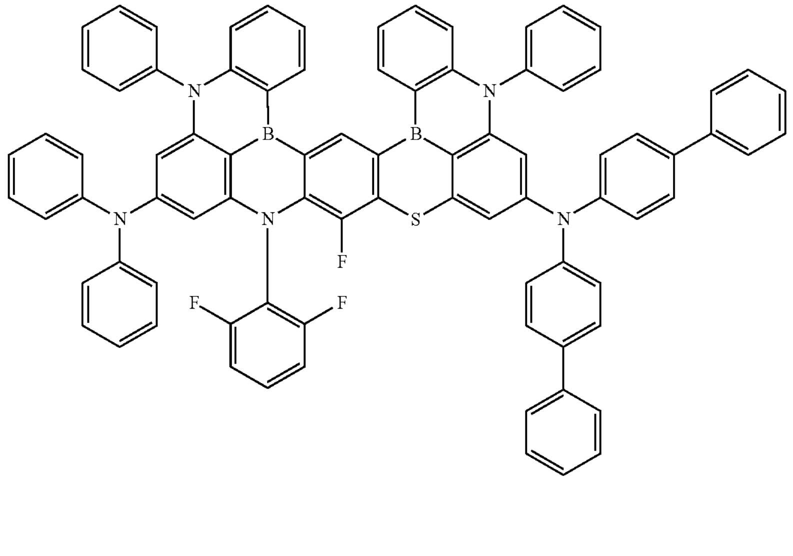
181
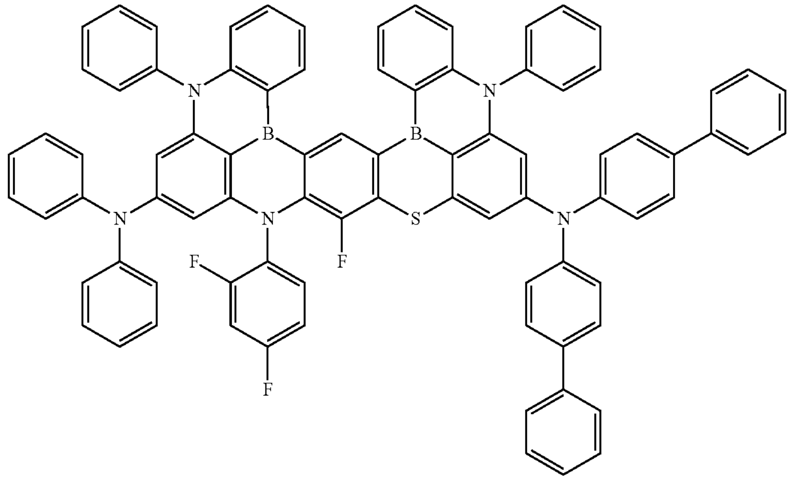
182
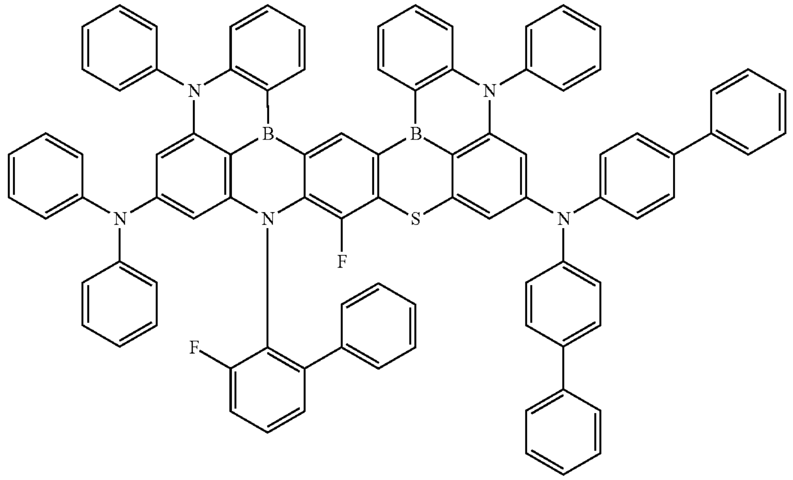

-continued
183
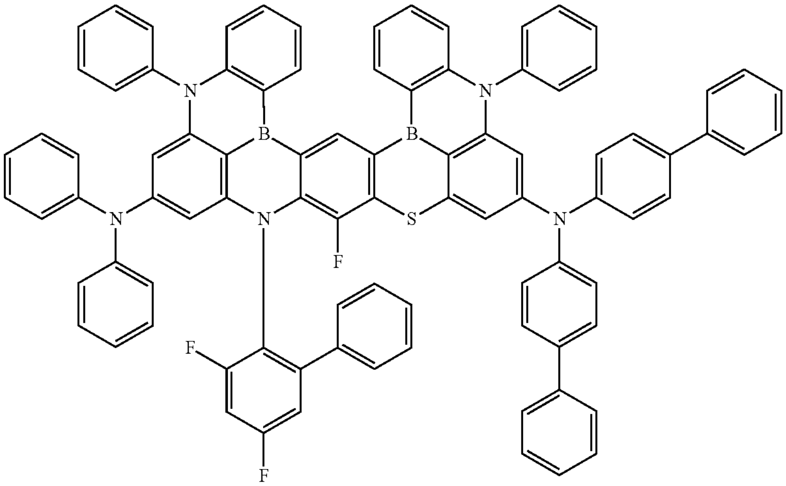
184
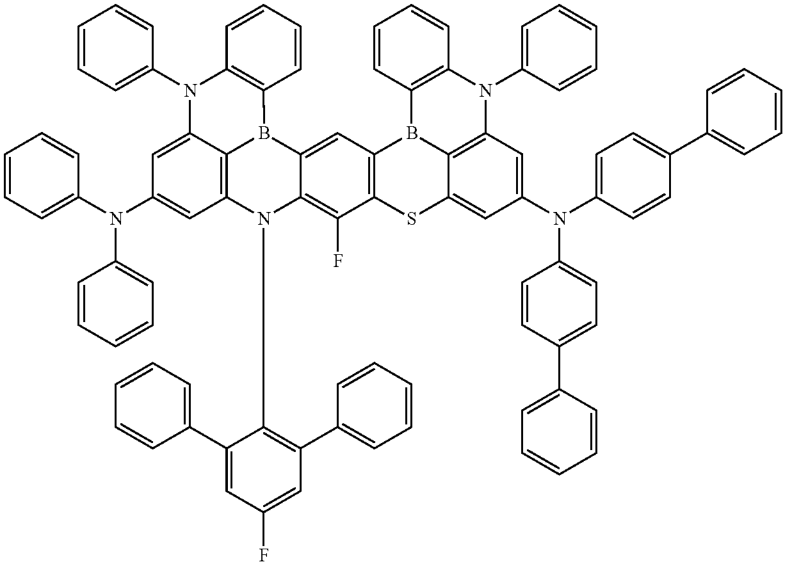
185
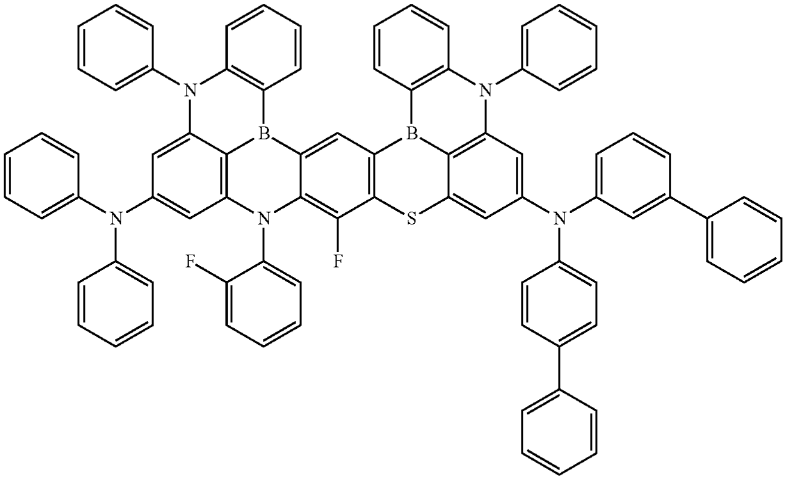

-continued
186
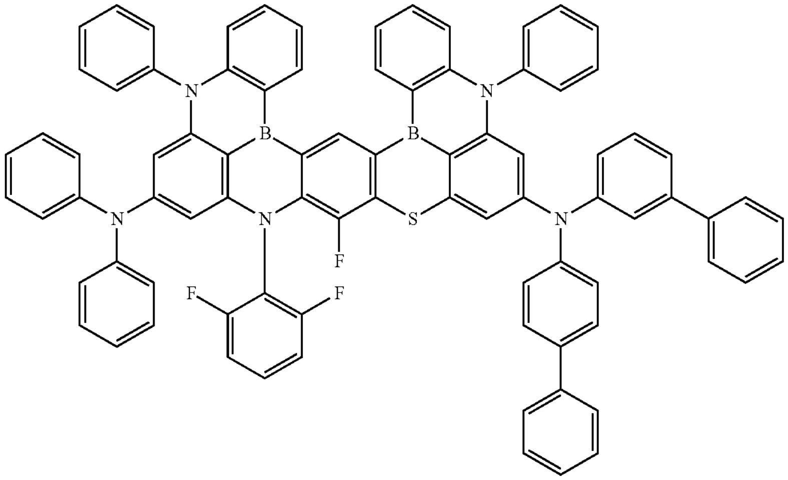
187
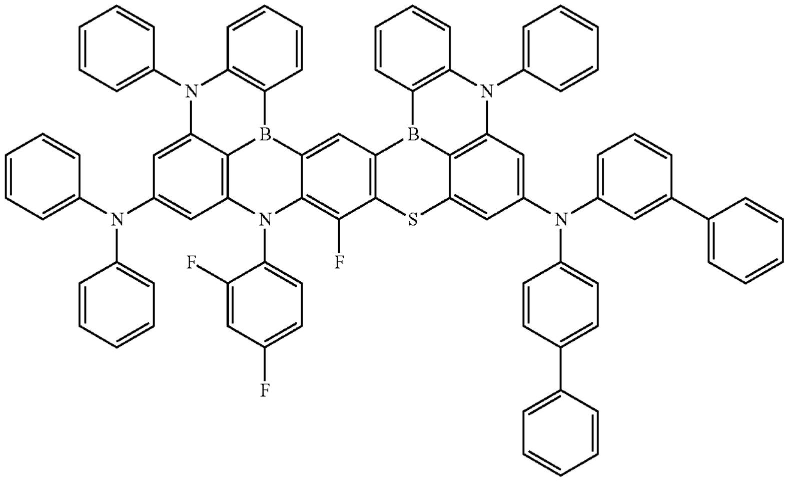
188
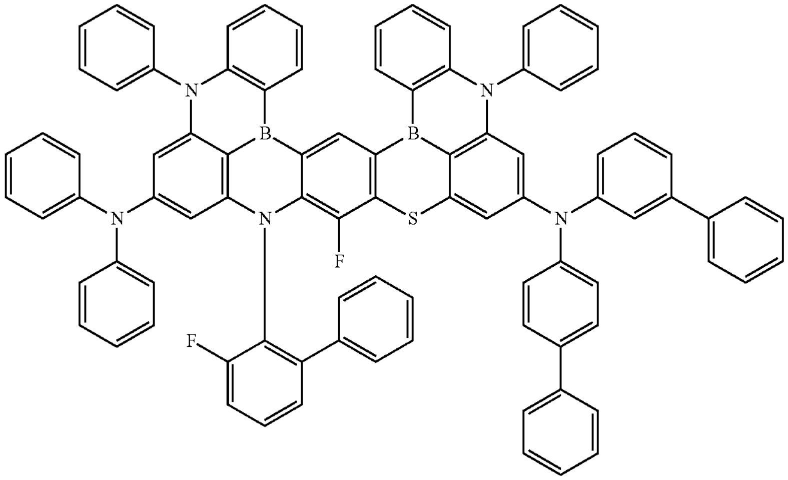

-continued
189
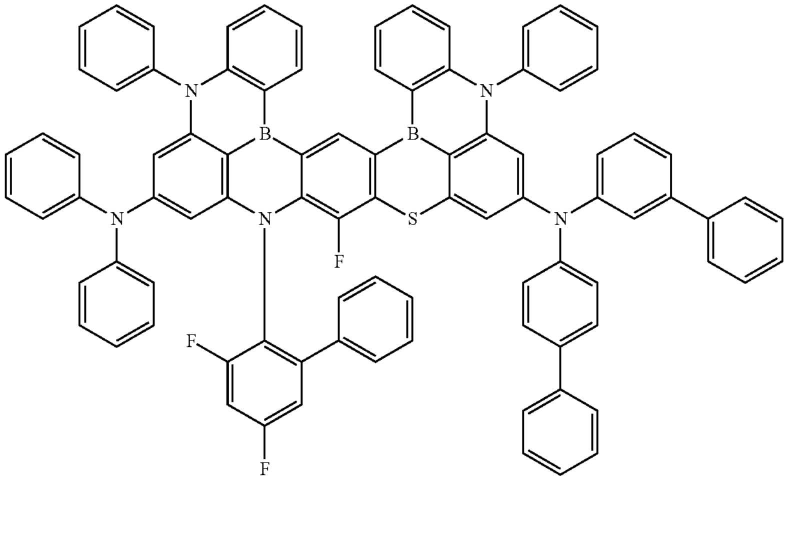
190
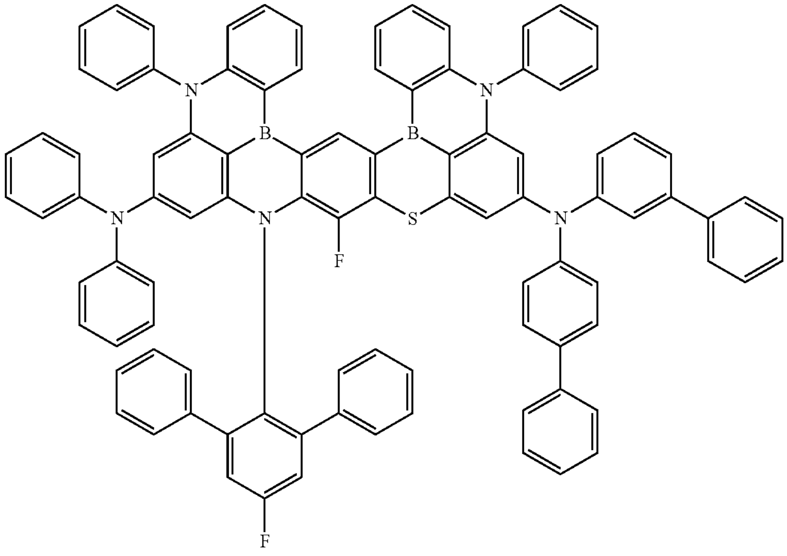
191
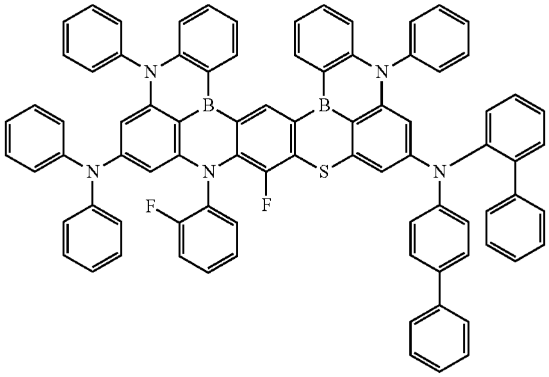
192
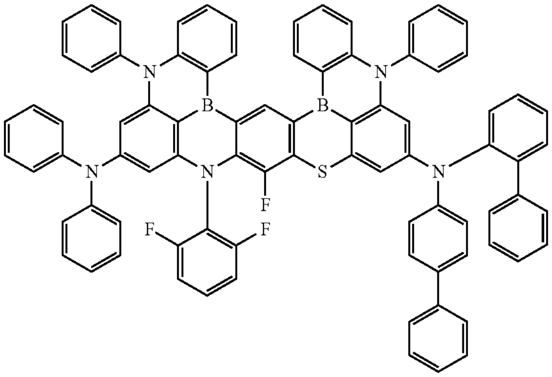

-continued
193
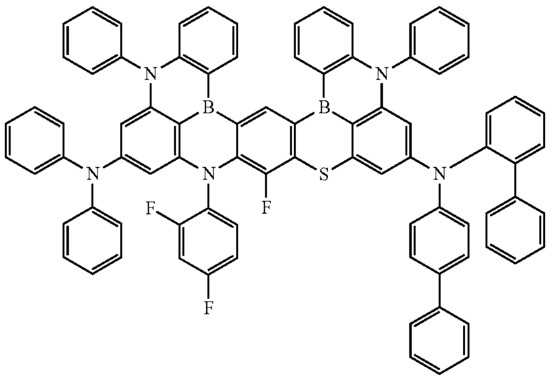
194
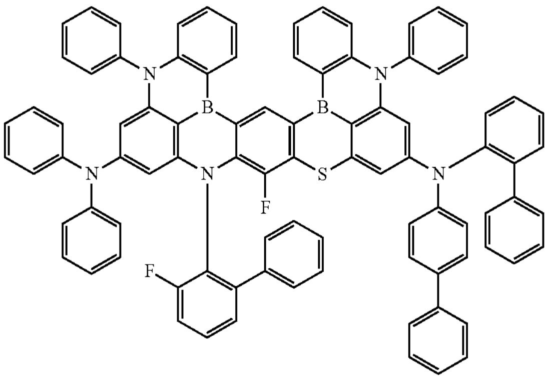
195
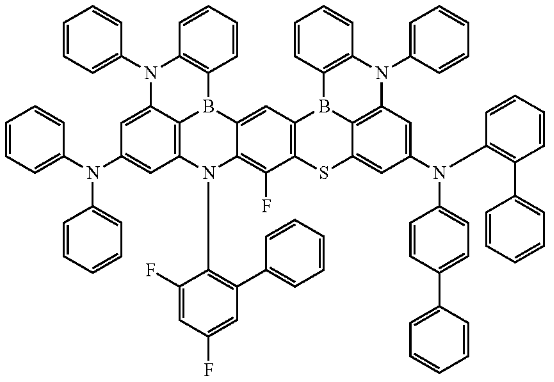
196
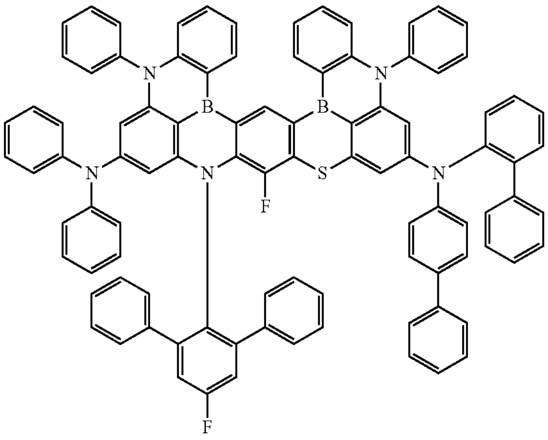
197
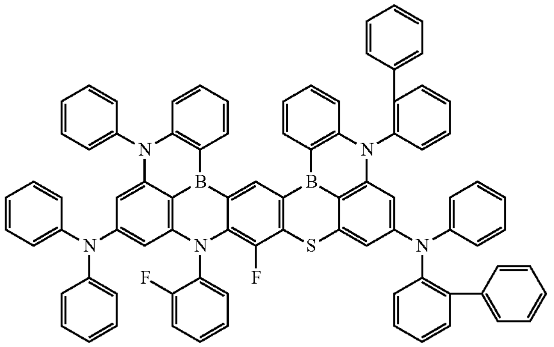
198
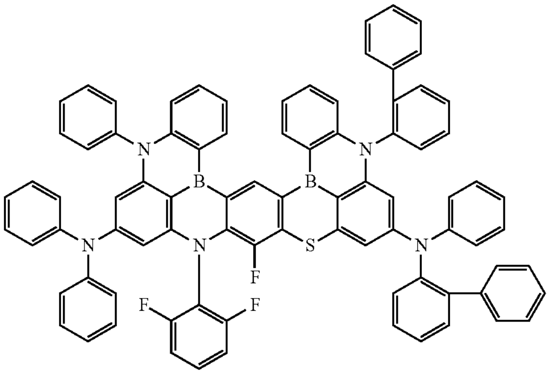

-continued
199
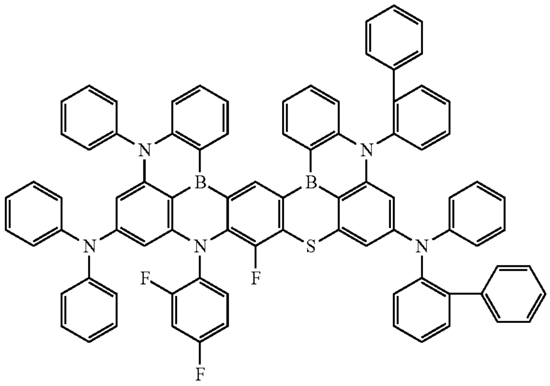
200
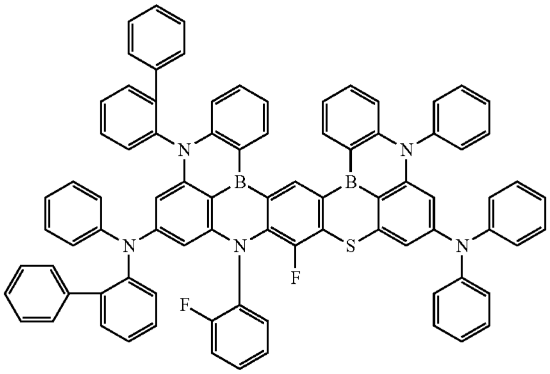
201
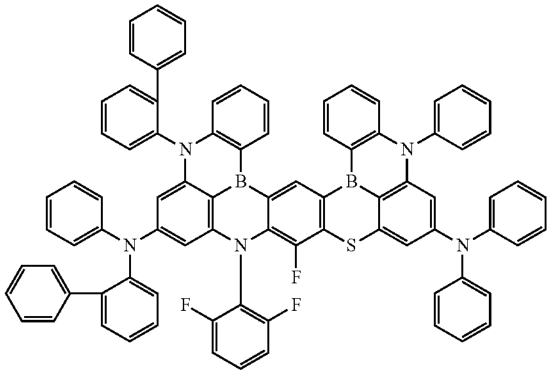
202
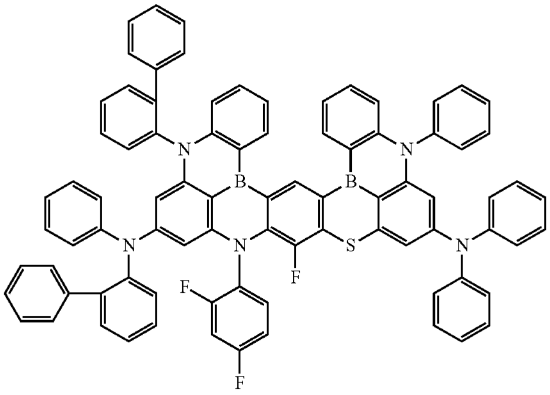
203
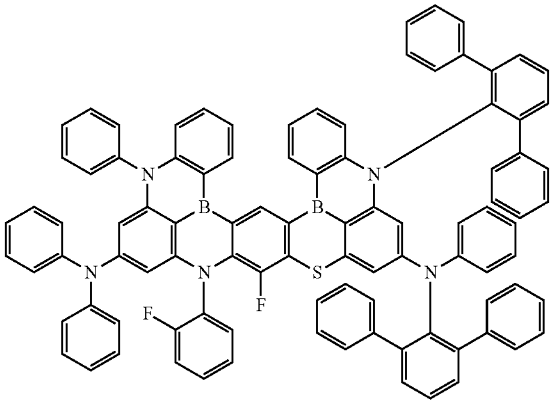
204
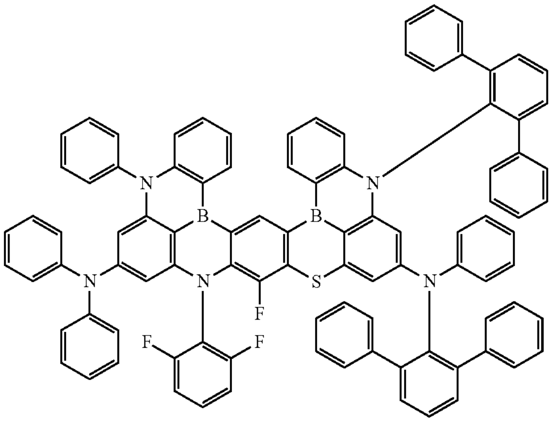

-continued
205
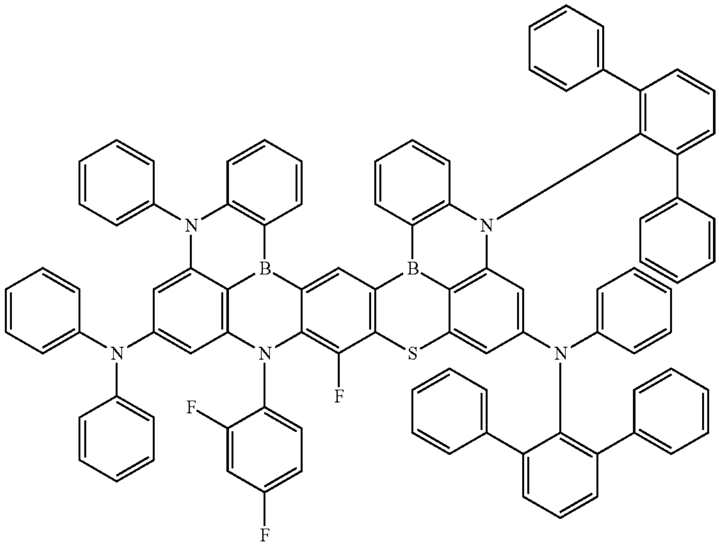
206
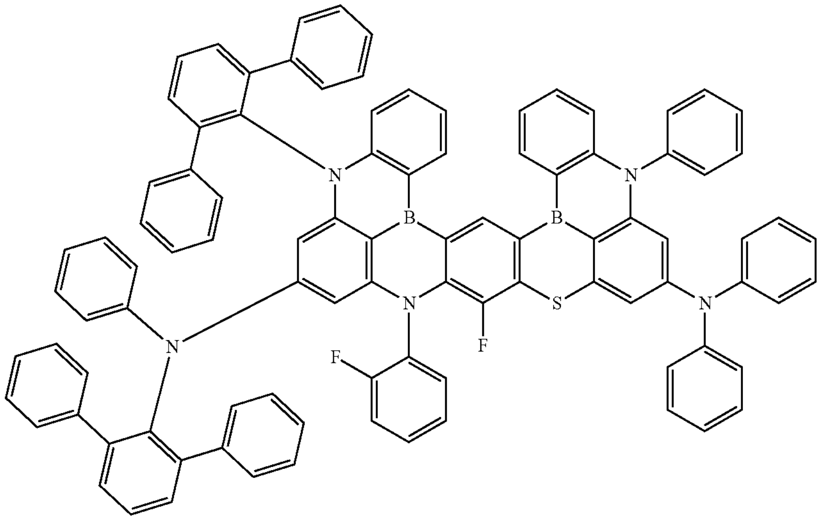
207
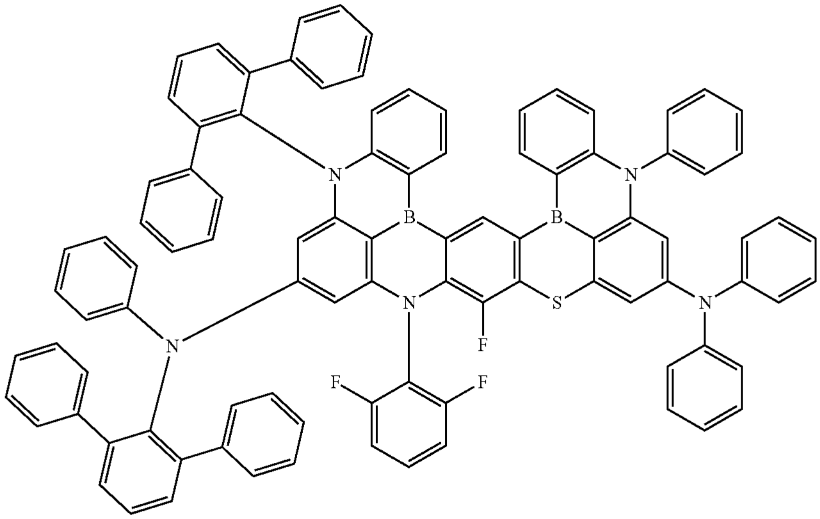

-continued
208
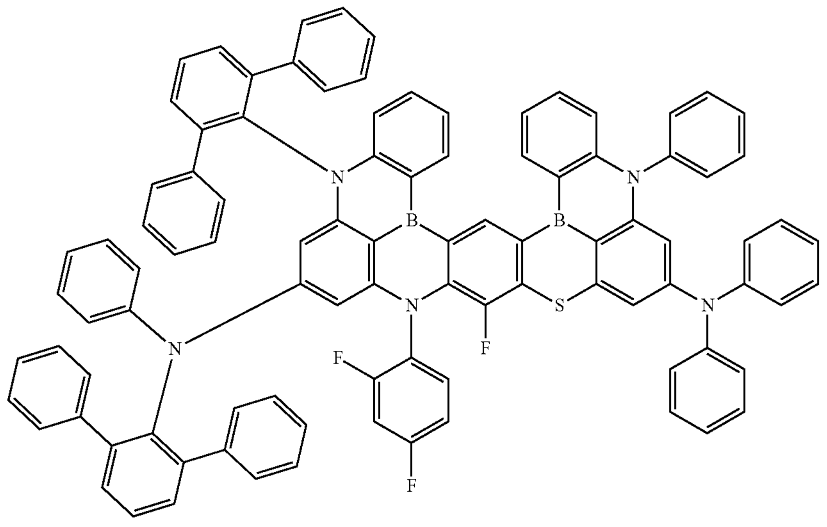
209
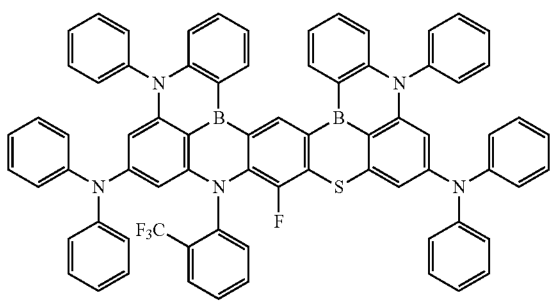
210
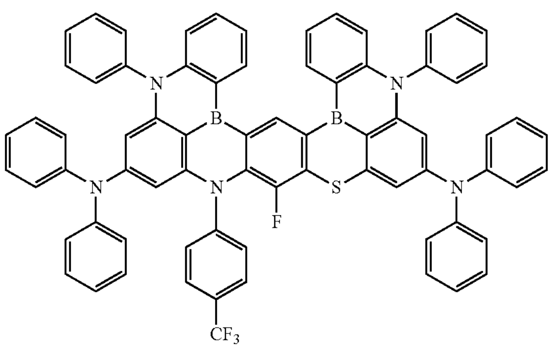
211
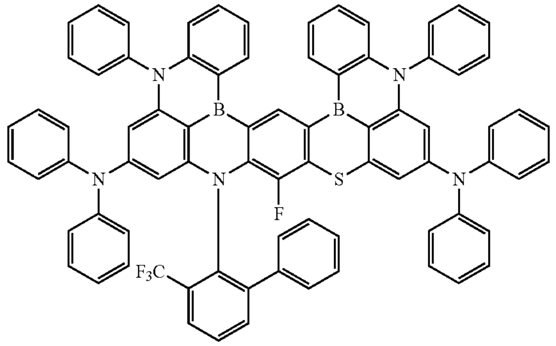
212
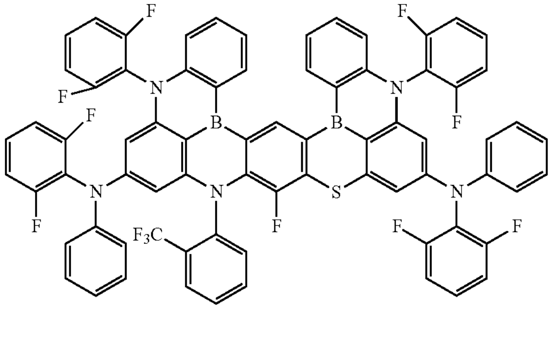

-continued
213
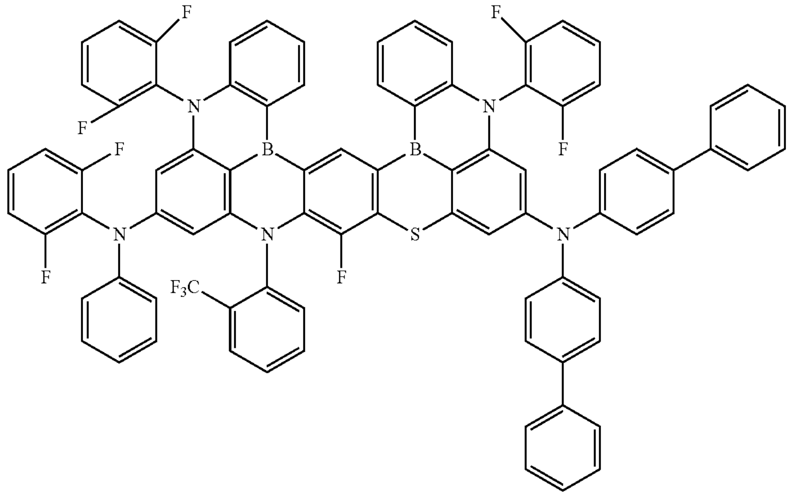
214
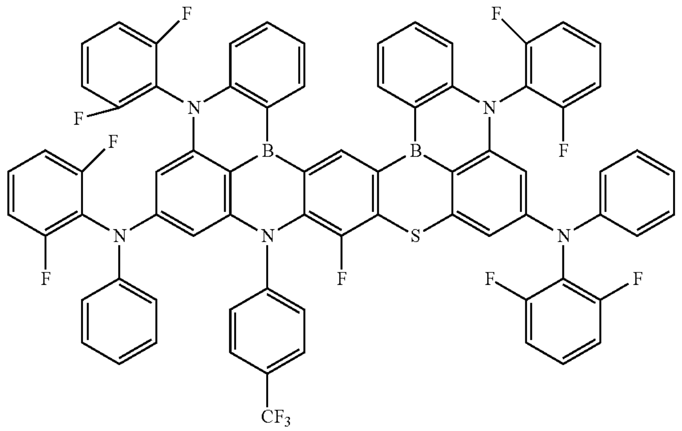
215
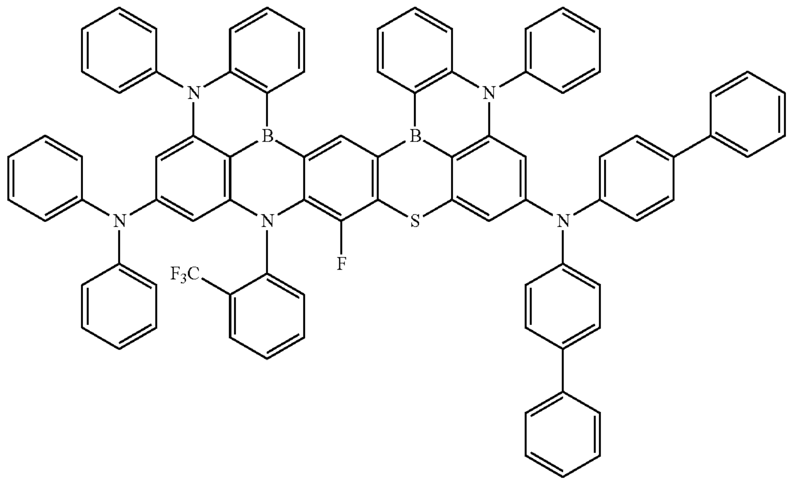

-continued
216
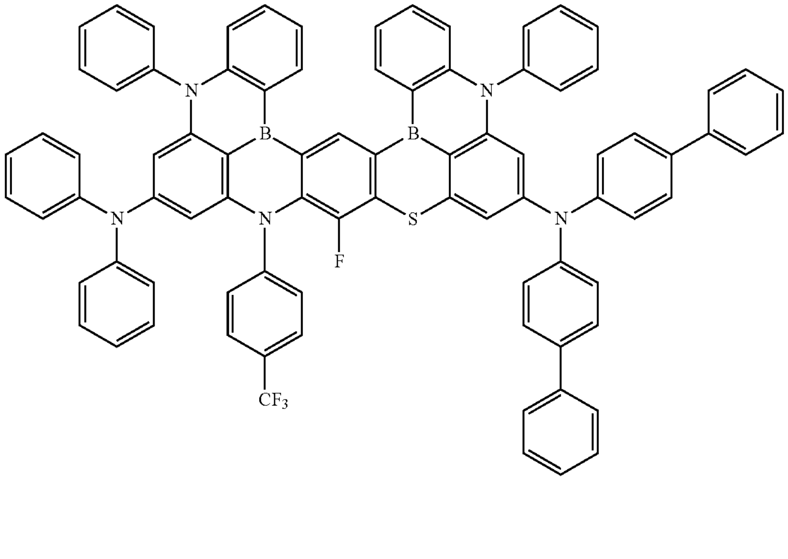
217
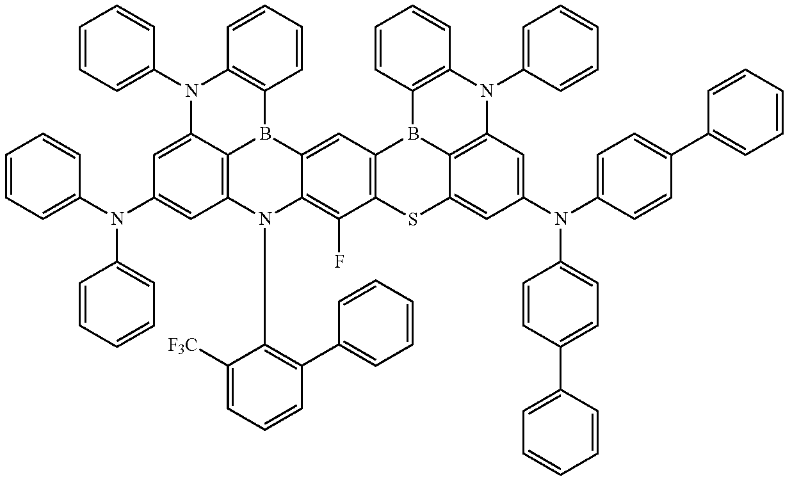
218
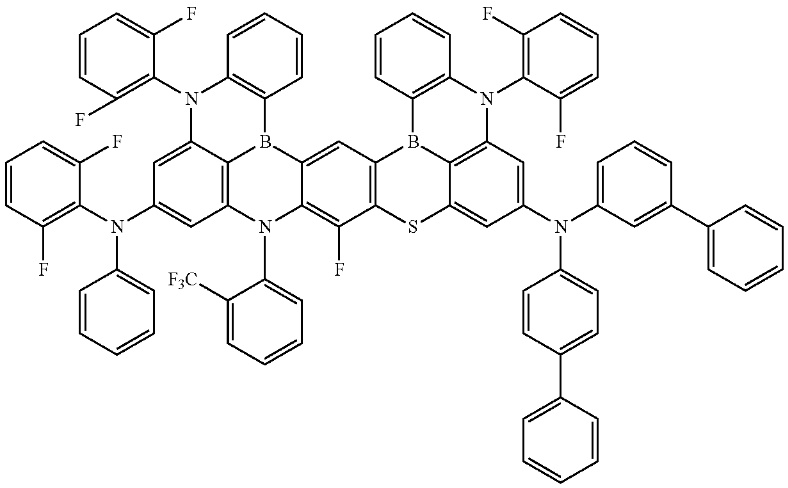

-continued
219
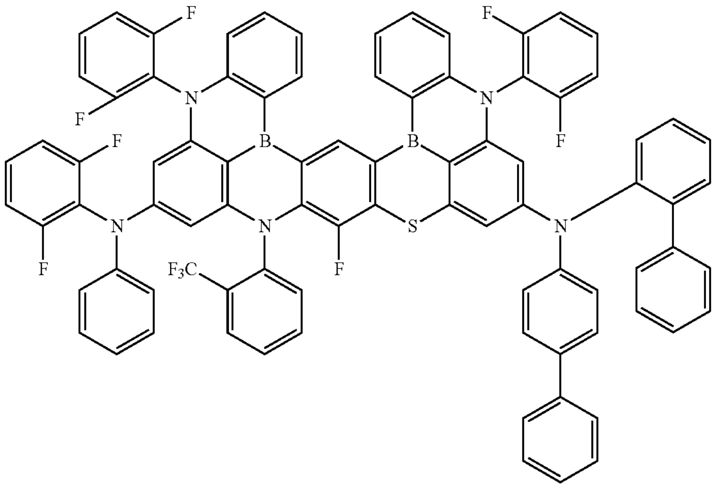
220
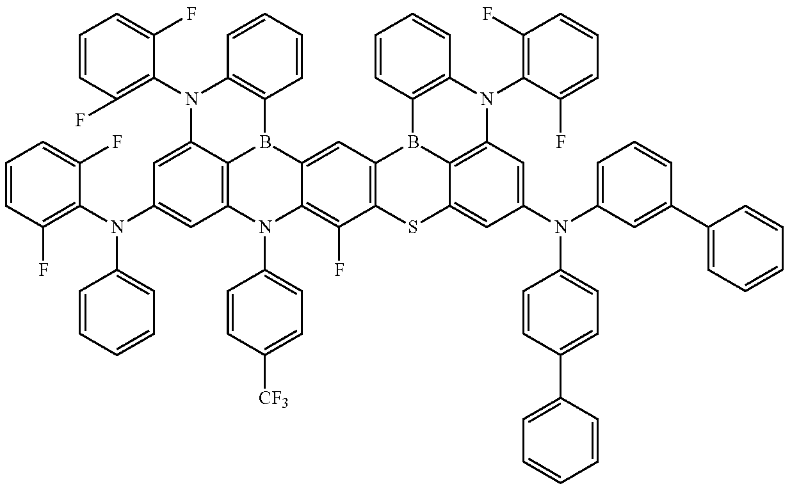
221
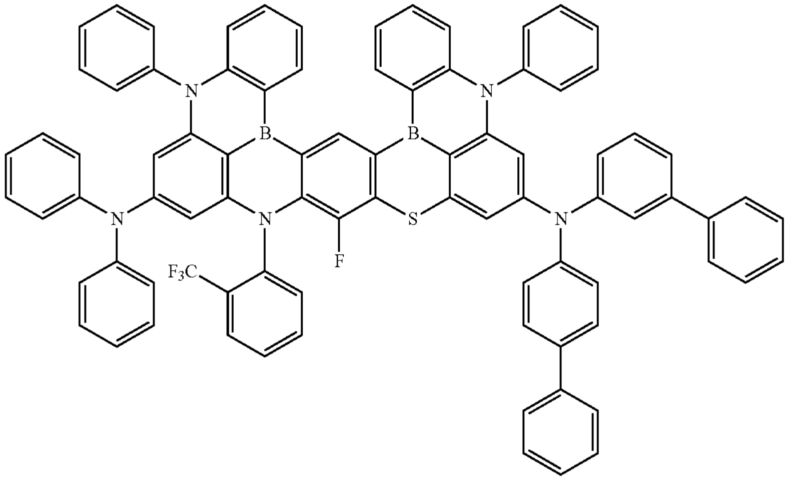

-continued
222
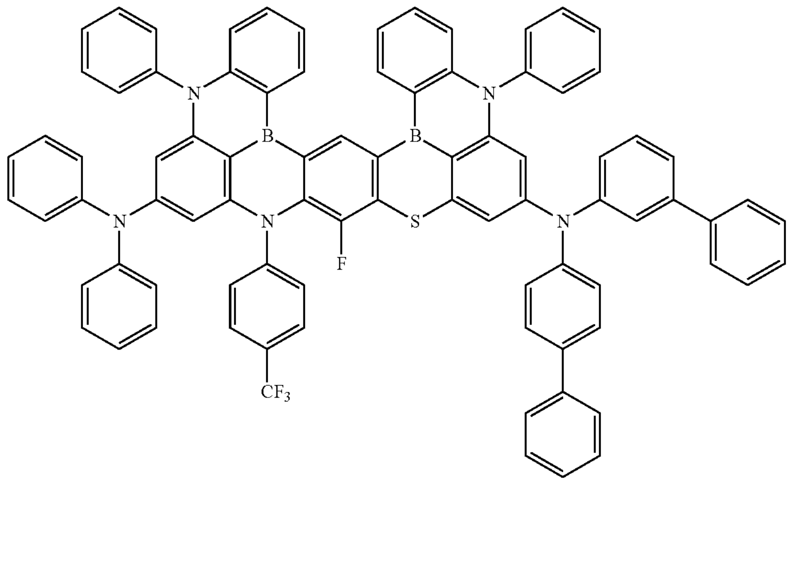
223
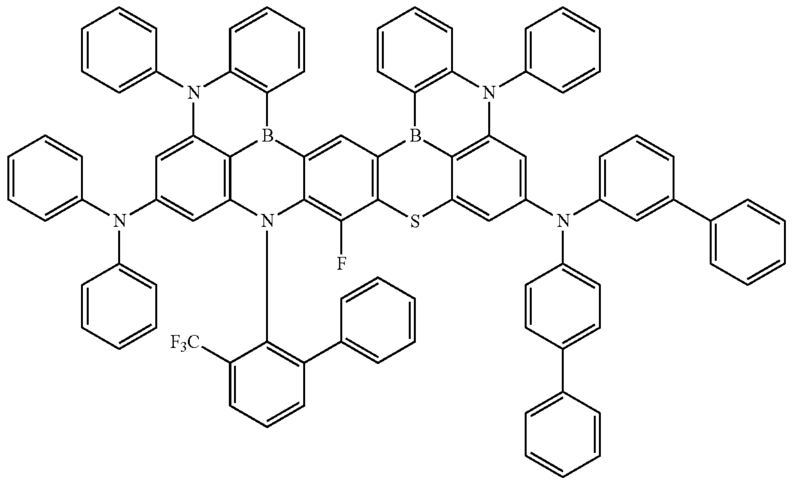
224
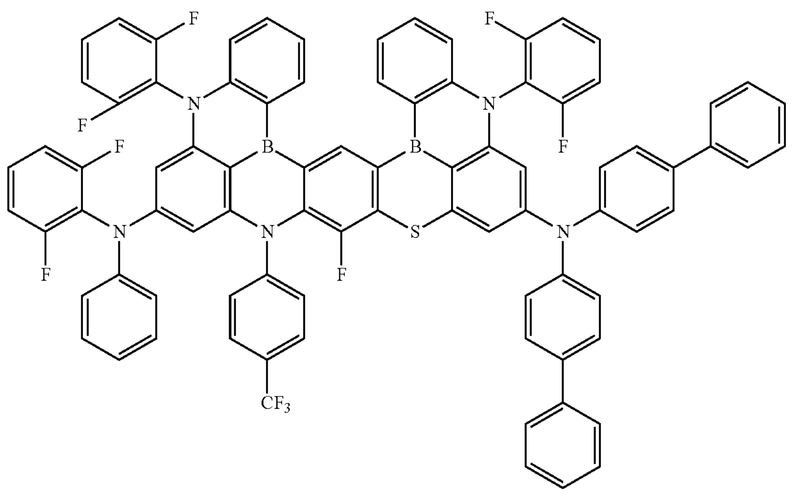

-continued
225
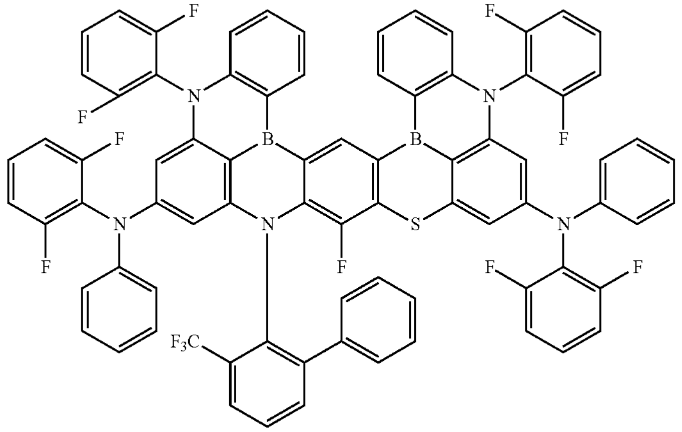
226
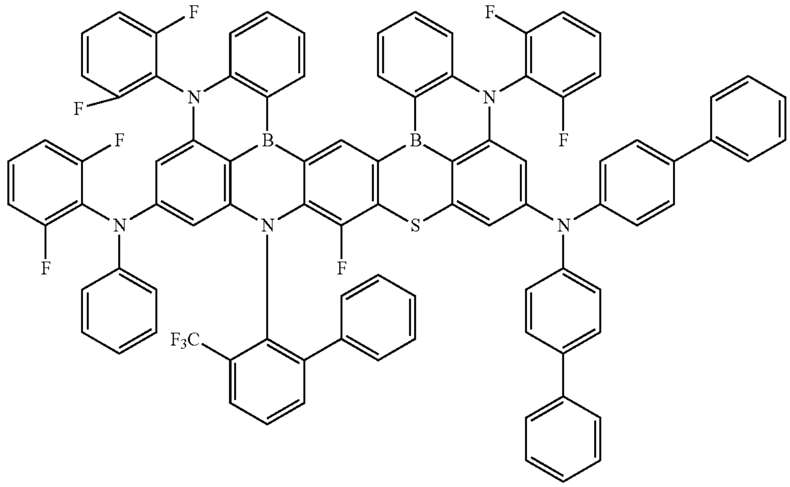
227
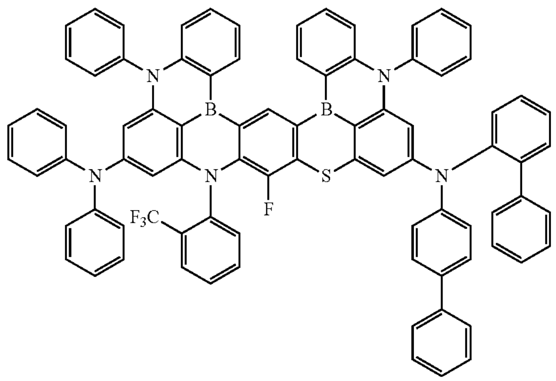
228
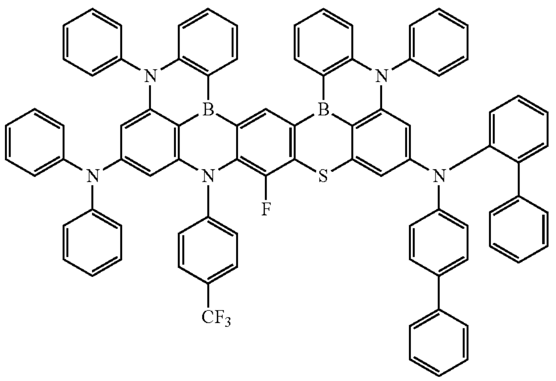

-continued
229
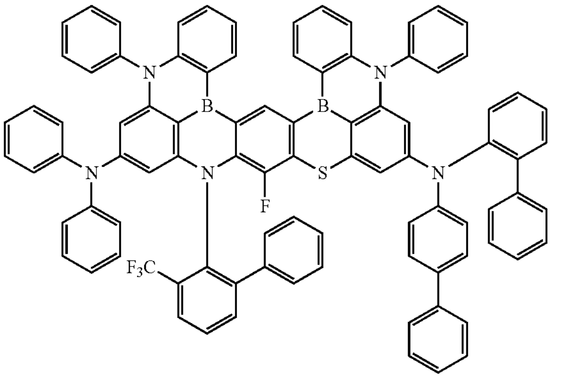
230
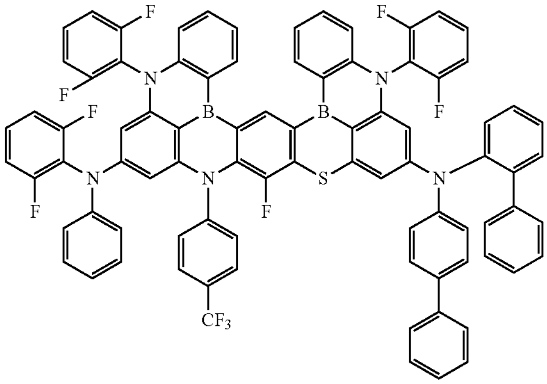
231
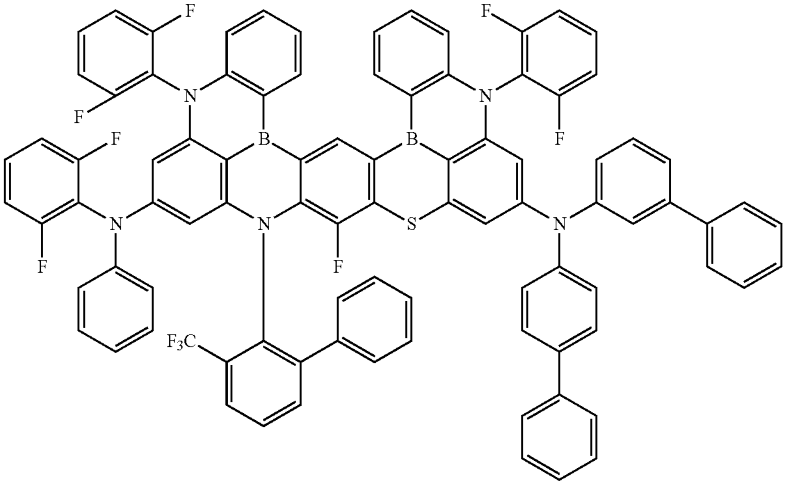
232
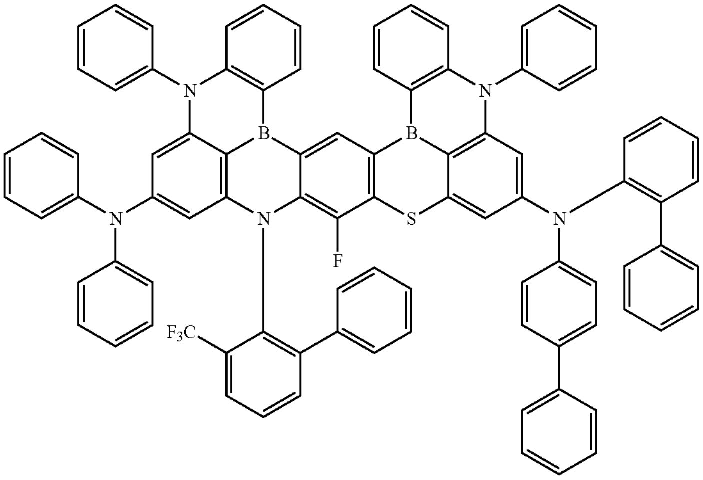

233
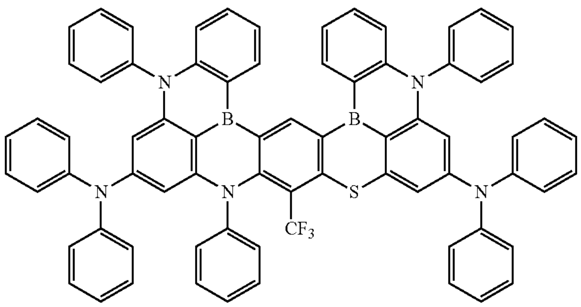
234
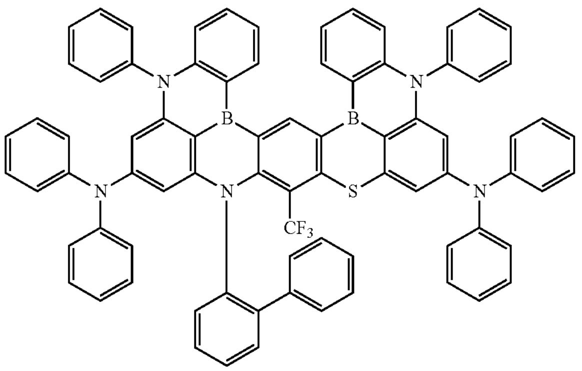
235
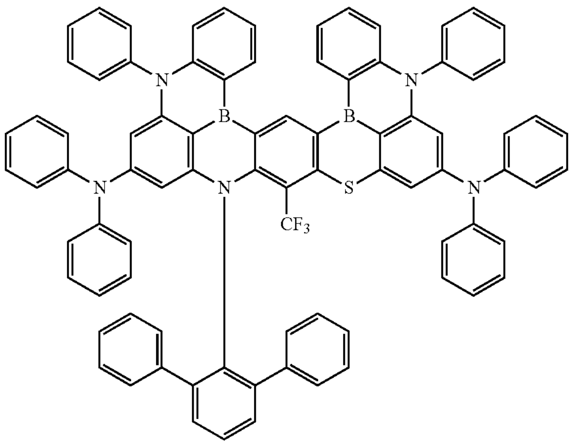
236
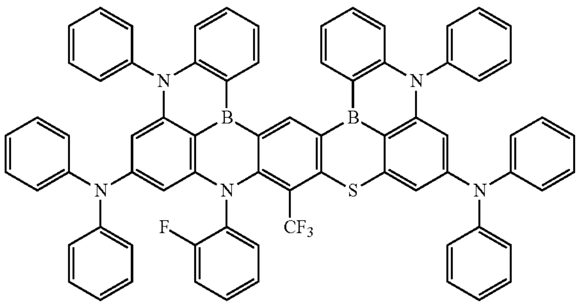
237
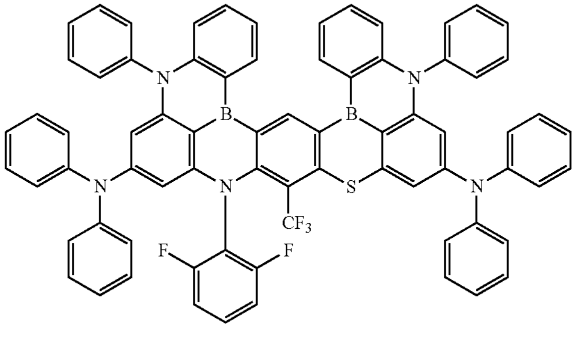
238
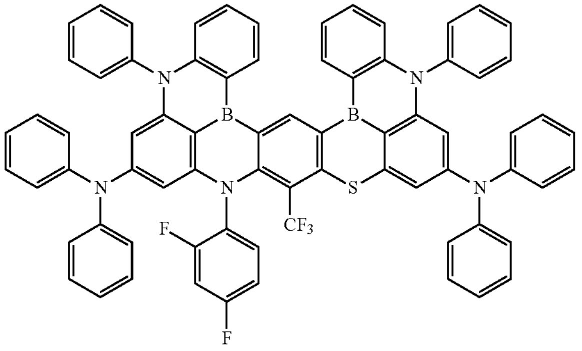
239
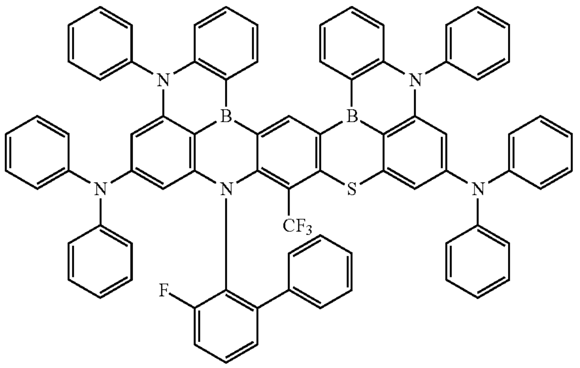
240
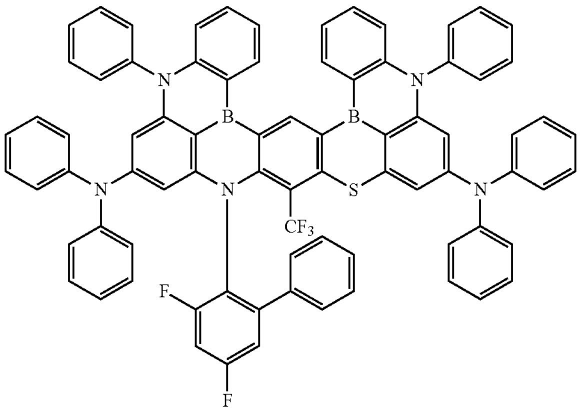

-continued
241
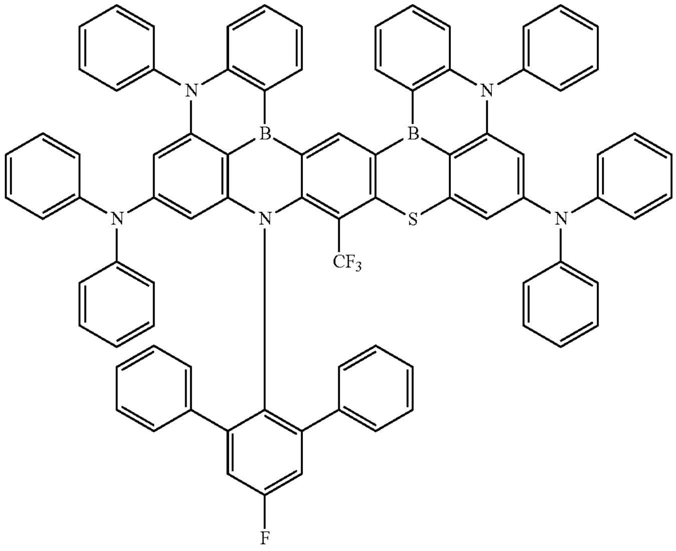
242
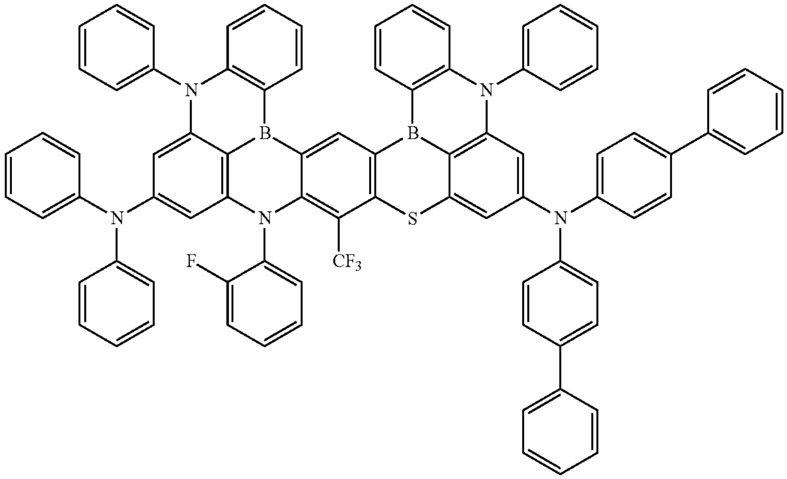
243
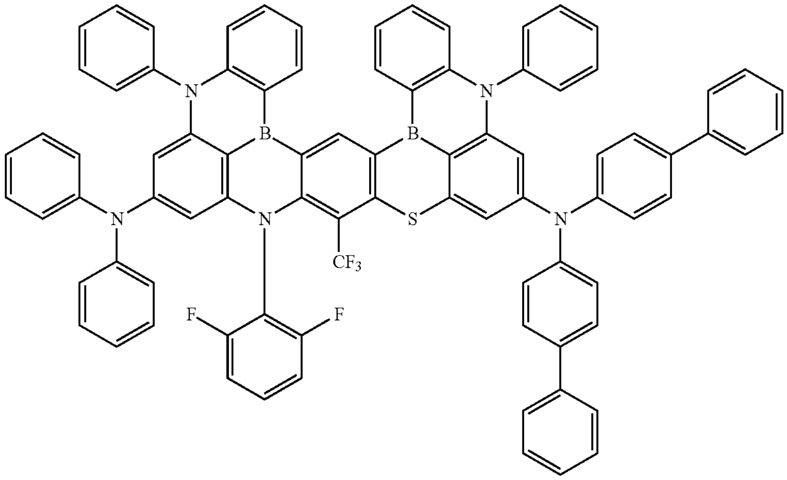

-continued
244
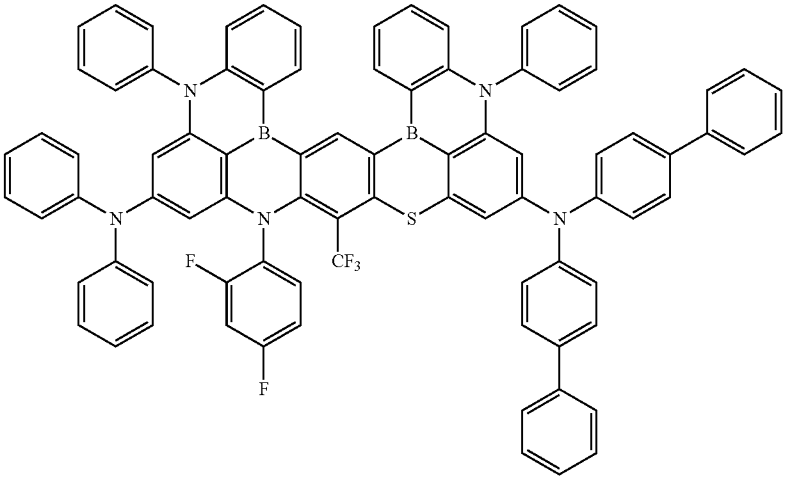
245
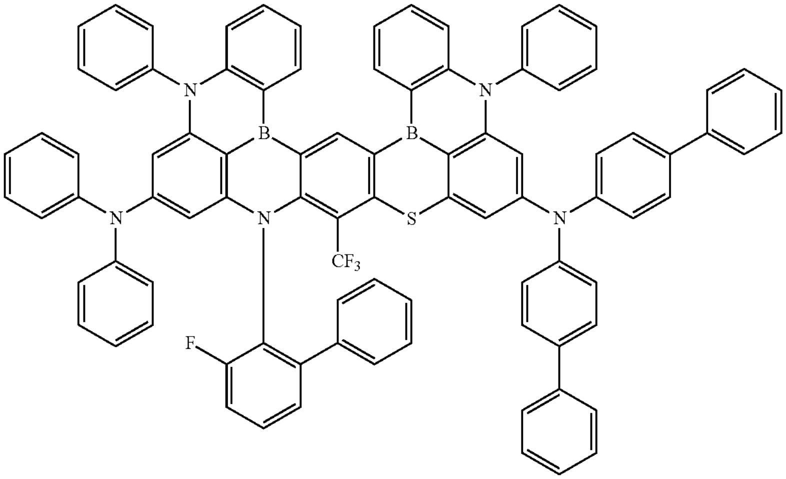
246
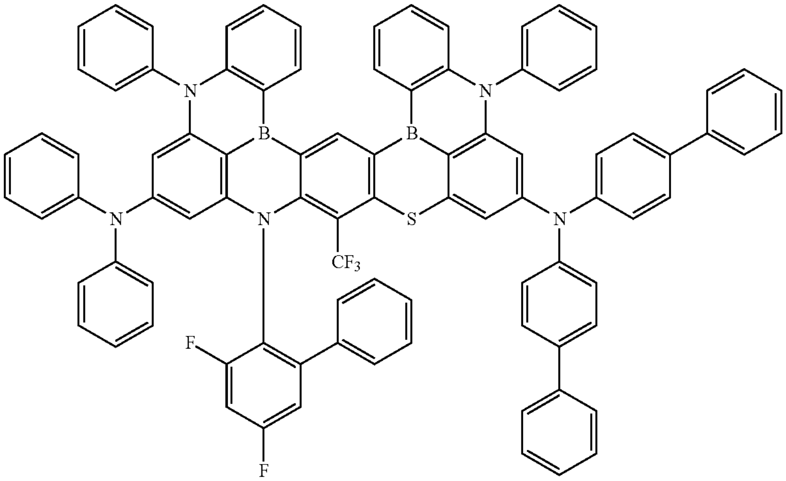

-continued
247
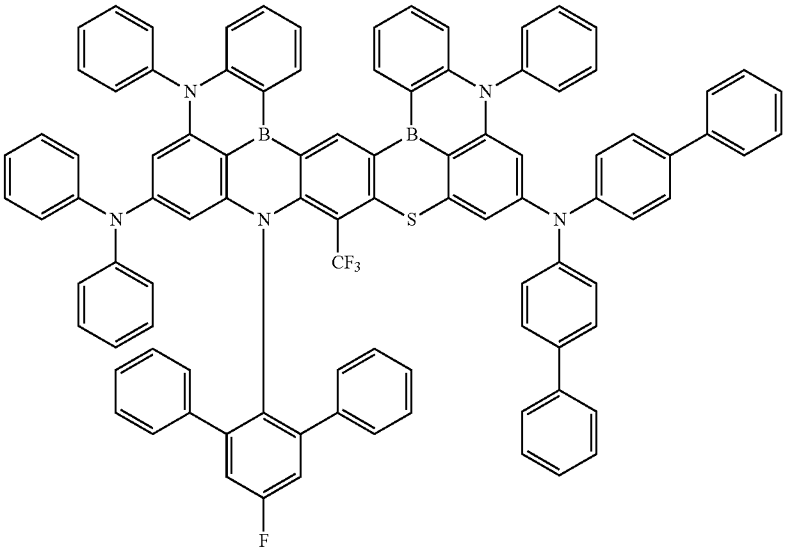
248
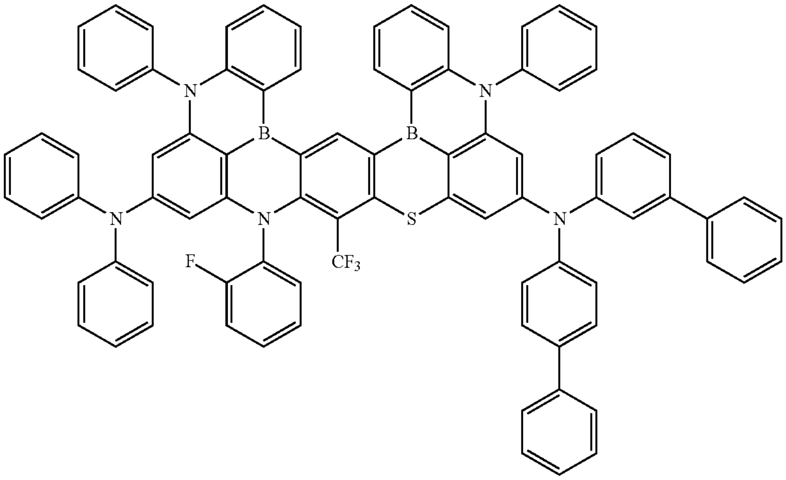
249
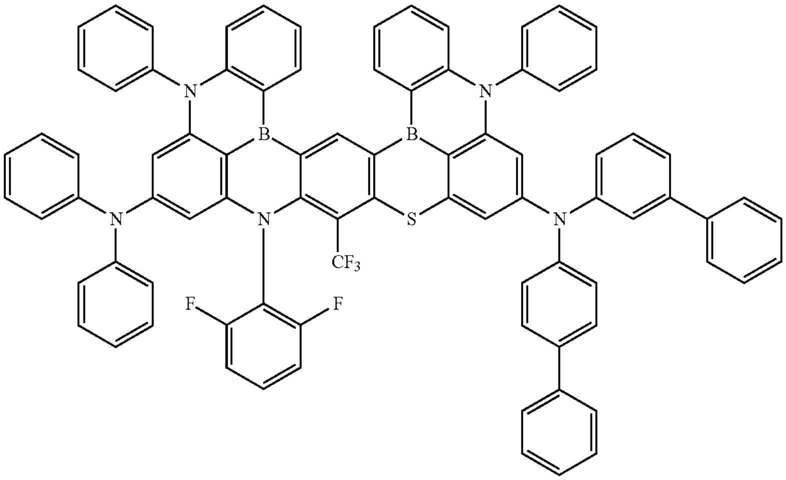

-continued
250
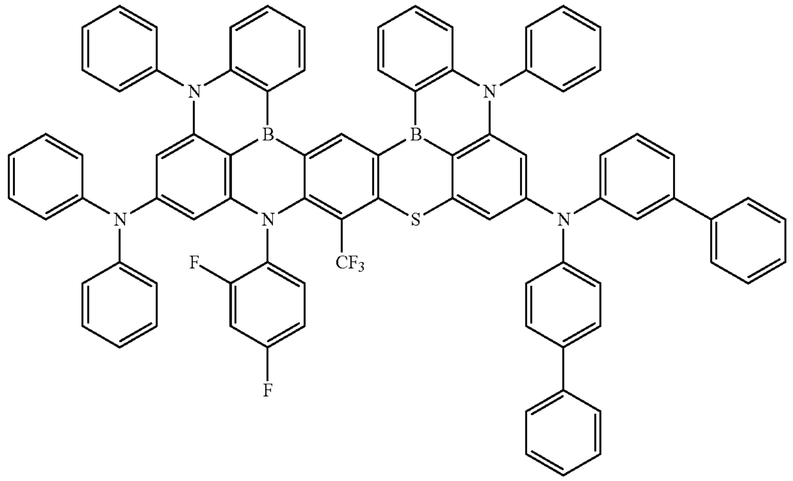
251
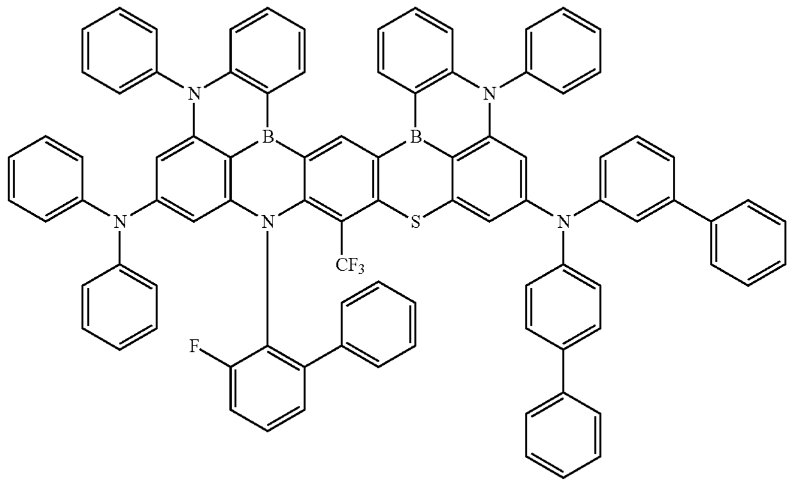
252
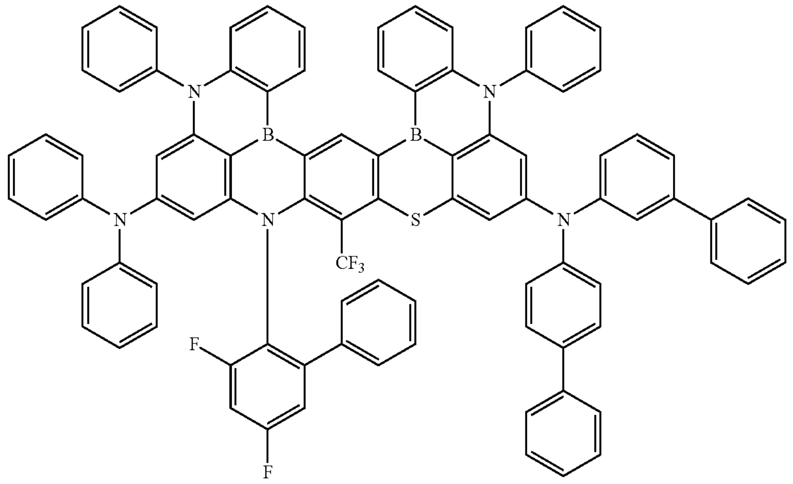

-continued
253
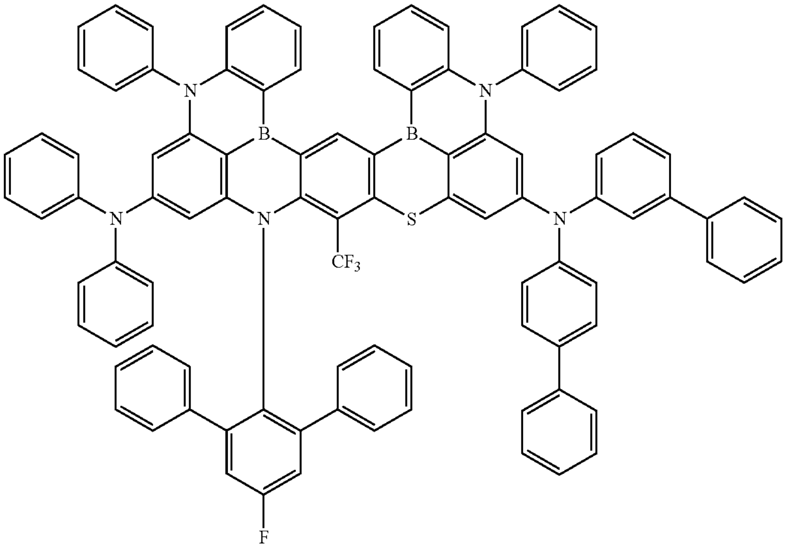
254
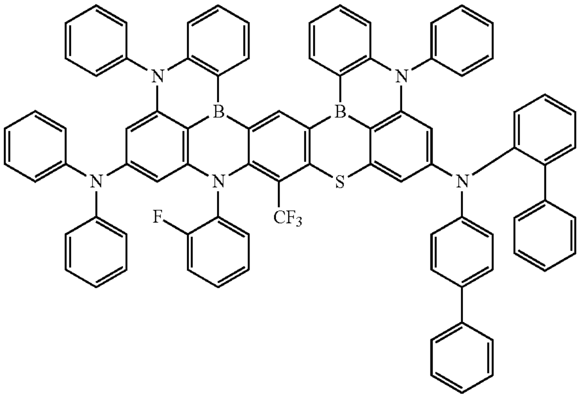
255
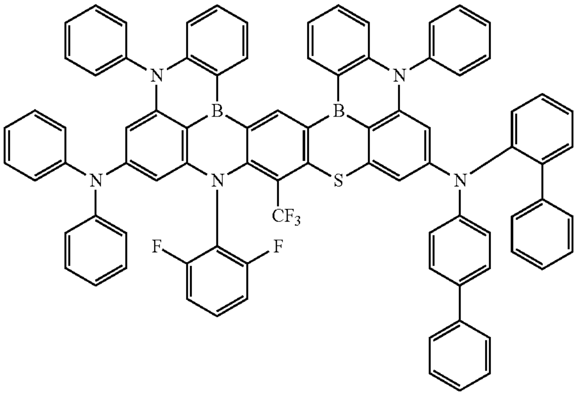
256
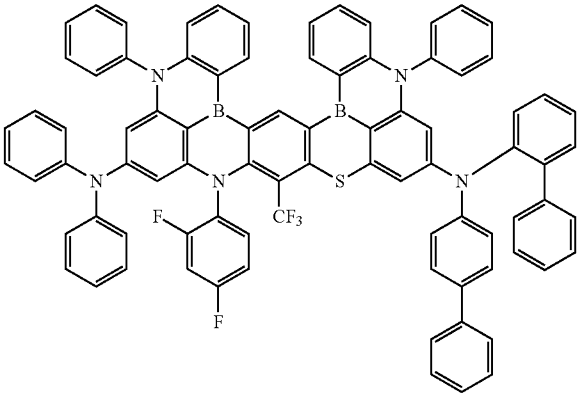
257
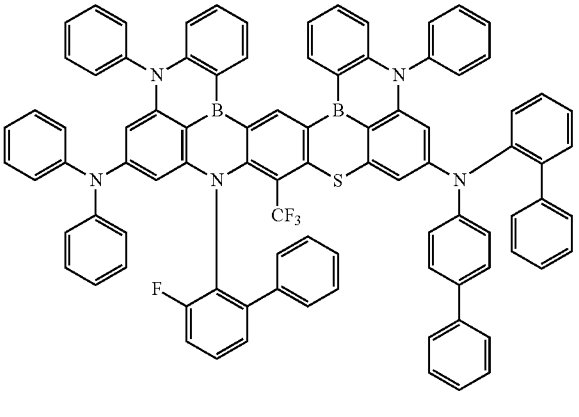

-continued
258
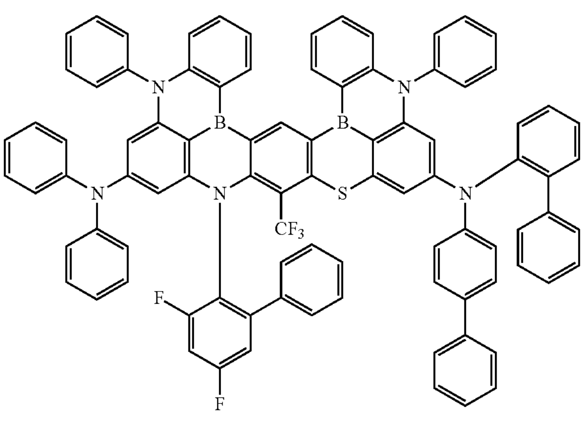
259
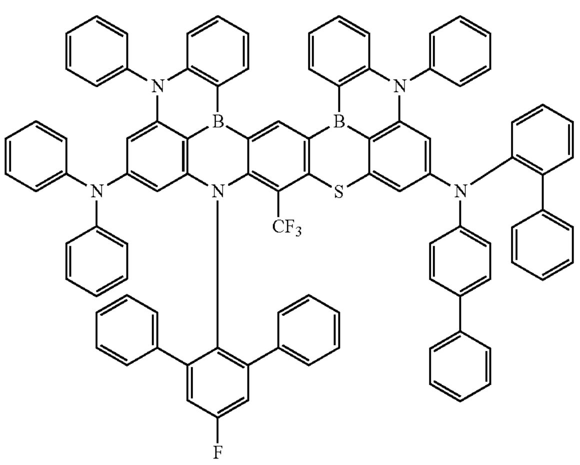
260
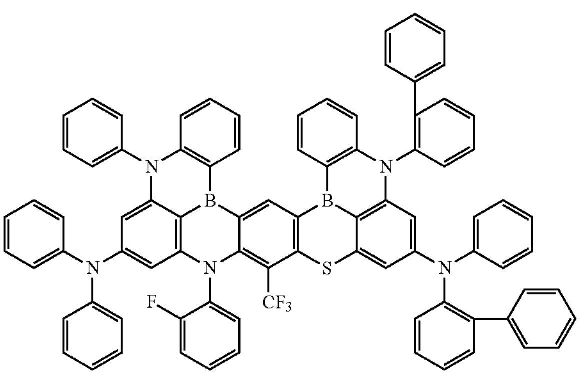
261
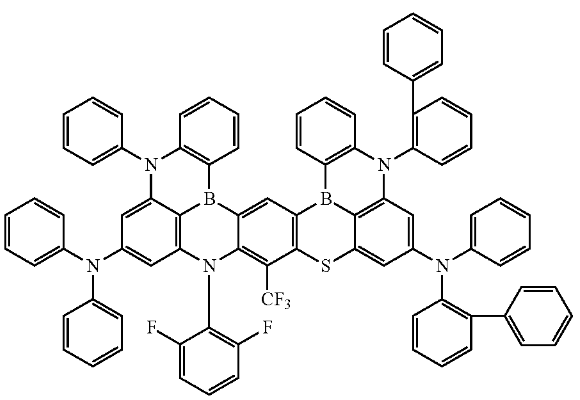
262
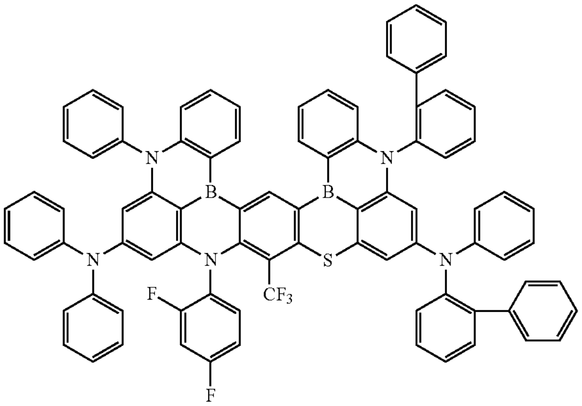
263
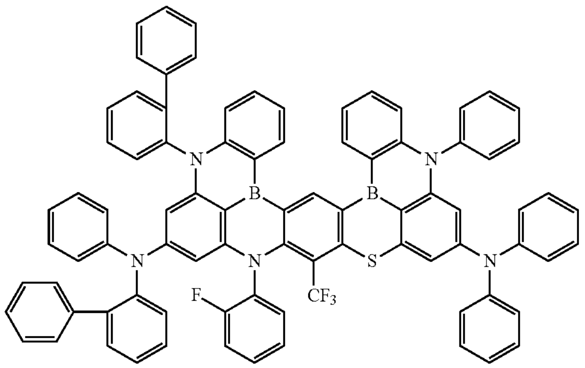

-continued
264
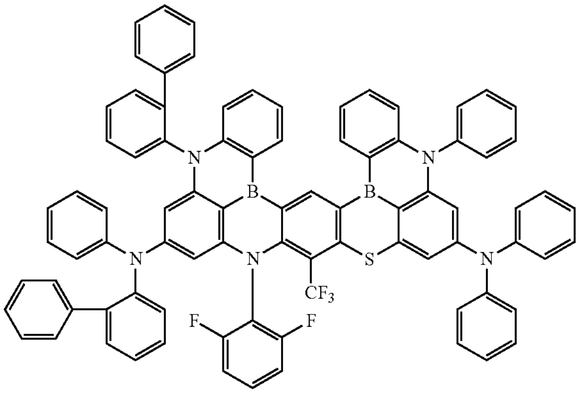
265
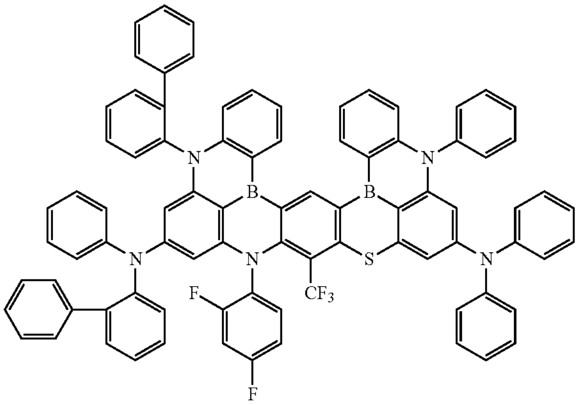
266
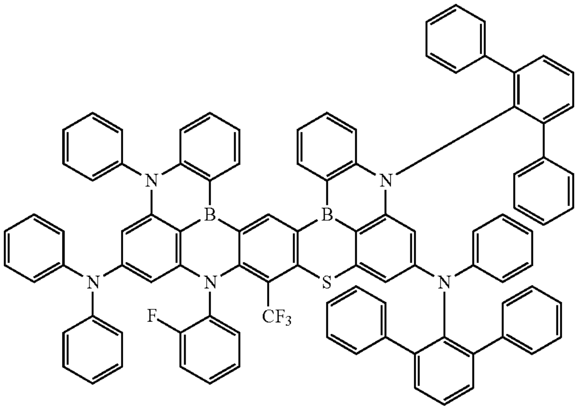
267
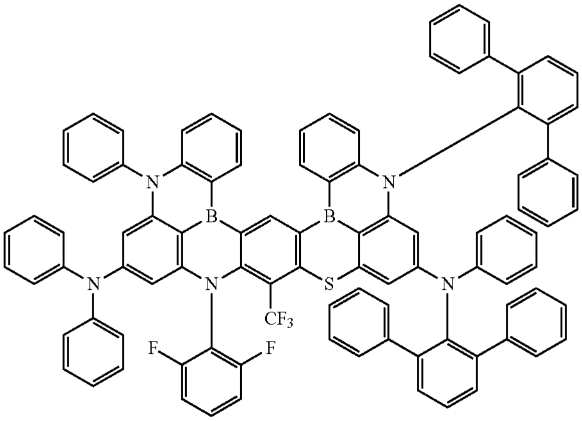
268
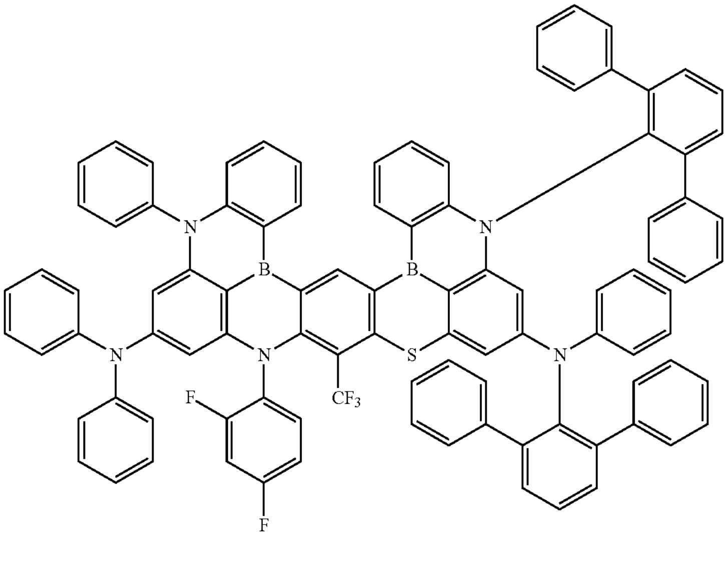

-continued
269
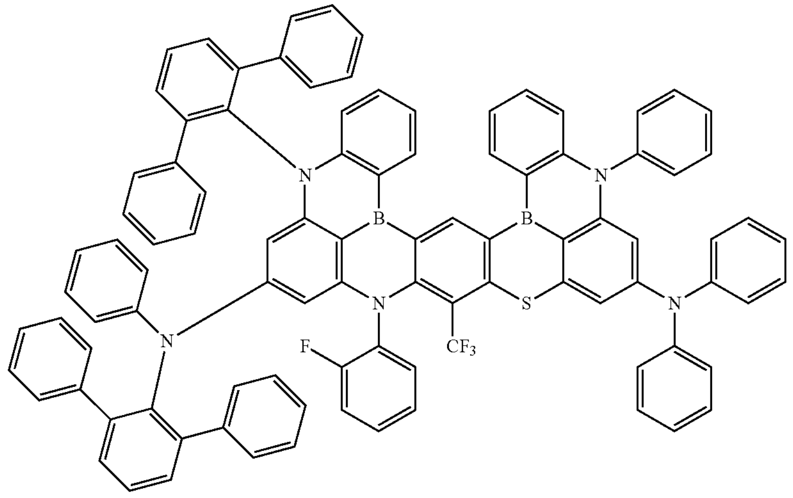
270
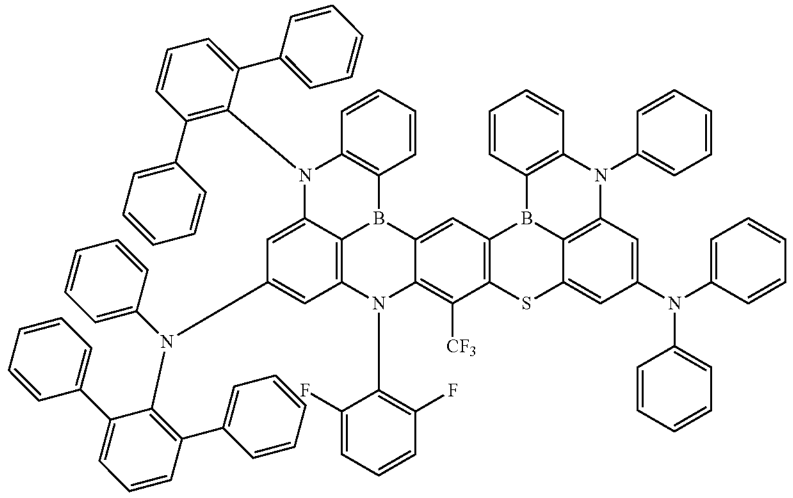
271
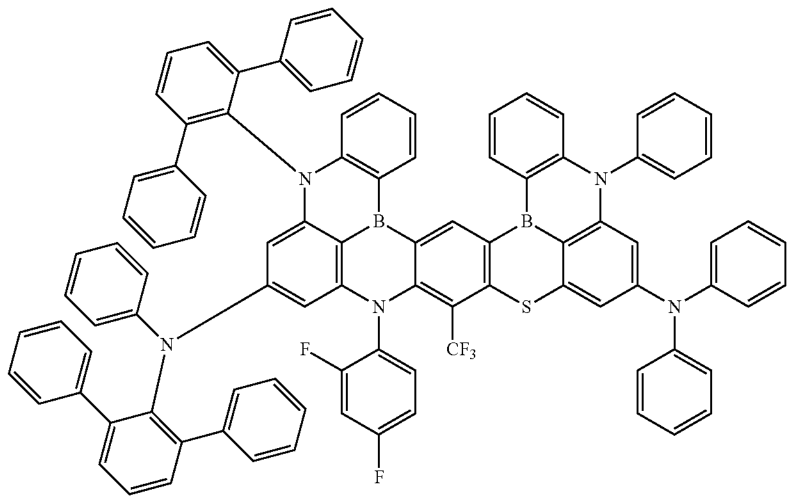

-continued
272
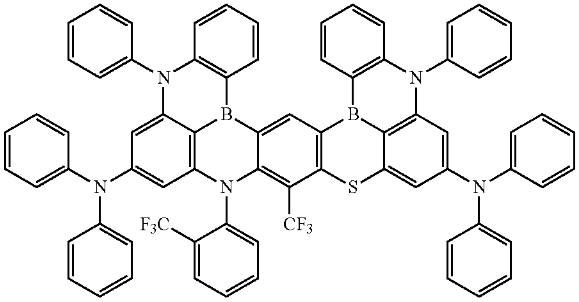
273
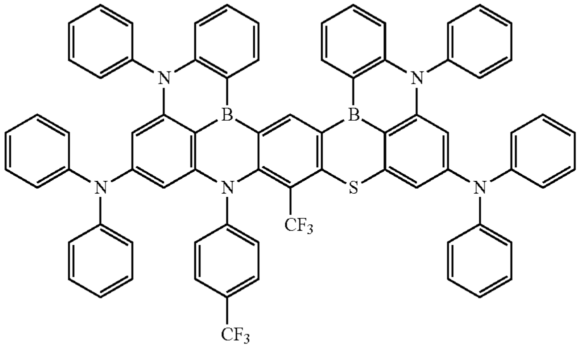
274
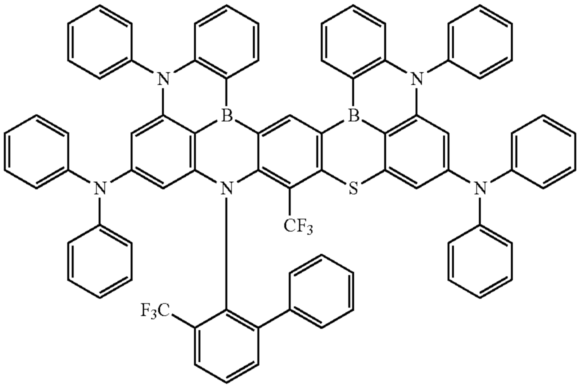
275
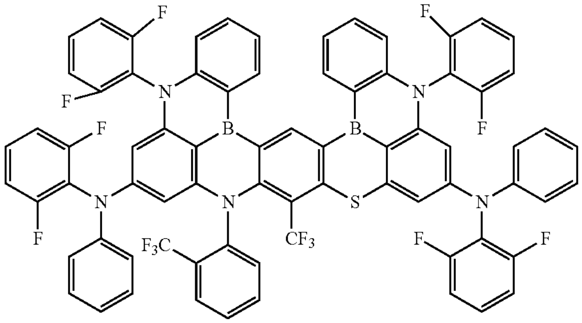
276
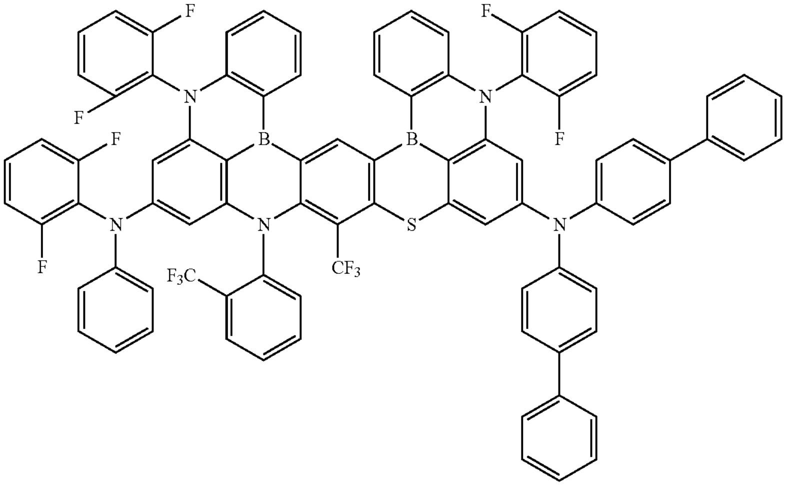

-continued
278
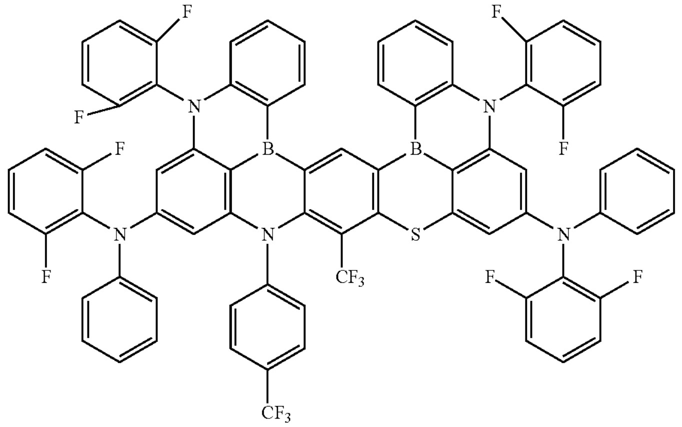
279
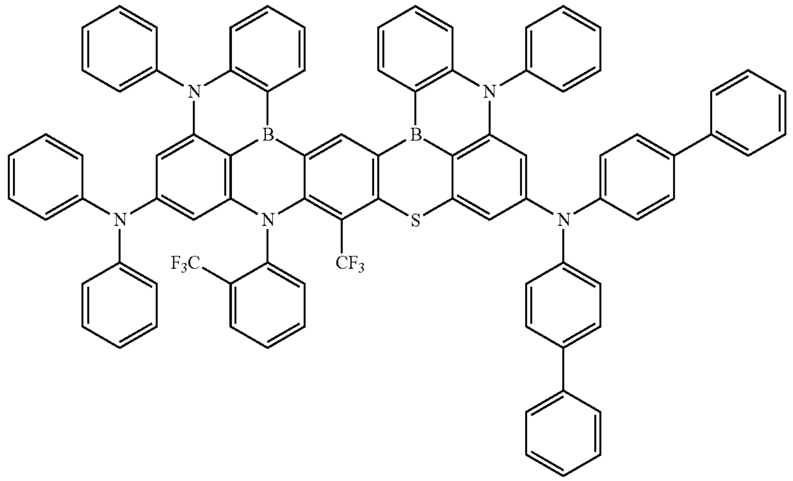
280
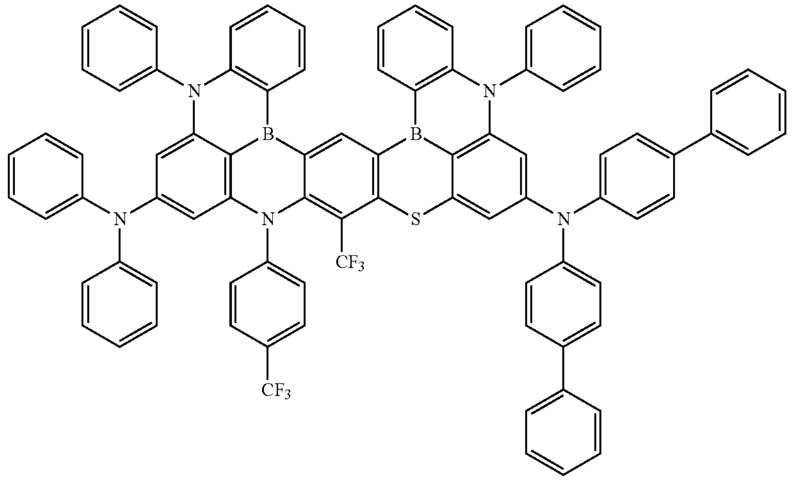

-continued
281
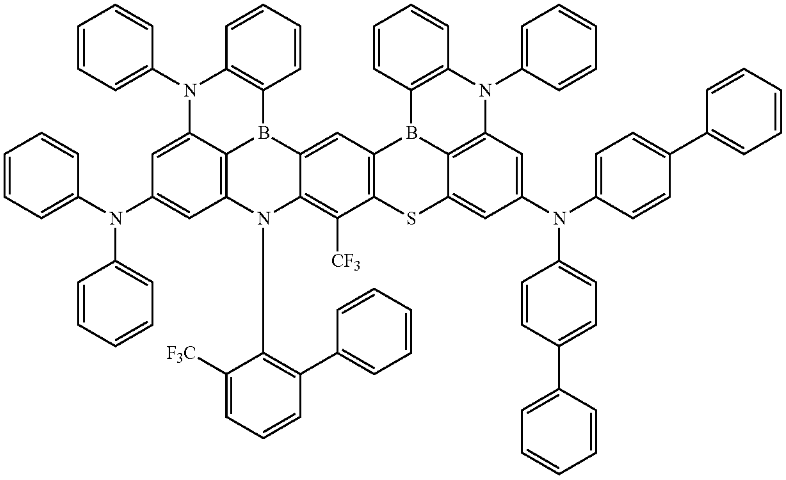
282
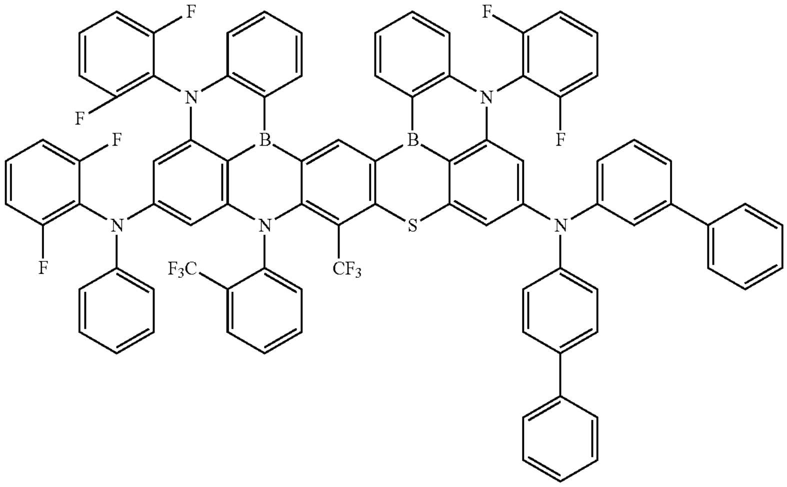
283
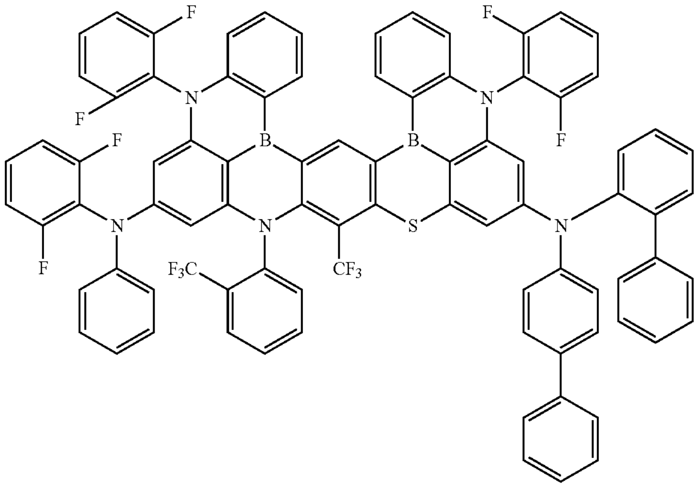

-continued
284
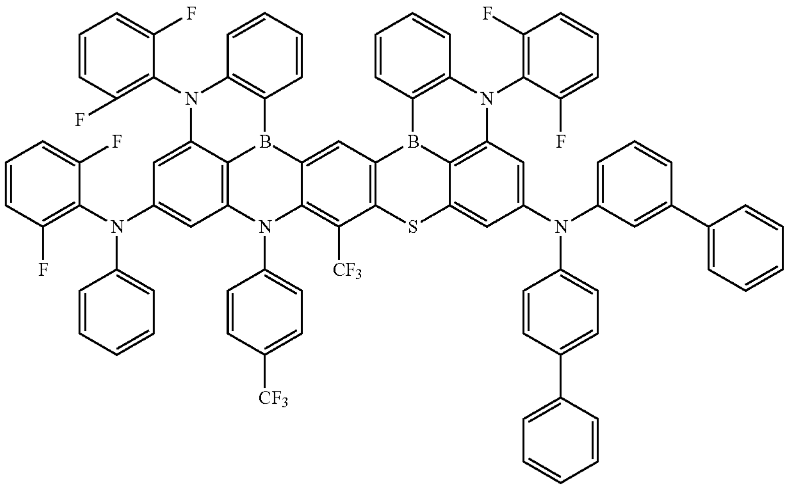
285
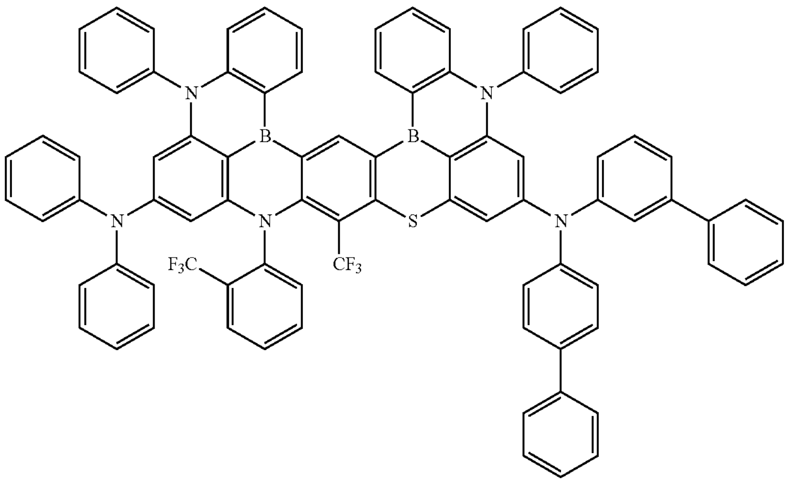
286
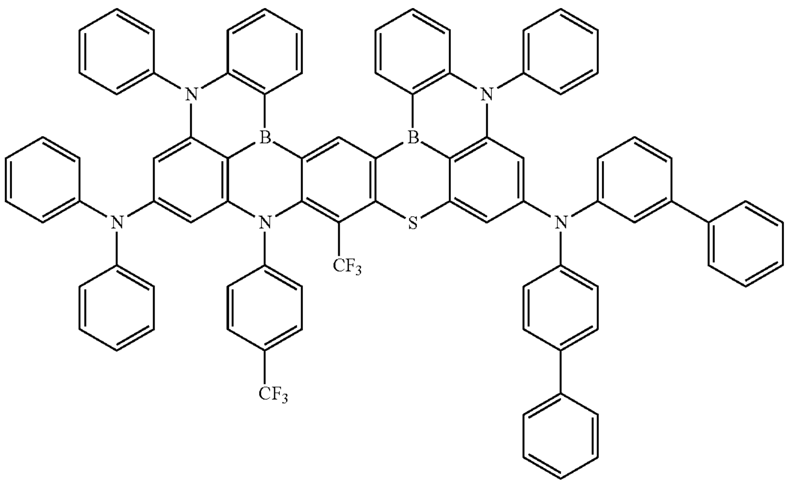

-continued
287
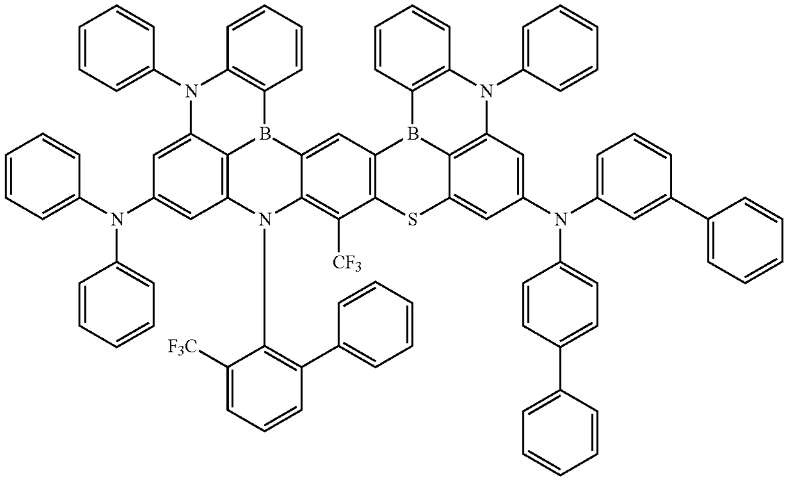
288
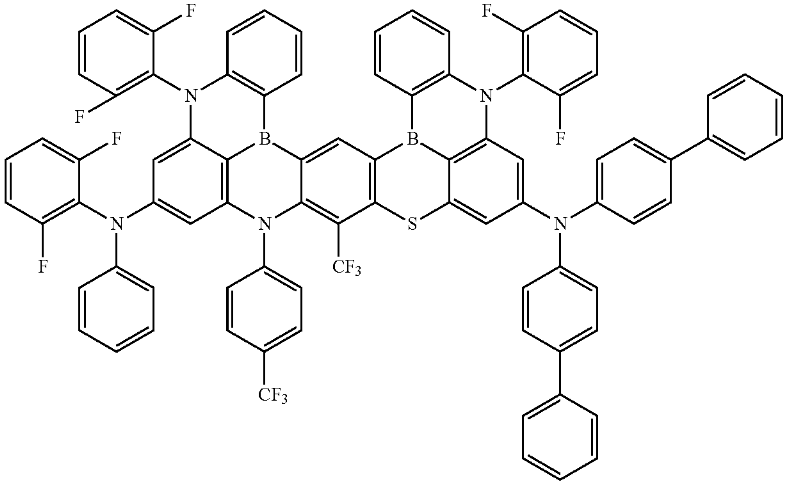
289
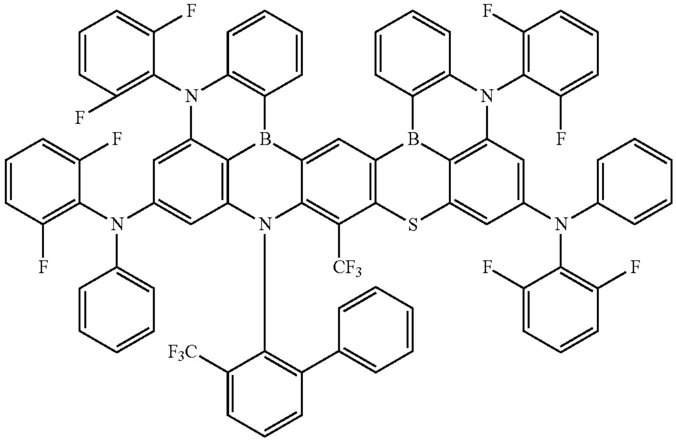

-continued
290
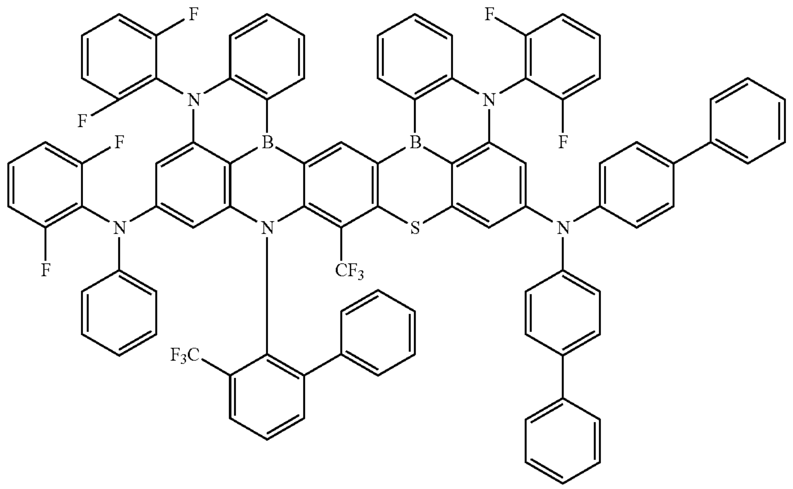
291
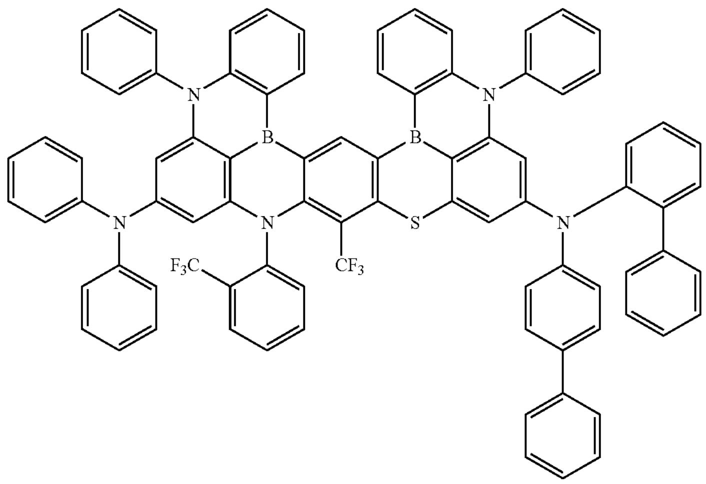
292
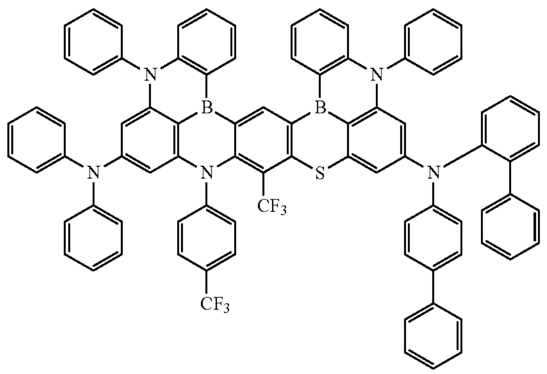
293
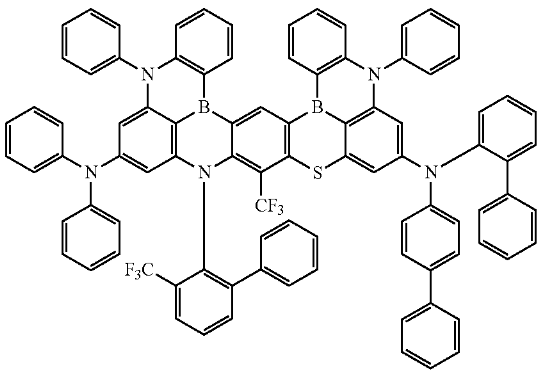

-continued
294
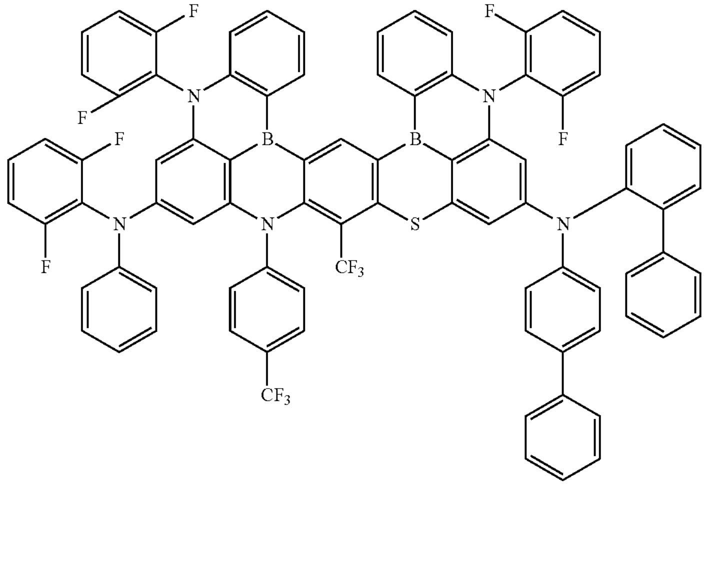
295
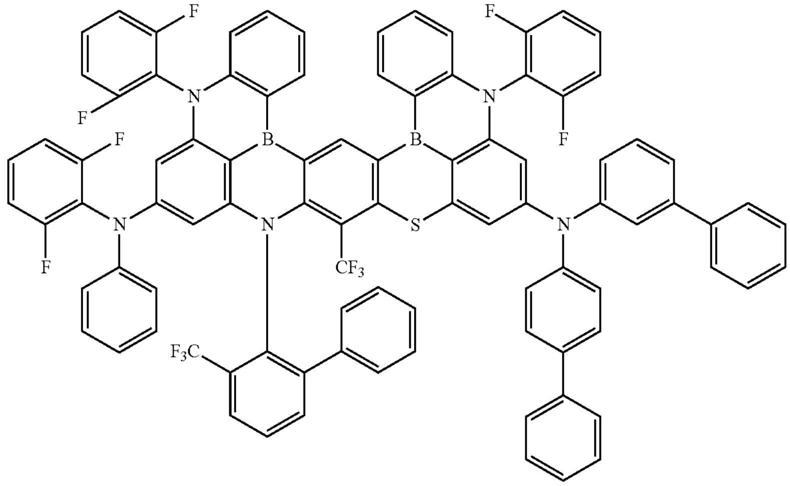
296
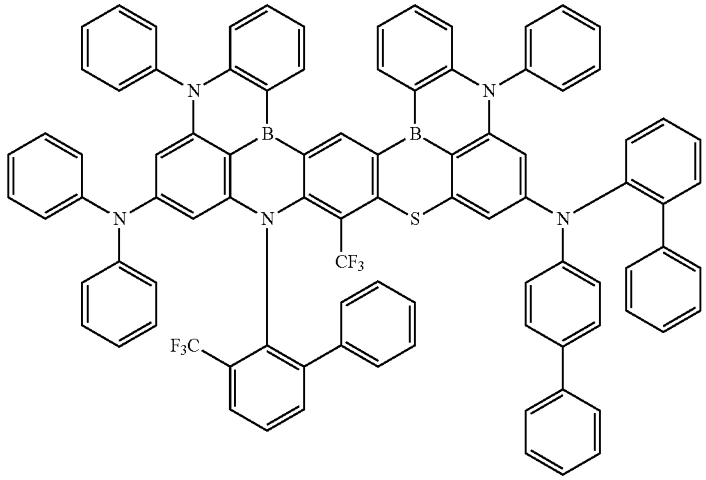

-continued
297
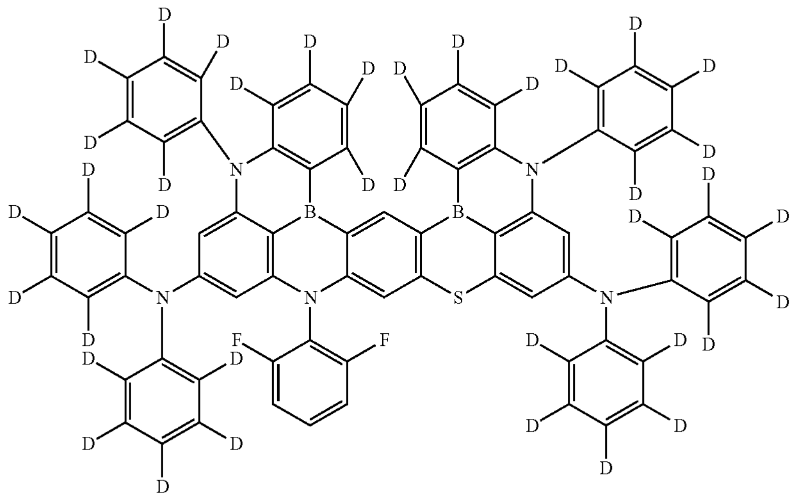
298
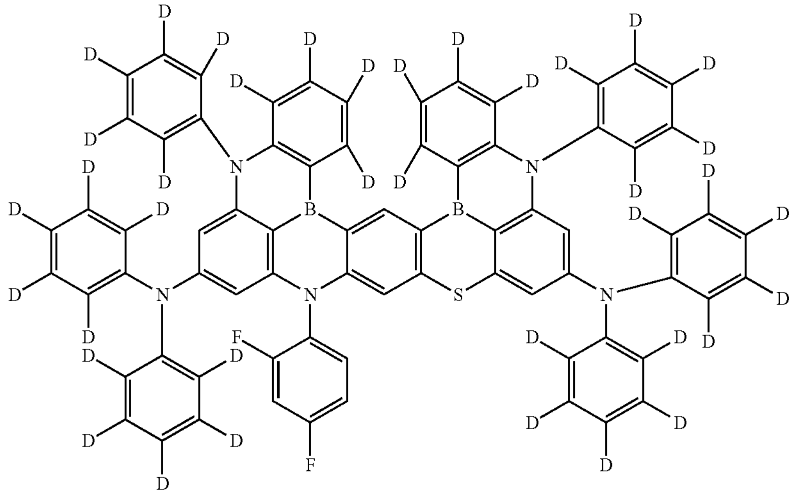
299
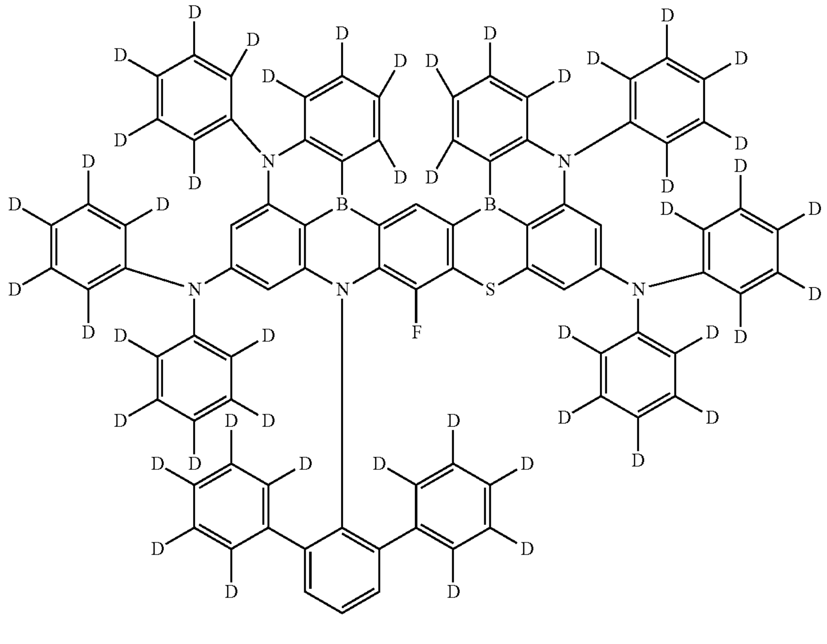

-continued
300
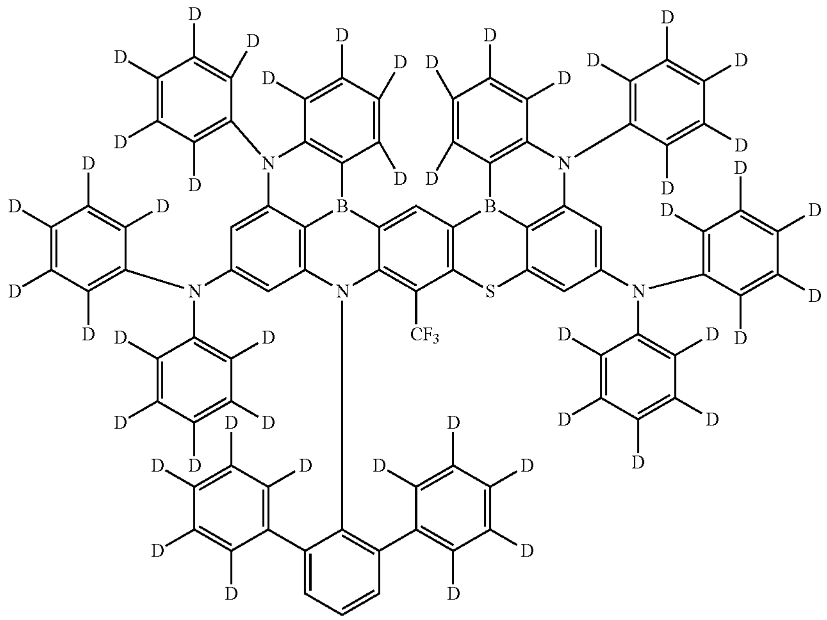
301
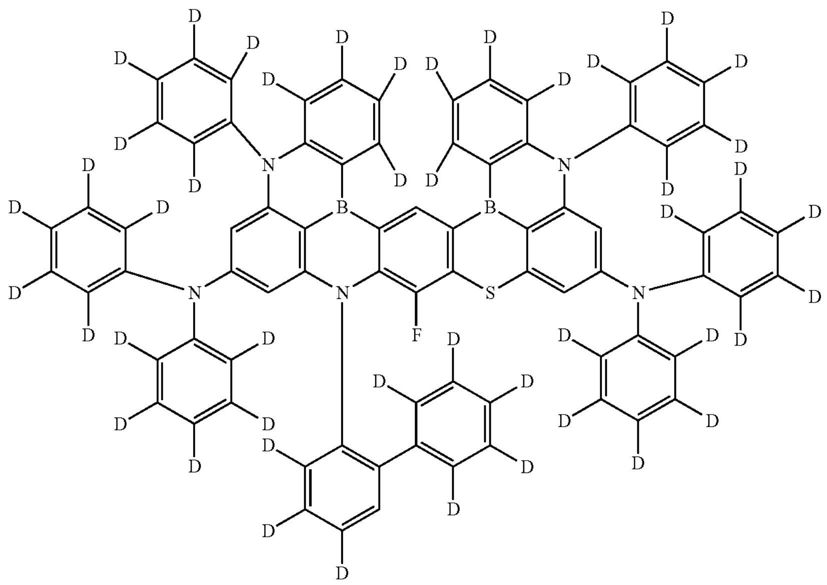

-continued

302

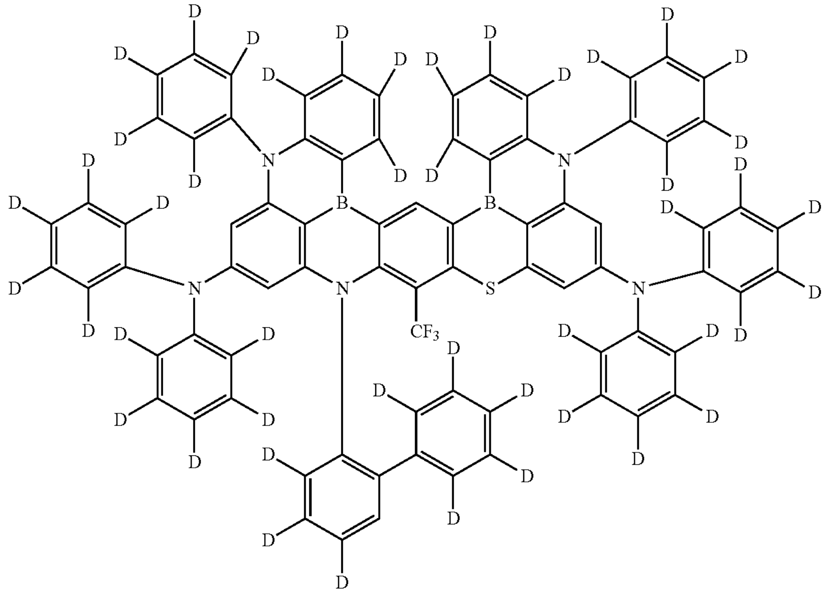

In the organic electroluminescence devices ED according to an embodiment shown in FIGS. 3 to 6, the emission layer EML may include a first compound and a second compound. For example, the first compound may include a dopant, and the second compound may be a host. In an embodiment, the first compound may include a polycyclic compound represented by Formula 1.

In the organic electroluminescence device ED according to an embodiment, the emission layer EML may further include an anthracene derivative, a pyrene derivative, a fluoranthene derivative, a chrysene derivative, a dihydrobenzanthracene derivative, or a triphenylene derivative. For example, the emission layer EML may further include an anthracene derivative or a pyrene derivative.

The emission layer EML may include a compound represented by Formula E-1 below. The compound represented by Formula E-1 below may be used as a fluorescent host material.

[Formula E-1]

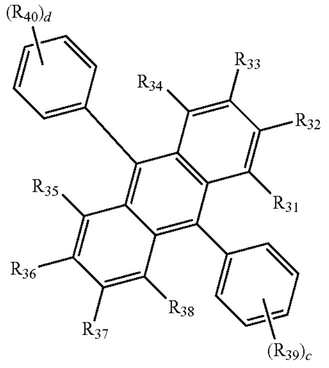

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring. In Formula E-1, $R_{31}$ to $R_{40}$ may be combined with an adjacent group to form a saturated hydrocarbon ring or an unsaturated hydrocarbon ring.

In Formula E-1, c and d may each independently be an integer from 0 to 5.

Formula E-1 may be represented by any one among Compound E1 to Compound E16 below.

E1

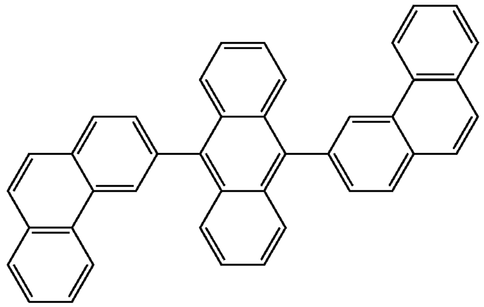

E2

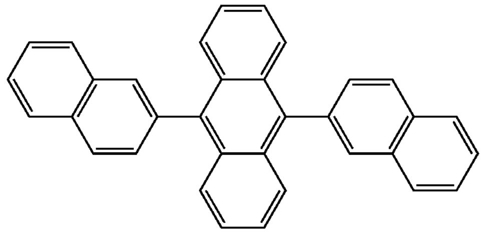

-continued
E3
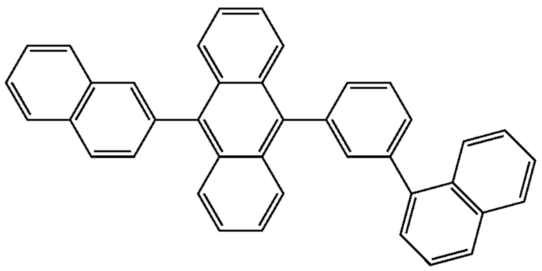
E4
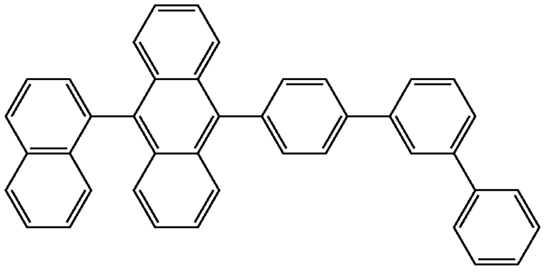
E5
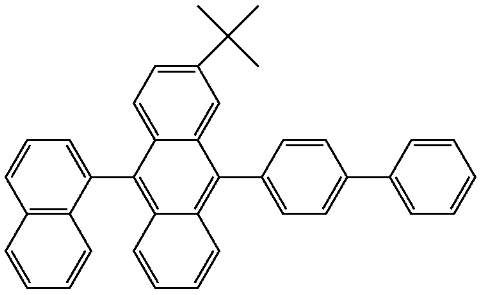
E6
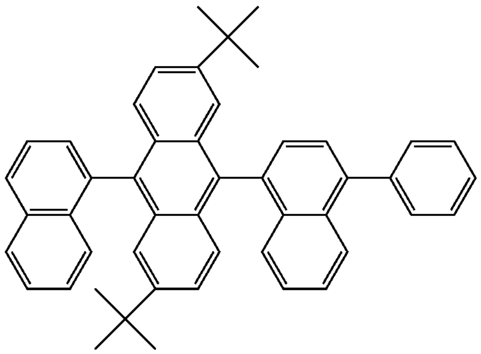
E7
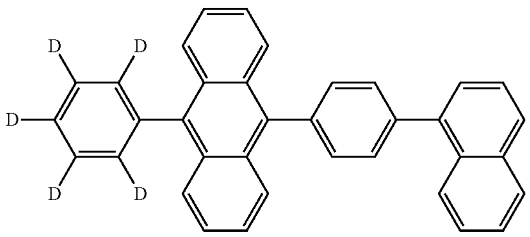
-continued
E8
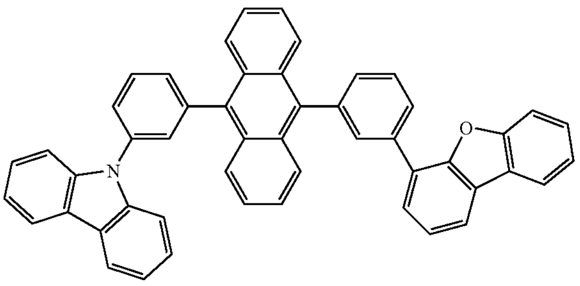
E9
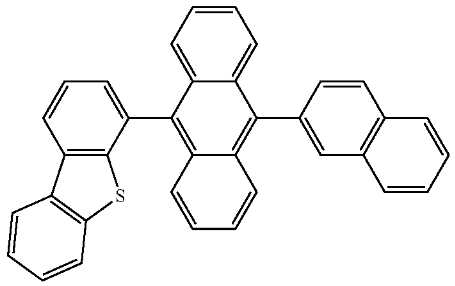
E10
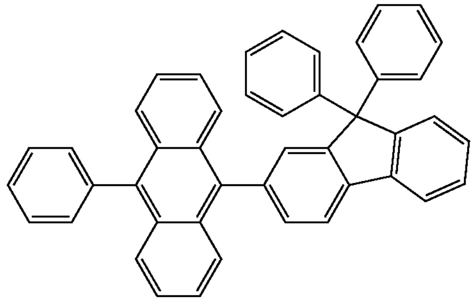
E11
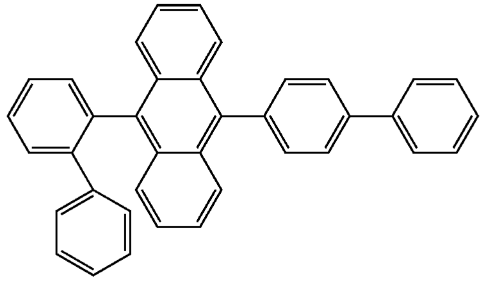
E12
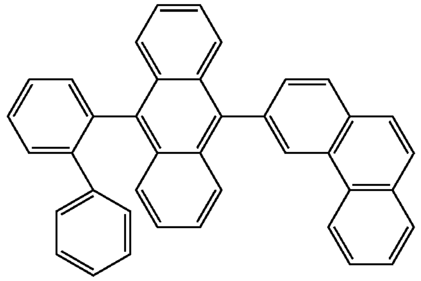

-continued

E13

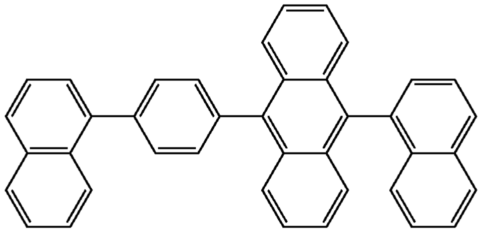

E14

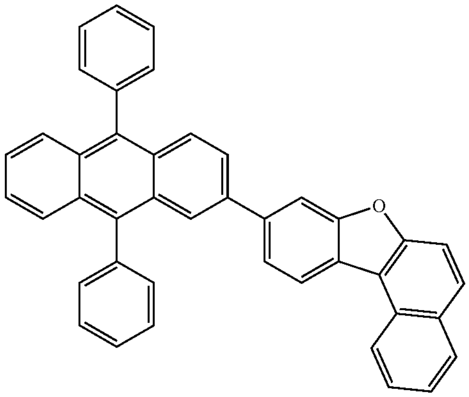

E15

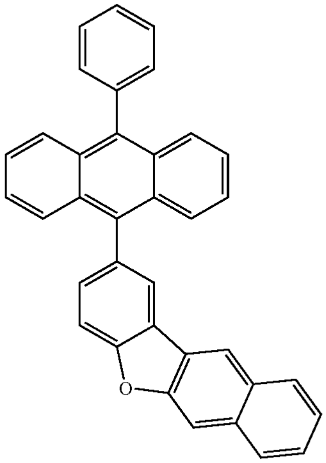

E16

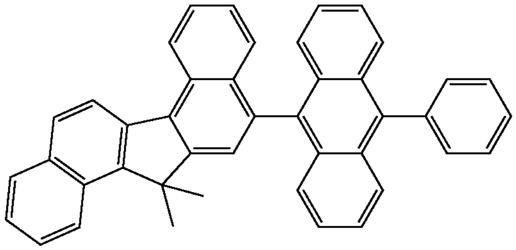

-continued

E17

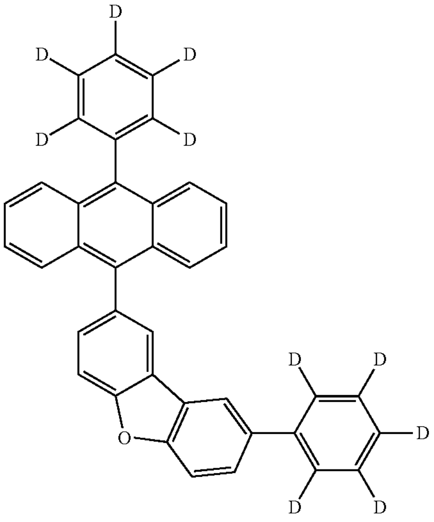

E18

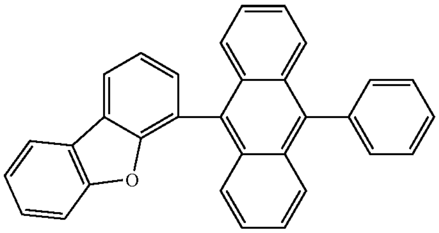

E19

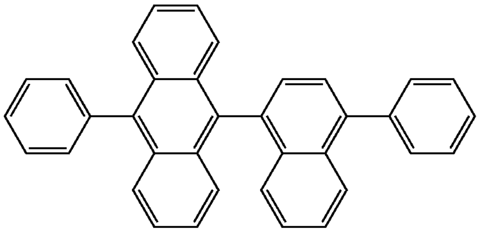

In an embodiment, the emission layer EML may include the compound represented by Formula E-2a or Formula E-2b below. The compound represented by Formula E-2a or Formula E-2b below may be used as a phosphorescent host material.

[Formula E-2a]

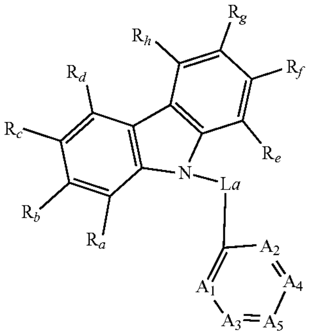

In Formula E-2a, La may be a direct linkage, or a substituted or unsubstituted ring-forming arylene group having 6 to 30 carbon atoms. In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring. $R_a$ to $R_i$ may be combined with an adjacent group to form a hydrocarbon ring or hetero ring including N, O, S, or the like as a ring-forming atom.

In Formula E-2a, two or three of $A_1$ to $A_5$ may be N, and the remainder of $A_1$ to $A_5$ may be $C(R_i)$.

$$(\mathrm{Cbz1}-)-L_b-(-\mathrm{Cbz2})$$ [Formula E-2b]

In Formula E-2b, Cbz1 and Cbz2 may each independently be an unsubstituted carbazole group, or a carbazole group substituted with a ring-forming aryl group having 6 to 30 carbon atoms. $L_b$ may be a direct linkage, or a substituted or unsubstituted ring-forming arylene group having 6 to 30 carbon atoms.

The compound represented by Formula E-2a or Formula E-2b may be represented by any one among the compounds in Compound Group E-2 below. However, the compounds listed in Compound Group E-2 below are illustrative, and the compound represented by Formula E-2a or Formula E-2b is not limited to those represented in Compound Group E-2 below.

[Compound Group E-2]

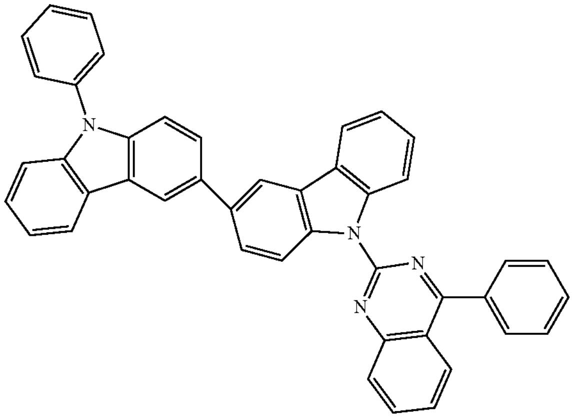

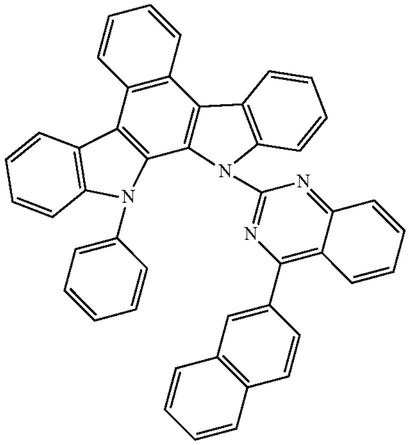

-continued

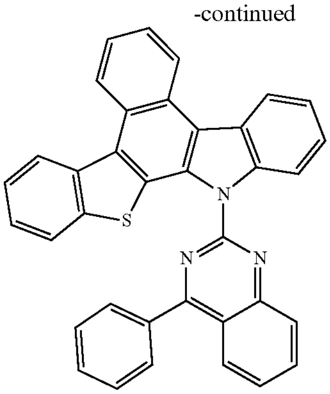

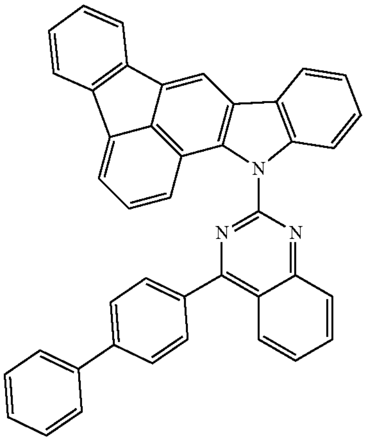

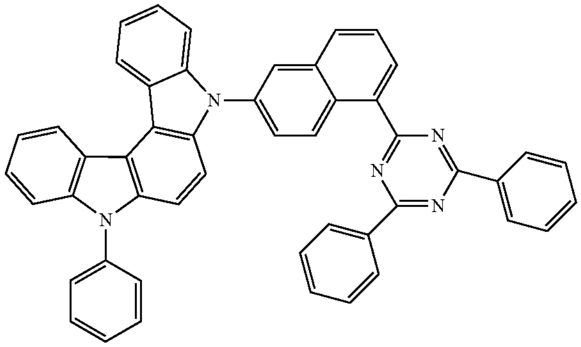

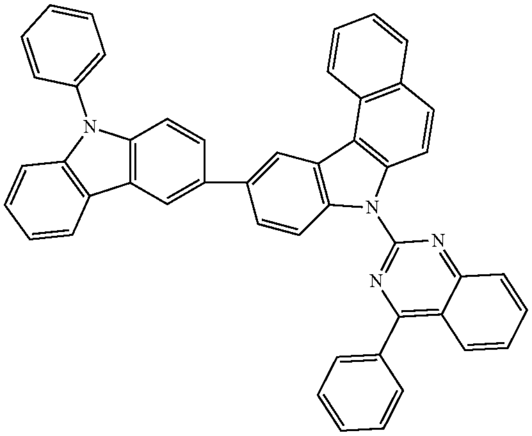

-continued
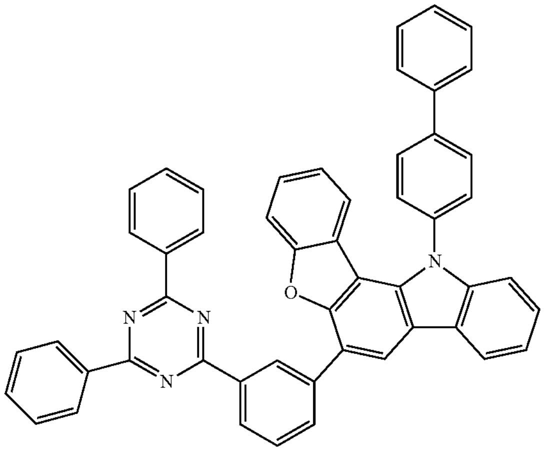
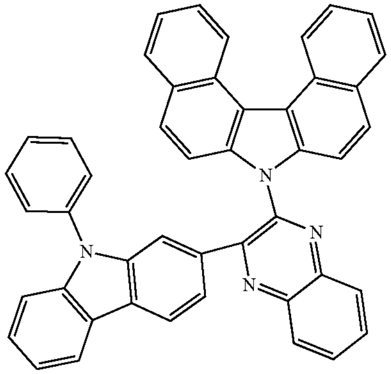
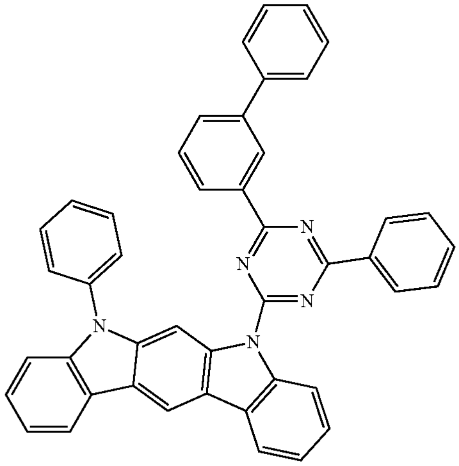
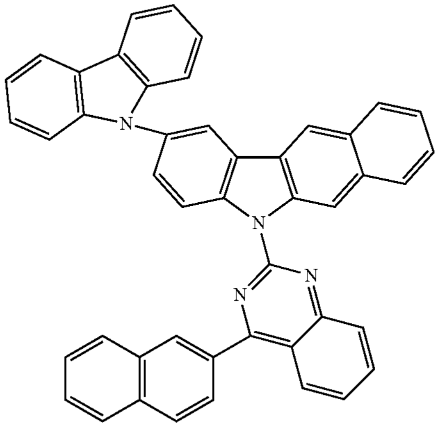
-continued
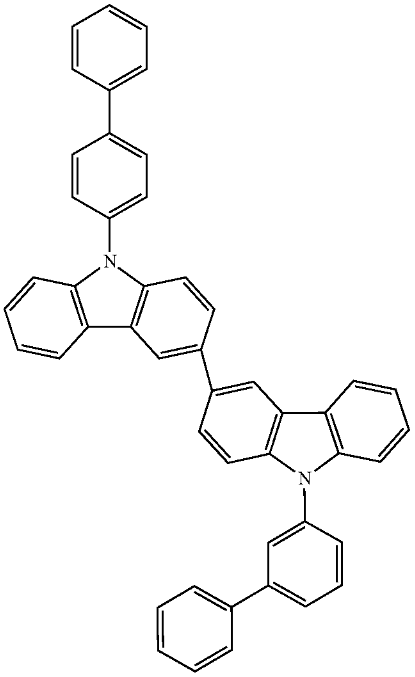
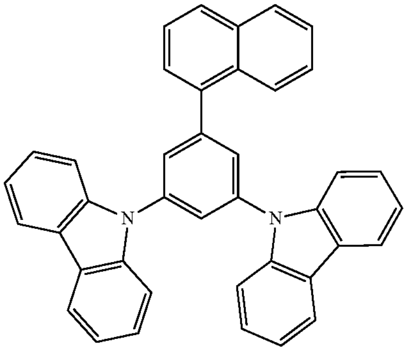
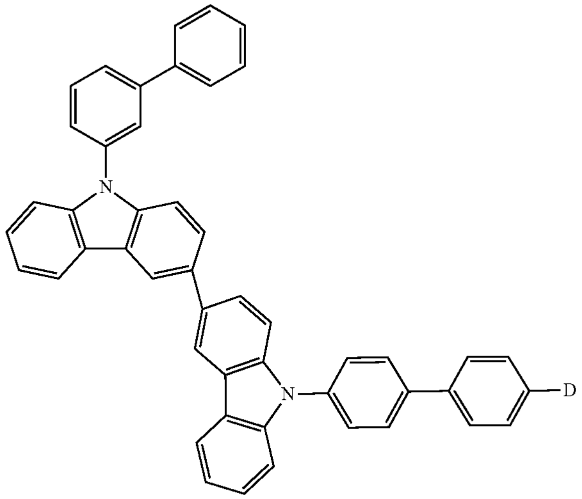

-continued
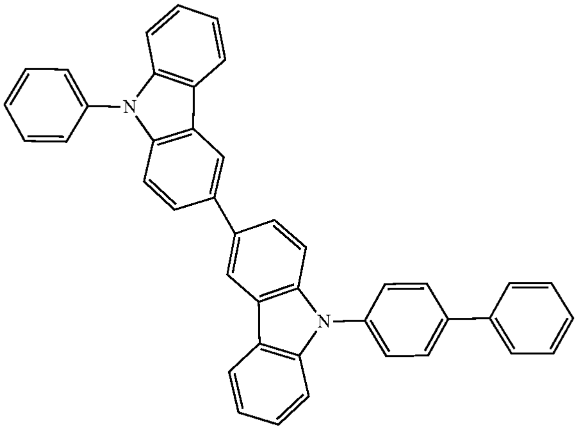
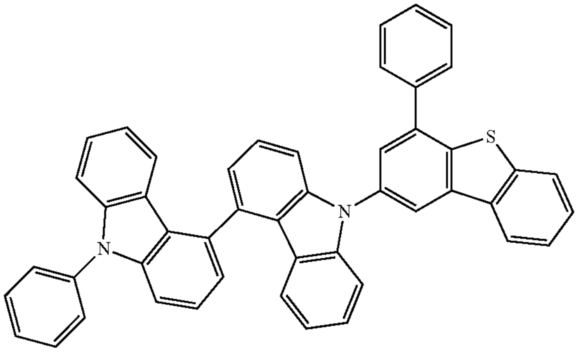
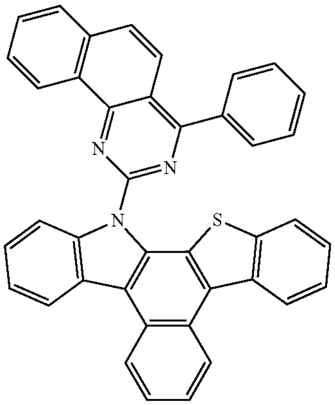
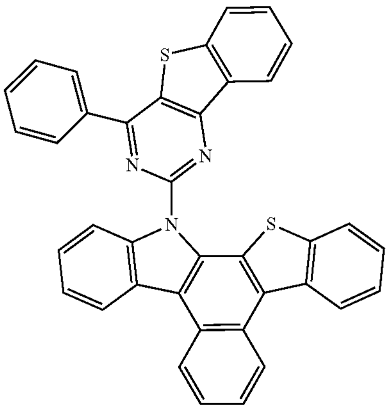
-continued
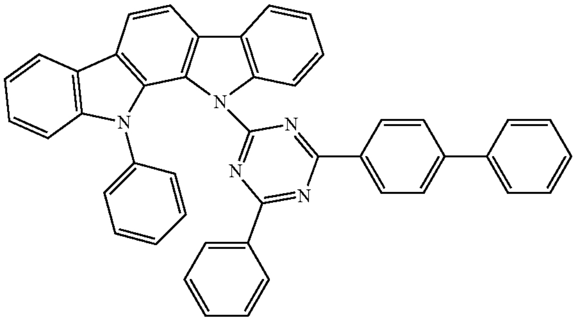
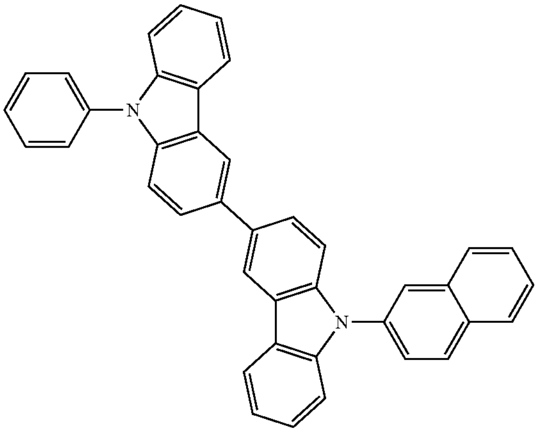
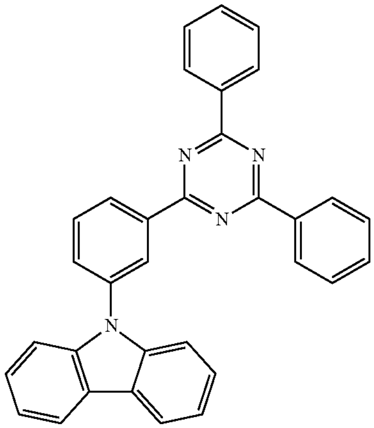
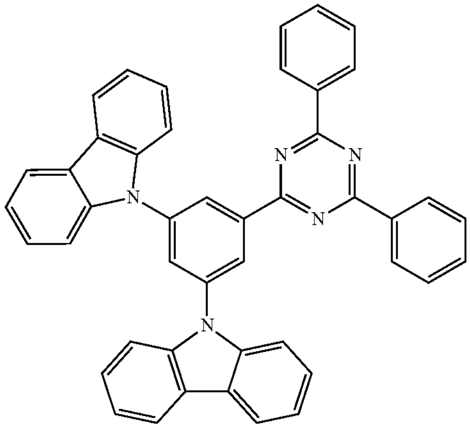

-continued

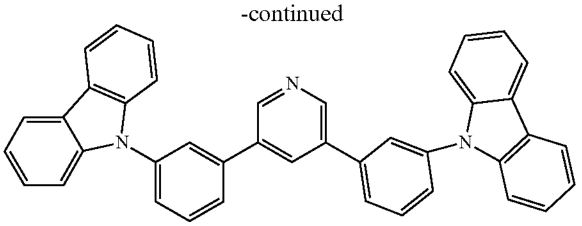

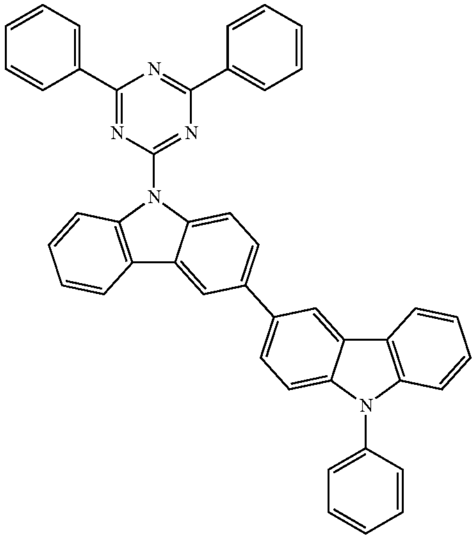

The emission layer EML may further include a common material in the art as a host material. For example, the emission layer EML may include at least one among bis[2-(diphenylphosphino)phenyl] ether oxide (DPEPO), 4,4'-bis(N-carbazol-9-yl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi) as the host material. However, embodiments are not limited thereto, and for example, tris(8-hydroxyquinolino)aluminum ($Alq_3$), poly(N-vinylcarbazole) (PVK), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), or the like may be used as the host material.

The emission layer EML may include a compound represented by Formula M-a or Formula M-b below. The compound represented by Formula M-a or Formula M-b below may be used as a phosphorescent dopant material.

[Formula M-a]

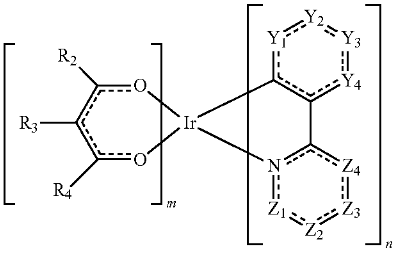

In Formula M-a above, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a red phosphorescent dopant or a green phosphorescent dopant.

The compound represented by Formula M-a may be represented by any one among Compounds M-a1 to M-a19 below. However, Compounds M-a1 to M-a19 below are illustrative, and the compound represented by Formula M-a is not limited to those represented by Compounds M-a1 to M-a19 below.

M-a1

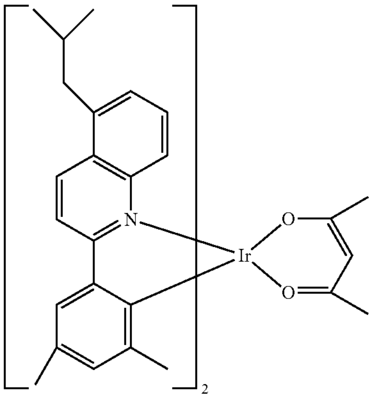

-continued
M-a2
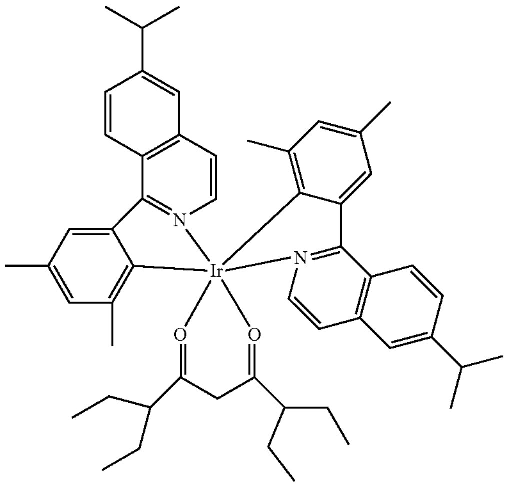
M-a3
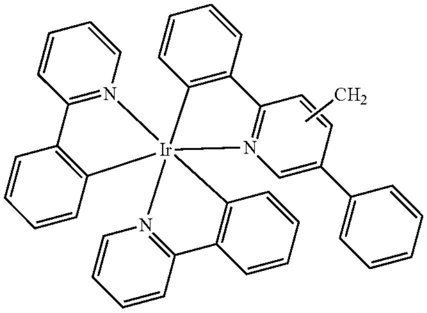
M-a4
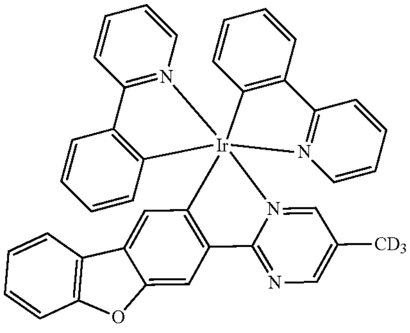
M-a5
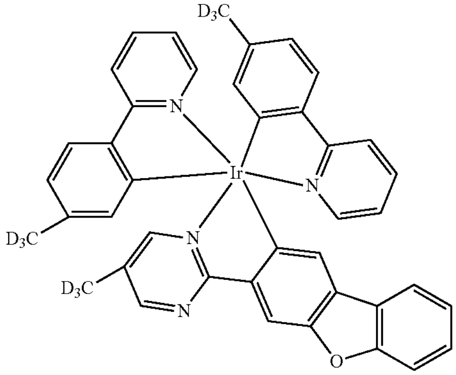
-continued
M-a6
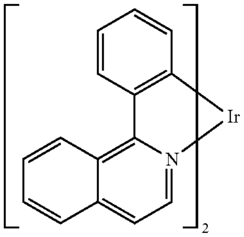
M-a7
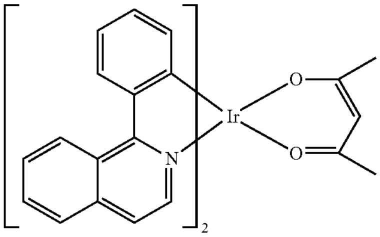
M-a8
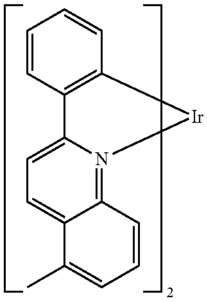
M-a9
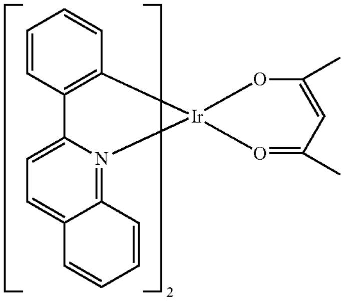
M-a10
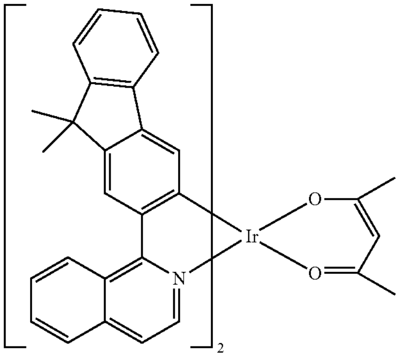

-continued
M-a11
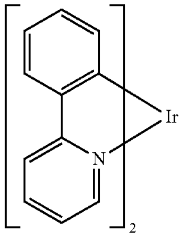
M-a12
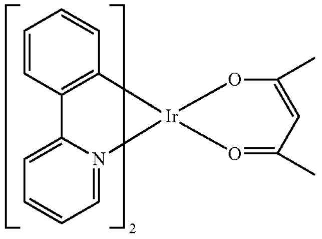
M-a13
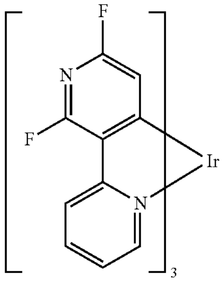
M-a14
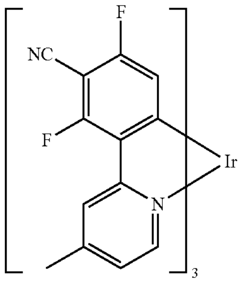
M-a15
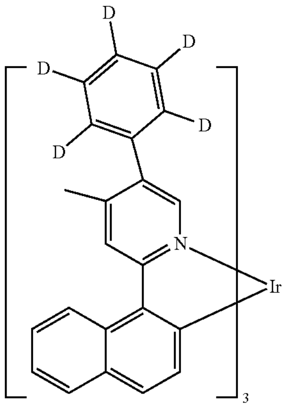
-continued
M-a16
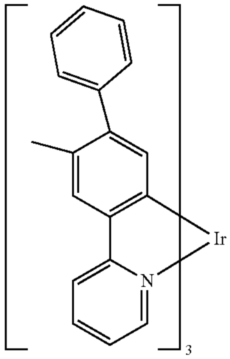
M-a17
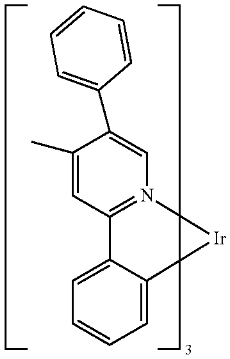
M-a18
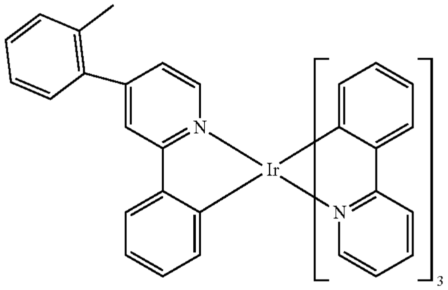
M-a19
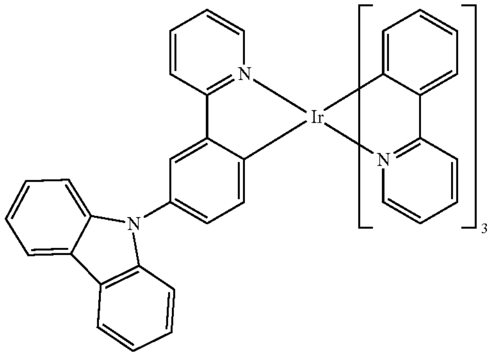
Compound M-a1 and Compound M-a2 may be used as a red dopant material, and Compounds M-a3 to M-a5 may be used as a green dopant material.

[Formula M-b]

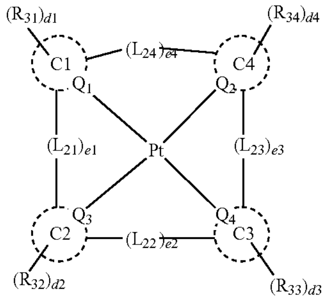

In Formula M-b, $Q_1$ to $Q_4$ may each independently be C or N, and C1 to C4 may each independently be a substituted or unsubstituted ring-forming hydrocarbon ring having 5 to 30 carbon atoms, or a substituted or unsubstituted ring-forming heterocycle having 2 to 30 carbon atoms. $L_{21}$ to $L_{24}$ may each independently be a direct linkage,

*—O—*, *—S—*, 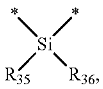 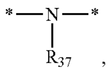 ,

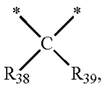 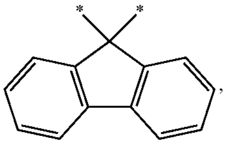 , a substituted or unsubstituted divalent alkyl group having 1 to 20 carbon atoms, a substituted or unsubstituted ring-forming arylene group having 6 to 30 carbon atoms, or a substituted or unsubstituted ring-forming heteroarylene group having 2 to 30 carbon atoms, and e1 to e4 may each independently be 0 or 1. $R_{31}$ to $R_{39}$ may each independently be a hydrogen atom, a deuterium atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring, and d1 to d4 may each independently be an integer from 0 to 4.

The compound represented by Formula M-b may be used as a blue phosphorescent dopant or a green phosphorescent dopant.

The compound represented by Formula M-b may be represented by any one among the compounds below. However, the compounds below are illustrative, and the compound represented by Formula M-b is not limited to those represented in the compounds below.

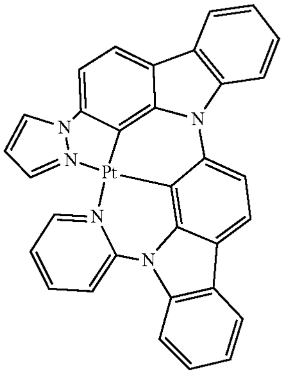

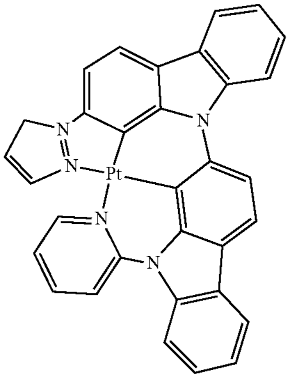

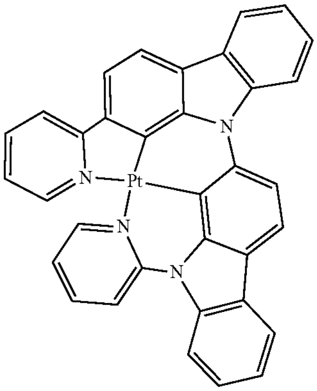

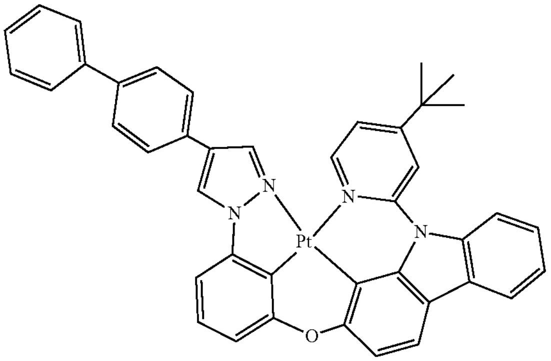

-continued

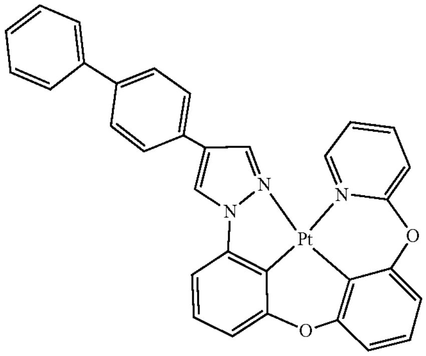

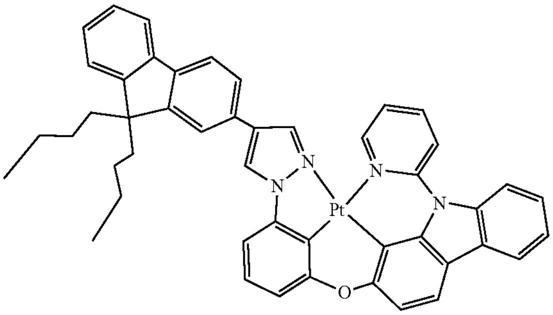

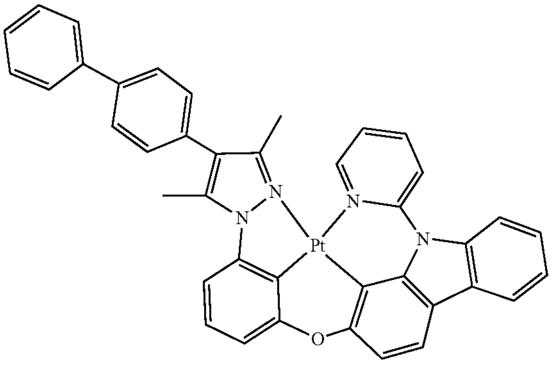

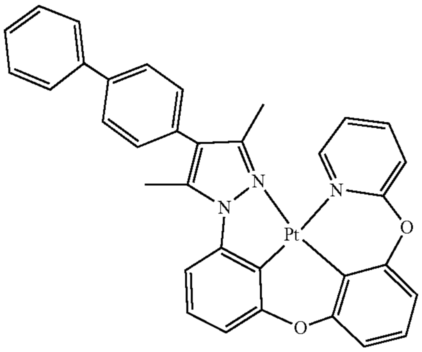

-continued

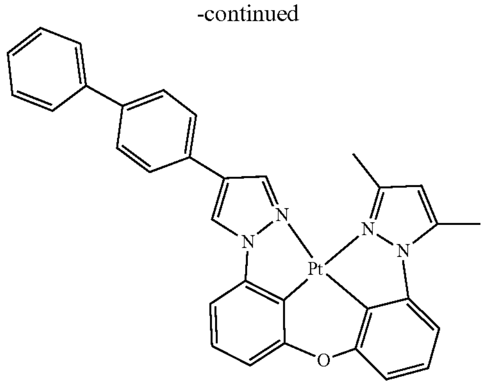

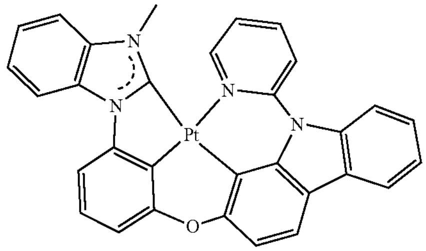

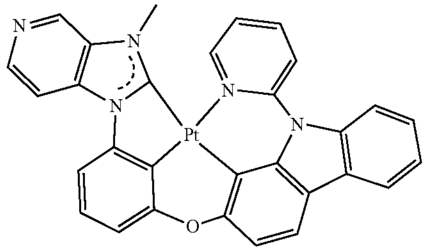

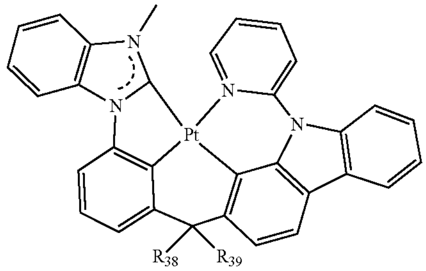

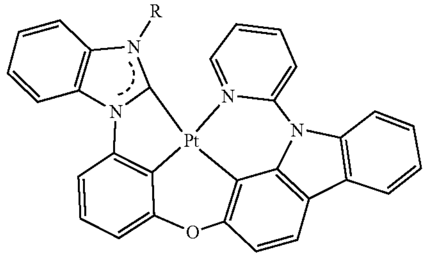

In the above compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

The emission layer EML may include a compound represented by any one among Formula F-a to Formula F-c below. The compound represented by Formula F-a to Formula F-c below may be used as a fluorescent dopant material.

[Formula F-a]

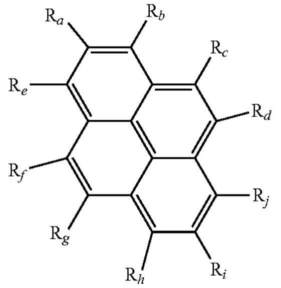

In Formula F-a above, two selected among $R_a$ to $R_j$ may each independently be substituted with

*—$NAr_1Ar_2$.

The remainder among $R_a$ to $R_j$ that are not substituted with

*—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In

*—$NAr_1Ar_2$, $Ar_1$ and $Ar_2$ may each independently be a substituted or unsubstituted ring-forming aryl group having 6 to 30 carbon atoms, or a substituted or unsubstituted ring-forming heteroaryl group having 2 to 30 carbon atoms. For example, at least one of $Ar_1$ and $Ar_2$ may be a heteroaryl group including O or S as a ring-forming atom.

[Formula F-b]

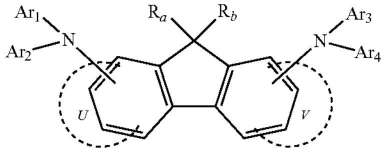

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring.

In Formula F-b, U and V may each independently be 0 or 1. In Formula F-b, U means the number of rings combined to a U position, and V means the number of rings combined to a V position. For example, if U or Vis 1, the ring indicated as U or V may form a condensed ring, and if U or Vis 0, it means that the ring indicated as U or V does not exist. In case that U is 0 and Vis 1, or U is 1 and V is 0, the condensed ring having a fluorene core of Formula F-b may be a tetracyclic compound. In case that U and V are both 0, the condensed ring of Formula F-b may be a tricyclic compound. In case that U and V are both 1, the condensed ring having a fluorene core of Formula F-b may be a pentacyclic compound.

In Formula F-b, if U and V are both 1, U and V may each independently be a substituted or unsubstituted ring-forming hydrocarbon ring having 5 to 30 carbon atoms, or a substituted or unsubstituted ring-forming heterocycle having 2 to 30 carbon atoms.

[Formula F-c]

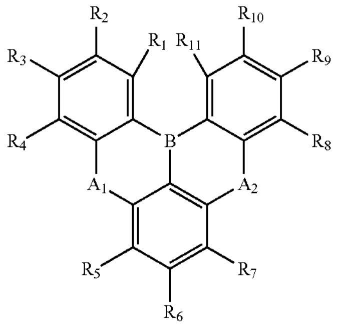

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring.

In Formula F-c, $A_1$ and $A_2$ may each independently be combined with substituents of an adjacent ring to form a condensed ring. For example, when $A_1$ and $A_2$ are each independently $N(R_m)$, $A_1$ may be combined with $R_4$ or $R_5$ to form a ring. In an embodiment, in Formula F-c, $A_2$ may be combined with $R_7$ or $R_8$ to form a ring.

In an embodiment, the emission layer EML may include, as a dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl) naphthalen-2-yl)vinyl)phenyl)-N-phenylbenzenamine (N-BDAVBi)), perylene and a derivative thereof (for example, 2,5,8,11-tetra-t-butylperylene (TBP)), pyrene and a derivative thereof (for example, 1,1-dipyrene, 1,4-dipyrenylbenzene, 1,4-bis(N,N-diphenylamino) pyrene), or the like.

The emission layer EML may include a phosphorescent dopant material. For example, a metal complex including iridium (Ir), platinum (Pt), osmium (Os), gold (Au), titanium (Ti), zirconium (Zr), hafnium (Hf), europium (Eu), terbium (Tb), or thulium (Tm) may be used as a phosphorescent dopant. For example, iridium (III) bis(4,6-difluorophenylpyridinato-N,C2')picolinate (FIrpic), bis(2,4-difluorophenylpyridinato)-tetrakis(1-pyrazolyl)borate iridium (III) (Fir6), or platinum octaethyl porphyrin (PtOEP) may be used as a phosphorescent dopant. However, embodiments are not limited thereto.

In the organic electroluminescence devices ED according to an embodiment shown in FIGS. 3 to 6, the electron transport region ETR is provided on the emission layer EML. The electron transport region ETR may include at least one of the hole blocking layer HBL, the electron transport layer ETL, and the electron injection layer EIL, but embodiments are not limited thereto.

The electron transport region ETR may have a single layer structure formed using a single material, a single layer structure formed using different materials, or a multilayer structure having layers formed using different materials.

For example, the electron transport region ETR may have a structure of a single layer of an electron injection layer EIL or an electron transport layer ETL, and may have a structure of a single layer formed using an electron injection material and an electron transport material. The electron transport region ETR may have a single layer structure formed using different materials, or a structure stacked from the emission layer EML of electron transport layer ETL/electron injection layer EIL, or hole blocking layer HBL/electron transport layer ETL/electron injection layer EIL, but embodiments are not limited thereto. A thickness of the electron transport region ETR may be, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include a compound represented by Formula ET-1 below.

[Formula ET-1]

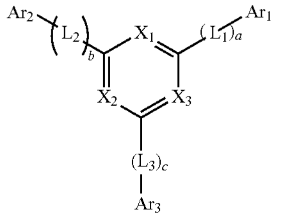

In Formula ET-1, at least one of $X_1$ to $X_3$ is N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. Ar1 to Ar3 may each independently be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula ET-1, $L_1$ to $L_3$ may each independently be a direct linkage, a substituted or unsubstituted ring-forming arylene group having 6 to 30 carbon atoms, or a substituted or unsubstituted ring-forming heteroarylene group having 2 to 30 carbon atoms.

A thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without substantial increase of a driving voltage.

If the electron transport region ETR includes an electron injection layer EIL, the electron transport region ETR may include a halogenated metal such as LiF, NaCl, CsF, RbCl, RbI, CuI, KI, a lanthanide metal such as Yb, or a co-deposited material of the above-described halogenated metal and lanthanide metal. For example, the electron transport region ETR may include KI:Yb, RbI:Yb, or the like as a co-deposited material. The electron transport region ETR may include a metal oxide such as $Li_2O$, BaO, or Liq(8-hydroxyl-lithium quinolate), but embodiments are not limited thereto. In an embodiment, the electron injection layer EIL may be formed using a mixture material of an electron transport material and an insulating organo metal salt. The organo metal salt may be a material having an energy band gap of about 4 eV or more. In an embodiment, the organo metal salt may include, for example, metal acetates, metal benzoates, metal acetoacetates, metal acetylacetonates, or metal stearates. A thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) and 4,7-diphenyl-1,10-phenanthroline (Bphen). However, embodiments are not limited thereto.

The electron transport region ETR may include the aforementioned compounds of the electron transport region in at least one of the electron injection layer EIL, the electron transport layer ETL, and the hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be achieved without substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection properties may be achieved without substantial increase of a driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second electrode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include transparent metal oxide such as indium tin oxide (ITO), indium zinc oxide (IZO), zinc oxide (ZnO), indium tin zinc oxide (ITZO), or the like.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (for example, AgMg, AgYb, or MgAg). In another embodiment, the second electrode EL2 may have a multi-layered structure including a reflective film or a transflective film formed using the aforementioned materials and a transparent conductive film formed using indium tin oxide (ITO), indium zinc oxide (IZO), zinc oxide (ZnO), indium tin zinc oxide (ITZO), or the like. For example, the second electrode EL2 may include the aforementioned metal material, a combination of two or more metal materials selected from the aforementioned metal materials, or an oxide of the aforementioned metal materials.

Although not illustrated, the second electrode EL2 may be electrically connected to an auxiliary electrode. If the second electrode EL2 is electrically connected to the auxiliary electrode, the resistance of the second electrode EL2 may decrease.

A capping layer CPL may be further disposed on the second electrode EL2 of the organic electroluminescence device ED, according to an embodiment. The capping layer CPL may include multiple layers or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNX, SiOy, or the like.

For example, if the capping layer CPL includes an organic material, the organic material may include a-NPD, NPB, TPD, m-MTDATA, $Alq_3$, CuPc, N4,N4,N4',N4'-tetra(biphenyl-4-yl)biphenyl-4,4'-diamine (TPD15), 4,4',4"-tris(carbazol sol-9-yl)triphenylamine (TCTA), etc., epoxy resin, or acrylate such as methacrylate. However, embodiments are not limited thereto, and the capping layer CPL may include at least one among Compounds P1 to P5 below.

P1

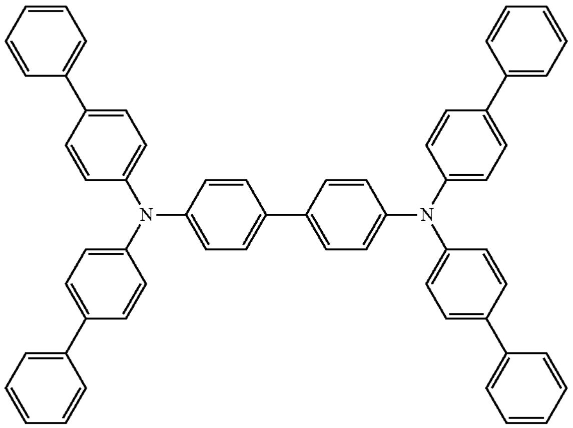

P2

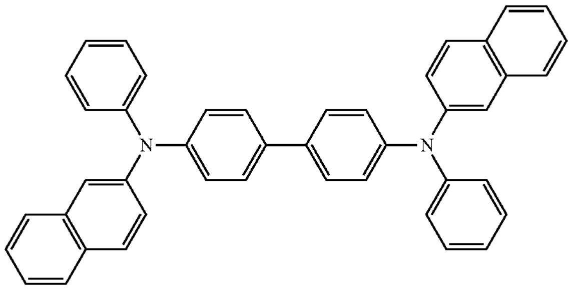

P3

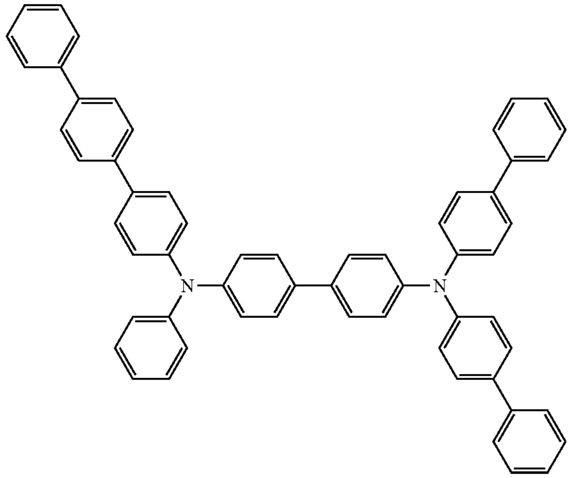

-continued

P4

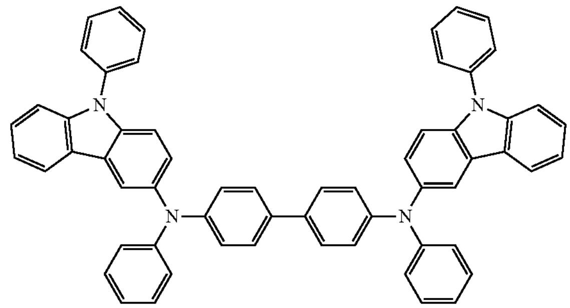

P5

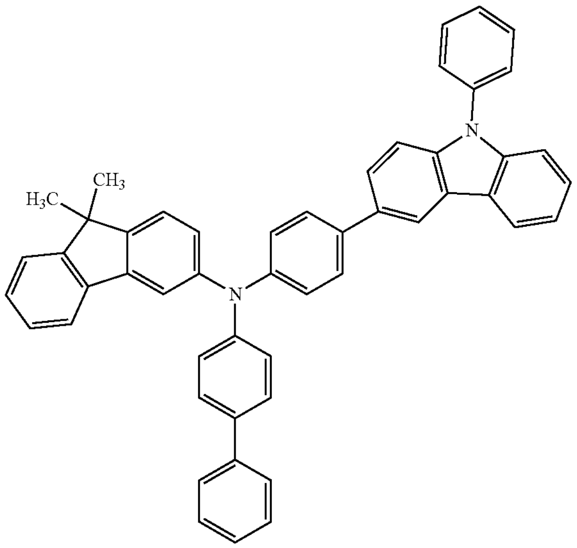

A refractive index of the capping layer CPL may be equal to or greater than about 1.6. For example, for light having a wavelength in a range of about 550 nm to about 660 nm, the refractive index of the capping layer CPL may be equal to or greater than about 1.6.

Figure 7:
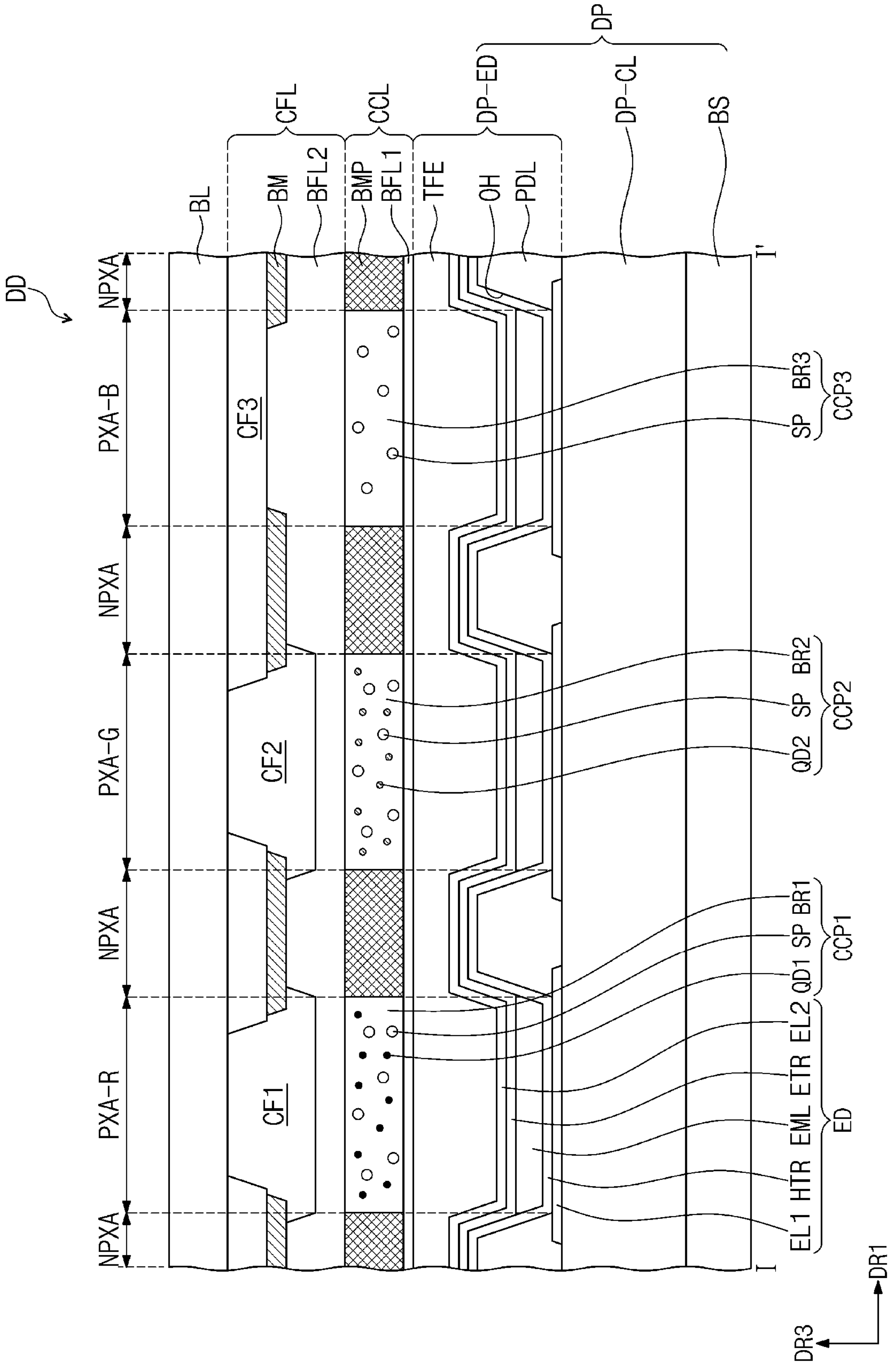
FIG. 7 is a schematic cross-sectional view illustrating a display apparatus according to an embodiment.
Figure 8:
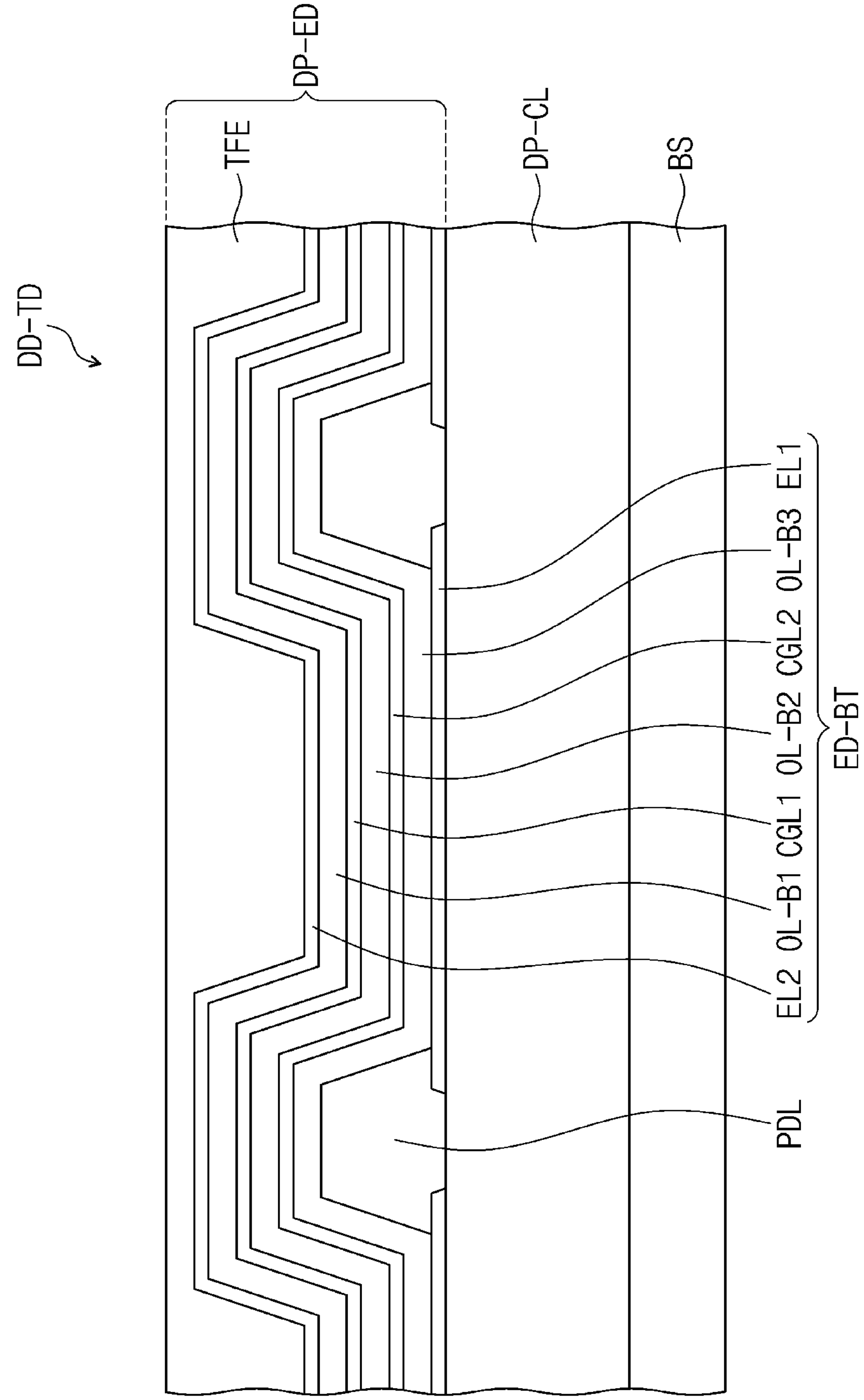
FIG. 8 is a schematic cross-sectional view illustrating a display apparatus according to an embodiment.

FIG. 7 and FIG. 8 are each a schematic cross-sectional view of a display apparatus according to an embodiment. In the description of the display apparatus according to an embodiment described with reference to FIG. 7 and FIG. 8, the contents overlapping with those described in FIGS. 1 to 6 will not be described again, and differences will be described.

Referring to FIG. 7, a display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and a display apparatus layer DP-ED, and the display apparatus layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structure of the organic electroluminescence device ED illustrated in FIG. 7 may have a same structure of the organic electroluminescence device in FIGS. 3 to 6 described above.

Referring to FIG. 7, the emission layer EML may be disposed in an opening OH defined in a pixel-defining film PDL. For example, the emission layer EML separated by the pixel-defining film PDL and provided corresponding to each of light-emitting regions PXA-R, PXA-G, and PXA-B may emit light of the same wavelength region. In a display apparatus DD according to an embodiment, the emission layer EML may emit blue light. While not illustrated in the drawings, in another embodiment, the emission layer EML may be provided as a common layer over all of the light-emitting regions PXA-R, PXA-G, and PXA-B.

The light control layer CCL may be disposed on the display panel DP. The light control layer CCL may include a light conversion body. The light conversion body may include a quantum dot or a phosphor. The light conversion body may convert the wavelength of received light to emit. For example, the light control layer CCL may be a layer including a quantum dot or a layer including a phosphor.

The core of the quantum dot may be selected from a II-VI group compounds, a III-VI group compound, a I-III-VI group compound, a III-V group compound, a III-II-V group compound, a IV-VI group compounds, a IV group elements, a IV group compounds, and a combination thereof.

The II-VI group compounds may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The III-VI group compounds may include a binary compound such as In2S3 and In2Se3, a ternary compound such as $InGaS_3$ and $InGaSe_3$, or any combination thereof.

The I-III-VI group compounds may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as AgInGaS2 and CuInGaS2.

The III-V group compounds may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The III-V compounds may further include a Group II metal. For example, InZnP, or the like may be selected as III-II-V compounds.

The IV-VI group compounds may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. Group IV elements may be selected from the group consisting of Si, Ge, and a mixture thereof. IV compounds may be a binary compound selected from the group consisting of SiC, SiGe, and a mixture thereof.

For example, a binary compound, a ternary compound, or a quaternary compound may be present in the particle at a uniform concentration, or may be present in the same particle while being divided to have a partially different concentration distribution. A quantum dot may have a core/shell structure in which one quantum dot surrounds another quantum dot. An interface between the core and the shell may have a concentration gradient such that a concentration of an element present in the shell gradually decreases toward the core.

In embodiment, the quantum dot may have a core-shell structure including a core that includes the aforementioned nanocrystal and a shell surrounding the core. The shell of the quantum dot may serve as a protective layer for maintaining characteristics of a semiconductor by preventing chemical modification of the core and/or a charging layer for imparting electrophoretic characteristics to the quantum dot. The shell may be a single layer or multiple layers. An interface between the core and the shell may have a concentration gradient such that a concentration of an element present in the shell gradually decreases toward the core. Examples of the shell of the quantum dot may include metal or non-metal oxide, a semiconductor compound, or a combination thereof.

For example, the metal or non-metal oxide may be illustrated as a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Color purity or color gamut may be improved in this range. Light emitted through such a quantum dot may be emitted in all directions, and a wide viewing angle may be improved.

The shape of the quantum dot may be selected from among shapes generally used in the art, and is not particularly limited. For example, the quantum dot may have a spherical, a pyramidal, a multi-arm, or a cubic shape, or the quantum dot may be in the form of nanoparticles, nanotubes, nanowires, nanofibers, plate-shaped nanoparticles, or the like.

The quantum dot may control the color of emitted light according to the particle size, and thus, the quantum dots may have various light-emitting colors such as blue, red, green, and the like.

The light control layer CCL may include light control portions CCP1, CCP2, and CCP3. The light control portions CCP1, CCP2, and CCP3 may be spaced apart from each other.

Referring to FIG. 7, a division pattern BMP may be disposed between the light control portions CCP1, CCP2, and CCP3 spaced apart from each other, but embodiments are not limited thereto. In FIG. 7, the division pattern BMP is illustrated to be non-overlapping with the light control portions CCP1, CCP2, and CCP3, but in an embodiment, edges of the light control portions CCP1, CCP2, and CCP3 may at least partially overlap with the division pattern BMP.

The light control layer CCL may include a first light control portion CCP1 including a first quantum dot QD1 that converts a first color light provided in the organic electroluminescence device ED into a second color light, a second light control portion CCP2 including a second quantum dot QD2 that converts the first color light into a third color light, and a third light control portion CCP3 that transmits the first color light.

In an embodiment, the first light control portion CCP1 may provide red light, which is a second color light, and the second light control portion CCP2 may provide green light, which is a third color light. The third light control portion CCP3 may transmit and provide blue light, which is the first light provided in the organic electroluminescence device ED. For example, the first quantum dot QD1 may be a red quantum dot, and the second quantum dot QD2 may be a green quantum dot. The same description as provided above may be applied to the quantum dots QD1 and QD2.

The light control layer CCL may further include a scatterer SP. The first light control portion CCP1 may include the first quantum dot QD1 and the scatterer SP, the second light control portion CCP2 may include the second quantum dot QD2 and the scatterer SP, and the third light control portion CCP3 may not include a quantum dot but may include the scatterer SP.

The scatterer SP may be an inorganic particle. For example, the scatterer SP may include at least one of $TiO_2$, ZnO, $Al_2O3$, $SiO_2$, and hollow silica. The scatterer SP may include at least one of $TiO_2$, ZnO, $Al_2O3$, $SiO_2$, and hollow silica, or may be a mixture of two or more materials selected from $TiO_2$, ZnO, $Al_2O3$, $SiO_2$, and hollow silica.

The first light control portion CCP1, the second light control portion CCP2, and the third light control portion CCP3 may respectively include base resins BR1, BR2, and BR3 in which the quantum dots QD1 and QD2 and the scatterer SP are dispersed. In an embodiment, the first light control portion CCP1 may include the first quantum dot QD1 and the scatterer SP dispersed in a first base resin BR1, the second light control portion CCP2 may include the second quantum dot QD2 and the scatterer SP dispersed in a second base resin BR2, and the third light control portion CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent penetration of moisture and/or oxygen (hereinafter referred to as "moisture/oxygen"). The barrier layer BFL1 may be disposed on the light control portions CCP1, CCP2, and CCP3 to prevent the light control portions CCP1, CCP2, and CCP3 from being exposed to moisture/oxygen. The barrier layer BFL1 may cover the light control portions CCP1, CCP2, and CCP3. A barrier layer BFL2 may be provided between the light control portions CCP1, CCP2, and CCP3 and the color filter layer CFL as well.

The barrier layers BFL1 and BFL2 may include at least one inorganic layer. For example, the barrier layers BFL1 and BFL2 may be formed including an inorganic material. For example, the barrier layers BFL1 and BFL2 may be formed including silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or a metal thin film wherein light transmittance is secured. The barrier layers BFL1 and BFL2 may further include an organic film. The barrier layers BFL1 and BFL2 may be comprised of a single layer or of multiple layers.

In a display apparatus DD according to an embodiment, a color filter layer CFL may be disposed on the light control layer CCL. For example, the color filter layer CFL may be directly disposed on the light control layer CCL. For example, in an embodiment, the barrier layer BFL2 may be omitted.

The color filter layer CFL may include a light-shielding portion BM and filters CF1, CF2, and CF3. The color filter layer CFL may include a first filter CF1 that transmits a second color light, a second filter CF2 that transmits a third color light, and a third filter CF3 that transmits a first color light. For example, the first filter CF1 may be a red filter, the second filter CF2 may be a green filter, and the third filter CF3 may be a blue filter. Each of the filters CF1, CF2, and CF3 may include polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include polymer photosensitive resin and may not include a pigment or dye. The third filter CF3 may be transparent. The third filter CF3 may be formed of a transparent photosensitive resin.

In an embodiment, the first filter CF1 and the second filter CF2 may be a yellow filter. The first filter CF 1 and the second filter CF2 may not be separated from each other and provided integrally.

The light-shielding portion BM may be a black matrix. The light-shielding portion BM may be formed by including an organic light-shielding material or an inorganic light-shielding material including a black pigment or a black dye. The light-shielding portion BM may prevent light leakage, and separate the boundary between the adjacent filters CF1, CF2, and CF3. In an embodiment, the light-shielding portion BM may be formed of a blue filter.

Each of the first to the third filters CF1, CF2, and CF3 may be disposed to correspond to each of a red light-emitting region PXA-R, a green light-emitting region PXA-G, and a blue light-emitting region PXA-B.

A base substrate BL may be disposed on the color filter layer CFL. The base substrate BL may be a member that provides a base surface on which the color filter layer CFL and the light control layer CCL are disposed. The base substrate BL may be a glass substrate, a metal substrate, a plastic substrate, or the like. However, embodiments are not limited thereto, and the base substrate BL may be an inorganic layer, an organic layer, or a composite material layer. While not shown in the drawings, the base substrate BL may be omitted in another embodiment.

FIG. 8 is a schematic cross-sectional view illustrating a portion of a display apparatus according to an embodiment. FIG. 8 illustrates a schematic cross-sectional view of a portion corresponding to the display panel DP of FIG. 7. In the display apparatus DD-TD according to an embodiment, the organic electroluminescence device ED-BT may include light-emitting structures OL-B1, OL-B2, and OL-B3. The organic electroluminescence device ED-BT may include a first electrode EL1 and a second electrode EL2 that face each other, and light-emitting structures OL-B1, OL-B2, and OL-B3 that are provided by sequentially stacking in a thickness direction between the first electrode EL1 and the second electrode EL2. Each of the light-emitting structures OL-B1, OL-B2, and OL-B3 may include the emission layer EML (FIG. 7), and a hole transport region HTR and an electron transport region ETR, with the emission layer EML (FIG. 7) disposed therebetween.

For example, the organic electroluminescence device ED-BT included in the display apparatus DD-TD according to an embodiment may be an organic electroluminescence device having a tandem structure including multiple emission layers.

In an embodiment illustrated in FIG. 8, all of the light emitted from each of the light-emitting structures OL-B1, OL-B2, and OL-B3 may be blue light. However, embodiments are not limited thereto, and the wavelength ranges of light emitted from each of the light-emitting structures OL-B1, OL-B2, and OL-B3 may be different from each other. For example, the organic electroluminescence device ED-BT including the light-emitting structures OL-B1, OL-B2, and OL-B3 that emit light of different wavelength regions may emit white light.

A charge generating layer CGL1 and CGL2 may be disposed between the adjacent light-emitting structures OL-B1, OL-B2, and OL-B3. The charge generating layer CGL may include a p-type charge generating layer and/or an n-type charge generating layer.

Hereinafter, the embodiments will be described in detail with reference to specific examples and comparative examples. The following examples are only illustrations to assist the understanding of the disclosure, and the scope of the embodiments are not limited thereto.

Synthesis Example

An amine compound according to an embodiment may be synthesized, for example, as follows. However, a method for synthesizing an amine compound according to an embodiment is not limited thereto.

1. Synthesis of Compound 1

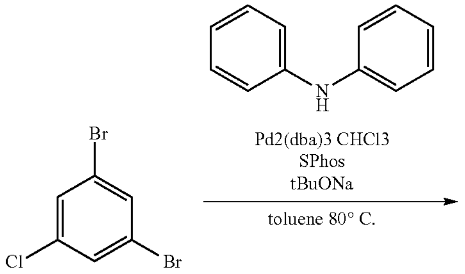

-continued
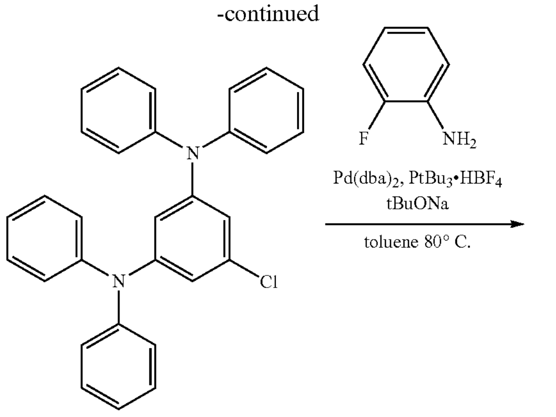
A
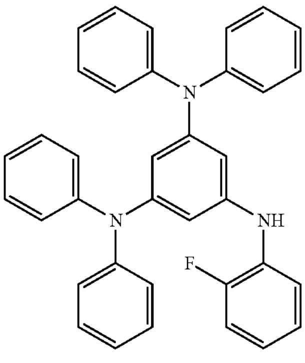
B
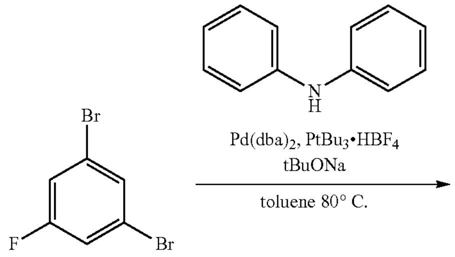
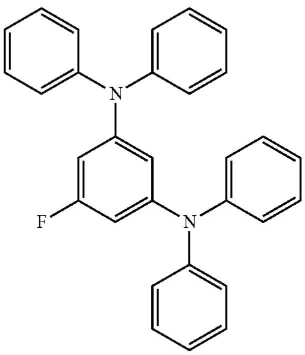
C
-continued
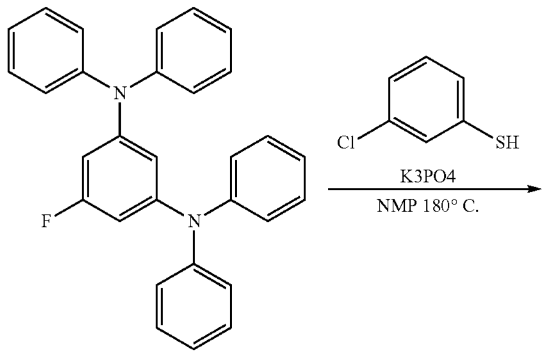
C
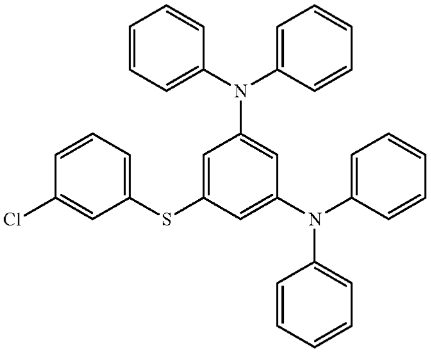
D
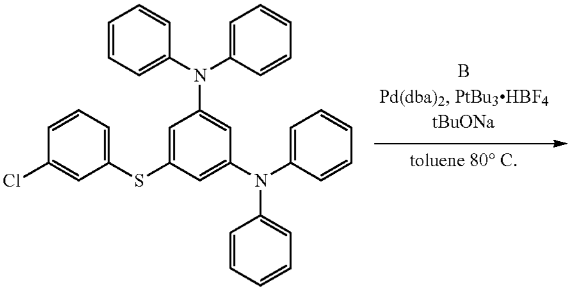
D
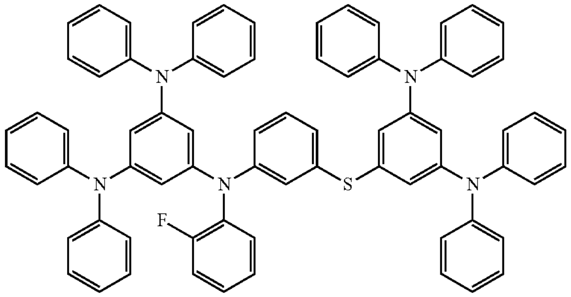
E
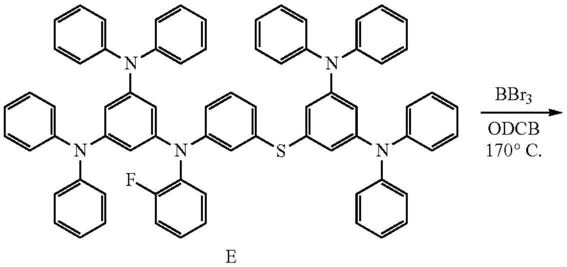
E -continued

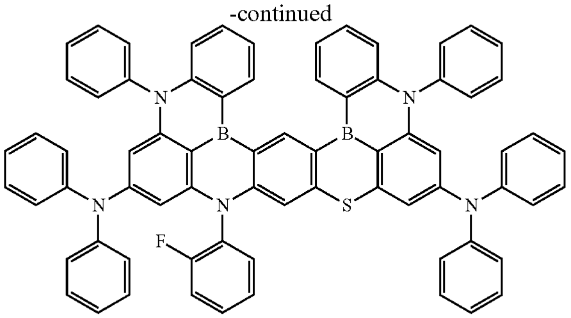

1

1) Synthesis of Compound A

Under Ar atmosphere, diphenylamine (31.3 g, 185 mmol), tris(dibenzylideneacetone) dipalladium (0)-chloroform adduct ($Pd_2(dba)_3 \cdot CHCl_3$, 1.78 g, 1.94 mmol), 2-dicyclohexylphosphino-2',6'-dimethoxybiphenyl (SPhos, 1.59 g, 3.88 mmol), and tBuONa (27.1 g, 282 mmol) were added with 1,3-dibromo-5-chlorobenzene (25.0 g, 92.5 mmol) to about 400 ml of toluene, and reacted at about 80° C. for about 6 hours. After cooling, water was added, and separated by filtration with Celite to concentrate an organic layer. Purification by silica gel column chromatography was performed to provide Compound A (33.1 g, yield 80%). The molecular weight of Compound A was about 447 as measured by FAB MS.

2) Synthesis of Compound B

Under Ar atmosphere, 2-fluoroaniline (9.53 g, 73.8 mmol), Pd (dba) 2 (1.69 g, 2.95 mmol), $P(t\text{-}Bu)_3HBF_4$ (1.72 g, 5.91 mmol), and tBuONa (10.64 g, 111 mmol) were added with Compound A (33.0 g, 73.8 mmol) to about 300 ml of toluene, and stirred at about 80° C. for about 2 hours while heating. Water was added, and separated by filtration with Celite to concentrate an organic layer. Purification by silica gel column chromatography was performed to provide Compound B (35.0 g, yield 88%). The molecular weight of Compound B was about 522 as measured by FAB MS.

3) Synthesis of Compound C

Under Ar atmosphere, diphenylamine (70.0 g, 414 mmol) Pd (dba) 2 (5.66 g, 9.85 mmol), $P(t\text{-}Bu)_3HBF_4$ (2.86 g, 9.85 mmol), and tBuONa (66.2 g, 689 mmol) were added with 1,3-dibromo-5-fluorobenzene (50.0 g, 197 mmol) to about 700 ml of toluene, and stirred at about 80° C. for about 2 hours while heating. Water was added, and separated by filtration with Celite to concentrate an organic layer. Purification by silica gel column chromatography was performed to provide Compound C (74.6 g, yield 88%). The molecular weight of Compound C was about 430 as measured by FAB MS.

4) Synthesis of Compound D

Under Ar atmosphere, 3-chlorobenzenethiol (10.9 g, 75.5 mmol) and $K_3PO_4$ (49.3 g, 232 mmol) were added with Compound C (25.0 g, 58.0 mmol) to 1-methyl-2-pyrrolidone (NMP, 250 ml), and stirred at about 170° C. for about 10 hours while heating. After cooling, water and toluene were added, and liquid was separated to concentrate an organic layer. Purification by silica gel column chromatography was performed to provide Compound D (19.3 g, yield 60%). The molecular weight of Compound D was about 555 as measured by FAB MS.

5) Synthesis of Compound E

Compound E was synthesized in the same way as Compound B, and Compound E (30.0 g, yield 87%) was obtained from Compound D (18.0 g, 32 mmol) and Compound B (17.5 g, 32.4 mmol). The molecular weight of Compound E was about 1040 as measured by FAB MS.

6) Synthesis of Compound 1

Under Ar atmosphere, Compound E (29.0 g, 27.4 mmol) was dissolved in 1,2-dichlorobenzene (ODCB, 365 ml), $BBr_3$ (41.2 g, 164 mmol) was added, and stirred at about 180° C. for about 10 hours while heating. After cooling to room temperature, N,N-diisopropylethylamine (106 g, 822 mmol) was added, water was added, and separated by filtration with Celite to concentrate an organic layer. Purification by silica gel column chromatography was performed to provide Compound 1 (8.83 g, yield 30%). The molecular weight of Compound 1 was about 1056 as measured by FAB MS. The device was purified by sublimation (380° C., $7.7\times10^{-3}$ Pa) to evaluate.

2. Synthesis of Compound 3

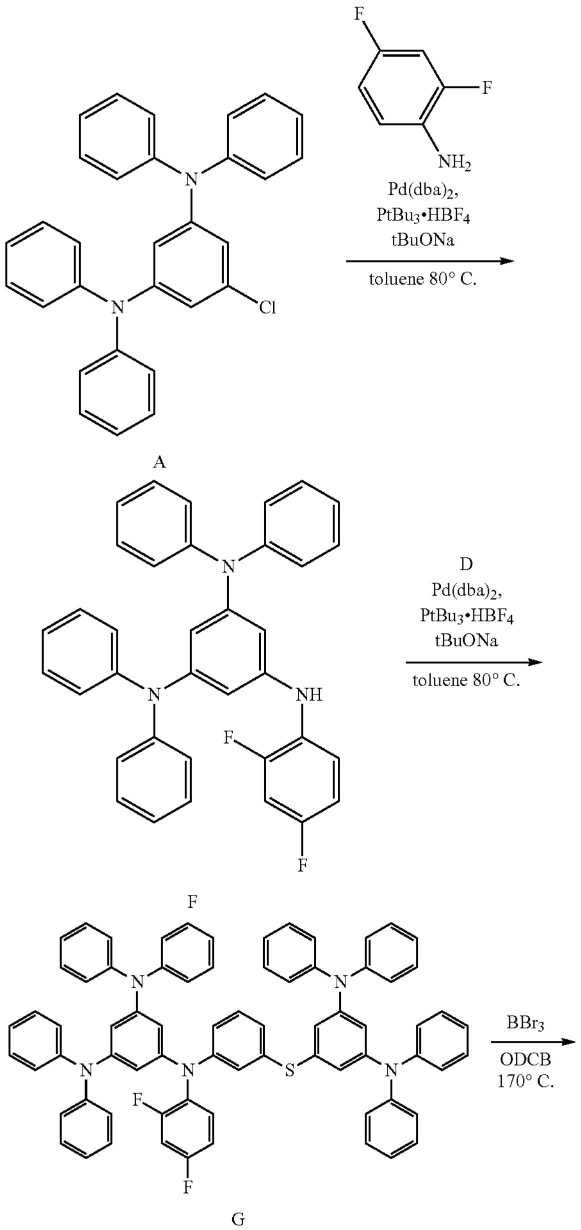

-continued

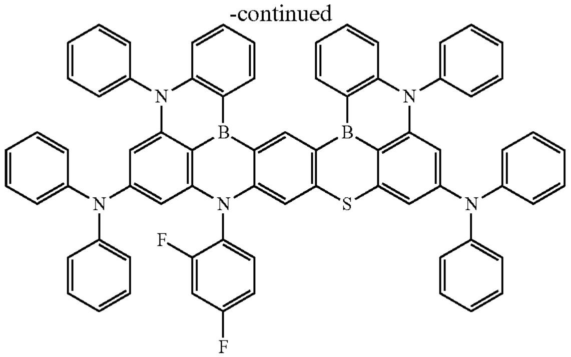

3

1) Synthesis of Compound F

Compound F was synthesized in the same way as Compound B, and Compound F (33.0 g, yield 83%) was obtained from Compound A (33.0 g, 73.8 mmol) and 2,4-difluoroaniline (9.53 g, 73.8 mmol). The molecular weight of Compound F was about 540 as measured by FAB MS.

2) Synthesis of Compound G

Compound G was synthesized in the same way as Compound E, and Compound G (30.0 g, yield 79%) was obtained from Compound F (19.4 g, 36.0 mmol) and Compound D (20.0 g, 36.0 mmol). The molecular weight of Compound G was about 1058 as measured by FAB MS.

3) Synthesis of Compound 3

Compound 3 was synthesized in the same way as Compound 21, and Compound 3 (10.3 g, yield 35%) was obtained from Compound G (29.0 g, 27.4 mmol). The molecular weight of Compound 3 was about 1074 as measured by FAB MS. The device was purified by sublimation (410° C., $8.7 \times 10^{-3}$ Pa) to evaluate.

3. Synthesis of Compound 25

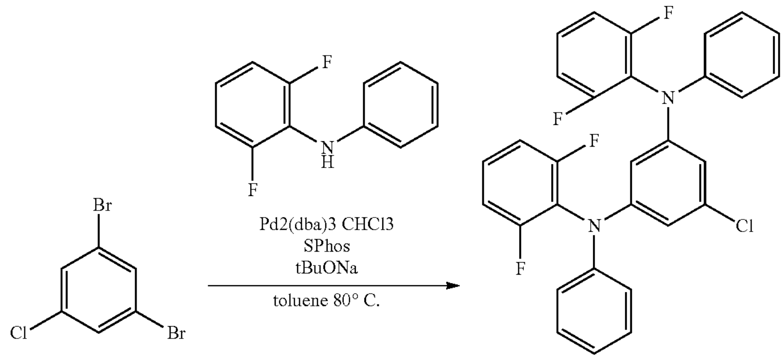

H

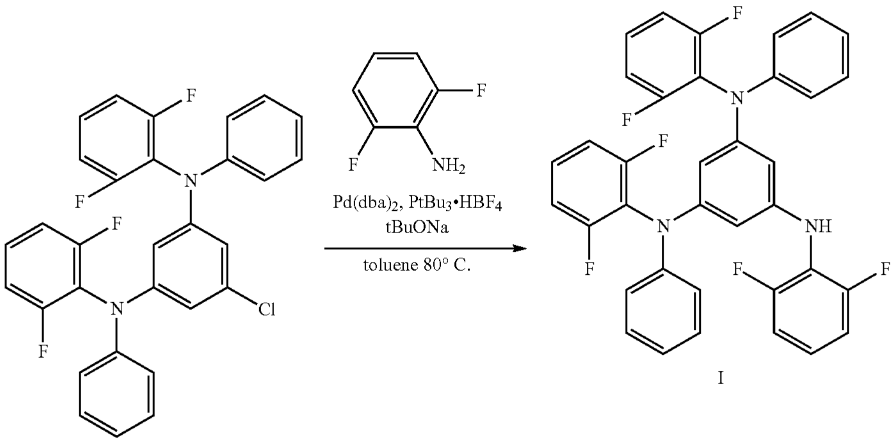

H

I

-continued
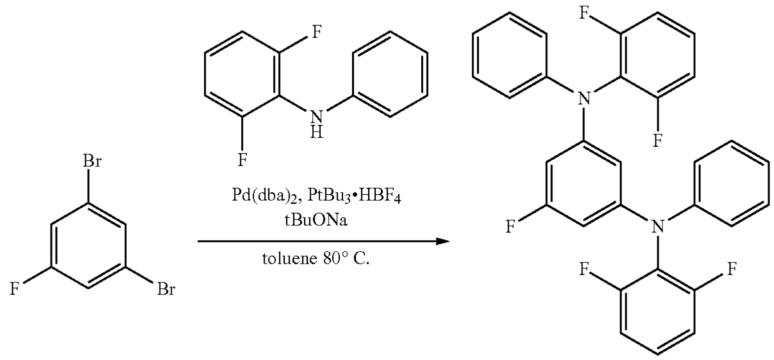
J
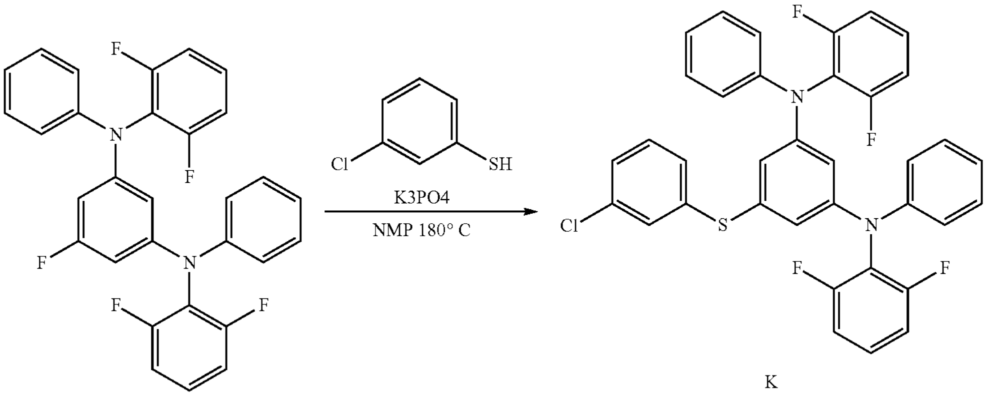
K
J
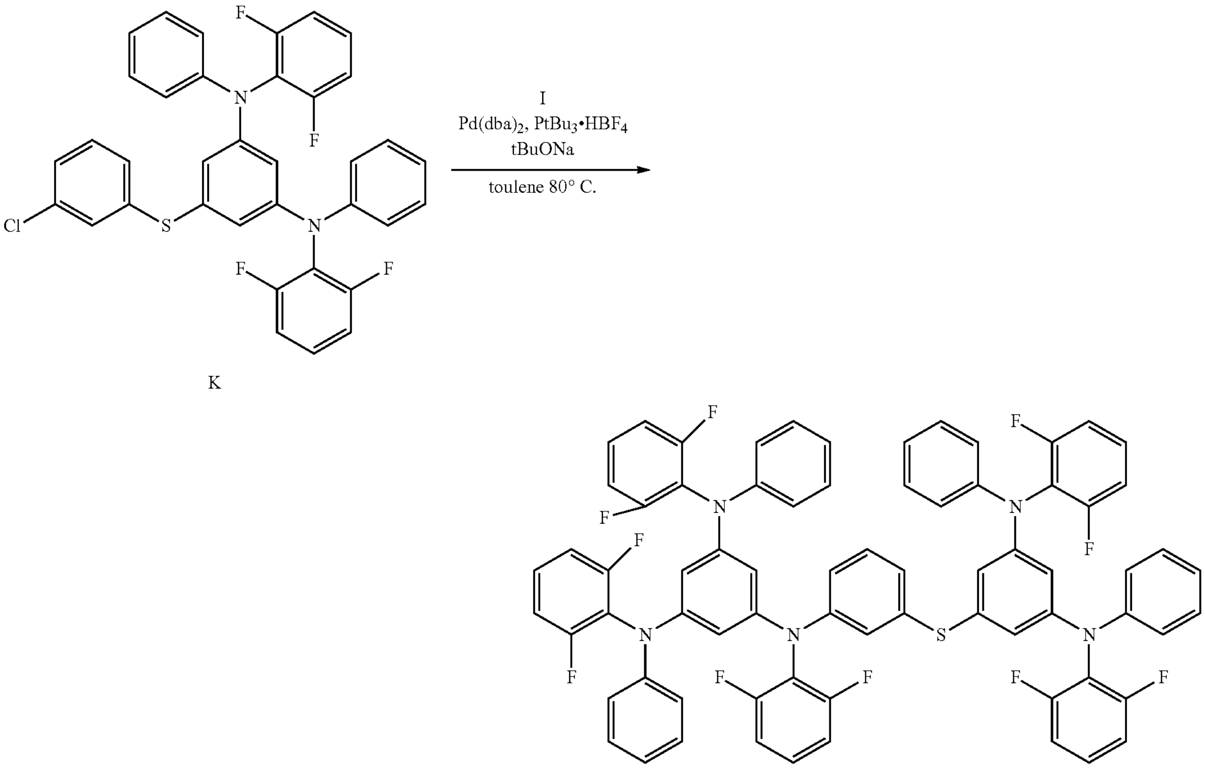
K
L

-continued

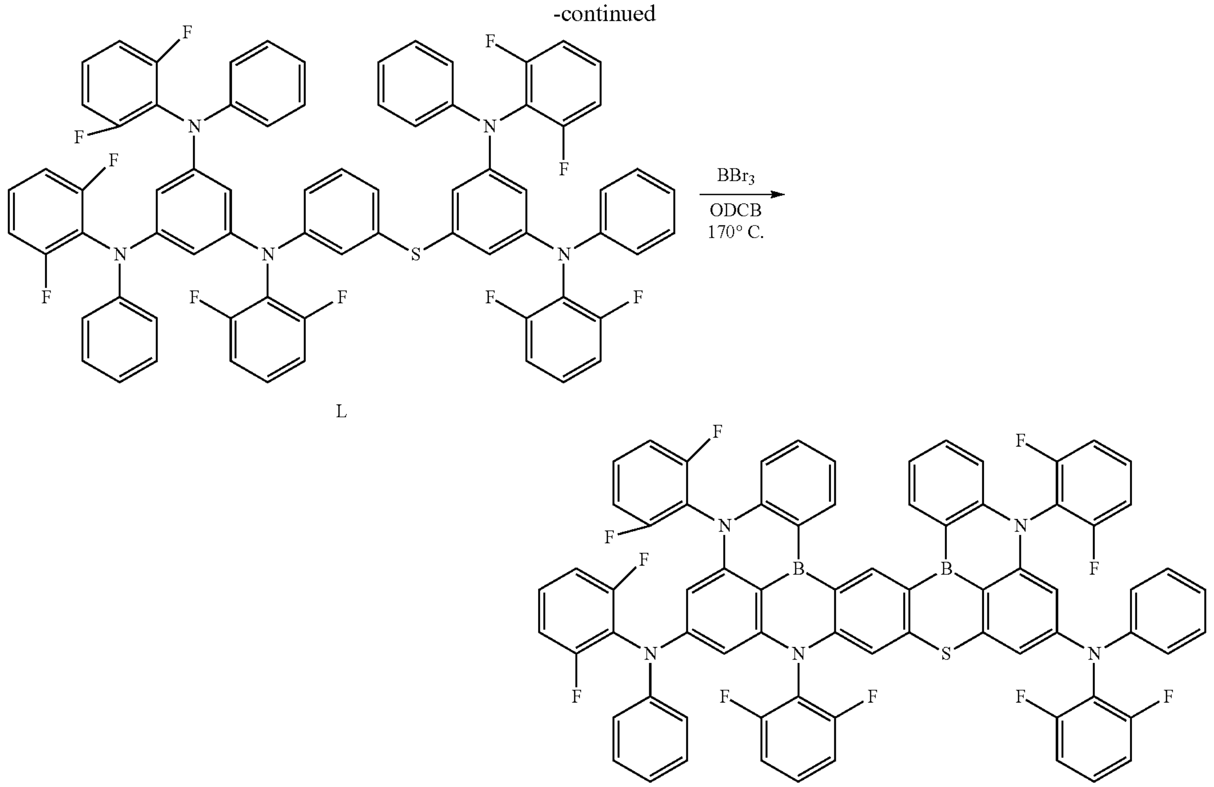

L

25

1) Synthesis of Compound H

Compound H was synthesized in the same way as Compound A, and Compound H (38.4 g, yield 80%) was obtained from 1,3-dibromo-5-chlorobenzene (25.0 g, 92.5 mmol) and 2,6-difluoro-N-phenylaniline (38.0 g, 185 mmol). The molecular weight of Compound H was about 519 as measured by FAB MS.

2) Synthesis of Compound I

Compound I was synthesized in the same way as Compound B, and Compound I (20.0 g, yield 85%) was obtained from Compound H (20.0 g, 38.5 mmol) and 2,6-difluoroaniline (4.98 g, 38.5 mmol). The molecular weight of Compound I was about 612 as measured by FAB MS.

3) Synthesis of Compound J

Compound J was synthesized in the same way as Compound C, and Compound J (32.5 g, yield 82%) was obtained from 1,3-dibromo-5-fluorobenzene (20.0 g, 78.8 mmol) and 2,6-difluoro-N-phenylaniline (32.3 g, 158 mmol). The molecular weight of Compound J was about 502 as measured by FAB MS.

4) Synthesis of Compound K

Compound K was synthesized in the same way as Compound D, and Compound K (23.4 g, yield 75%) was obtained from Compound J (25.0 g, 49.8 mmol) and 3-chlorobenzenethiol (9.35 g, 64.7 mmol. The molecular weight of Compound K was about 627 as measured by FAB MS.

5) Synthesis of Compound L

Compound L was synthesized in the same way as Compound E, and Compound L (33.0 g, yield 82%) was obtained from Compound K (21.0 g, 33.5 mmol) and Compound I (20.5 g, 33.5 mmol). The molecular weight of Compound L was about 1202 as measured by FAB MS.

6) Synthesis of Compound 25

Compound 25 was synthesized in the same way as Compound 12, and Compound 25 (8.82 g, yield 30%) was obtained from Compound L (29.0 g, 27.4 mmol). The molecular weight of Compound 25 was about 1218 as measured by FAB MS. The device was purified by sublimation (420° C., $6.7\times10^{-3}$ Pa) to evaluate.

4. Synthesis of Compound 74

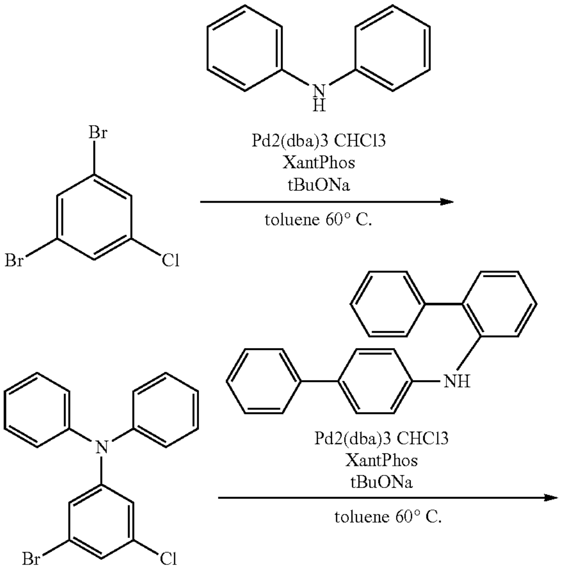

M

-continued

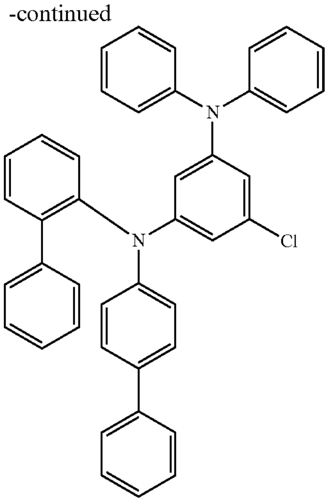

N

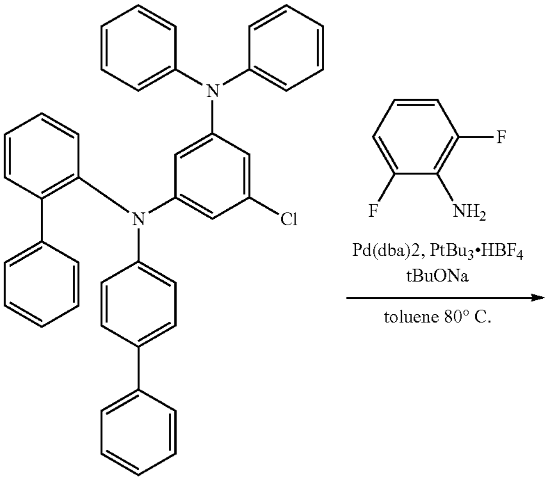

N

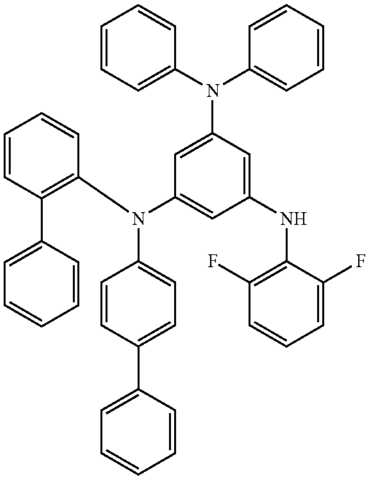

O

1) Synthesis of Compound M

Under Ar atmosphere, diphenylamine (20.0 g, 118 mmol), Pdz (dba) 3·$CHCl_3$ (2.71 g, 3.0 mmol), 4,5-bis(diphenylphosphino)-9,9-dimethylxanthene (XantPhos, 2.87 g, 5.0 mmol), and tBuONa (13.6 g, 142 mmol) were added with 1,3-dibromo-5-chlorobenzene (38.3 g, 142 mmol) to about 260 ml of toluene, and reacted at about 60° C. for about 7 hours. After cooling, water was added, and separated by filtration with Celite to concentrate an organic layer. Purification by silica gel column chromatography was performed to provide Compound M (25.4 g, yield 60%). The molecular weight of Compound M was about 359 as measured by FAB MS.

2) Synthesis of Compound N

Under Ar atmosphere, N-(4-biphenylyl)-2-biphenylamine (17.0 g, 62.9 mmol), $Pd_2(dba)_3$·$CHCl_3$ (1.21 g, 1.32 mmol), Sphos (0.65 g, 1.58 mmol), and tBuONa (18.4 g, 192 mmol) were added with Compound M (24.3 g, 75.5 mmol) to about 250 ml of toluene, and reacted at about 80° C. for about 6 hours. After cooling, water was added, and separated by filtration with Celite to concentrate an organic layer. Purification by silica gel column chromatography was performed to provide Compound N (31.3 g, yield 83%). The molecular weight of Compound N was about 599 as measured by FAB MS.

3) Synthesis of Compound O

Compound O was synthesized in the same way as Compound B, and Compound O (20.8 g, yield 78%) was obtained from Compound N (20.0 g, 38.5 mmol) and 2,6-difluoroaniline (4.98 g, 38.5 mmol). The molecular weight of Compound O was about 692 as measured by FAB MS.

4) Synthesis of Compound P

Compound P was synthesized in the same way as Compound E, and Compound P (30.0 g, yield 86%) was obtained from Compound O (19.9 g, 28.8 mmol) and Compound D (16.0 g, 28.8 mmol). The molecular weight of Compound P was about 1211 as measured by FAB MS.

5) Compound 74

Compound 74 was synthesized in the same way as Compound 12, and Compound 74 (6.16 g, yield 21%) was obtained from Compound P (29.0 g, 24.0 mmol). The molecular weight of Compound 74 was about 1226 as measured by FAB MS. The device was purified by sublimation (425° C., 7.7×$10^{-3}$ Pa) to evaluate.

5. Synthesis of Compound 112

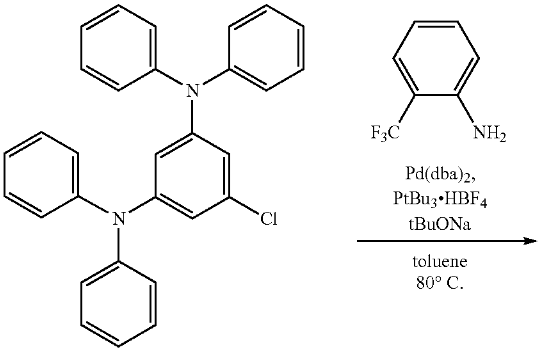

A

-continued

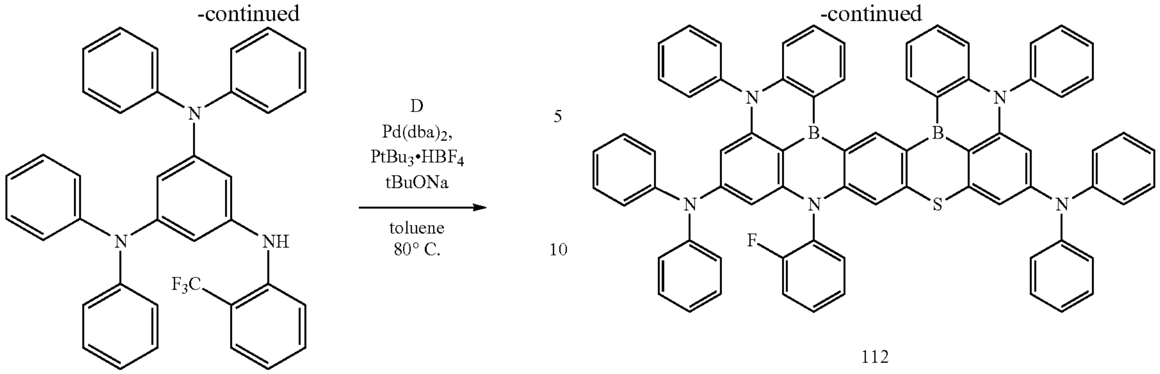

Q

112

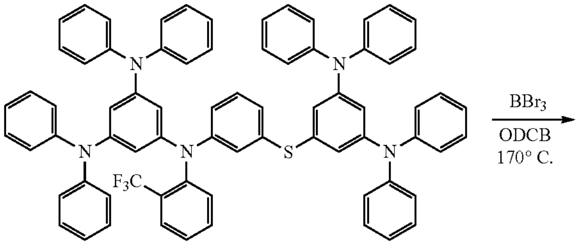

R

1) Synthesis of Compound Q

Compound Q was synthesized in the same way as Compound B, and Compound Q (19.4 g, yield 76%) was obtained from Compound A (20.0 g, 44.7 mmol) and 2-trifluoroaniline (7.21 g, 44.7 mmol). The molecular weight of Compound Q was about 572 as measured by FAB MS.

2) Synthesis of Compound R

Compound R was synthesized in the same way as Compound E, and Compound R (27.6 g, yield 78%) was obtained from Compound Q (18.5 g, 32.4 mmol) and Compound D (18.0 g, 32.4 mmol). The molecular weight of Compound R was about 1090 as measured by FAB MS.

3) Synthesis of Compound 112

Compound 112 was synthesized in the same way as Compound 12, and Compound 112 (4.11 g, yield 18%) was obtained from Compound P (25.0 g, 20.7 mmol). The molecular weight of Compound 112 was about 1106 as measured by FAB MS. The device was purified by sublimation (390° C., $8.7\times10^{-3}$ Pa) to evaluate.

6. Synthesis of Compound 170

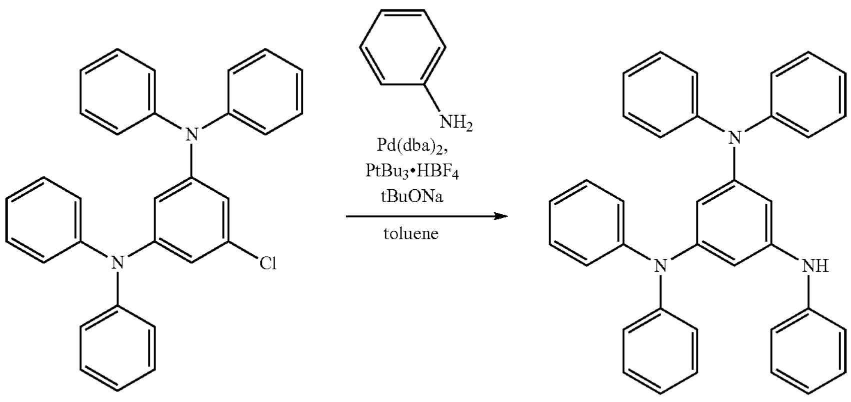

A

S

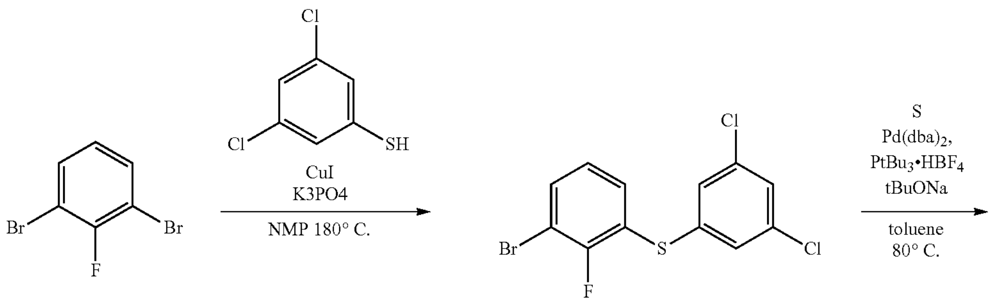

T

-continued

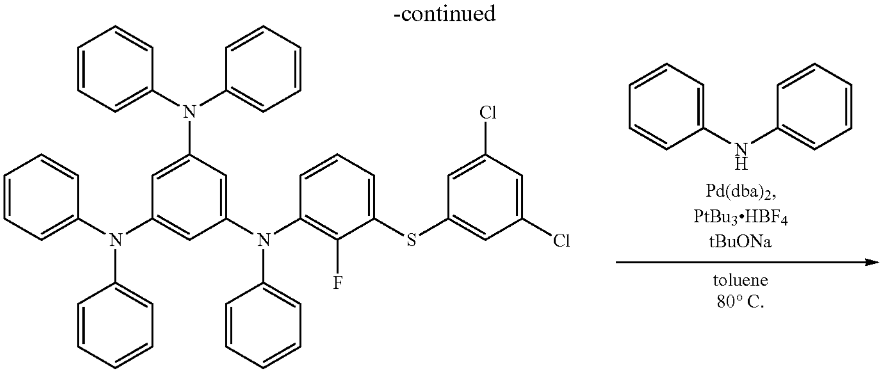

U

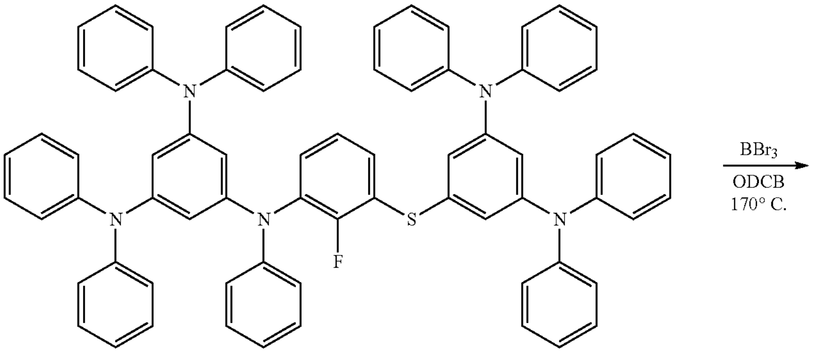

V

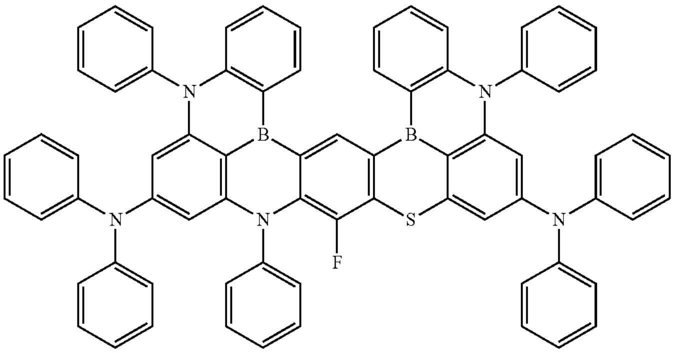

170

1) Synthesis of Compound S

Compound S was synthesized in the same way as Compound B, and Compound S (22.0 g, yield 85%) was obtained from Compound A (20.0 g, 44.7 mmol) and aniline (7.21 g, 44.7 mmol). The molecular weight of Compound S was about 504 as measured by FAB MS.

2) Synthesis of Compound T 1,3-dibromo-2-fluorobenzene (30.0 g, 118 mmol) and 3,5-dichlorobenzenethiol (27.5 g, 154 mmol), CuI (3.85 g, 11.8 mmol), and $K_3PO_4$ (50.2 g, 236 mmol) were added to NMP (50 ml), and maintained at about 180° C. for about 10 hours. Water was added, and separated by filtration with Celite to concentrate an organic layer. Purification by silica gel column chromatography was performed to provide Compound T (25.0 g, yield 60%). The molecular weight of Compound T was about 352 as measured by FAB MS.

3) Synthesis of Compound U

Compound U was synthesized in the same way as Compound E, and Compound U (25.1 g, yield 65%) was obtained from Compound S (26.3 g, 45.5 mmol) and Compound T (16.0 g, 45.5 mmol). The molecular weight of Compound U was about 775 as measured by FAB MS.

4) Synthesis of Compound V

Compound V was synthesized in the same way as Compound A, and Compound V (27.7 g, yield 88%) was obtained from Compound U (24.0 g, 28.2 mmol) and diphenylamine (11.9 g, 70.5 mmol). The molecular weight of Compound V was about 1040 as measured by FAB MS.

5) Synthesis of Compound 170

Compound 170 was synthesized in the same way as Compound 1, and Compound 170 (6.33 g, yield 25%) was obtained from Compound V (25.0 g, 22.4 mmol). The molecular weight of Compound 170 was about 1056 as measured by FAB MS. The device was purified by sublimation (380° C., $9.6\times10^{-3}$ Pa) to evaluate.

7. Synthesis of Compound 235
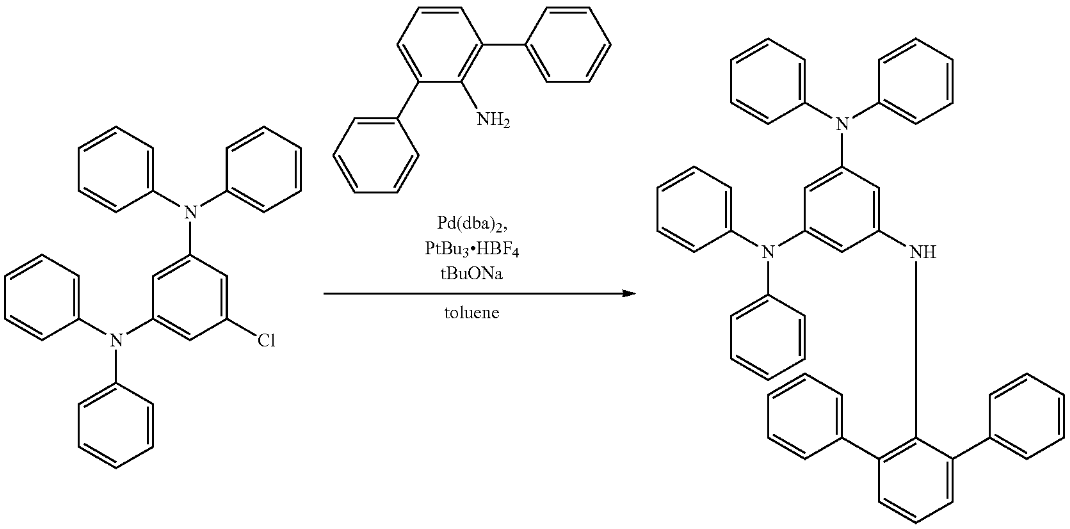
A W
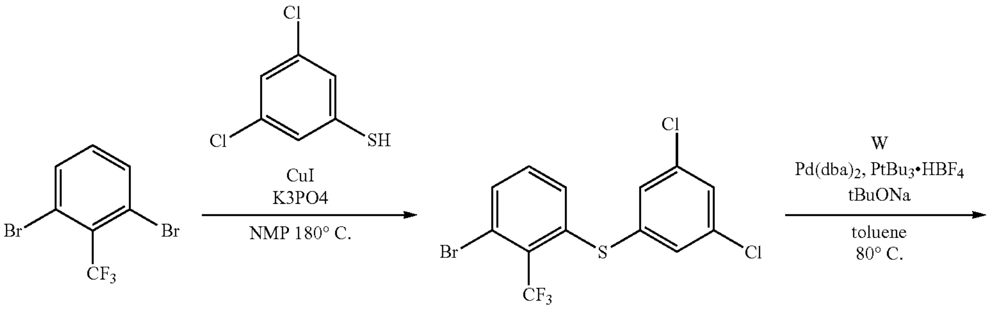
X
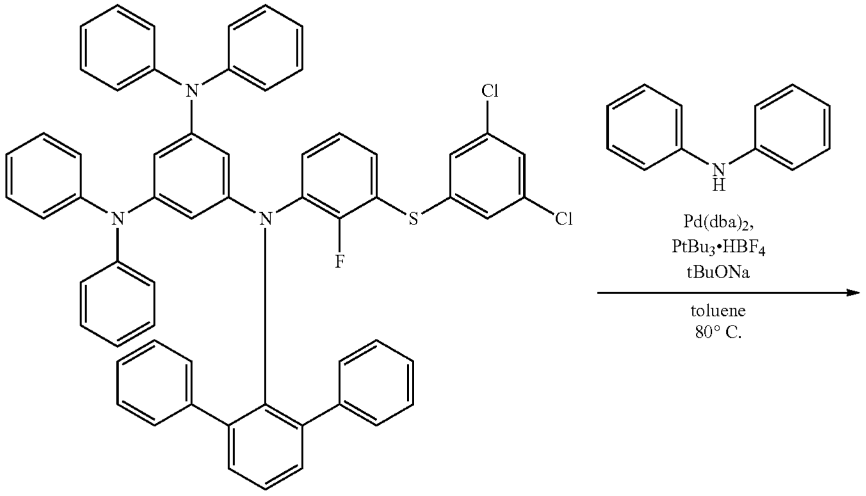
Y

-continued

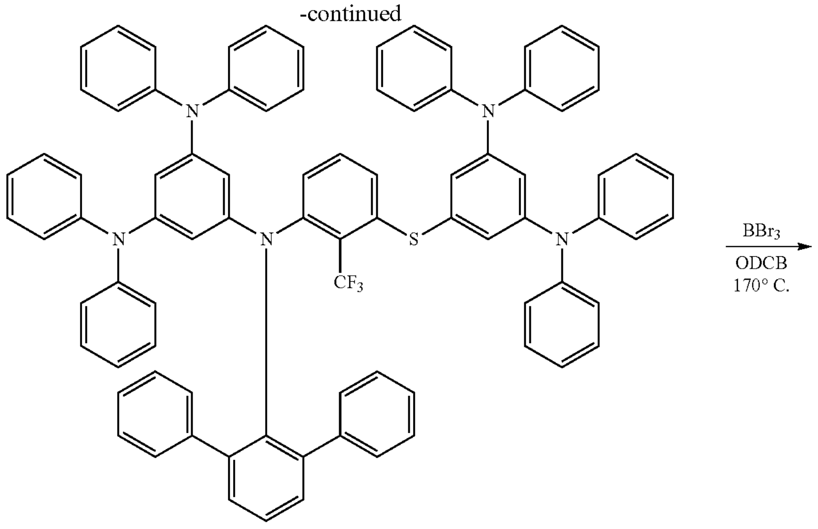

Z

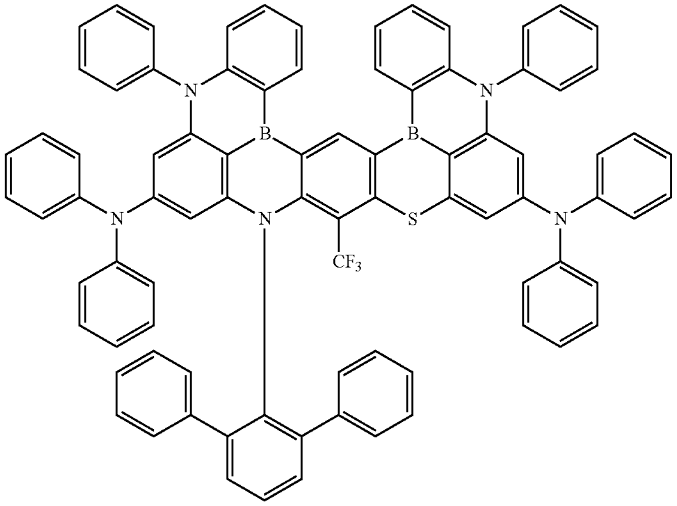

235

1) Synthesis of Compound W

Compound W was synthesized in the same way as Compound B, and Compound W (22.9 g, yield 78%) was obtained from Compound A (20.0 g, 44.7 mmol) and terphenyamine (10.98 g, 44.7 mmol). The molecular weight of Compound W was about 656 as measured by FAB MS.

2) Synthesis of Compound X

Compound X was synthesized in the same way as Compound T, and Compound X (27.0 g, yield 68%) was obtained from 1,3-dibromo-2-(trifluoromethyl)benzene (30.0 g, 98.7 mmol) and 3,5-dichlorobenzenethiol (23.0 g, 128 mmol). The molecular weight of Compound X was about 402 as measured by FAB MS.

3) Synthesis of Compound Y

Compound Y was synthesized in the same way as Compound E, and Compound Y (19.8 g, yield 35%) was obtained from Compound X (24.5 g, 61 mmol) and Compound W (40 g, 61 mmol). The molecular weight of Compound Y was about 927 as measured by FAB MS.

4) Synthesis of Compound Z

Compound Z was synthesized in the same way as Compound A, and Compound Z (18.8 g, yield 78%) was obtained from Compound Y (18.0 g, 19.4 mmol) and diphenylamine (8.21 g, 48.5 mmol). The molecular weight of Compound Z was about 1243 as measured by FAB MS.

5) Synthesis of Compound 235

Compound 235 was synthesized in the same way as Compound 21, and Compound 235 (2.73 g, yield 15%) was obtained from Compound Z (18.0 g, 14.5 mmol). The molecular weight of Compound 235 was about 1258 as measured by FAB MS. The device was purified by sublimation (370° C., $6.6\times10^{-3}$ Pa) to evaluate.

Device Fabrication Example
The organic electroluminescence devices were fabricated using compounds of Examples and Comparative Examples below as materials of an emission layer.
[Example Compound]
1
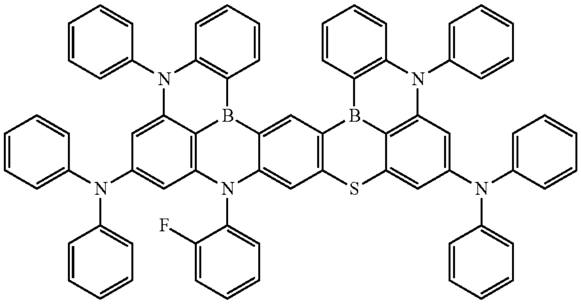
3
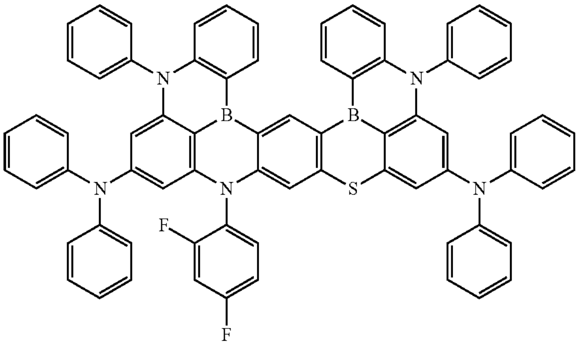
25
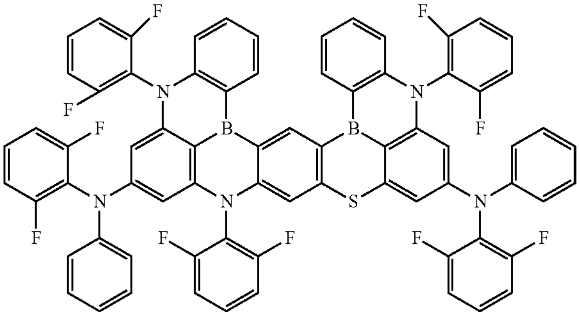
74
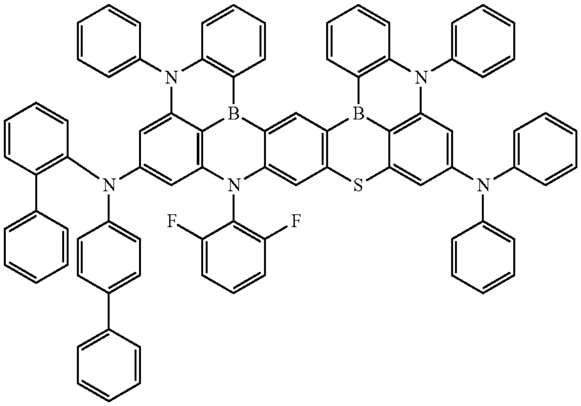
-continued
112
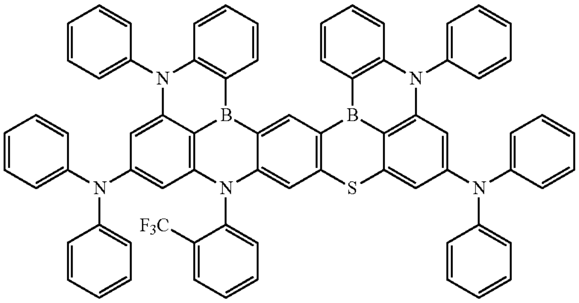
170
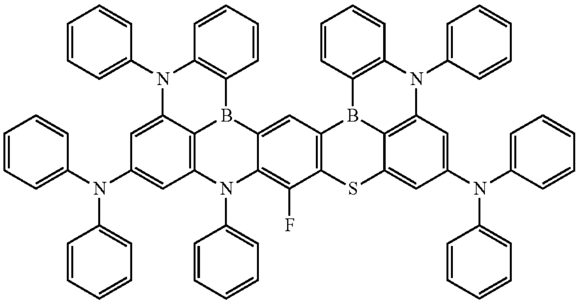
235
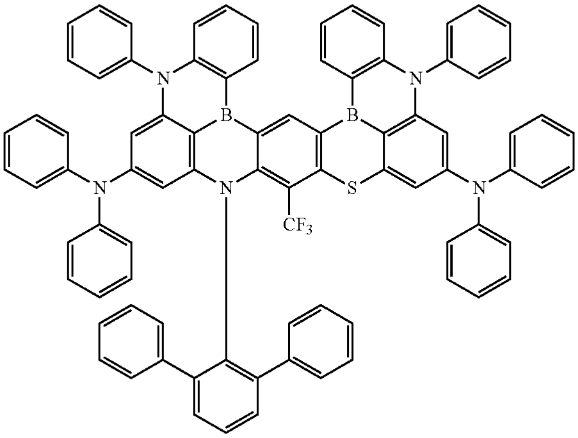
[Comparative Example Compound]
X1
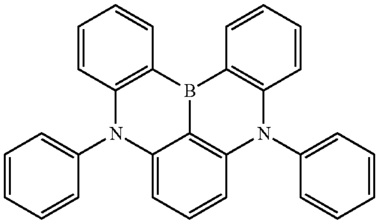

-continued

X2

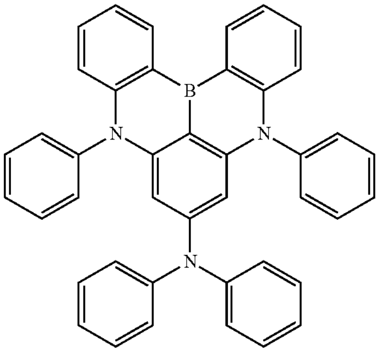

X3

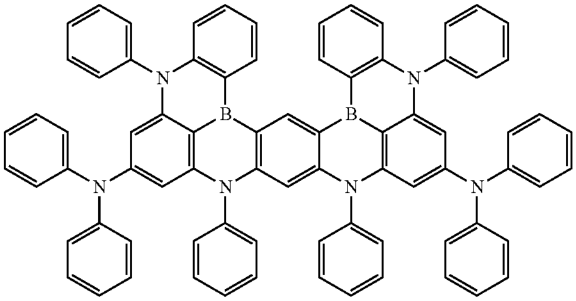

X4

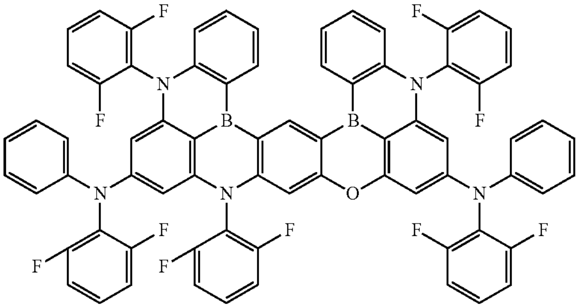

X5

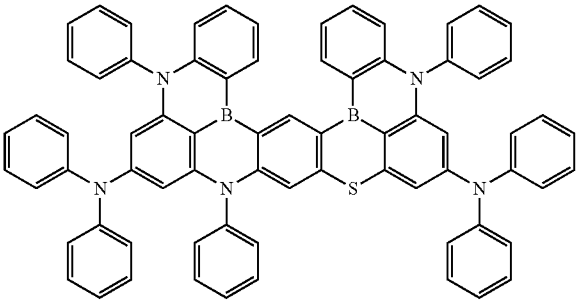

-continued

X6

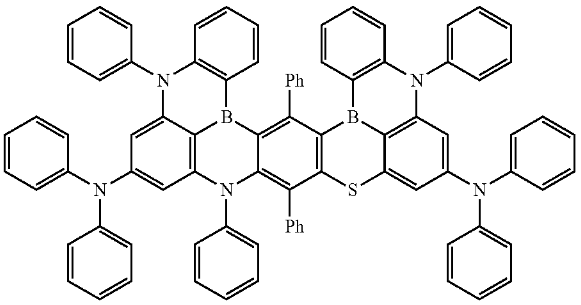

X7

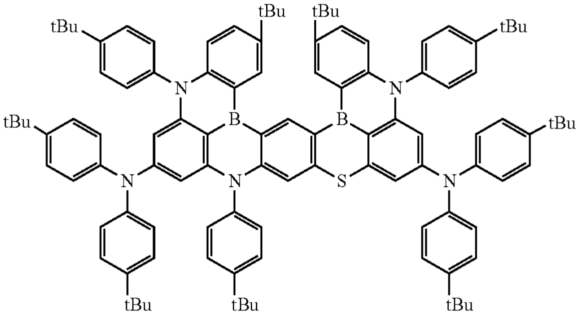

On a glass substrate, ITO with a thickness of about 1500 Å was patterned and washed with ultra-pure water, followed by treatment with UV ozone for about 10 minutes. HAT-CN was deposited to a thickness of about 100 Å, a-NPD was deposited to a thickness of about 800 Å, and mCP was deposited to a thickness of about 50 Å to form a hole transport region.

In forming the emission layer, the polycyclic compound according to an embodiment or a compound of Comparative Example was co-deposited with mCBP at a ratio of 1:99 to form a layer with a thickness of about 200 Å.

On the emission layer, an electron transport region was formed by forming a layer with a thickness of about 300 Å using TPBi and a layer with a thickness of about 5 Å using LiF. After that, a second electrode with a thickness of about 1000 Å was formed using aluminum (Al).

The measurement values according to Examples 1 to 7 and Comparative Examples 1 to 7 are shown in Table 1 below. Roll-off is expressed as (external quantum efficiency of 1 cd/$m^3$)-(1000 cd/$m^3$)/(external quantum efficiency of 1 cd/$m^3$)×100. Emission efficiency is a measurement value at 10 mA/$cm^2$, and relative service life means a relative service life value when the half-life of Comparative Example 3 is 1.

TABLE 1

| | Emission Layer | Maximum Emission Wavelength(nm) | Delayed Fluorescence Service Life(μS) | Roll-off (%) | Emission Efficacy(%) | Relative Service LifeLT50(h) |
|---|---|---|---|---|---|---|
| Example 1 | 1 | 460 | 2.5 | 10.4 | 22.1 | 3.8 |
| Example 2 | 3 | 458 | 2.3 | 9.1 | 22.2 | 4.3 |
| Example 3 | 25 | 457 | 2.6 | 11.3 | 21.1 | 3.6 |
| Example 4 | 74 | 461 | 2.4 | 10.5 | 20.6 | 2.8 |
| Example 5 | 112 | 459 | 2.8 | 12.0 | 20.8 | 2.6 |

TABLE 1-continued

| | Emission Layer | Maximum Emission Wavelength(nm) | Delayed Fluorescence Service Life(μS) | Roll-off (%) | Emission Efficacy(%) | Relative Service LifeLT50(h) |
|---|---|---|---|---|---|---|
| Example 6 | 170 | 463 | 2.7 | 12.1 | 19.6 | 2.4 |
| Example 7 | 235 | 463 | 2.9 | 12.2 | 18.5 | 2.2 |
| Comparative Example 1 | X1 | 457 | 130 | 33.2 | 5.4 | 0.3 |
| Comparative Example 2 | X2 | 446 | 11.2 | 30.5 | 7.2 | 0.2 |
| Comparative Example 3 | X3 | 467 | 5.5 | 13.5 | 17.4 | 1 |
| Comparative Example 4 | X4 | 451 | 9.3 | 20.3 | 7.5 | 0.1 |
| Comparative Example 5 | X5 | 465 | 2.4 | 12.0 | 20.3 | 1.5 |
| Comparative Example 6 | X6 | 466 | 15.0 | 15.0 | 8.2 | 0.2 |
| Comparative Example 7 | X7 | 467 | 10.2 | 18.0 | 10.5 | 0.4 |

Referring to Table 1, it may be confirmed that Examples 1 to 7 achieved long service life and high efficiency at the same time compared to Comparative Examples 1 to 7.

The polycyclic compound according to an embodiment includes an S atom in a core structure, and by introducing a fluorine atom as an electron withdrawing group at a specific position, thereby accomplishing long service life and high efficiency of the device at the same time.

Emission wavelengths of Examples 1 to 7 was shorter than those of Comparative Example compound X3 which has a similar structure, and thus, exhibit color purity closer to pure blue. Considering delayed fluorescence service life value, it may be seen that Examples 1 to 7 exhibit delayed fluorescence and express TADF. Also, it may be seen that the emission service life became faster compared to Comparative Examples 1 to 4. It may be observed that in Examples 1 to 7, the roll-off is low in proportion to the emission service life, and triplet-triplet annihilation (TTA) and singlet-triplet annihilation (STA) are suppressed.

Particularly compared to Example 1, Comparative Example 5 does not contain an F atom in a characteristic position. The emission wavelength of Comparative Example 5 was about 465 nm, which was too long in pure blue.

Particularly compared to Example 6, Comparative Example 6 does not contain an F atom in a characteristic position. The emission wavelength of the compound of Comparative Example 6 was about 466 nm, which was too long in pure blue.

Particularly compared to Example 3, Comparative Example 7 does not contain an F atom in a characteristic position. The emission wavelength of the compound of Comparative Example 7 was about 467 nm, which was too long in pure blue.

Comparing Compound 25 of Example 3 with Compound X4 of Comparative Example 4, the fluorine atoms were polysubstituted in both, but in Example compound 25, the emission wavelength was about 457 nm, which exhibits color purity close to ideal pure blue, whereas in Compound X4 the emission wavelength was about 451 nm, which was too short.

The polycyclic compound according to an embodiment is used in the emission layer to contribute to low driving voltage, high efficiency, and long service life of the organic electroluminescence device.

The organic electroluminescence device according to an embodiment has excellent efficiency.

The polycyclic compound according to an embodiment may be used as a material for the emission layer of an organic electroluminescence device, and by using the polycyclic compound, the efficiency of the organic electroluminescence device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

The invention claimed is:

1. An organic electroluminescence device comprising:

a first electrode;

a hole transport region disposed on the first electrode;

an emission layer disposed on the hole transport region;

an electron transport region disposed on the emission layer; and a second electrode disposed on the electron transport region, wherein the emission layer comprises a polycyclic compound represented by Formula 1:

[Formula 1]

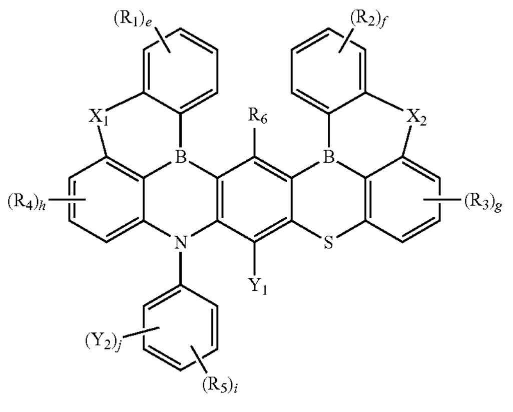

wherein in Formula 1, $X_1$ and $X_2$ are each independently $N(Ar_1)$, O, or S, $Ar_1$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, $Y_1$ is a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, provided that:

a phenyl group including $Y_2$ and $R_5$ is represented by one of $Y_2$-2 to $Y_2$-7; or $Y_1$ is F or CF3, and a phenyl group including $Y_2$ and $R_5$ is represented by one of $Y_2$-1 to $Y_2$-7, $R_1$ to $R_4$ and $R_6$ are each independently a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, e and f are each independently an integer from 0 to 4, j and i are each independently an integer from 0 to 5, the sum of j and i is equal to or less than 5, and g and h are each independently an integer from 0 to 3:

Y2-1

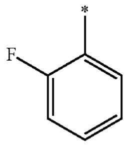

Y2-2

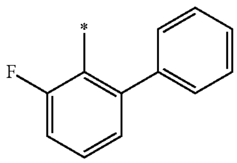

Y2-3

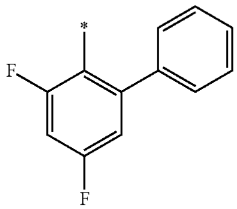

Y2-4

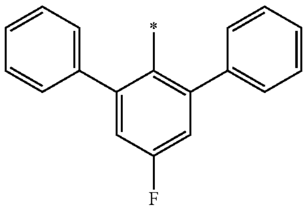

-continued

Y2-5

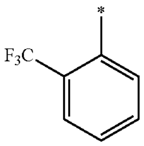

Y2-6

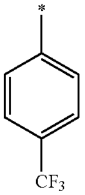

Y2-7

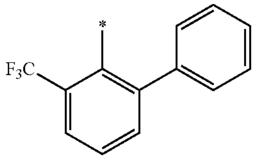

wherein in $Y_2$-1 to $Y_2$-7,

* indicates a binding site to a neighboring atom.

2. The organic electroluminescence device of claim 1, wherein the emission layer emits delayed fluorescence.

3. The organic electroluminescence device of claim 1, wherein the emission layer is a delayed fluorescence emission layer comprising a first compound and a second compound, and the first compound comprises the polycyclic compound.

4. The organic electroluminescence device of claim 1, wherein the emission layer is a thermally activated delayed fluorescence emission layer that emits light of a wavelength in a range of about 430 nm to about 480 nm.

5. The organic electroluminescence device of claim 1, wherein $X_1$ and $X_2$ are the same as each other.

6. The organic electroluminescence device of claim 1, wherein Formula 1 is represented by Formula 2:

[Formula 2]

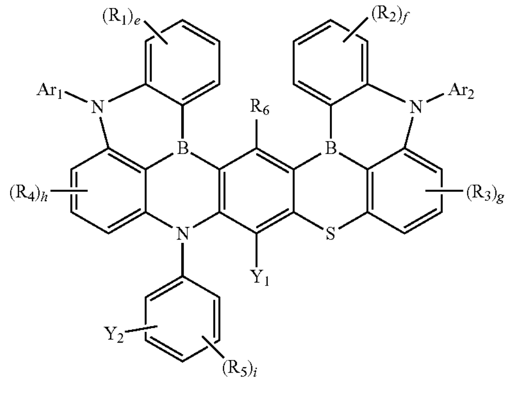

wherein in Formula 2, $Ar_2$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $Ar_1$, $Y_1$, $Y_2$, $R_1$ to $R_6$, and e to i are the same as defined in connection with Formula 1.

7. The organic electroluminescence device of claim 1, wherein the sum of g and h is equal to or greater than 1, and at least one of $R_3$ and $R_4$ is a substituted amine group.

8. The organic electroluminescence device of claim 6, wherein Formula 2 is represented by Formula 3:

[Formula 3]

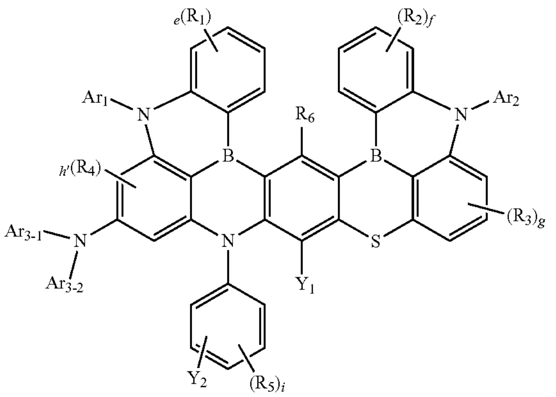

wherein in Formula 3, $Ar_{3-1}$ and $Ar_{3-2}$ are each independently a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, h' is an integer from 0 to 2, and $Ar_1$, $Ar_2$, $Y_1$, $Y_2$, $R_1$ to $R_6$, e to g, and i are the same as defined in connection with Formula 2.

9. The organic electroluminescence device of claim 6, wherein Formula 2 is represented by Formula 4:

[Formula 4]

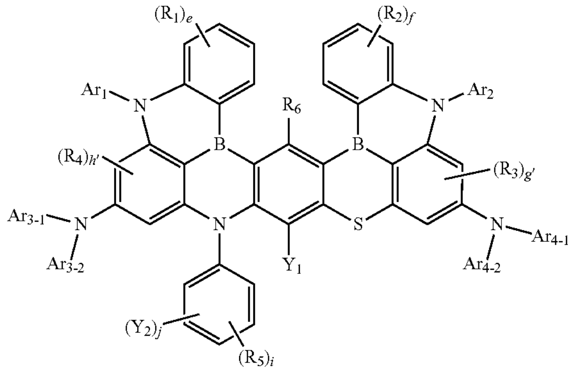

wherein in Formula 4, $Ar_{3-1}$, $Ar_{3-2}$, $Ar_{4-1}$, and $Ar_{4-2}$ are each independently a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, h' and g' are each independently an integer from 0 to 2, and $Ar_1$, $Ar_2$, $Y_1$, $Y_2$, $R_1$ to $R_6$, e, f, to i are the same as defined in connection with Formula 2.

10. The organic electroluminescence device of claim 9, wherein $Ar_{3-1}$, $Ar_{3-2}$, $Ar_{4-1}$, and $Ar_{4-2}$ are each independently a substituted or unsubstituted ring-forming aryl group having 6 to 18 carbon atoms.

11. The organic electroluminescence device of claim 1, wherein Formula 1 is represented by Formula 6:

[Formula 6]

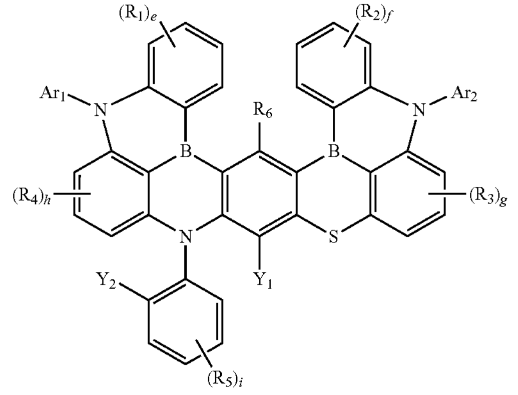

wherein in Formula 6, $Ar_2$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $Ar_1$, $Y_1$, $Y_2$, $R_1$ to $R_6$, and e to i are the same as defined in connection with Formula 1.

12. The organic electroluminescence device of claim 6, wherein $Ar_1$ and $Ar_2$ are each independently represented by one of Formula 5-1 to Formula 5-3:

[Formula 5-1]

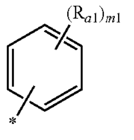

[Formula 5-2]

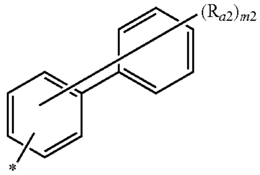

[Formula 5-3]

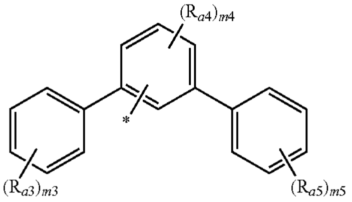

wherein in Formula 5-1 to Formula 5-3, $R_{a1}$ to $R_{a5}$ are each independently a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, $m^1$, $m^3$, and $m^5$ are each independently an integer from 0 to 5, $m^2$ is an integer from 0 to 9, $m^4$ is an integer from 0 to 3, and

* indicates a binding site to a neighboring atom.

13. The organic electroluminescence device of claim 1, wherein the polycyclic compound represented by Formula 1 is one selected from Compound Group 1:

[Compound Group 1]

13

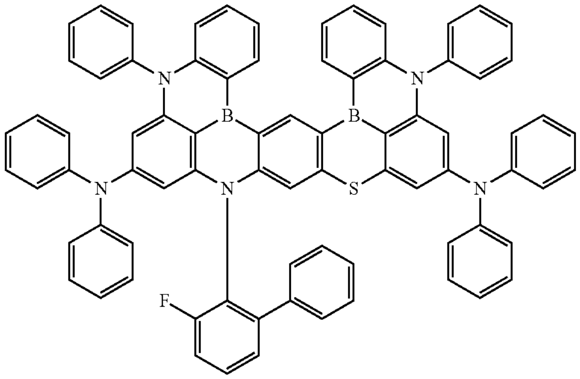

14

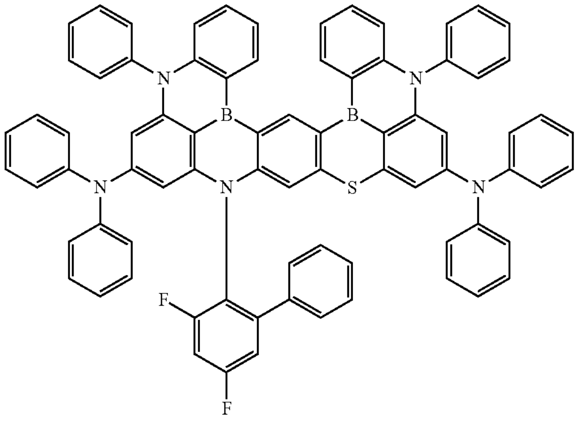

15

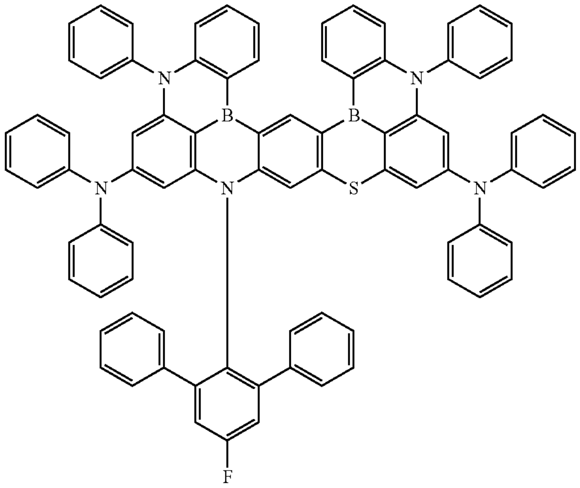

16

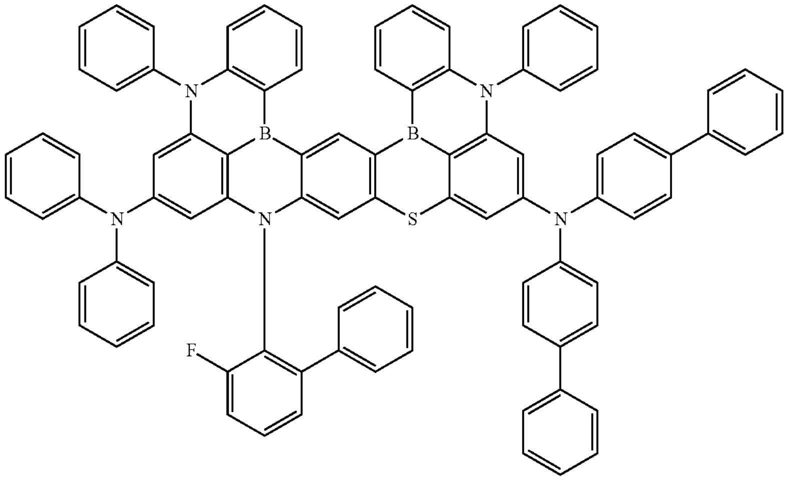

-continued
17
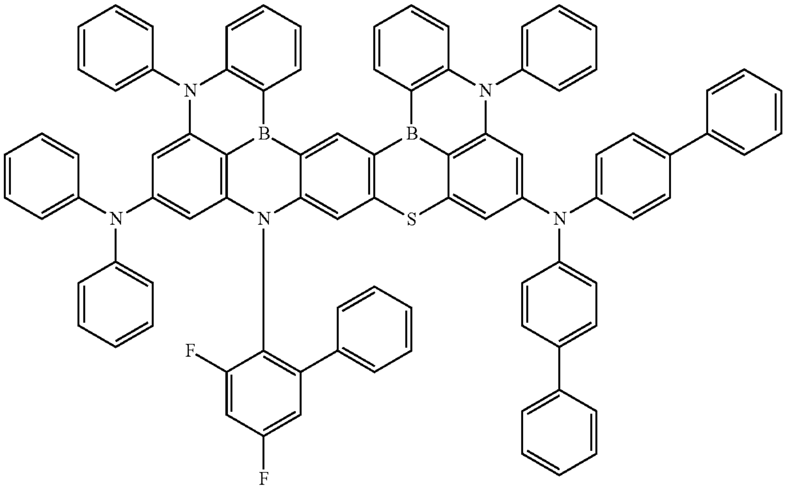
18
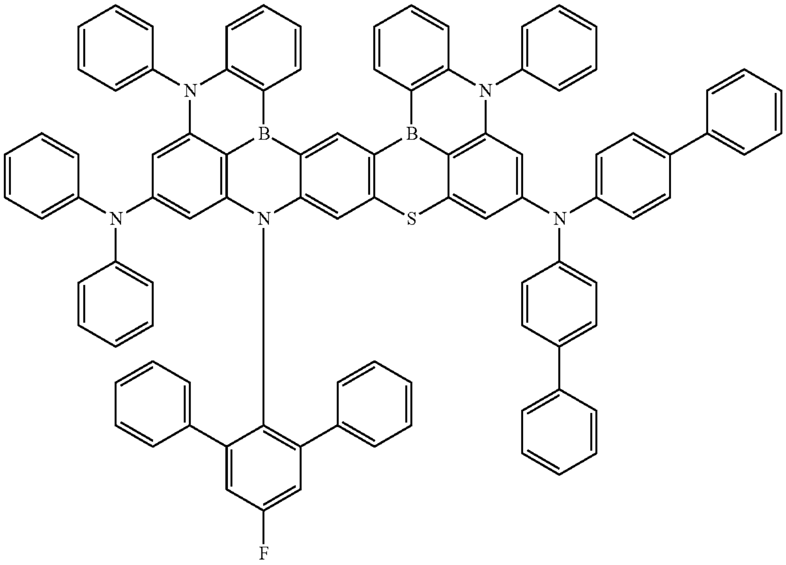
19
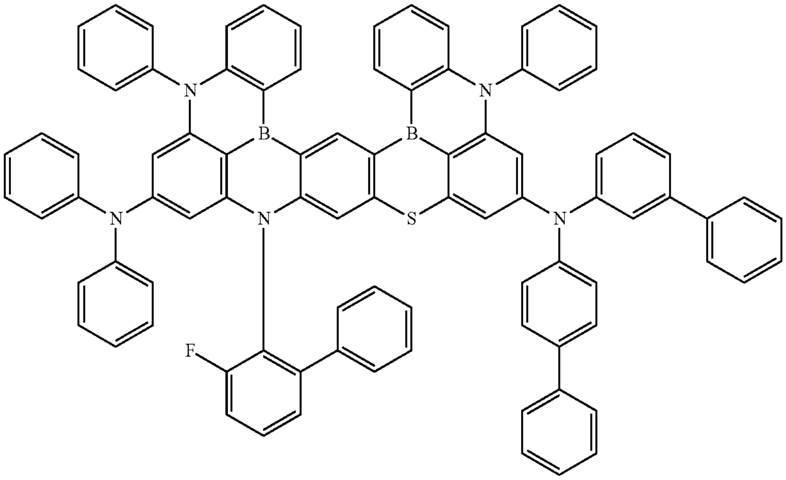

-continued
20
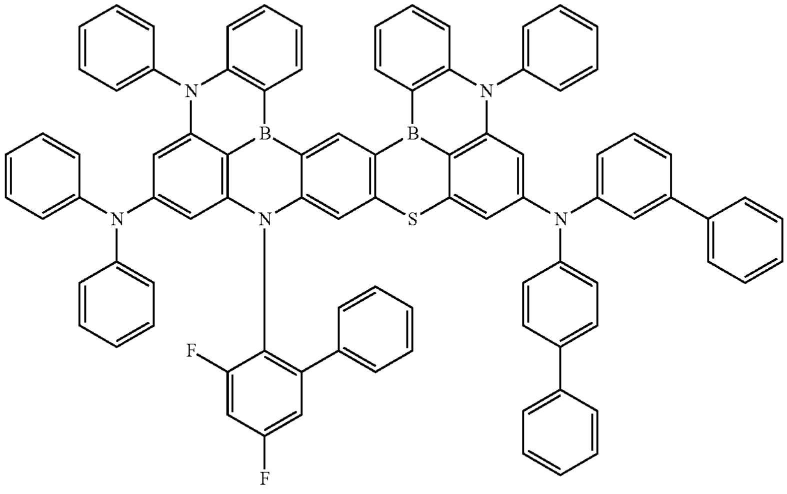
21
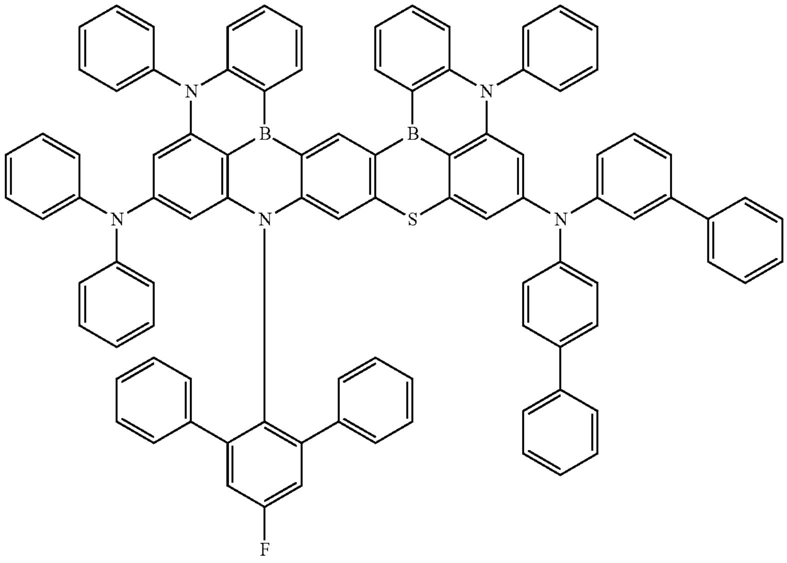
22
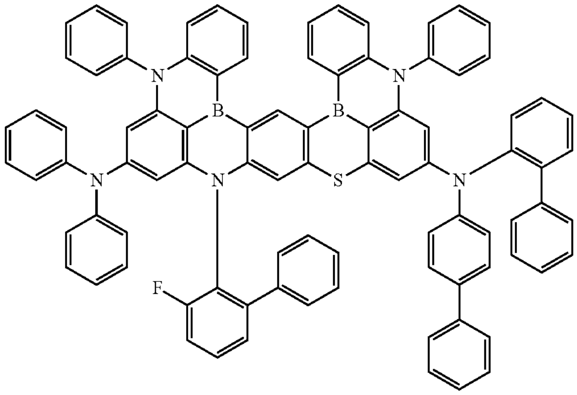
23
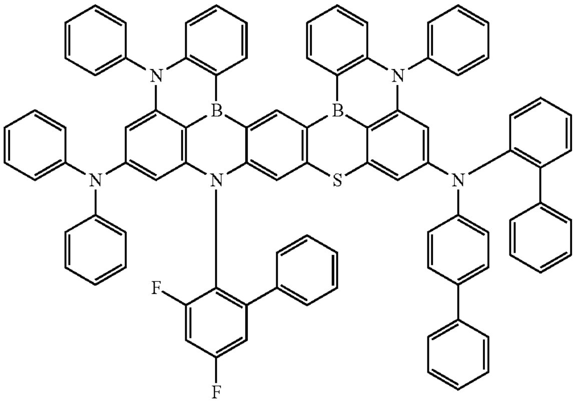

-continued
24
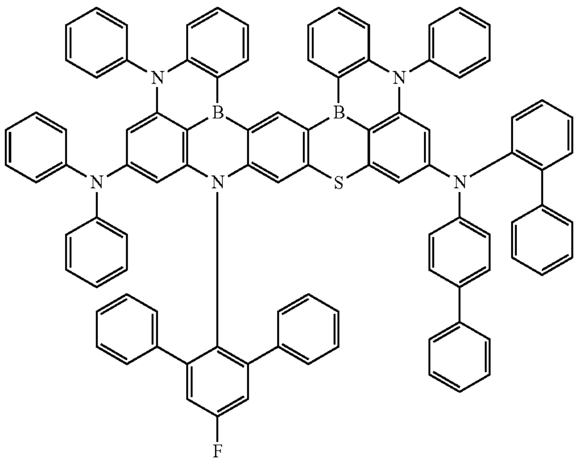
27
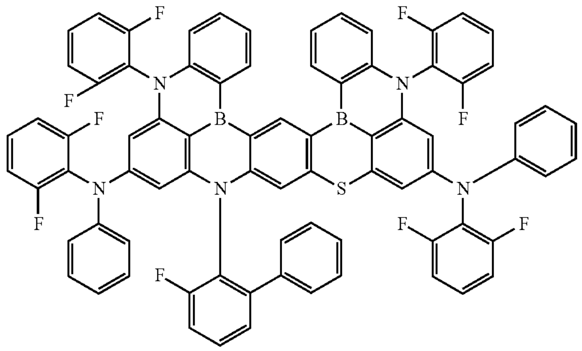
30
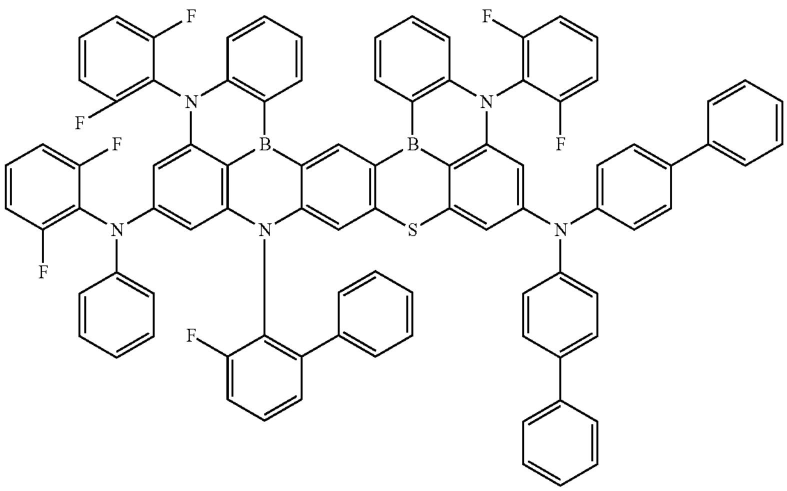
33
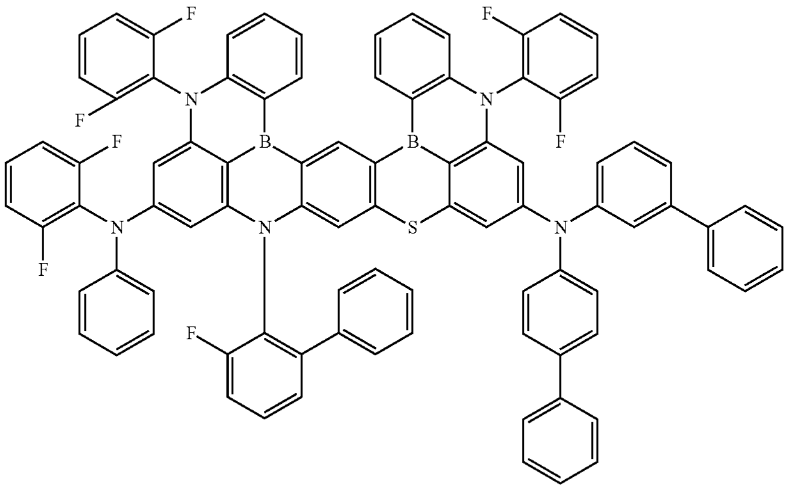

-continued
36
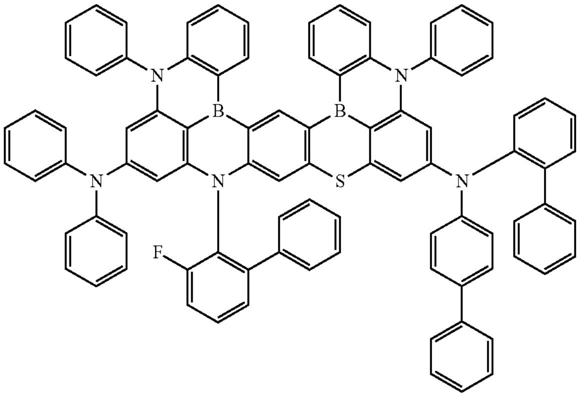
55
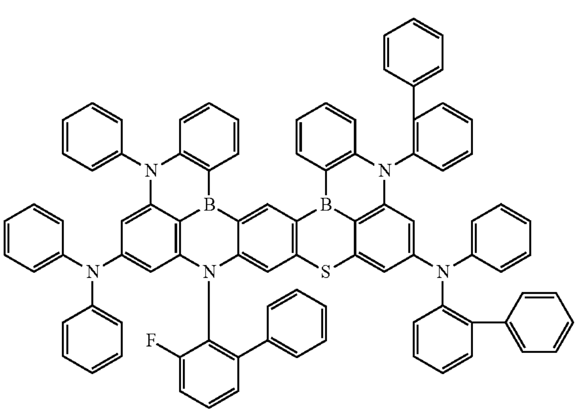
56
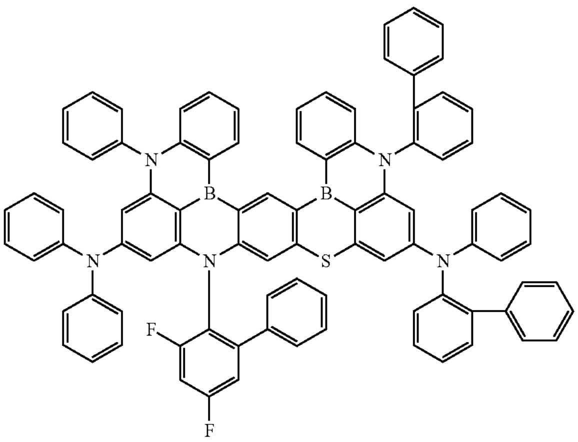
57
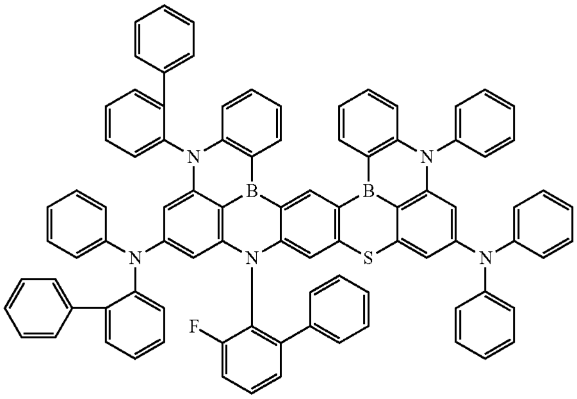
58
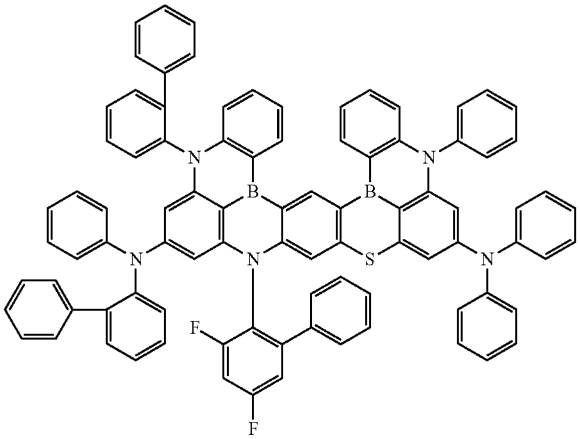

-continued
59
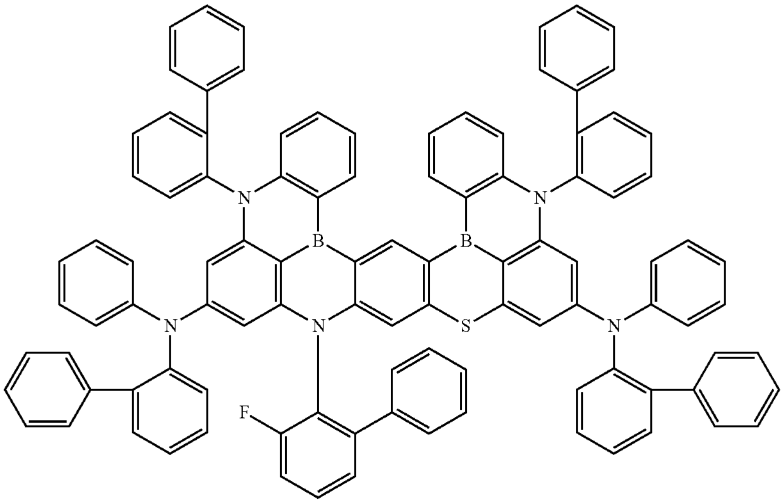
60
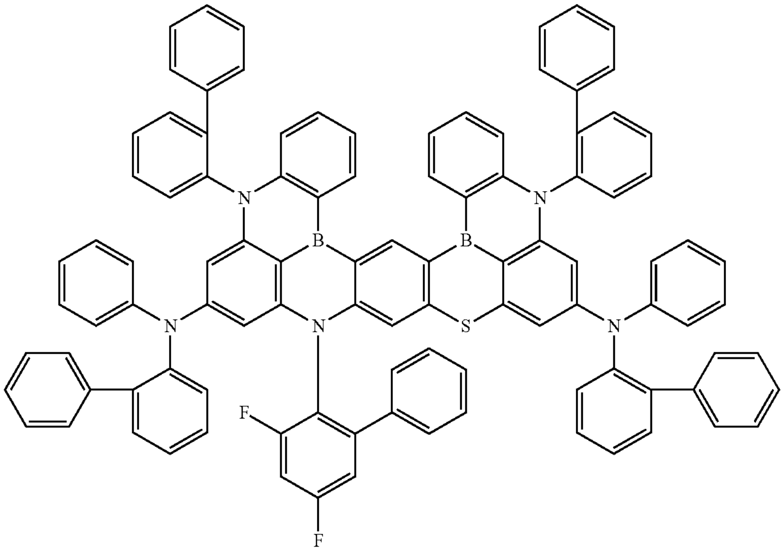
61
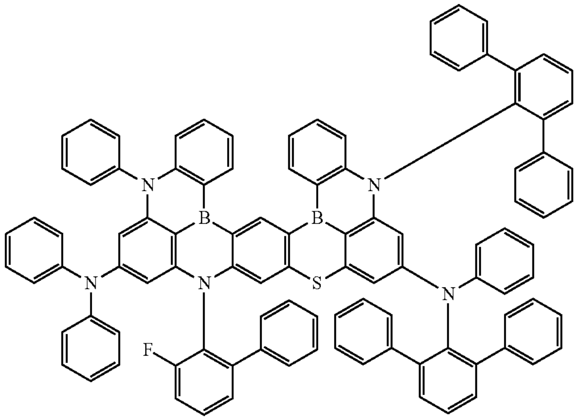
62
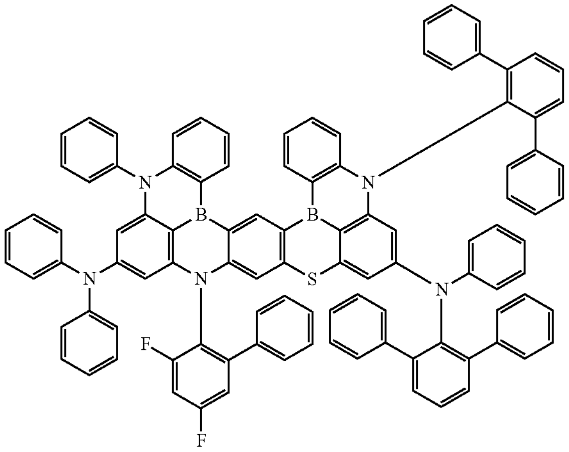

-continued
63
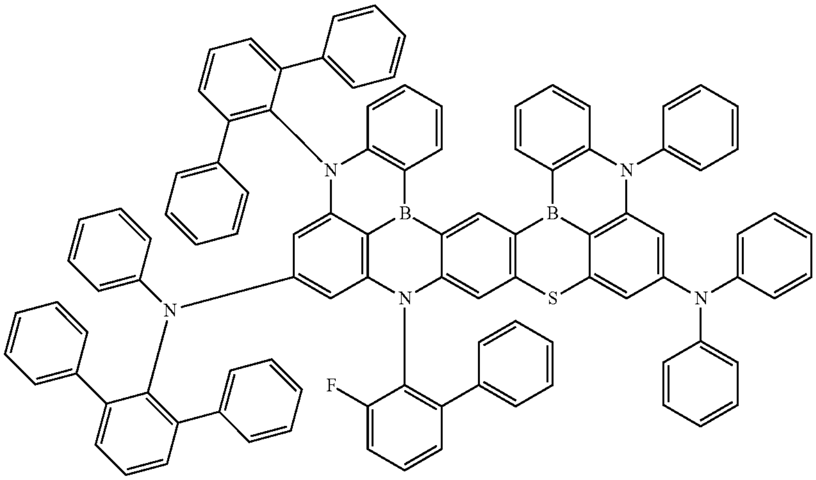
64
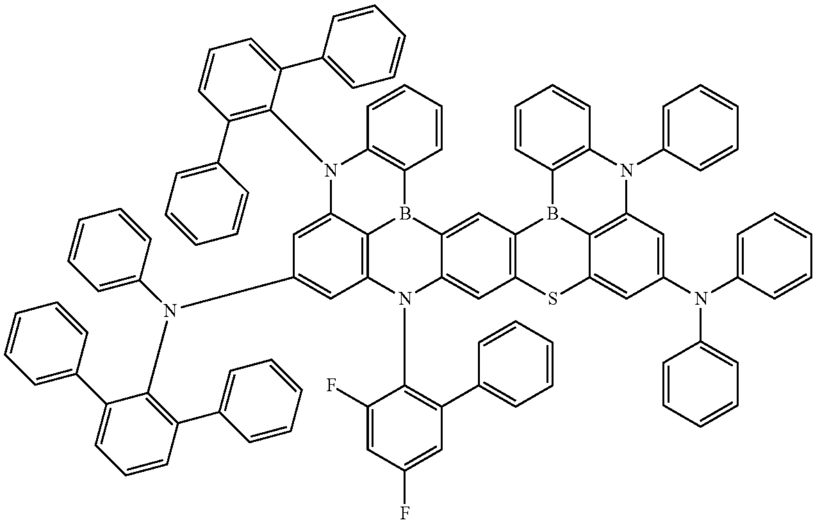
65
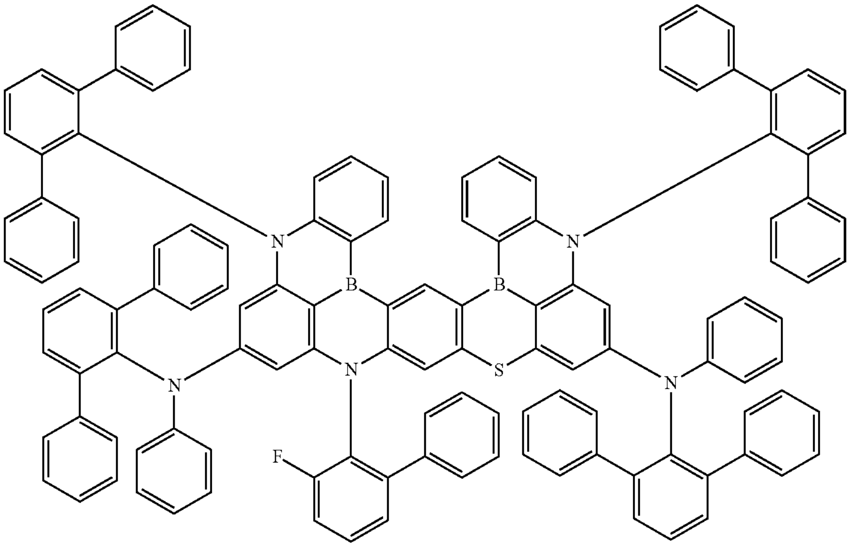

-continued
66
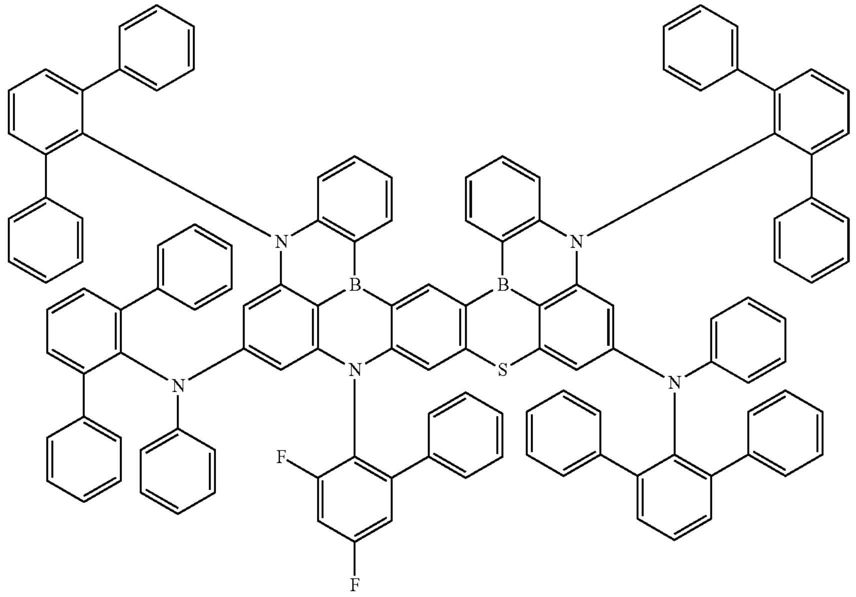
76
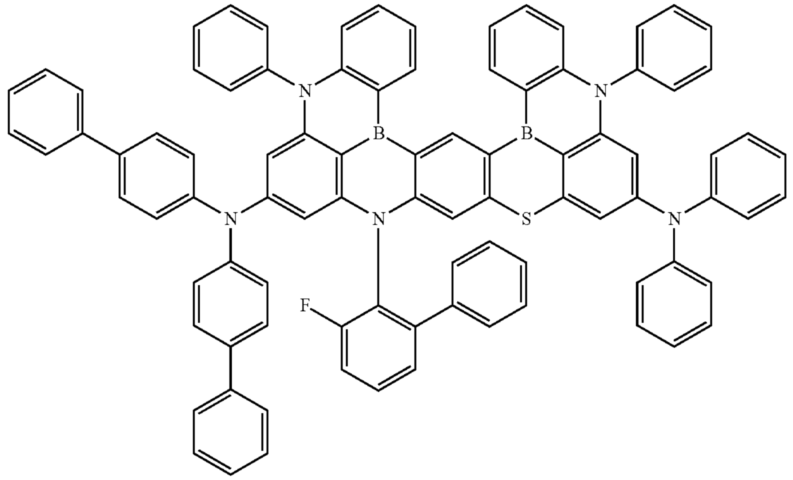
77
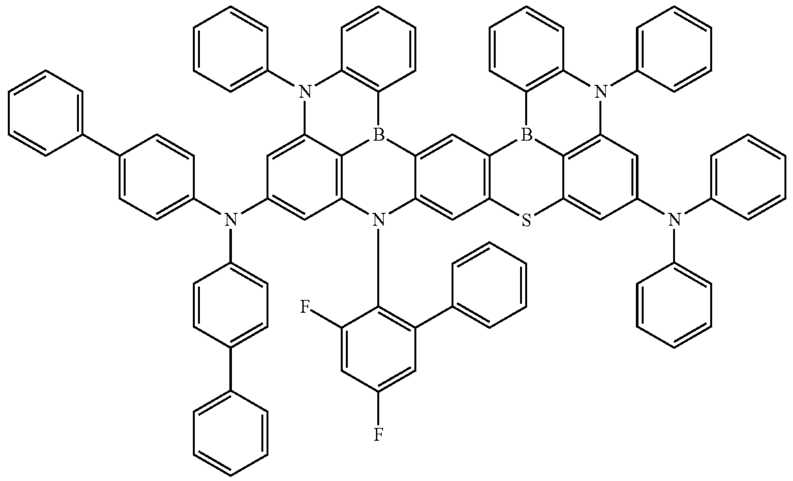

-continued
78
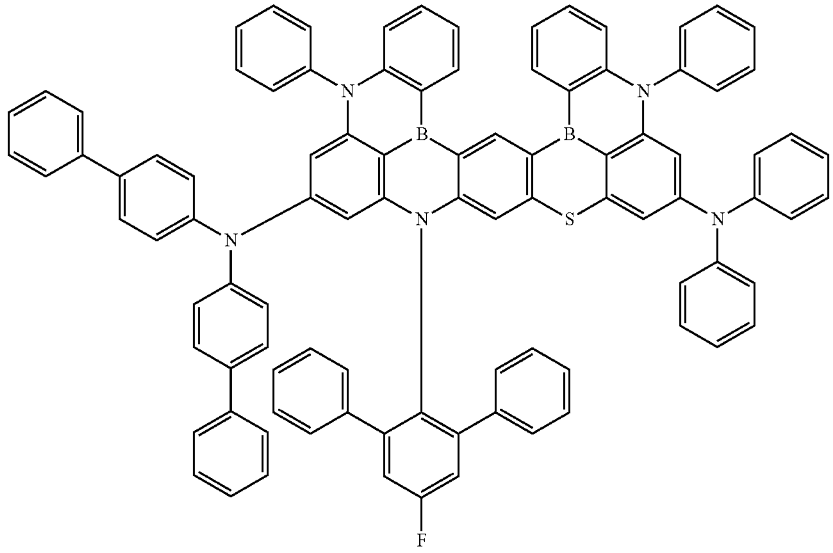
79
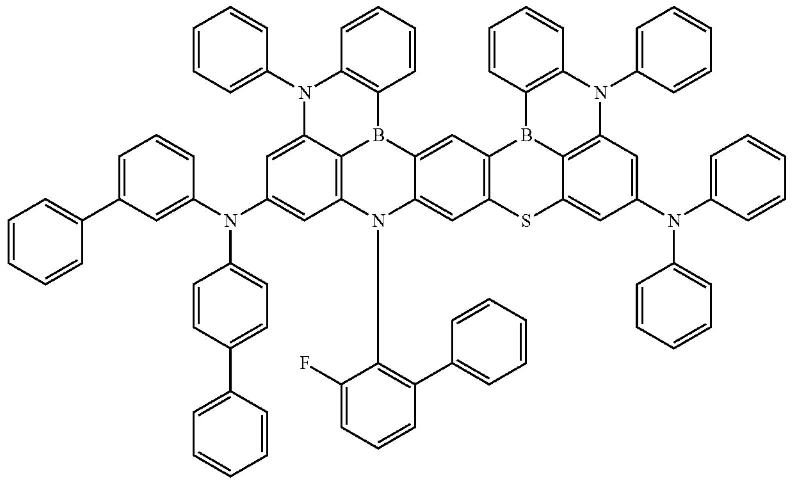
80
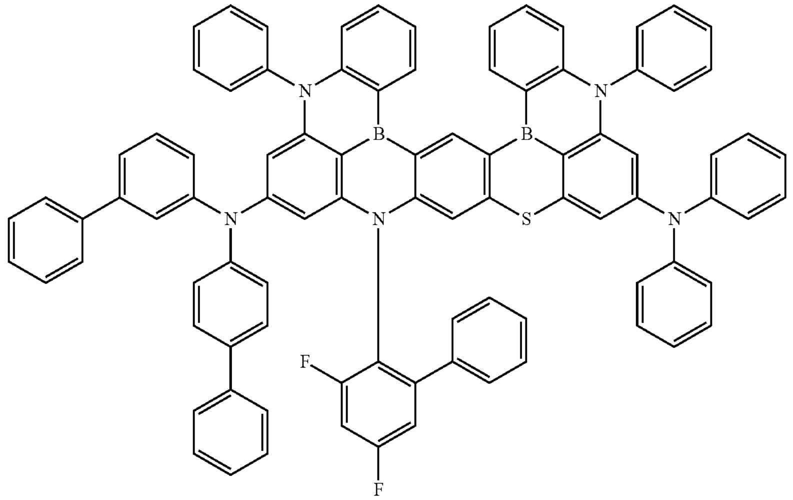

81
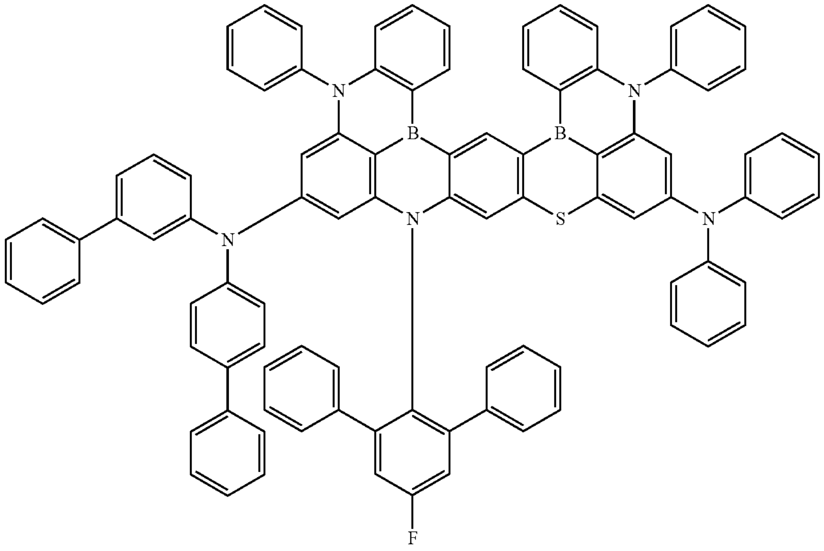
82
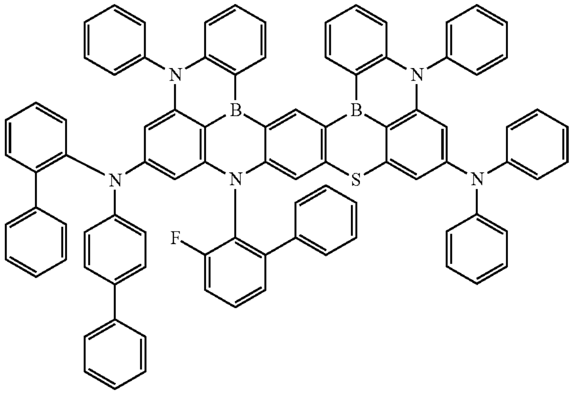
83
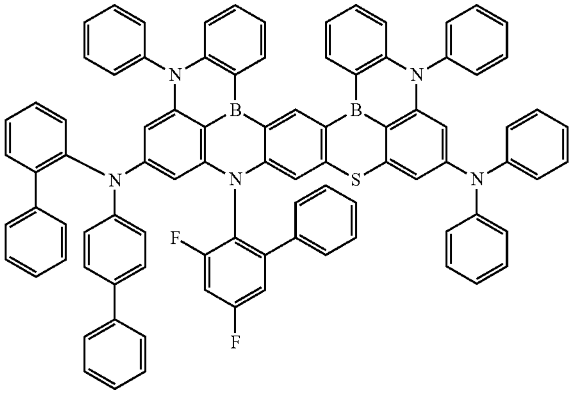
84
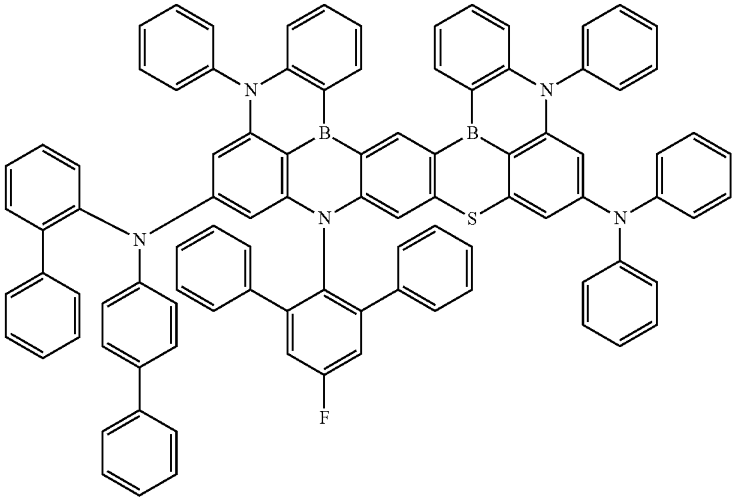

-continued
94
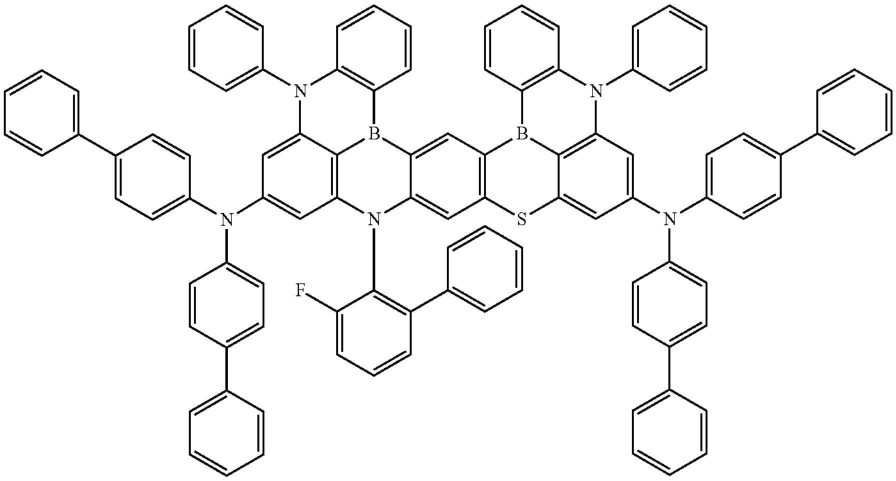
95
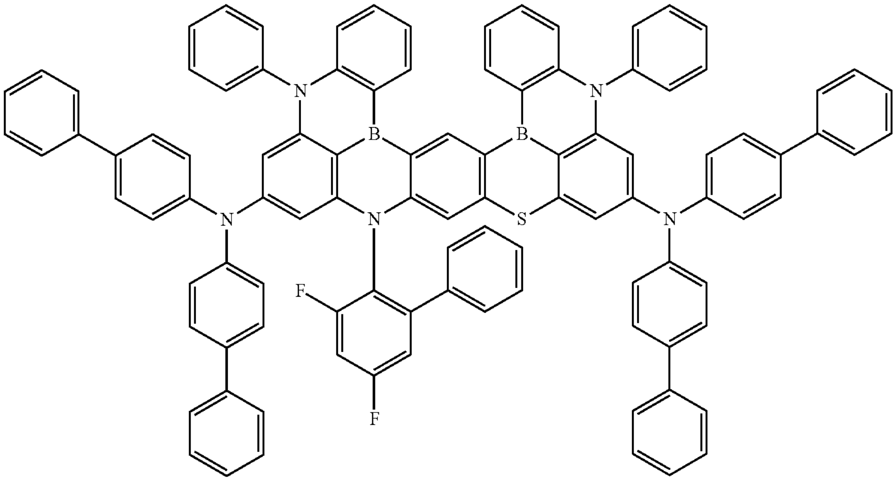
96
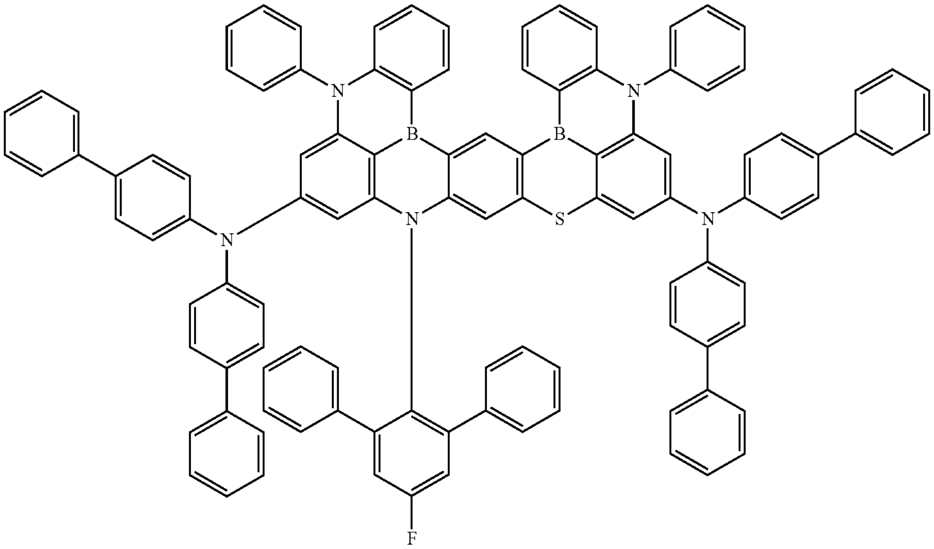

-continued
97
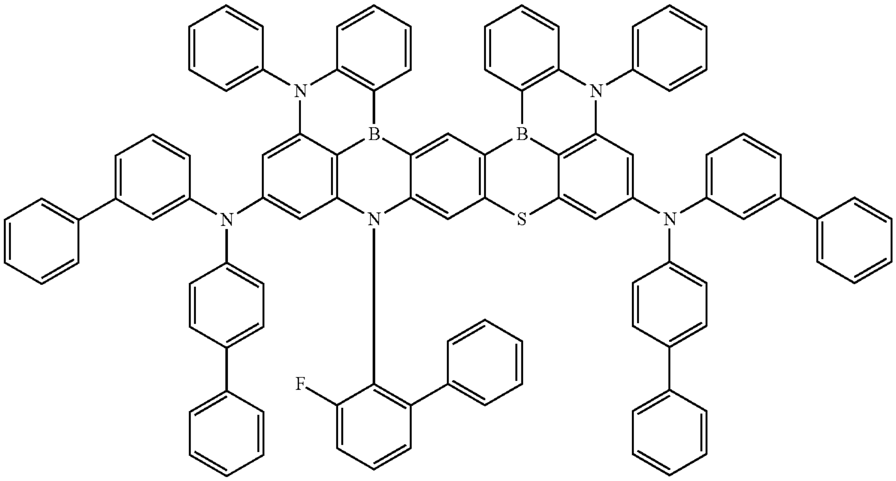
98
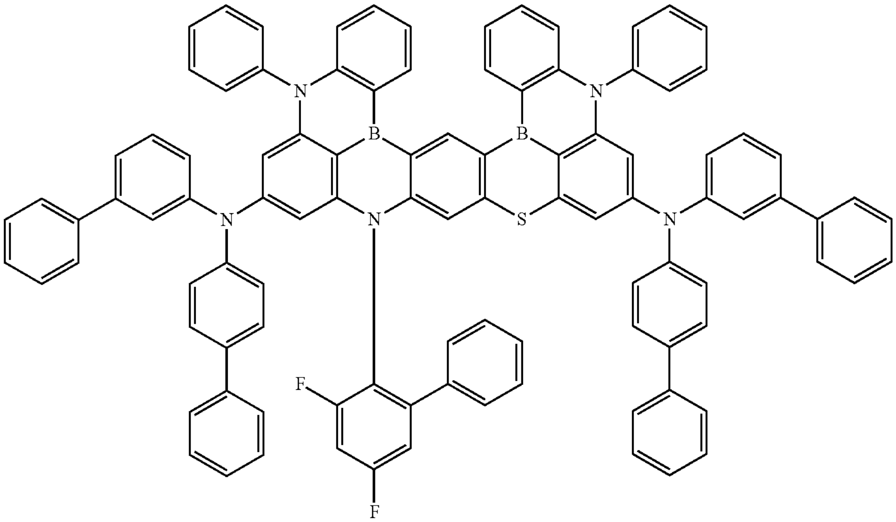
99
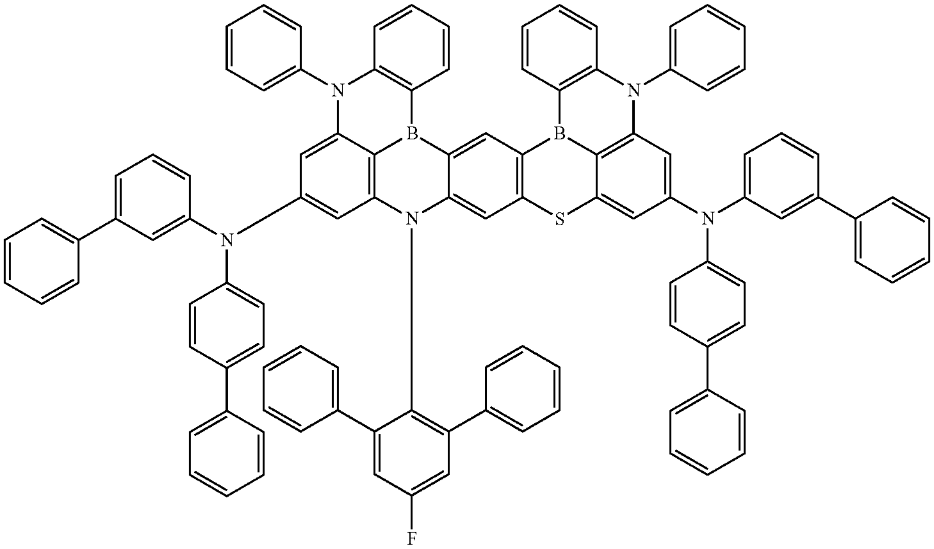

-continued
100
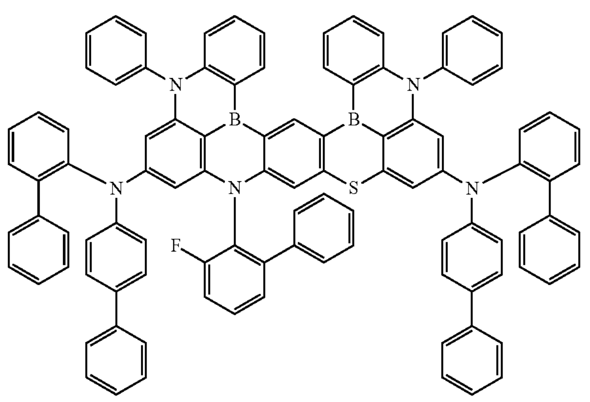
101
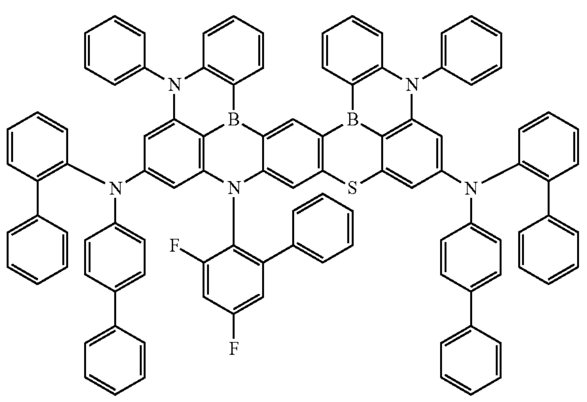
102
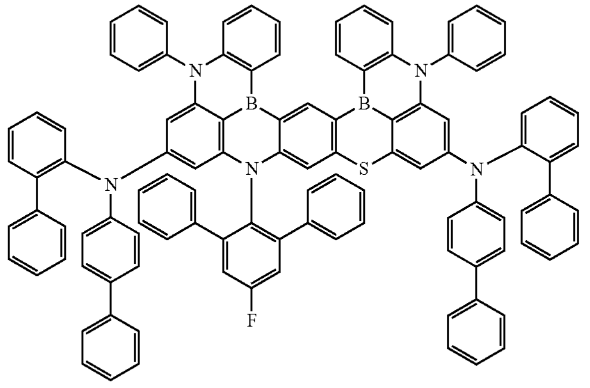
112
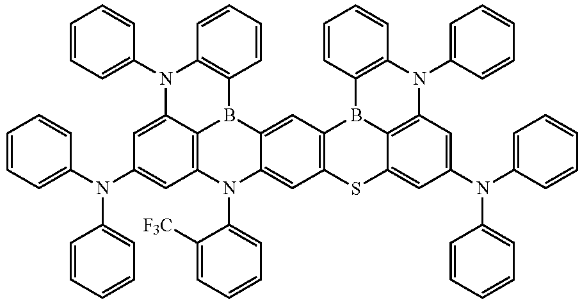
113
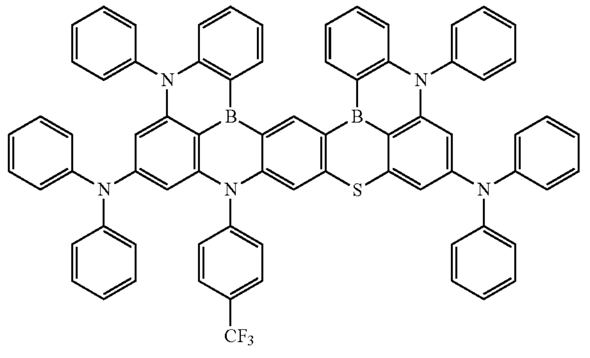
114
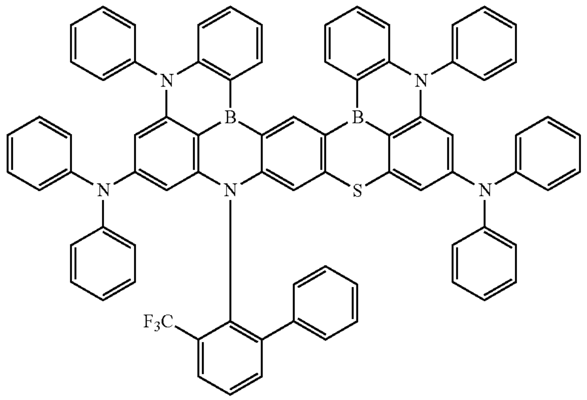

-continued
115
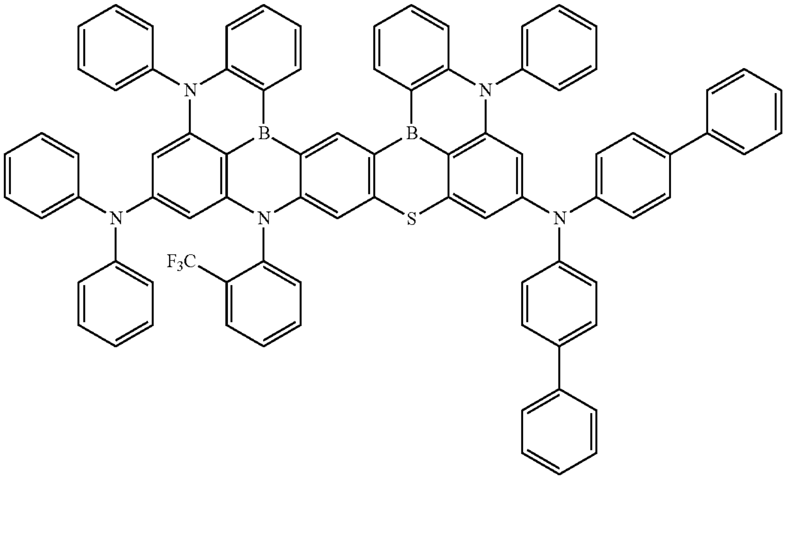
116
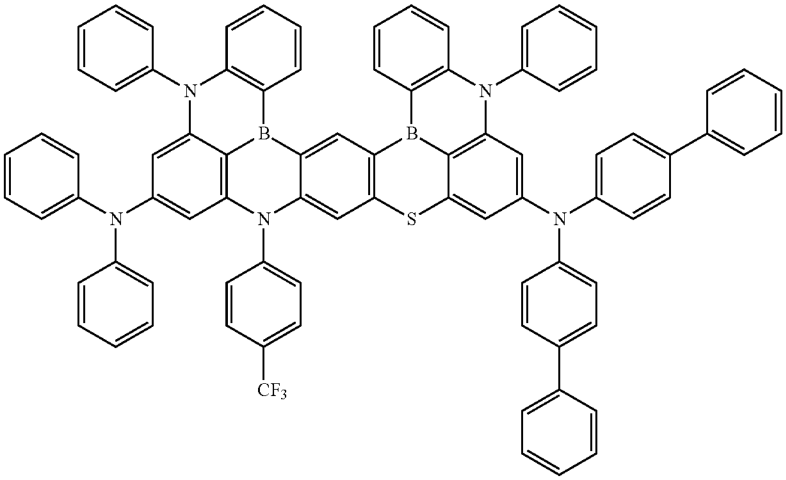
117
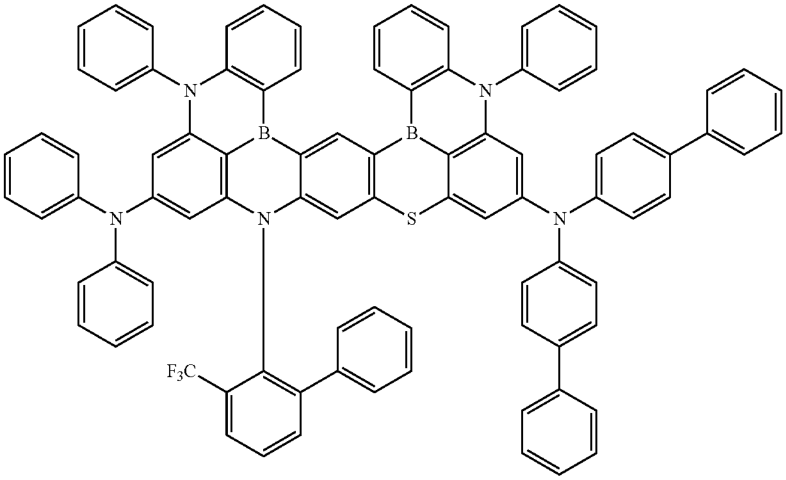

-continued
118
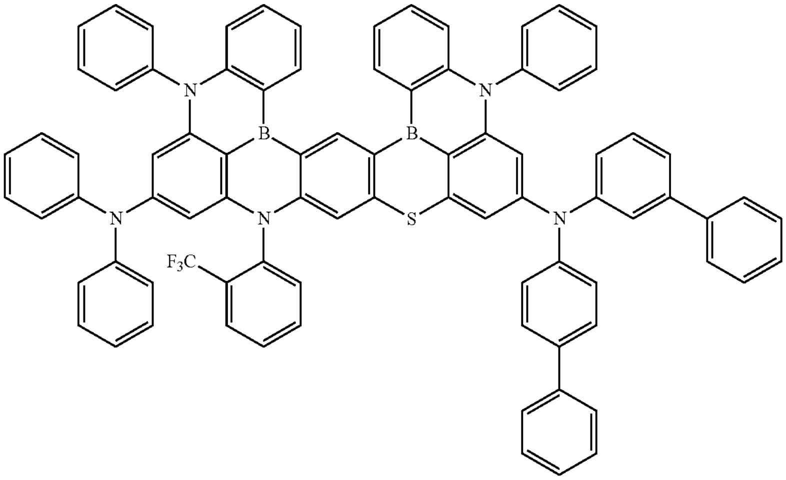
119
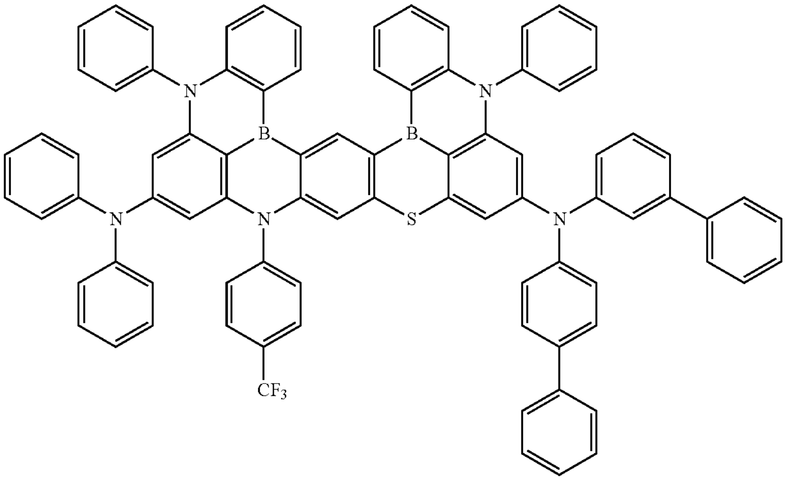
120
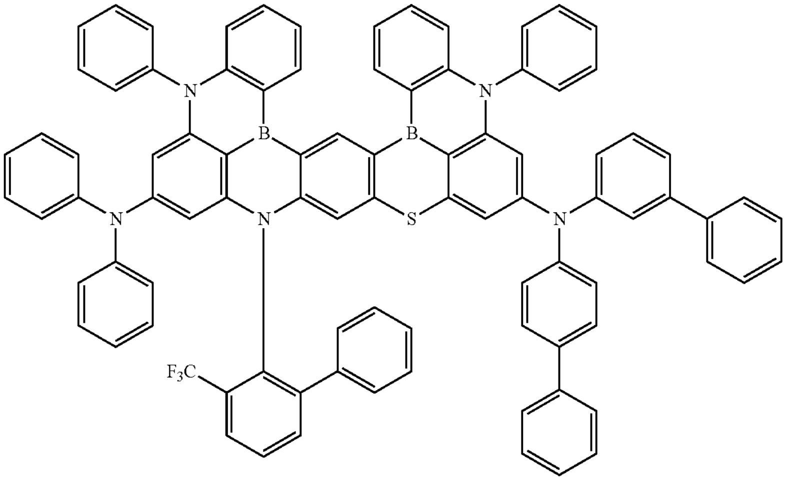

-continued
121
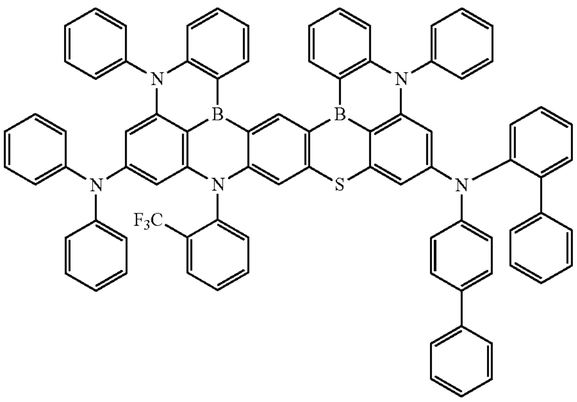
122
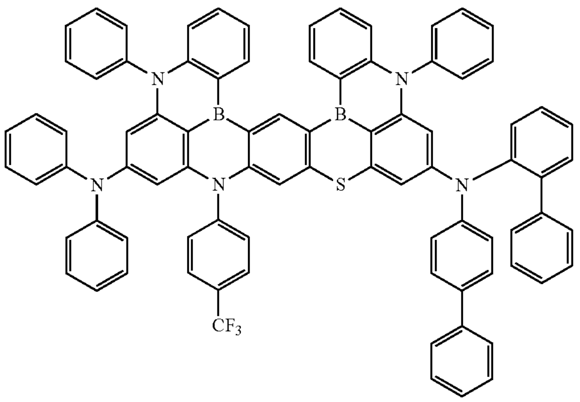
123
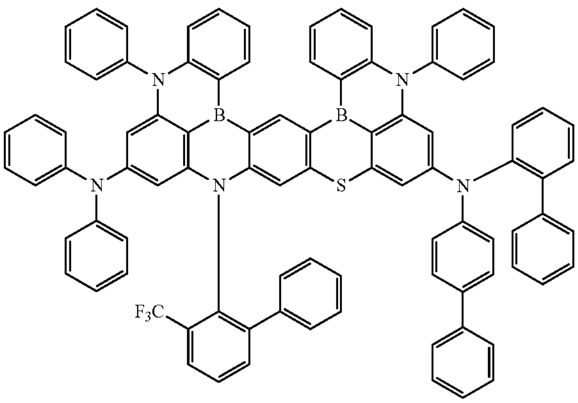
124
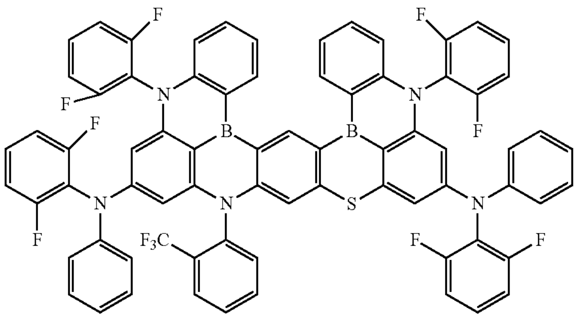
125
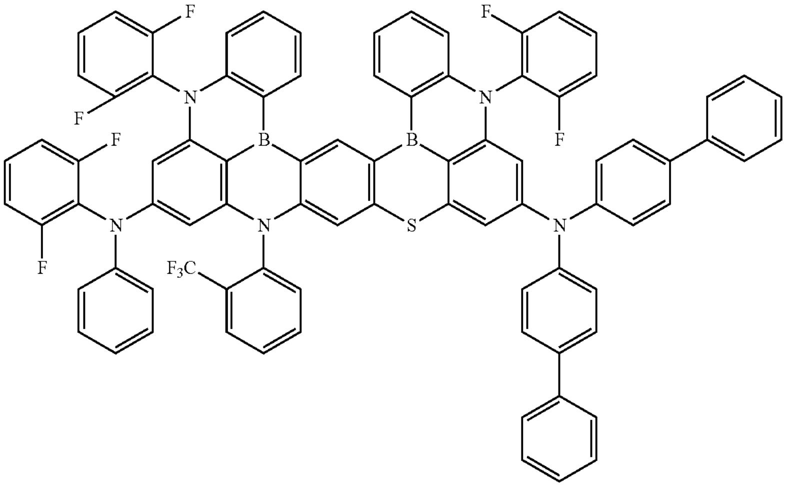

-continued
126
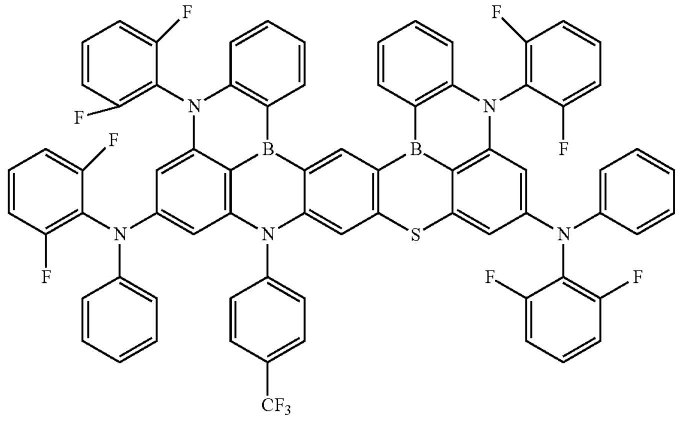
127
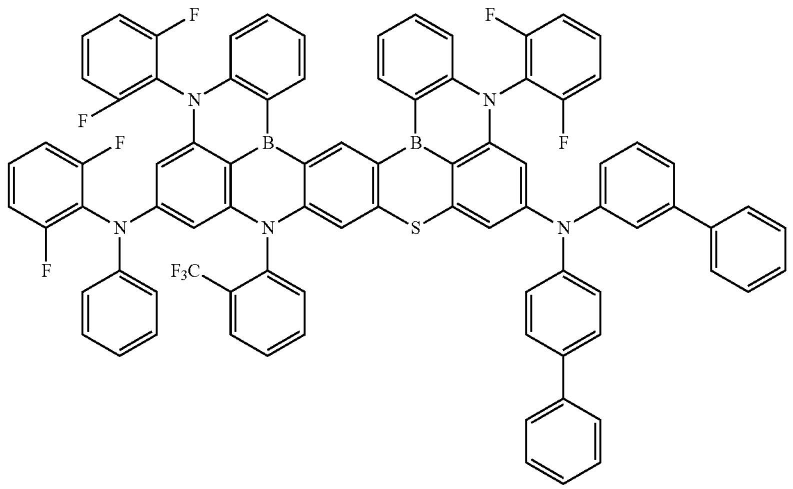
128
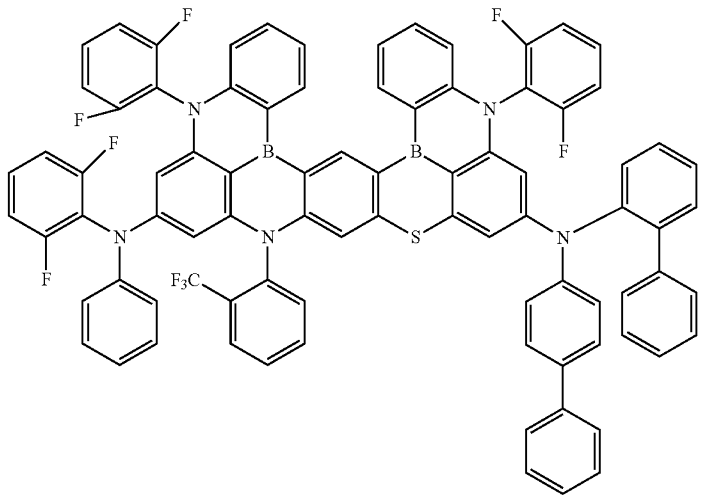

-continued
129
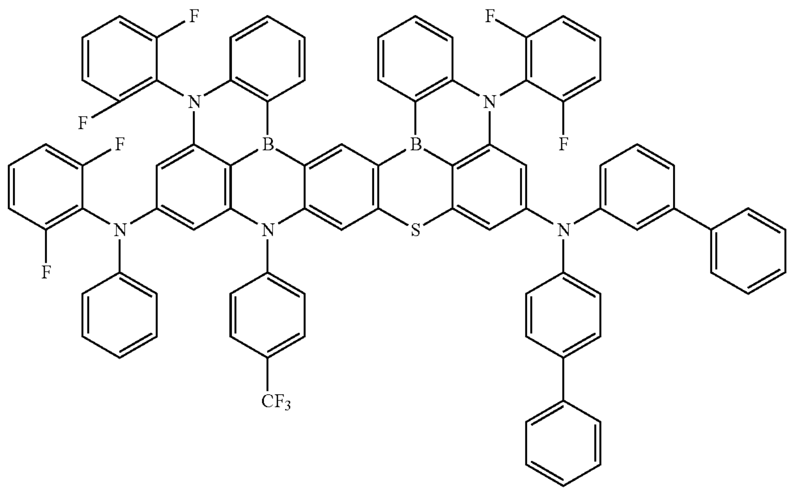
130
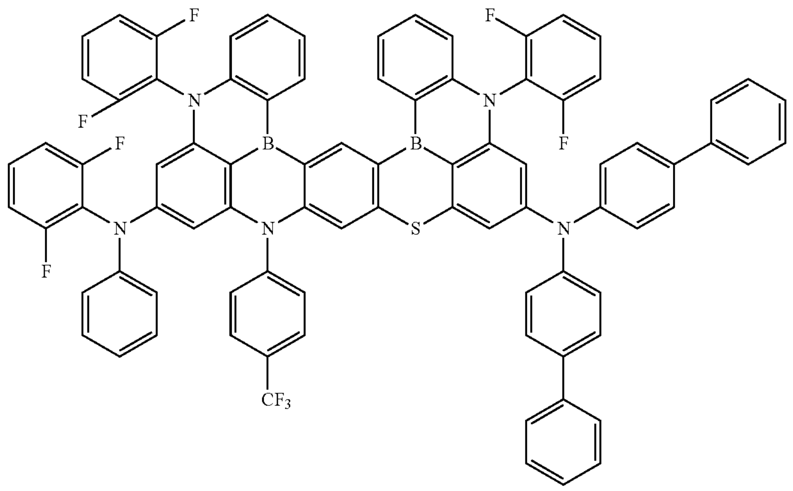
131
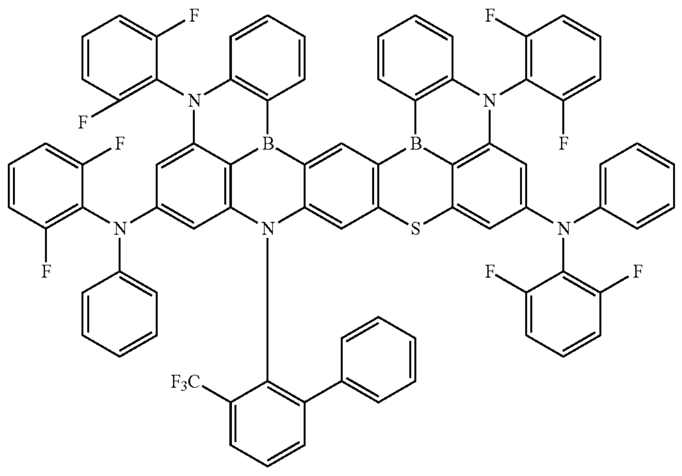

-continued
132
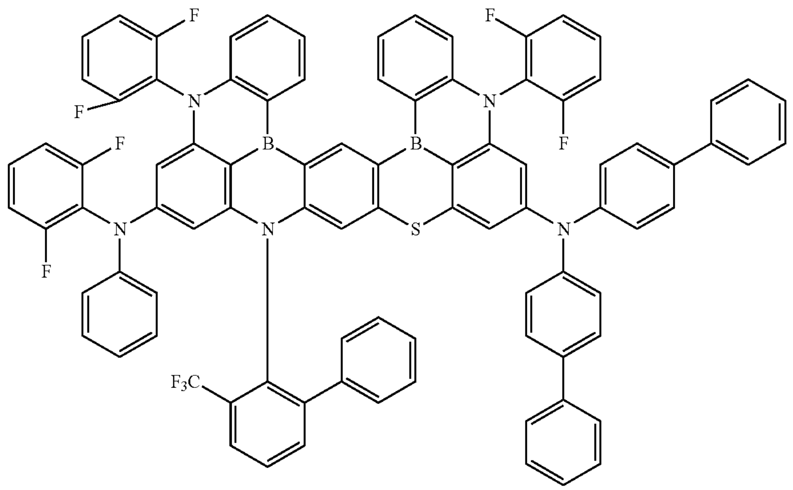
133
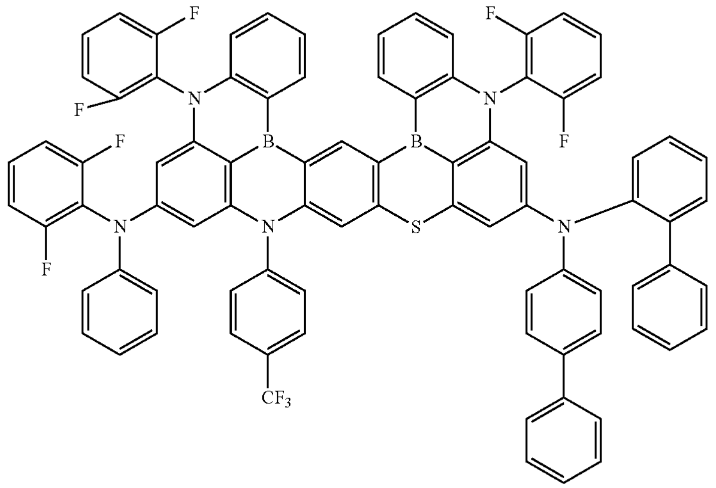
134
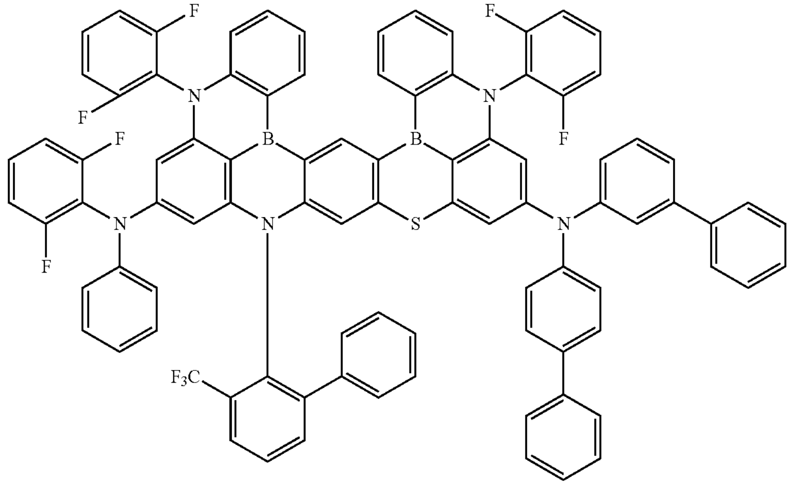

-continued
135
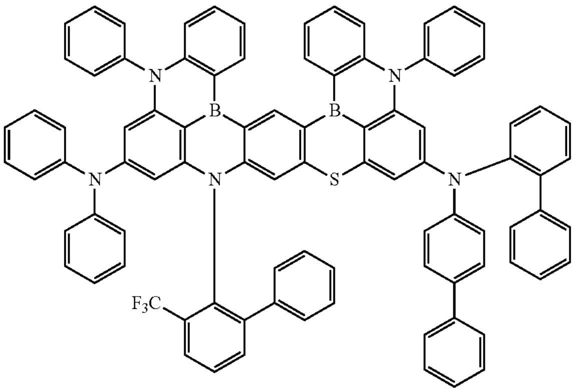
136
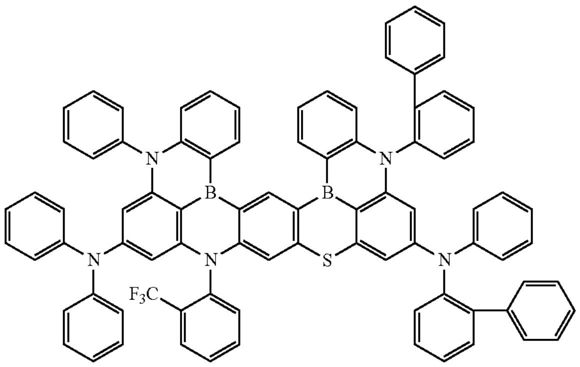
137
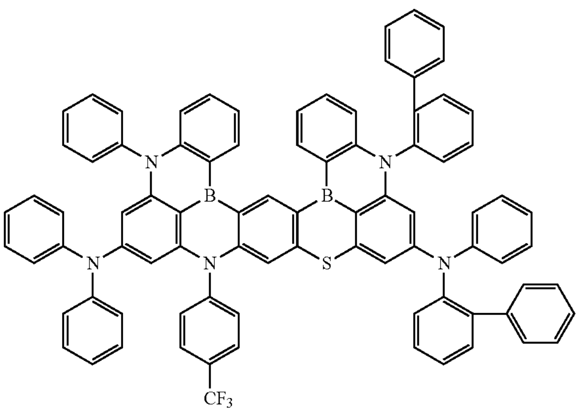
138
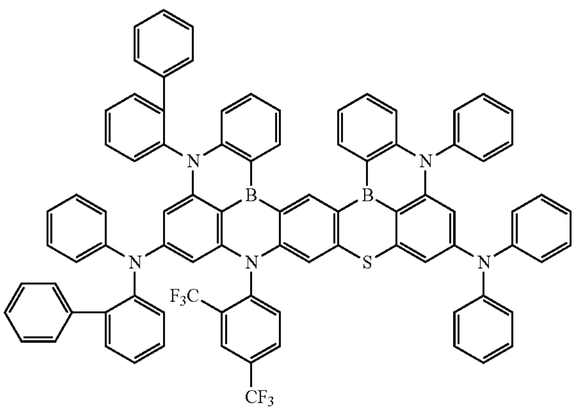
139
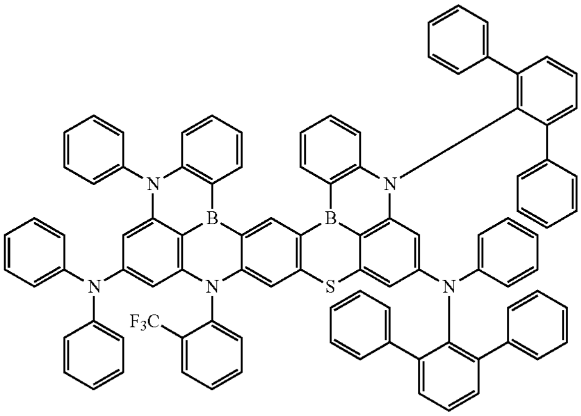
140
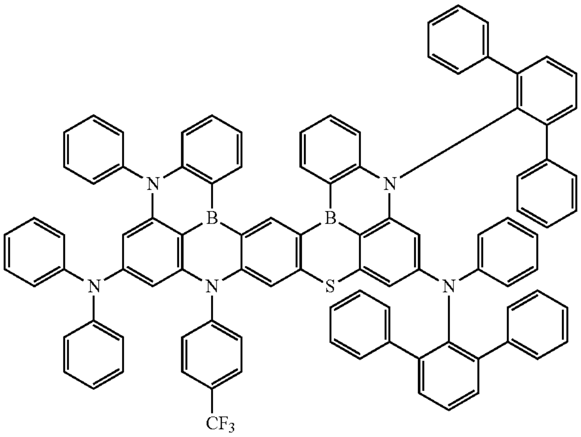

-continued
141
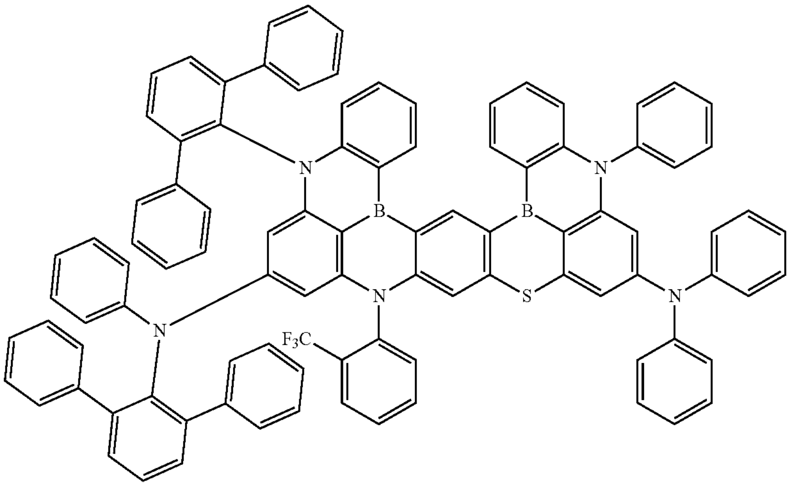
142
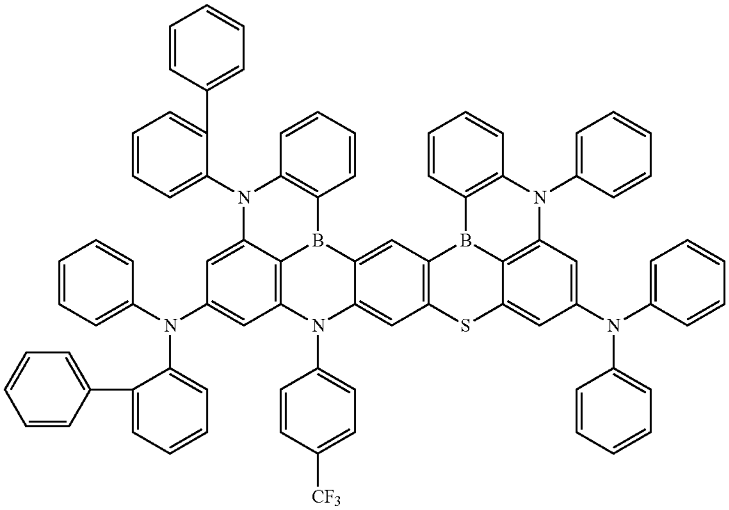

-continued
143
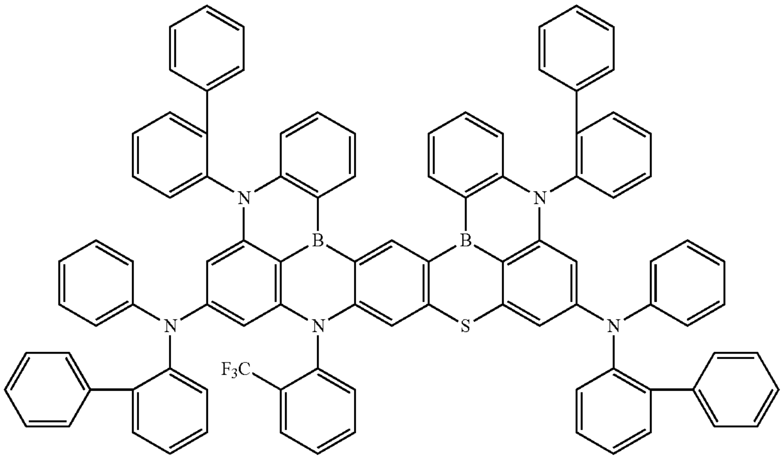
144
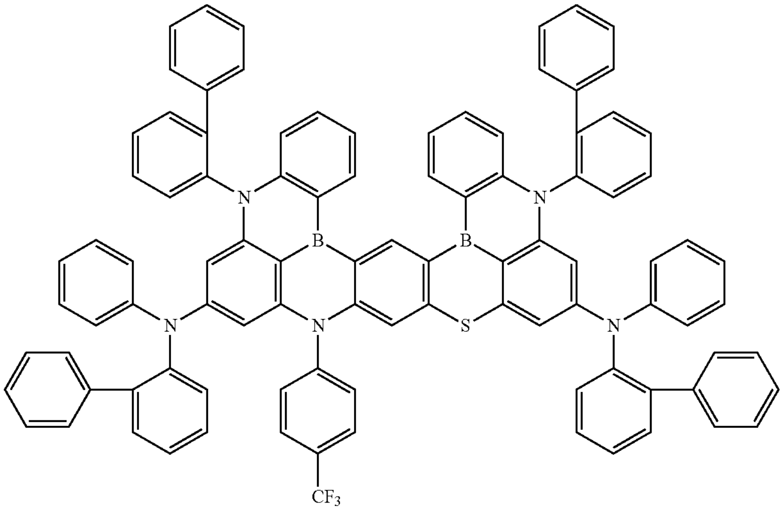
145
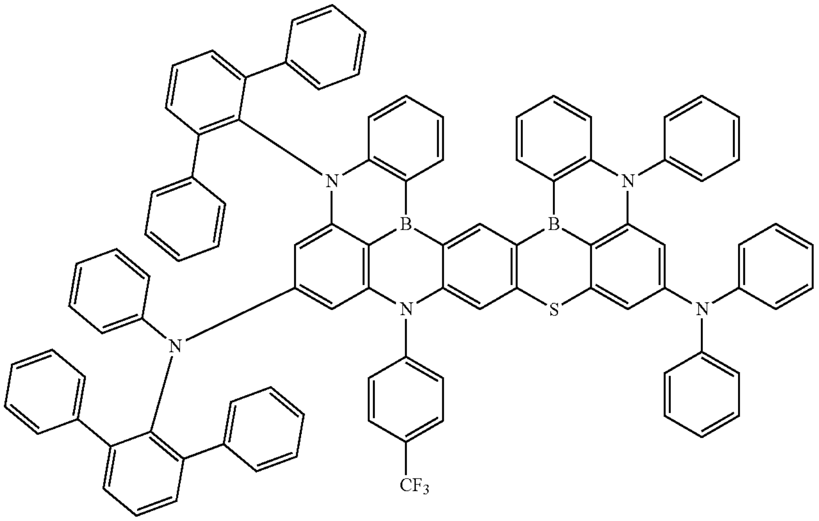

-continued
146
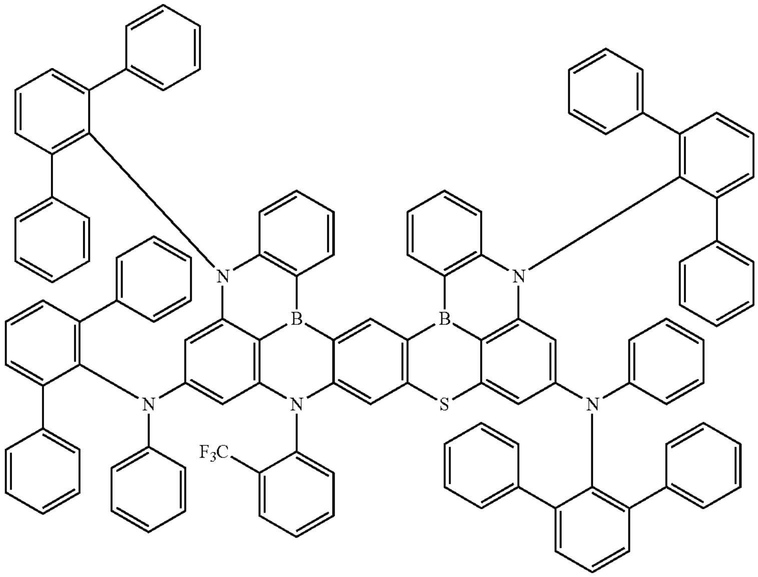
147
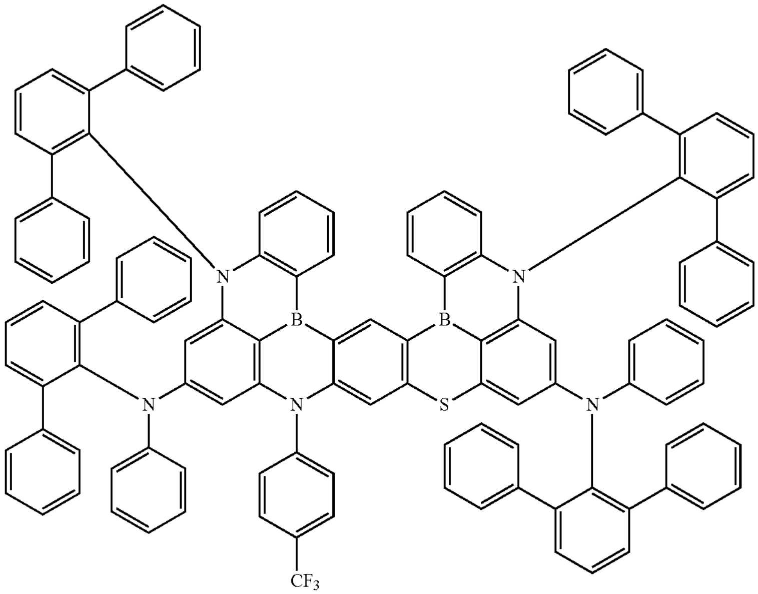
148
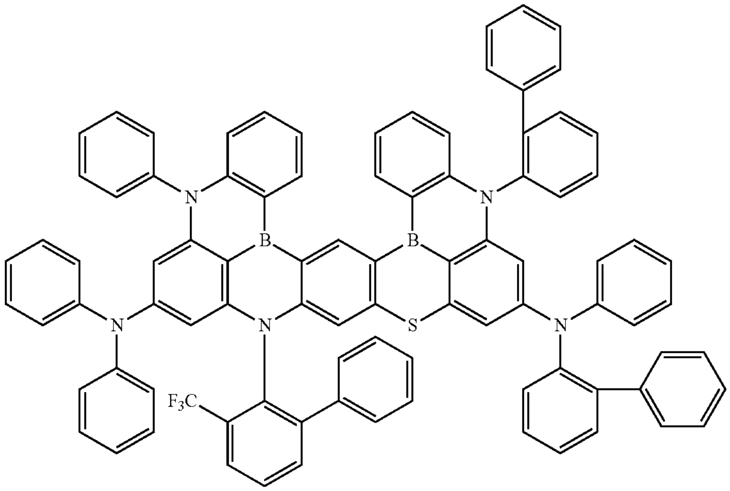

-continued
149
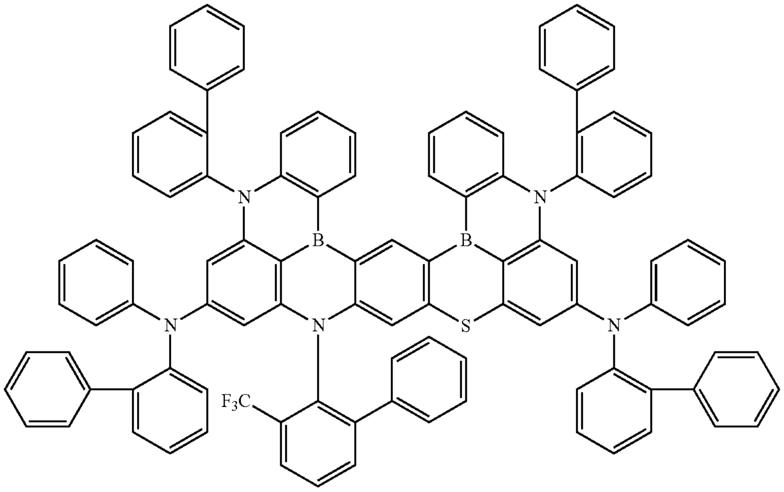
150
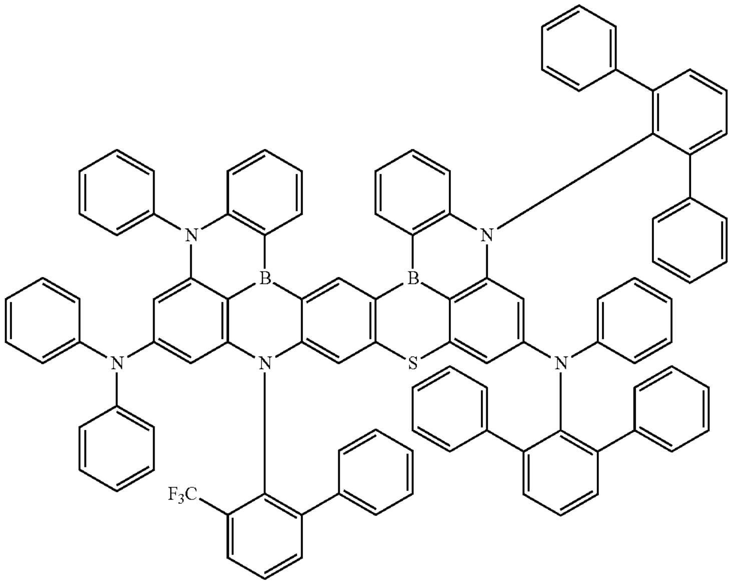

-continued
151
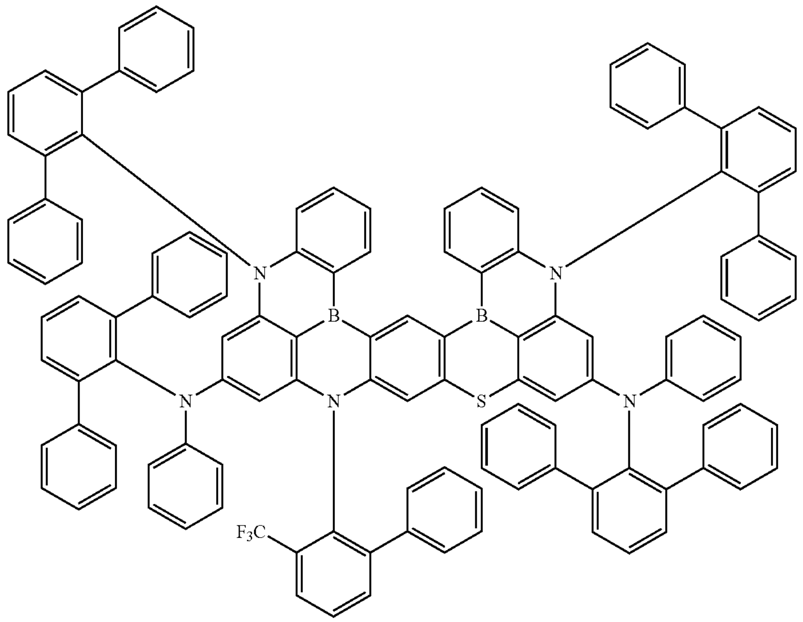
152
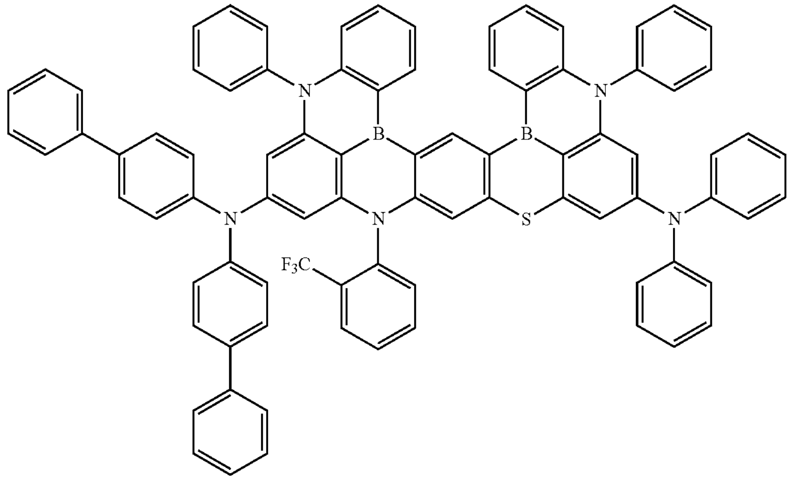
153
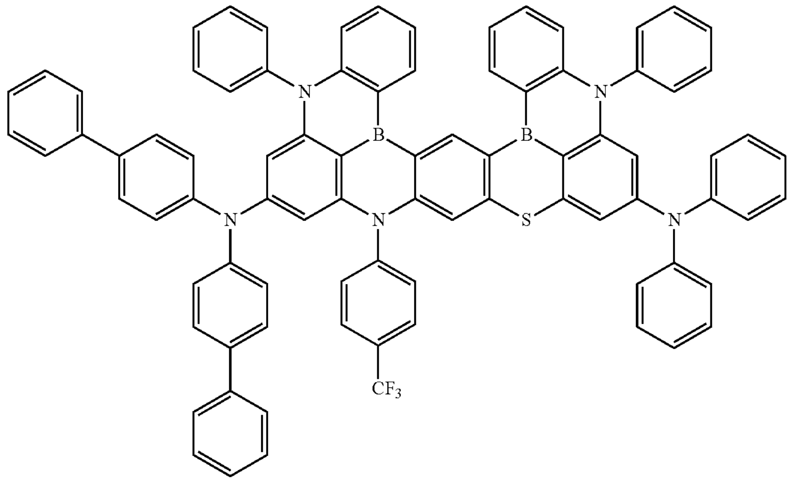

-continued
154
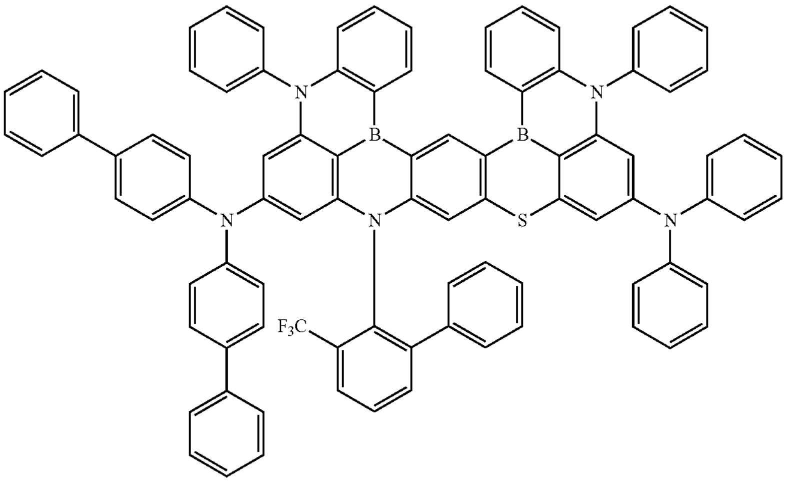
155
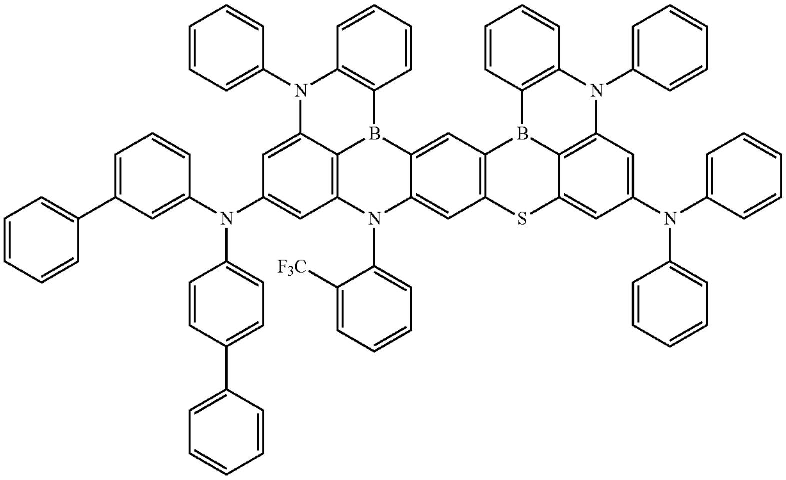
156
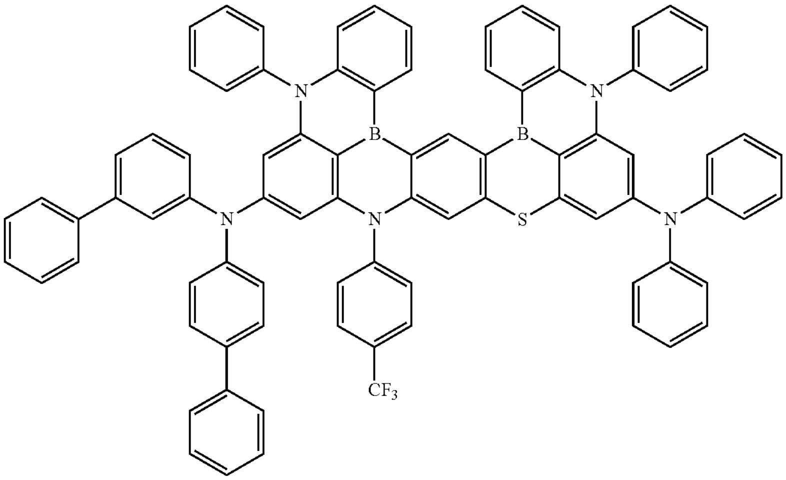

-continued
157
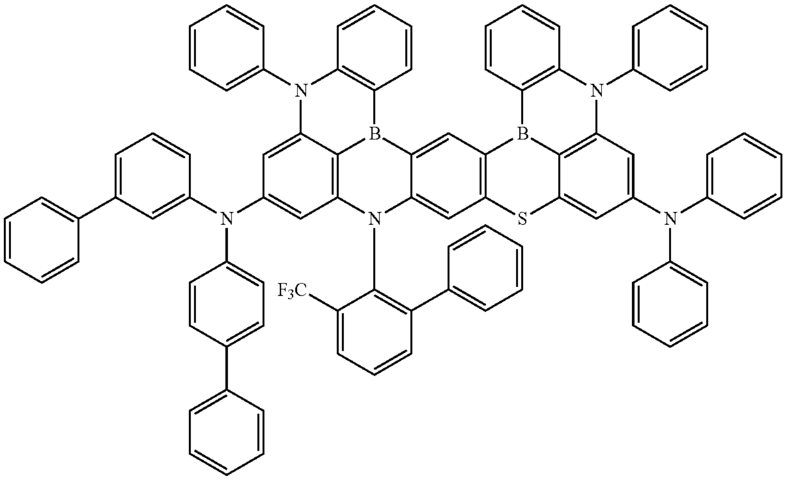
158
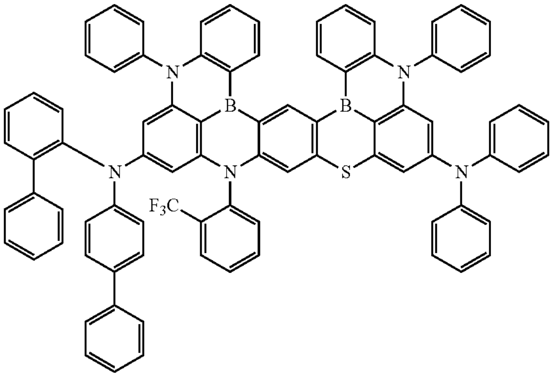
159
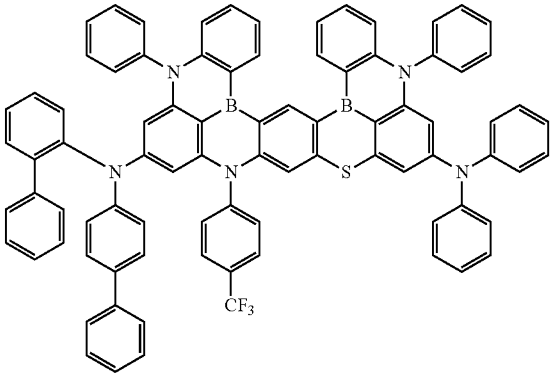
160
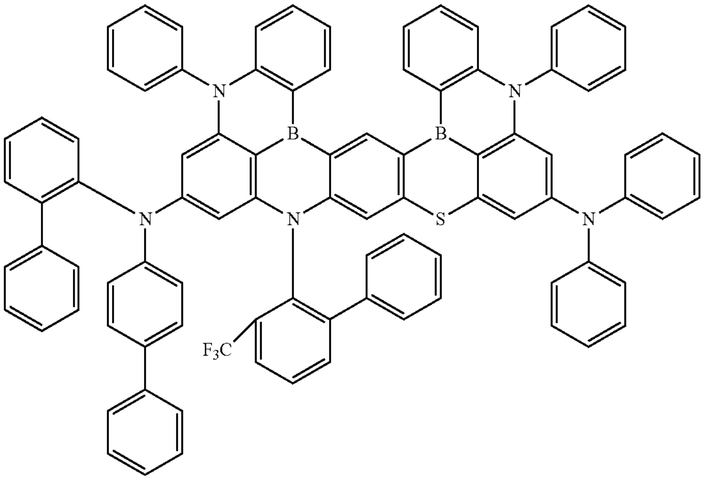

-continued
161
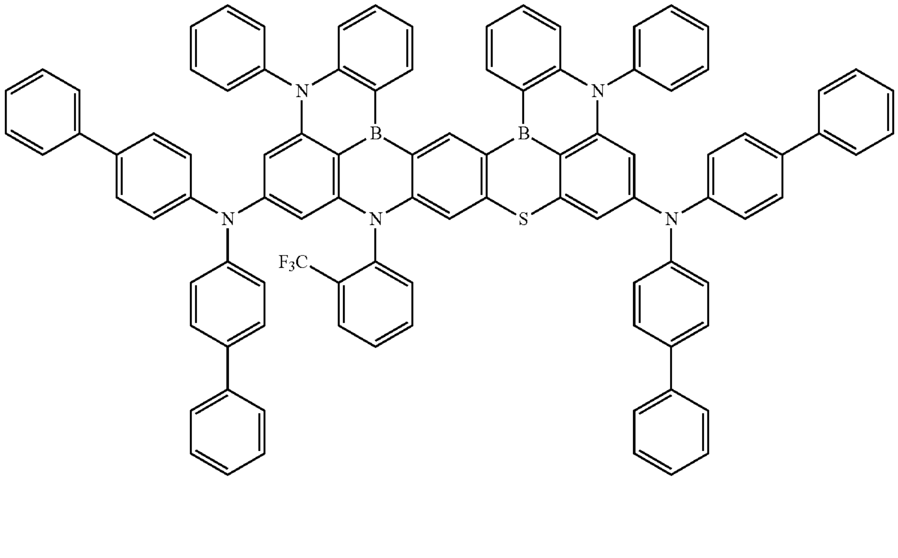
162
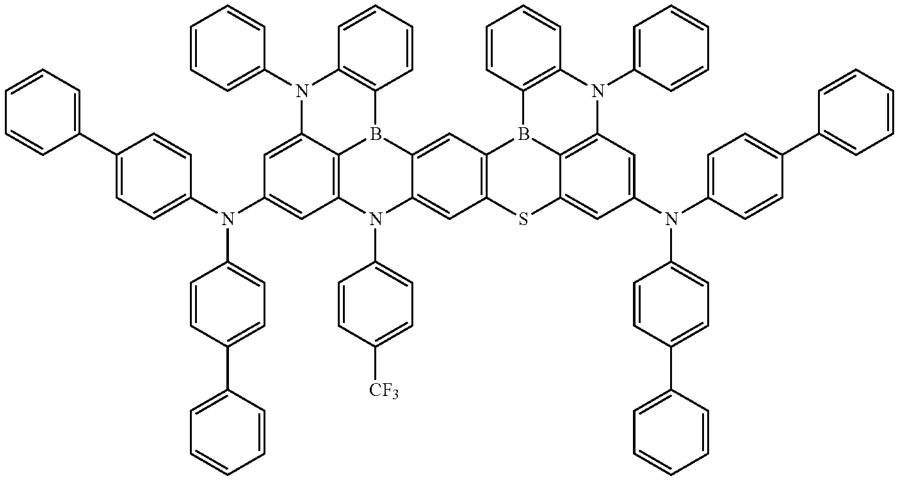
163
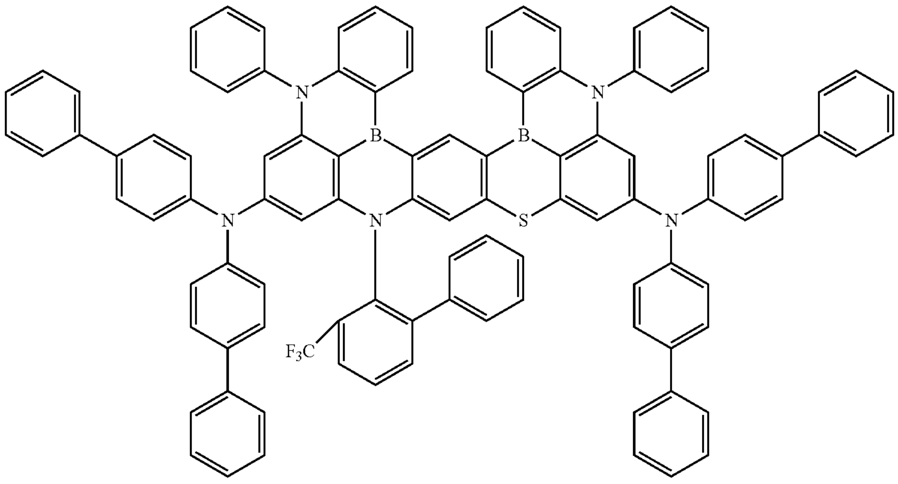

-continued
164
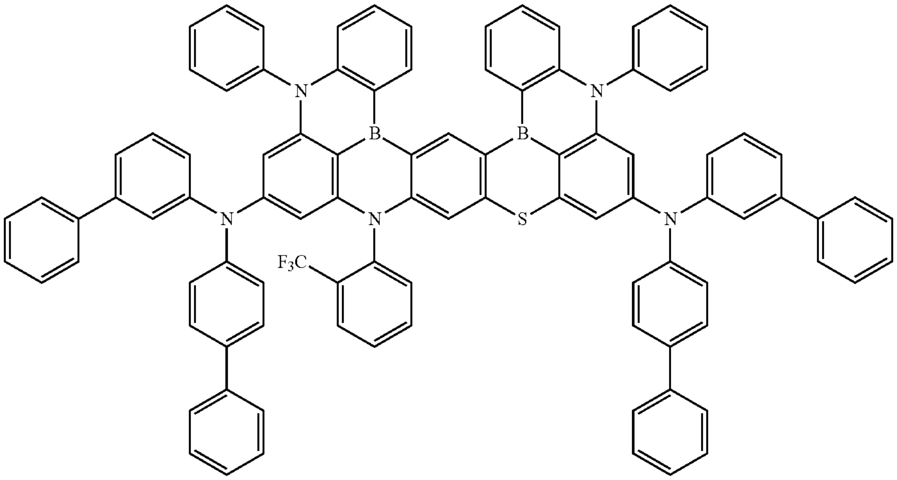
165
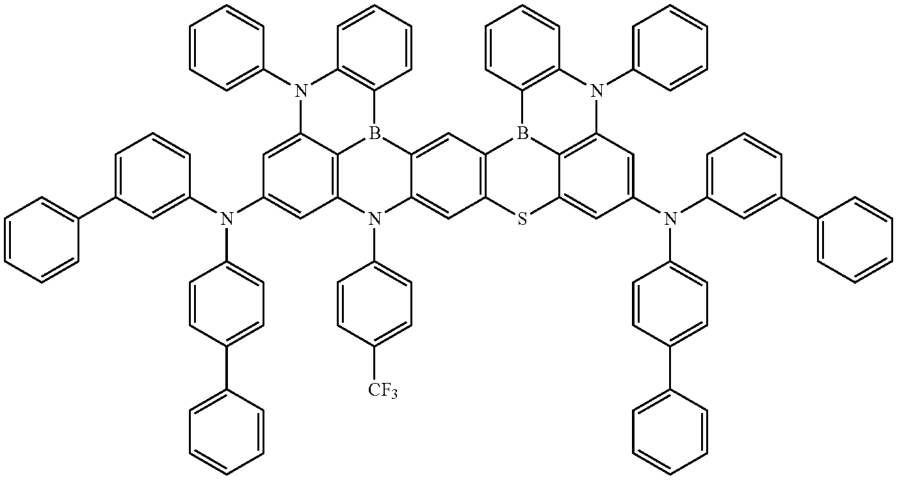
166
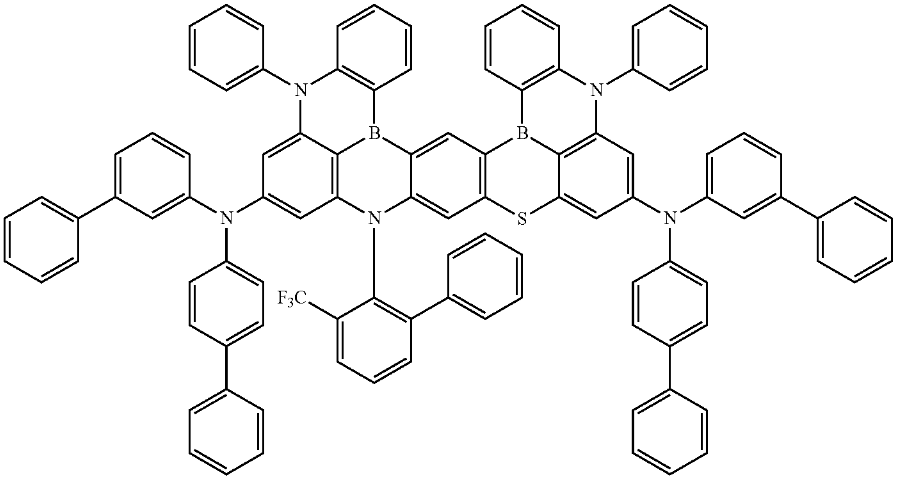

-continued
167
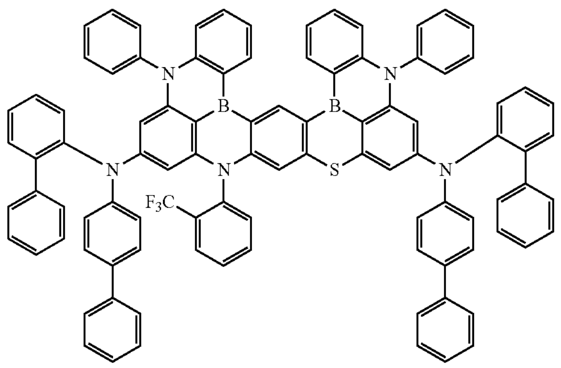
168
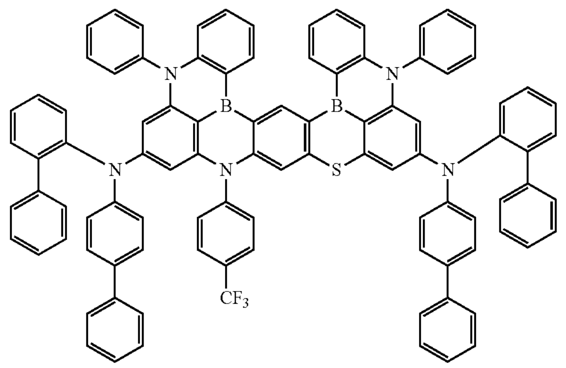
169
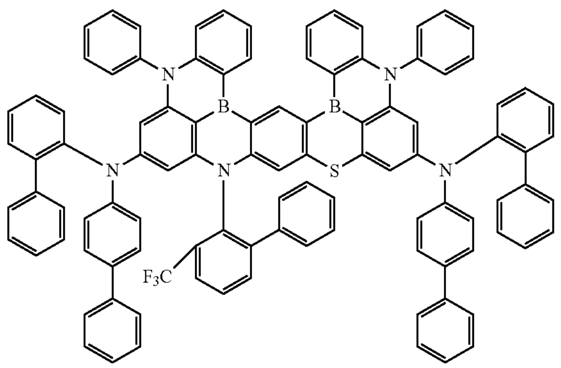
173
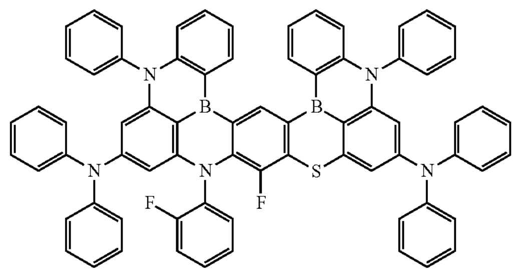
175
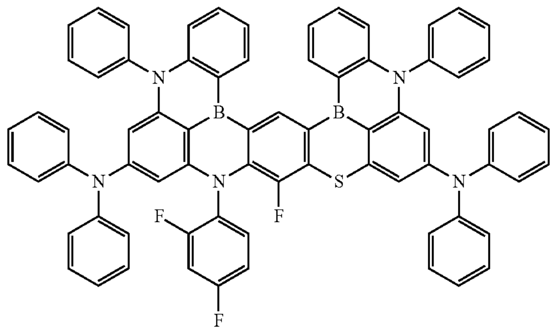
176
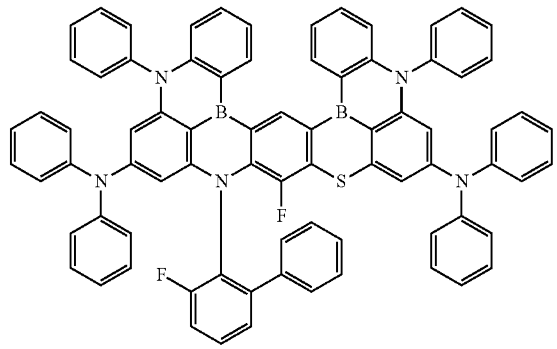
177
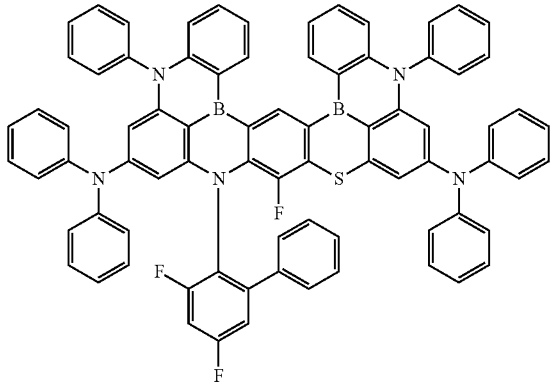
178
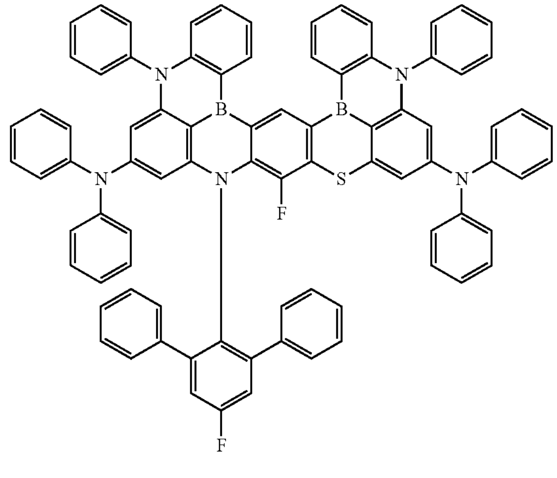

-continued
179
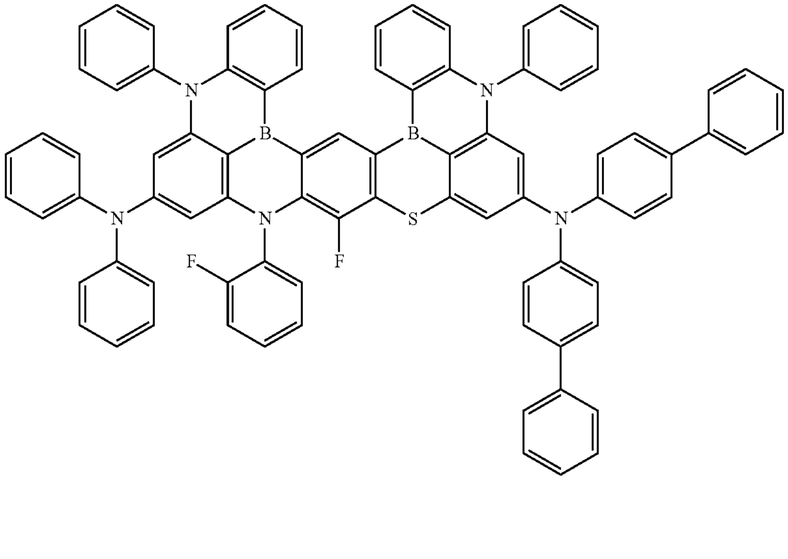
182
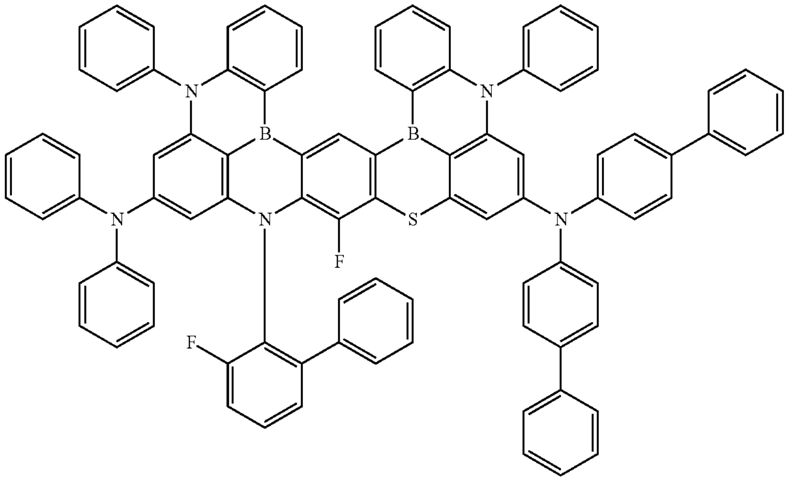
183
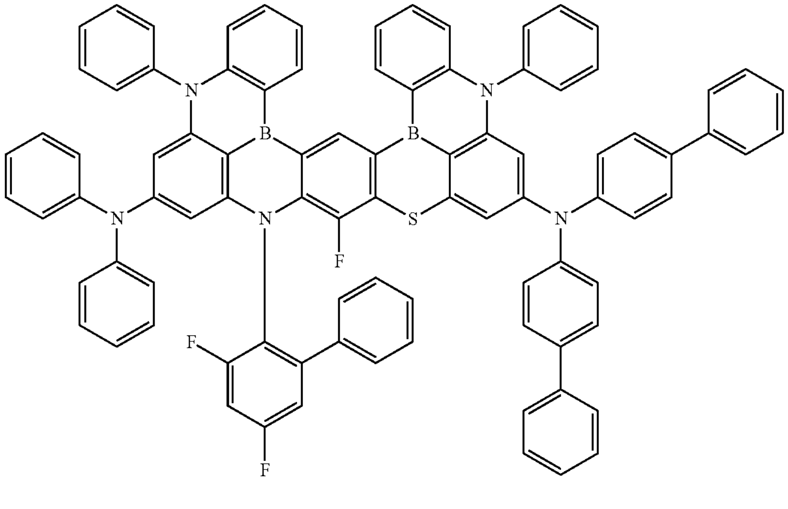

-continued
184
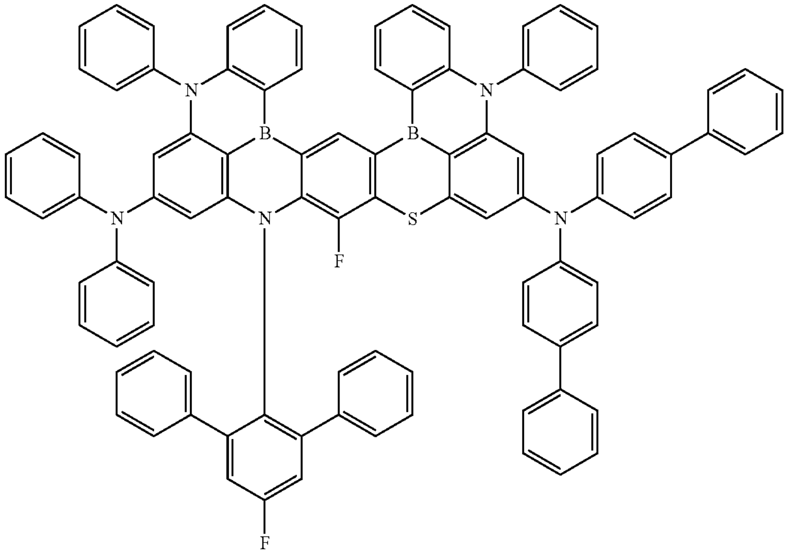
185
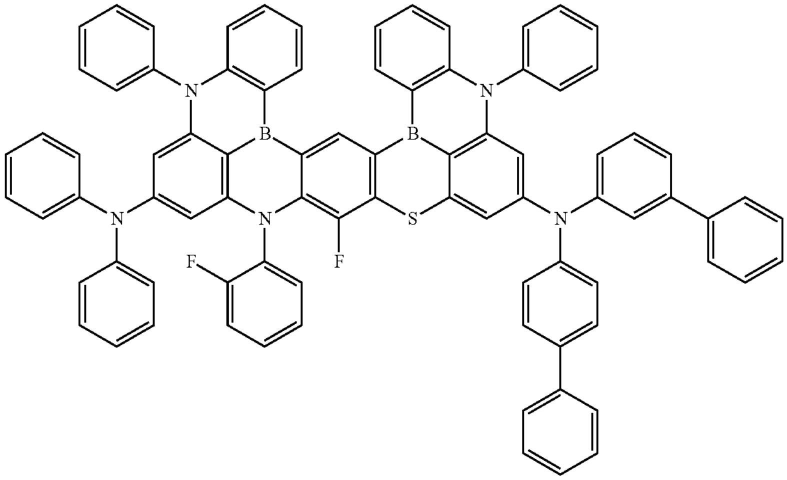
188
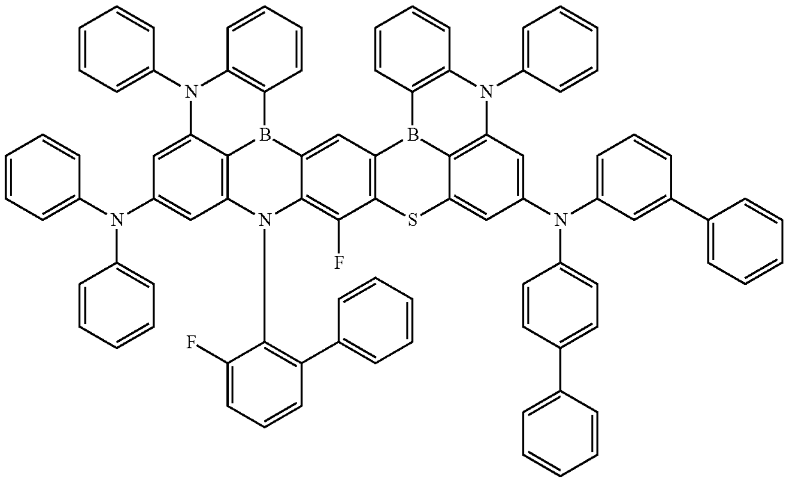

-continued
189
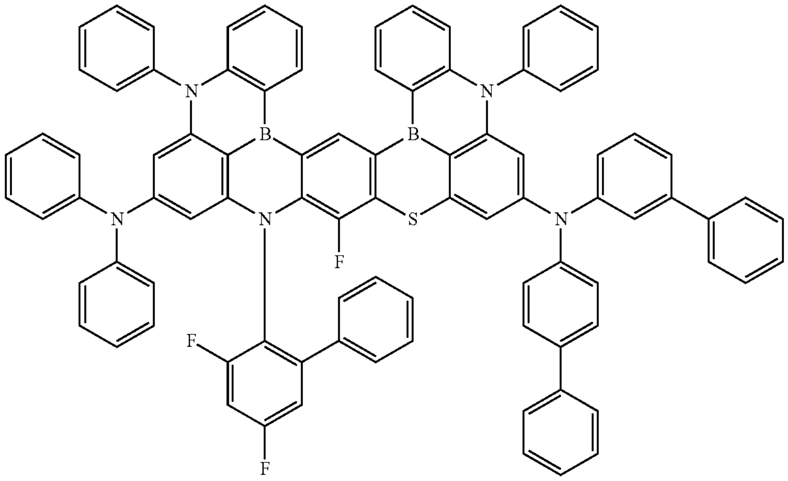
190
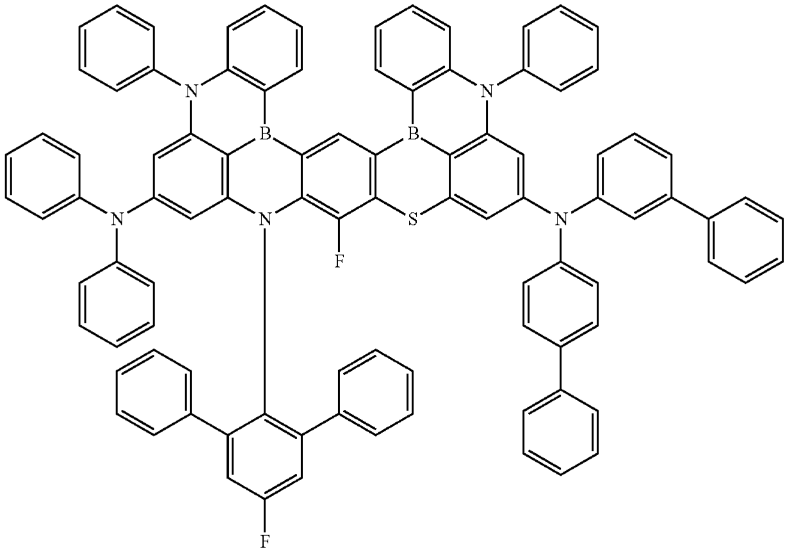
191
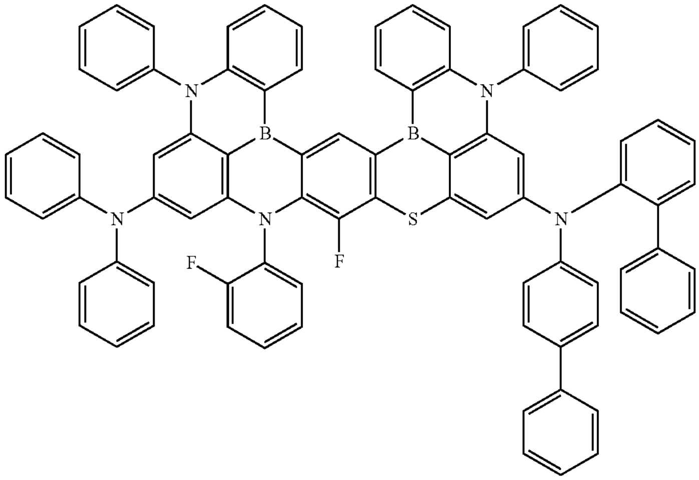

194
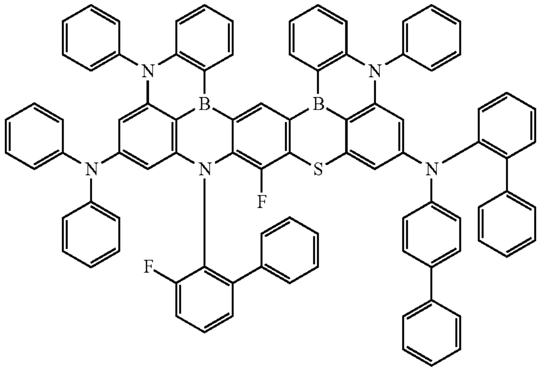
195
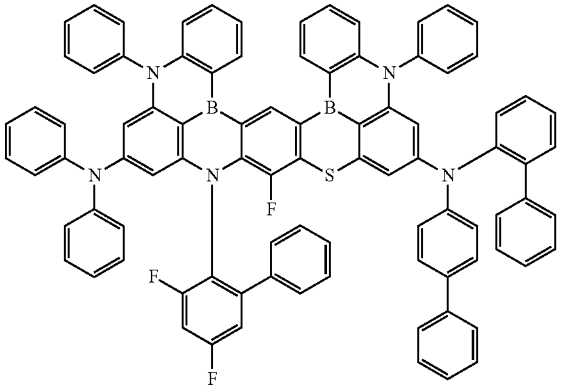
196
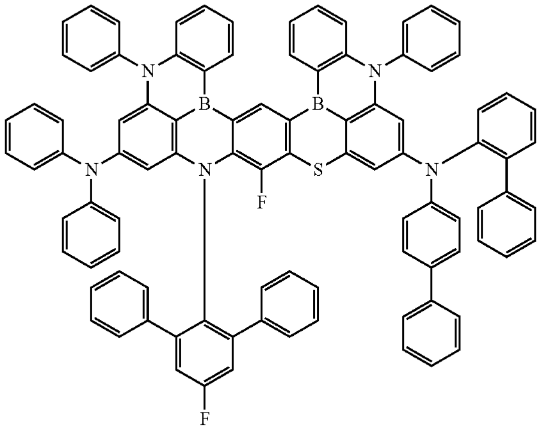
197
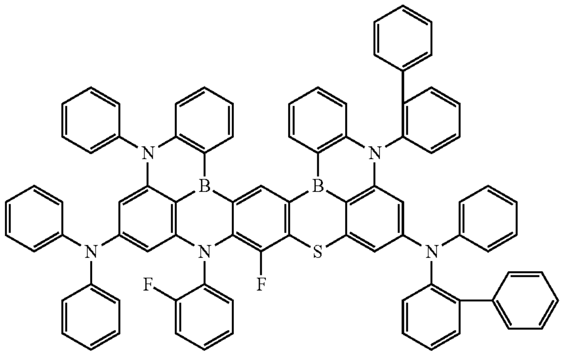
200
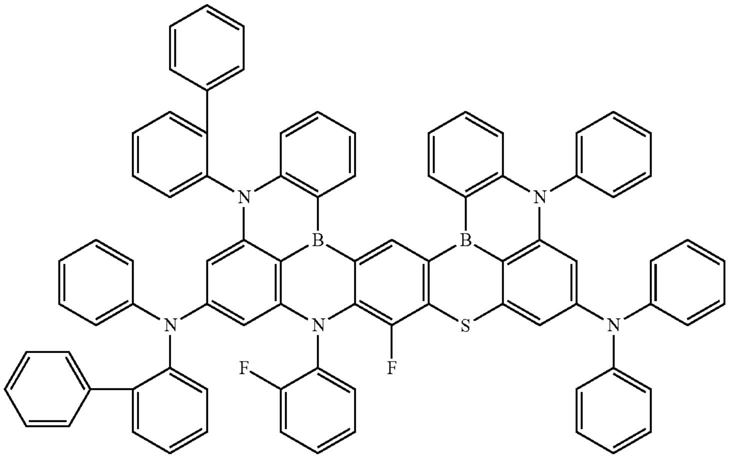

-continued
203
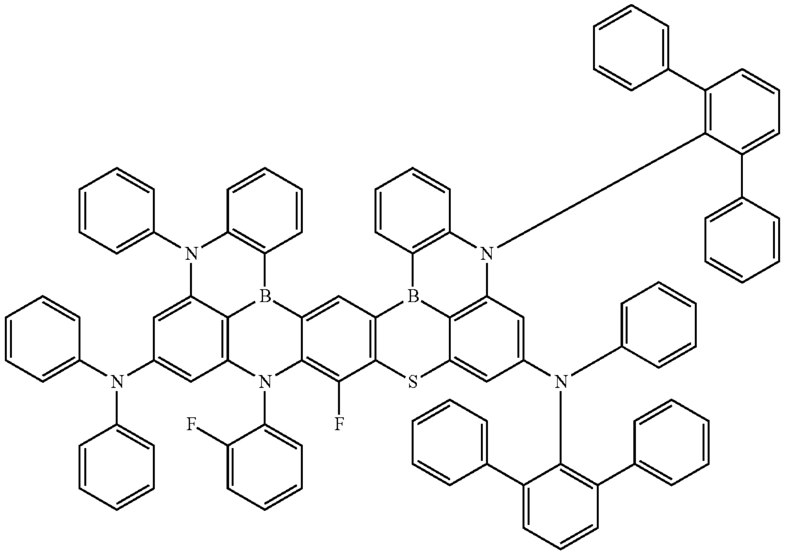
206
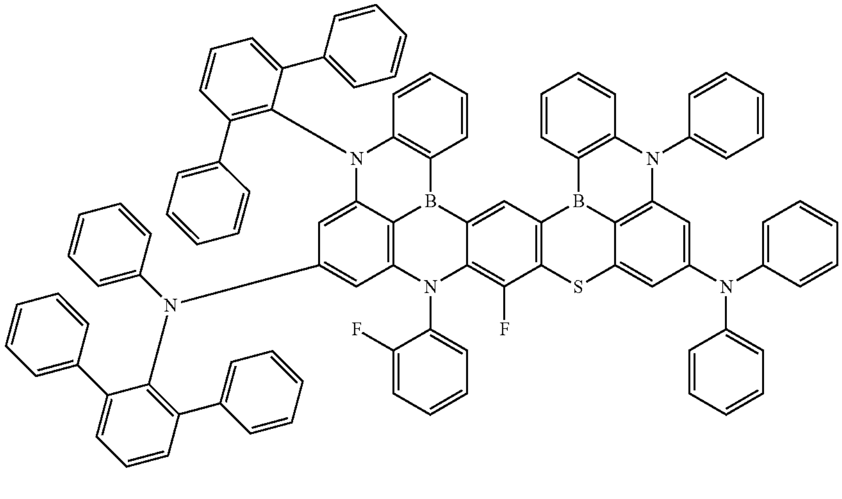
209
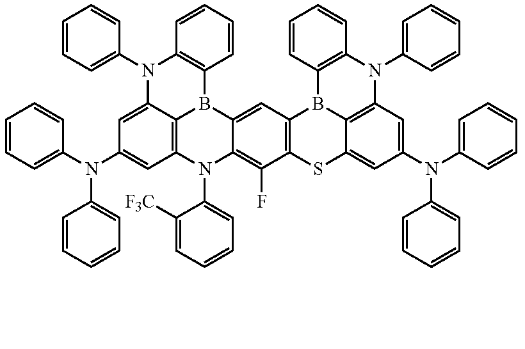
210
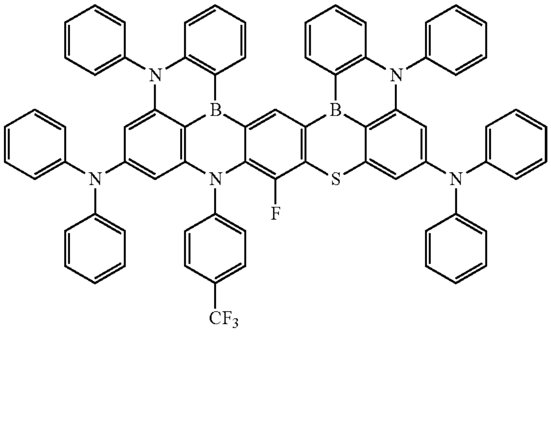

-continued
211
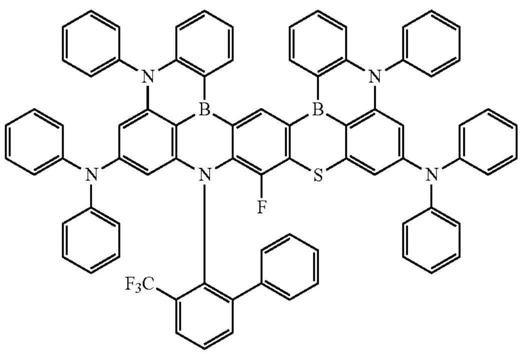
212
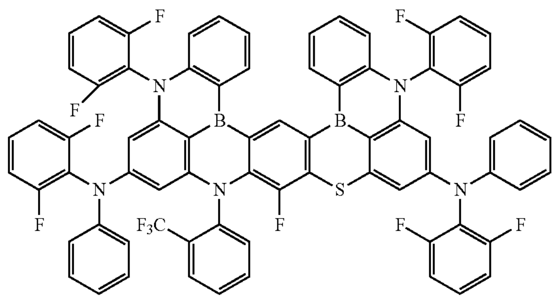
213
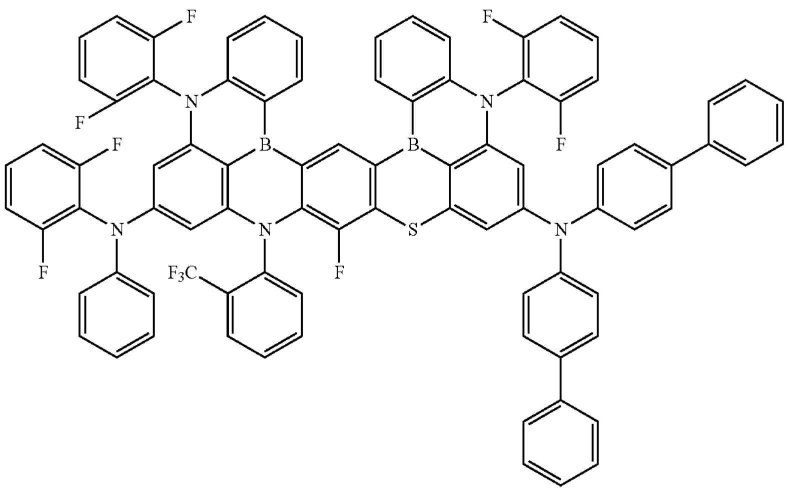
214
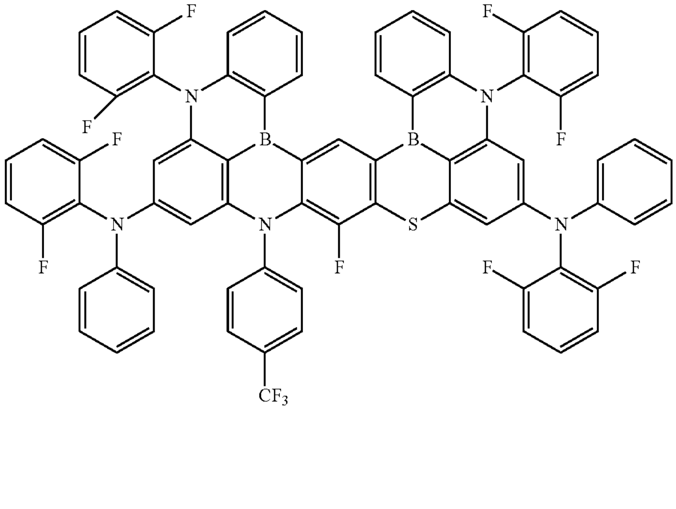

-continued
215
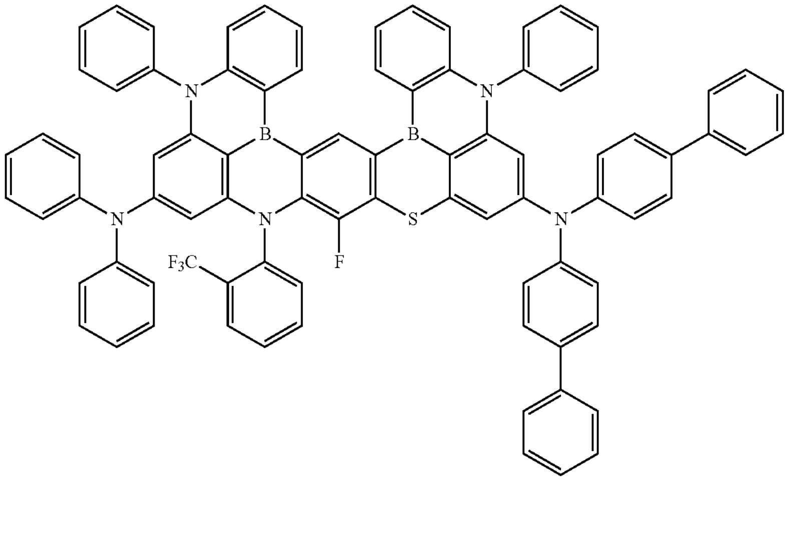
216
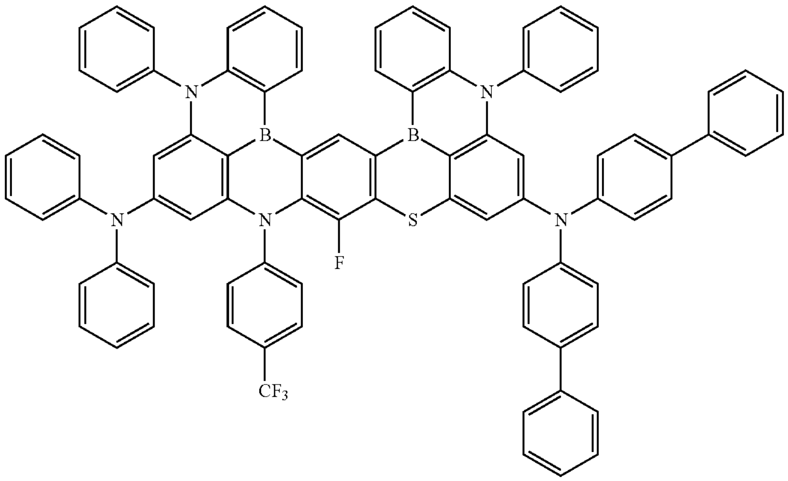
217
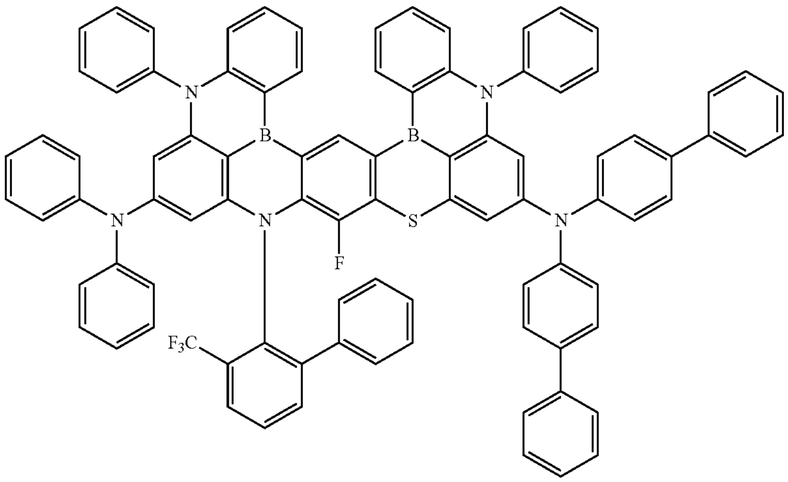

-continued
218
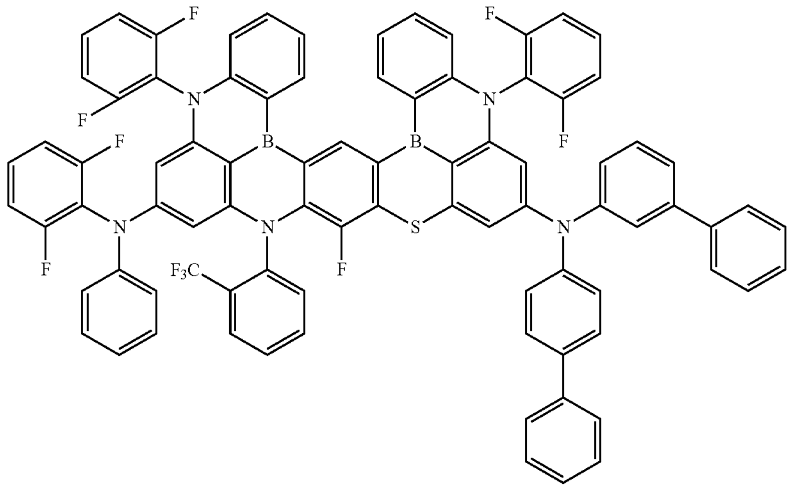
219
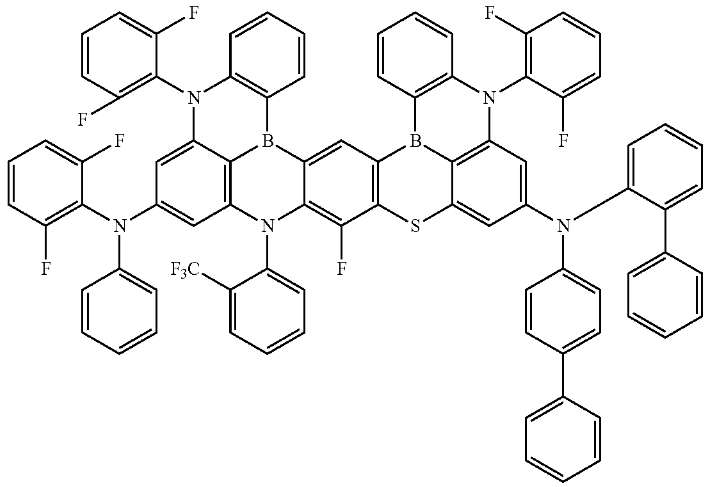
220
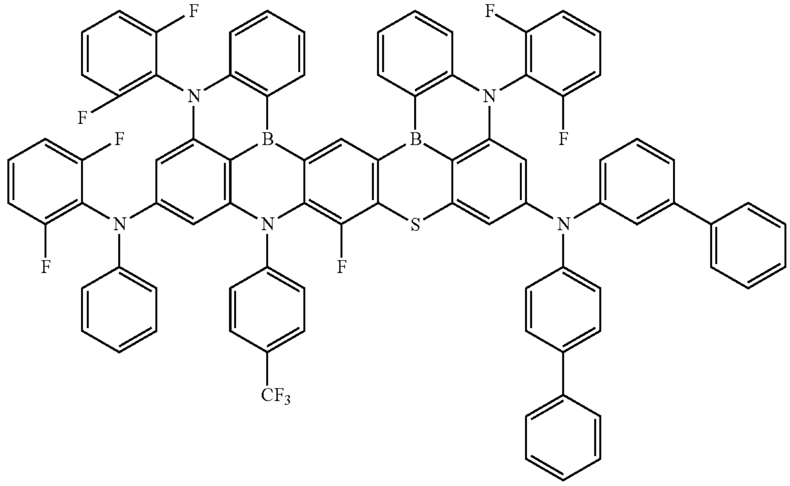

-continued
221
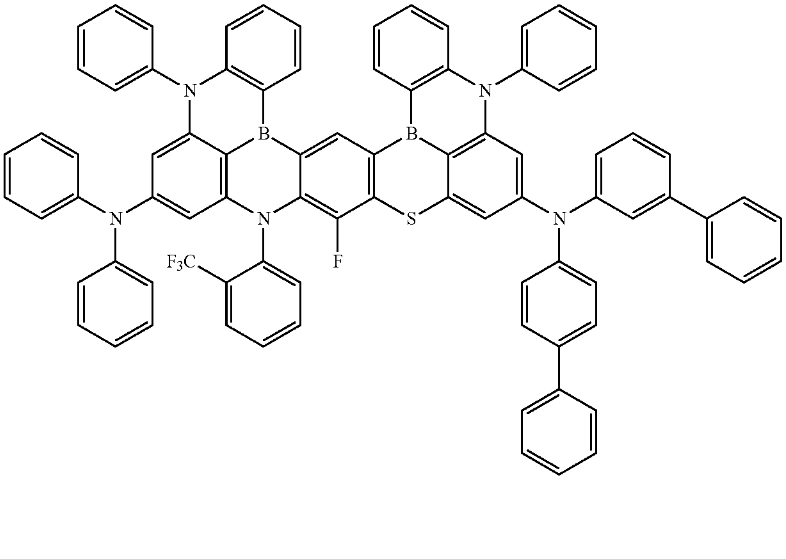
222
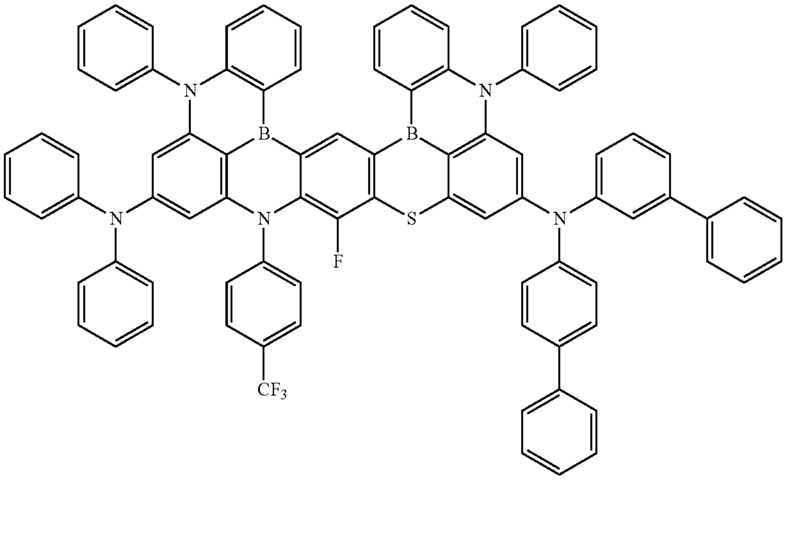
223
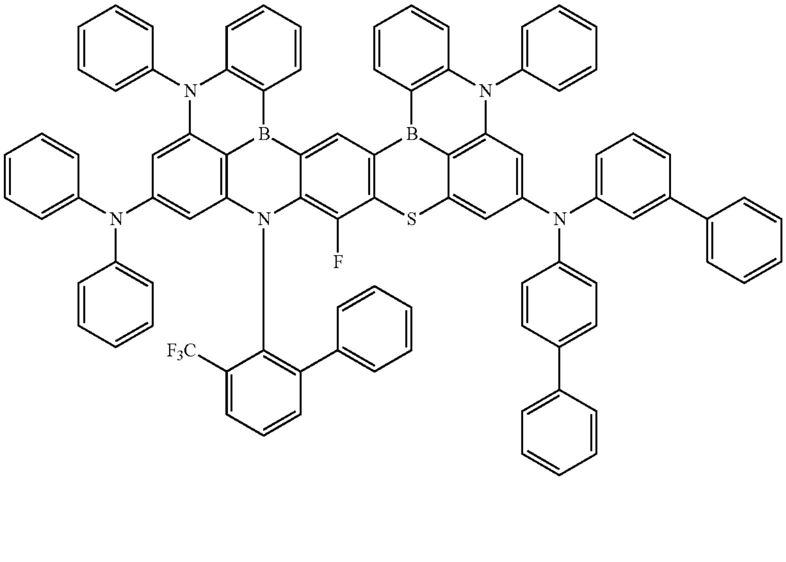

-continued
224
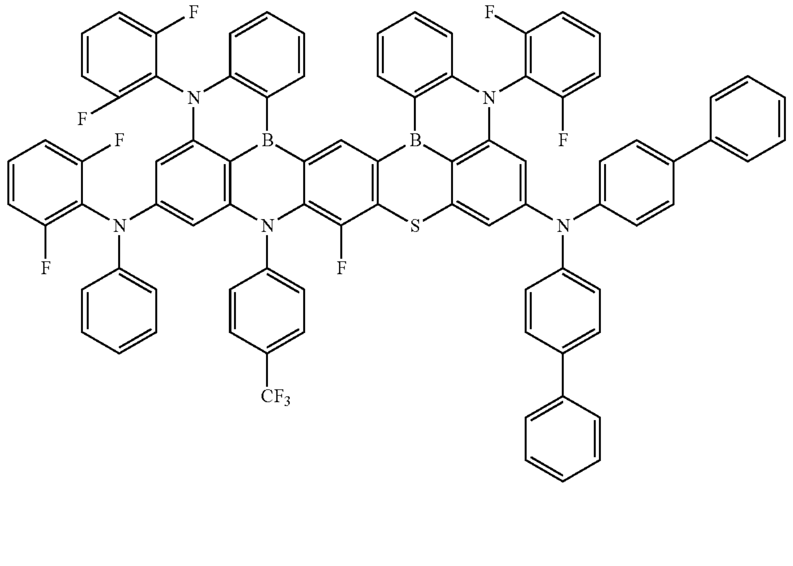
225
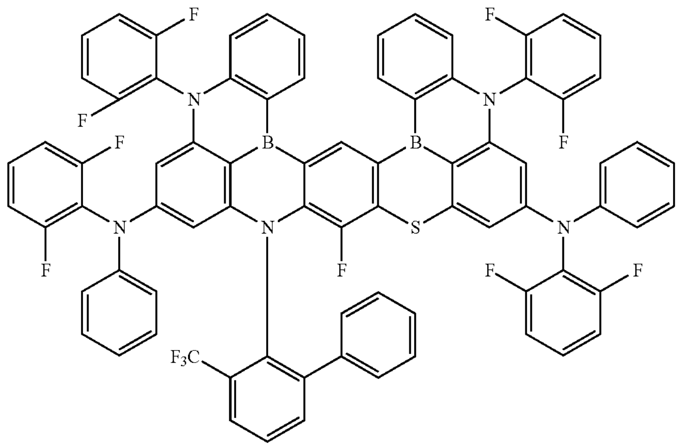
226
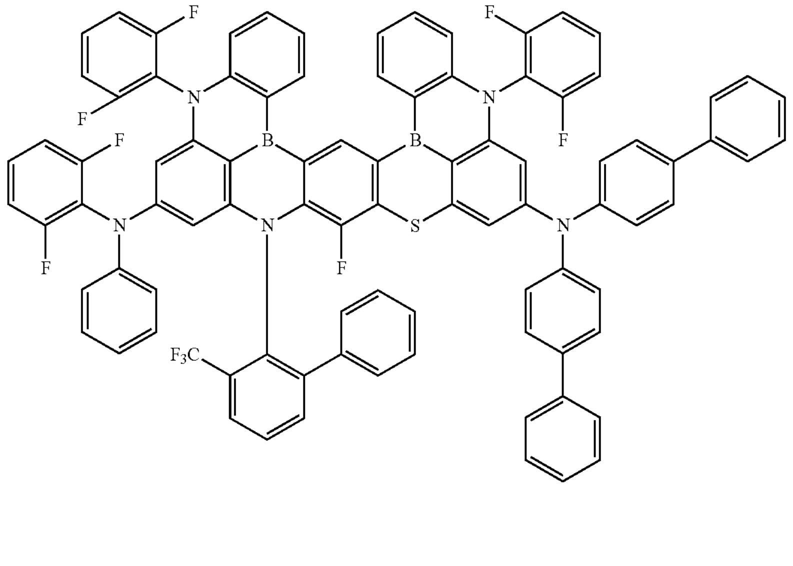

-continued
227
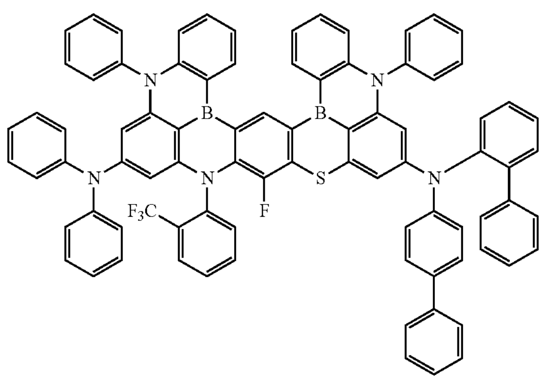
228
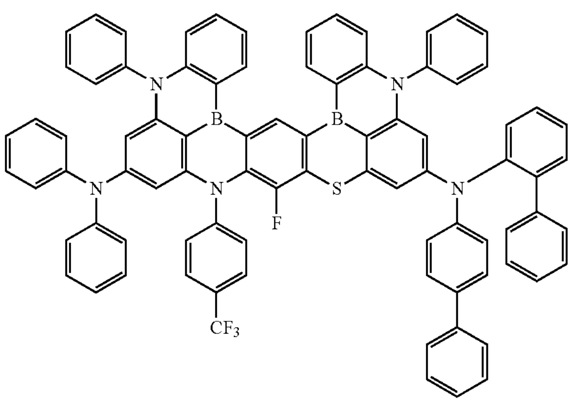
229
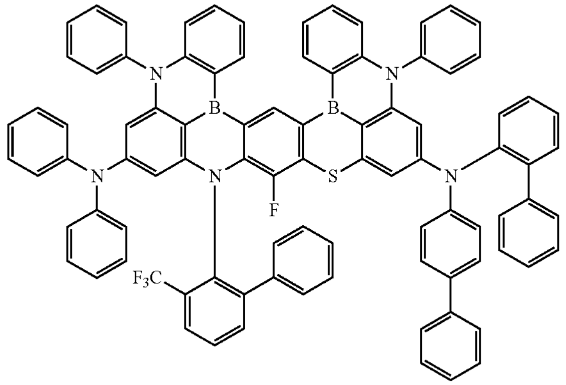
230
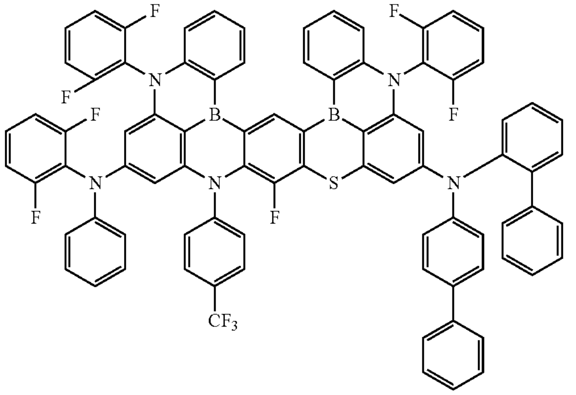
231
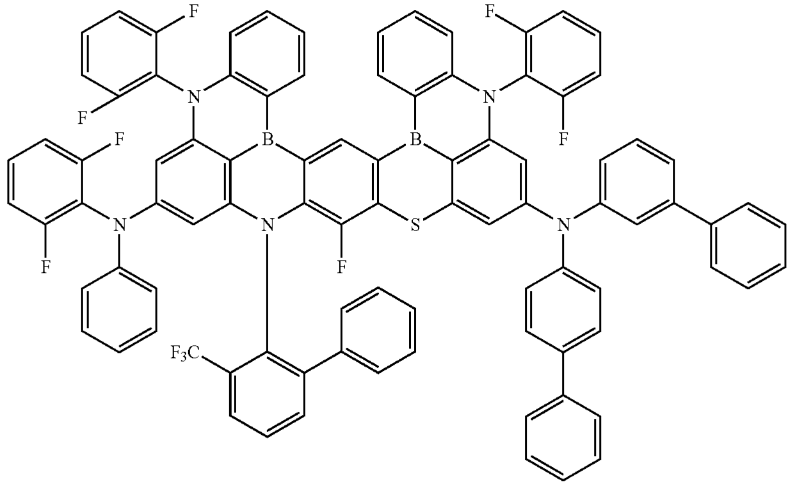

-continued
232
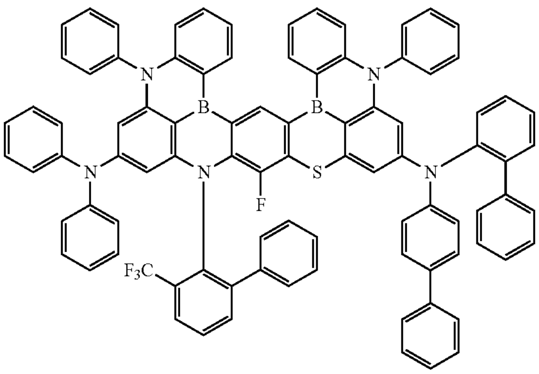
236
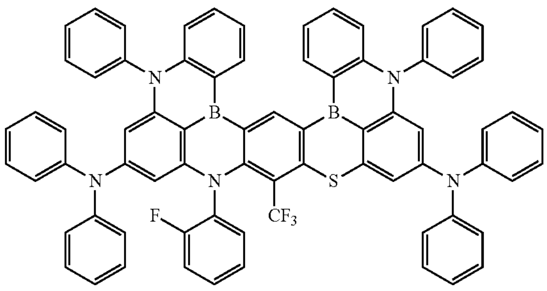
239
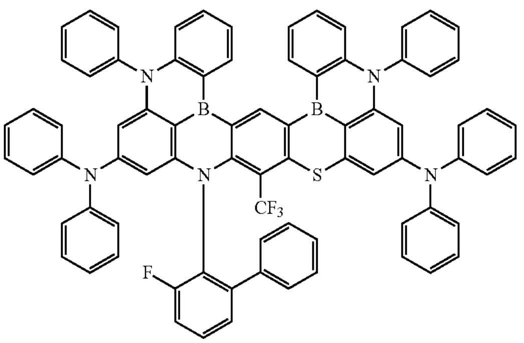
240
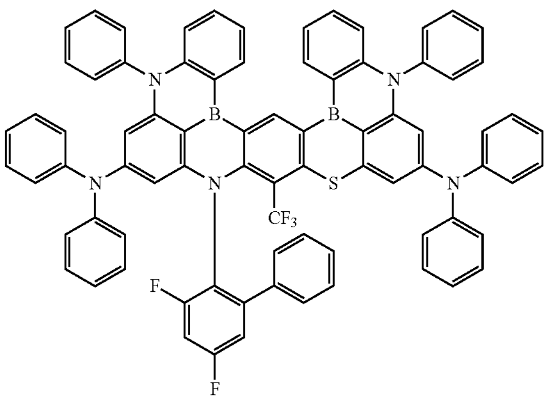
241
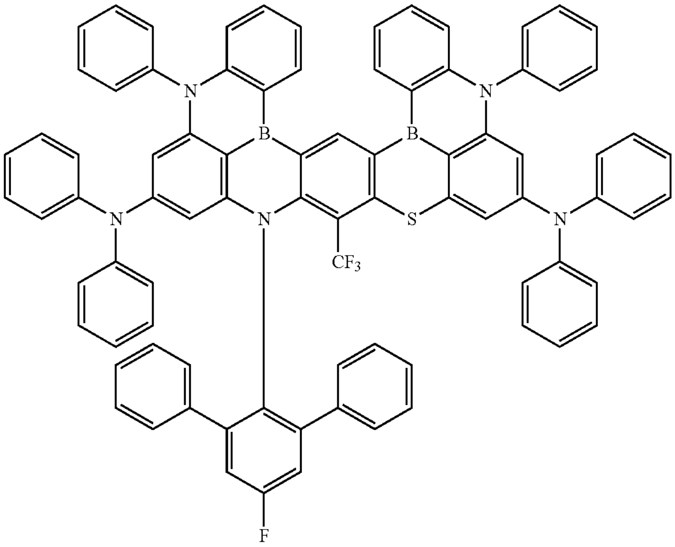

-continued
242
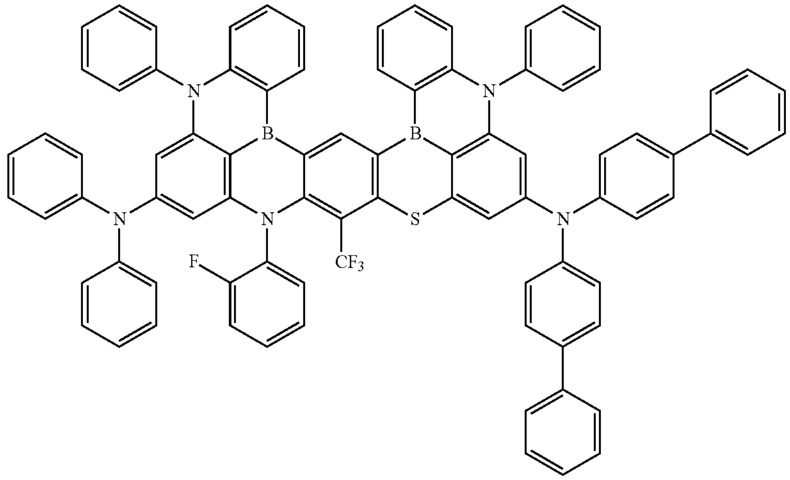
245
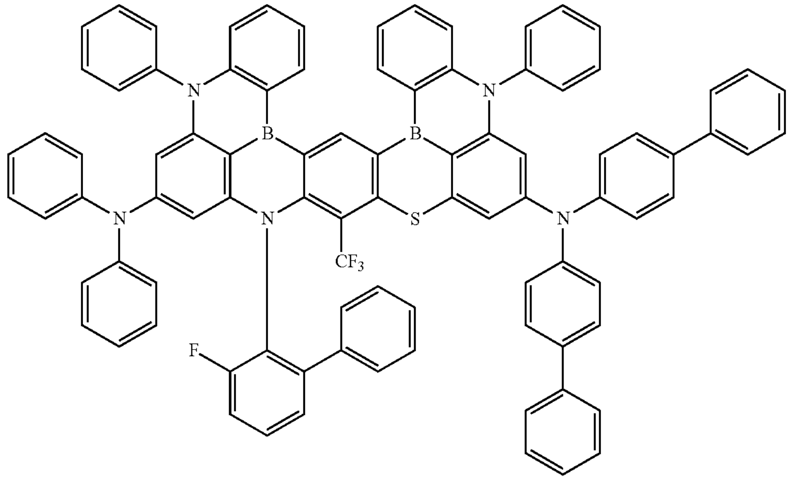
246
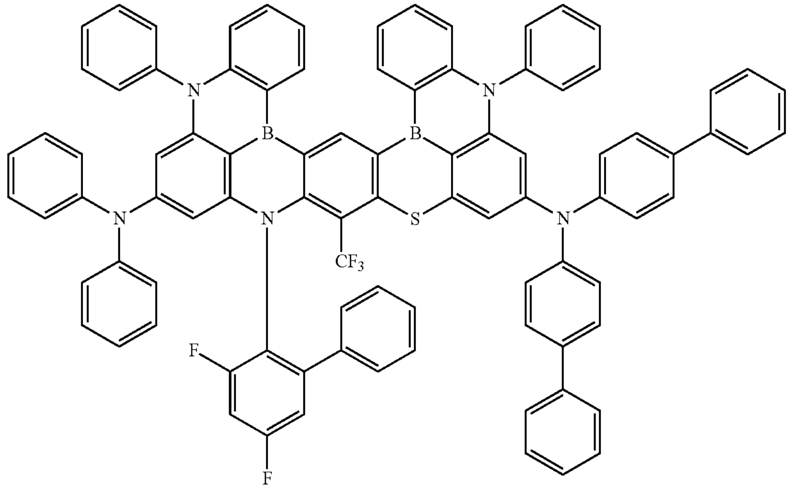

-continued
247
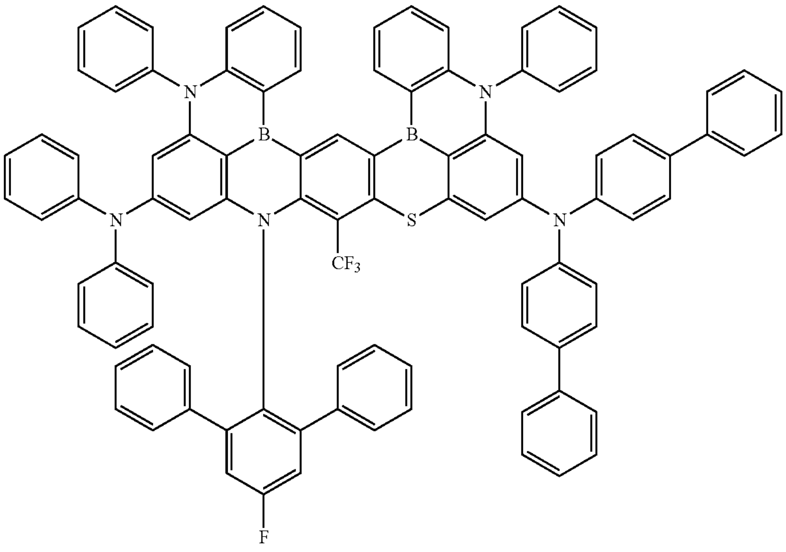
248
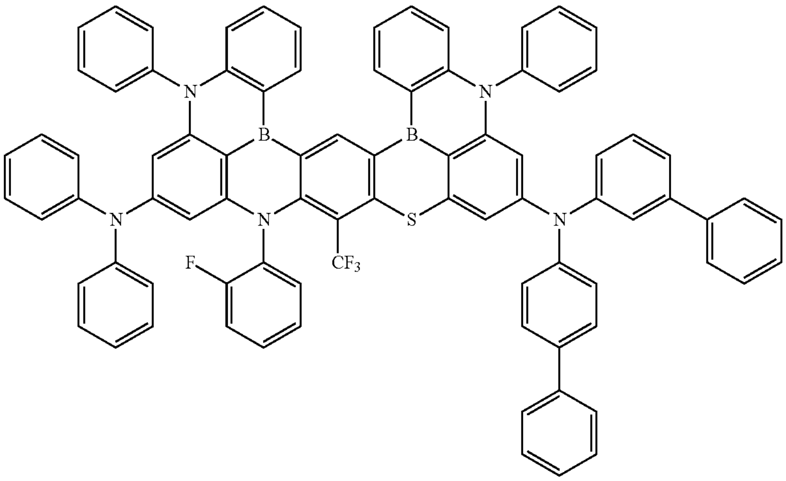
251
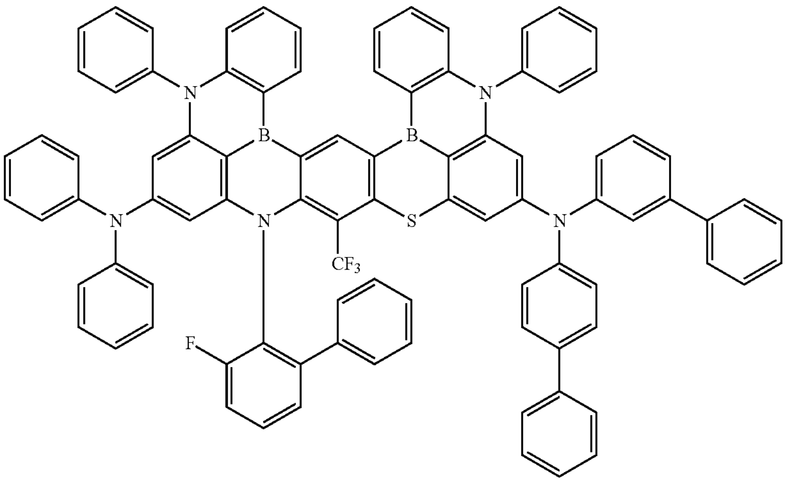

-continued
252
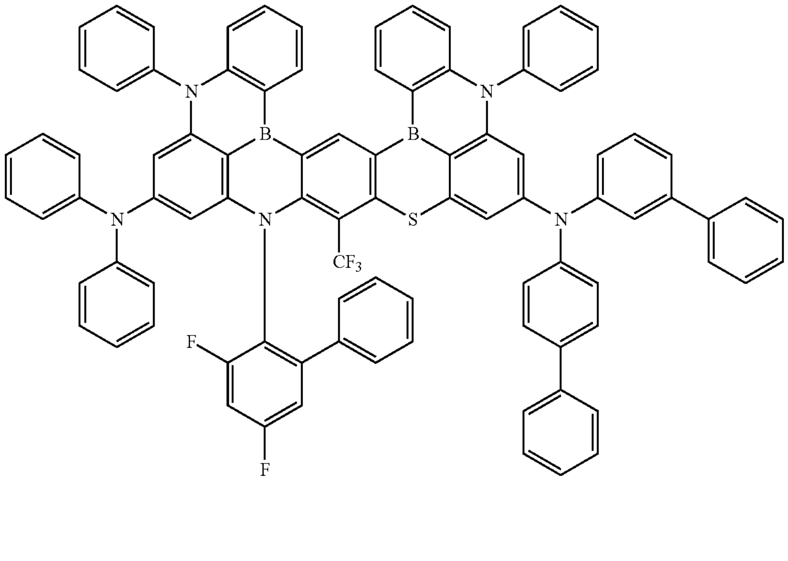
253
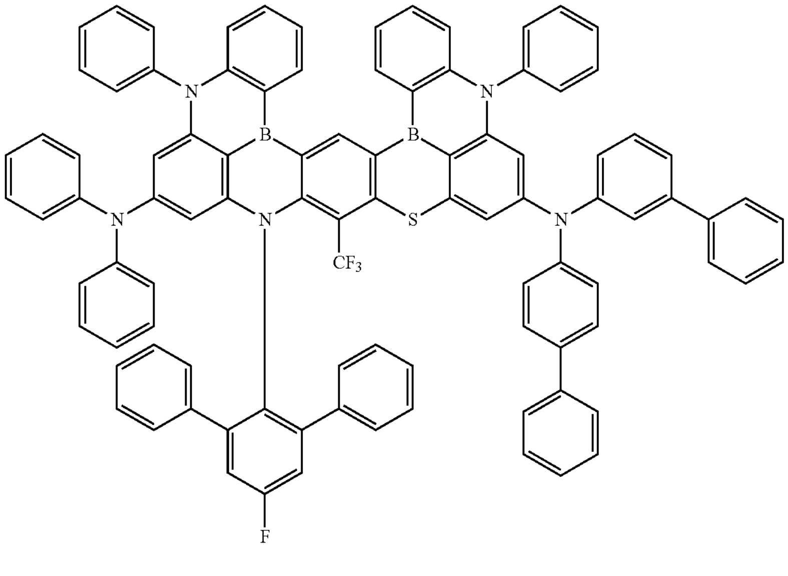
254
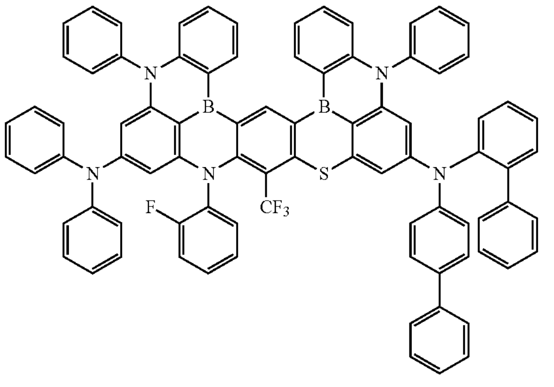
257
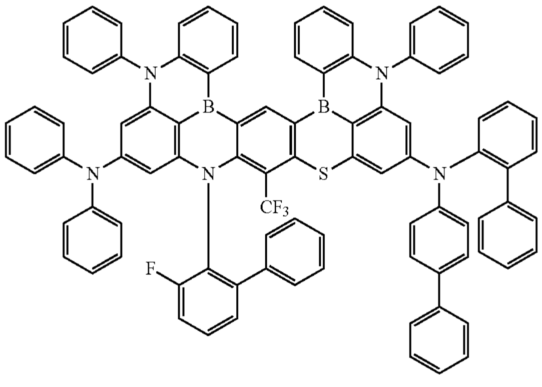

-continued
258
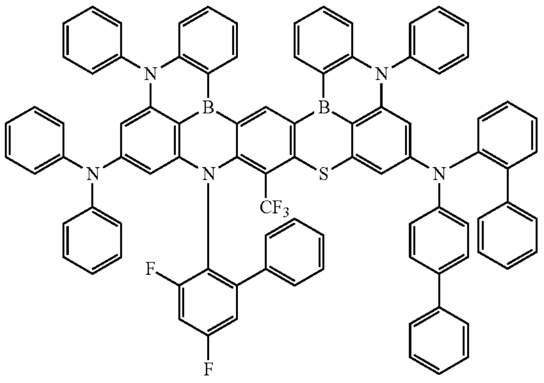
259
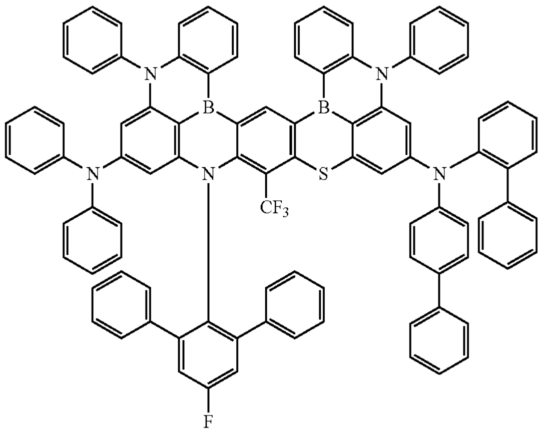
260
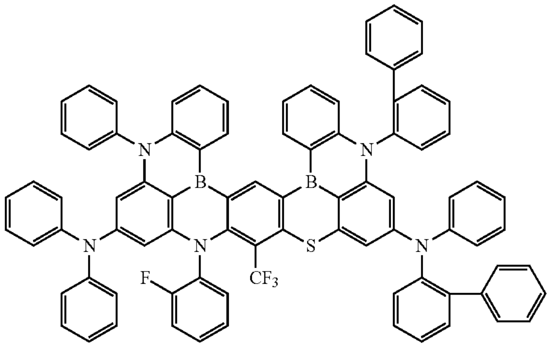
263
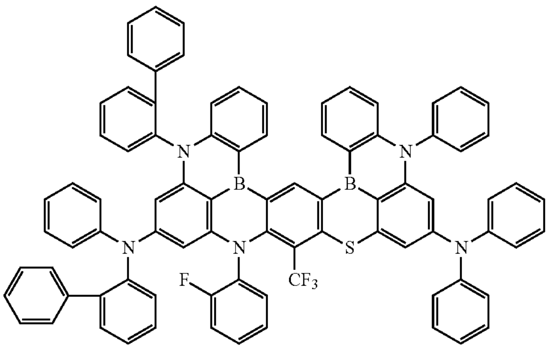
266
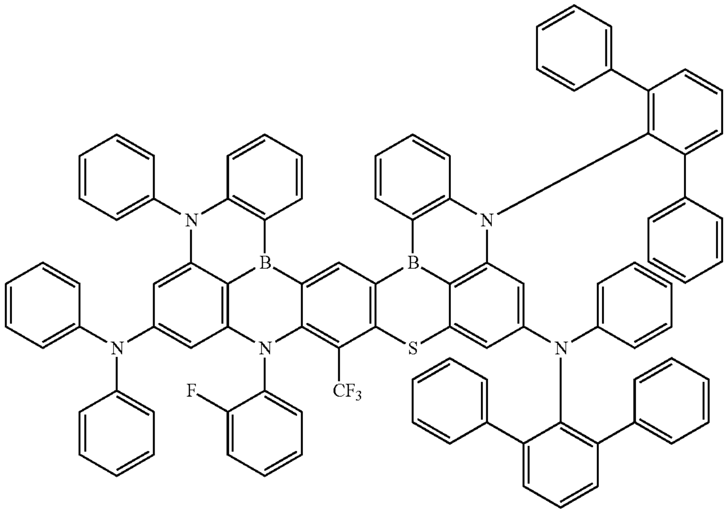

-continued
269
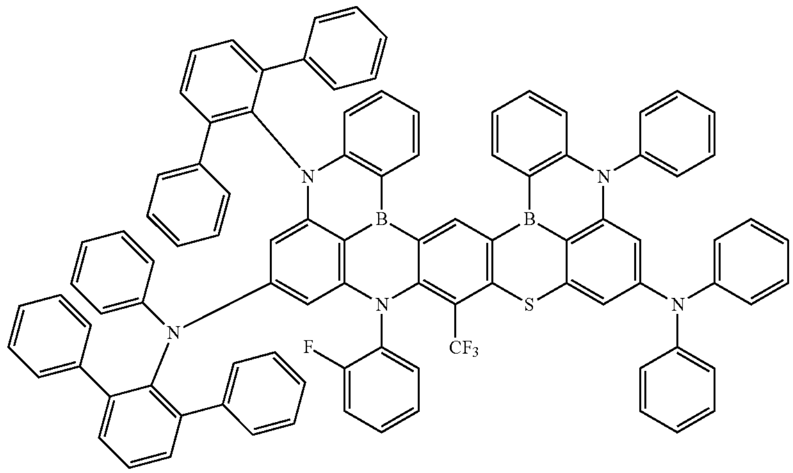
272
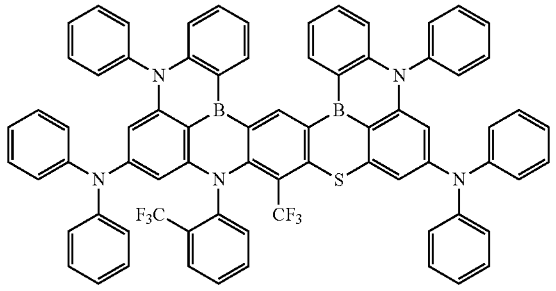
273
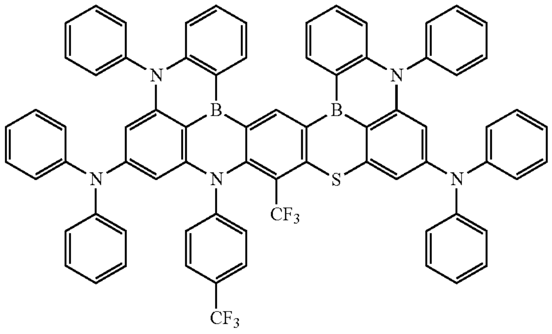
274
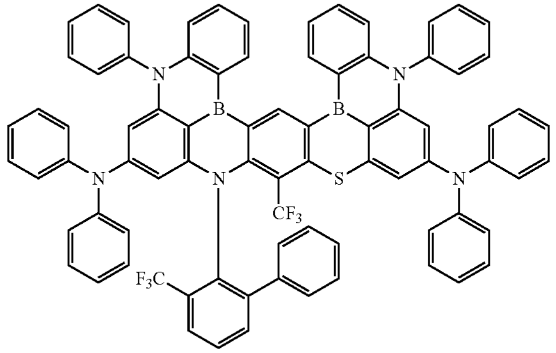
275
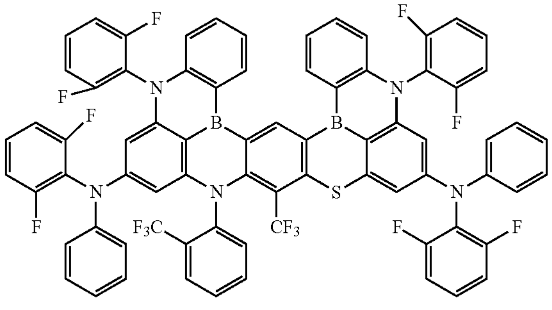

-continued
276
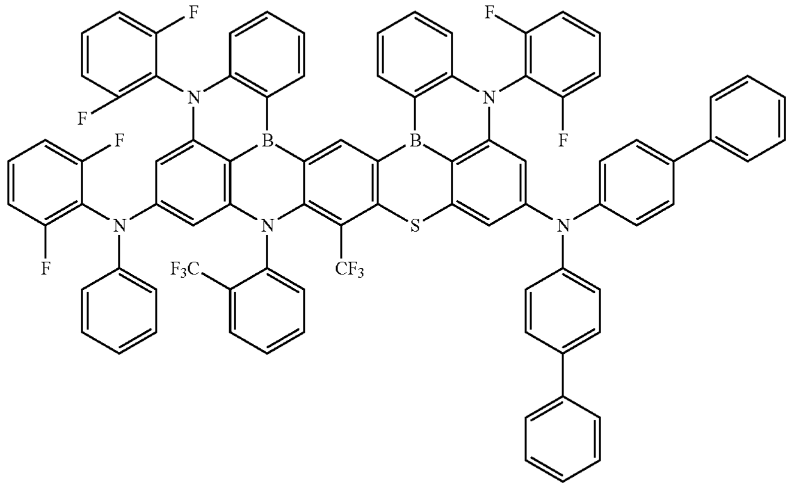
278
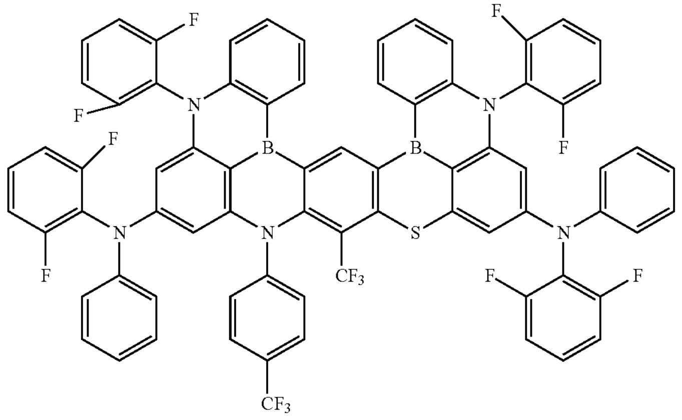
279
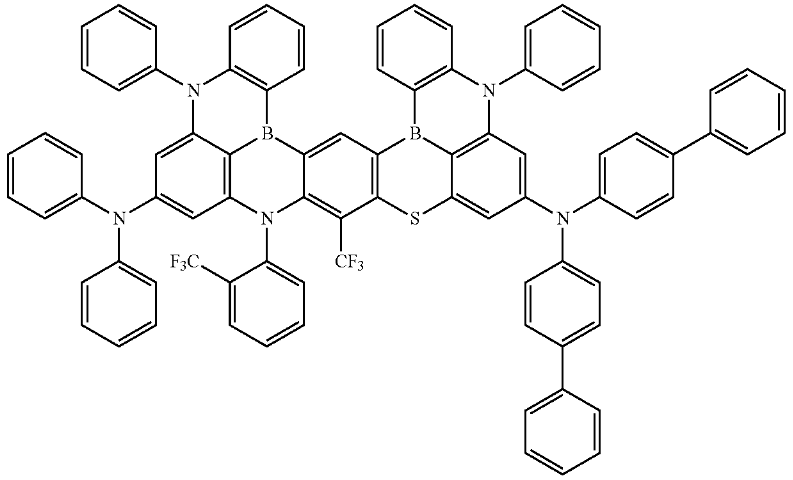

-continued
280
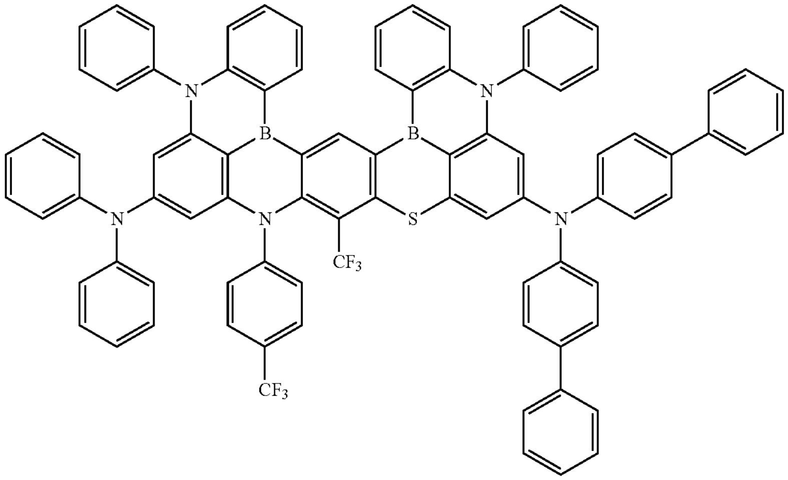
281
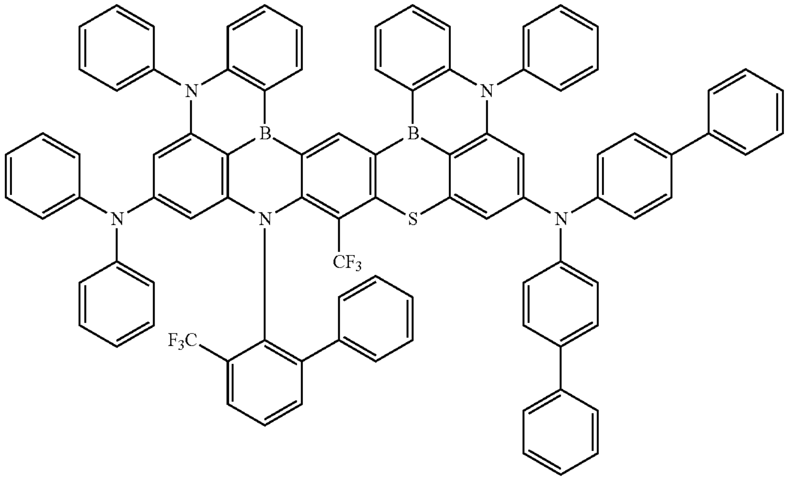
282
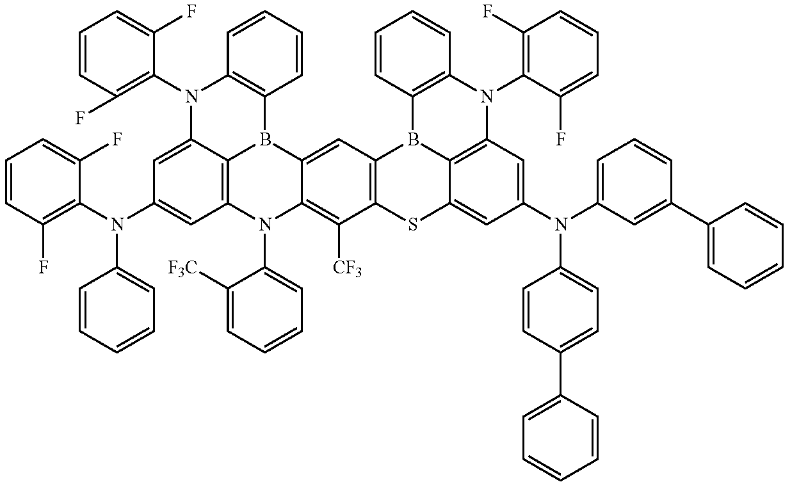

-continued
283
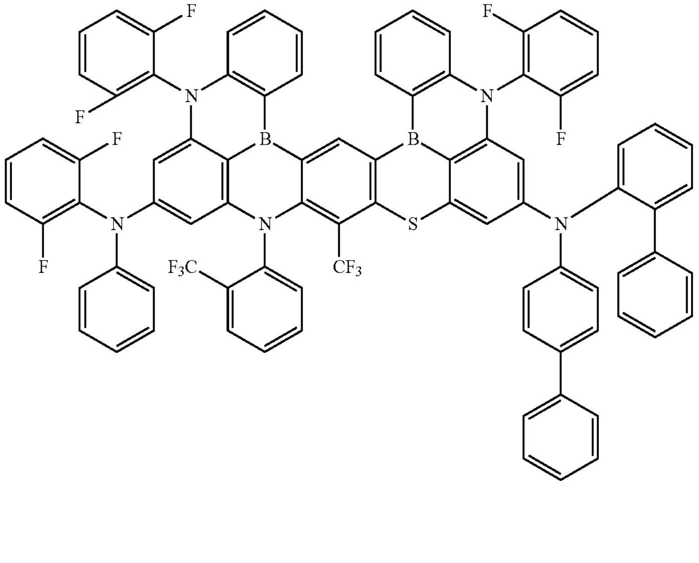
284
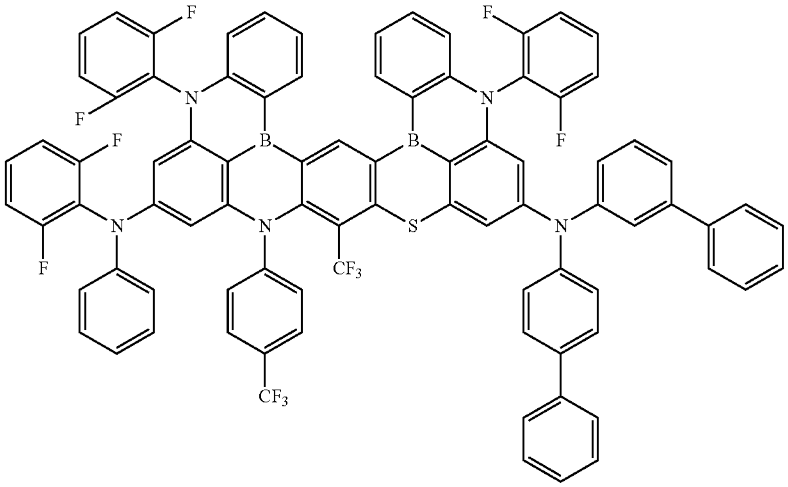
285
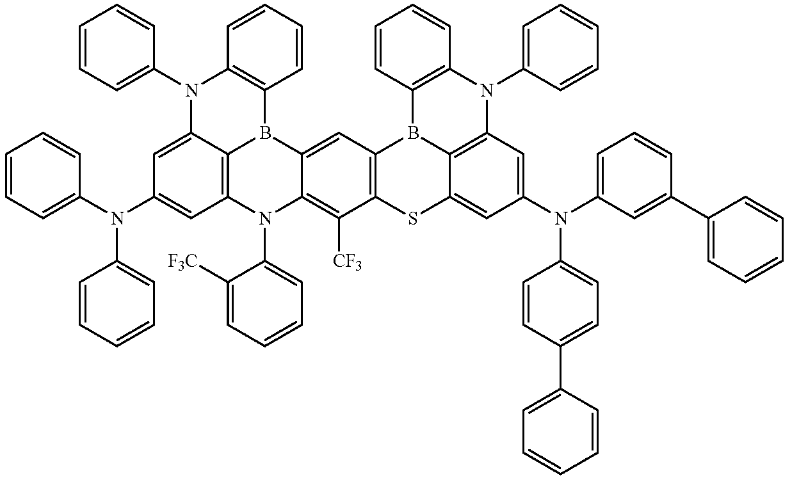

-continued
286
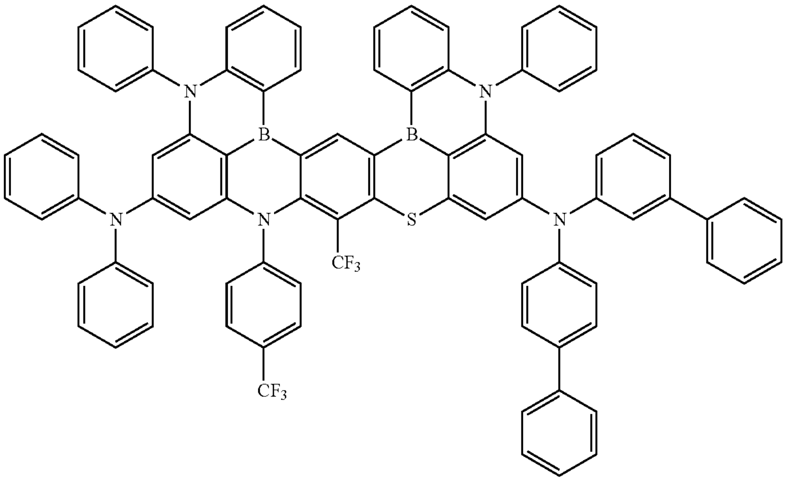
287
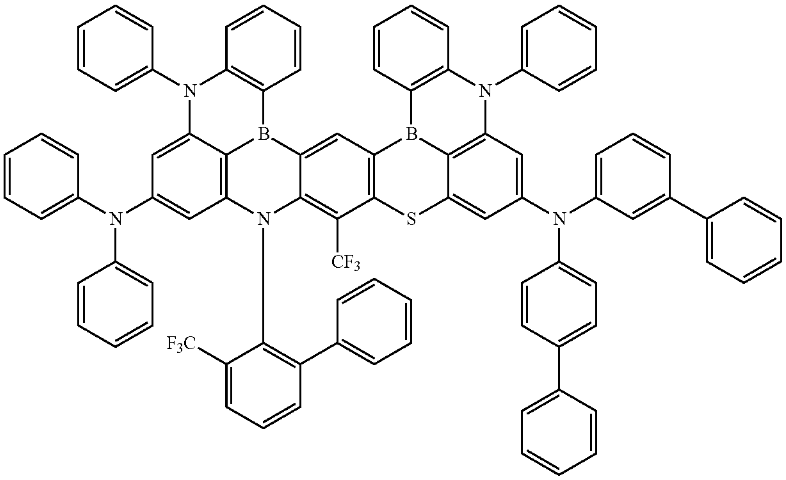
288
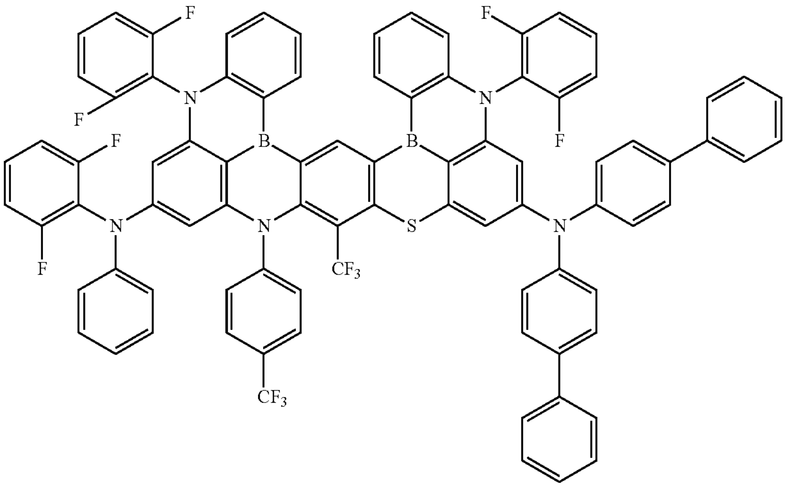

-continued
289
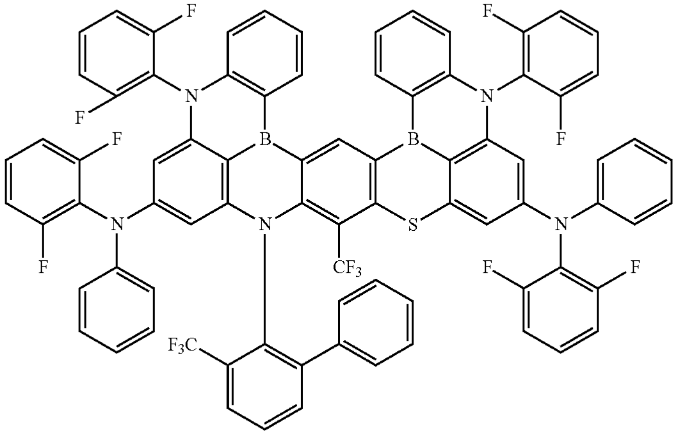
290
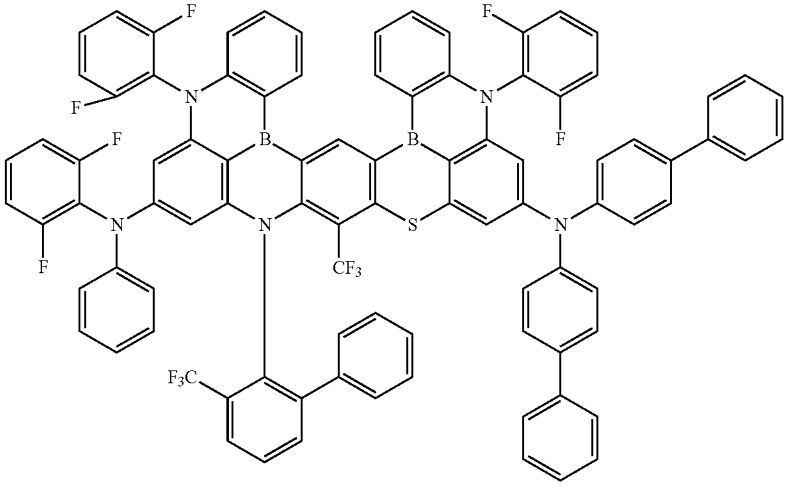
291
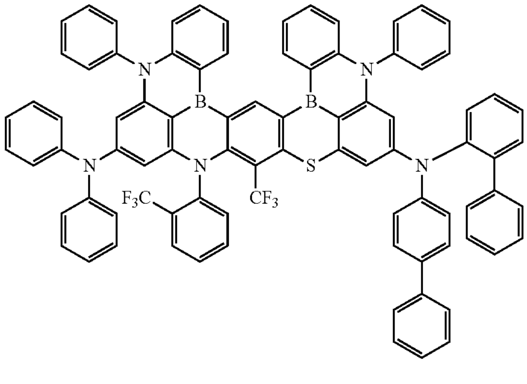
292
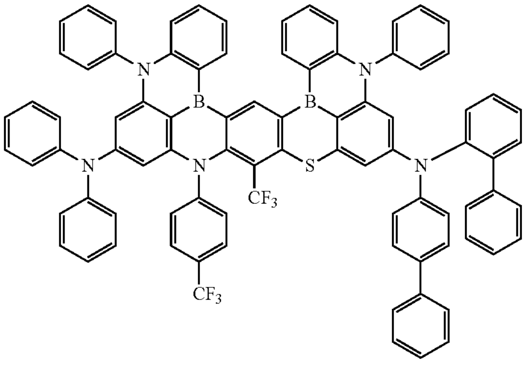

-continued
293
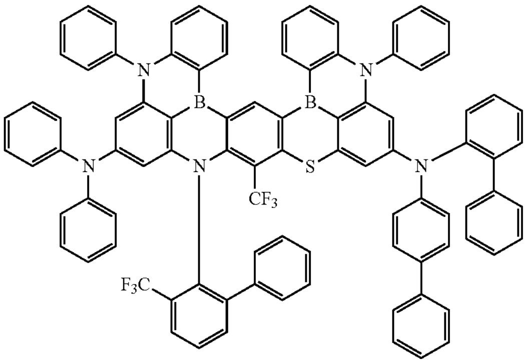
294
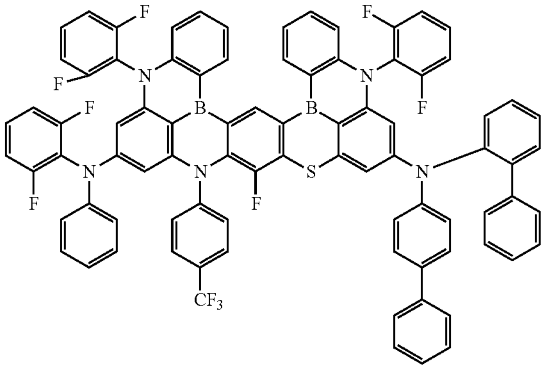
295
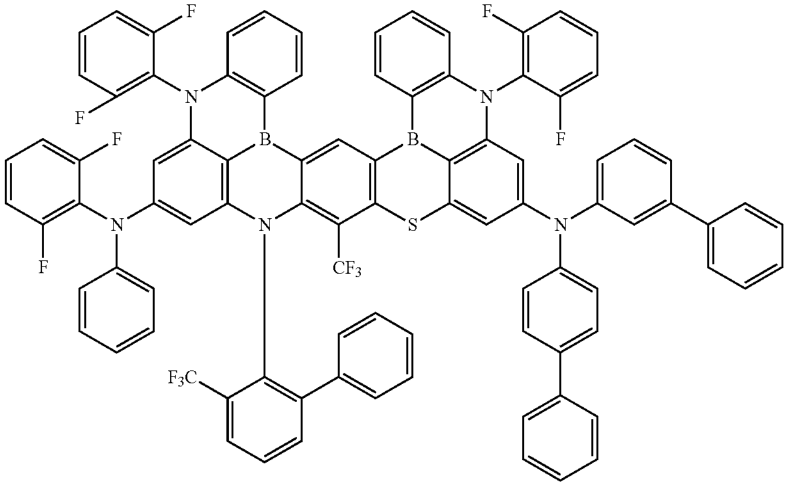
296
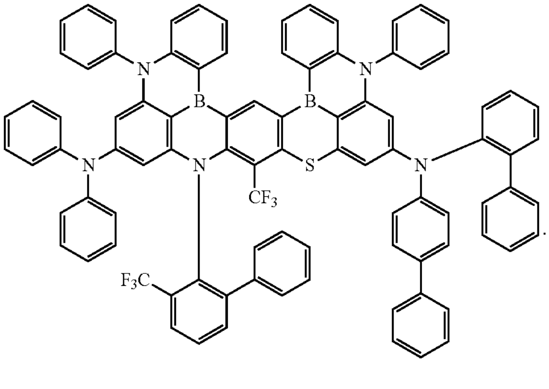

14. A polycyclic compound represented by Formula 1:

[Formula 1]

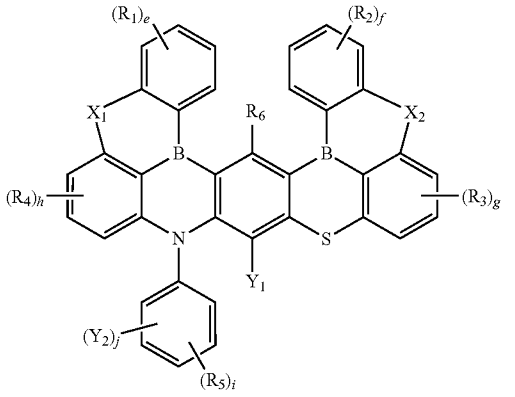

wherein in Formula 1, $X_1$ and $X_2$ are each independently $N(Ar_1)$, O, or S, $Ar_1$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, $Y_1$ is a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, provided that:

a phenyl group including $Y_2$ and $R_5$ is represented by one of $Y_2$-2 to $Y_2$-7; or $Y_1$ is F or CF3, and a phenyl group including $Y_2$ and $R_5$ is represented by one of $Y_2$-1 to $Y_2$-7, $R_1$ to $R_4$ and $R_6$ are each independently a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, e and f are each independently an integer from 0 to 4, j and i are each independently an integer from 0 to 5, the sum of j and i is equal to or less than 5, and g and h are each independently an integer from 0 to 3:

Y2-1

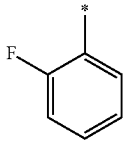

-continued

Y2-2

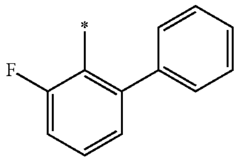

Y2-3

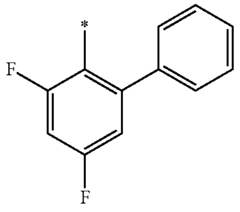

Y2-4

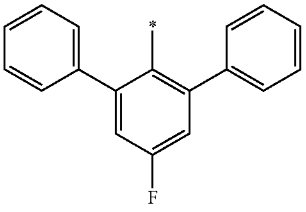

Y2-5

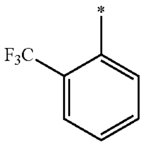

Y2-6

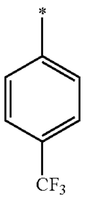

Y2-7

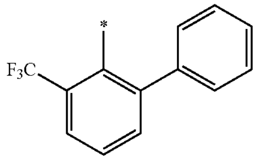

wherein in $Y_2$-1 to $Y_2$-7,

* indicates a binding site to a neighboring atom.

15. The polycyclic compound of claim 14, wherein Formula 1 is represented by Formula 2:

[Formula 2]

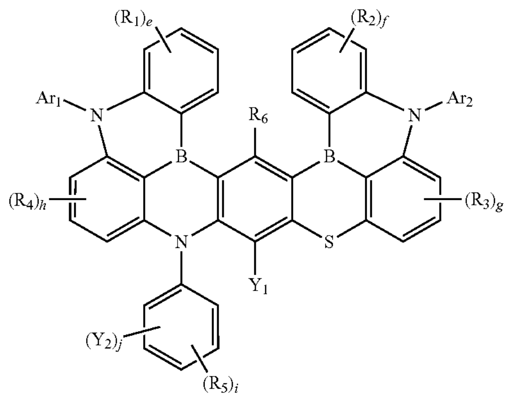

wherein in Formula 2, $Ar_2$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $Ar_1$, $Y_1$, $Y_2$, $R_1$ to $R_6$, and e to i are the same as defined in connection with Formula 1.

16. The polycyclic compound of claim 15, wherein Formula 2 is represented by Formula 3:

[Formula 3]

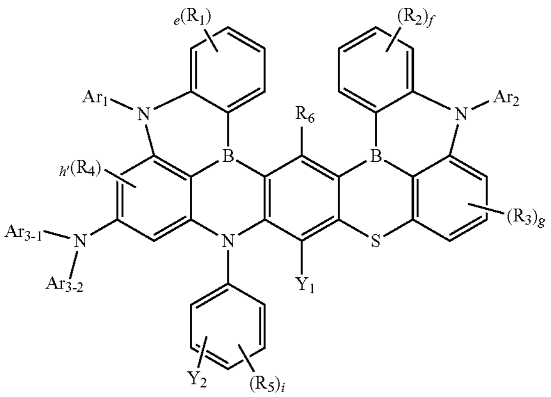

wherein in Formula 3, $Ar_{3-1}$ and $Ar_{3-2}$ are each independently a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, h' is an integer from 0 to 2, and $Ar_1$, $Ar_2$, $Y_1$, $Y_2$, $R_1$ to $R_6$, e to g, and i are the same as defined in connection with Formula 2.

17. The polycyclic compound of claim 15, wherein Formula 2 is represented by Formula 4:

[Formula 4]

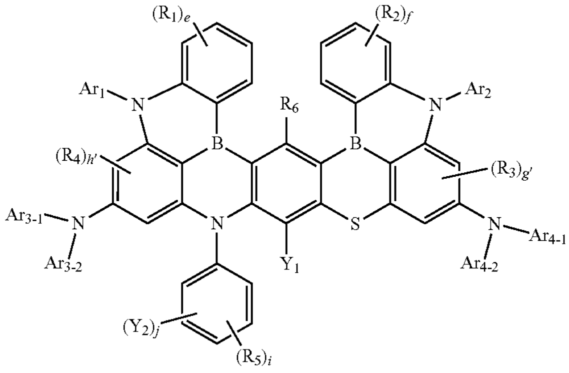

wherein in Formula 4, $Ar_{3-1}$, $Ar_{3-2}$, $Ar_{4-1}$, and $Ar_{4-2}$ are each independently a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, h' and g' are each independently an integer from 0 to 2, and $Ar_1$, $Ar_2$, $Y_1$, $Y_2$, $R_1$ to $R_6$, e, f, and i are the same as defined in connection with Formula 2.

18. The polycyclic compound of claim 14, wherein Formula 1 is represented by Formula 6:

[Formula 6]

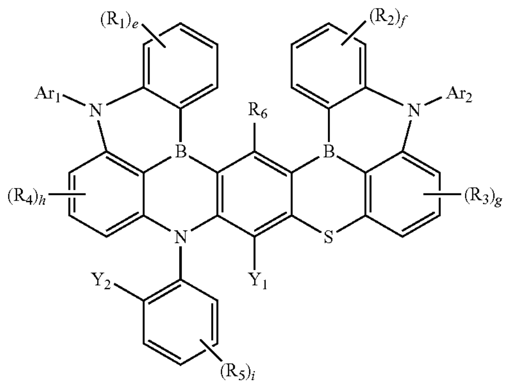

wherein in Formula 6, $Ar_2$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $Ar_1$, $Y_1$, $Y_2$, $R_1$ to $R_6$, and e to i are the same as defined in connection with Formula 1.

19. The polycyclic compound of claim 15, wherein $Ar_1$ and $Ar_2$ are each independently represented by one of Formula 5-1 to Formula 5-3:

[Formula 5-1]

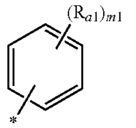

[Formula 5-2]

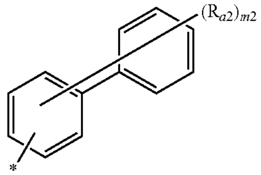

[Formula 5-3]

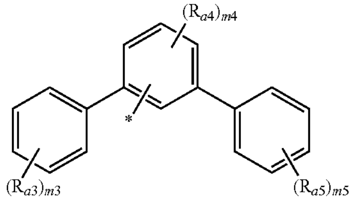

wherein in Formula 5-1 to Formula 5-3, $R_{a1}$ to $R_{a5}$ are each independently a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, $m^1$, $m^3$, and $m^5$ are each independently an integer from 0 to 5, $m^2$ is an integer from 0 to 9, $m^4$ is an integer from 0 to 3, and

* indicates a binding site to a neighboring atom.

20. The polycyclic compound of claim 14, wherein the polycyclic compound represented by Formula 1 is one selected from Compound Group 1:

[Compound Group 1]

13

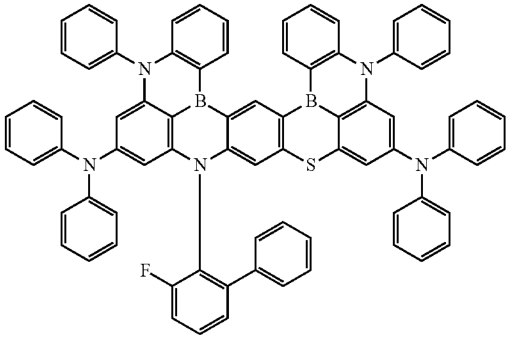

14

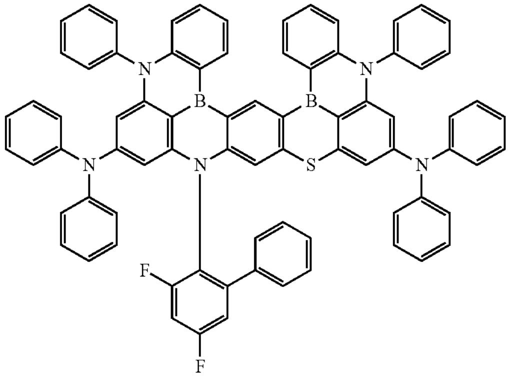

15

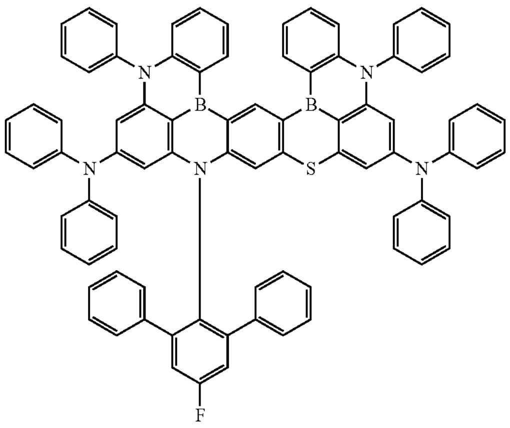

-continued
16
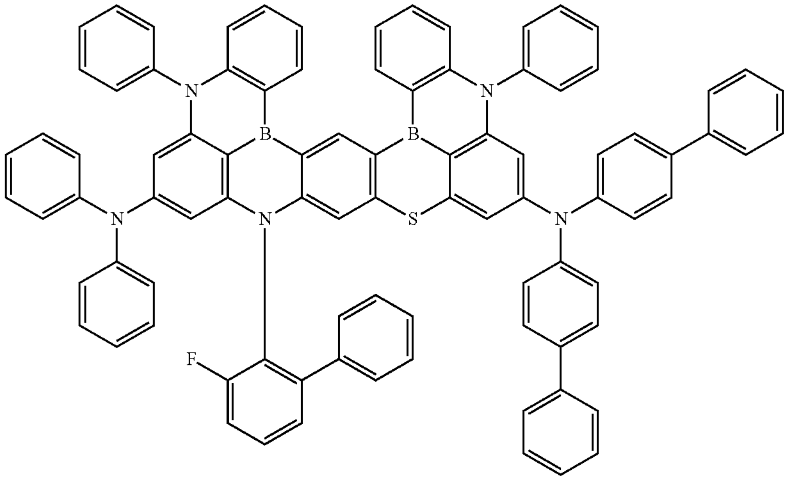
17
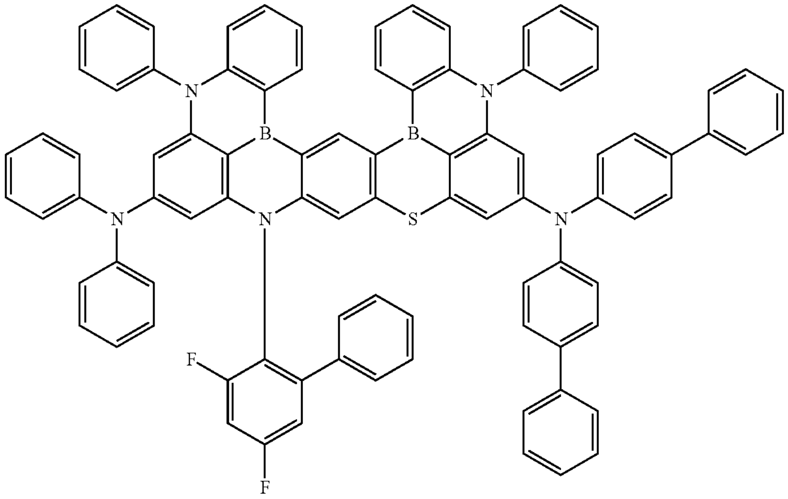
18
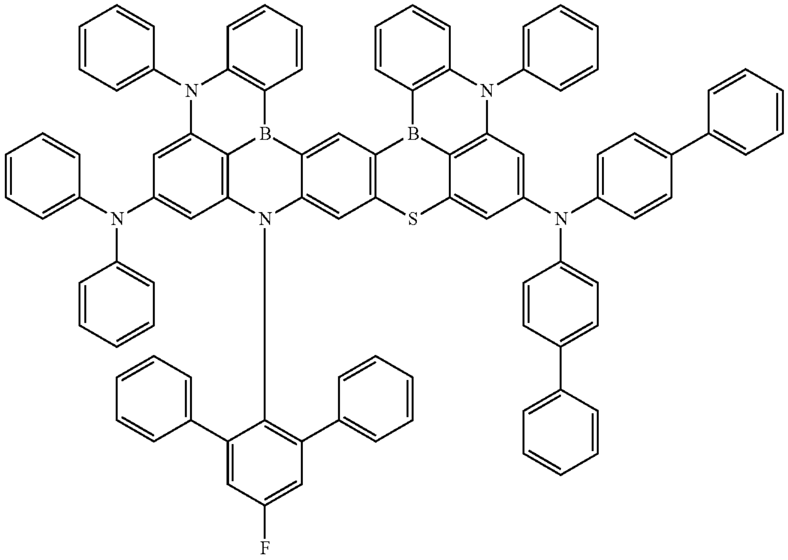

-continued
19
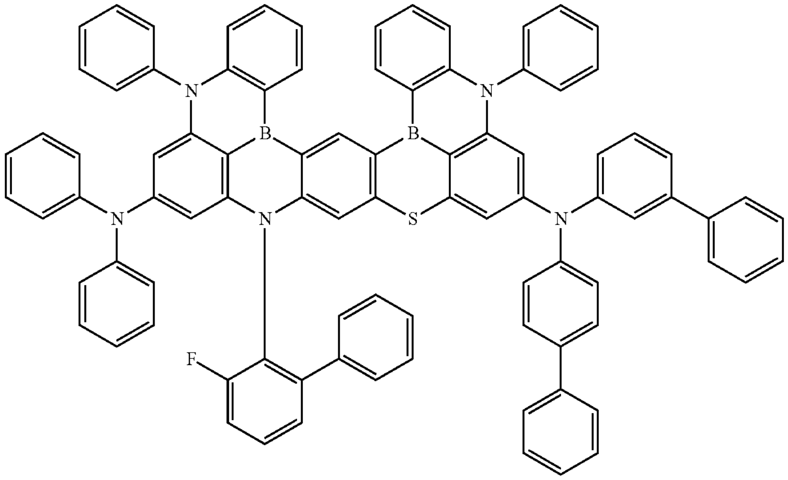
20
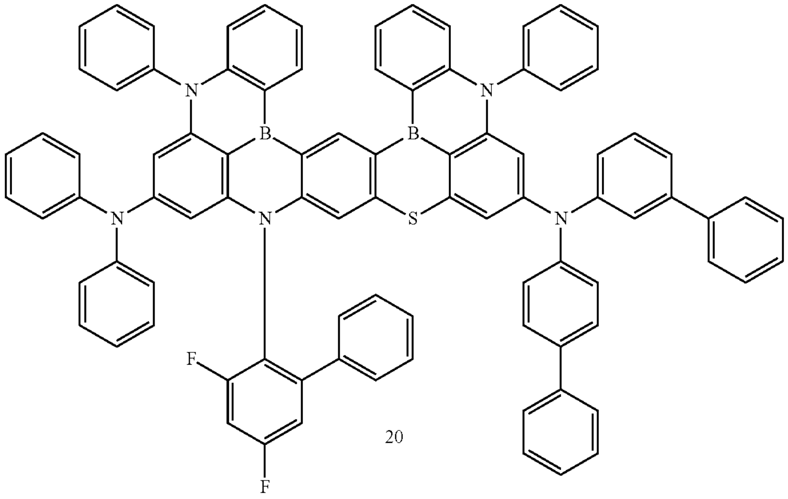
21
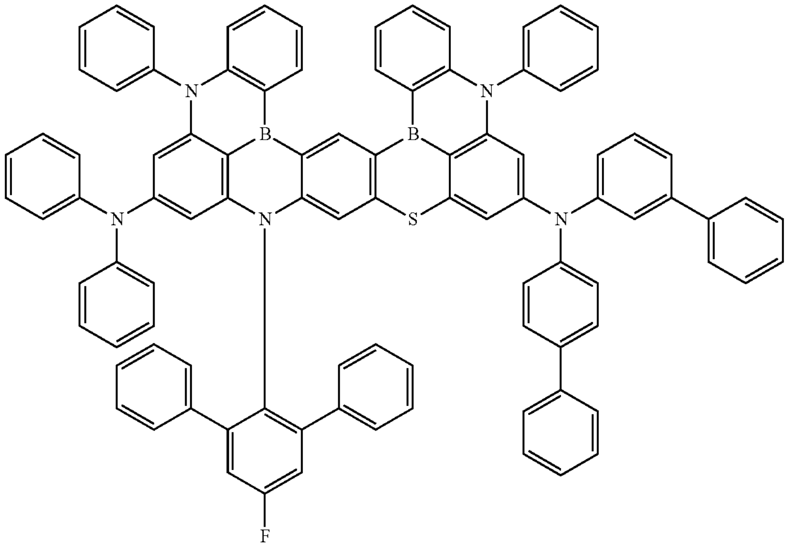

-continued
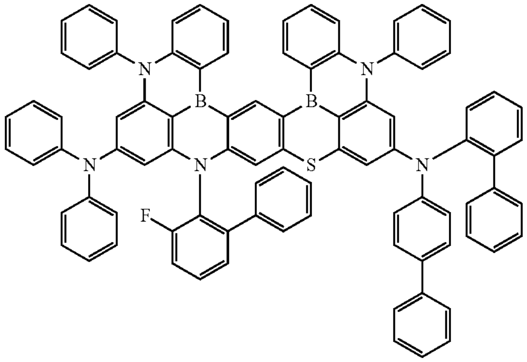
22
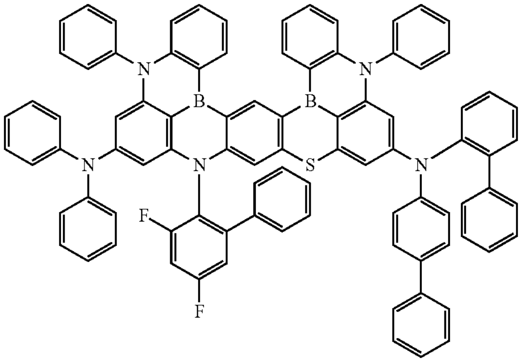
23
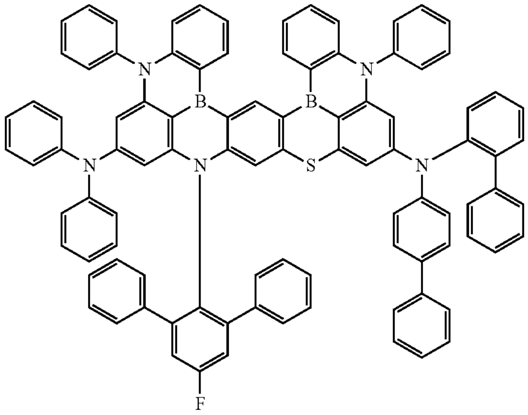
24
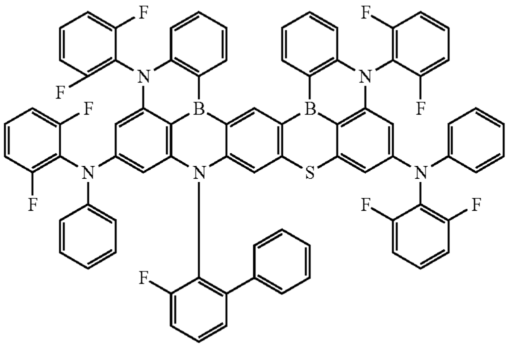
27
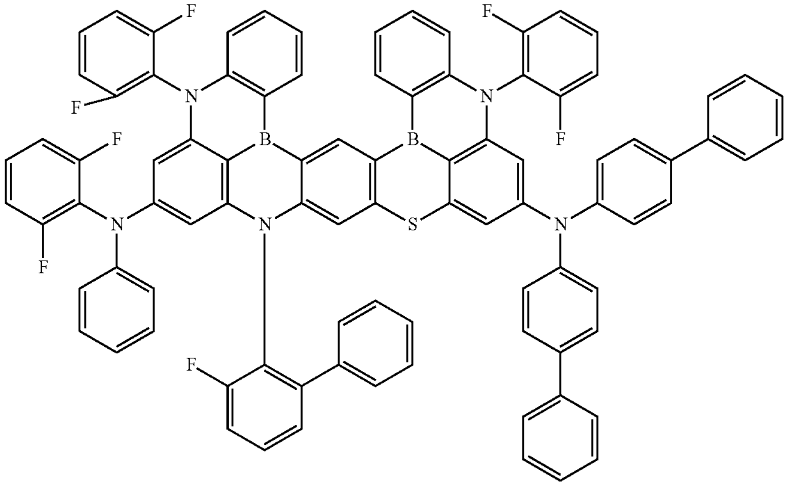
30

-continued
33
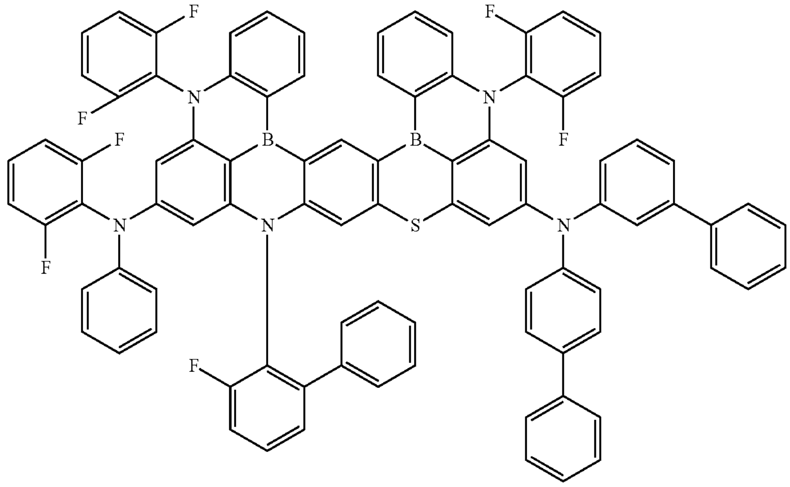
36
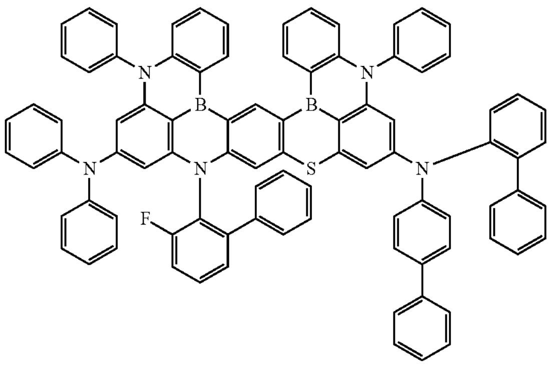
55
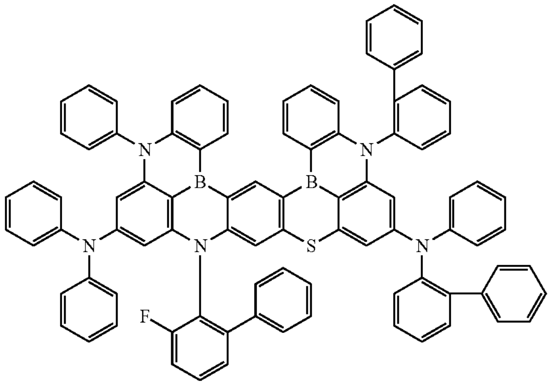
56
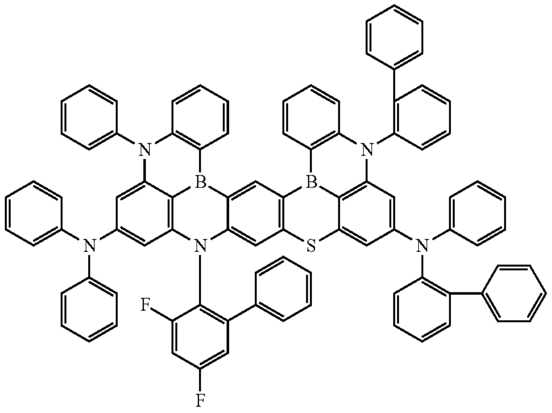
57
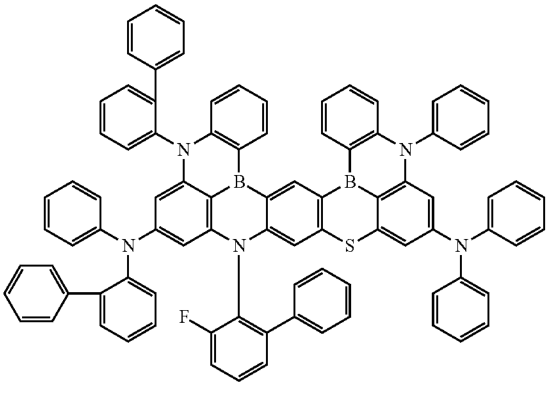

-continued
58
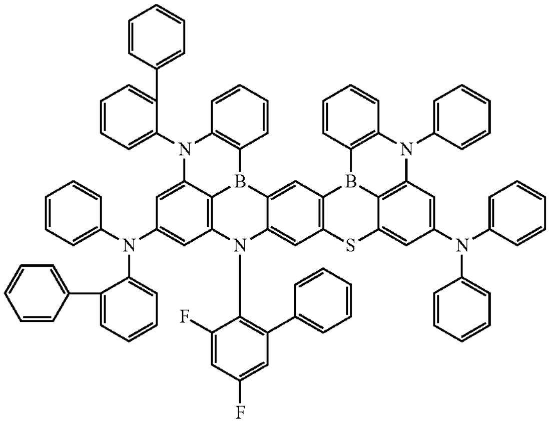
59
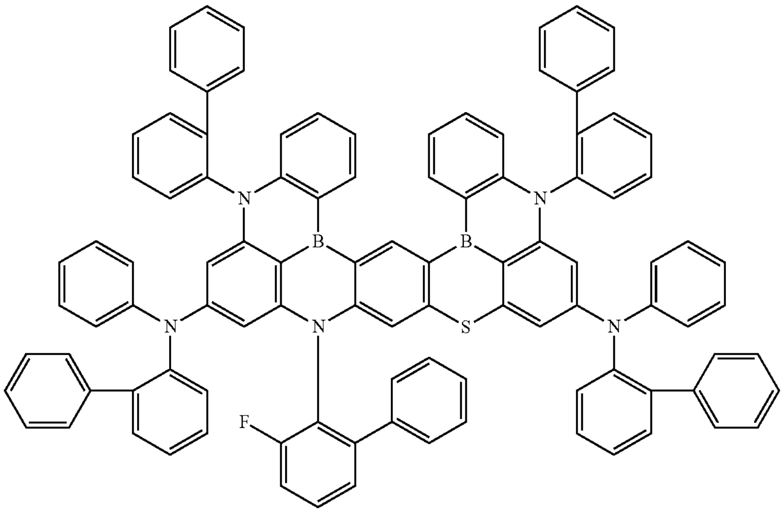
60
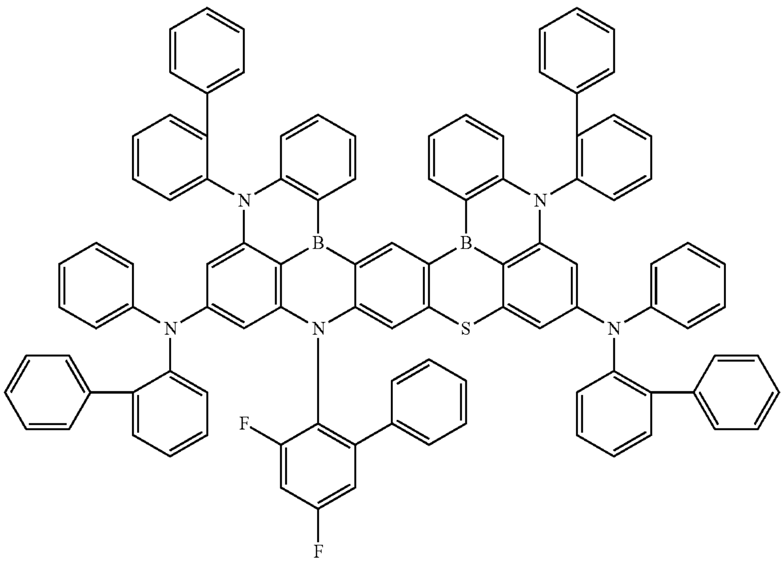

-continued
61
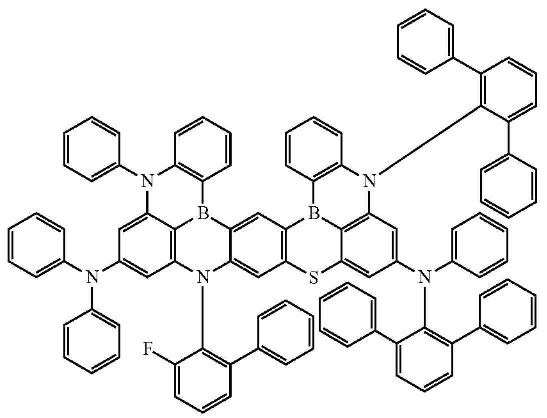
62
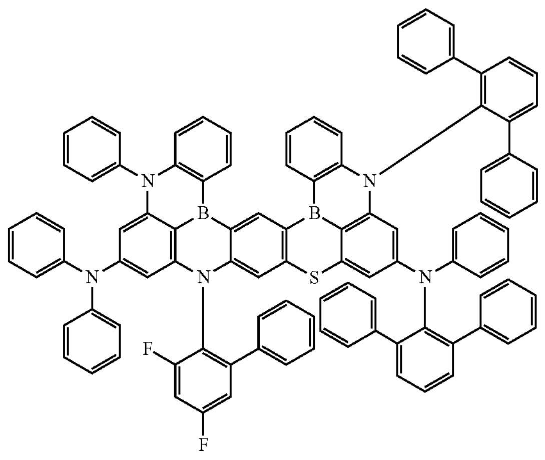
63
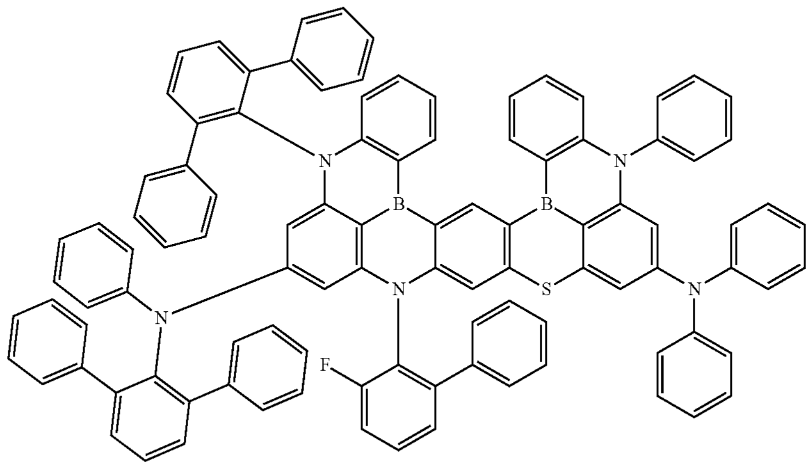
64
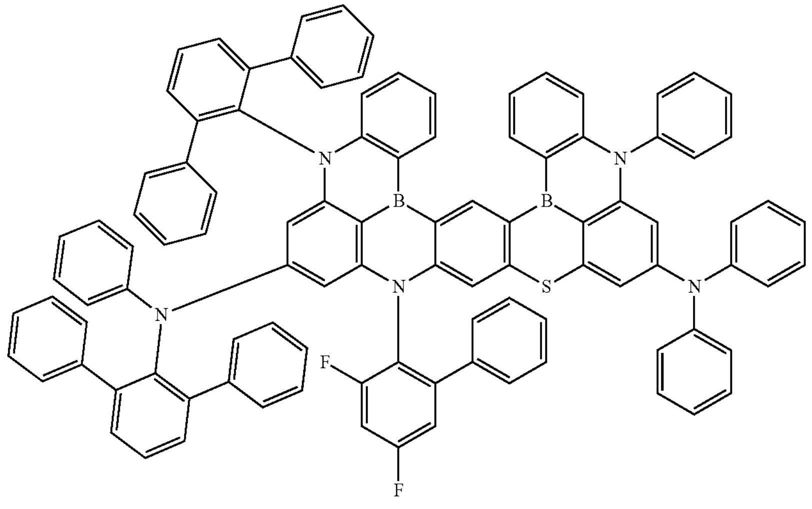

-continued
65
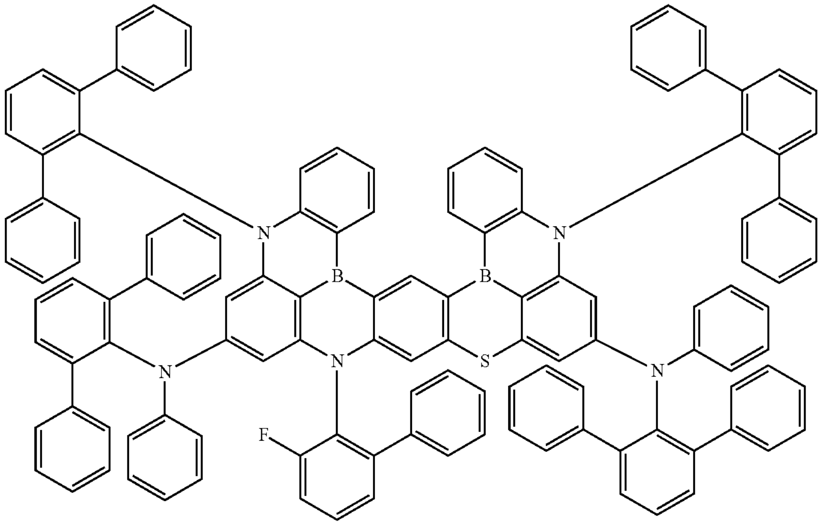
66
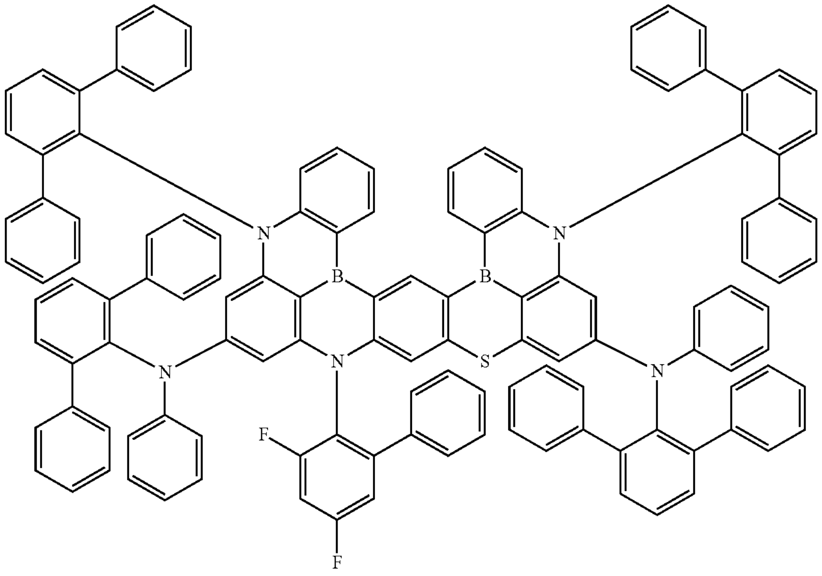
76
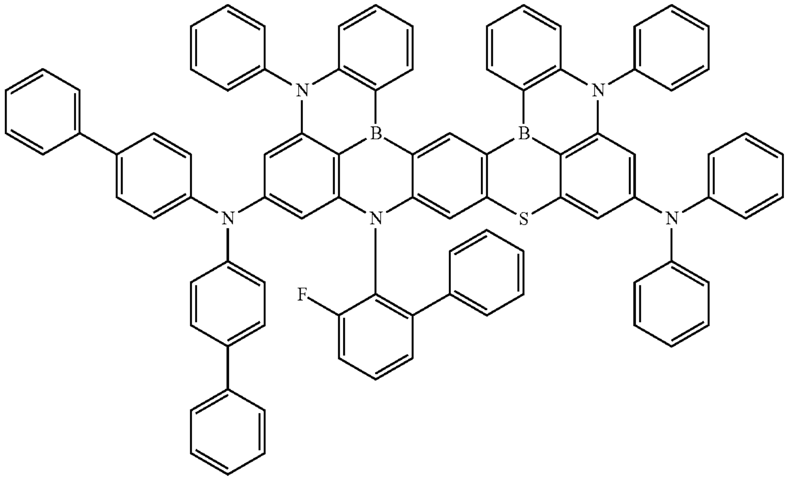

-continued
77
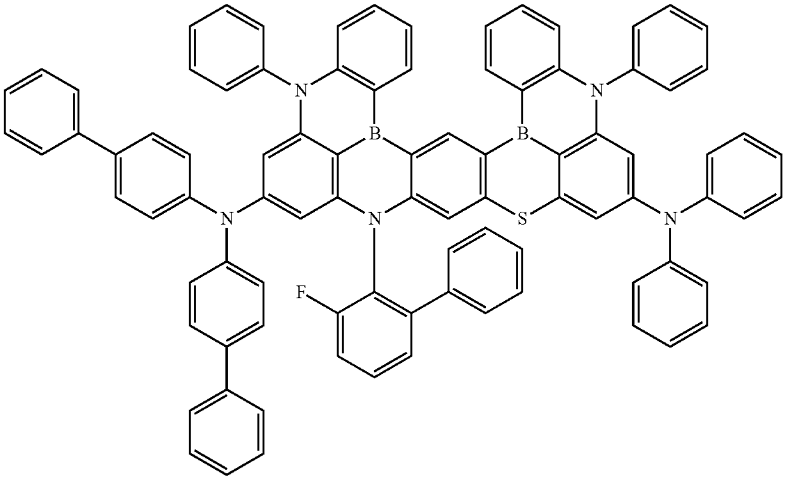
78
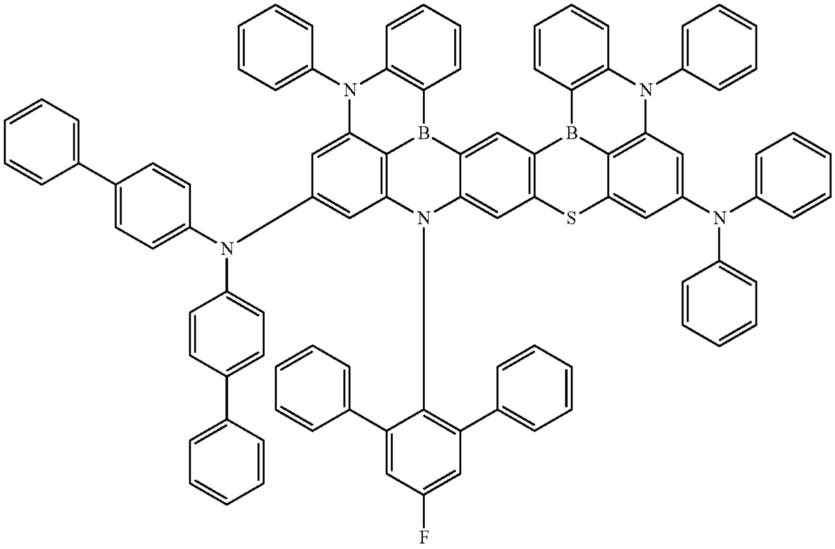
79
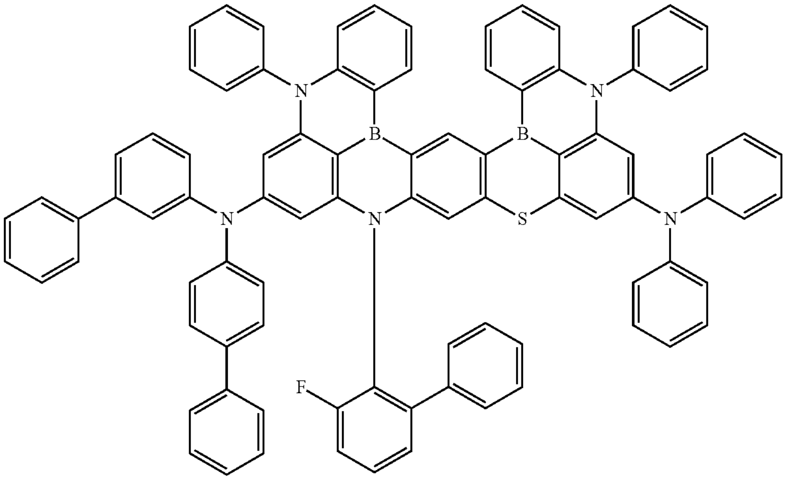

-continued
80
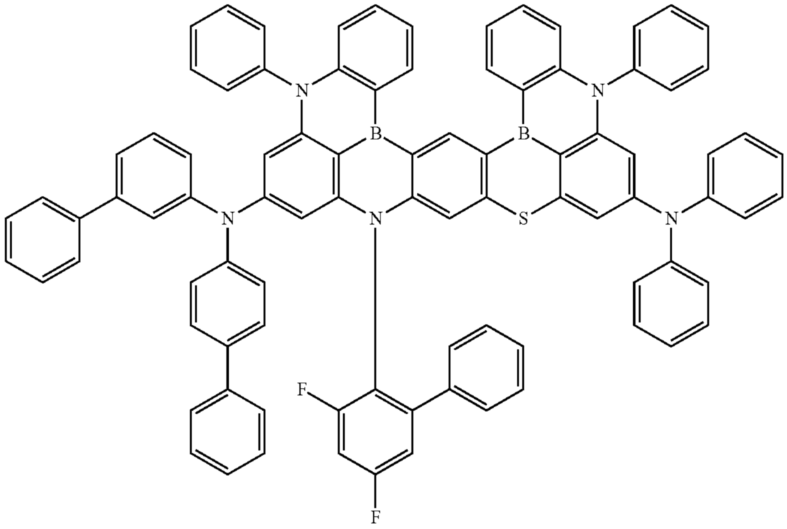
81
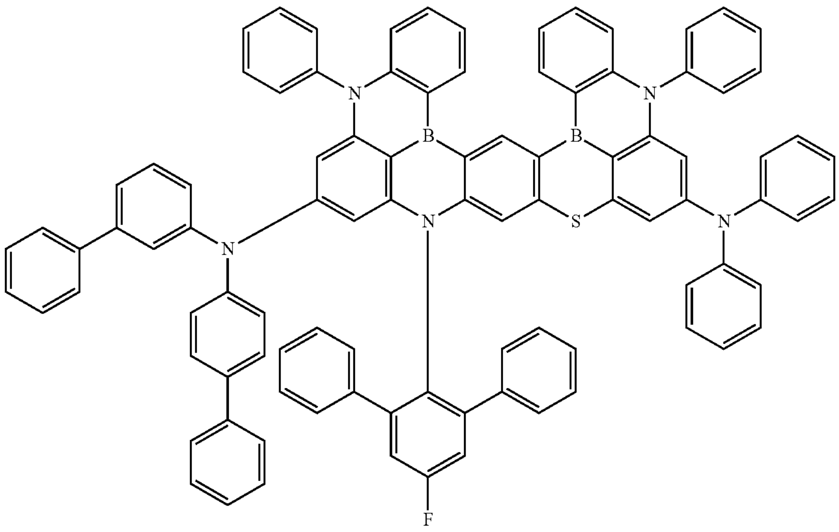
82
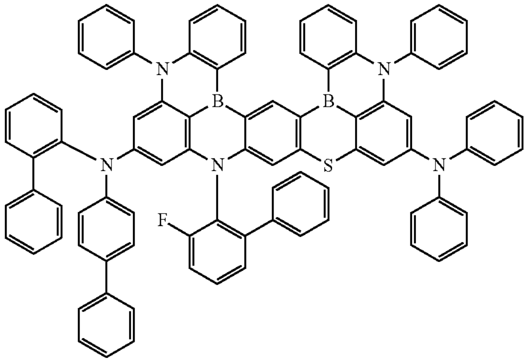
83
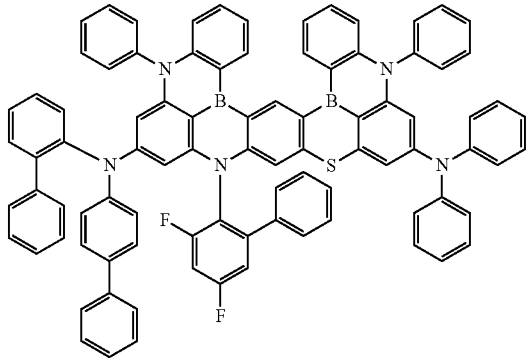

-continued
84
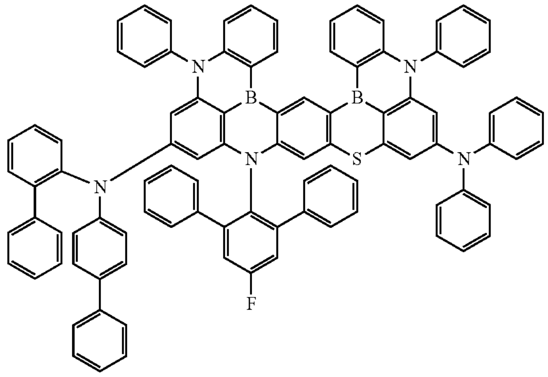
94
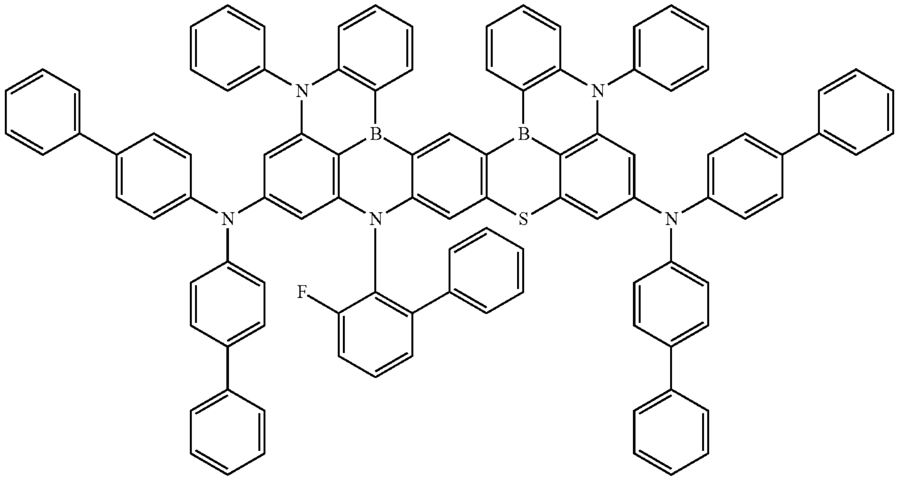
95
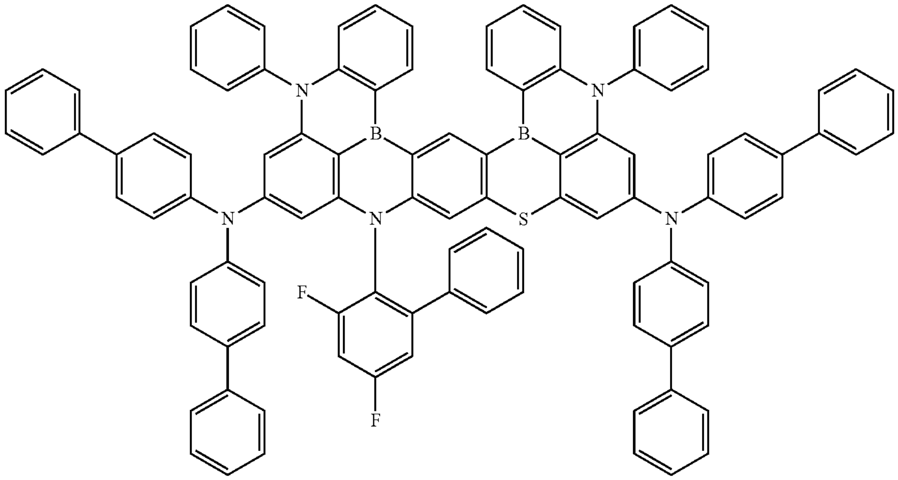

-continued
96
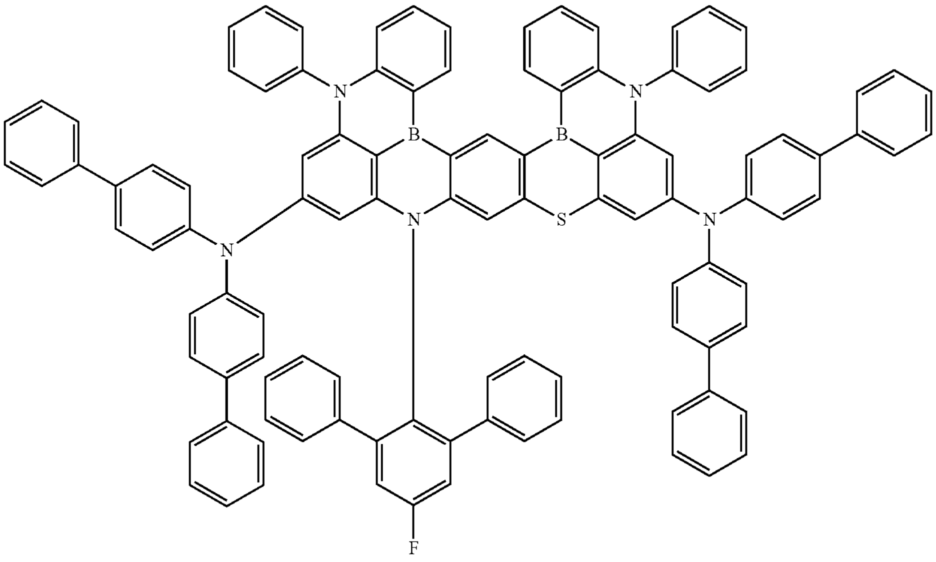
97
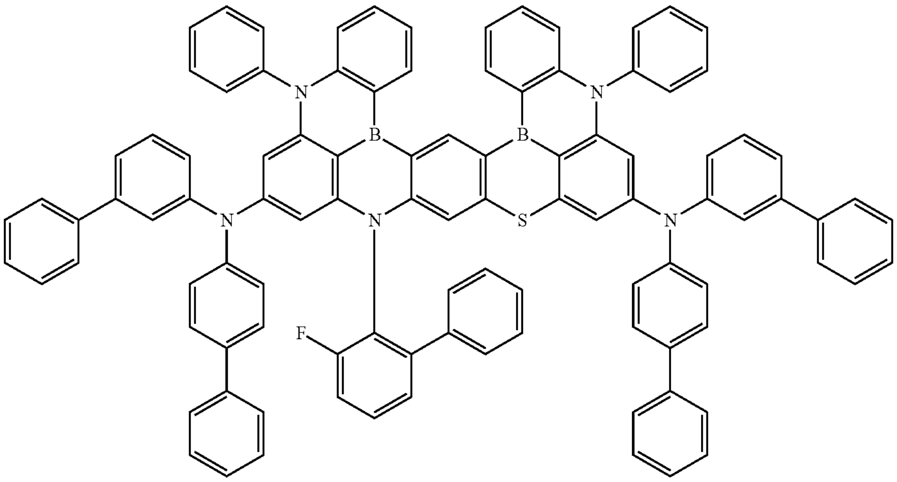
98
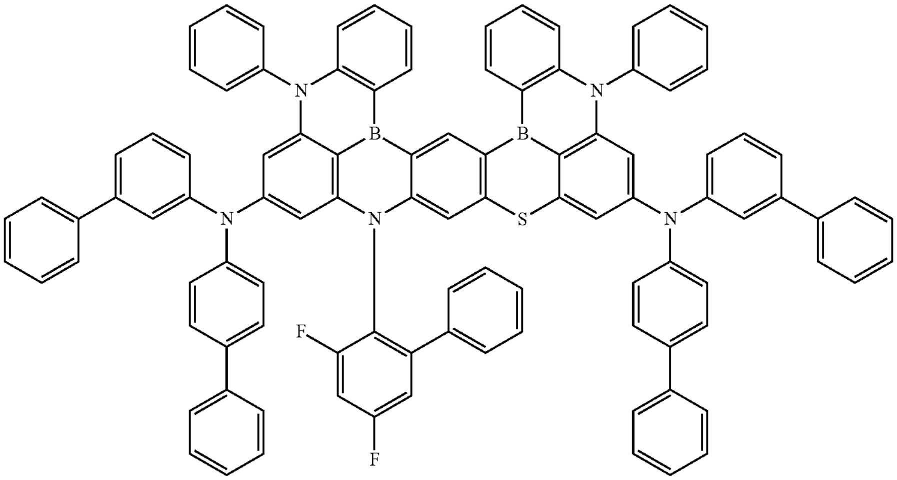

-continued
99
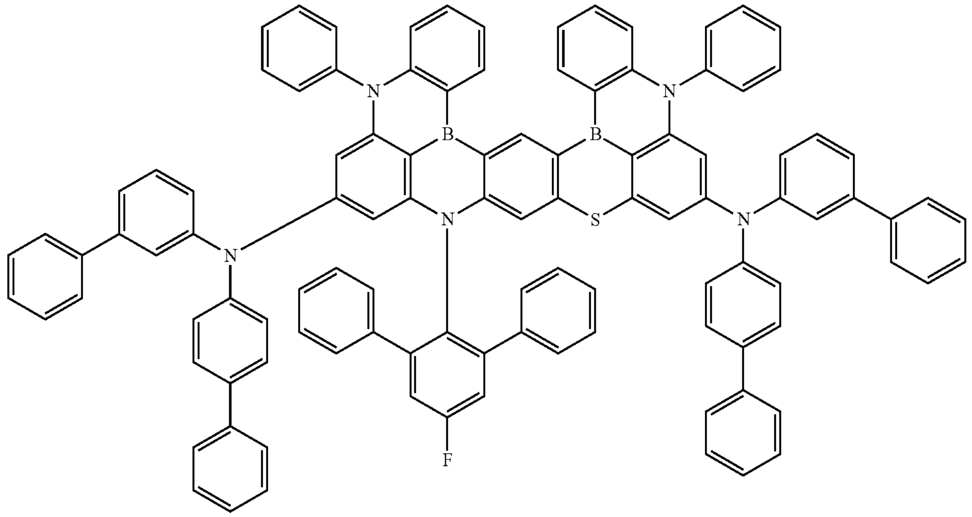
100
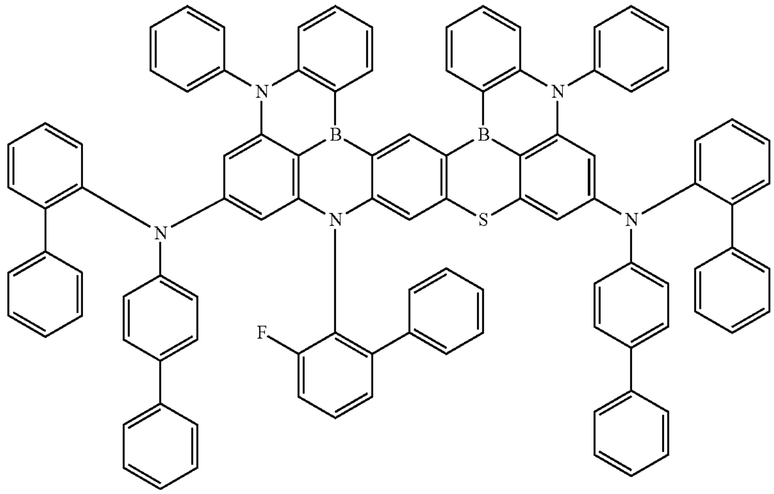
101
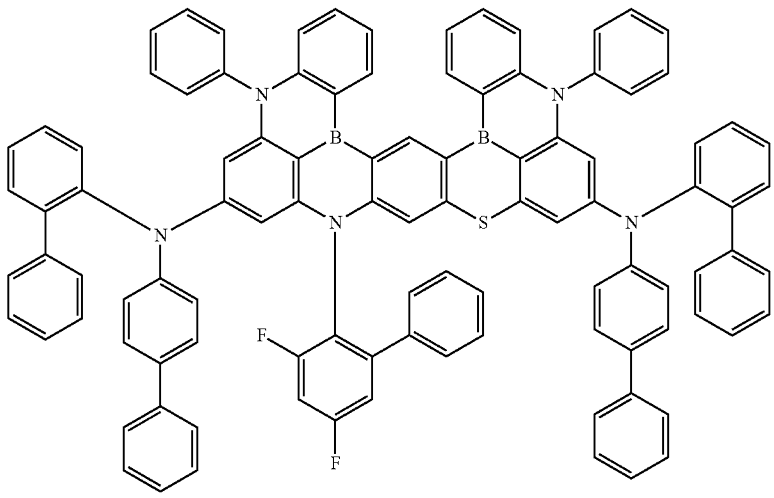

-continued
102
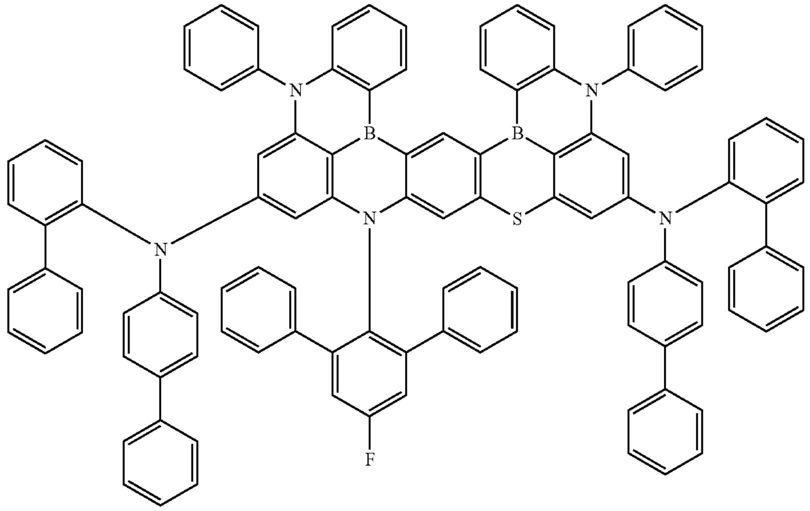
112
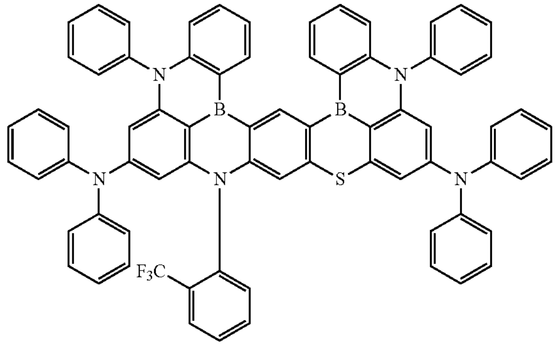
113
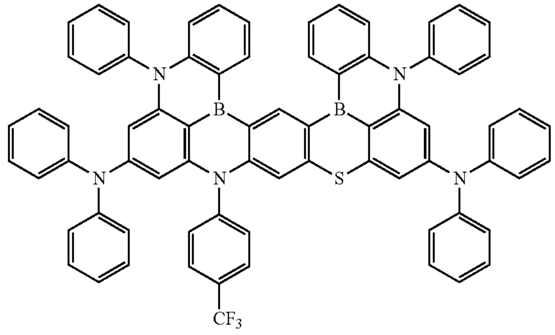
114
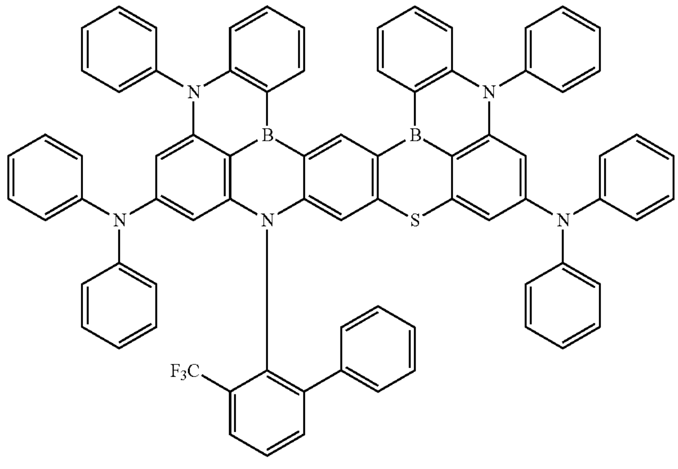

-continued
115
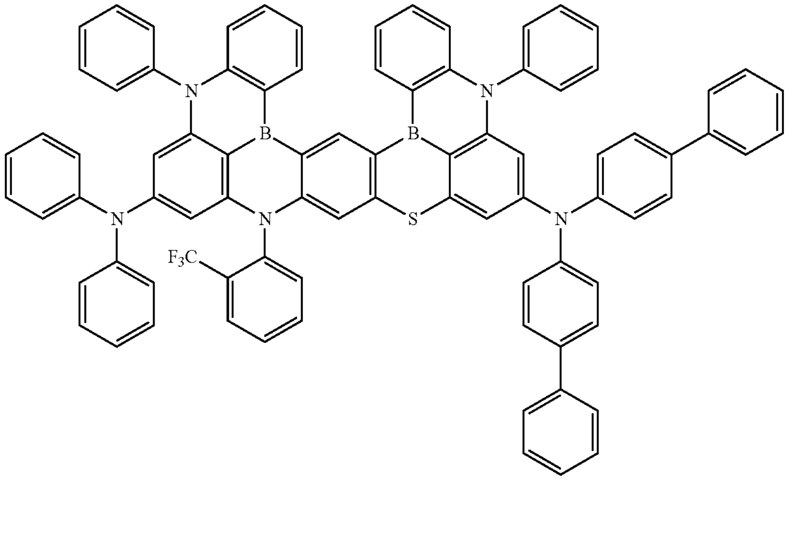
116
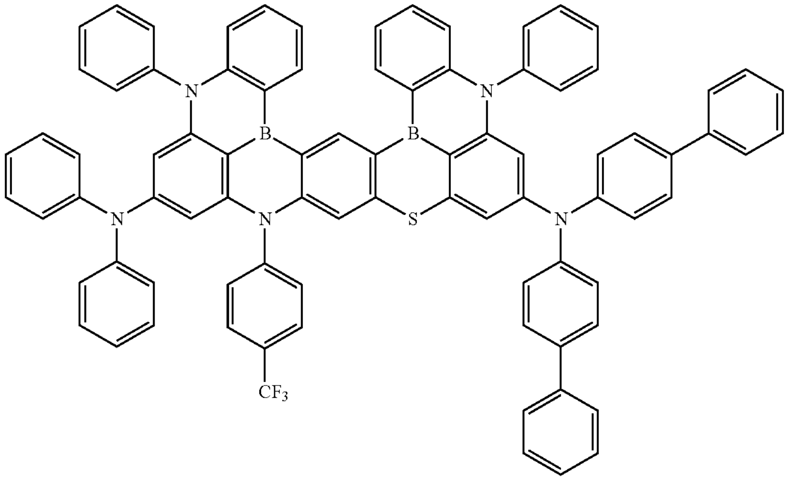
117
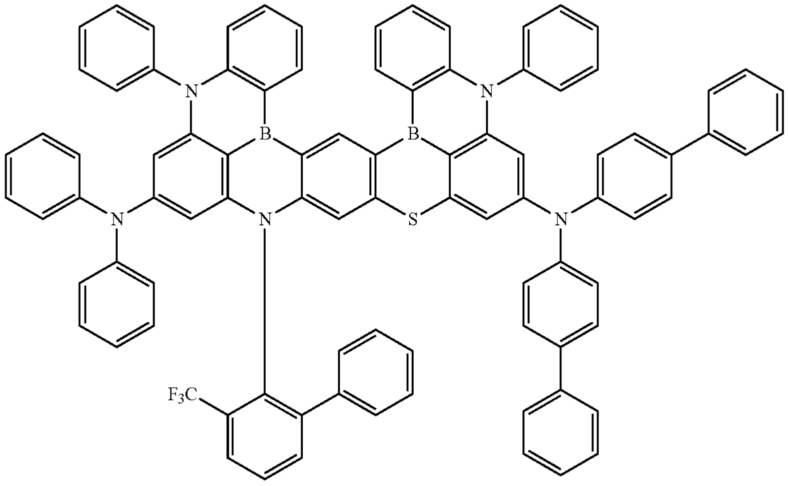

-continued
118
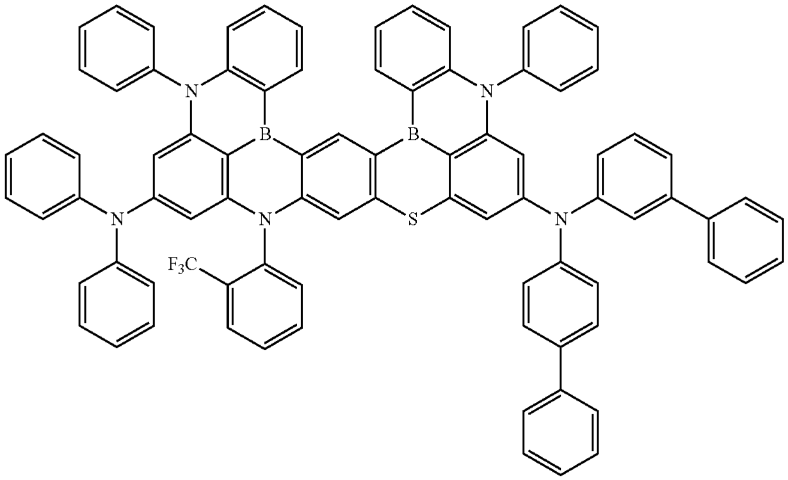
119
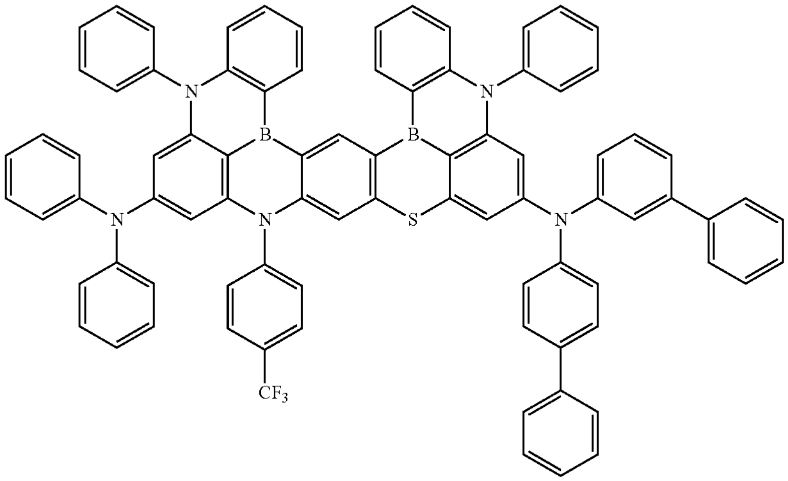
120
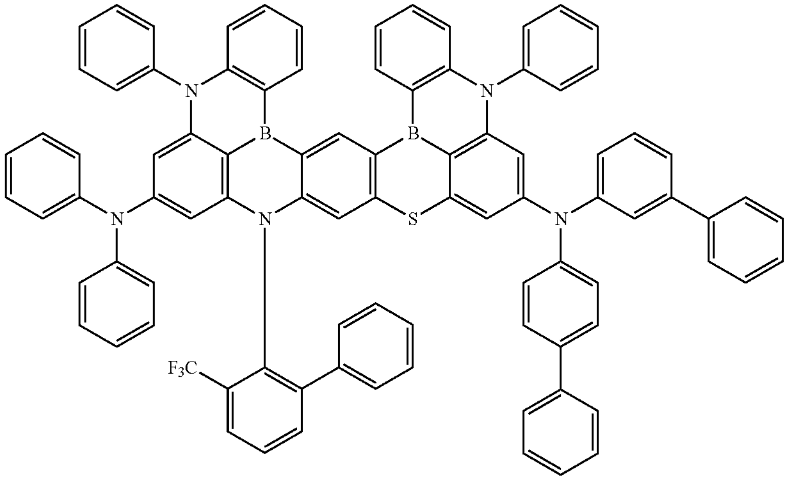

-continued
121
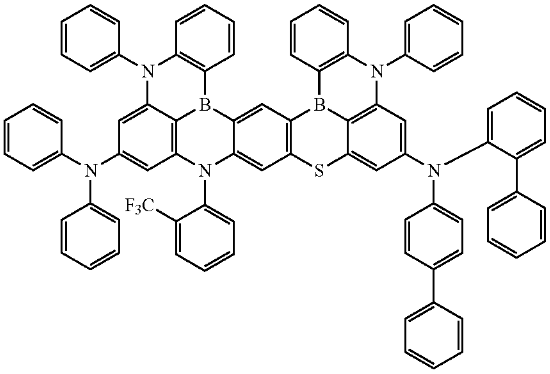
122
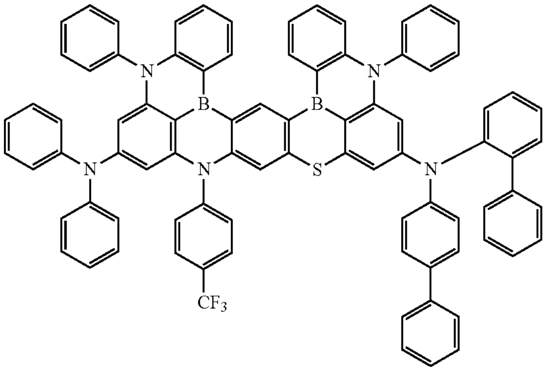
123
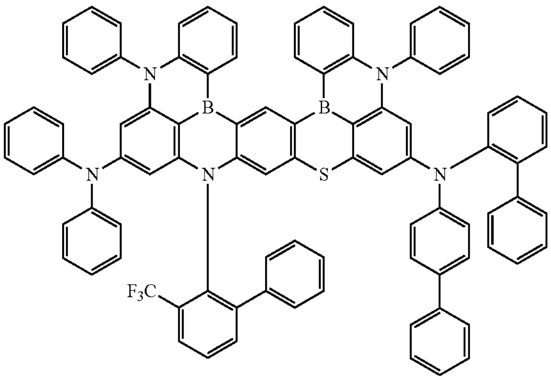
124
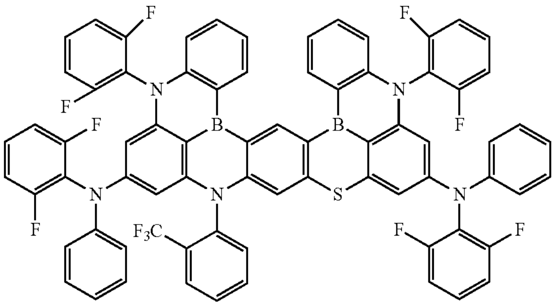
125
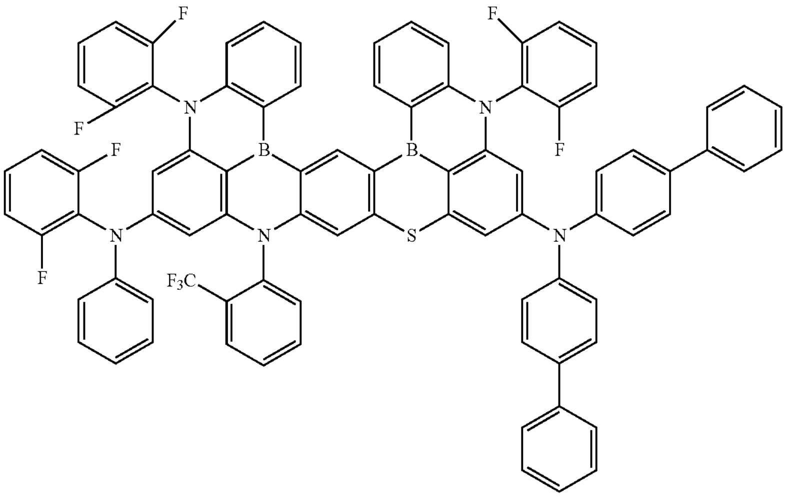

-continued
126
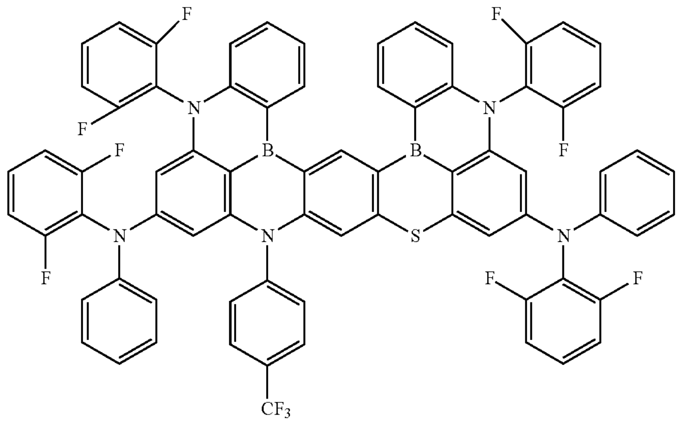
127
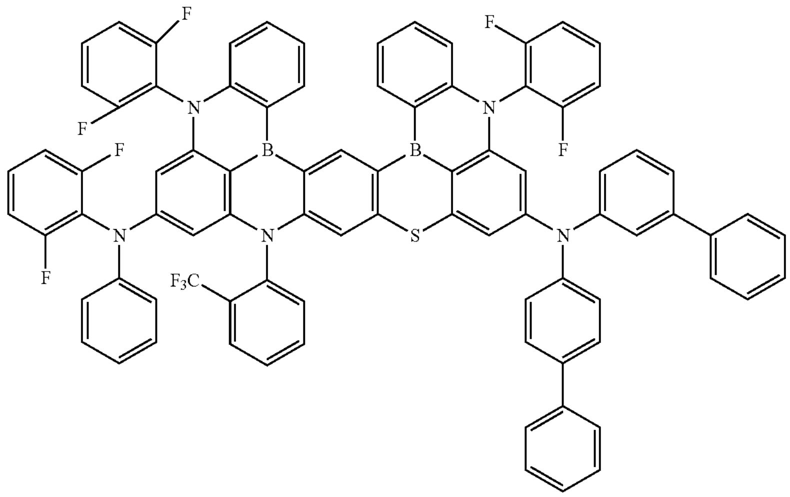
128
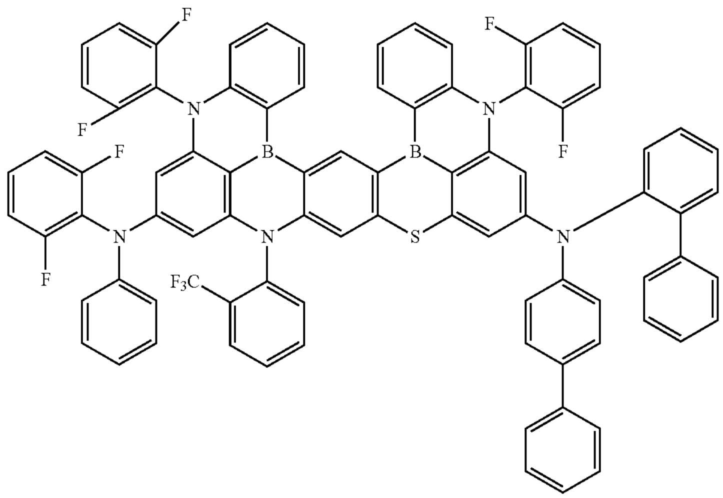

-continued
129
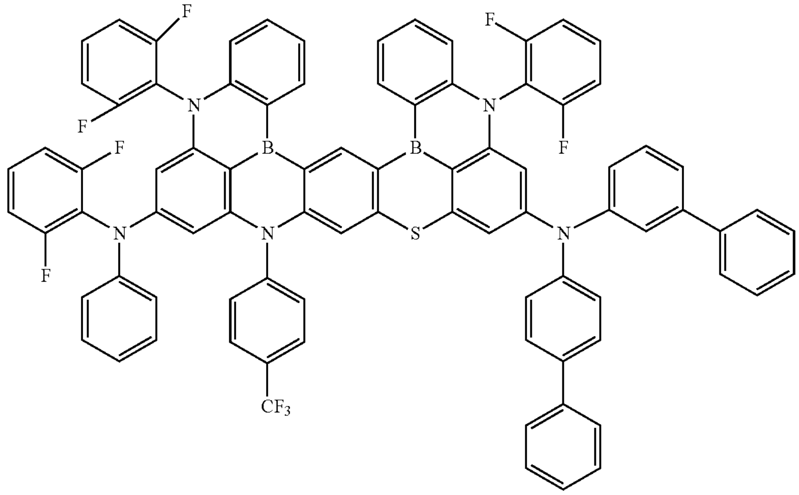
130
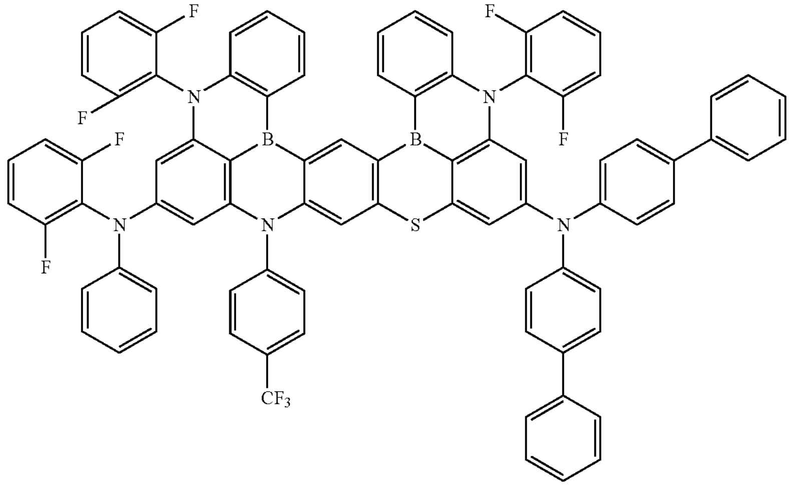
131
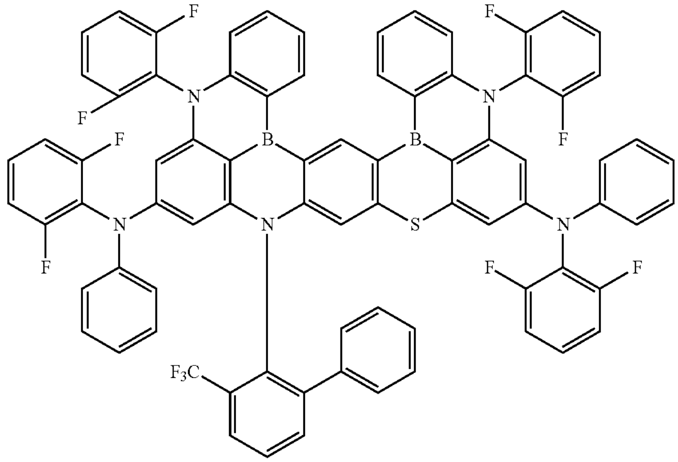

-continued
132
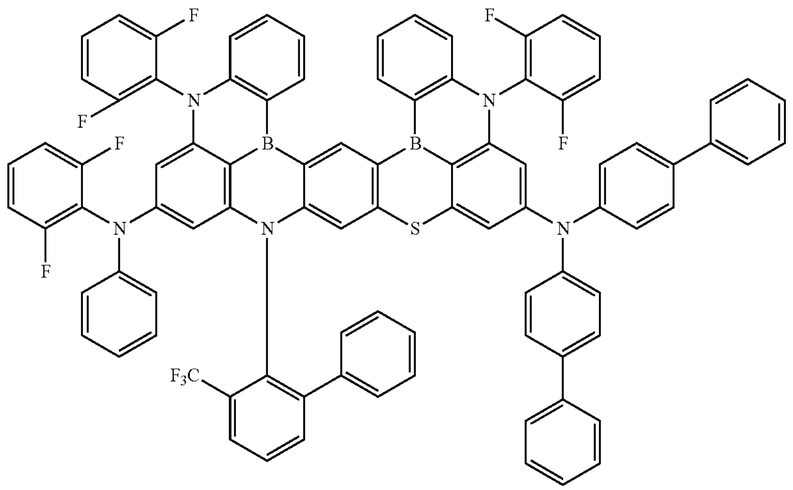
133
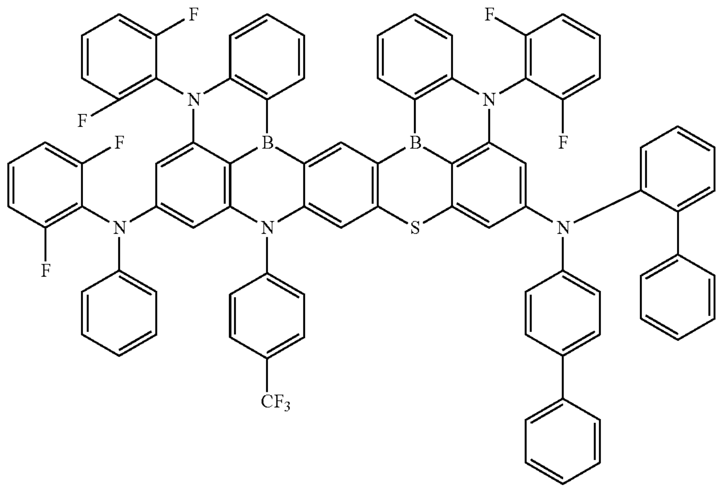
134
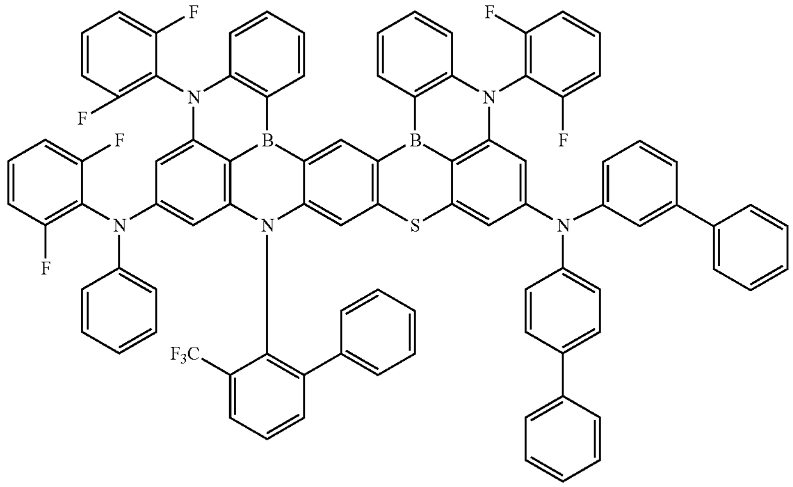

-continued
135
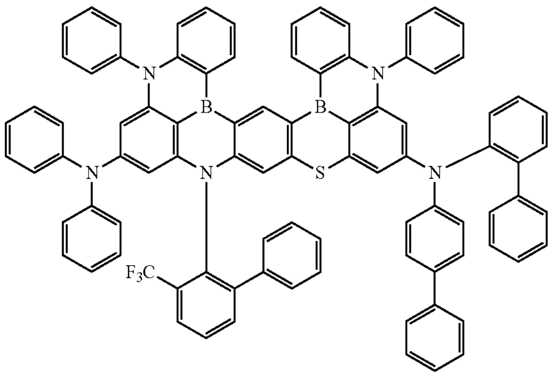
136
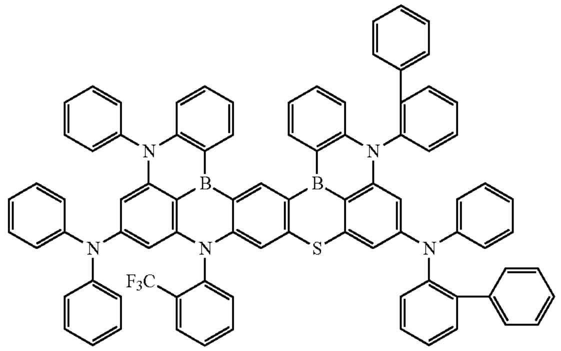
137
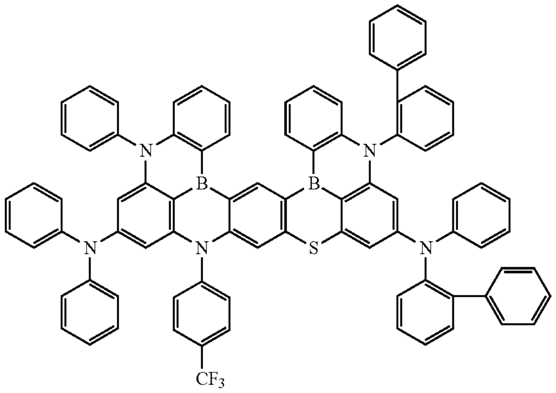
138
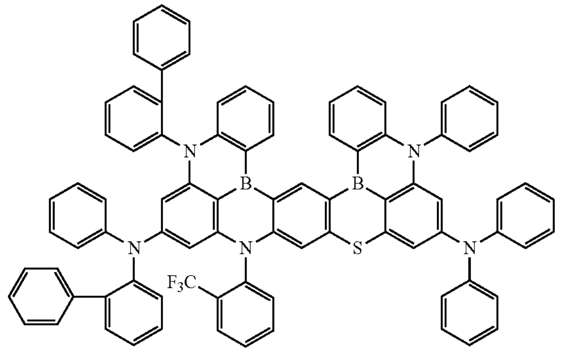
139
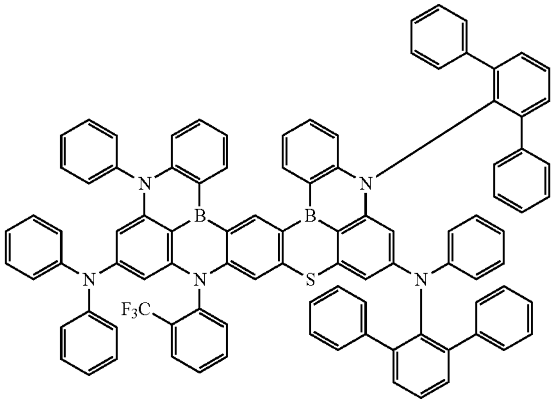
140
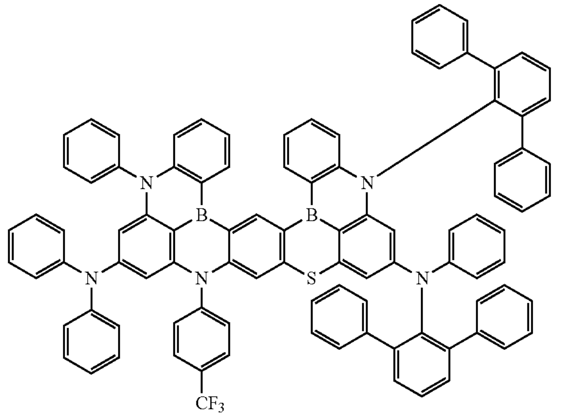

-continued
141
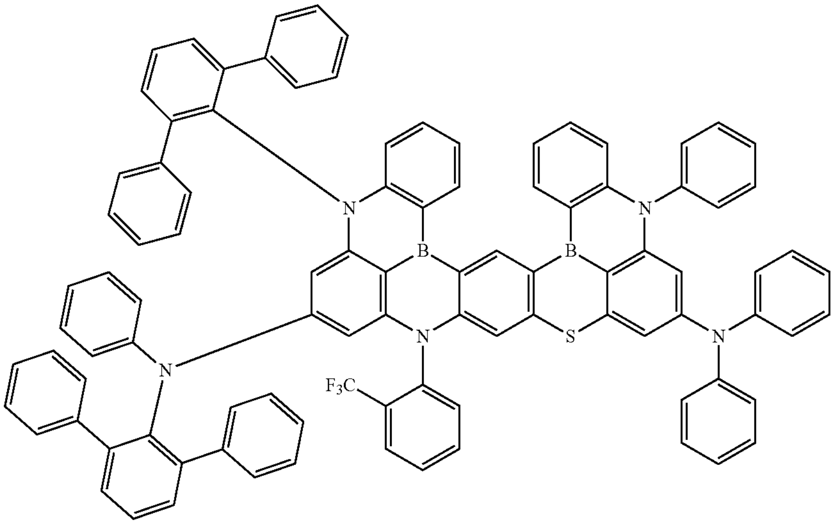
142
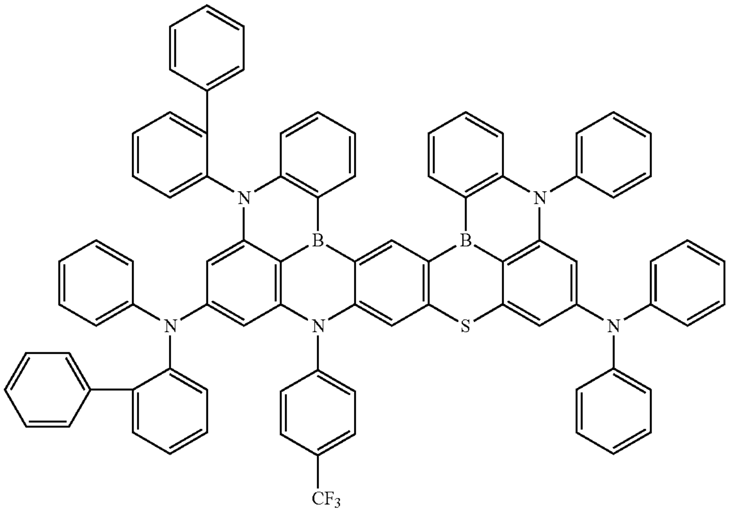
143
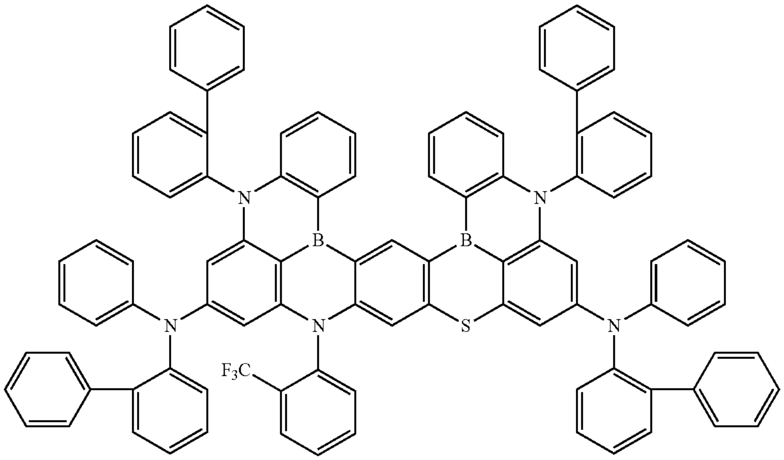

-continued
144
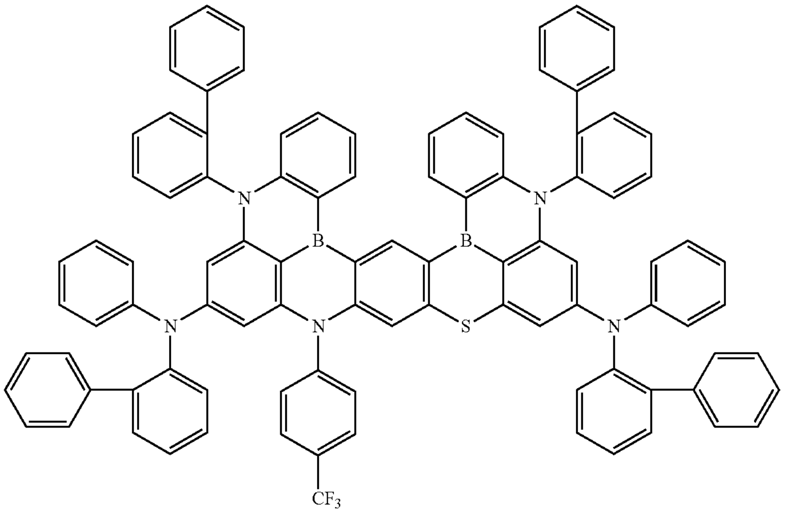
145
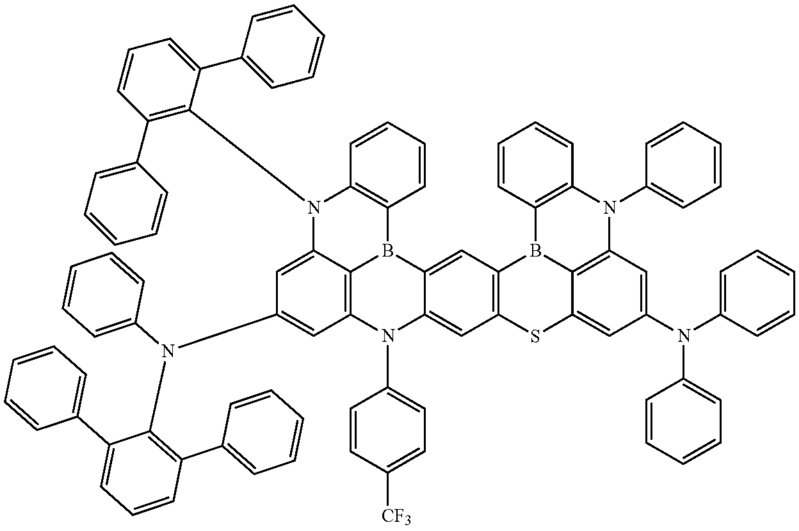
146
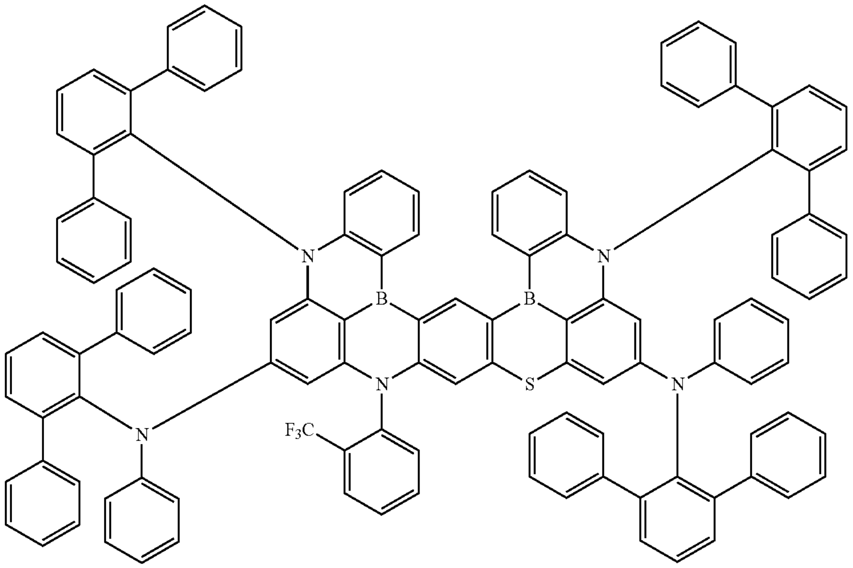

-continued
147
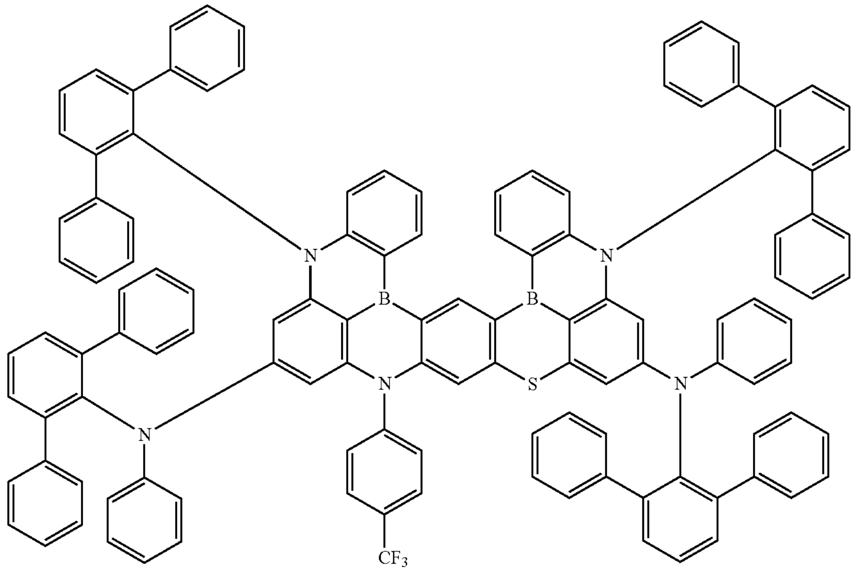
148
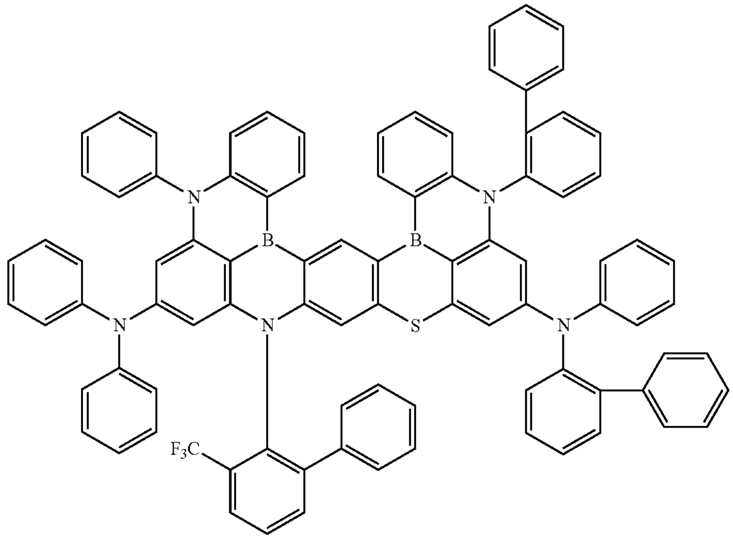

-continued
149
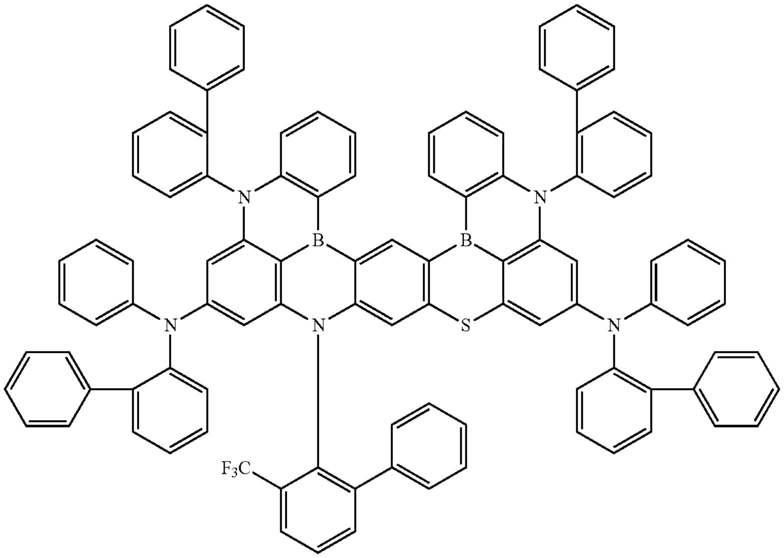
150
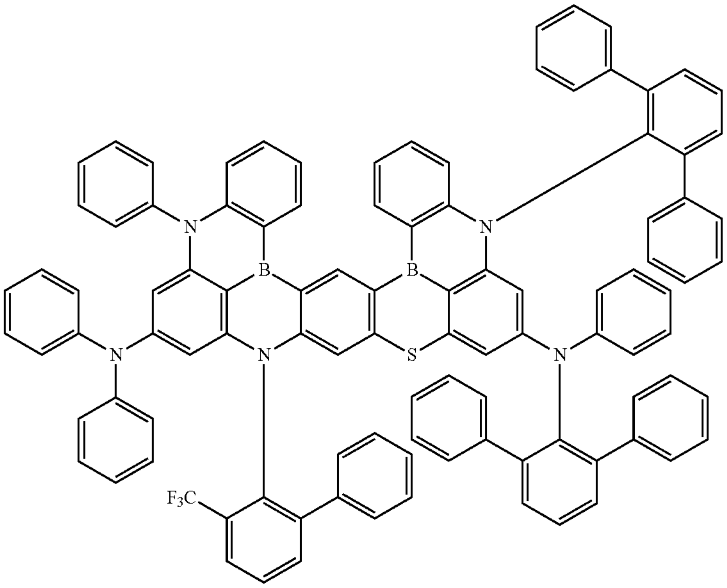

-continued
151
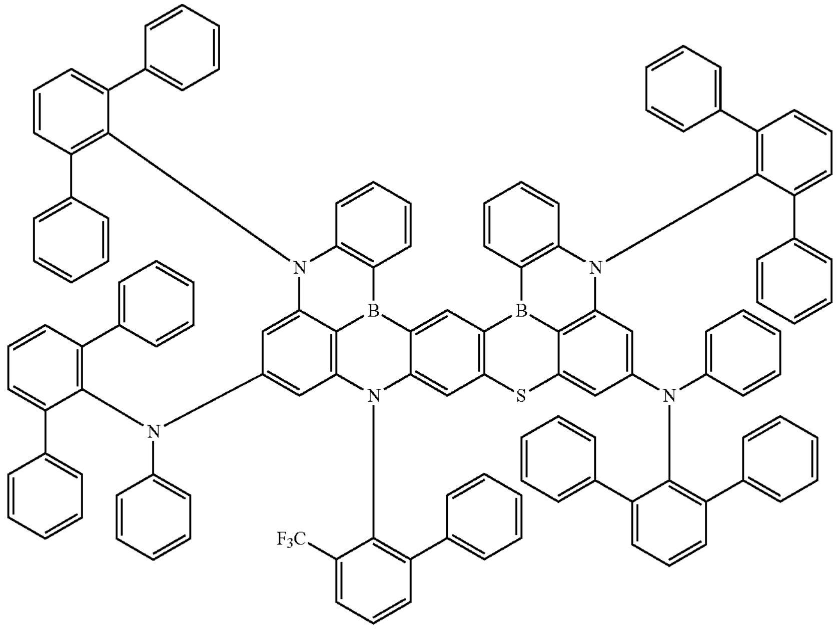
152
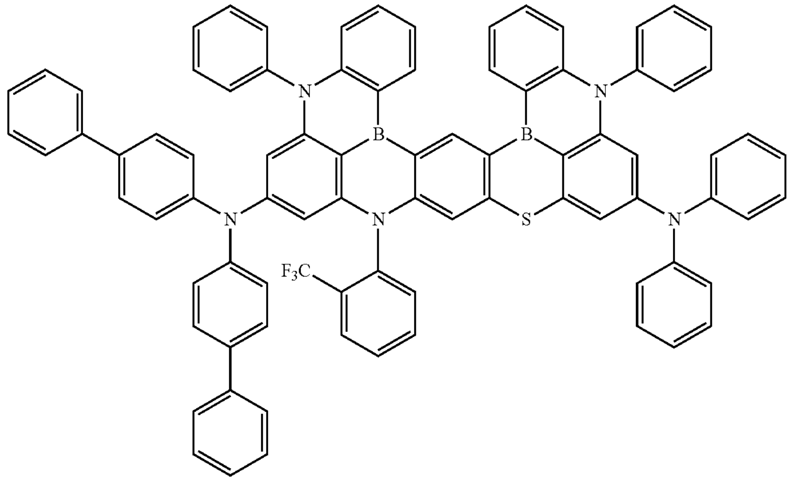

153
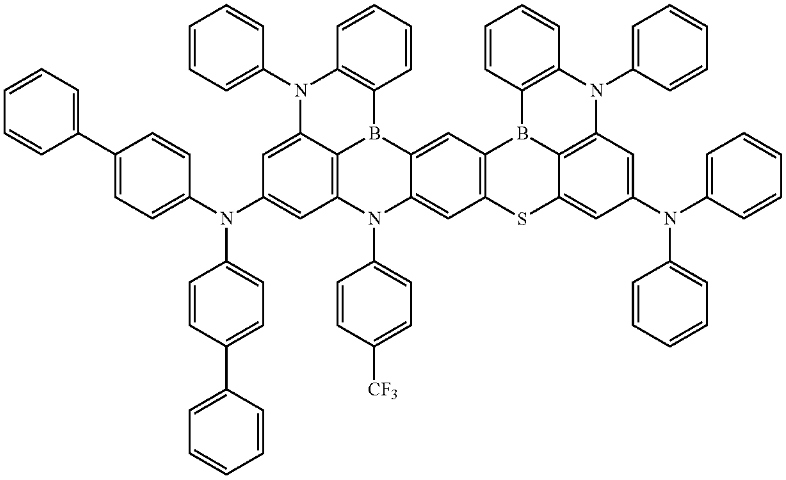
154
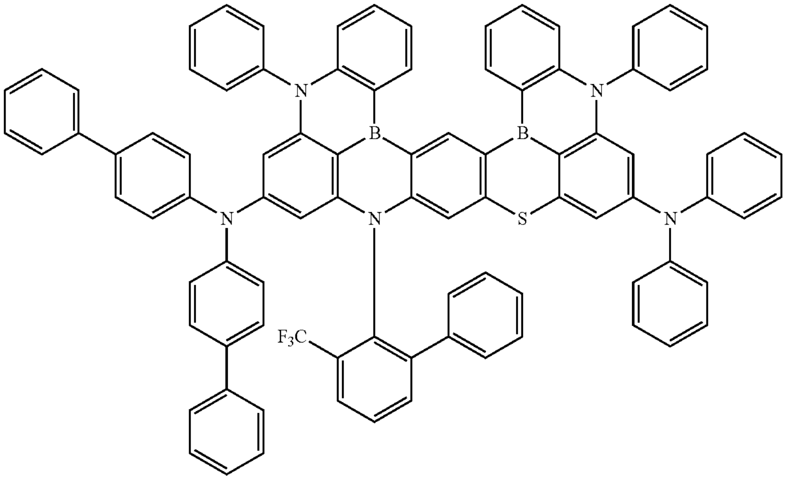
155
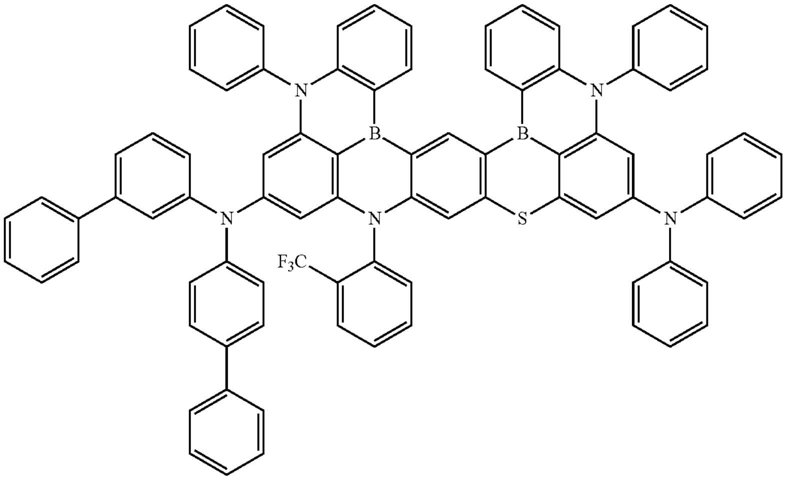

-continued
156
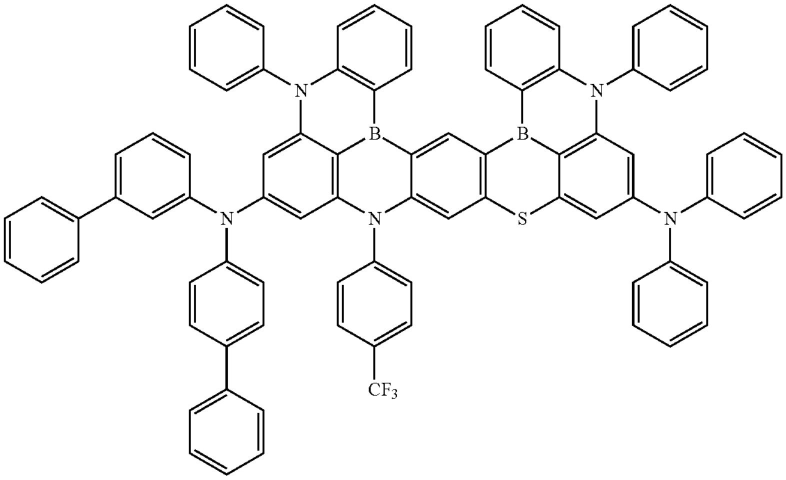
157
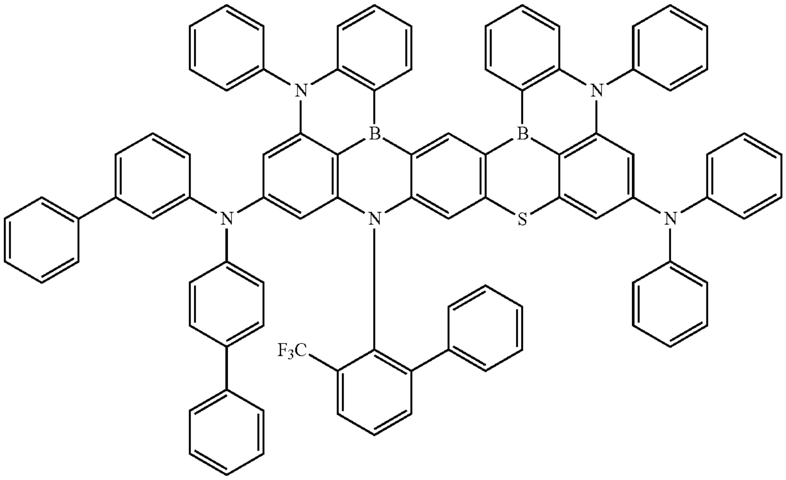
158
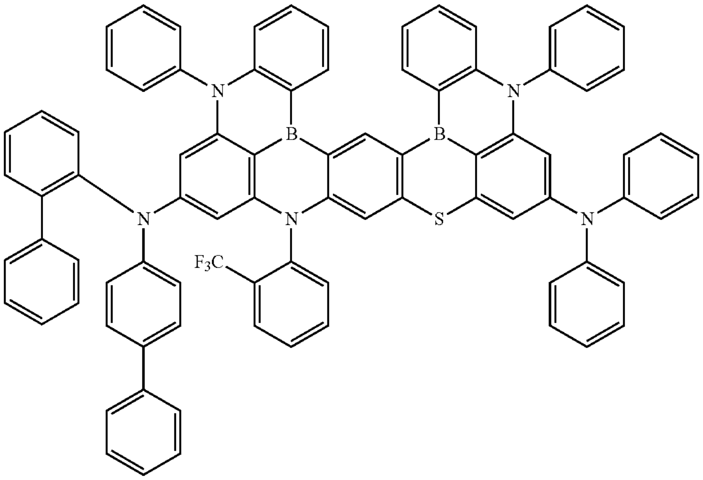

-continued
159
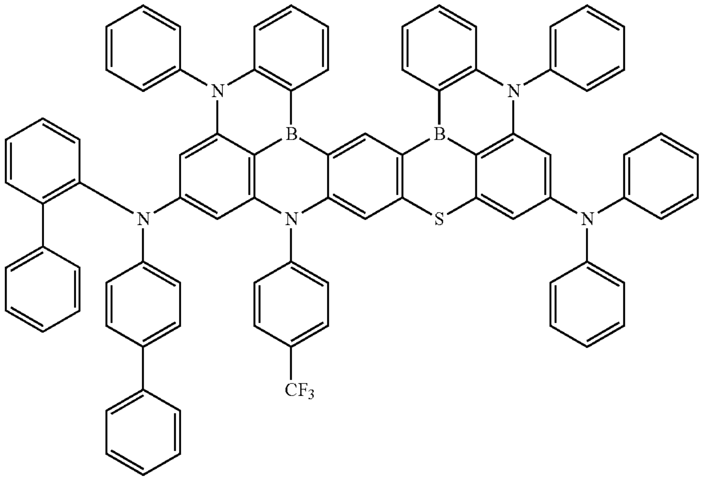
160
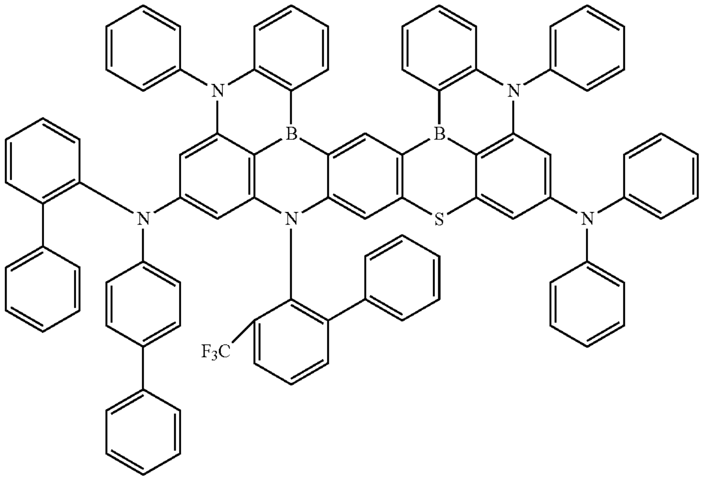
161
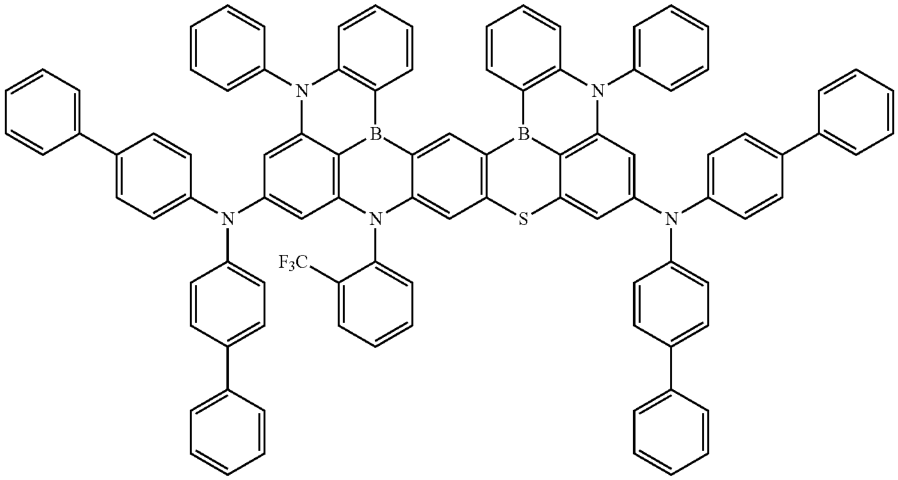

-continued
162
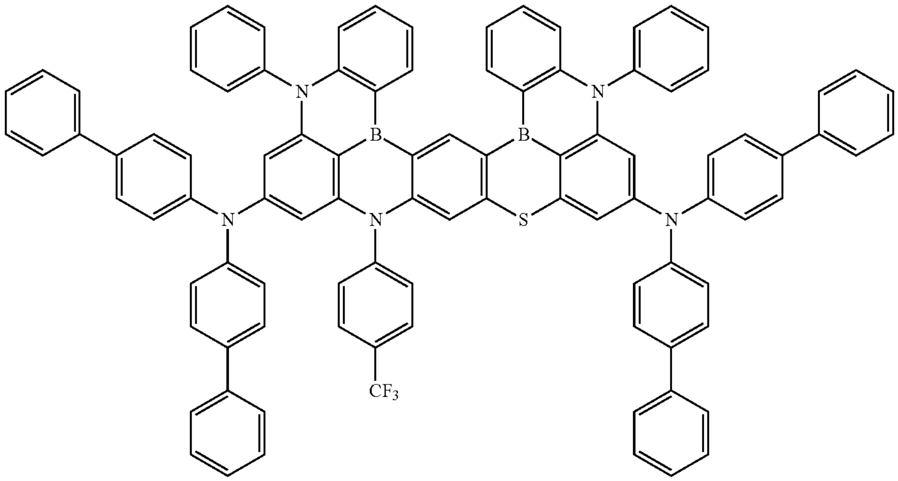
163
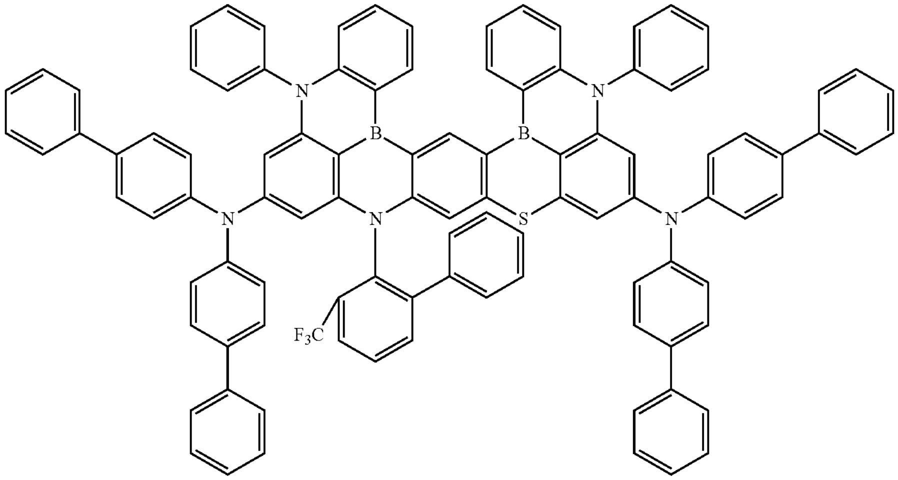
164
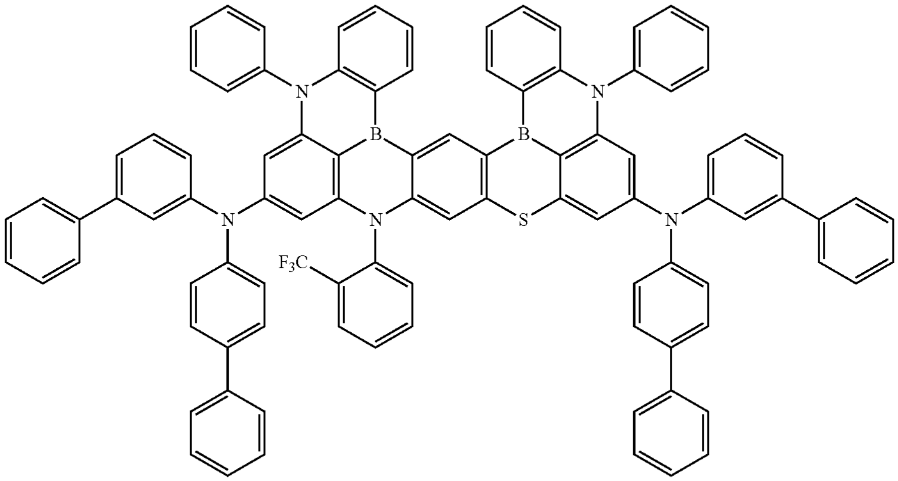

-continued
165
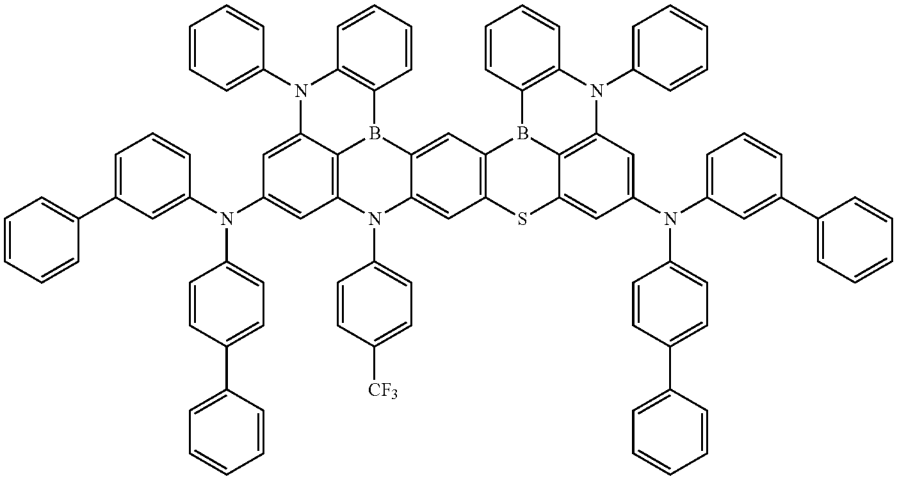
166
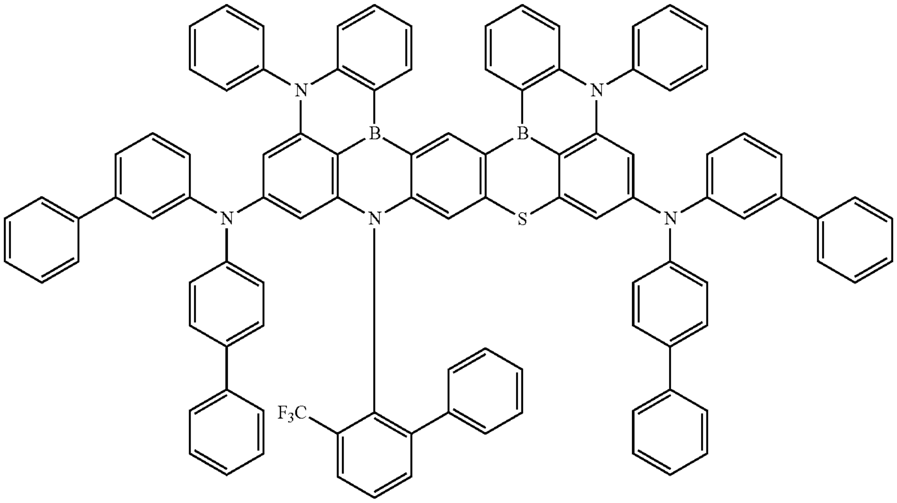
167
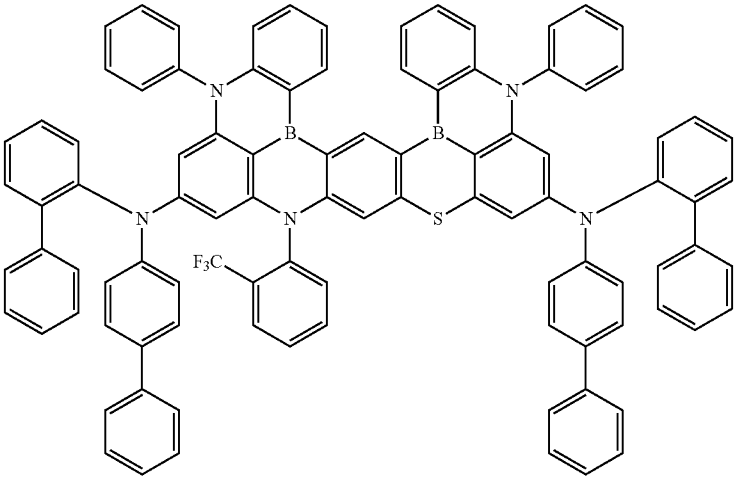

-continued
168
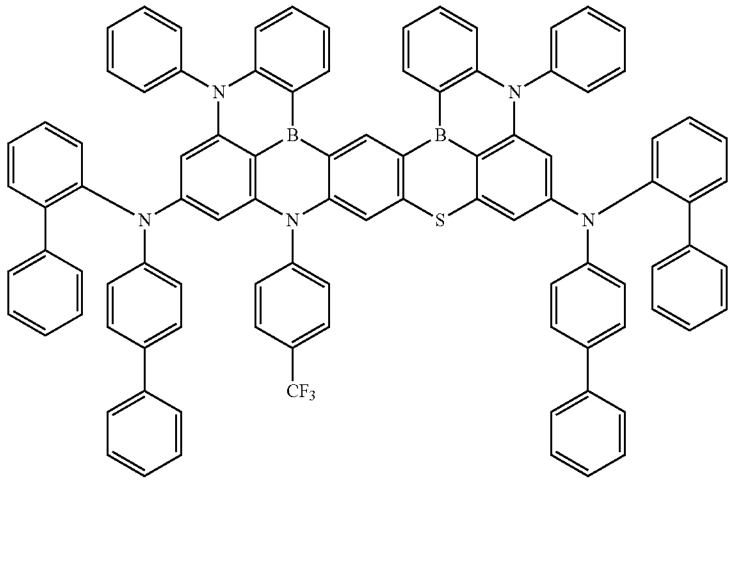
169
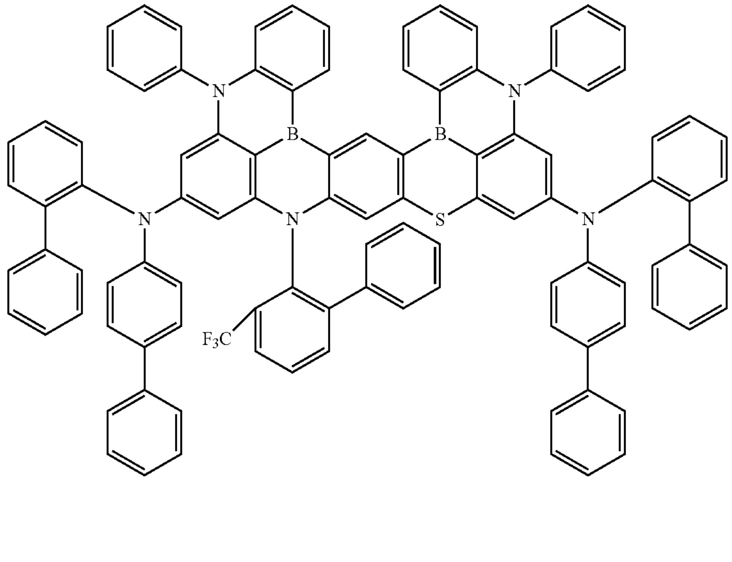
173
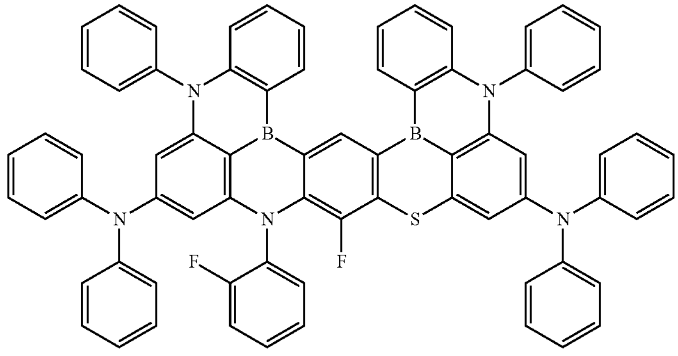

-continued
175
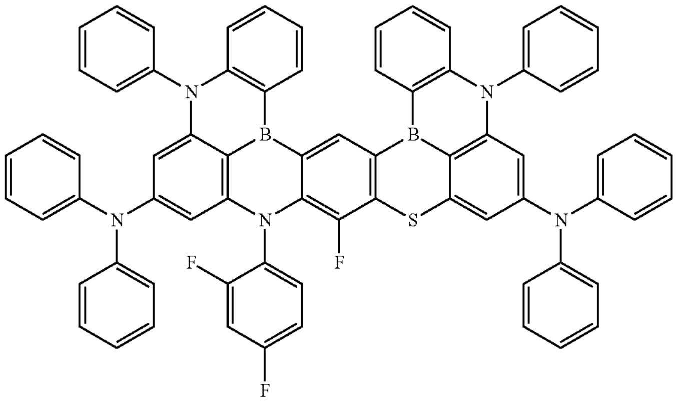
176
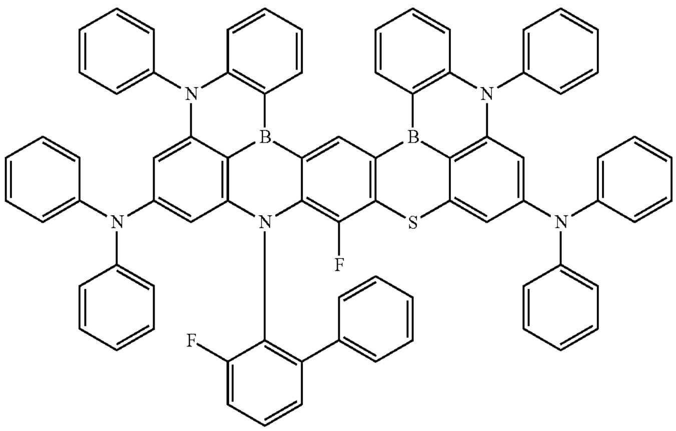
177
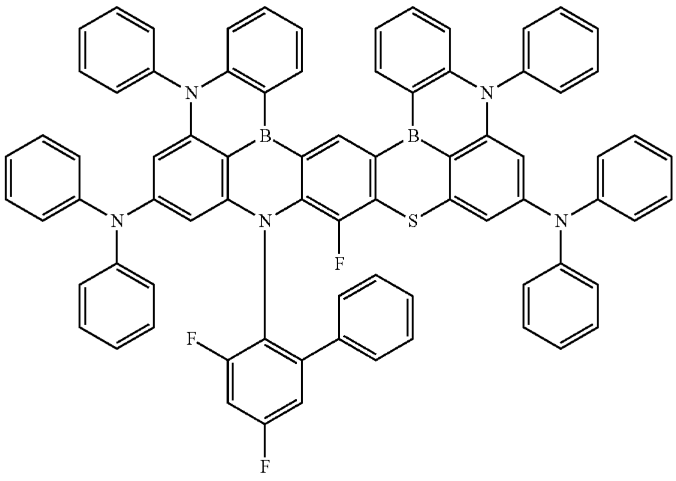

-continued
178
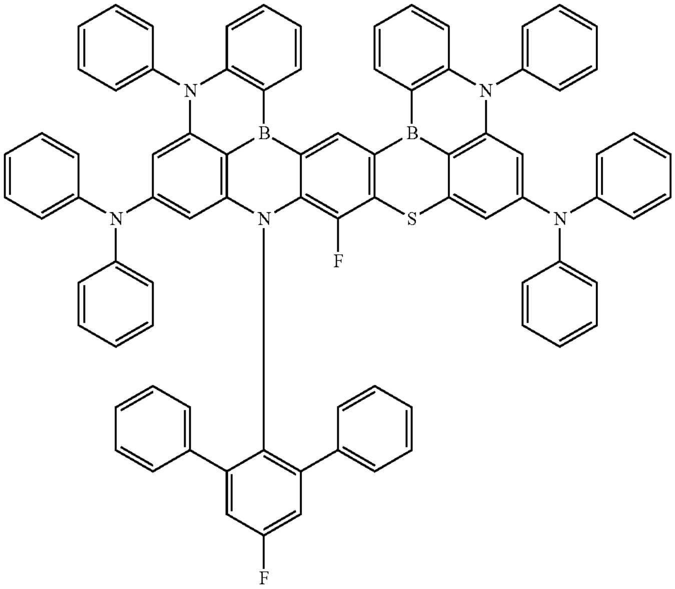
179
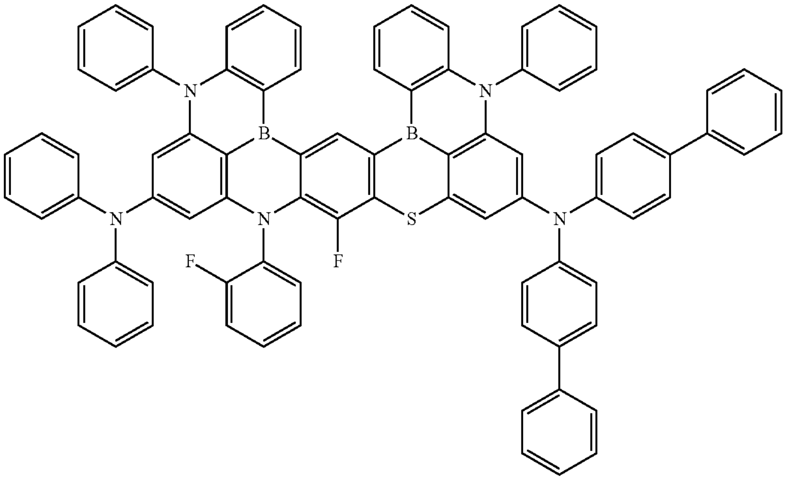
182
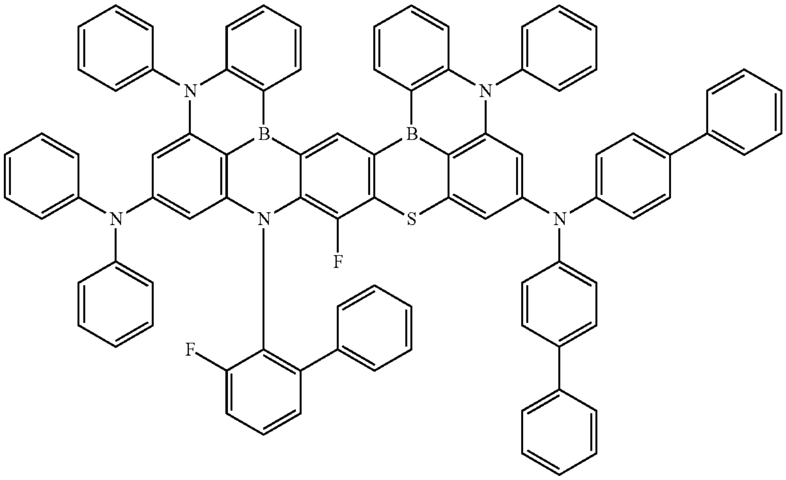

-continued
183
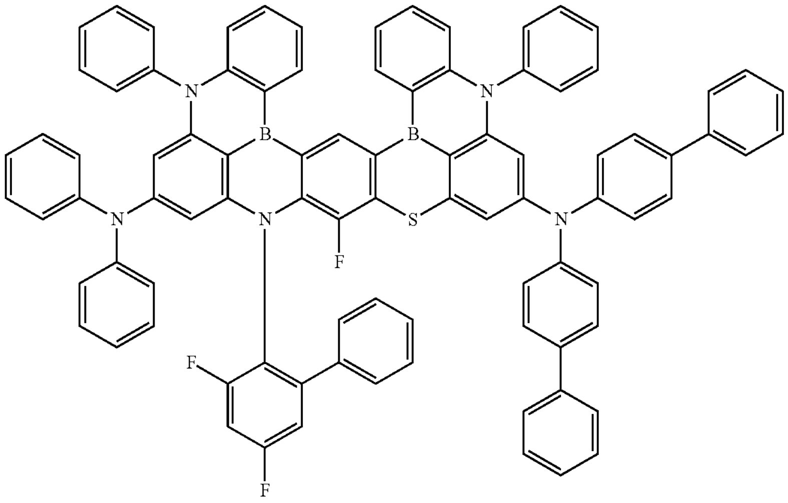
184
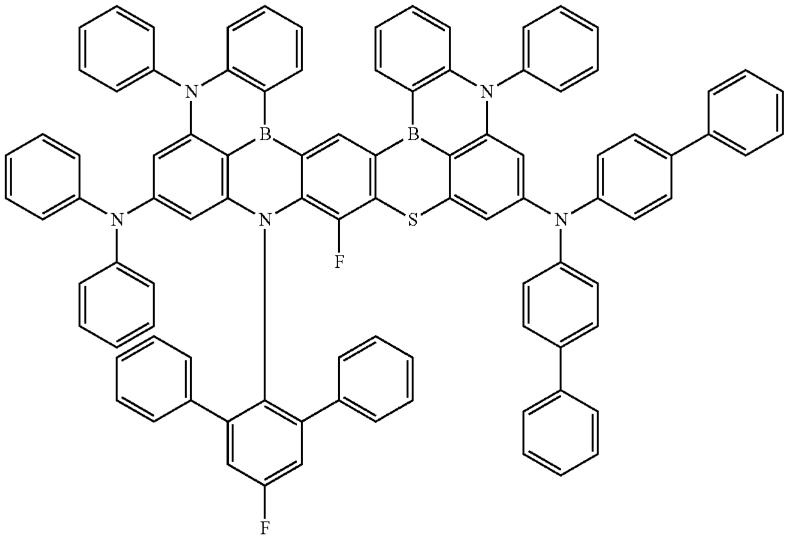
185
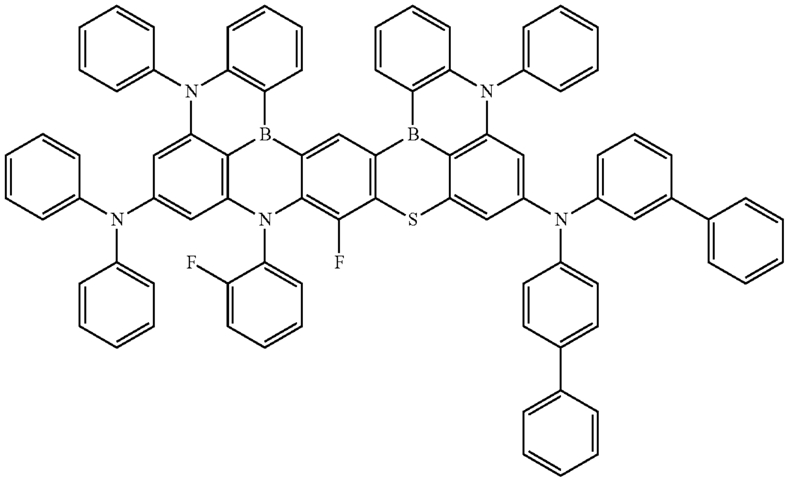

-continued
188
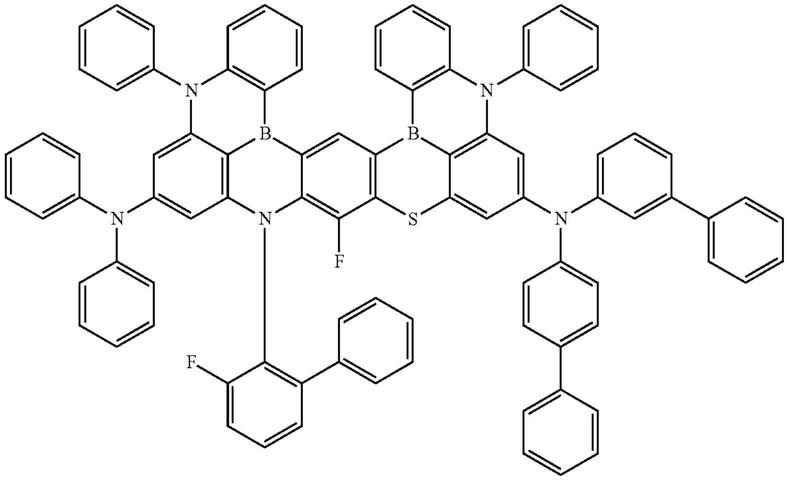
189
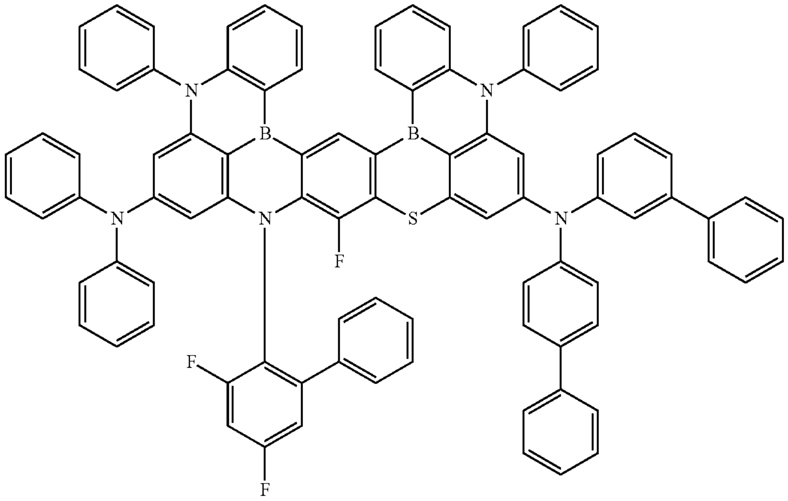
190
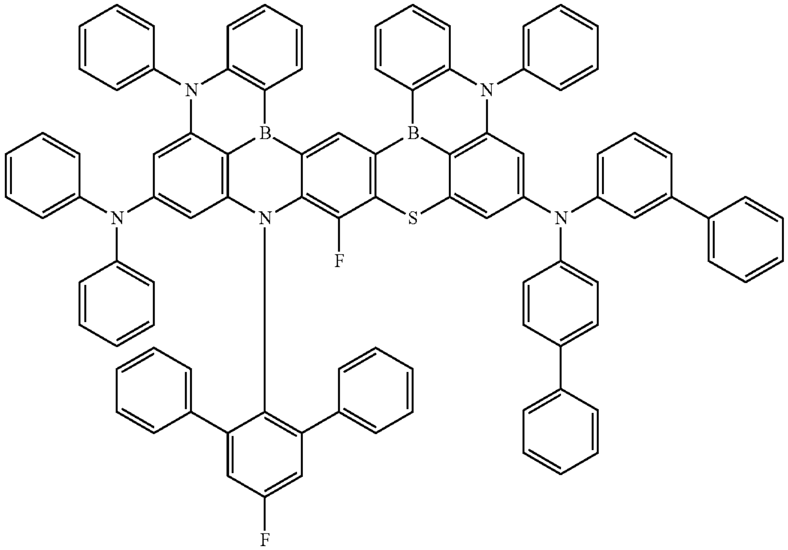

-continued
191
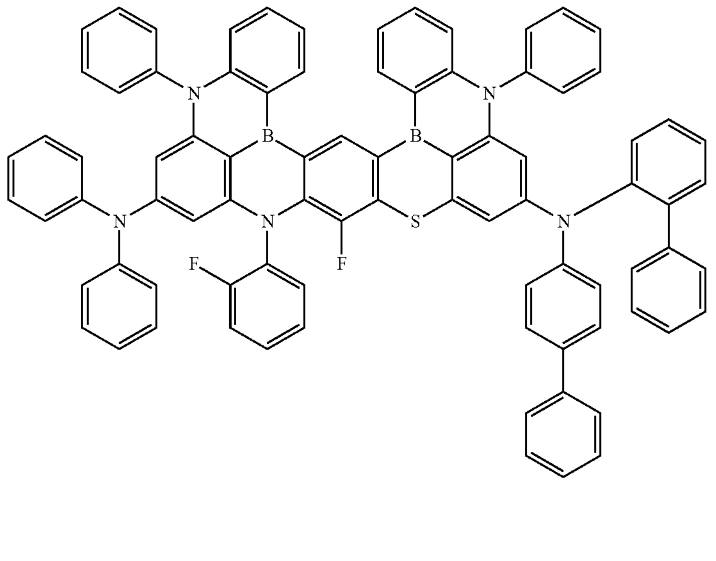
194
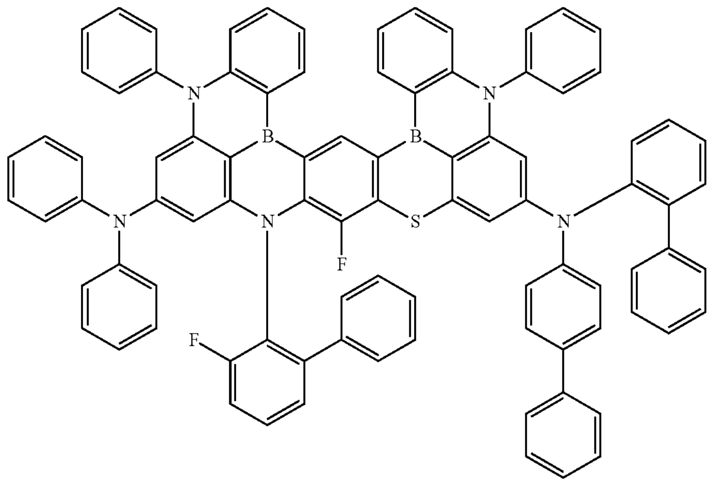
195
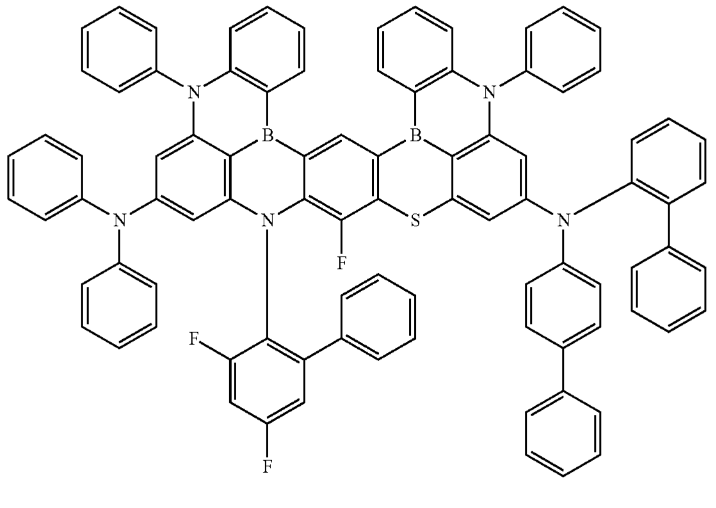

-continued
196
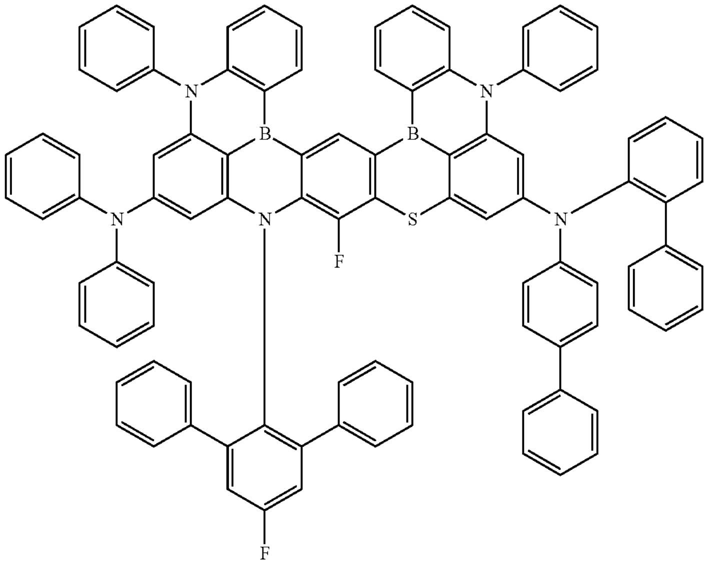
197
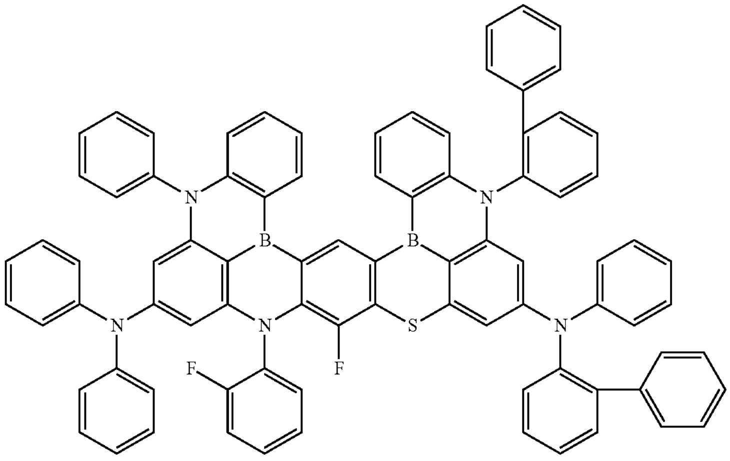
200
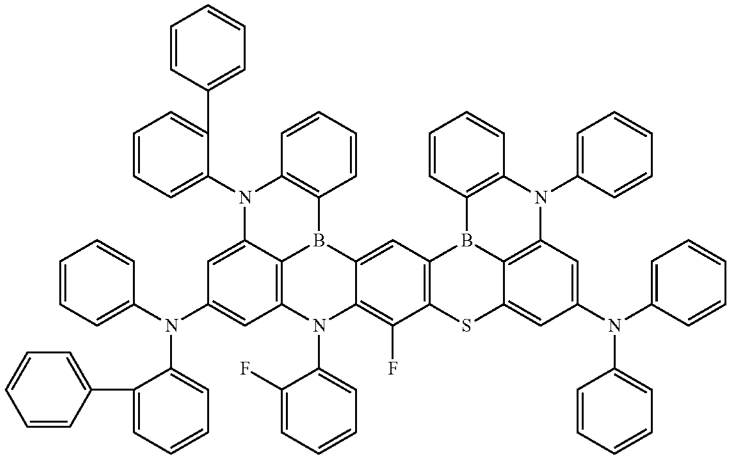

203
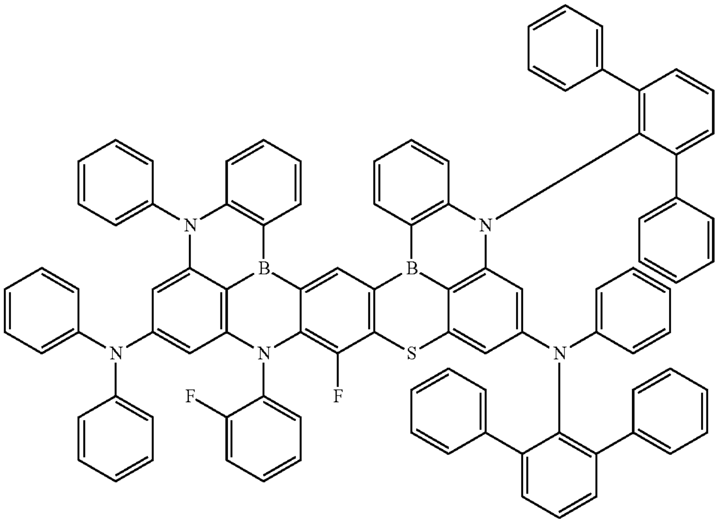
206
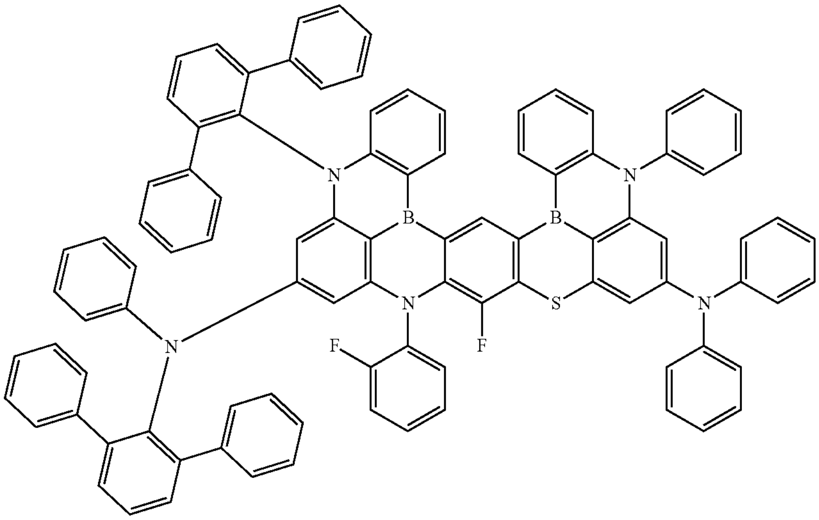
209
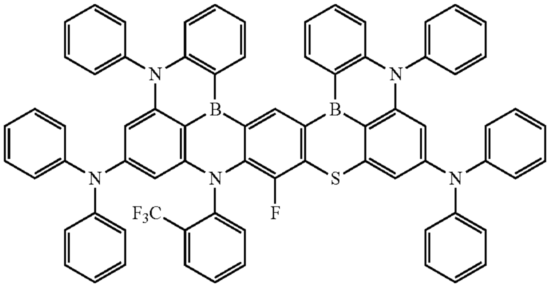
210
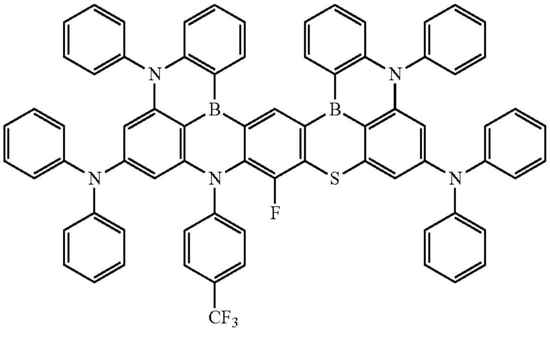

-continued
211
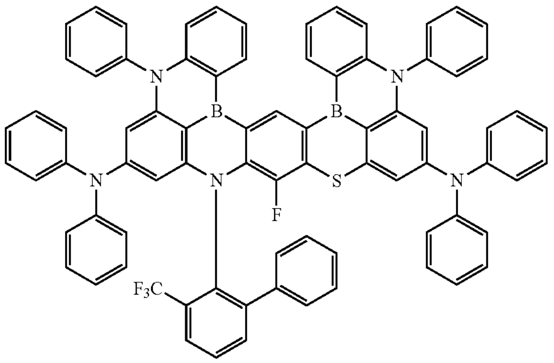
212
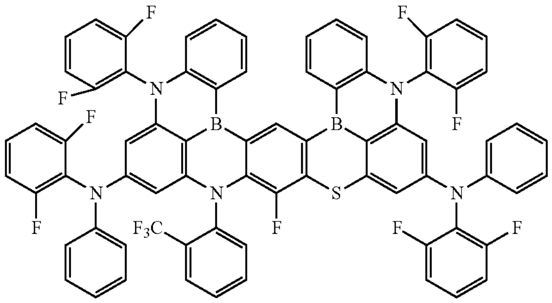
213
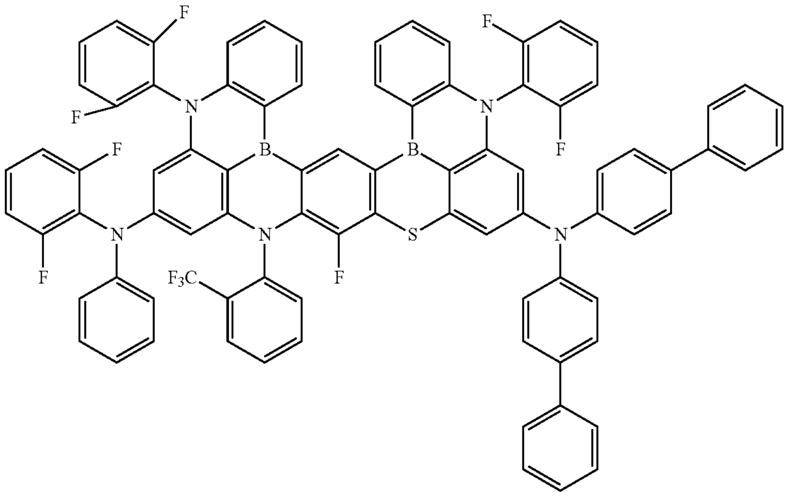
214
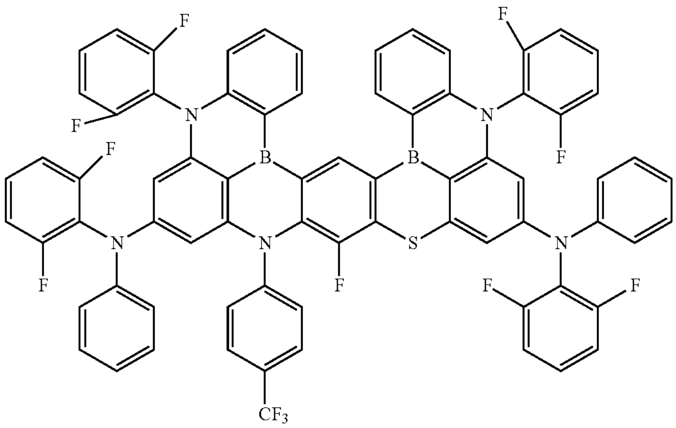

-continued
215
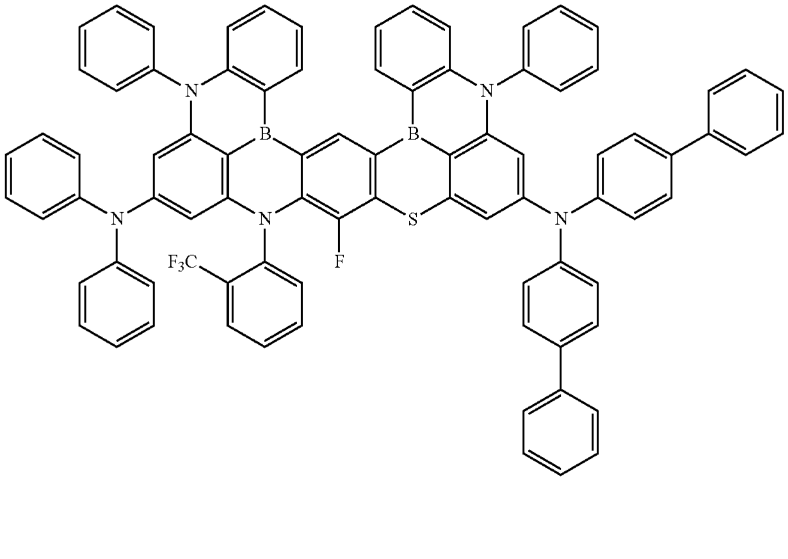
216
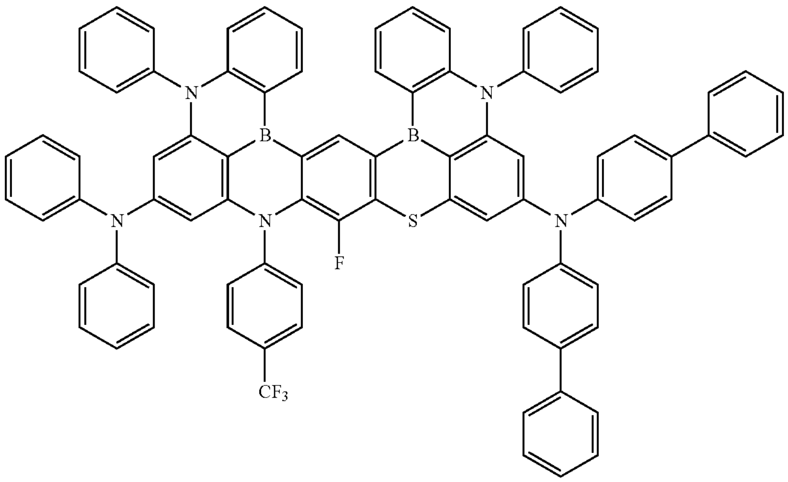
217
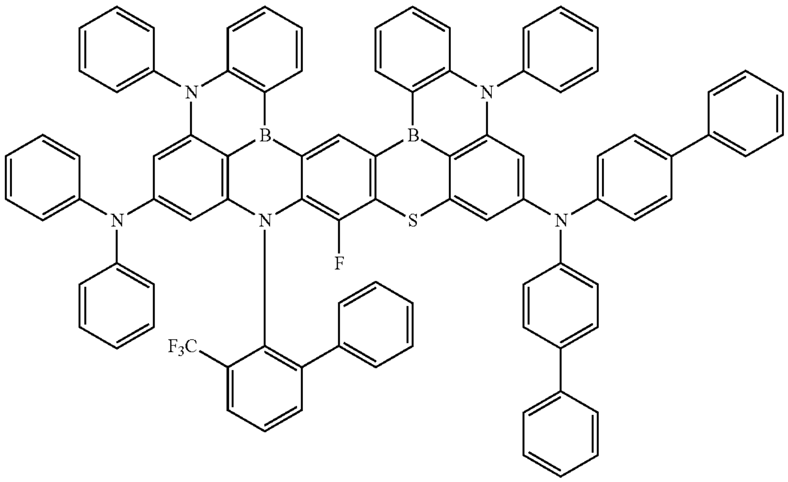

-continued
218
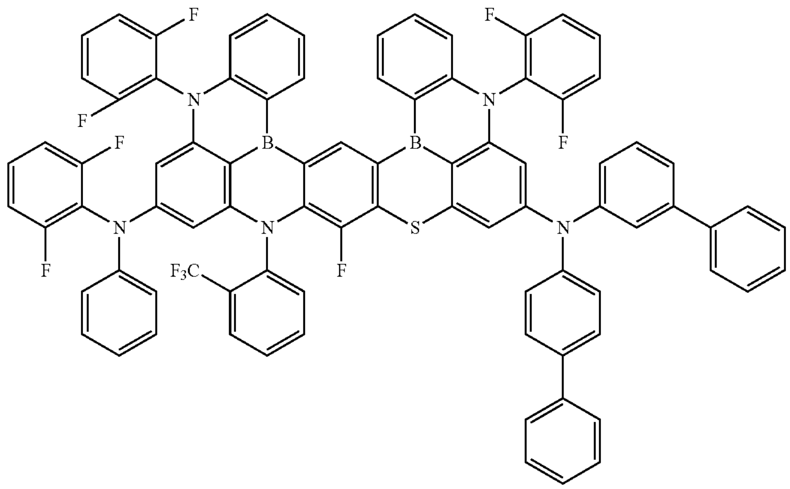
219
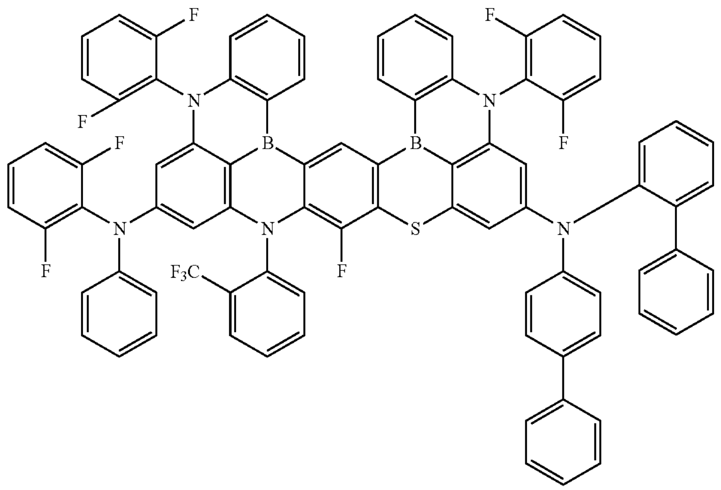
220
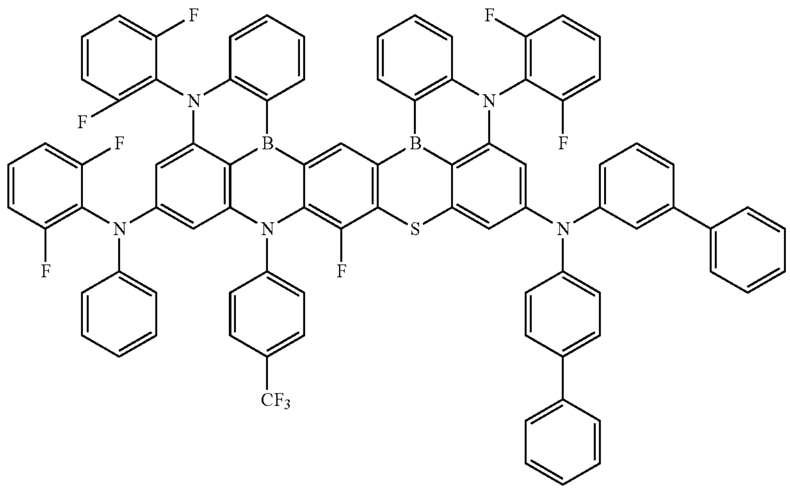

-continued
221
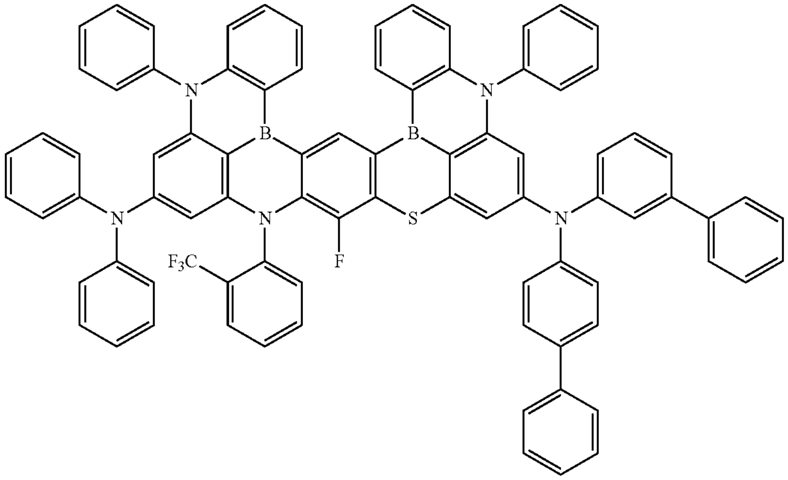
222
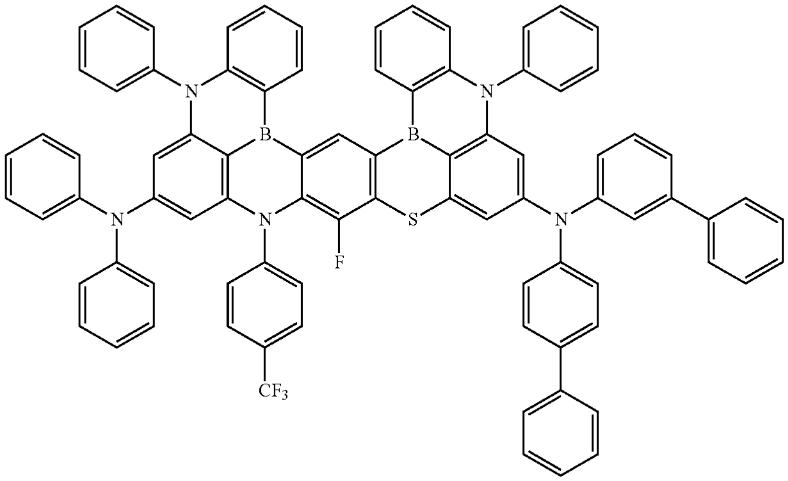
223
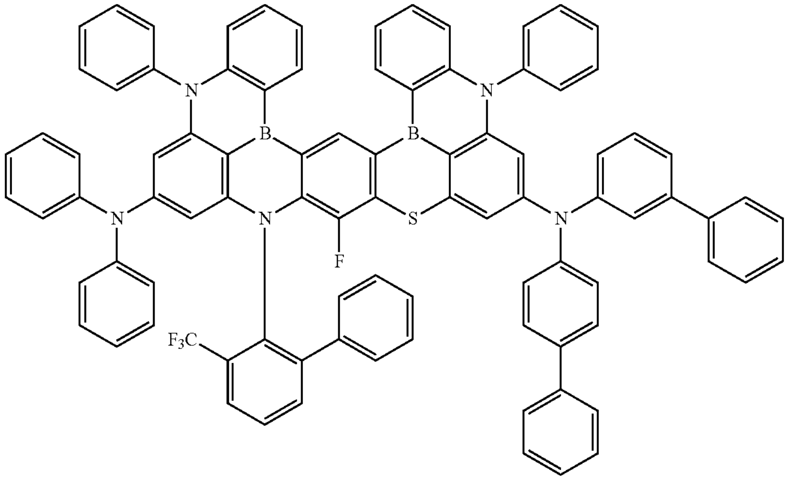

-continued
224
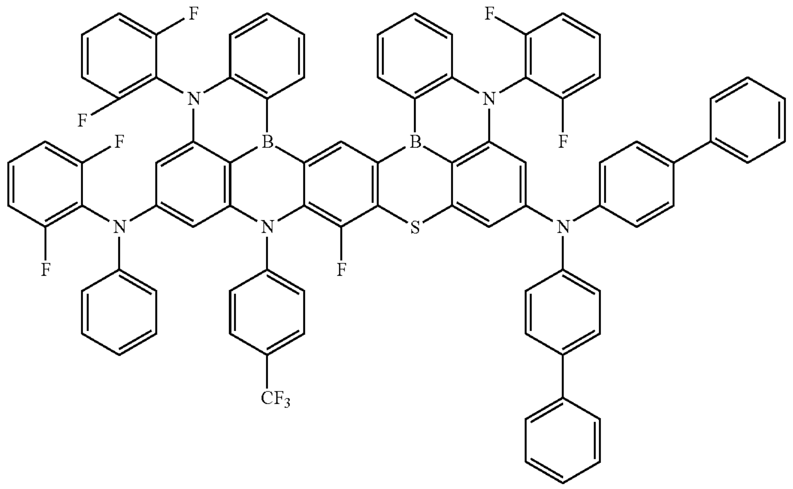
225
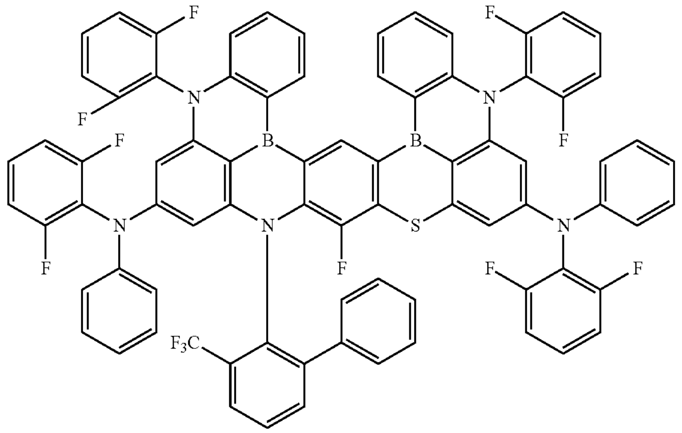
226
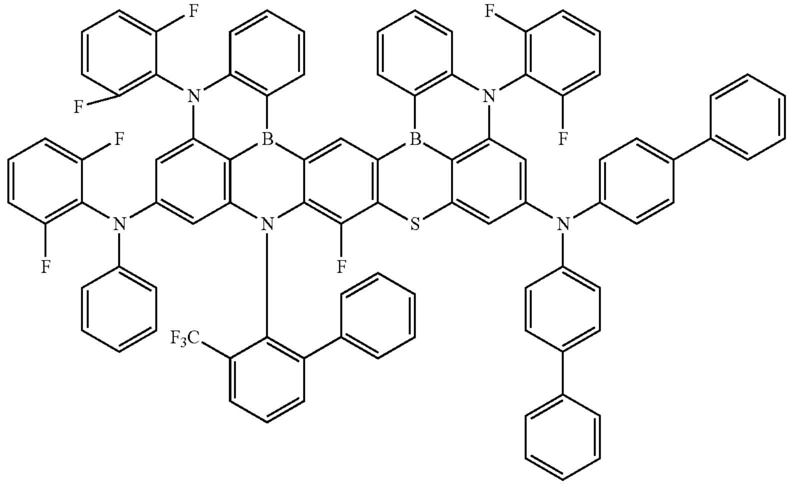

-continued
227
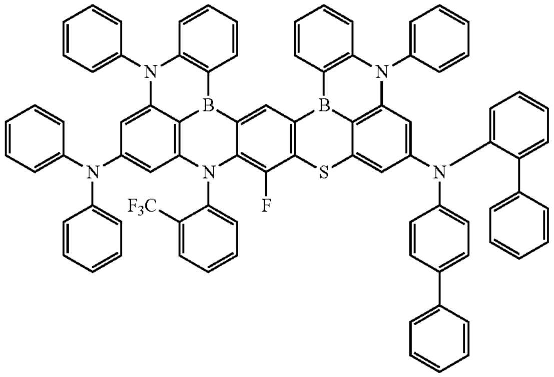
228
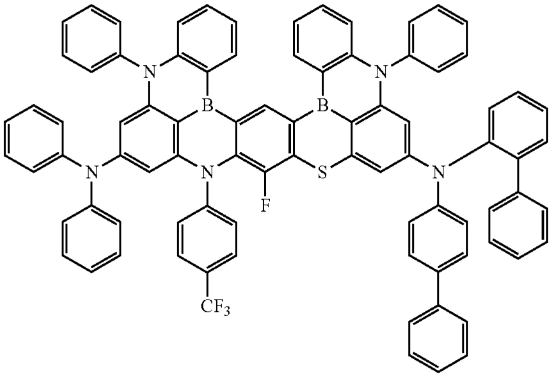
229
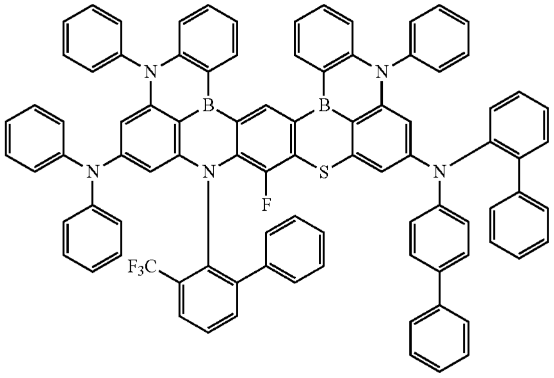
230
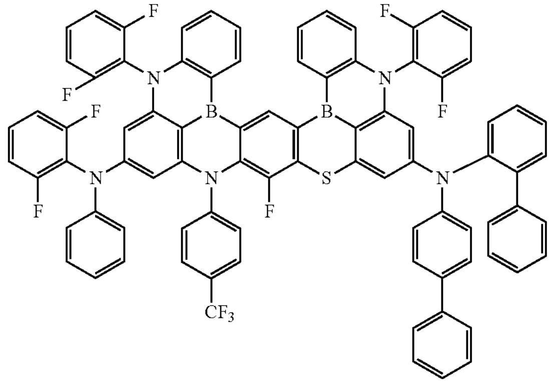
231
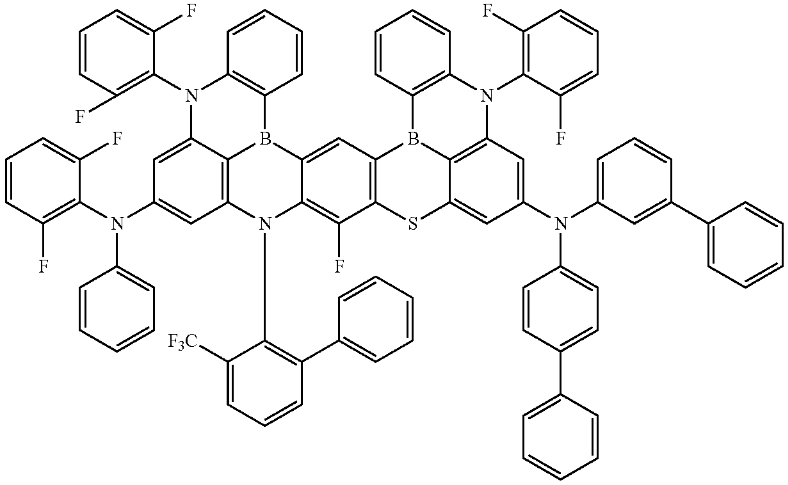

-continued
232
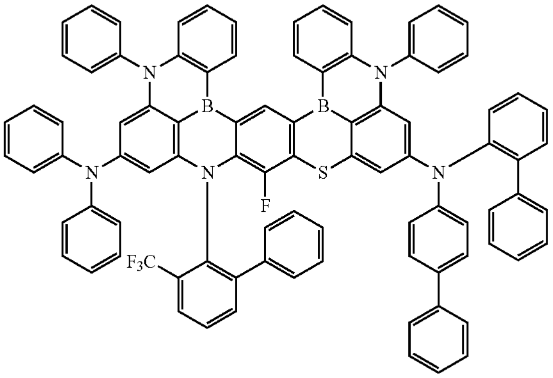
236
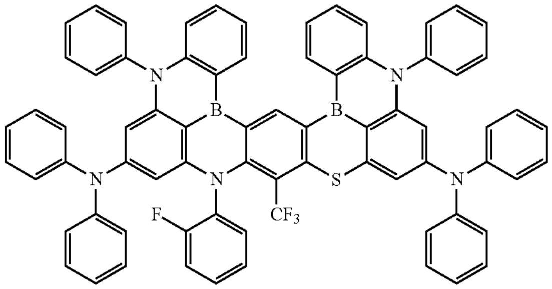
239
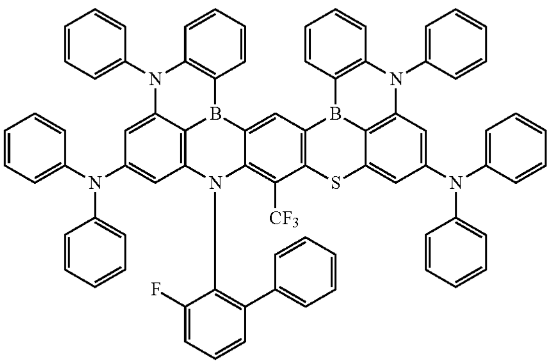
240
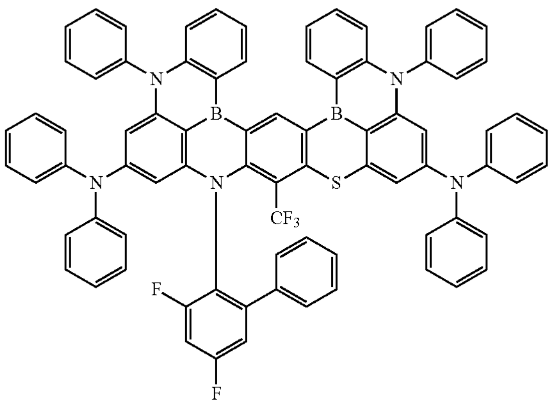
241
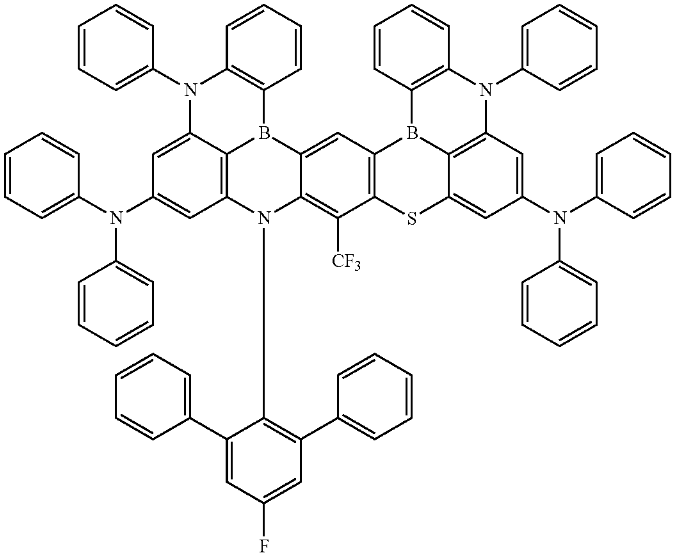

-continued
242
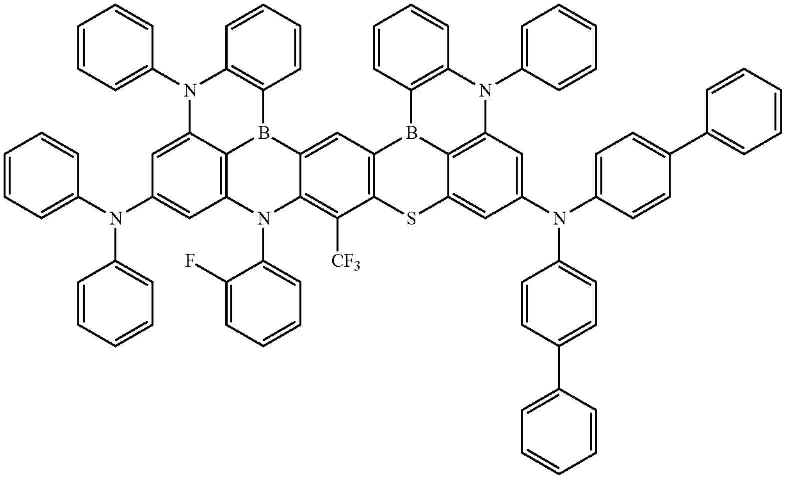
245
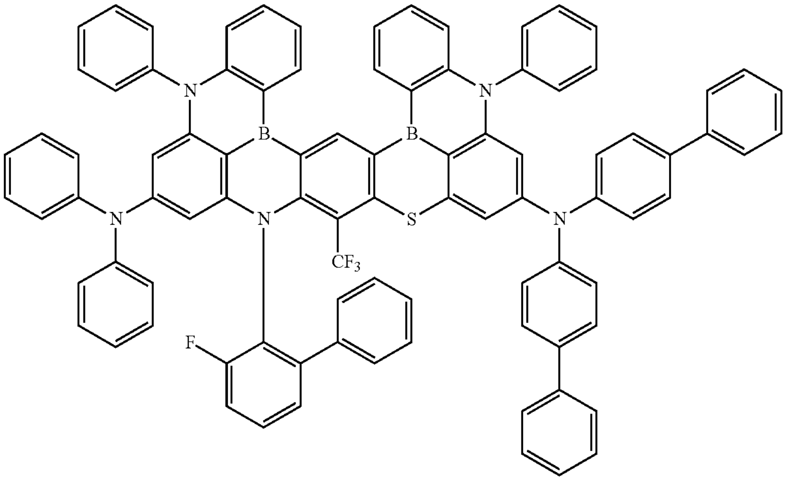
246
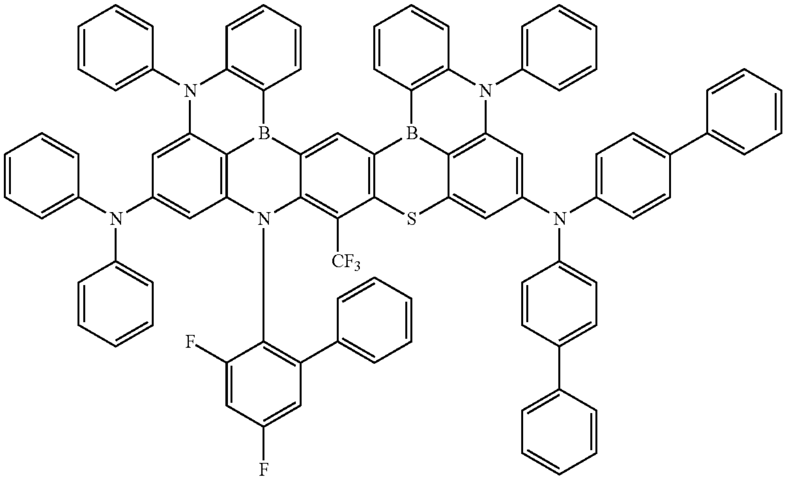

-continued
247
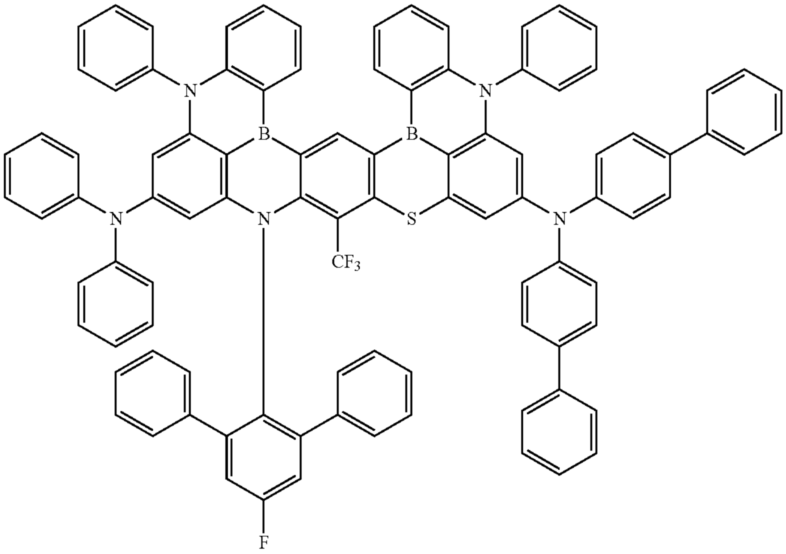
248
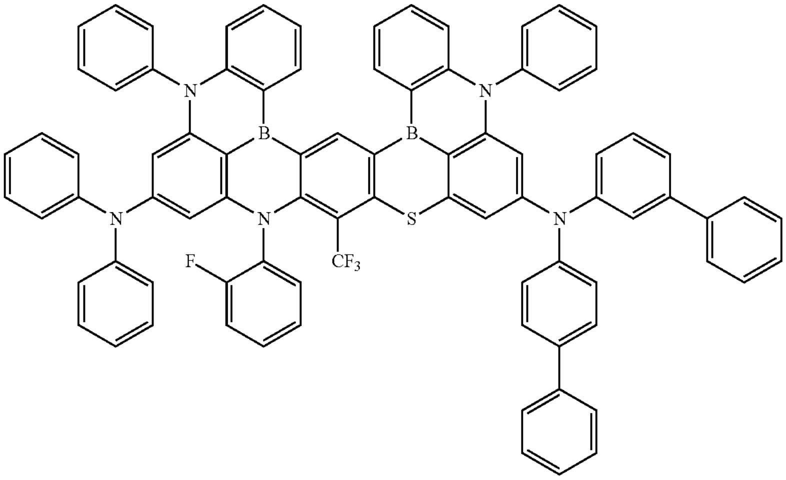
251
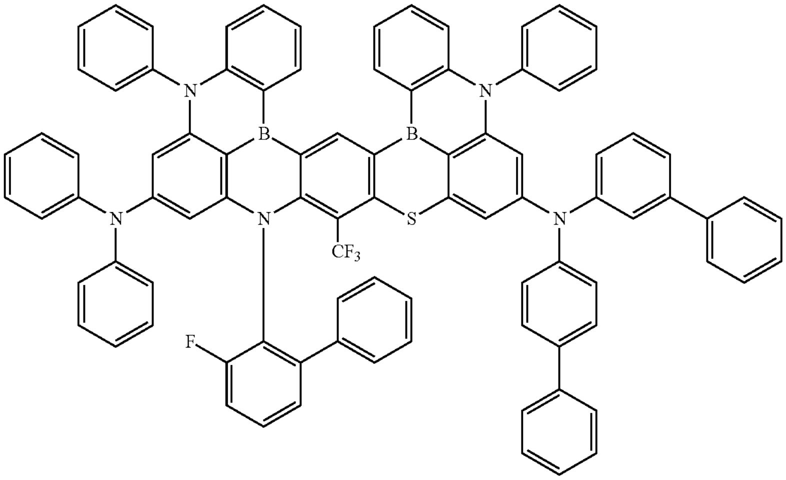

-continued
252
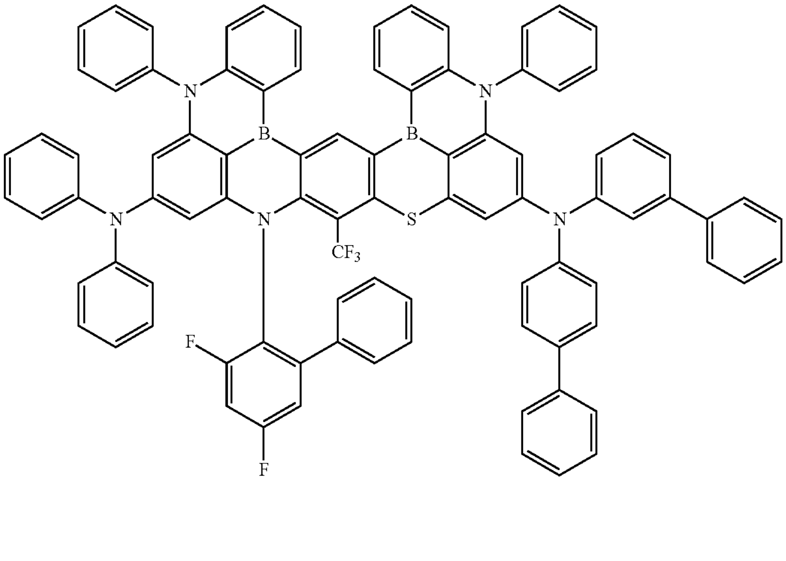
253
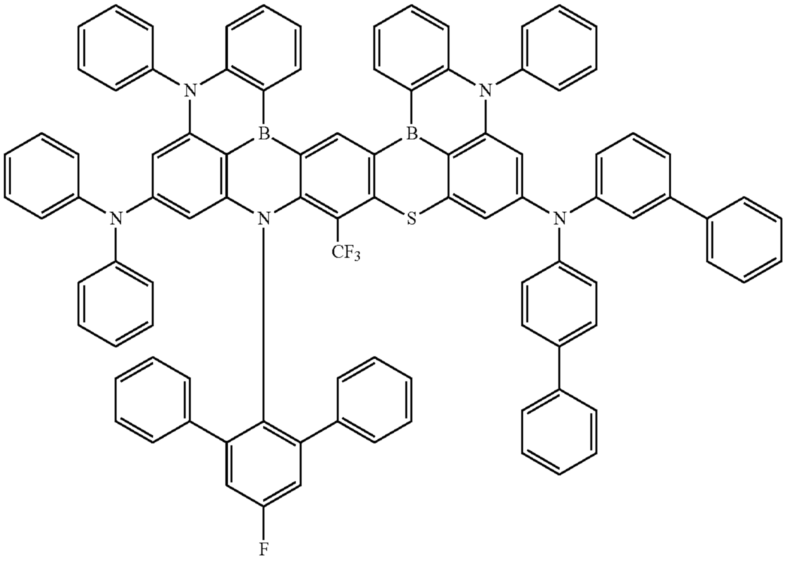
254
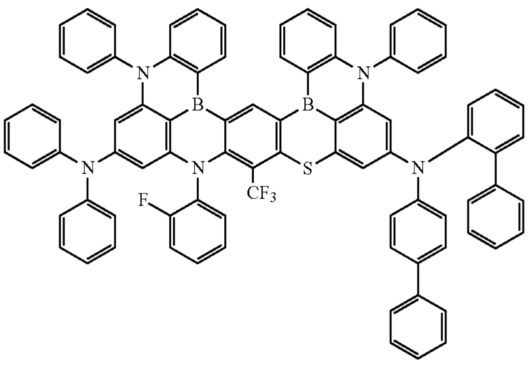
257
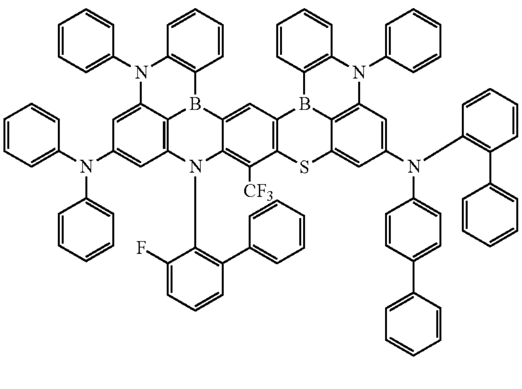

-continued
258
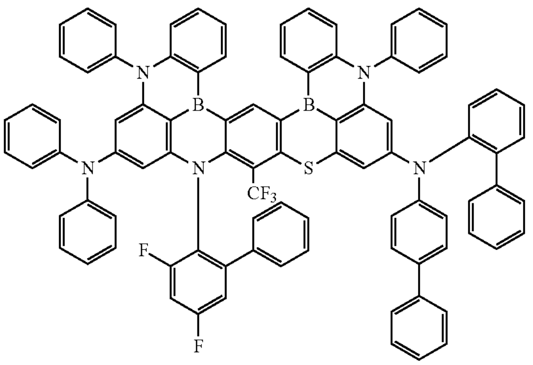
259
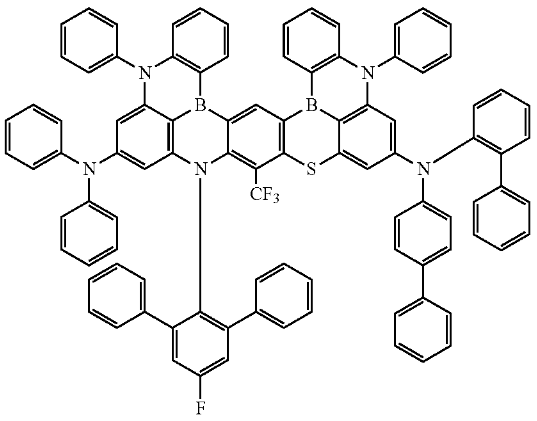
260
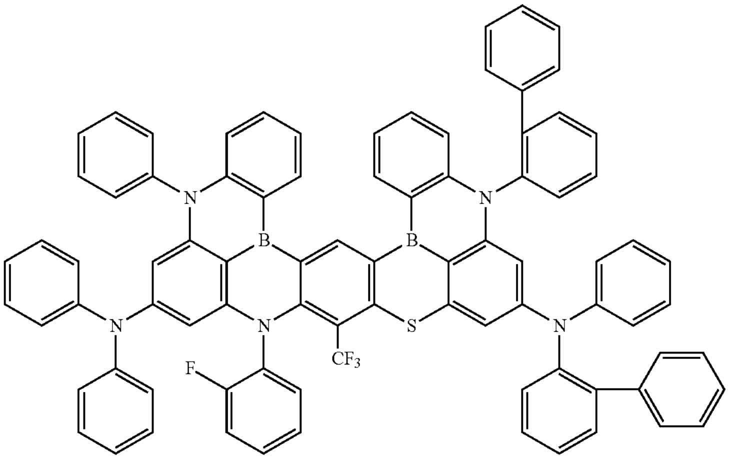
263
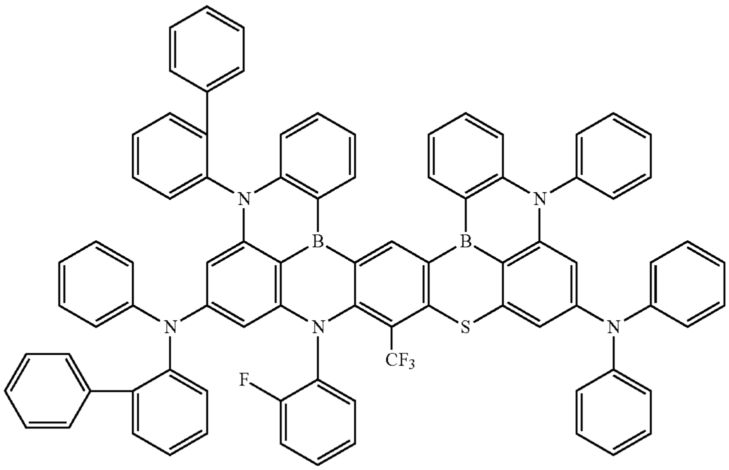

-continued
266
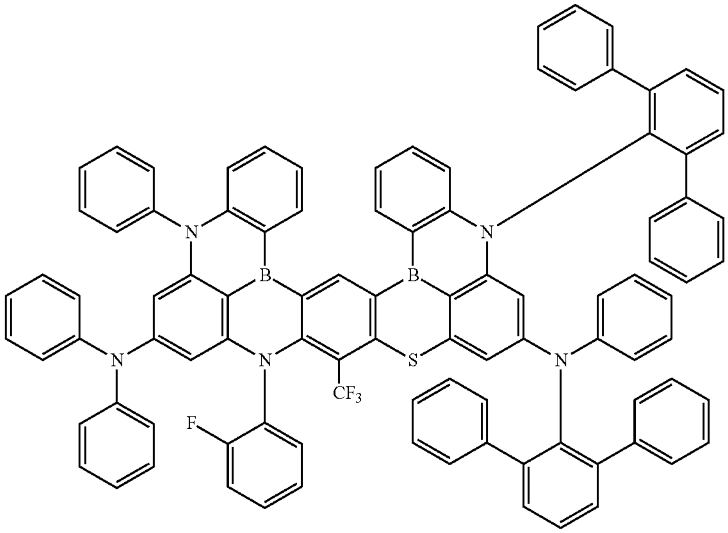
269
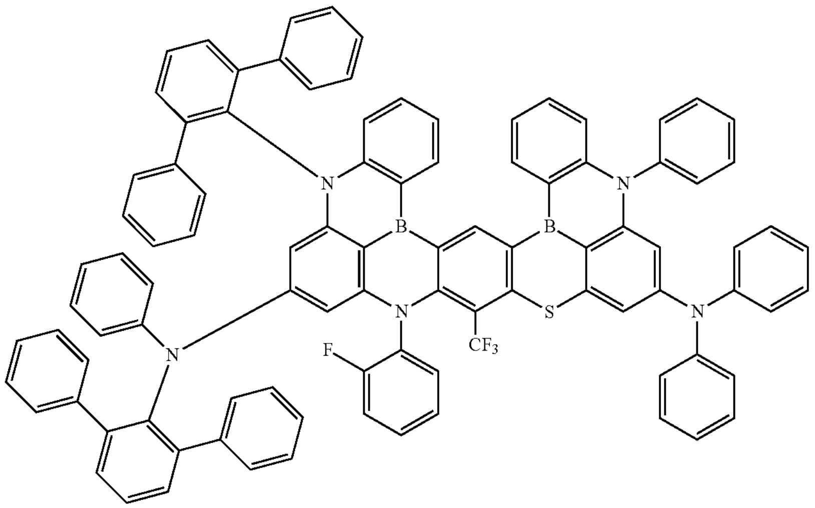
272
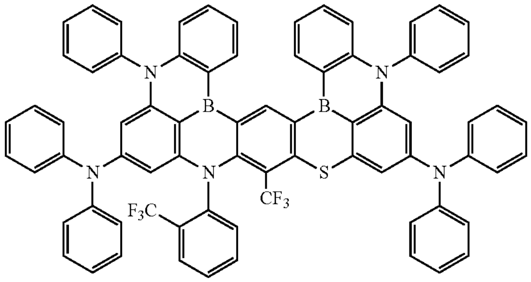
273
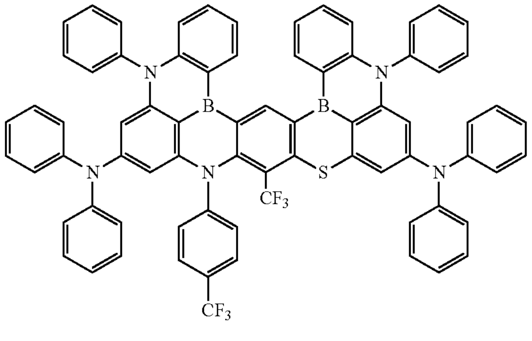

-continued
274
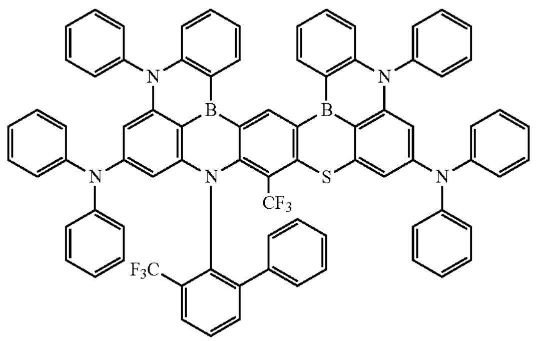
275
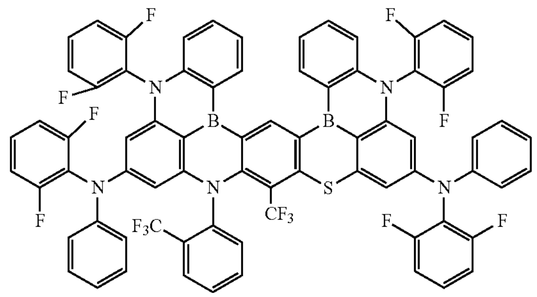
276
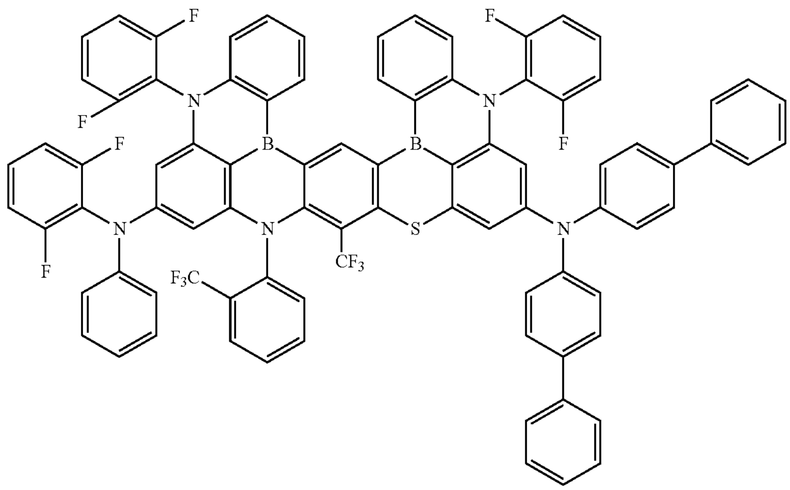
278
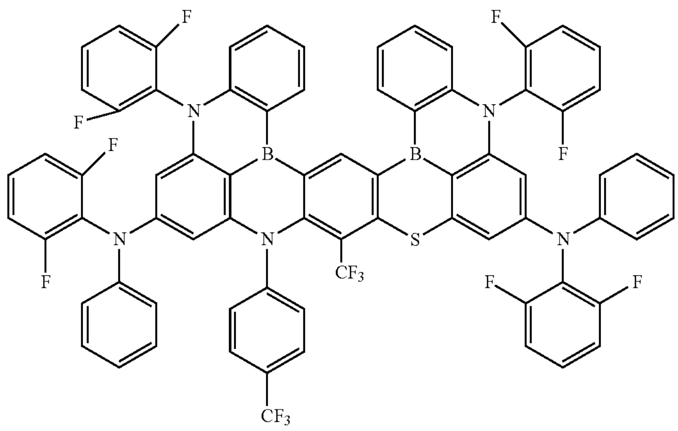

-continued
279
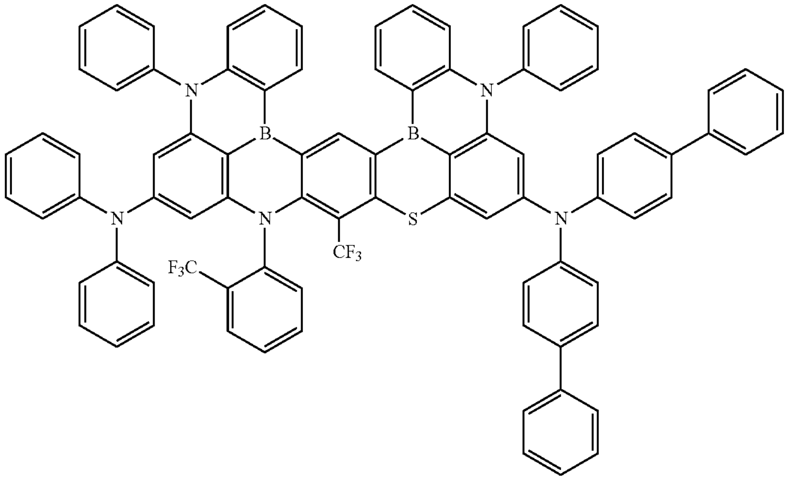
280
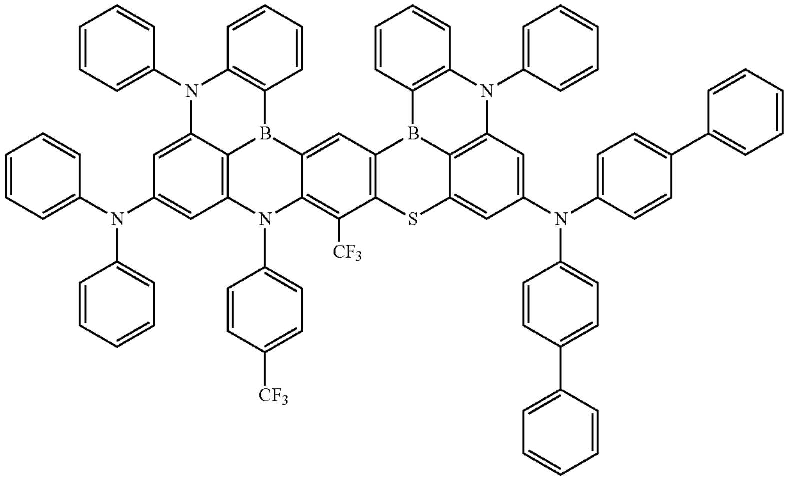
281
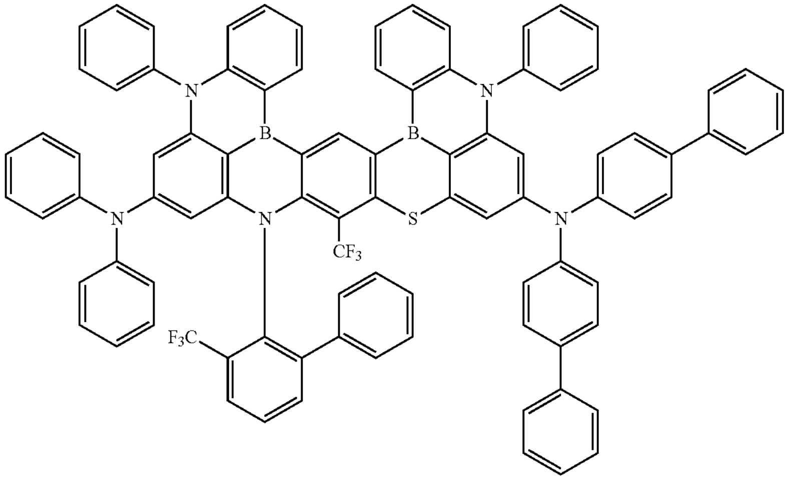

-continued
282
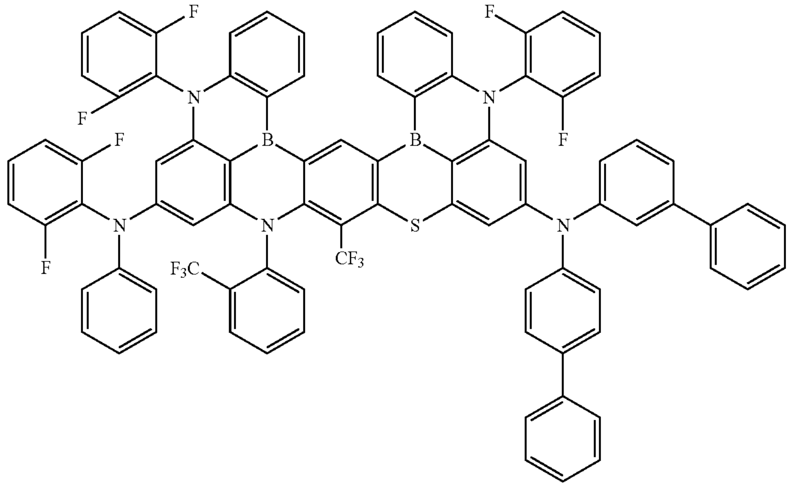
283
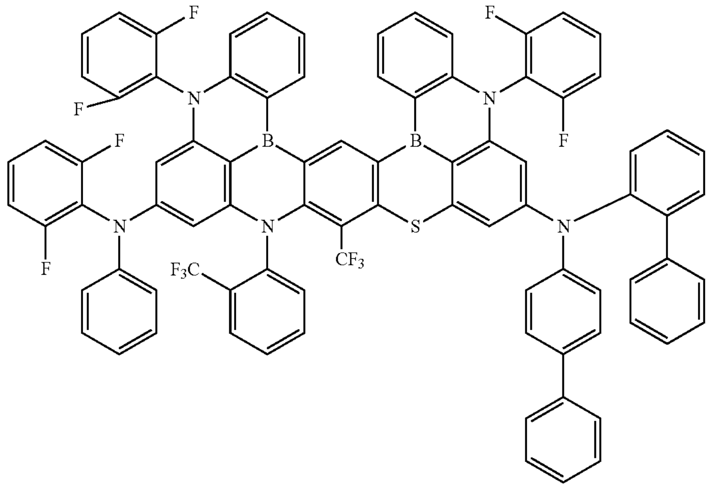
284
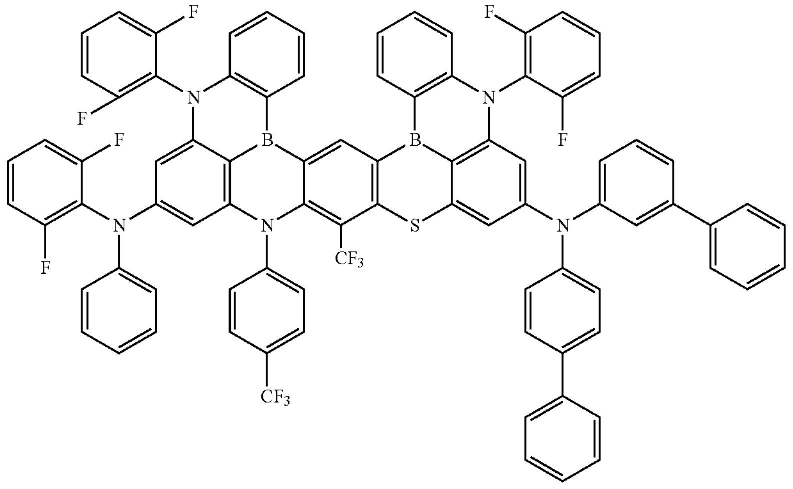

-continued
285
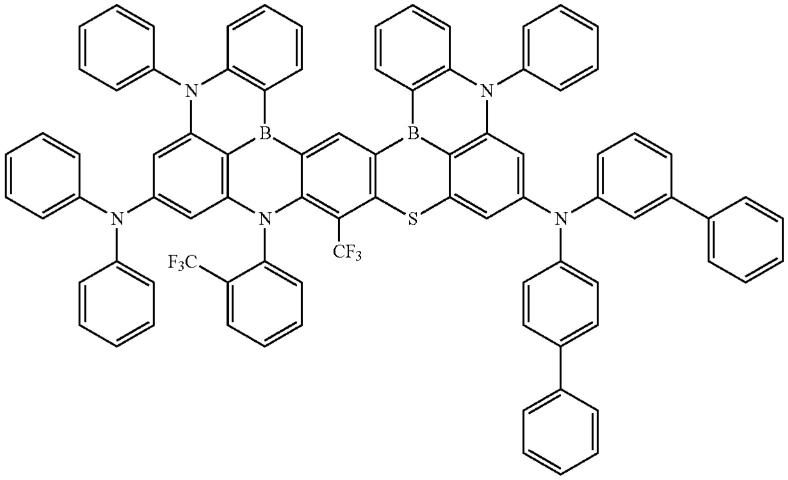
286
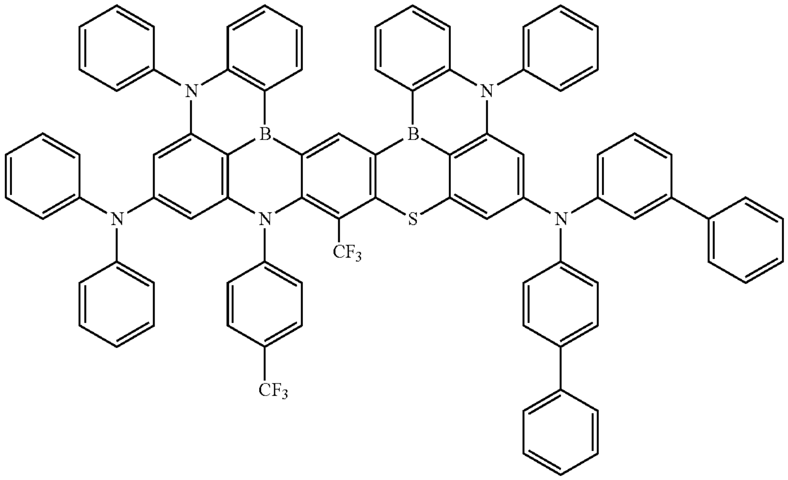
287
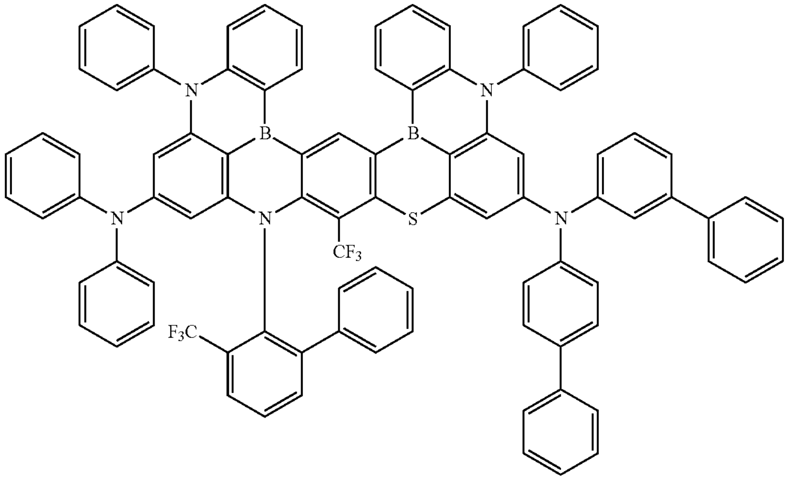

-continued
288
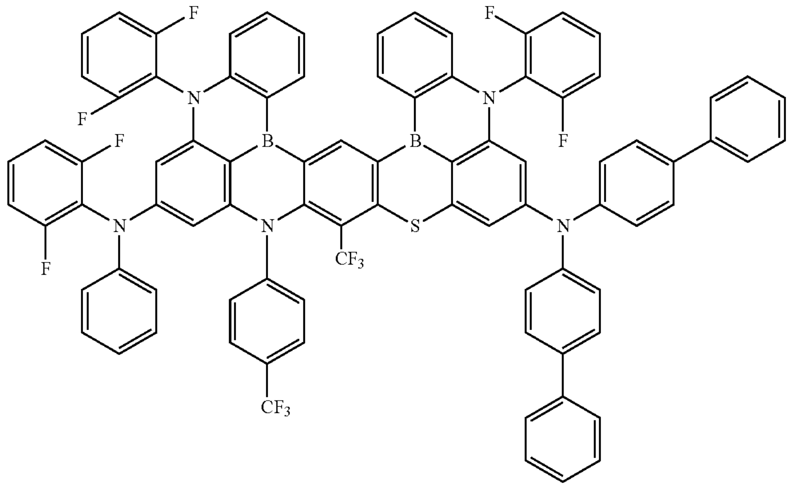
289
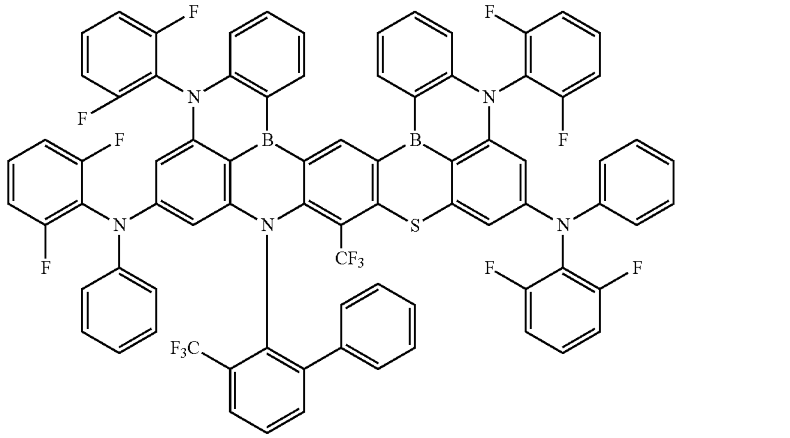
290
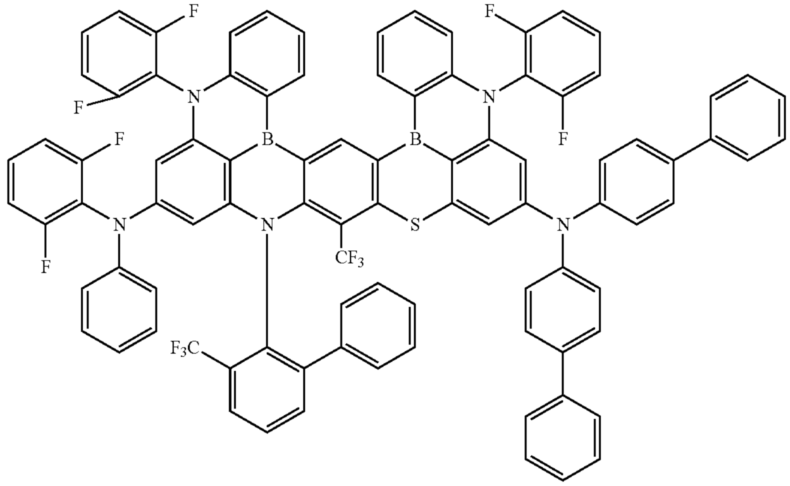

-continued
291
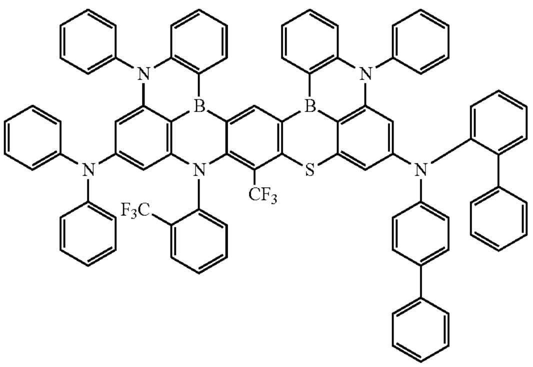
292
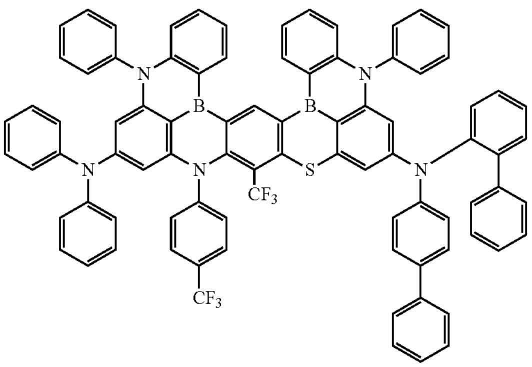
293
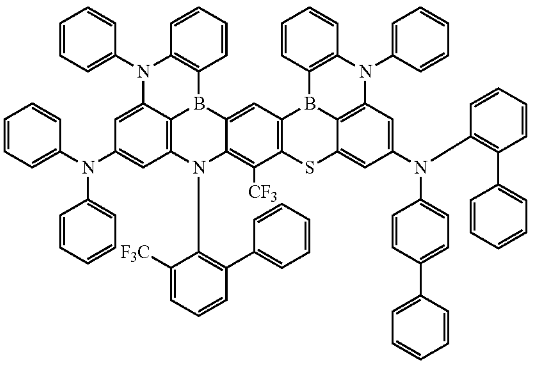
294
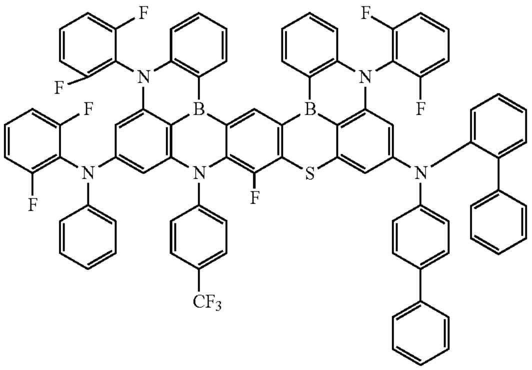
295
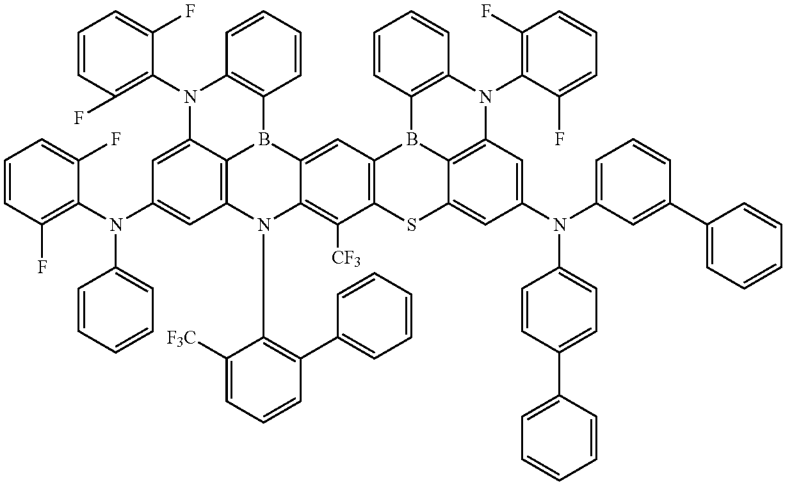

-continued

296

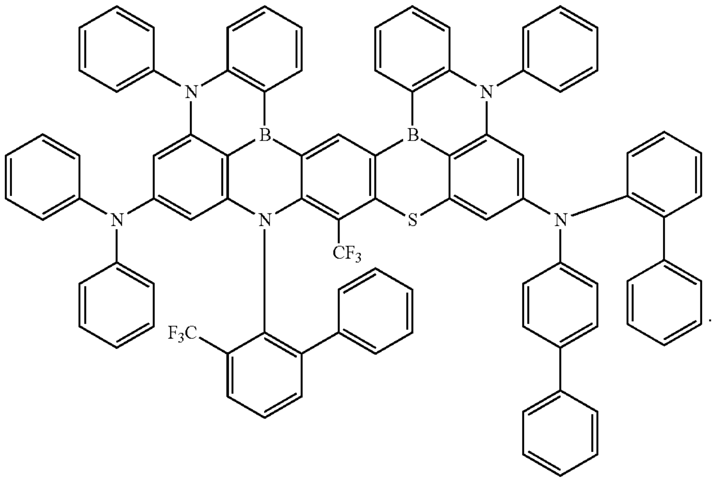

21. A display apparatus, comprising:

a base layer;

a circuit layer disposed on the base layer; and a display device layer disposed on the circuit layer, and including an organic electroluminescence device, wherein the organic electroluminescence device includes:

a first electrode;

a hole transport region disposed on the first electrode;

an emission layer disposed on the hole transport region;

an electron transport region disposed on the emission layer; and a second electrode disposed on the electron transport region, and the emission layer comprises a polycyclic compound represented by Formula 1:

[Formula 1]

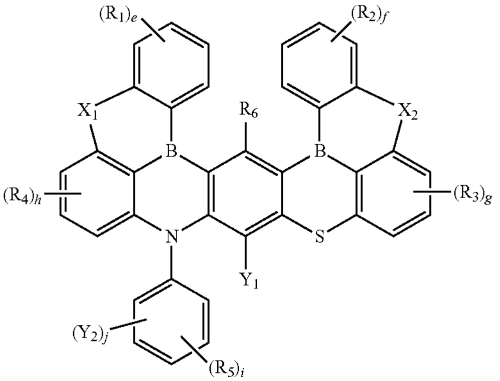

wherein in Formula 1, $X_1$ and $X_2$ are each independently $N(Ar_1)$, O, or S, $Ar_1$ is a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, $Y_1$ is a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, provided that:

a phenyl group including $Y_2$ and $R_5$ is represented by one of $Y_2$-2 to $Y_2$-7; or $Y_1$ is F or $CF_3$, and a phenyl group including $Y_2$ and $R_5$ is represented by one of $Y_2$-1 to $Y_2$-7, $R_1$ to $R_4$ and $R_6$ are each independently a hydrogen atom, a deuterium atom, a halogen atom, a substituted or unsubstituted amine group, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, e and f are each independently an integer from 0 to 4, j and i are each independently an integer from 0 to 5, the sum of j and i is equal to or less than 5, and g and h are each independently an integer from 0 to 3:

Y2-1

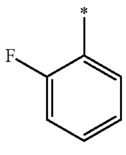

Y2-2

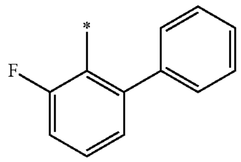

-continued
Y2-3
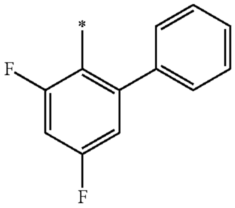
Y2-4
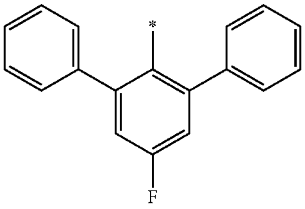
Y2-5
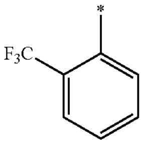
-continued
Y2-6
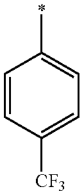
Y2-7
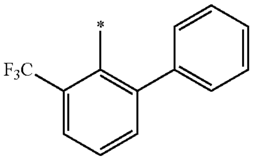
wherein in $Y_2$-1 to $Y_2$-7,
* indicates a binding site to a neighboring atom.
22. The display apparatus of claim 21, further comprising:
a light control layer disposed on the display device layer, wherein
the light control layer includes a quantum dot.
* * * * *